US012278309B2

(12) United States Patent
Atanackovic

(10) Patent No.: US 12,278,309 B2
(45) Date of Patent: Apr. 15, 2025

(54) EPITAXIAL OXIDE MATERIALS, STRUCTURES, AND DEVICES

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 18/167,349

(22) Filed: Feb. 10, 2023

(65) Prior Publication Data

US 2023/0197794 A1 Jun. 22, 2023

Related U.S. Application Data

(63) Continuation of application No. 17/653,828, filed on Mar. 7, 2022, now Pat. No. 11,621,329, which is a (Continued)

(51) Int. Cl.

*H01L 33/26* (2010.01)
*H01L 29/267* (2006.01)

(Continued)

(52) U.S. Cl.

CPC ............ *H01L 33/26* (2013.01); *H01L 29/267* (2013.01); *H01L 33/002* (2013.01); *H01L 33/005* (2013.01); *H01L 33/04* (2013.01); *H01L 33/40* (2013.01); *H01S 5/3206* (2013.01); *H01S 5/183* (2013.01); *H01S 5/34* (2013.01); *H01S 5/3425* (2013.01)

(58) Field of Classification Search

None

See application file for complete search history.

(56) References Cited

U.S. PATENT DOCUMENTS 4,433,233 A 2/1984 Hierholzer, Jr. et al.
5,175,592 A 12/1992 Watson (Continued)

FOREIGN PATENT DOCUMENTS

EP 1081256 B1 8/2011
KR 1020060024421 A 3/2006

(Continued)

OTHER PUBLICATIONS

Peelaers and Van De Walle, Brillouin zone and band structure of β—Ga2O3, Phys. Status Solidi B 252, No. 4, 828-832, Jan. 2015.

(Continued)

*Primary Examiner* — Khaja Ahmad

(74) *Attorney, Agent, or Firm* — MLO, a professional corp.

(57) ABSTRACT

In some embodiments, a semiconductor structure includes: a first epitaxial oxide semiconductor layer; a metal layer; and a contact layer adjacent to the metal layer, and between the first epitaxial oxide semiconductor layer and the metal layer. The contact layer can include an epitaxial oxide semiconductor material. The contact layer can also include a region comprising a gradient in a composition of the epitaxial oxide semiconductor material adjacent to the metal layer, or a gradient in a strain of the epitaxial oxide semiconductor material over a region adjacent to the metal layer.

24 Claims, 213 Drawing Sheets

Related U.S. Application Data continuation of application No. PCT/IB2021/060413, filed on Nov. 10, 2021.

(51) Int. Cl.

| | |
|---|---|
| ***H01L 33/00*** | (2010.01) |
| ***H01L 33/04*** | (2010.01) |
| ***H01L 33/40*** | (2010.01) |
| ***H01S 5/183*** | (2006.01) |
| ***H01S 5/32*** | (2006.01) |
| ***H01S 5/34*** | (2006.01) |

(56) References Cited

U.S. PATENT DOCUMENTS

| | | | |
|---|---|---|---|
| 5,438,233 | A | 8/1995 | Boland et al. |
| 5,450,812 | A | 9/1995 | McKee et al. |
| 5,625,202 | A | 4/1997 | Chai |
| 5,879,811 | A | 3/1999 | Tanaka et al. |
| 6,236,076 | B1 | 5/2001 | Arita et al. |
| 6,255,201 | B1 | 7/2001 | Yoshida et al. |
| 6,914,268 | B2 | 7/2005 | Shei et al. |
| 6,977,397 | B2 | 12/2005 | Ichinose et al. |
| 7,359,415 | B1 | 4/2008 | Alfano et al. |
| 7,393,411 | B2 | 7/2008 | Chinose et al. |
| 7,727,865 | B2 | 6/2010 | Ichinose et al. |
| 7,824,955 | B2 | 11/2010 | White et al. |
| 9,105,473 | B2 | 8/2015 | Ueda et al. |
| 9,246,311 | B1 | 1/2016 | Raring et al. |
| 9,412,911 | B2 | 8/2016 | Atanackovic |
| 9,548,678 | B2 | 1/2017 | Schuh et al. |
| 9,666,677 | B1 | 5/2017 | Raring et al. |
| 9,691,938 | B2 | 6/2017 | Atanackovic et al. |
| 10,475,956 | B2 | 11/2019 | Atanackovic |
| 10,636,916 | B2 | 4/2020 | Shih et al. |
| 11,164,976 | B2 | 11/2021 | Ramamoorthy et al. |
| 11,175,447 | B1 | 11/2021 | Pynn et al. |
| 11,342,484 | B2 | 5/2022 | Atanackovic |
| 11,456,361 | B1 | 9/2022 | Atanackovic |
| 11,462,400 | B1 | 10/2022 | Atanackovic |
| 11,502,223 | B1 | 11/2022 | Atanackovic |
| 11,522,087 | B1 | 12/2022 | Atanackovic |
| 11,522,103 | B1 | 12/2022 | Atanackovic |
| 11,621,329 | B1 | 4/2023 | Atanackovic |
| 11,855,152 | B2 | 12/2023 | Atanackovic |
| 12,087,880 | B2 | 9/2024 | Atanackovic |
| 12,095,006 | B2 | 9/2024 | Atanackovic |
| 2001/0011743 | A1 | 8/2001 | Arita et al. |
| 2002/0025594 | A1 | 2/2002 | Iwata et al. |
| 2003/0236642 | A1 | 12/2003 | Timans |
| 2004/0079285 | A1 | 4/2004 | Li et al. |
| 2004/0087118 | A1 | 5/2004 | Maegawa et al. |
| 2004/0095978 | A1* | 5/2004 | Cheng ................ H01S 5/18305 372/45.01 |
| 2004/0113156 | A1 | 6/2004 | Tamura et al. |
| 2005/0122005 | A1 | 6/2005 | Higuchi et al. |
| 2005/0223983 | A1 | 10/2005 | Selvamanickam et al. |
| 2006/0049424 | A1 | 3/2006 | Wu et al. |
| 2006/0150891 | A1 | 7/2006 | Ichinose et al. |
| 2006/0220029 | A1 | 10/2006 | Ishikazi |
| 2007/0166967 | A1 | 7/2007 | Ichinose et al. |
| 2008/0008964 | A1 | 1/2008 | Chan et al. |
| 2008/0033300 | A1 | 2/2008 | Hoang et al. |
| 2008/0083905 | A1 | 4/2008 | Alfano et al. |
| 2008/0230779 | A1 | 9/2008 | Goyal |
| 2008/0233671 | A1 | 9/2008 | Chou et al. |
| 2008/0302653 | A1 | 12/2008 | Trassl et al. |
| 2009/0095907 | A1 | 4/2009 | Harding et al. |
| 2009/0137099 | A1 | 5/2009 | Schonherr et al. |
| 2010/0074604 | A1 | 3/2010 | Koelmel et al. |
| 2010/0140642 | A1 | 6/2010 | Arai et al. |
| 2011/0046916 | A1 | 2/2011 | Yu et al. |
| 2011/0062440 | A1 | 3/2011 | Adekore et al. |
| 2012/0045661 | A1 | 2/2012 | Kumaran et al. |
| 2012/0091548 | A1 | 4/2012 | Sukegawa et al. |
| 2012/0112158 | A1 | 5/2012 | Chyan et al. |
| 2012/0234238 | A1 | 9/2012 | Hsu et al. |
| 2012/0280224 | A1 | 11/2012 | Doolittle et al. |
| 2012/0306834 | A1 | 12/2012 | Ueda et al. |
| 2013/0233240 | A1 | 9/2013 | Cody et al. |
| 2013/0240874 | A1 | 9/2013 | Maekawa et al. |
| 2014/0061486 | A1 | 3/2014 | Bao et al. |
| 2014/0331919 | A1 | 11/2014 | Sasaki |
| 2015/0001467 | A1 | 1/2015 | Cho et al. |
| 2015/0171173 | A1 | 6/2015 | Umeda et al. |
| 2015/0171222 | A1 | 6/2015 | Sasagawa et al. |
| 2015/0179445 | A1 | 6/2015 | Sasaki et al. |
| 2015/0369728 | A1 | 12/2015 | Bahatt et al. |
| 2016/0149074 | A1 | 5/2016 | Atanackovic et al. |
| 2016/0149075 | A1 | 5/2016 | Atanackovic |
| 2016/0163920 | A1 | 6/2016 | Atanackovic |
| 2017/0258268 | A1 | 9/2017 | Kazanas et al. |
| 2017/0263809 | A1 | 9/2017 | Atanackovic |
| 2017/0263813 | A1* | 9/2017 | Atanackovic ..... H01L 21/02554 |
| 2017/0288024 | A1 | 10/2017 | Reznicek |
| 2017/0309779 | A1 | 10/2017 | Atanackovic |
| 2017/0316963 | A1 | 11/2017 | Parkhe |
| 2018/0066940 | A1 | 3/2018 | Sopori et al. |
| 2018/0122985 | A1 | 5/2018 | Atanackovic et al. |
| 2018/0315886 | A1 | 11/2018 | Gaevski et al. |
| 2019/0028081 | A1 | 1/2019 | Pelzel et al. |
| 2019/0051794 | A1 | 2/2019 | Atanackovic et al. |
| 2019/0280098 | A1 | 9/2019 | Ueda et al. |
| 2019/0329542 | A1 | 10/2019 | Wang et al. |
| 2020/0075799 | A1 | 3/2020 | Atanackovic et al. |
| 2020/0075809 | A1 | 3/2020 | Rajan et al. |
| 2020/0168454 | A1 | 5/2020 | Dargis et al. |
| 2020/0194560 | A1 | 6/2020 | Takizawa et al. |
| 2020/0328164 | A1 | 10/2020 | Delacruz et al. |
| 2020/0328165 | A1 | 10/2020 | Delacruz et al. |
| 2020/0411648 | A1 | 12/2020 | Yamazaki |
| 2021/0013374 | A1 | 1/2021 | Iida et al. |
| 2021/0050474 | A1 | 2/2021 | Krause |
| 2021/0074541 | A1 | 3/2021 | Atanackovic |
| 2021/0126091 | A1 | 4/2021 | Chang et al. |
| 2021/0273415 | A1 | 9/2021 | McLaurin et al. |
| 2021/0351321 | A1 | 11/2021 | Atanackovic |
| 2021/0388526 | A1 | 12/2021 | Zhao et al. |
| 2022/0115544 | A1* | 4/2022 | Miyake ........... H01L 31/035236 |
| 2022/0199858 | A1 | 6/2022 | Atanackovic |
| 2022/0199859 | A1 | 6/2022 | Atanackovic |
| 2022/0271197 | A1 | 8/2022 | Atanackovic |
| 2023/0045518 | A1 | 2/2023 | Char et al. |
| 2023/0143766 | A1 | 5/2023 | Atanackovic |
| 2023/0420617 | A1 | 12/2023 | Iza et al. |
| 2024/0055560 | A1 | 2/2024 | Atanackovic |
| 2024/0072206 | A1 | 2/2024 | Atanackovic |
| 2024/0072207 | A1 | 2/2024 | Atanackovic |

FOREIGN PATENT DOCUMENTS

| | | | |
|---|---|---|---|
| WO | 2004074556 | A2 | 9/2004 |
| WO | 2009152207 | A2 | 12/2009 |
| WO | 2011090963 | A2 | 7/2011 |
| WO | 2016052929 | A1 | 4/2016 |
| WO | 2017165197 | A1 | 9/2017 |
| WO | 2019155444 | A1 | 8/2019 |

OTHER PUBLICATIONS

Peng Lingling et al., 'Enhanced Photoluminescence and Thermal Properties of Size Mismatch inMg2TixGe1—xO4: Mn4+ Deep-Red Phosphors', Journal of Materials Chemistry C, Issue 8, Jan. 28, 2019, abstract; and p. 2. (https://pubs.rsc.org/en/content/articlelanding/2019/tc/c8tc05743e).

Petricevic et al. "Room-temperature near-infrared tunable laser operation of Cr4+:Ca2GeO4", Optics Letters vol. 21, Issue 21, pp. 1750-1752 (1996), Optica Publishing (Year: 1996).

Ranga et al., "MOVPE-grown Si-doped f3-(AI0.26Ga0.74)2O3 thin films and heterostructures," Template for APEX (2014).

Shuo-Huang Yuan et al 2018 Jpn. J. Appl. Phys. 57 070301 (Year: 2018).

(56) References Cited

OTHER PUBLICATIONS

St. Senz et al., 'The effect of stress on cubic-to-tetragonal phase transitions in Mg2TiO4 and Mg2GeO4spinel films', Philosophical Magazine A, 2001, vol. 81, No. 1, 109-124, Aug. 5, 2009, abstract; pp. 110-111; and figures 1(d)-1(e), 3.(https://www.tandfonline.com/doi/abs/10.1080/01418610108216621?cookieSet=1).
Swallow et al., Indium Gallium Oxide Alloys: Electronic Structure, Optical Gap, Surface Space Charge, and Chemical Trends within Common-Cation Semiconductors, ACS Appl. Mater. Interfaces 2021, 13, 2807-2819 (Year: 2021).
Vaidya et al., "Enhancement Mode f3-(AlxGa1-x)2O3/Ga2O3 Heterostructure FET (HFET) With High Transconductance and Cutoff Frequency," IEEE Electron Device Letters 42 (2021) pp. 1444-1447.
Wang et al., Band gap and band offset of Ga2O3 and (AlxGa1-x)2O3 alloys, arXiv: 1806.03360v2 [cond-mat.mtrl-sci] Jul. 31, 2018 ( Year: 2018).
Wang et al., Band gap and band offset of Ga2O3 and (AlxGa1-x)2O3 alloys, Physical Review Applied 10, 011003-1 (Year: 2018).
Zhang et al., Recent progress on the electronic structure, defect, and doping properties of Ga2O3, APL Mater. 8, 020906 (2020)—Published Online: Feb. 21, 2020.
Notice of Allowance and Fees dated Feb. 15, 2023 for U.S. Appl. No. 17/653,832.
Office Action dated Apr. 13, 2023 for U.S. Appl. No. 17/651,711.
Office Action dated Apr. 21, 2023 for U.S. Appl. No. 17/658,510.
Office Action dated Jul. 13, 2023 for U.S. Appl. No. 18/175,363.
Office Action dated May 11, 2023 for U.S. Appl. No. 18/175,363.
Anhar Uddin Bhuiyan et al., MOCVD epitaxy of β-(AlxGa1-x)203 thin films on (010) Ga2O3 substrates and N-type doping, Appl. Phys. Lett. 115, Sep. 2019, pp. 120602-1-120602-5.
Anhar Uddin Bhuiyan et al., Phase transformation in MOCVD growth of (AlxGa1-x)2O3 thin films, APL Mater. 8, 031104 (2020)—Published Online: Mar. 2, 2020.
Bhuiyan et al., "MOCVD epitaxy of b-(AlxGa 1-x)2O3 thin films on (010) Ga2O3 substrates and N-type doping," Applied Physics Letters 115 (2019) 120602.
Bhuiyan et al., "MOCVD Epitaxy of Ultrawide Bandgap f3 (AlxGa1-x)2O3 with High-AI Composition on (100) f3 Ga2O3 Substrates," Crystal Growth & Design 20 (2020) pp. 6722-6730.
Bosi et al., Ga2O3 polymorphs: tailoring the epitaxial growth conditions, J. Mater. Chem. C, 2020, 8, 10975, Jul. 2020.
Cheng et al., Phase formation and strain relaxation of Ga2O3 on c-plane and a-plane sapphire substrates as studied by synchrotron-based x-ray diffraction, Applied Physics Letters 111, 162104, Oct. 2017.
Dang et al., α-(AlxGa1-x)203 single-layer and heterostructure buffers for the growth of conductive Sn-doped α-Ga2O3 thin films via mist chemical vapor deposition, APL Mater. 8, 101101 (2020)—Published Online: Oct. 1, 2020.
Elaheh Ahmadi et al., 'Schottky barrier height of Ni to β-(AlxGa1-x)2O3 with different compositions grown by plasma assisted molecular beam epitaxy', Semicond. Sci. Technol. 32 (2017) 035004 (5pp), Jan. 30, 2017 pp. 1-5. (https://iopscience.iop.org/article/10.1088/1361-6641/aa53a7).
Hilfiker et al., Dielectric function tensor (1.5 eV to 9.0 eV), anisotropy, and band to band transitions of monoclinic β-(Al x Ga 1-x ) 2 O 3 ( x≤ 0.21) films, Applied Physics Letters 114(23):231901, Jun. 2019.
Ildikó Cora et al., 'The real structure of &-Ga203 and its relation to K-phase', CrystEngComm, 2017, 19, 1509-1516, Feb. 17, 2017 p. 1512. (https://pubs.rsc.org/en/content/articlelanding/2017/ce/c7ce00123a).
International Search Report and Written Opinion dated Aug. 6, 2021 for PCT Patent Application No. PCT/IB2021/053652.
International Search Report and Written Opinion dated Aug. 9, 2022 for PCT Patent Application No. PCT//IB2021/060413.
International Search Report and Written Opinion dated Aug. 9, 2022 for PCT Patent Application No. PCT/IB2021/060414.
International Search Report and Written Opinion dated Aug. 9, 2022 for PCT Patent Application No. PCT/IB2021/060466.
International Search Report and Written Opinion dated Jul. 18, 2022 for PCT Patent Application No. PCT/IB2021/059945.
Jiao et al., The Structural and Photoelectrical Properties of Gallium Oxide Thin Film Grown by Radio Frequency Magnetron Sputtering, ECS Journal of Solid State Science and Technology, 8 (7) Q3086-Q3090 (Year: 2019).
Kato et al., Fabrication of coherent γ-A12O3/Ga2O3 superlattices on MgAl2O4 substrates, Appl. Phys. Express 12 065503, May 2019.
Kaun et al., β-(AlxGa1-x)2O3/Ga203 (010) heterostructures grown on β-Ga203 (010) substrates by plasma-assisted molecular beam epitaxy, Journal of Vacuum Science & Technology A Vacuum Surfaces and Films 33(4):041508 Jul. 2015.
Kneiss et al., Growth, structural and optical properties of coherent κ-(AlxGa1-x )2O3/κ-Ga2O3 quantum well superlattice heterostructures, APL Mater. 8, 051112 (2020).—Published Online: May 19, 2020.
Krueger et al., Variation of Band Gap and Lattice Parameters of B-(AlxGa1-x)2O3 Powder Produced by Solution, J. Am. Ceram. Soc., 99 [7], pp. 2467-2473. (Year: 2016).
Lin and Lee, Ga2O3-based solar-blind deep ultraviolet light-emitting diodes, Journal of Luminescence vol. 224, 2020 117326, Apr. 2020, 4 pages.
Masataka Higashiwaki, Shizuo Fujita, Gallium Oxide: Materials Properties, Crystal Growth, and Devices, Springer International Publishing, Apr. 25, 2021—Technology & Engineering—764 pages, Section 8.4.1 B-(AlxGa1-x)203/B-Ga2O3 Heterostructures ( Year: 2021).
Mengmeng Shang et al., '(Zn, Mg)2GeO4:Mn2+ submicrorods as promising green phosphors forfield emission displays: hydrothermal synthesis and luminescence properties', Dalton Trans., 2011, 40,9379-9387, Aug. 4, 2011, abstract; and pp. 9379-9387. (https://pubs.rsc.org/en/content/articlelanding/2011/dt/c1dt10673b).
Notice of Allowance and Fees dated Apr. 8, 2022 for U.S. Appl. No. 16/990,349.
Notice of Allowance and Fees dated Aug. 17, 2022 for U.S. Appl. No. 17/651,713.
Notice of Allowance and Fees dated Aug. 25, 2022 for U.S. Appl. No. 17/652,028.
Notice of Allowance and Fees dated Aug. 25, 2022 for U.S. Appl. No. 17/658,506.
Notice of Allowance and Fees dated Jul. 13, 2022 for U.S. Appl. No. 17/653,824.
Notice of Allowance and Fees dated Jun. 15, 2022 for U.S. Appl. No. 17/658,501.
Notice of Allowance and Fees dated Oct. 28, 2022 for U.S. Appl. No. 17/653,828.
Notice of Allowance and Fees dated Sep. 21, 2022 for U.S. Appl. No. 17/652,031.
Office Action dated Aug. 27, 2021 for U.S. Appl. No. 16/990,349.
Office Action dated Feb. 18, 2022 for U.S. Appl. No. 16/990,349.
Office Action dated Jul. 22, 2022 for U.S. Appl. No. 17/653,828.
Office Action dated Jul. 25, 2022 for U.S. Appl. No. 17/658,506.
Office Action dated Jul. 26, 2022 for U.S. Appl. No. 17/651,713.
Office Action dated Jun. 13, 2022 for U.S. Appl. No. 17/658,510.
Office Action dated Jun. 22, 2022 for U.S. Appl. No. 17/651,713.
Office Action dated Jun. 24, 2022 for U.S. Appl. No. 17/652,028.
Office Action dated Jun. 6, 2022 for U.S. Appl. No. 17/651,712.
Office Action dated Jun. 9, 2022 for U.S. Appl. No. 17/652,031.
Office Action dated Jun. 9, 2022 for U.S. Appl. No. 17/653,824.
Office Action dated Oct. 20, 2020 for U.S. Appl. No. 16/990,349.
Office Action dated Sep. 1, 2022 for U.S. Appl. No. 17/658,515.
Office Action dated Sep. 2, 2022 for U.S. Appl. No. 17/653,832.
Office Action dated Sep. 21, 2022 for U.S. Appl. No. 17/658,510.
Oshima et al., Epitaxial growth of γ-(AlxGa1-x)O3 alloy films for band-gap engineering, Appl. Phys. Express 10 051104, Apr. 2017.
Oshima et al., α-A12O3/Ga2O3 superlattices coherently grown on r-plane sapphire, Applied Physics Express, 11, 065501, Apr. 2018.
Oshima, Coherent gamma-Al2O3/Ga2O3 superlattices grown on MgAl2O4, (Conference Presentation), Proceedings vol. 10919, Oxide-based Materials and Devices X; 109190G (2019), Event: SPIE OPTO, Mar. 2019, San Francisco, California, United States. Abstract Only.

(56) References Cited

OTHER PUBLICATIONS

Pearton et al., A review of Ga2O3 materials, and devices, Applied Physics Reviews, 5, 011301 (Year: 2018).
European Search Report dated May 22, 2024 for European Patent Office Patent Application No. 21803849.5.
Notice of Allowance and Fees dated May 22, 2024 for U.S. Appl. No. 17/664,569.
Office Action dated Jun. 14, 2024 for U.S. Appl. No. 18/480,334.
Office Action dated Jun. 3, 2024 for U.S. Appl. No. 18/496,764.
Advisory Action dated Feb. 28, 2024 for U.S. Appl. No. 18/175,363.
Notice of Allowance and Fees dated Apr. 10, 2024 for U.S. Appl. No. 17/664,577.
Notice of Allowance and Fees dated Mar. 25, 2024 for U.S. Appl. No. 17/652,019.
Office Action dated Mar. 28, 2024 for U.S. Appl. No. 17/664,569.
Office Action dated May 8, 2024 for U.S. Appl. No. 18/167,365.
Notice of Allowance and Fees dated Aug. 23, 2024 for U.S. Appl. No. 18/167,365.
Notice of Allowance and Fees dated Jul. 19, 2024 for U.S. Appl. No. 18/480,323.
Notice of Allowance and Fees dated Sep. 18, 2024 for U.S. Appl. No. 18/480,334.
Office Action dated Aug. 1, 2024 for U.S. Appl. No. 18/497,137.
Office Action dated Aug. 29, 2024 for U.S. Appl. No. 18/175,363.
Notice of Allowance and Fees dated Oct. 2, 2024 for U.S. Appl. No. 18/496,764.
Office Action dated Sep. 30, 2024 for U.S. Appl. No. 17/654,221.

* cited by examiner

2800

| x | $Ga_2O_3$ | $Al_2O_3$ | MgO | NiO | ZnO | $Bi_2O_3$ | r-$GeO_2$ | $Ir_2O_3$ | $RE_2O_3$ | $Li_2O$ |
|---|---|---|---|---|---|---|---|---|---|---|
| Ga | $Ga_{2x}O_3$ | $(Ga_xAl_{1-x})_2O_3$ | $(Ga_{2x}Mg_{1-x})O_{2x+1}$ | $(Ga_{2x}Ni_{1-x})O_{2x+1}$ | $(Ga_{2x}Zn_{1-x})O_{2x+1}$ | $(Ga_xBi_{1-x})_2O_3$ | $(Ga_{2x}Ge_{1-x})O_{2+x}$ | $(Ga_xIr_{1-x})_2O_3$ | $(Ga_xRE_{1-x})O_3$ | $(Ga_{2x}Li_{2(1-x)})O_{2x+1}$ |
| Al | | $Al_{2x}O_3$ | $(Al_{2x}Mg_{1-x})O_{2x+1}$ | $(Al_{2x}Ni_{1-x})O_{2x+1}$ | $(Al_{2x}Zn_{1-x})O_{2x+1}$ | $(Al_xBi_{1-x})_2O_3$ | $(Al_{2x}Ge_{1-x})O_{2+x}$ | $(Al_xIr_{1-x})_2O_3$ | $(Al_xRE_{1-x})O_3$ | $(Al_{2x}Li_{2(1-x)})O_{2x+1}$ |
| Mg | | | $Mg_xO$ | $(Mg_xNi_{1-x})O_1$ | $(Mg_xZn_{1-x})O_1$ | $(Mg_{1-x}Bi_{2x})O_{2x+1}$ | $(Mg_xGe_{1-x})O_{2-x}$ | $(Mg_{1-x}Ir_{2x})O_{2x+1}$ | $(Mg_{1-x}RE_{2x})O_{2x+1}$ | $(Mg_xLi_{2(1-x)})O_1$ |
| Ni | | | | $Ni_xO$ | $(Ni_xZn_{1-x})O_1$ | $(Ni_{1-x}Bi_{2x})O_{2x+1}$ | $(Ni_xGe_{1-x})O_{2-x}$ | $(Ni_{1-x}Ir_{2x})O_{2x+1}$ | $(Ni_{1-x}RE_{2x})O_{2x+1}$ | $(Ni_xLi_{2(1-x)})O_1$ |
| Zn | | | | | $Zn_xO$ | $(Zn_{1-x}Bi_{2x})O_{2x+1}$ | $(Zn_xGe_{1-x})O_{2-x}$ | $(Zn_{1-x}Ir_{2x})O_{2x+1}$ | $(Zn_{1-x}RE_{2x})O_{2x+1}$ | $(Zn_xLi_{2(1-x)})O_1$ |
| Bi | | | | | | $Bi_{2x}O_3$ | $(Bi_{2x}Ge_{1-x})O_{2+x}$ | $(Bi_xIr_{1-x})O_3$ | $(Bi_xRE_{1-x})_2O_3$ | $(Bi_{2x}Li_{2(1-x)})O_{2x+1}$ |
| Ge | | | | | | | $Ge_xO_2$ | $(Ge_{1-x}Ir_{2x})O_{2+x}$ | $(Ge_{1-x}RE_{2x})O_{2+x}$ | $(Ge_xLi_{2(1-x)})O_{x+1}$ |
| Ir | | | | | | | | $Ir_{2x}O_3$ | $(Ir_xRE_{1-x})_2O_3$ | $(Ir_{2x}Li_{2(1-x)})O_{2x+1}$ |
| RE | | | | | | | | | $RE_{2x}O_3$ | $(RE_{2x}Li_{2(1-x)})O_{2x+1}$ |
| Li | | | | | | | | | | $Li_{2x}O_1$ |

*FIG. 28*

$Al_2O_3$ -TRIGONAL (CORUNDUM)

$Ga_2O_3$ -TRIGONAL (CORUNDUM)

TABLE I

| Substrate Type | Crystal Symmetry Type | Hgh Resistivity | N-type | P-type | Transparent UVC | Epitaxial Crystal Surface |
|---|---|---|---|---|---|---|
| **Gallium-Oxide**<br>**$Ga_2O_3$** | Monoclinic | Insulating<br>Compensated | Si, Ge, Sn<br>RE<br>Ga-rich/O-vac | Mg, Zn, Ni<br>Bi, N, Li<br>O-rich/Ga-vac | $l_{min}$ > 250nm<br>$l_{min}$ > 250nm | (001), (-201), (110), (010) |
| **Gallium-Oxide**<br>**$Ga_2O_3$** | Trigonal, Hexagonal<br>Corundum | Insulating<br>Compensated | Si, Ge, Sn<br>RE<br>Ga-rich/O-vac | Mg, Zn, Ni<br>Bi, N, Li<br>O-rich/Ga-vac | $l_{min}$ > 250nm<br>$l_{min}$ > 250nm | R-plane, M-plane<br>A-plane, C-plane |
| **Aluminum-Gallium-Oxide**<br>**$(Ga_xAl_{1-x})_2O_3$** | Monoclinic: Al% < 50%<br>Corundum: Al > 50% | Insulating<br>Compensated | Si, Ge, Sn<br>RE | Mg, Zn, Ni<br>Bi, N, Li | $l_{min}$ > 200nm<br>$l_{min}$ > 200nm | (001), (-201), (110), (010)<br>A-, R-, M-, C-plane |
| **Aluminum-Oxide**<br>**$Al_2O_3$** | Trigonal, Hexagonal<br>Corundum | Insulating<br>Compensated | F | /<br>/ | $l_{min}$ > 172nm<br>$l_{min}$ > 172nm | R-plane, M-plane<br>A-plane, C-plane |

*FIG. 43A*

TABLE II

| Oxide | Crystal Symmetry | unit cells parameters a (Å) | b (Å) | c(Å) | α | β | γ |
|---|---|---|---|---|---|---|---|
| $Ga_2O_3$ | C2/m | 12.452 | 3.083 | 5.876 | 90 | 103.68 | 90 |
| $Ga_2O_3$ | R3c | 5.059 | 5.059 | 13.625 | 90 | 90 | 120 |
| $Al_2O_3$ | C2/m | 11.926 | 2.941 | 5.671 | 90 | 104.03 | 90 |
| $Al_2O_3$ | R3c | 4.805 | 4.805 | 13.116 | 90 | 90 | 120 |

*FIG. 43B*

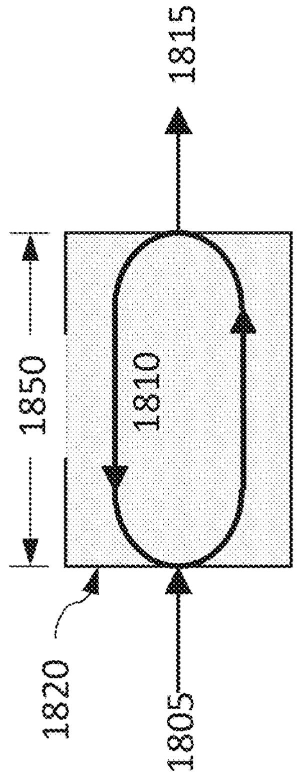
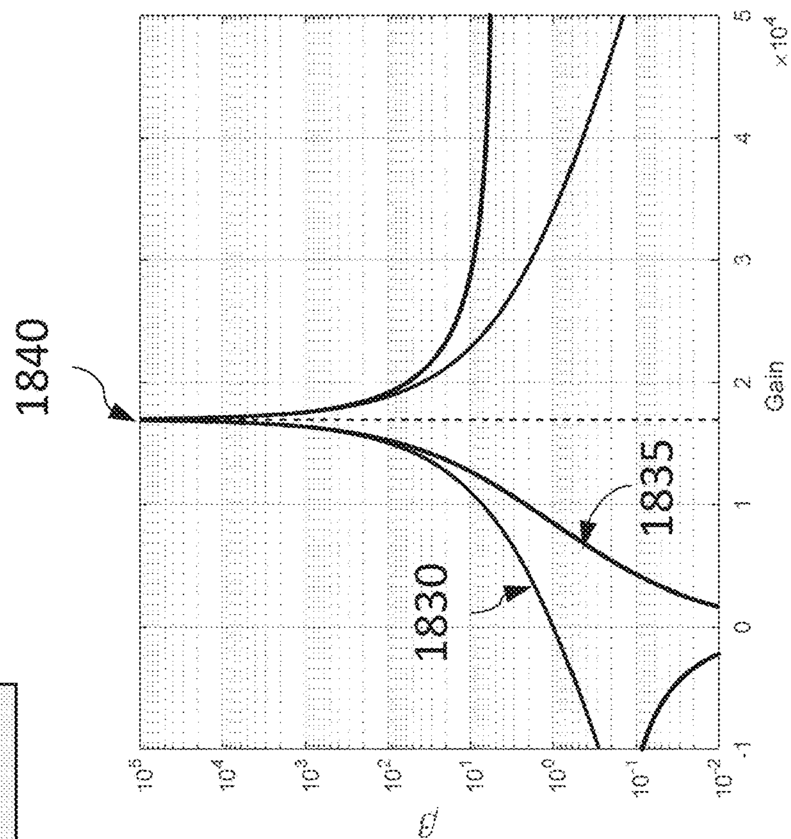
FIG. 58B
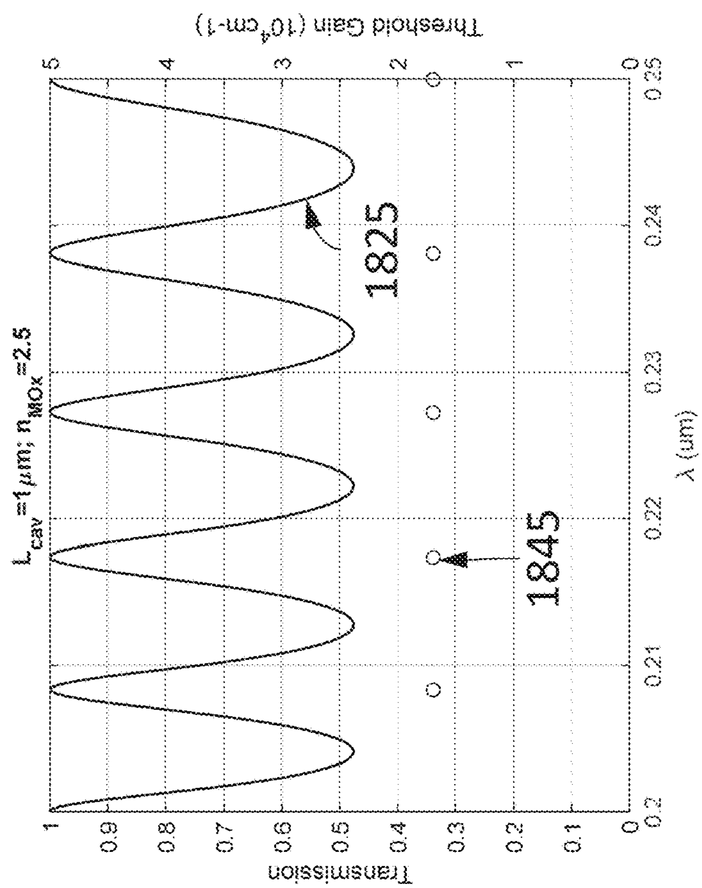
FIG. 58A

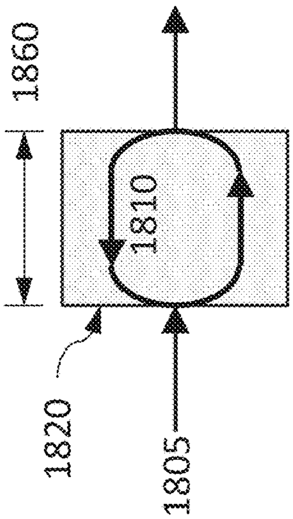
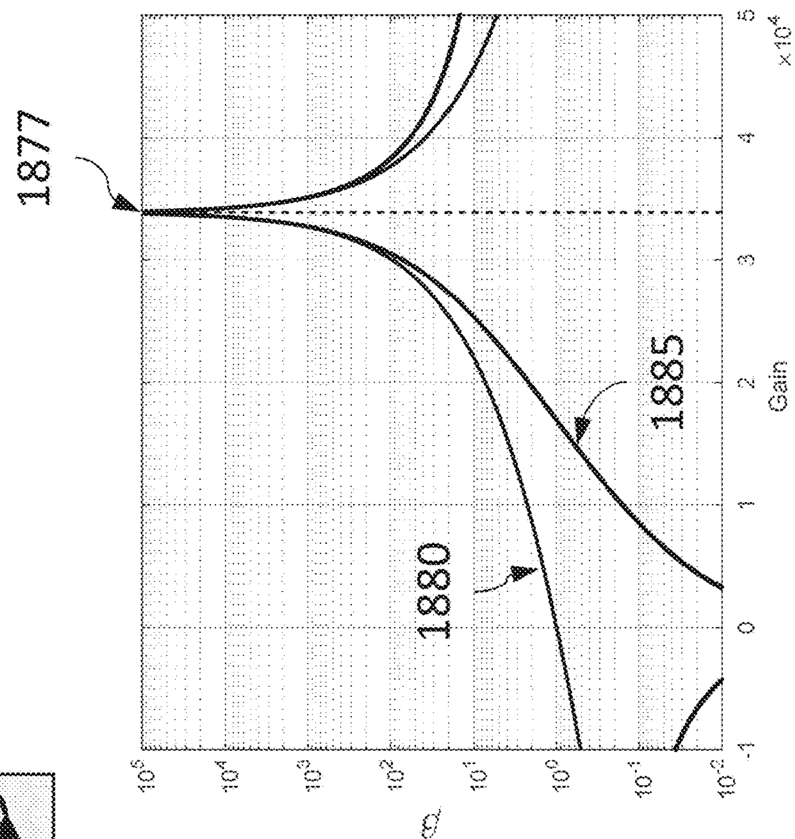
FIG. 59B
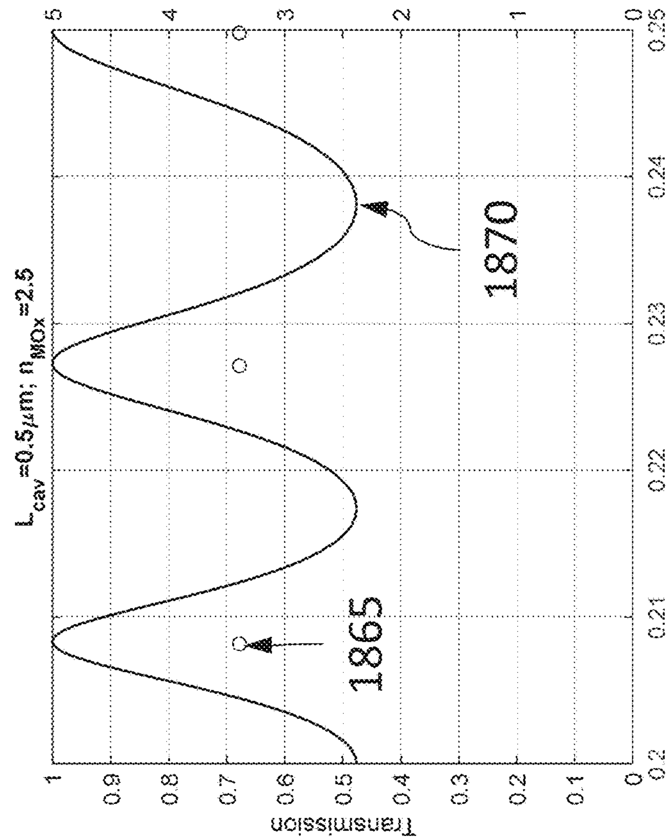
FIG. 59A

| Material | SG | a | b | c | Eg (eV) | λ_g |
|---|---|---|---|---|---|---|
| MgO | Fm3m | 4.2565 | 4.2565 | 4.2565 | 7.6865 | 161.30 |
| 2ax MgO | Fm3m | 8.5130 | 8.5130 | 8.5130 | 7.6865 | 161.30 |
| \sqrt{2a}x MgO | Fm3m | 6.0196 | 6.0196 | 6.0196 | 7.6865 | 161.30 |
| 2\sqrt2x MgO | Fm3m | 12.0392 | 12.0392 | 12.0392 | 7.6865 | 161.30 |
| NiO | Fm3m | 4.2166 | 4.2166 | 4.2166 | 1.9600 | 280.88 |
| \sqrt{2a}x NiO | Fm3m | 5.9632 | 5.9632 | 5.9632 | 1.9600 | 280.88 |
| 2ax NiO | Fm3m | 8.4332 | 8.4332 | 8.4332 | 1.9600 | 280.88 |
| 2\sqrt2x NiO | Fm3m | 11.9264 | 11.9264 | 11.9264 | 1.9600 | 280.88 |
| Mg_2GeO_4 | Fd3m | 8.3499 | 8.3499 | 8.3499 | 5.8052 | 213.57 |
| MgGa_2O_4 | Fd3m | 8.4568 | 8.4568 | 8.4568 | 6.1801 | 200.61 |
| Mg(Al_{0.5}Ga_{0.5})_2O_4 | Fd3m | 8.3137 | 8.3137 | 8.3137 | 7.3063 | 169.69 |
| MgAl_2O_4 | Fd3m | 8.1707 | 8.1707 | 8.1707 | 8.6054 | 144.07 |
| (Mg_{0.5}Zn_{0.5})Al_2O_4 | Fd3m | 8.1743 | 8.1743 | 8.1743 | 7.4621 | 166.15 |
| ZnGa_2O_4 | Fd3m | 8.4590 | 8.4590 | 8.4590 | 5.7651 | 215.05 |
| Zn(Al_{0.5}Ga_{0.5})_2O_4 | Fd3m | 8.3185 | 8.3185 | 8.3185 | 5.9800 | 207.32 |
| ZnAl_2O_4 | Fd3m | 8.1779 | 8.1779 | 8.1779 | 6.7745 | 183.01 |
| (Mg_{0.5}Zn_{0.5})Ga_2O_4 | Fd3m | 8.4579 | 8.4579 | 8.4579 | 5.9726 | 207.58 |
| \kappa-Ga_2O_3 | Pna21 | 5.0200 | 8.7000 | 9.2800 | 5.3595 | 231.33 |
| \kappa-(Al_{0.5}Ga_{0.5})_2O_3 | Pna21 | 4.9532 | 8.5484 | 9.1524 | 5.8799 | 210.85 |
| \kappa-Al_2O_3 | Pna21 | 4.8864 | 8.3968 | 9.0248 | 7.9897 | 155.17 |
| \alpha-Ga_2O_3 | R3c | 5.0595 | 5.0595 | 13.6248 | 5.1195 | 242.17 |
| \alpha-(Al_{0.25}Ga_{0.25})_2O_3 | R3c | 4.9959 | 4.9959 | 13.4977 | 5.8824 | 210.76 |
| \alpha-(Al_{0.5}Ga_{0.5})_2O_3 | R3c | 4.9323 | 4.9323 | 13.3705 | 6.7263 | 184.32 |
| \alpha-(Al_{0.75}Ga_{0.75})_2O_3 | R3c | 4.8687 | 4.8687 | 13.2434 | 7.7502 | 159.97 |
| \alpha-Al_2O_3 | R3c | 4.8050 | 4.8050 | 13.1163 | 8.9082 | 139.18 |
| \beta-Ga_2O_3 | C2m | 3.0830 | 5.8762 | 12.4524 | 4.9000 | 253.02 |
| \beta-(Al_{0.125}Ga_{0.875})_2O_3 | C2m | 3.0652 | 5.8504 | 12.3866 | 5.0880 | 243.67 |
| \beta-(Al_{0.25}Ga_{0.75})_2O_4 | C2m | 3.0475 | 5.8247 | 12.3208 | 5.3772 | 230.57 |
| \beta-(Al_{0.375}Ga_{0.625})_2O_3 | C2m | 3.0297 | 5.7990 | 12.2549 | 5.7082 | 217.20 |
| \beta-(Al_{0.5}Ga_{0.5})_2O_3 | C2m | 3.0120 | 5.7733 | 12.1891 | 6.0086 | 206.34 |
| \beta-Al_2O_3 | C2m | 2.9410 | 5.6705 | 11.9257 | 7.2400 | 171.24 |
| \gamma-Ga_2O_3 | Fd3m | 8.2376 | 8.2376 | 8.2376 | 4.8000 | 258.29 |
| \gamma-(Al_{0.5}Ga_{0.5})_2O_3 | Fd3m | 8.0743 | 8.0743 | 8.0743 | 5.8300 | 212.66 |
| \gamma-Al_2O_3 | Fd3m | 7.9110 | 7.9110 | 7.9110 | 6.8600 | 180.73 |
| Li_2O | Fm3m | 4.6588 | 4.6588 | 4.6588 | 7.4507 | 166.40 |
| LiGaO_2 | Pna21 | 5.0941 | 5.0941 | 6.4571 | 6.2705 | 197.72 |
| Li(Al_{0.25}Ga_{0.75})O_2 | Pna21 | 5.1281 | 5.1281 | 6.4245 | 6.5525 | 189.21 |
| Li(Al_{0.5}Ga_{0.5})O_2^{Pna21} | Pna21 | 5.1621 | 5.1621 | 6.3919 | 6.8626 | 180.66 |
| Li(Al_{0.5}Ga_{0.5})O_2^{P421} | P421212 | 5.1621 | 5.1621 | 6.3919 | 7.9425 | 156.10 |
| Li(Al_{0.75}Ga_{0.25})O_2 | P421212 | 5.1961 | 5.1961 | 6.3593 | 8.0277 | 154.44 |
| LiAlO_2 | P421212 | 5.2301 | 5.2301 | 6.3267 | 8.5273 | 145.39 |
| LiF | Fm3m | 4.0834 | 4.0834 | 4.0834 | 13.2616 | 93.49 |
| 2ax LiF | Fm3m | 8.1669 | 8.1669 | 8.1669 | 13.2616 | 93.49 |
| \sqrt2x LiF | Fm3m | 5.7748 | 5.7748 | 5.7748 | 13.2616 | 93.49 |
| 2\sqrt2x LiF | Fm3m | 11.5497 | 11.5497 | 11.5497 | 13.2616 | 93.49 |

*FIG. 76A-1*

| Material | SG | a | b | c | Eg (eV) | λ_g |
|---|---|---|---|---|---|---|
| Zn_2GeO_4 | R3 | 9.6625 | 14.4727 | 14.4727 | 5.5550 | 223.19 |
| ZnGeO_3 | R3 | 5.0937 | 5.0937 | 13.2629 | 4.7671 | 260.07 |
| Al_2Ge_2O_7 | C2c | 7.2791 | 7.8244 | 9.8132 | 6.1737 | 200.82 |
| Ni_2GeO_4 | Fd3m | 8.3131 | 8.3131 | 8.3131 | 1.5400 | 805.06 |
| Ga_4GeO_8 | C2m | 3.0475 | 9.5257 | 12.3879 | 4.1830 | 296.39 |
| NiGa_2O_4 | Fd3m | 8.4109 | 8.4109 | 8.4109 | 4.4000 | 281.77 |
| Li_4GeO_4 | Cmcm | 6.1384 | 7.4326 | 7.8796 | 7.2005 | 172.18 |
| Li_2GeO_3 | Cmc21 | 4.9348 | 5.5482 | 9.7284 | 6.4792 | 191.35 |
| LiMg_3O_4 | Pm3m | 4.2294 | 4.2294 | 4.2294 | 8.0208 | 154.57 |
| Ga_3NO_3 | R3m | 5.9139 | 5.9139 | 14.7213 | 4.0235 | 308.14 |
| Ga_3NO_3 | C2m | 5.9174 | 10.3343 | 10.3539 | 3.8100 | 325.41 |
| LiNi_2O_4 | P4332 | 8.1127 | 8.1127 | 8.1127 | 6.6476 | 186.50 |
| SiC-4H | P63mc | 3.0949 | 3.0949 | 15.1845 | 3.3608 | 368.90 |
| wz-AlN | P63mc | 3.1286 | 3.1286 | 5.0170 | 6.4404 | 192.50 |
| zb-AlN | F43m | 4.4014 | 4.4014 | 4.4014 | 5.4069 | 229.30 |
| c-AlN | Fm3m | 4.0690 | 4.0690 | 4.0690 | 6.1832 | 200.51 |
| ErAlO_3 | P63mmc | 3.4458 | 3.4458 | 11.4497 | 5.6210 | 220.57 |
| ErAlO_3 | Ia3d | 12.0502 | 12.0502 | 12.0502 | 6.7460 | 183.78 |
| PrAlO_3 | Pm3m | 3.7902 | 3.7902 | 3.7902 | 4.9570 | 250.11 |
| MgF_2 | P42mnm | 3.0946 | 4.6940 | 4.6940 | 11.9118 | 104.08 |
| NaCl | Fm3m | 5.6917 | 5.6917 | 5.6917 | 10.3897 | 119.33 |
| MgNi_2O_4 | Fd3m | 8.3587 | 8.3587 | 8.3587 | 5.0480 | 245.60 |
| NiAl_2O_4 | Fm3m | 8.2077 | 8.2077 | 8.2077 | 4.6891 | 264.40 |
| NiAl_2O_4 | Imma | 5.6748 | 5.7902 | 8.1022 | 2.5000 | 495.92 |
| Mg_{0.75}Zn_{0.25}O | Fd3m | 4.2465 | 4.2465 | 4.2465 | 5.1252 | 191.1916 |
| (Mg_{0.5}Ni_{0.5})Al_2O_4 | Fd3m | 8.1892 | 8.1892 | 8.1892 | 4.7990 | 258.35 |
| (Mg_{0.5}Ni_{0.5})Ga_2O_4 | Fd3m | 8.4338 | 8.4338 | 8.4338 | 5.2901 | 234.36 |
| (Zn_{0.5}Ni_{0.5})Al_2O_4 | Fd3m | 8.1928 | 8.1928 | 8.1928 | 4.3020 | 288.19 |
| (Zn_{0.5}Ni_{0.5})Ga_2O_4 | Fd3m | 8.4350 | 8.4350 | 8.4350 | 5.0826 | 243.93 |
| Mg_{0.75}Ni_{0.25}O | Fm3m | 4.2525 | 4.2525 | 4.2525 | 5.1252 | 241.90 |
| rGeO_2 | P42mnm | 4.4851 | 4.4851 | 2.9079 | 3.4333 | 361.11 |
| (Mg_{0.5}Zn_{0.5})_2GeO_4 | Fd3m | 8.3315 | 8.3315 | 8.3315 | 4.3377 | 285.82 |

*FIG. 76A-2*

SG= Pna21 Ga2O3

9010: Select gradient pattern growth sequence that transitions from a WBG to a NBG or from a NBG to a WBG material

↓

9020: Select an appropriate substrate

↓

9030: Form the selected gradient pattern on the substrate

EPITAXIAL OXIDE MATERIALS, STRUCTURES, AND DEVICES

RELATED APPLICATIONS

This application is a continuation of U.S. patent application Ser. No. 17/653,828, filed on Mar. 7, 2022, and entitled "Epitaxial Oxide Materials, Structures, and Devices"; which is a continuation of International Application No. PCT/IB2021/060413 filed on Nov. 10, 2021, and entitled "Metal Oxide Semiconductor-Based Light Emitting Device"; which is related to U.S. Pat. No. 11,342,484, filed on Aug. 11, 2020, and entitled "Metal Oxide Semiconductor-Based Light Emitting Device"; to International Application No. PCT/IB2021/060414 filed on Nov. 10, 2021, entitled "Ultra-wide Bandgap Semiconductor Devices Including Magnesium Germanium Oxides"; and to International Application No. PCT/IB2021/060466 filed on Nov. 11, 2021, entitled "Epitaxial Oxide Materials, Structures and Devices"; all of which are hereby incorporated by reference for all purposes.

This application is also related to U.S. application Ser. No. 17/653,824, entitled "Epitaxial Oxide Materials, Structures, and Devices"; and to U.S. application Ser. No. 17/653,828, entitled "Epitaxial Oxide Materials, Structures, and Devices," both of which are hereby incorporated by reference for all purposes.

The following publications are referred to in the present application and their contents are hereby incorporated by reference in their entirety:

- U.S. Pat. No. 9,412,911 titled "OPTICAL TUNING OF LIGHT EMITTING SEMICONDUCTOR JUNCTIONS", issued 9 Aug. 2016, and assigned to the applicant of the present application;
- U.S. Pat. No. 9,691,938 titled "ADVANCED ELECTRONIC DEVICE STRUCTURES USING SEMICONDUCTOR STRUCTURES AND SUPERLATTICES", issued 27 Jun. 2017, and assigned to the applicant of the present application;
- U.S. Pat. No. 10,475,956 titled "OPTOELECTRONIC DEVICE", issued 12 Nov. 2019, and assigned to the applicant of the present application; and The contents of each of the above publications are expressly incorporated by reference in their entirety.

BACKGROUND

Electronic and optoelectronic devices such as diodes, transistors, photodetectors, LEDs and lasers can use epitaxial semiconductor structures to control the transport of free carriers, detect light, or generate light. Wide bandgap semiconductor materials, such as those with bandgaps above about 4 eV, are useful in some applications such as high power devices, and optoelectronic devices that detect or emit light in ultraviolet (UV) wavelengths.

For example, UV light emitting devices (UVLEDs) have many applications in medicine, medical diagnostics, water purification, food processing, sterilization, aseptic packaging and deep submicron lithographic processing. Emerging applications in bio-sensing, communications, pharmaceutical process industry and materials manufacturing are also enabled by delivering extremely short wavelength optical sources in a compact and lightweight package having high electrical conversion efficiency such as a UVLED. Electro-optical conversion of electrical energy into discrete optical wavelengths with extremely high efficiency has generally been achieved using a semiconductor having the required properties to achieve the spatial recombination of charge carriers of electrons and holes to emit light of the required wavelength. In the case where UV light is required, UVLEDs have been developed using almost exclusively Gallium-Indium-Aluminum-Nitride (GaInAlN) compositions forming wurtzite-type crystal structures.

In another example, high power RF switches are used to separate transmitted and received signals in a transceiver of a wireless communication system. A requirement of transistor devices making up such RF switches are the ability to handle high voltages without being damaged. Typical RF switches use transistor devices employing low bandgap semiconductors (e.g., Si or GaAs) with relatively low breakdown voltages (e.g., below about 3 V), and therefore many transistor devices are connected in series to withstand the required voltages. Wider bandgap semiconductors (e.g., GaN) with higher breakdown voltages have been used to improve the maximum voltage limit of RF switches using fewer transistor devices connected in series.

SUMMARY

In some embodiments, a semiconductor structure includes an epitaxial oxide material. In some embodiments, a semiconductor structure includes one or more superlattices comprising epitaxial oxide materials. In some embodiments, a semiconductor structure includes one or more doped superlattices comprising host layers and impurity layers, wherein the host layers comprise an epitaxial oxide material. In some embodiments, a semiconductor structure includes one or more graded layers or regions comprising epitaxial oxide materials. In some embodiments, a semiconductor structure includes one or more chirp layers comprising epitaxial oxide materials. In some embodiments, a semiconductor structure includes one or more chirp layers comprising epitaxial oxide materials, wherein the chirp layers are adjacent to a metal layer. In some embodiments, the semiconductor structures comprise $(Al_xGa_{1-x})_yO_z$ where x is from 0 to 1, y is from 1 to 3, and z is form 2 to 4, for example, with a space group that is R3c (i.e., α), pna21 (i.e., κ), C2m (i.e., β), Fd3m (i.e., γ), and/or Ia3 (i.e., δ).

The semiconductor structures described herein can be a portion of a semiconductor device, such as an optoelectronic device with emission or detection wavelengths including those in the ultraviolet and deep-ultraviolet, a light emitting diode, a laser diode, a photodetector, a solar cell, a high-power diode, a high-power transistor, a transducer, or a high electron mobility transistor.

In some embodiments, a semiconductor structure includes: a first epitaxial oxide semiconductor layer; a metal layer; and a contact layer adjacent to the metal layer, and between the first epitaxial oxide semiconductor layer and the metal layer. The contact layer can include: an epitaxial oxide semiconductor material; and a region comprising a gradient in a composition of the epitaxial oxide semiconductor material adjacent to the metal layer.

In some embodiments, a semiconductor structure includes: a first epitaxial oxide semiconductor layer; a metal layer; and a contact layer adjacent to the metal layer, and between the first epitaxial oxide semiconductor layer and the metal layer. The contact layer can include: an epitaxial oxide semiconductor material; and a gradient in a strain of the epitaxial oxide semiconductor material over a region adjacent to the metal layer.

BRIEF DESCRIPTION OF THE DRAWINGS

Embodiments of the present disclosure will be discussed with reference to the accompanying figures.

FIG. 28 shows a chart of ternary metal oxide combinations that may be adopted in accordance with various illustrative embodiments of the present disclosure in the forming of optoelectronic devices.

FIG. 43A shows in TABLE I a selection of substrate crystals for depositing metal oxide structures in accordance with various illustrative embodiments of the present disclosure.

FIG. 43B shows in TABLE II unit cell parameters of a selection of metal oxides in accordance with various illustrative embodiments of the present disclosure, showing lattice constant mismatches between $Al_2O_3$ and $Ga_2O_3$.

FIGS. 58A and 58B illustrate optical mode structure and threshold gain for a slab of metal-oxide semiconductor material in accordance with an illustrative embodiment of the present disclosure.

FIGS. 59A and 59B illustrate optical mode structure and threshold gain for a slab of metal-oxide semiconductor material in accordance with another illustrative embodiment of the present disclosure.

FIGS. 76A-1, 76A-2, 76B, 76C and 76D show charts and tables of DFT calculated minimum bandgap energies and lattice parameters for some examples of epitaxial oxide materials.

Figure 86:
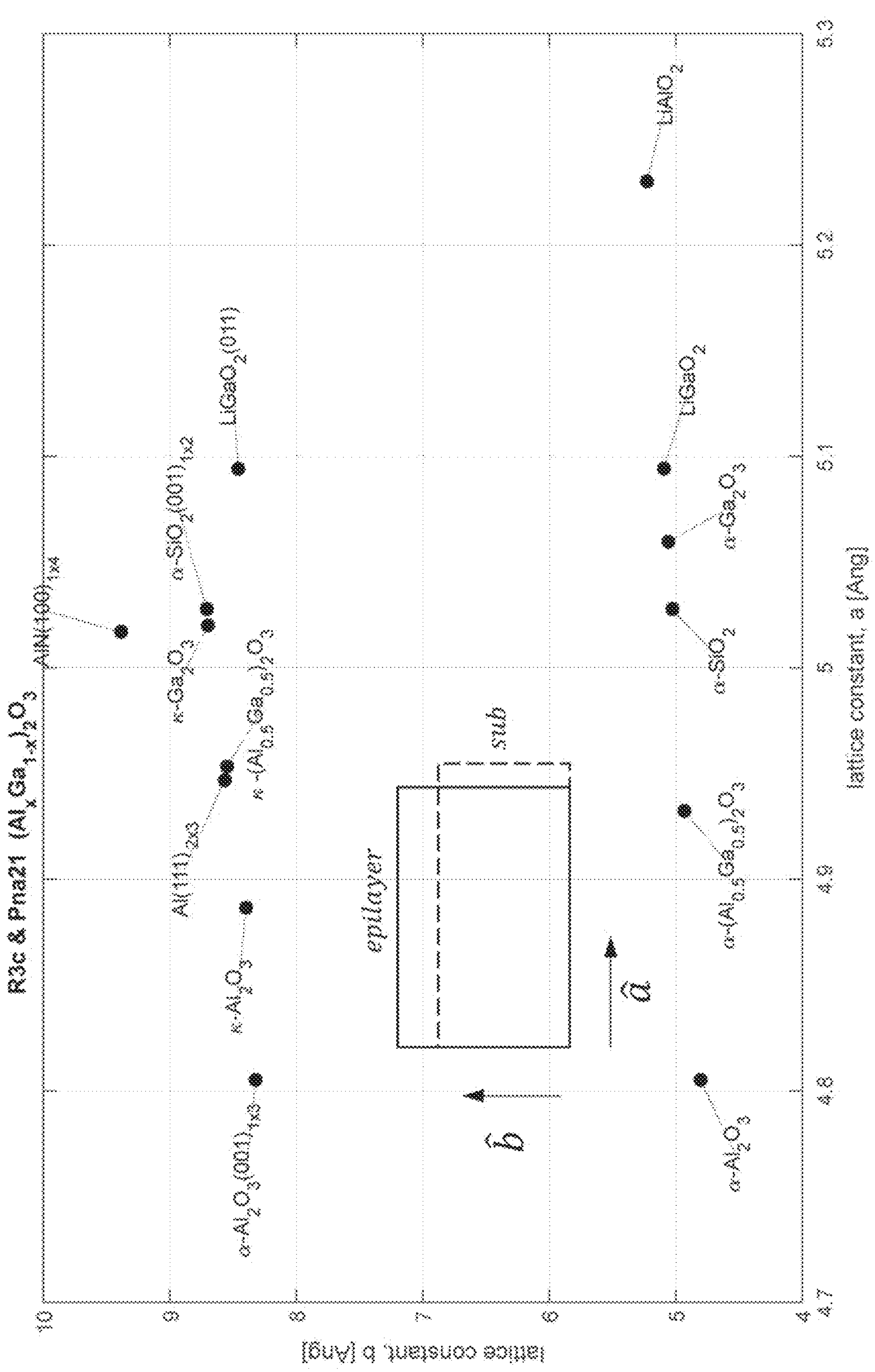

FIG. 86 shows some additional DFT calculated epitaxial oxide materials with lattice constants from about 4.8 Angstroms to about 5.3 Angstroms, that can be substrates for, and/or or form heterostructures with, $\alpha$- and $\kappa$-$Al_xGa_{1-x}O_y$, including $\alpha$-$SiO_2$, $Al(111)_{2\times3}$ (i.e., six atoms of Al(111) forming a 2×3 sub-array have an acceptable lattice mismatch with one unit cell of $\kappa$-$Al_xGa_{1-x}O_y$), and $AlN(100)_{1\times4}$.

FIGS. 87A-87E show atomic structures at surfaces of $\kappa$-$Ga_2O_3$ and some compatible substrates.

Figure 88:
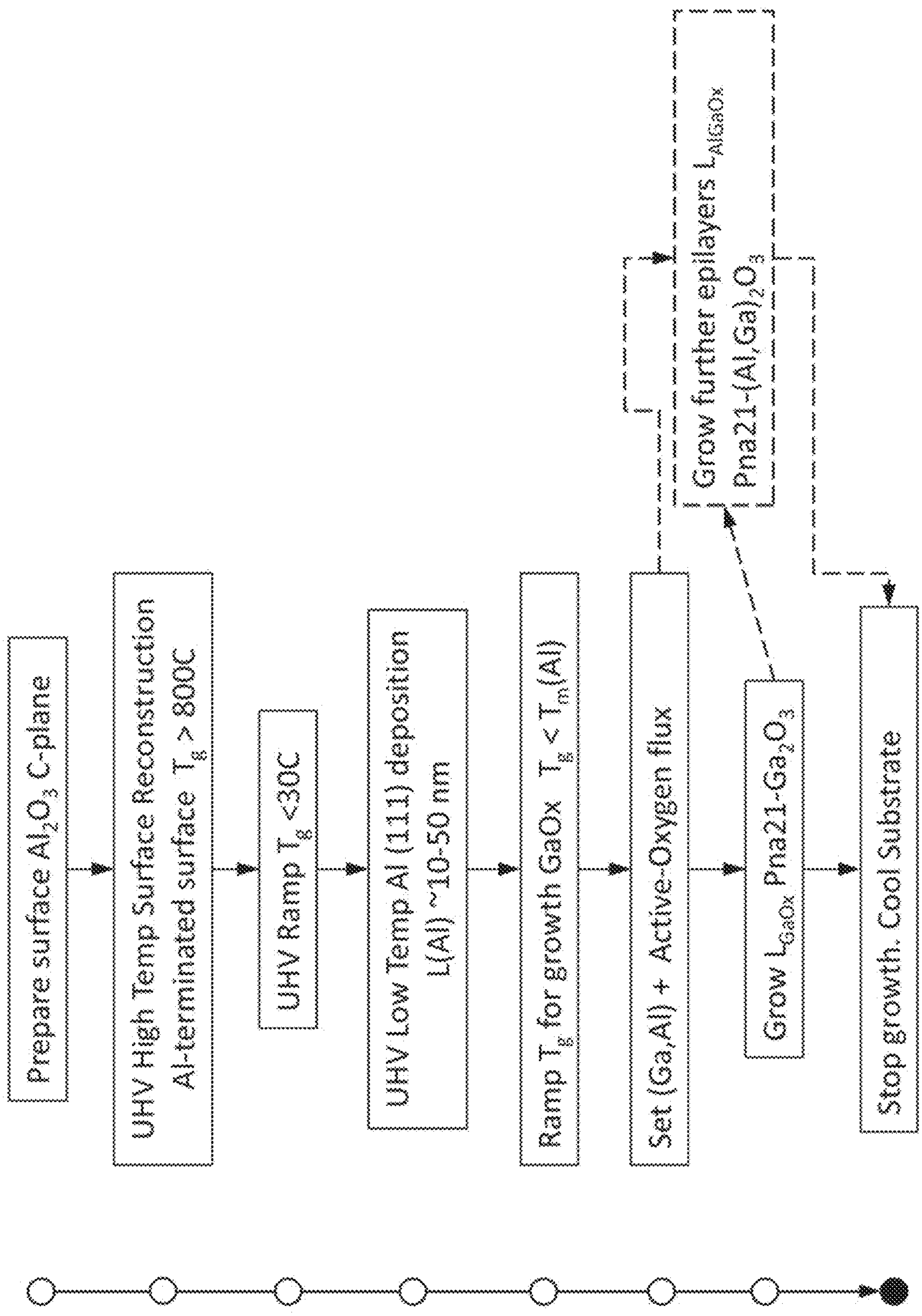

FIG. 88 shows a flowchart of an example method for forming a semiconductor structure comprising $\kappa$-$Al_xGa_{1-x}O_y$.

Figure 89A:
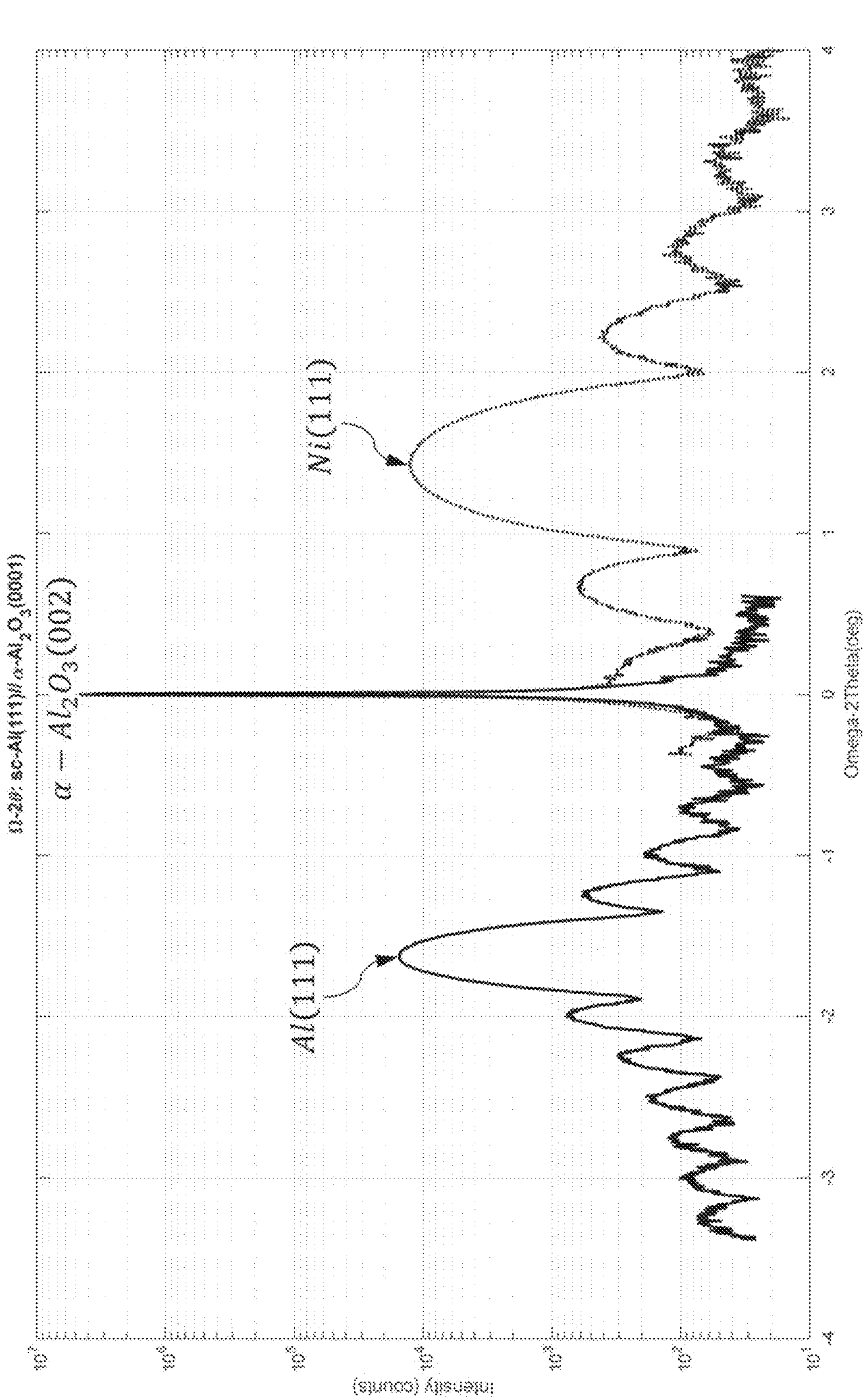
Figure 89B:
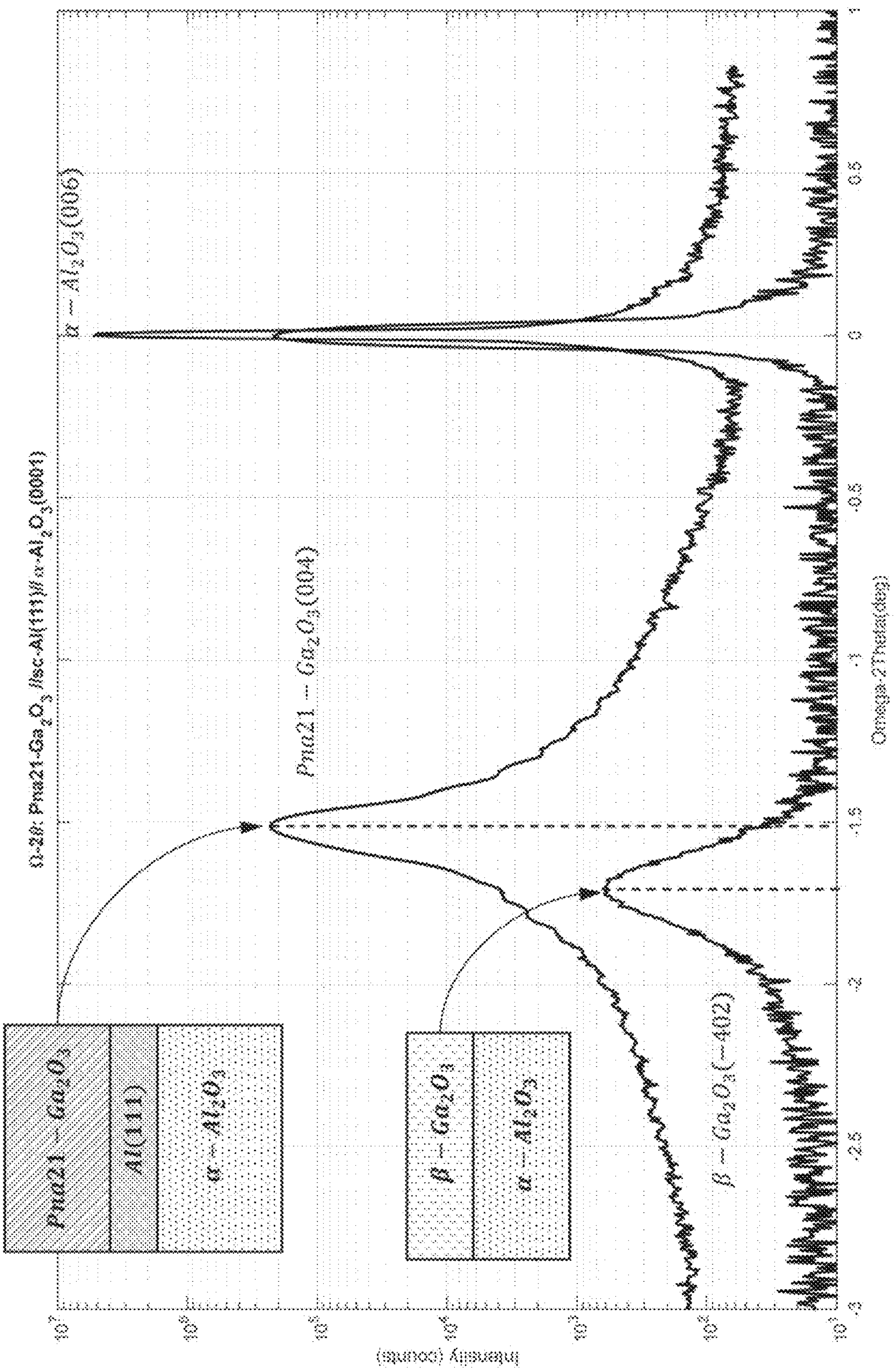
Figure 89C:
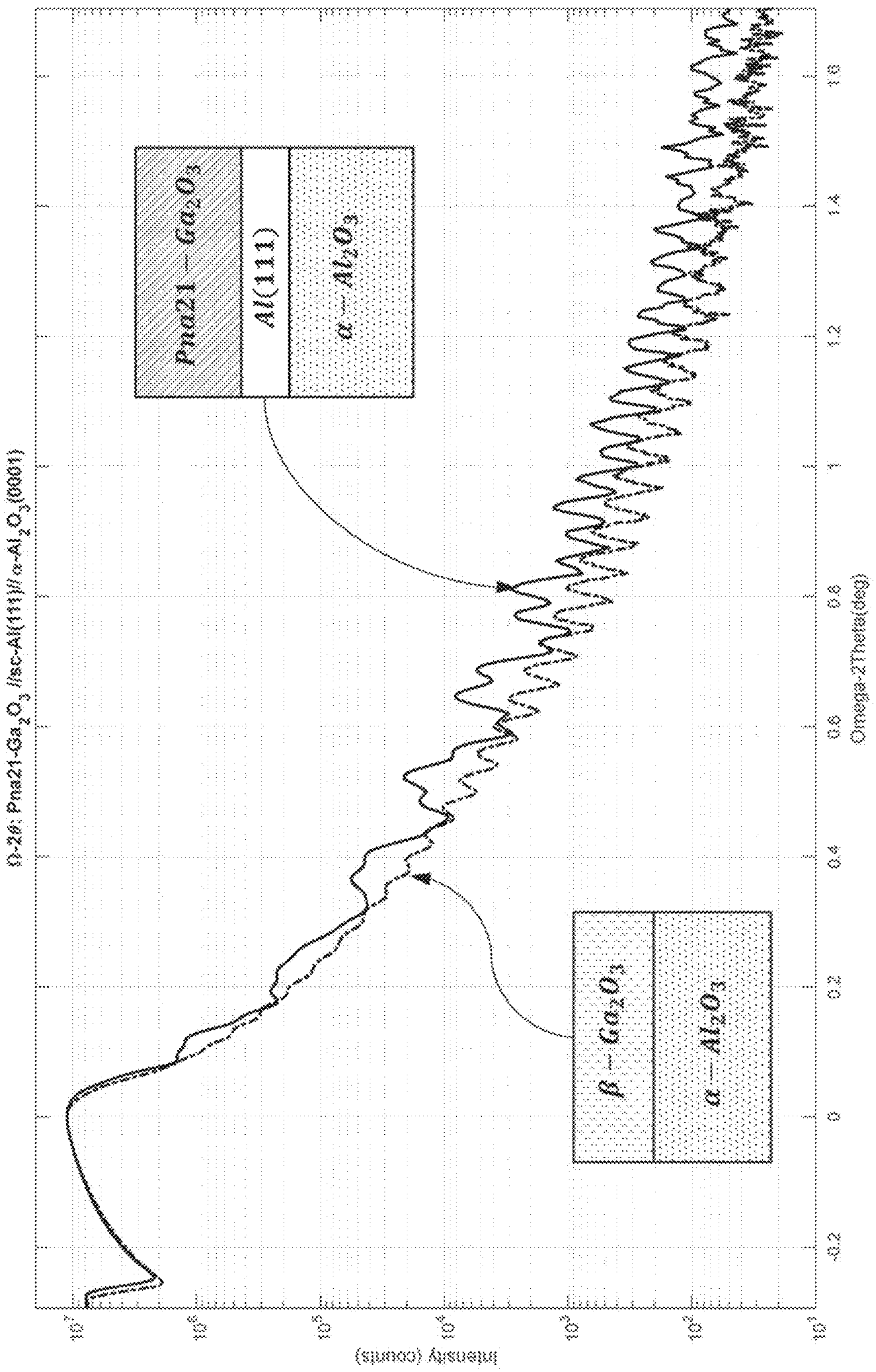

FIGS. 89A-89C are plots of XRD intensity versus angle (in an $\Omega$-$2\theta$ scan) for experimental structures.

FIGS. 90A-90I show examples of semiconductor structures 6201-6209 comprising epitaxial oxide materials in layers or regions.

Figure 90A:
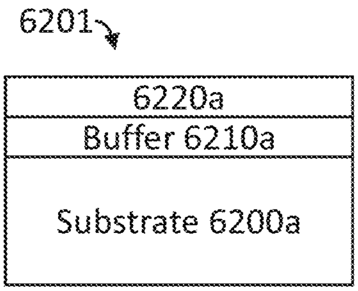
Figure 90B:
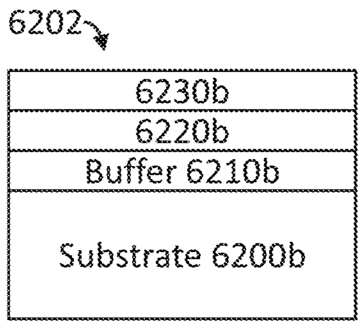
Figure 90C:
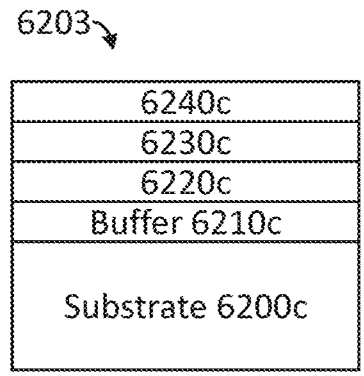
Figure 90D:
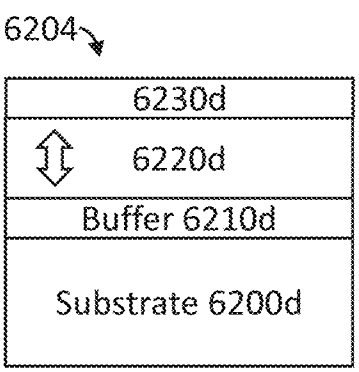
Figure 90E:
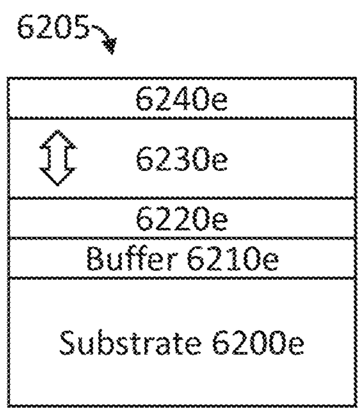
Figure 90F:
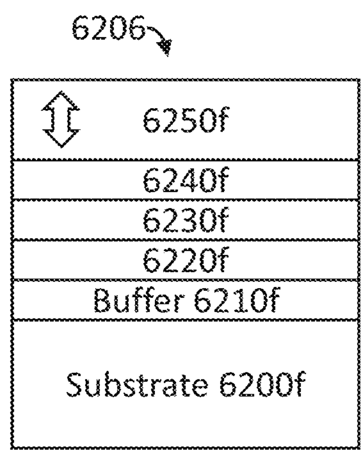
Figure 90G:
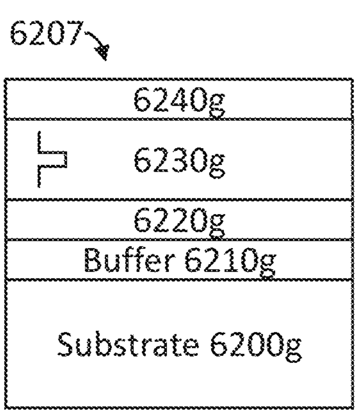
Figure 90H:
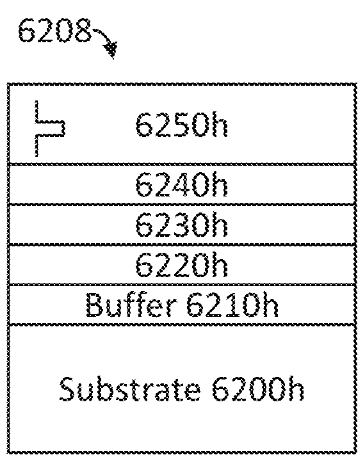
Figure 90I:
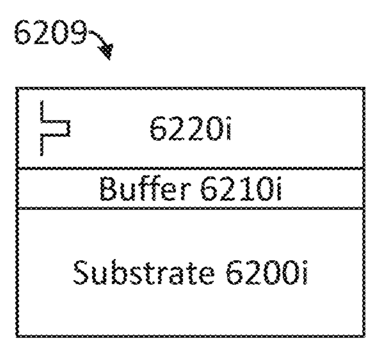
Figure 90J:
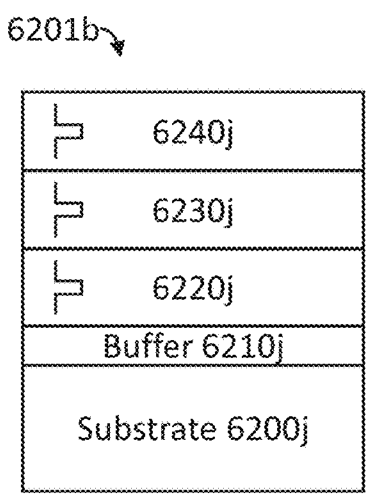
Figure 90K:
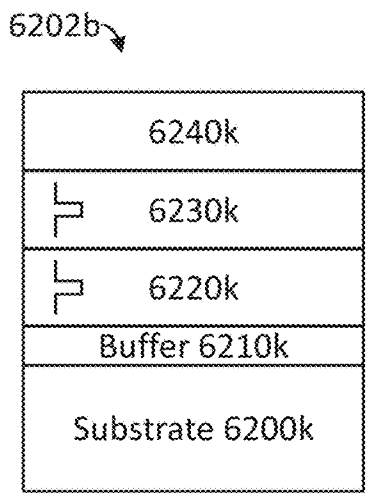
Figure 90L:
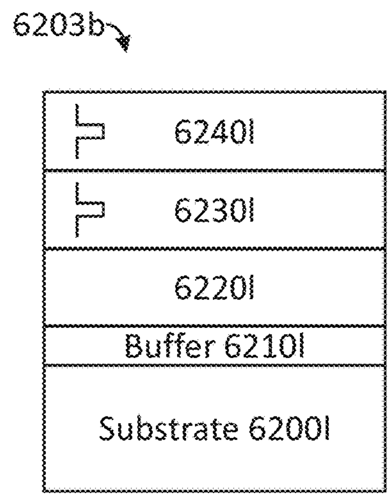

FIGS. 90J-90L show examples of semiconductor structures 6201*b*-6203*b* comprising epitaxial oxide materials in layers or regions.

Figure 91A:
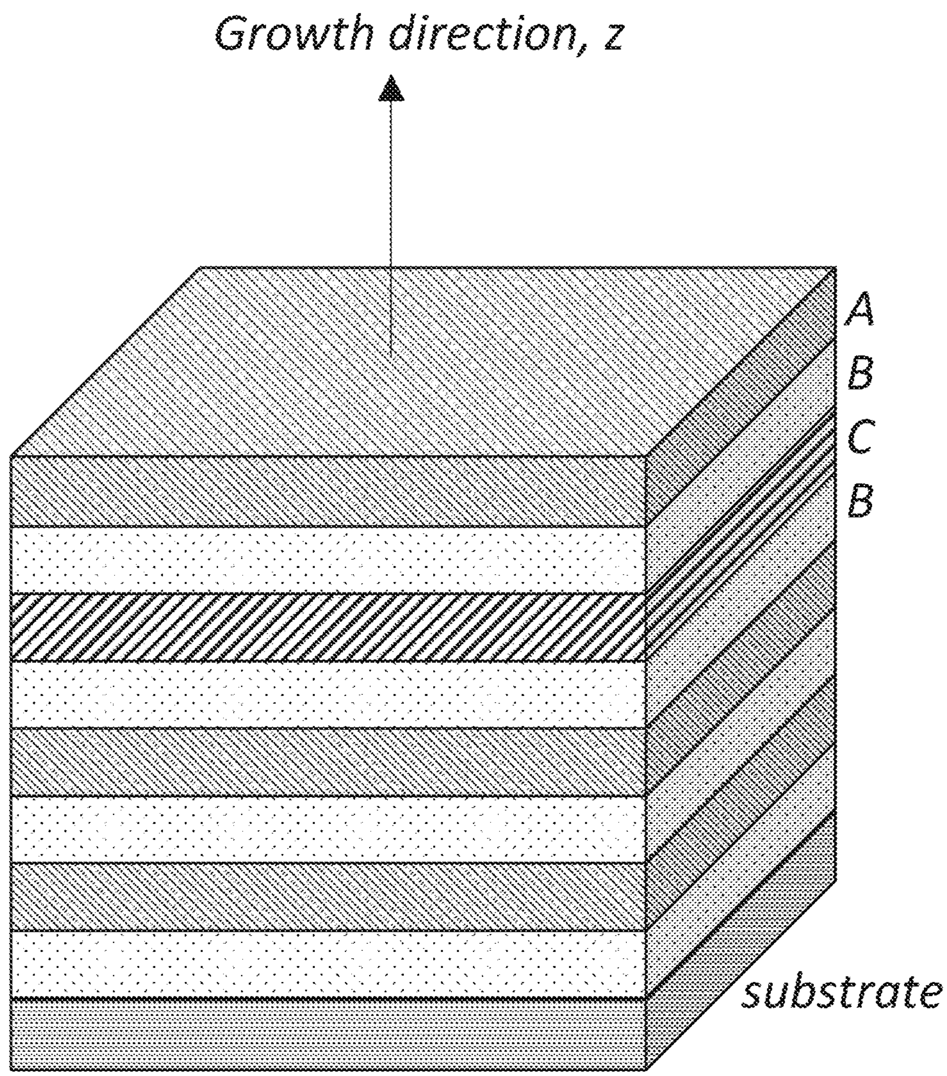

FIG. 91A is a schematic of an example of a semiconductor structure comprising epitaxial oxide layers on a suitable substrate.

FIGS. 91B-91I show electron energy (on the y-axis) vs. growth direction (on the x-axis) for examples of epitaxial oxide heterostructures comprising layers of dissimilar epitaxial oxide materials.

Figure 92A:
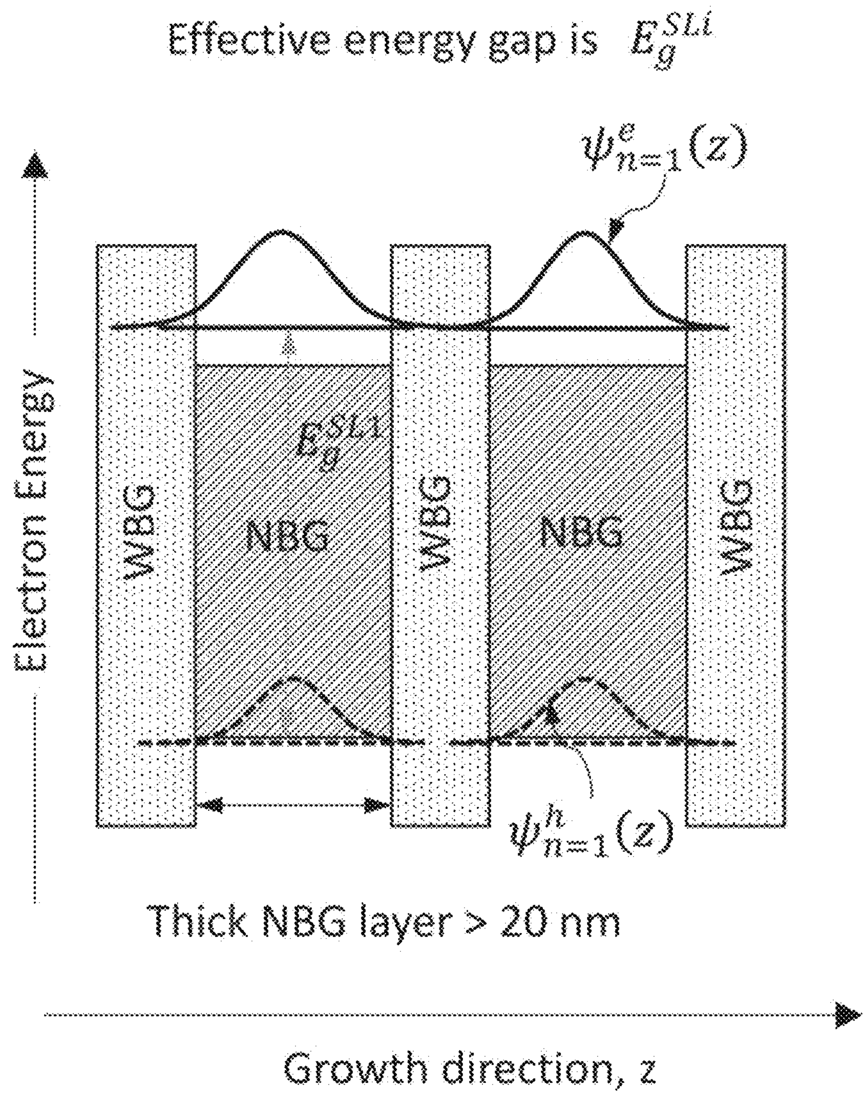
Figure 92B:
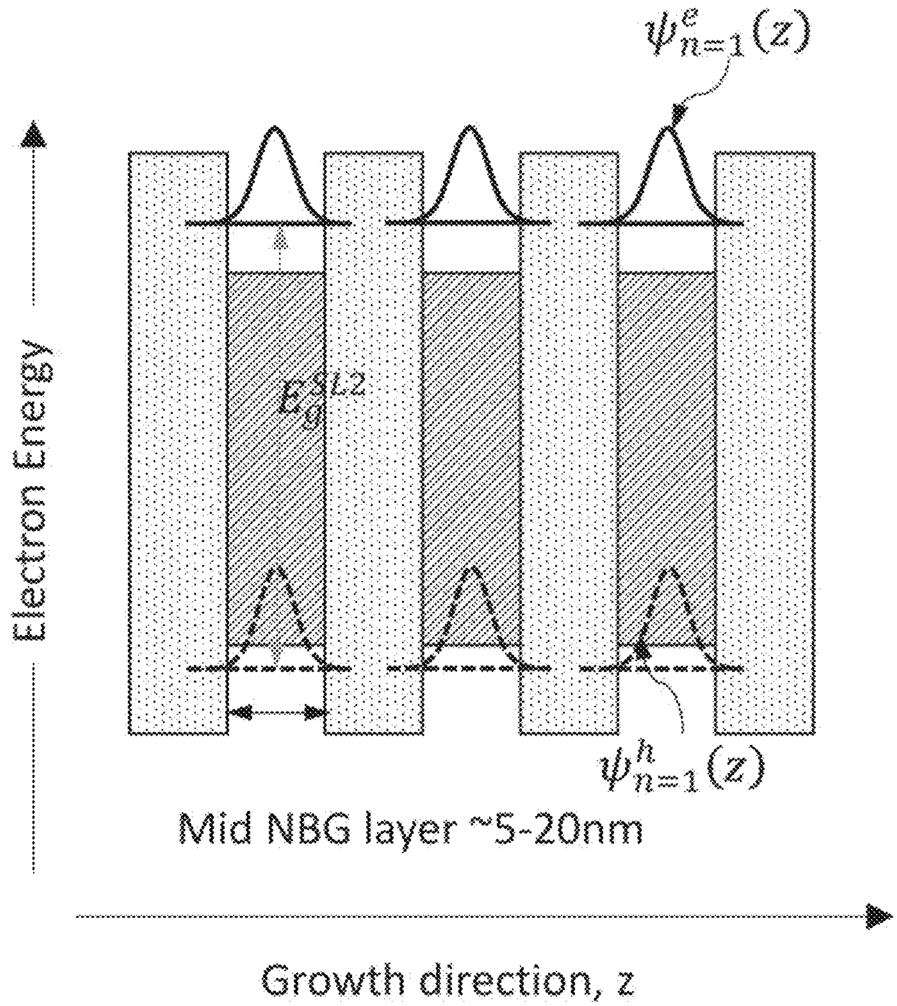
Figure 92C:
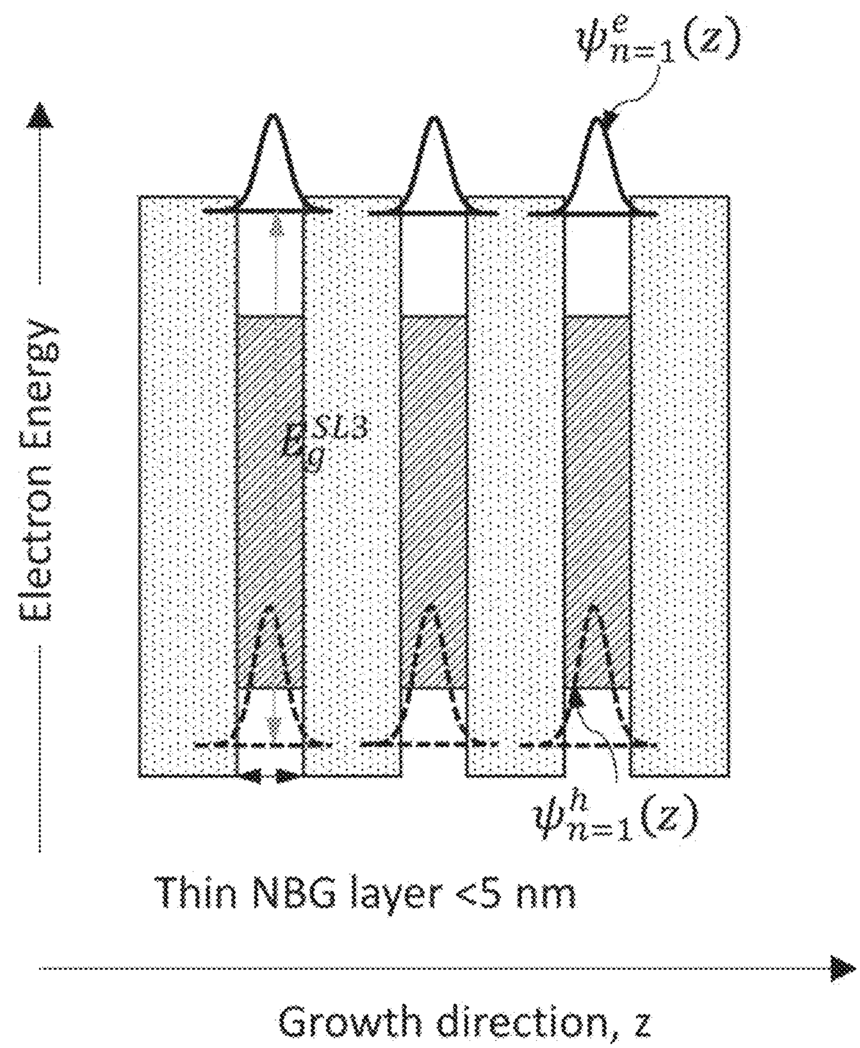

FIGS. 92A-92C show energy versus growth direction (distance, z) for three examples of different digital alloys, and example wavefunctions for the confined electrons and holes in each.

Figure 93:
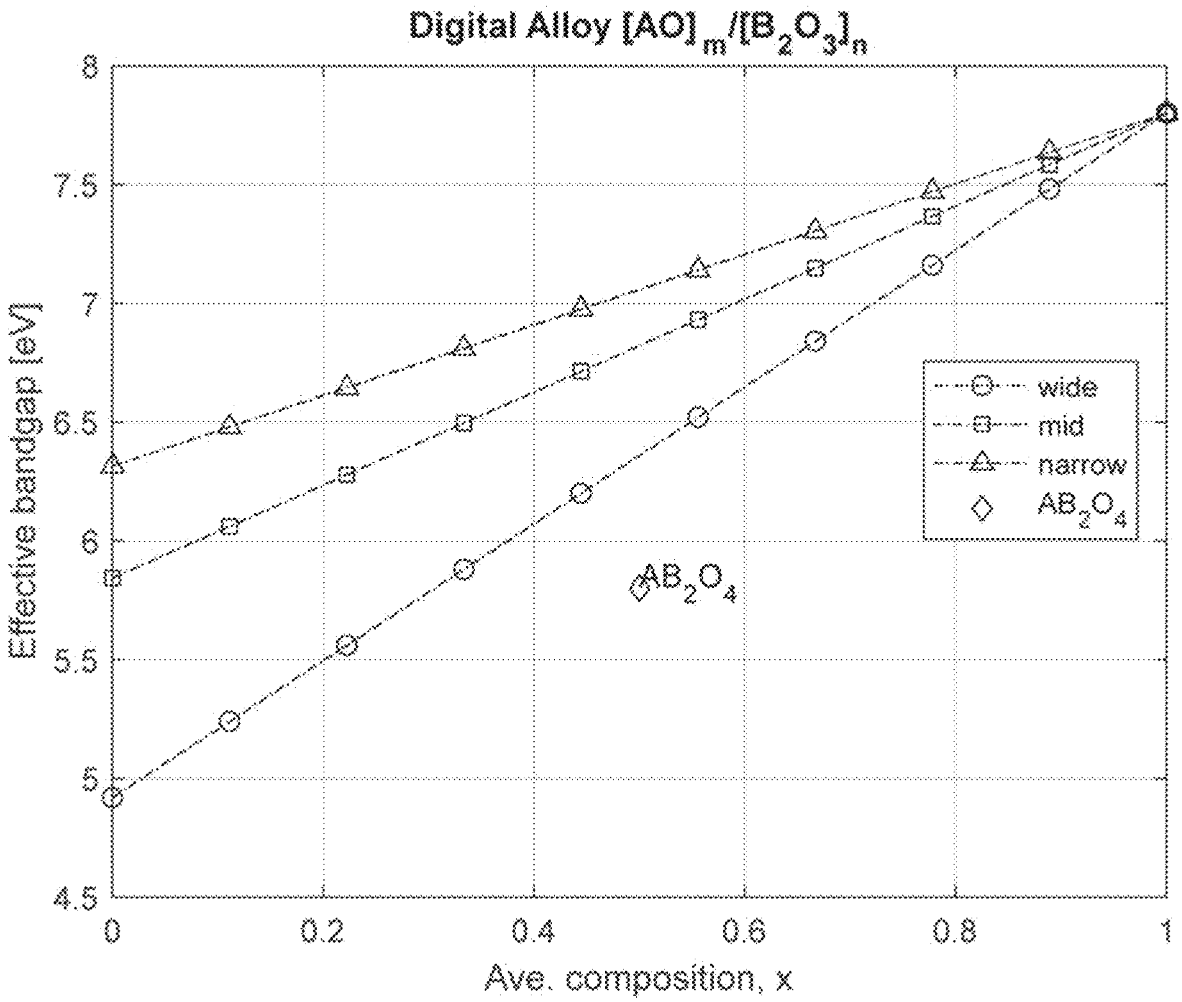

FIG. 93 shows a plot of effective bandgap versus an average composition (x) of the digital alloys shown in FIGS. 92A-92C.

Figure 94A:
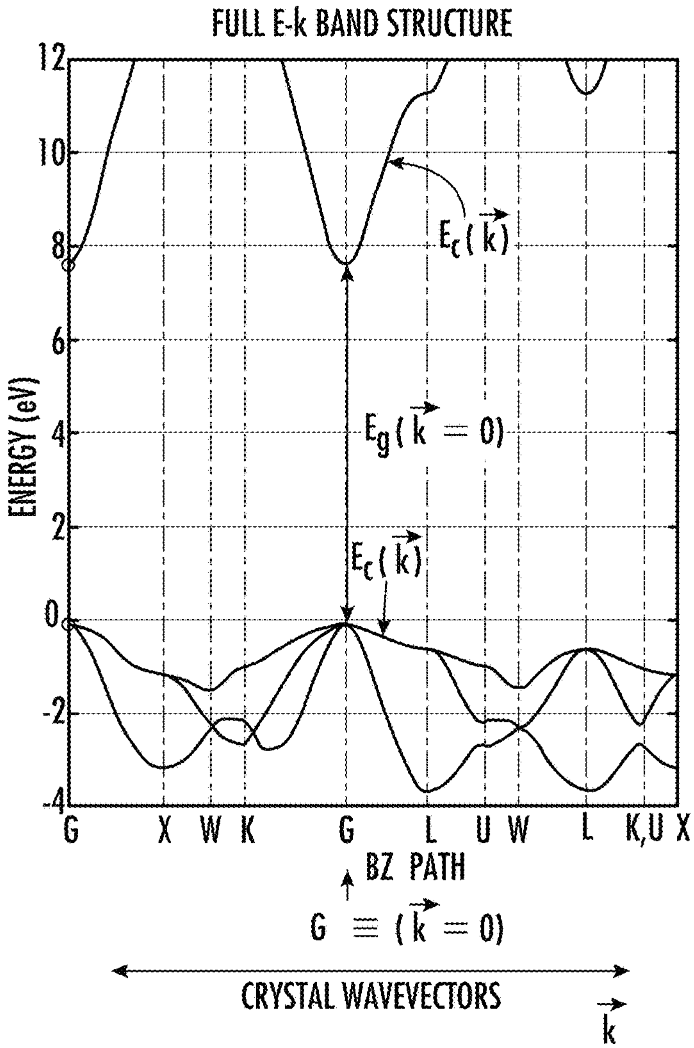

FIG. 94A shows a full E-k band structure of an epitaxial oxide material, which can be derived from the atomic structure of the crystal.

Figure 94B:
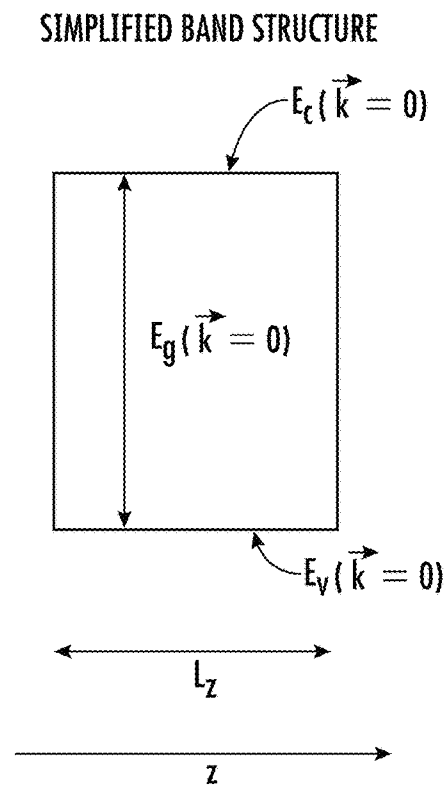

FIG. 94B shows a simplified band structure, which is a representation of the minimum bandgap of the material, and wherein the x-axis is space (z) rather than wavevectors (as in the E-k diagrams).

Figure 95:
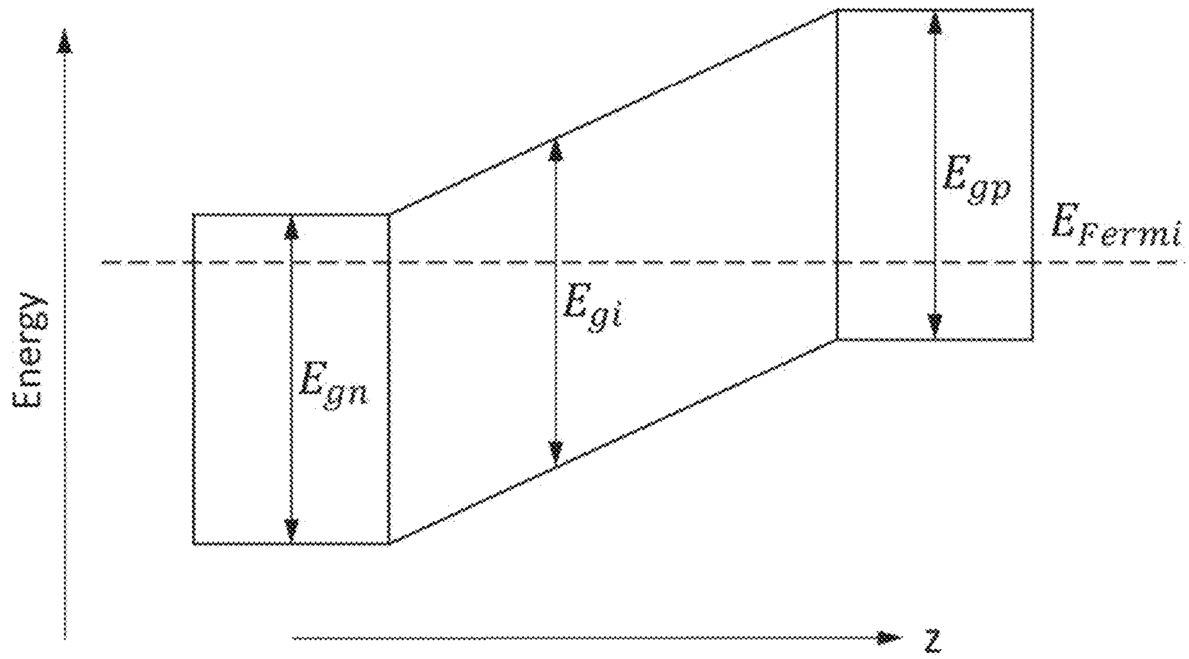

FIG. 95 shows an example of a simplified band structure of a p-i-n device comprising epitaxial oxide layers.

Figure 96:
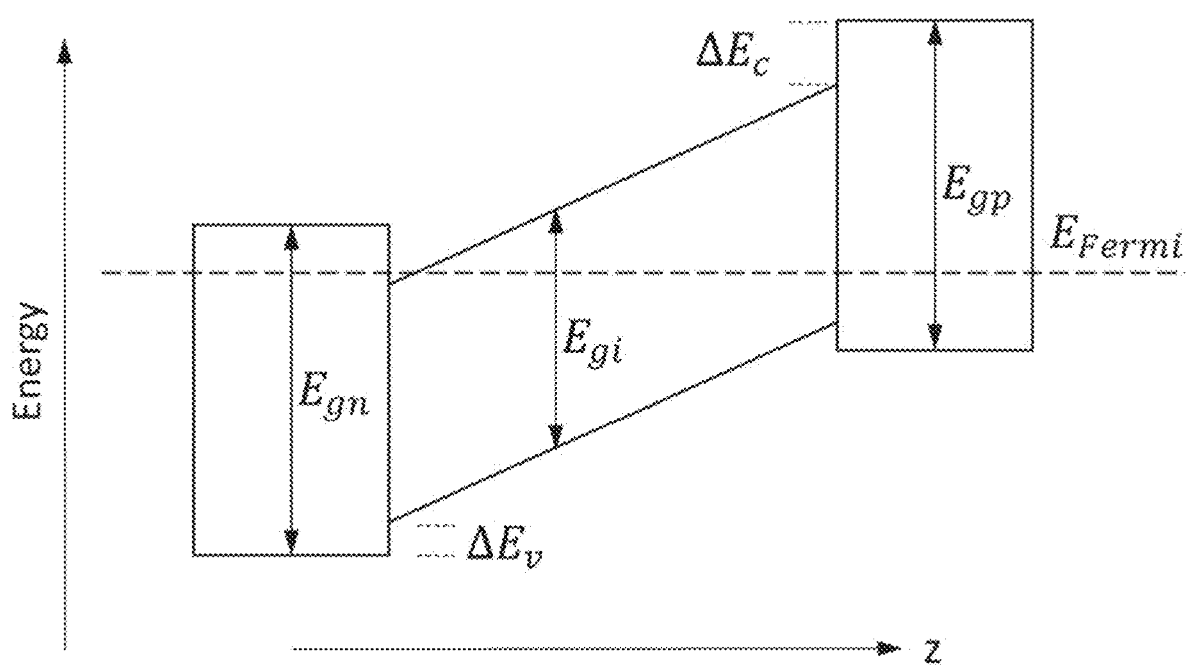

FIG. 96 shows a simplified band structure of a heterojunction p-i-n device comprising epitaxial oxide layers.

Figure 97:
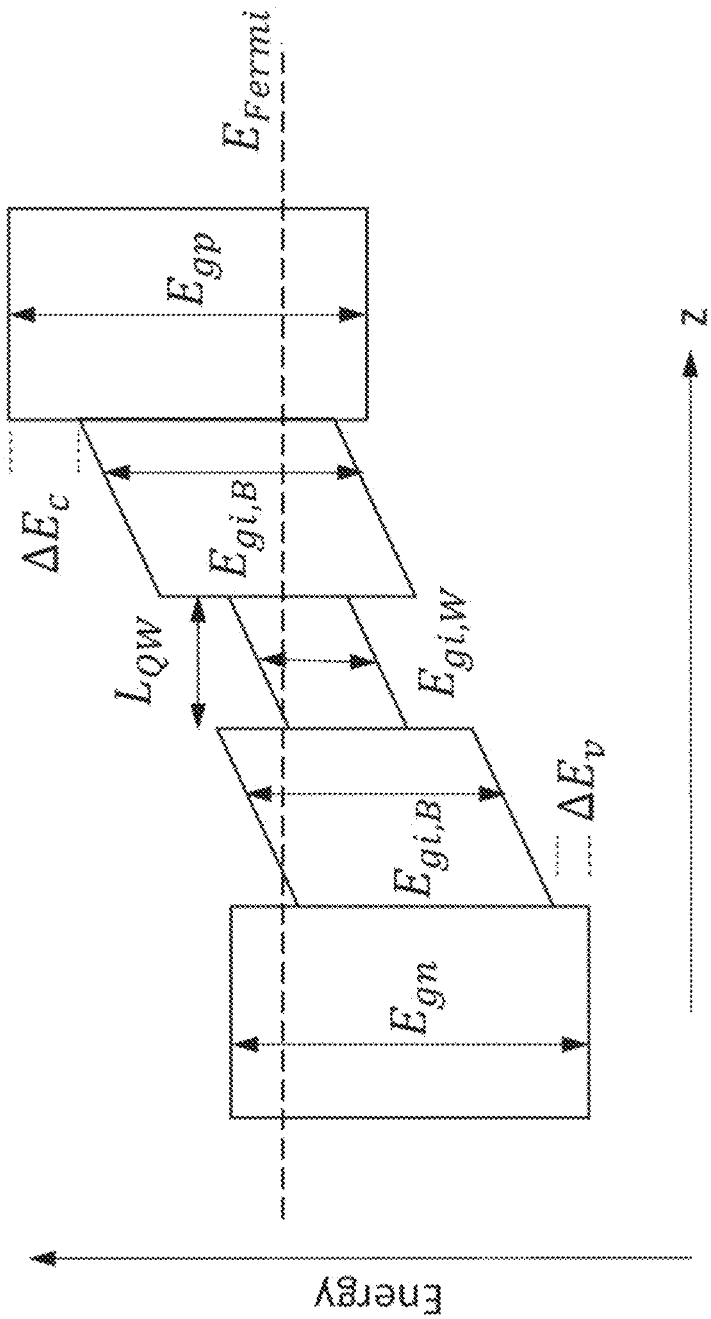

FIG. 97 shows a simplified band structure of a multiple heterojunction p-i-n device comprising epitaxial oxide layers.

Figure 98A:
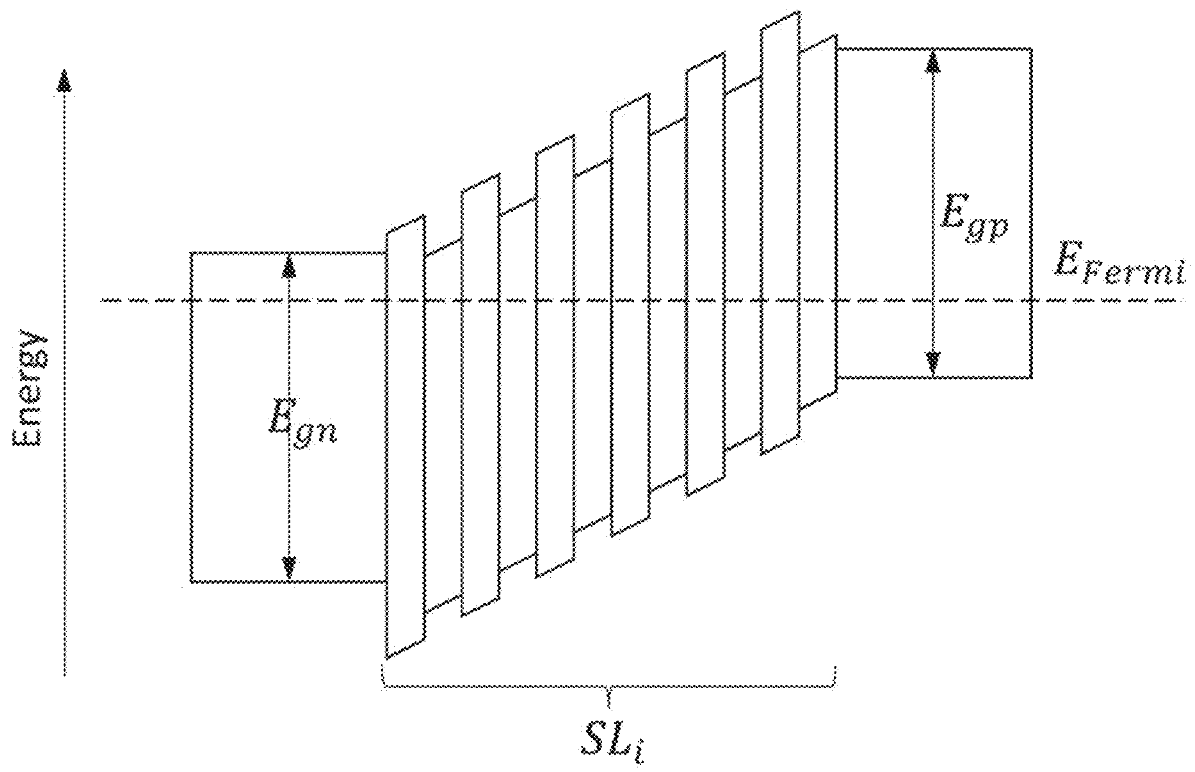

FIG. 98A shows another example of a p-i-n structure, with multiple quantum wells, and where the barrier layers of the multiple quantum well structure in the i-region have larger bandgaps than the bandgap of the n- and p-layers.

Figure 98B:
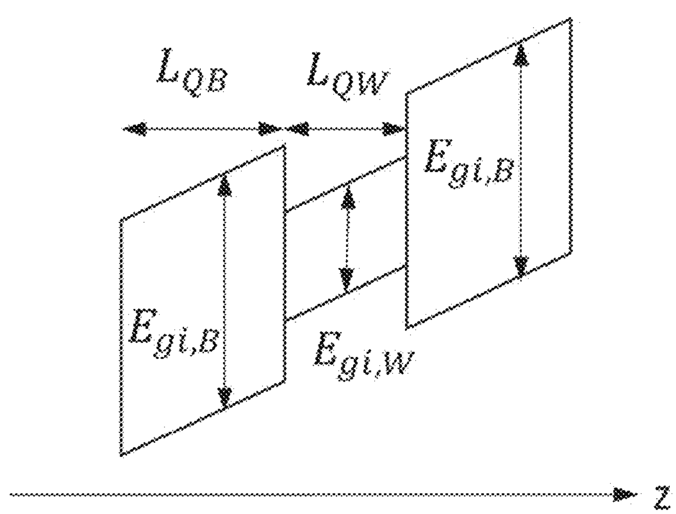

FIG. 98B shows a single quantum well of the multiple quantum well structure in 98A.

Figure 99:
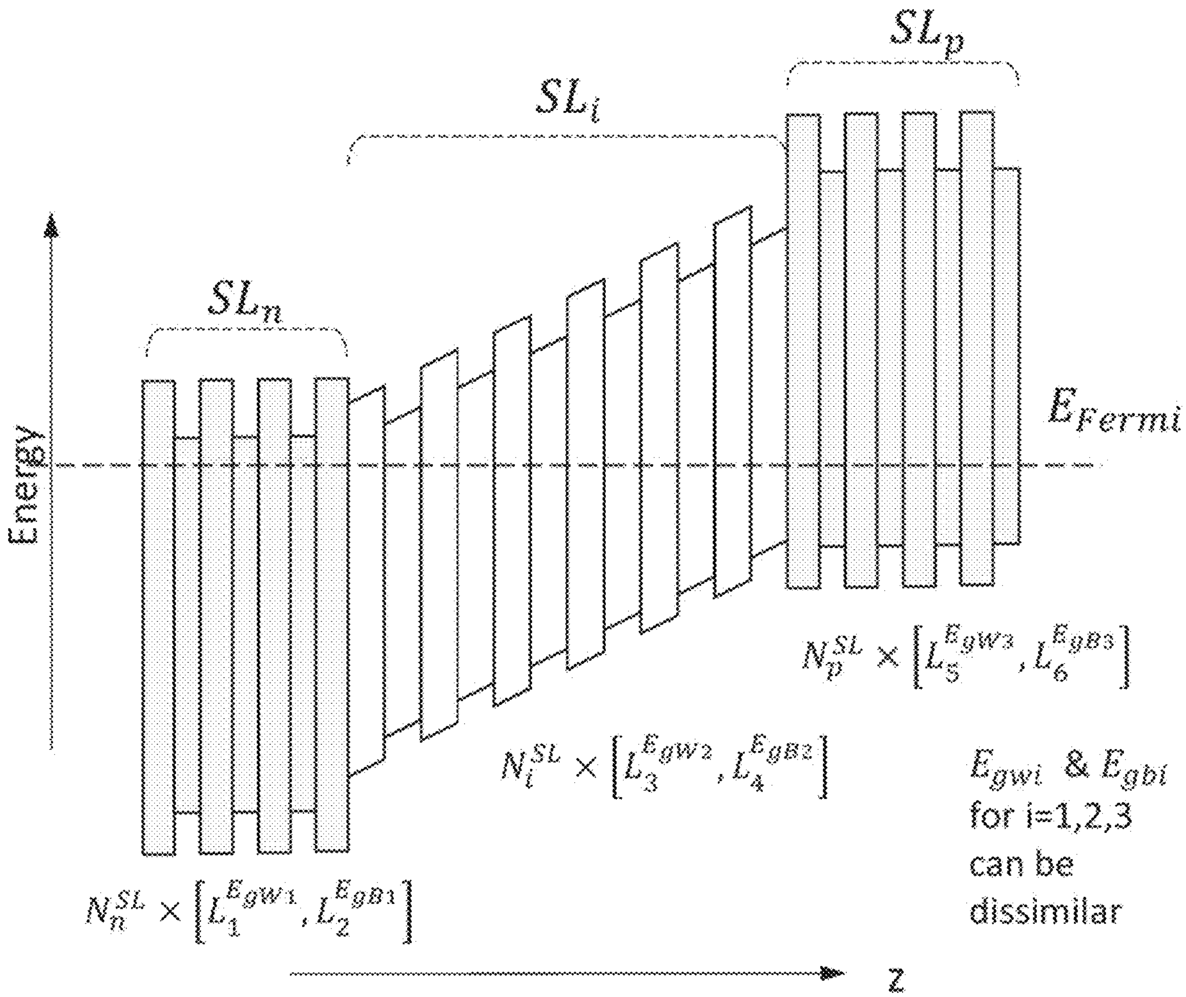

FIG. 99 shows another example of a p-i-n structure, with multiple quantum wells in the n-, i- and p-layers.

Figure 100:
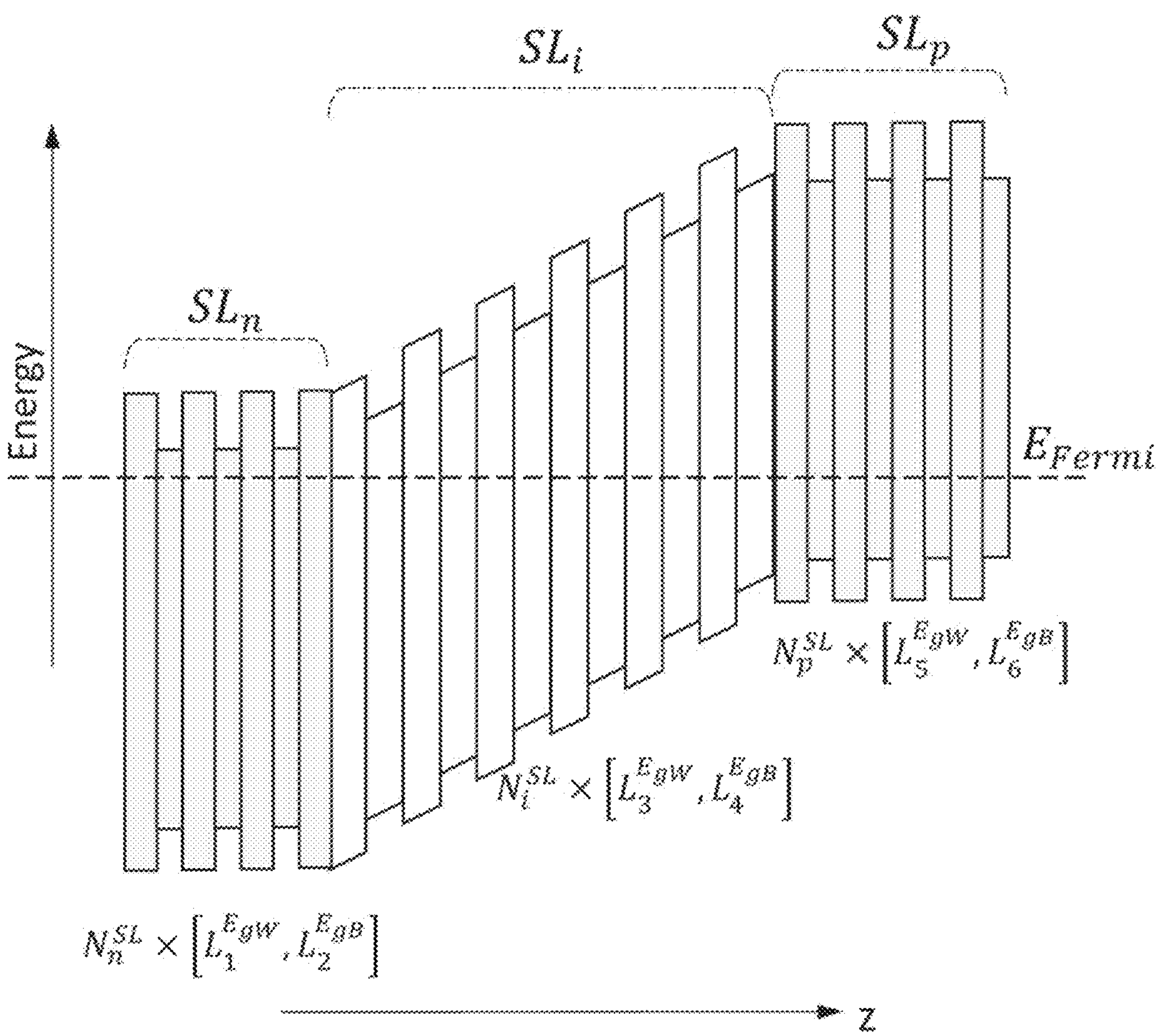

FIG. 100 shows another example of a p-i-n structure, with multiple quantum wells in the n-, i- and p-layers similar to the structure in FIG. 99.

Figure 101A:
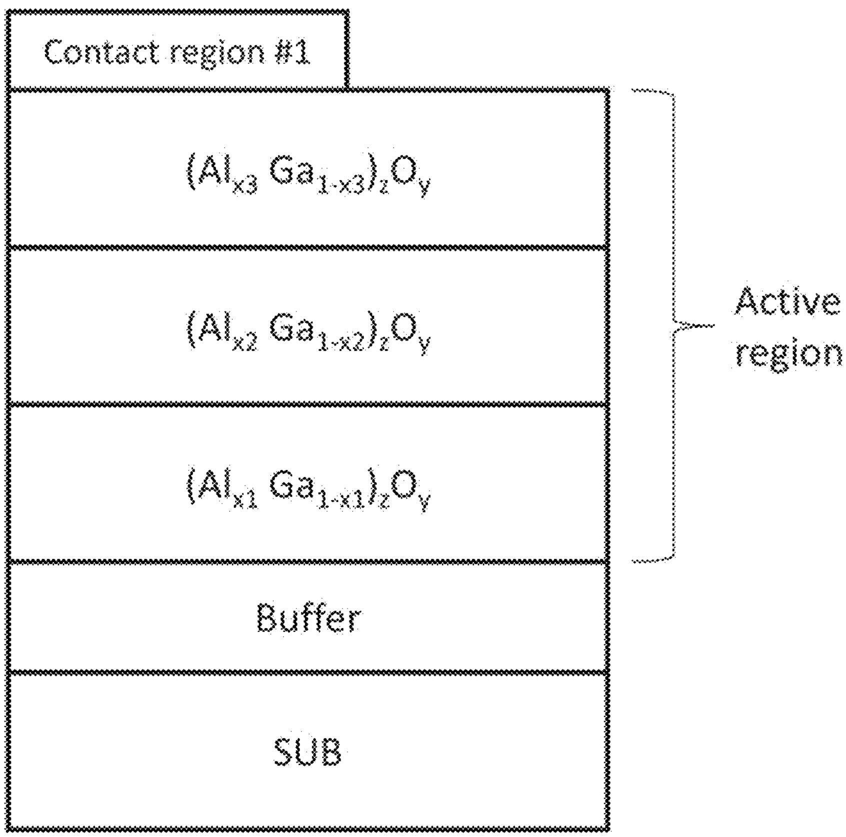

FIG. 101A shows an example of a semiconductor structure comprising $(Al_xGa_{1-x})_2O_3$ layers, where $0 \leq x \leq 1$ in each layer.

Figure 101B:
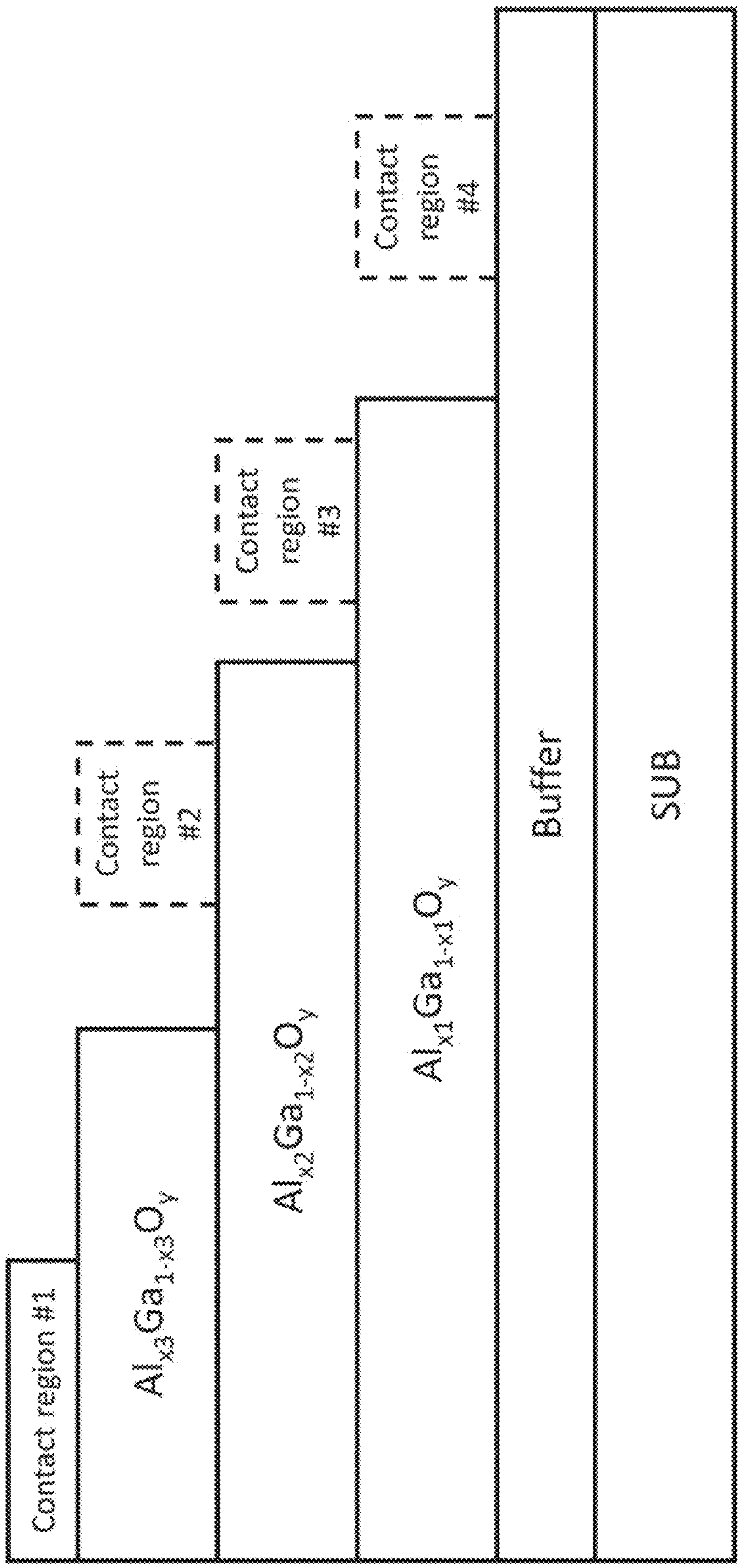

FIG. 101B shows the structure from FIG. 101A with the layers etched such that contact can be made to any layer of the semiconductor structure using "Contact region #2," "Contact region #3," and "Contact region #4."

Figure 101C:
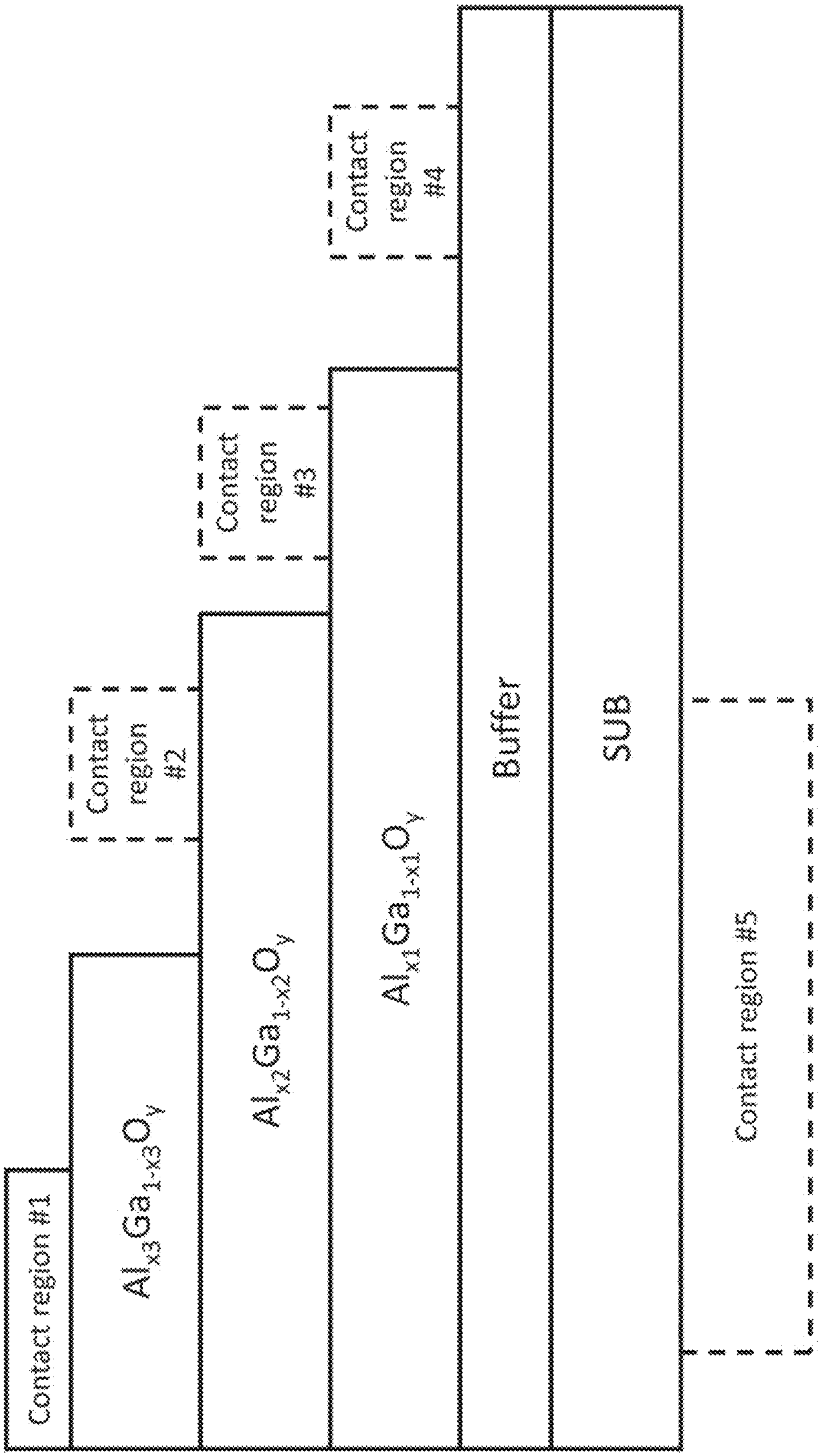

FIG. 101C shows the structure from FIG. 101B with an additional "Contact region #5," which makes contact to the back side (opposite the epitaxial oxide layers) of the substrate ("SUB").

Figure 102A:
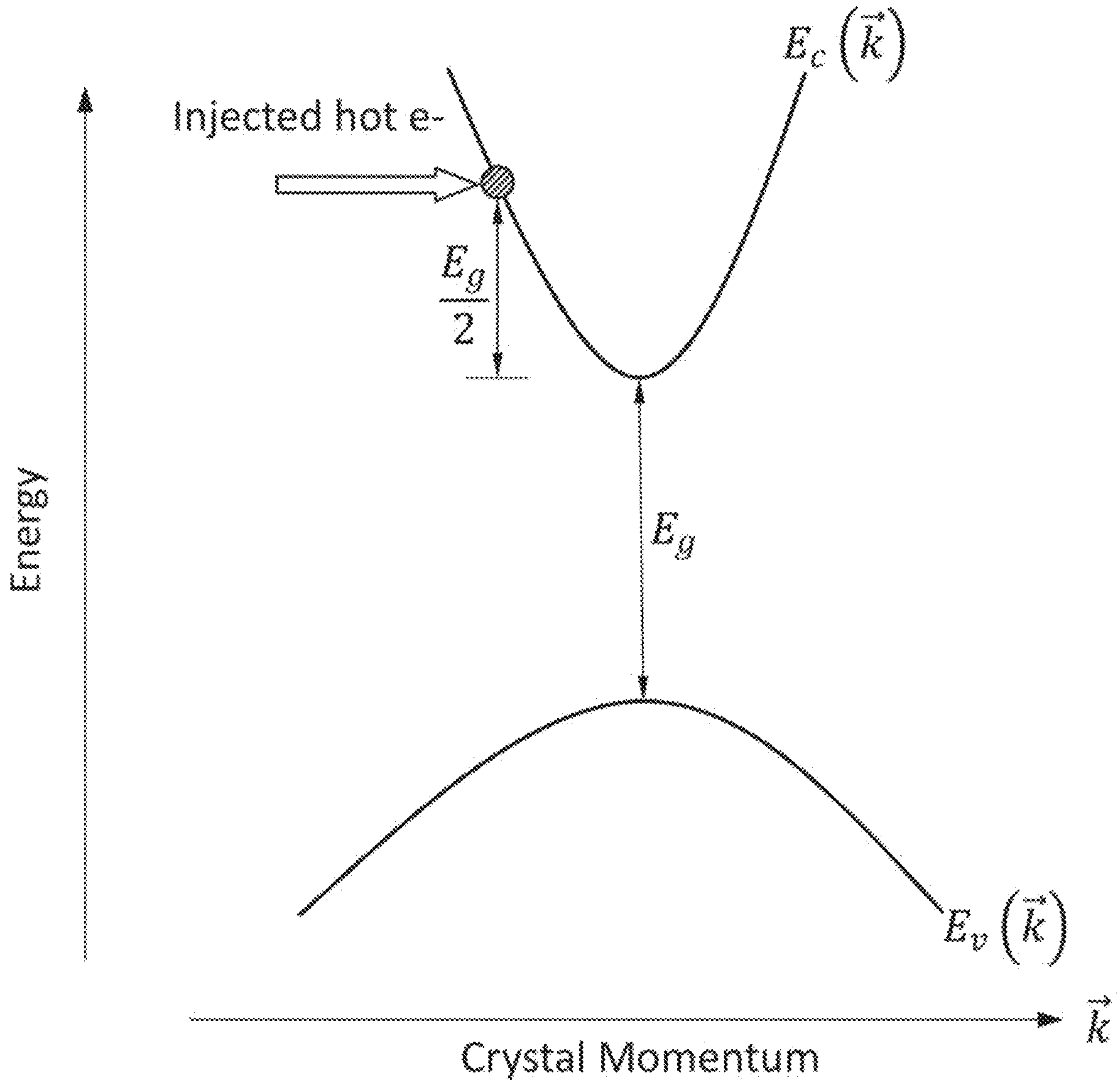
Figure 102B:
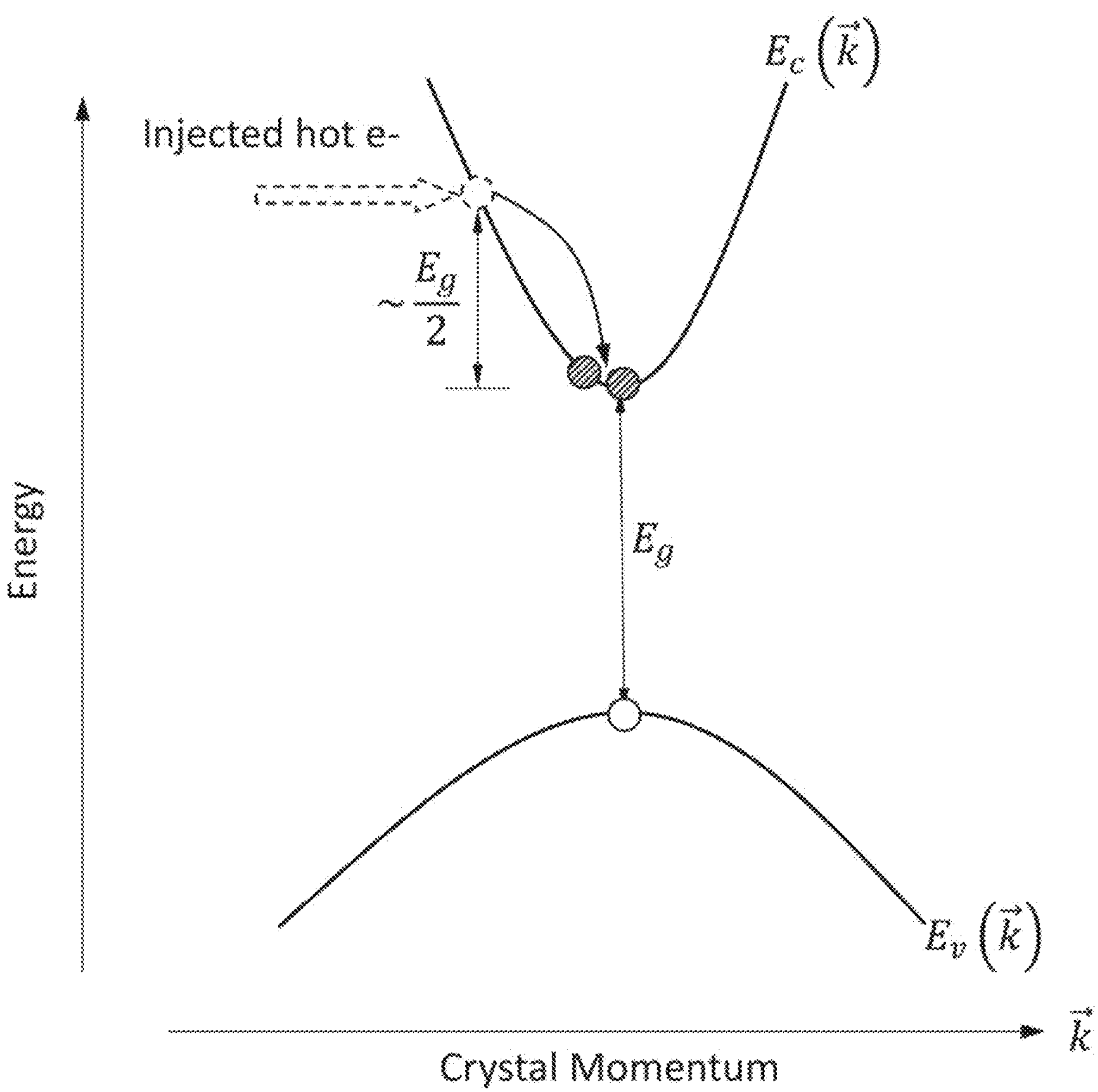

FIGS. 102A and 102B show simplified E-k diagrams in the vicinity of the Brillouin-zone center for an epitaxial oxide material, such as those shown in FIGS. 28, 76A-1, 76A-2 and 76B, showing a process of impact ionization.

Figure 103A:
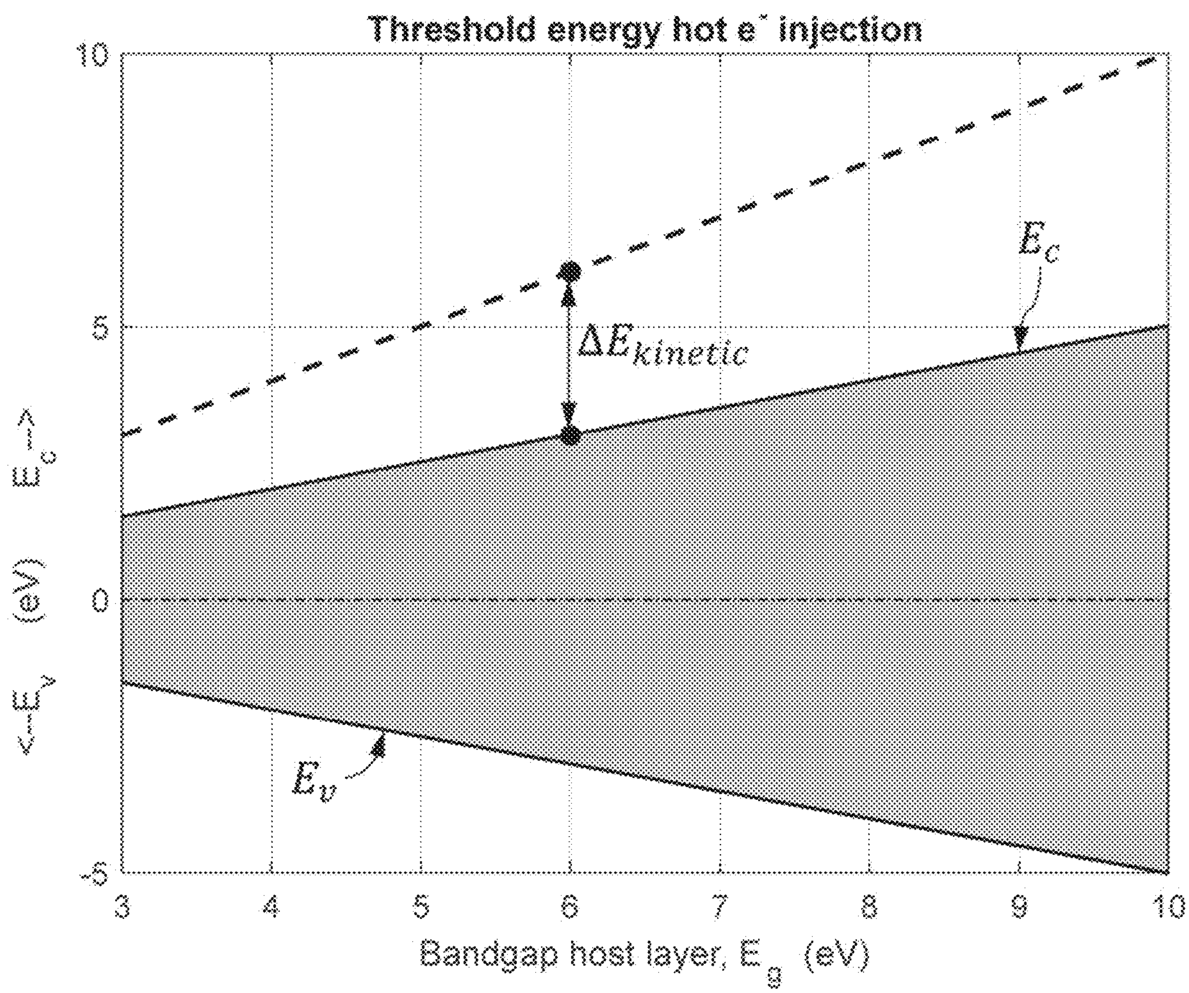

FIG. 103A shows a plot of energy versus bandgap of an epitaxial oxide material (including the conduction band edge, $E_c$, and the valence band edge, $E_v$), where the dotted line shows the approximate threshold energy required by a hot electron to generate an excess electron-hole pair through an impact ionization process.

Figure 103B:
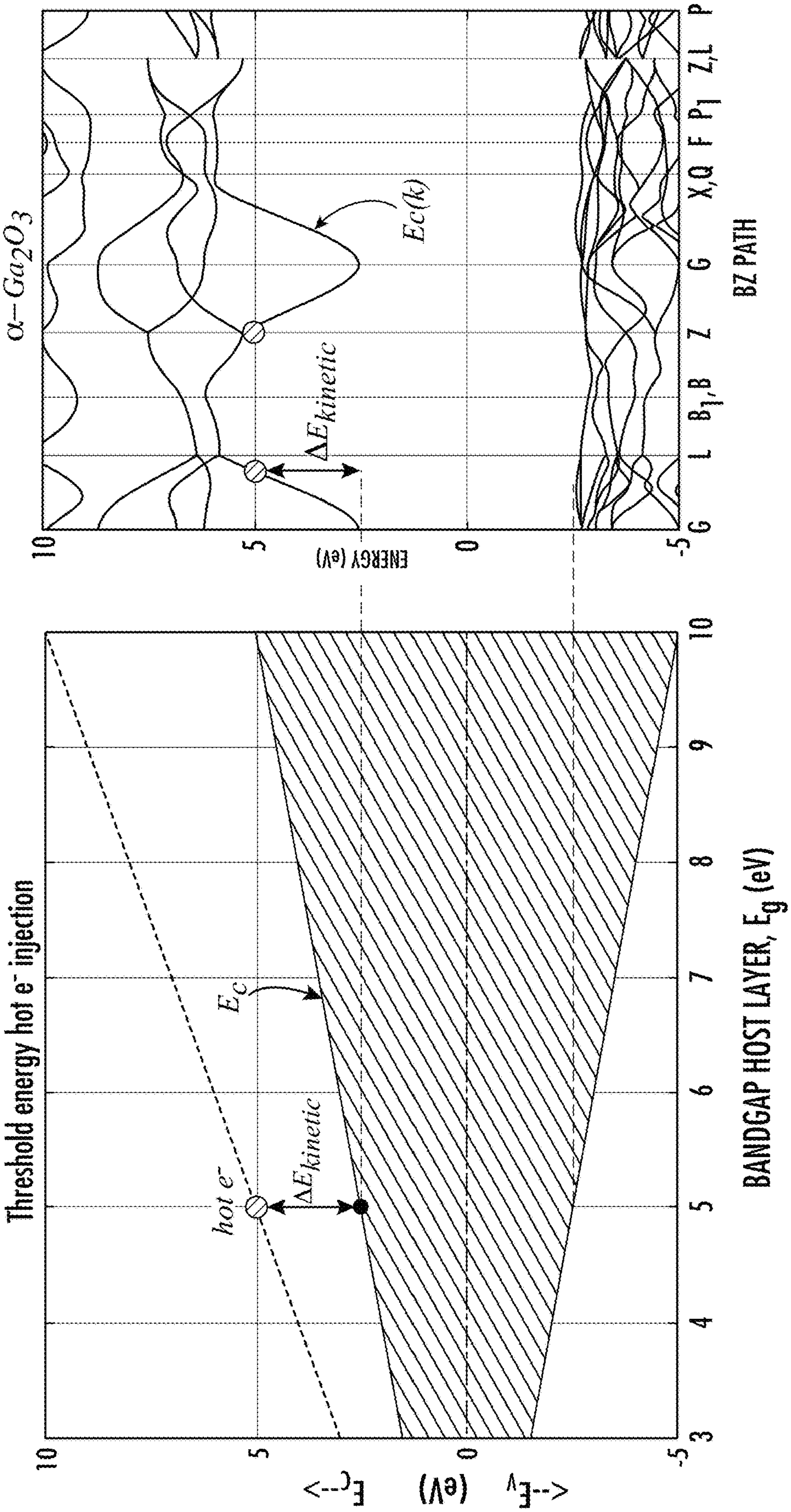

FIG. 103B shows an example of a hot electron in $\alpha$-$Ga_2O_3$ with a bandgap of about 5 eV.

Figure 104A:
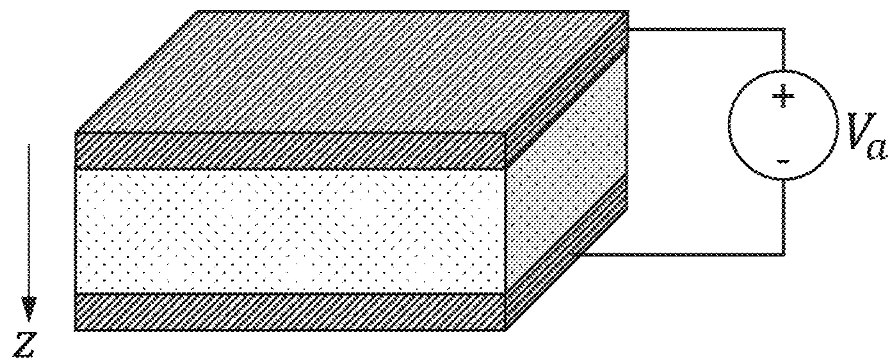

FIG. 104A shows a schematic of an epitaxial oxide material with two planar contact layers (e.g., metals, or highly doped semiconductor contact materials and metal contacts) coupled to an applied voltage, $V_a$.

Figure 104B:
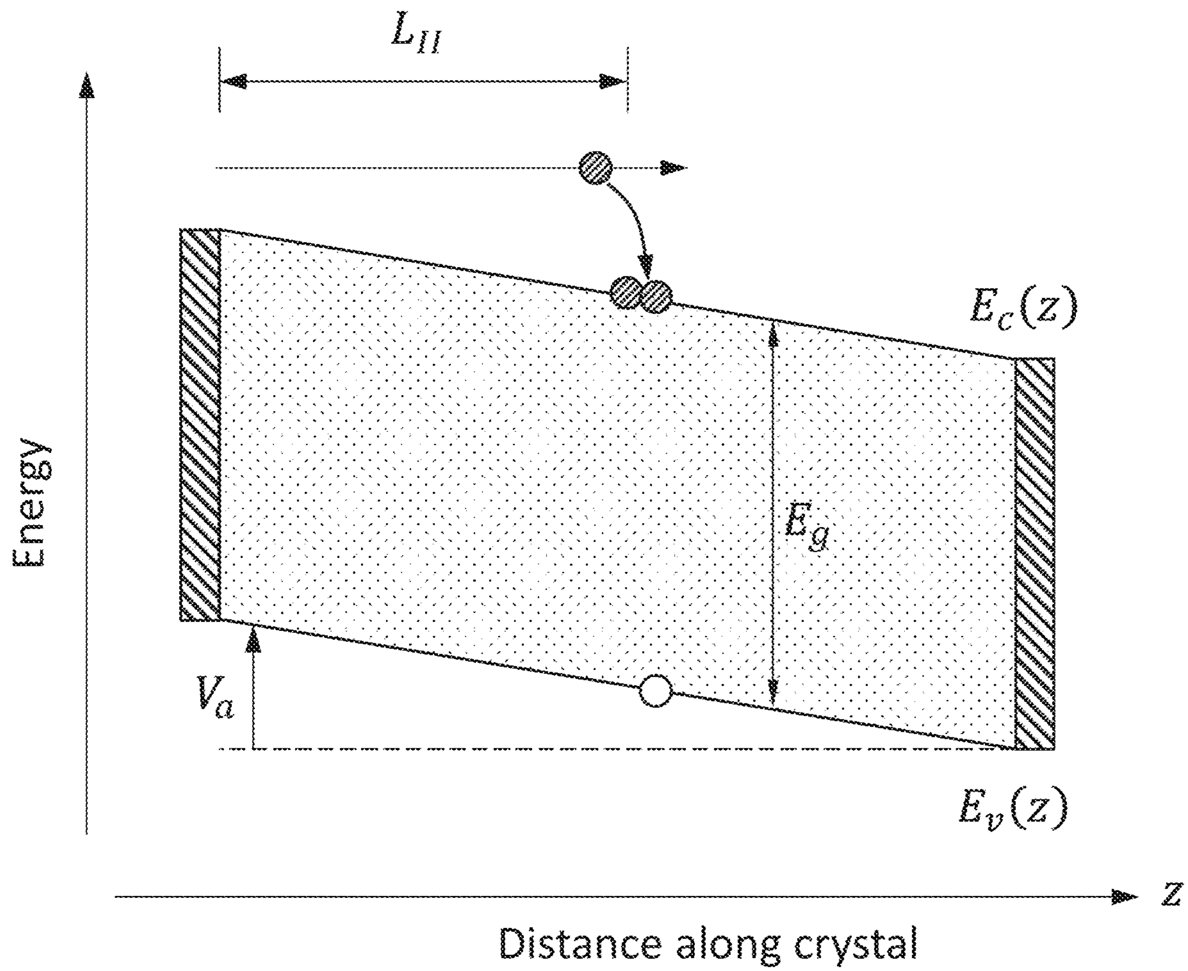

FIG. 104B shows a band diagram of the structure shown in FIG. 104A along the growth ("z") direction of the epitaxial oxide material.

Figure 104C:
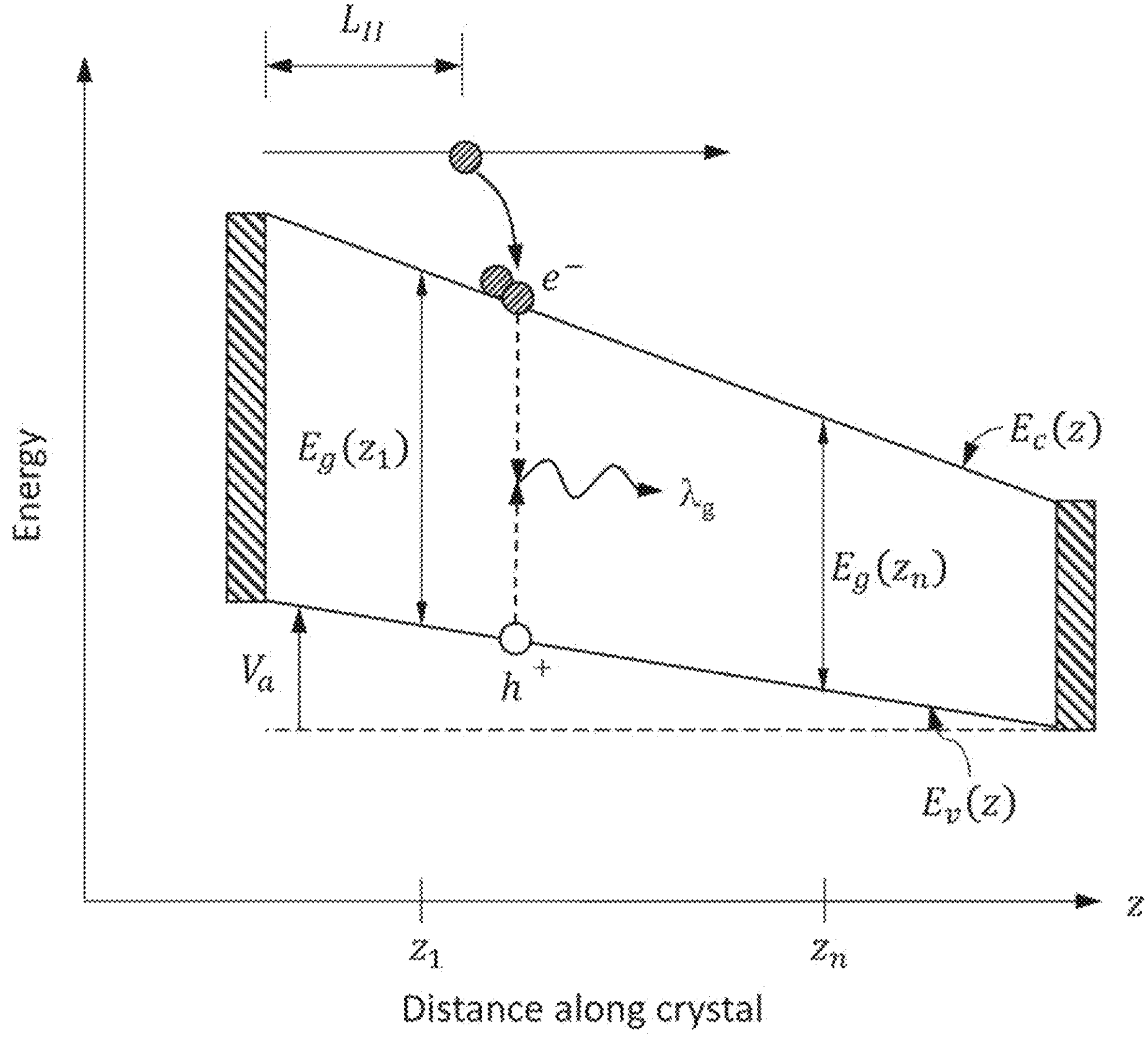

FIG. 104C shows a band diagram of the structure shown in FIG. 104A along the growth ("z") direction of the epitaxial oxide material.

Figure 105:
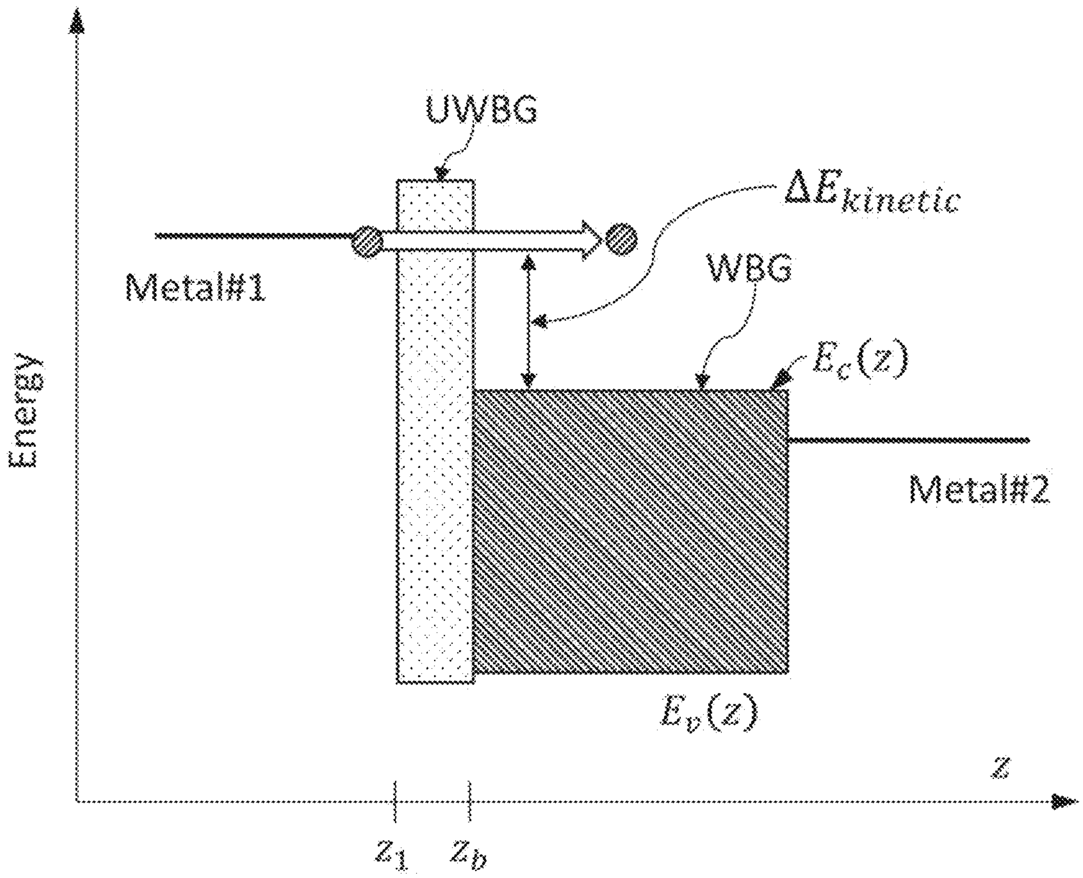

FIG. 105 shows a schematic of an example of an electroluminescent device including a high work function metal, an ultra-wide bandgap layer, a wide bandgap epitaxial oxide layer, and a second metal contact.

Figure 106A:
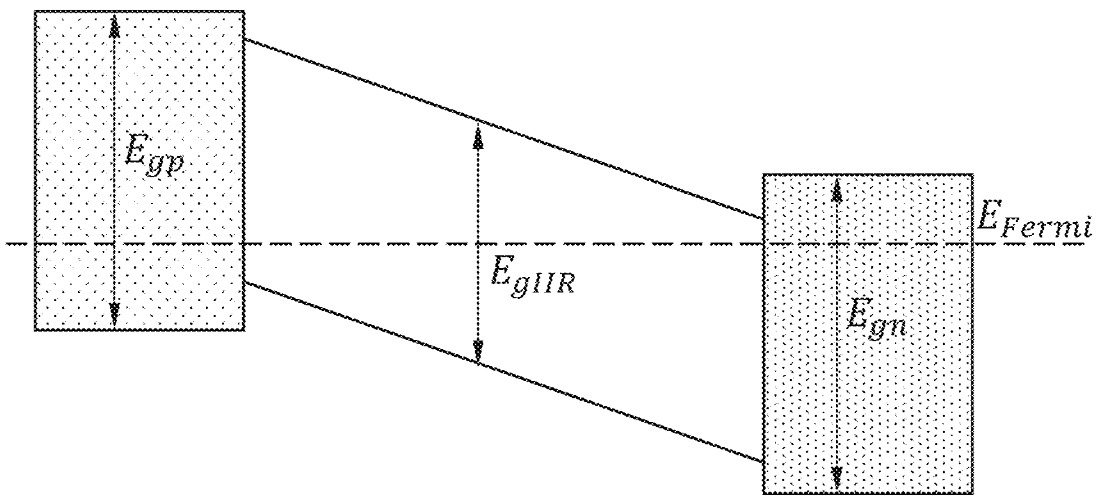
Figure 106B:
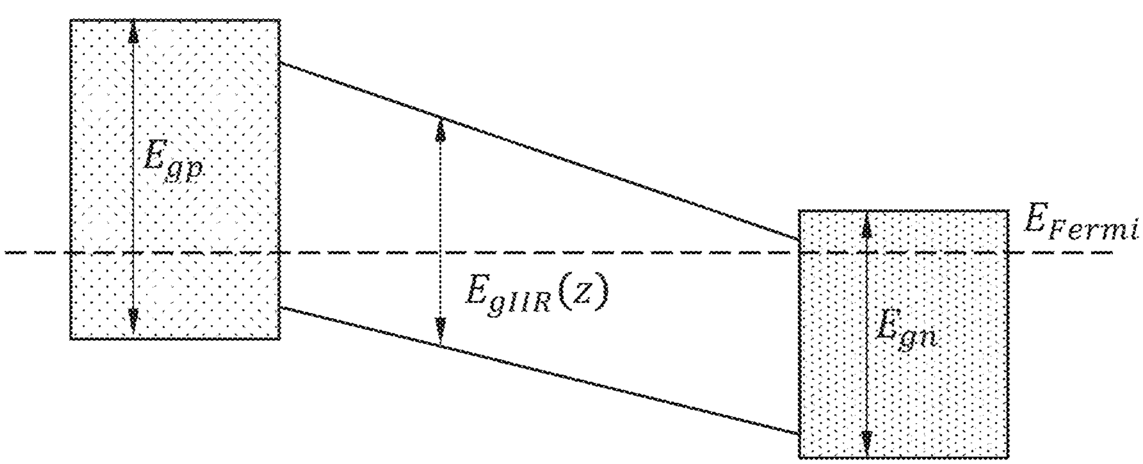

FIGS. 106A and 106B show schematics of examples of electroluminescent devices that are p-i-n diodes including a p-type semiconductor layer, an epitaxial oxide layer that is not intentionally doped (NID), an impact ionization region (IIR), and an n-type semiconductor layer.

Figure 107:
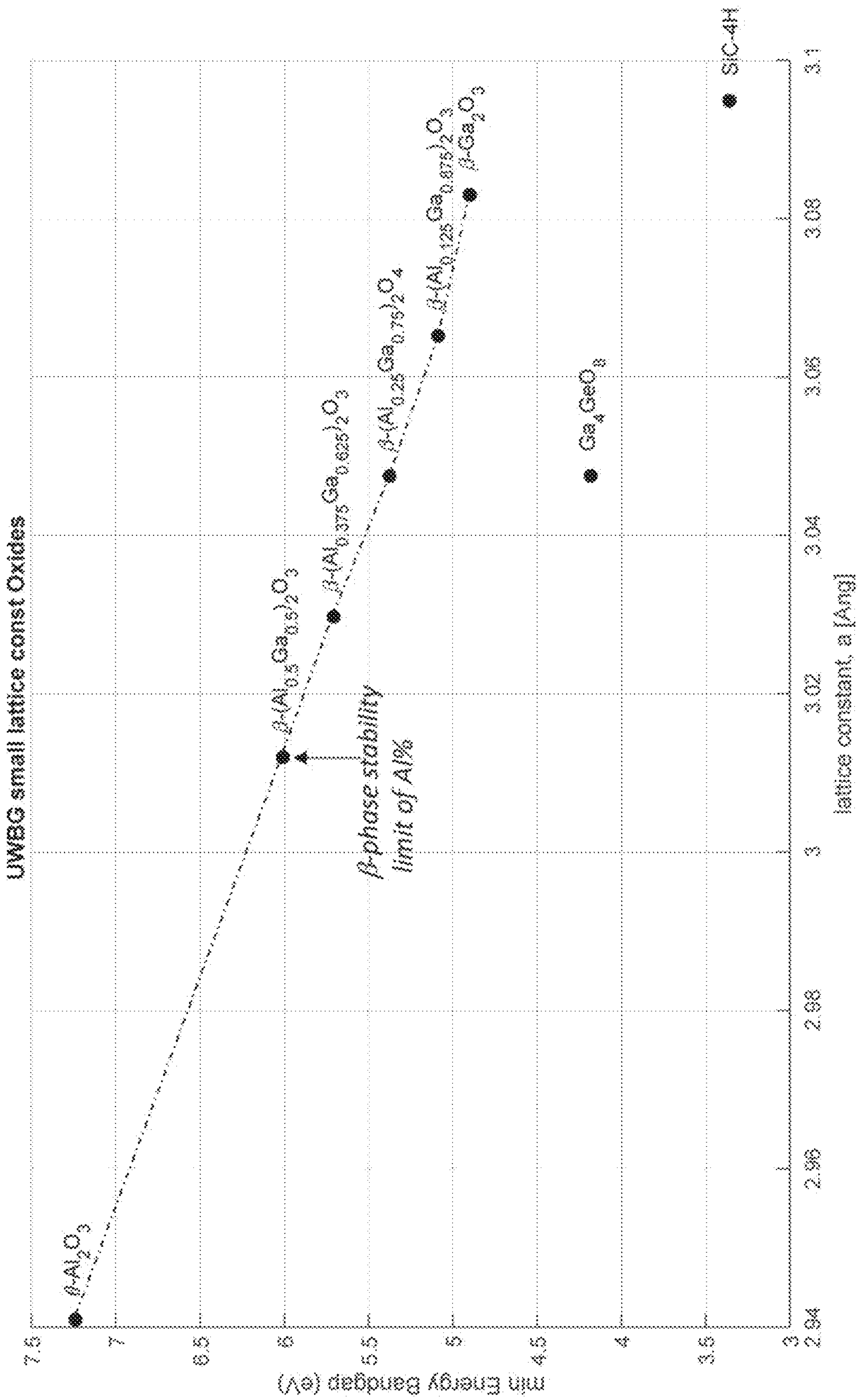

FIG. 107 shows the minimum bandgap energy versus the minor lattice constant of monoclinic $\beta(Al_xGa_{1-x})_2O_3$.

Figure 108:
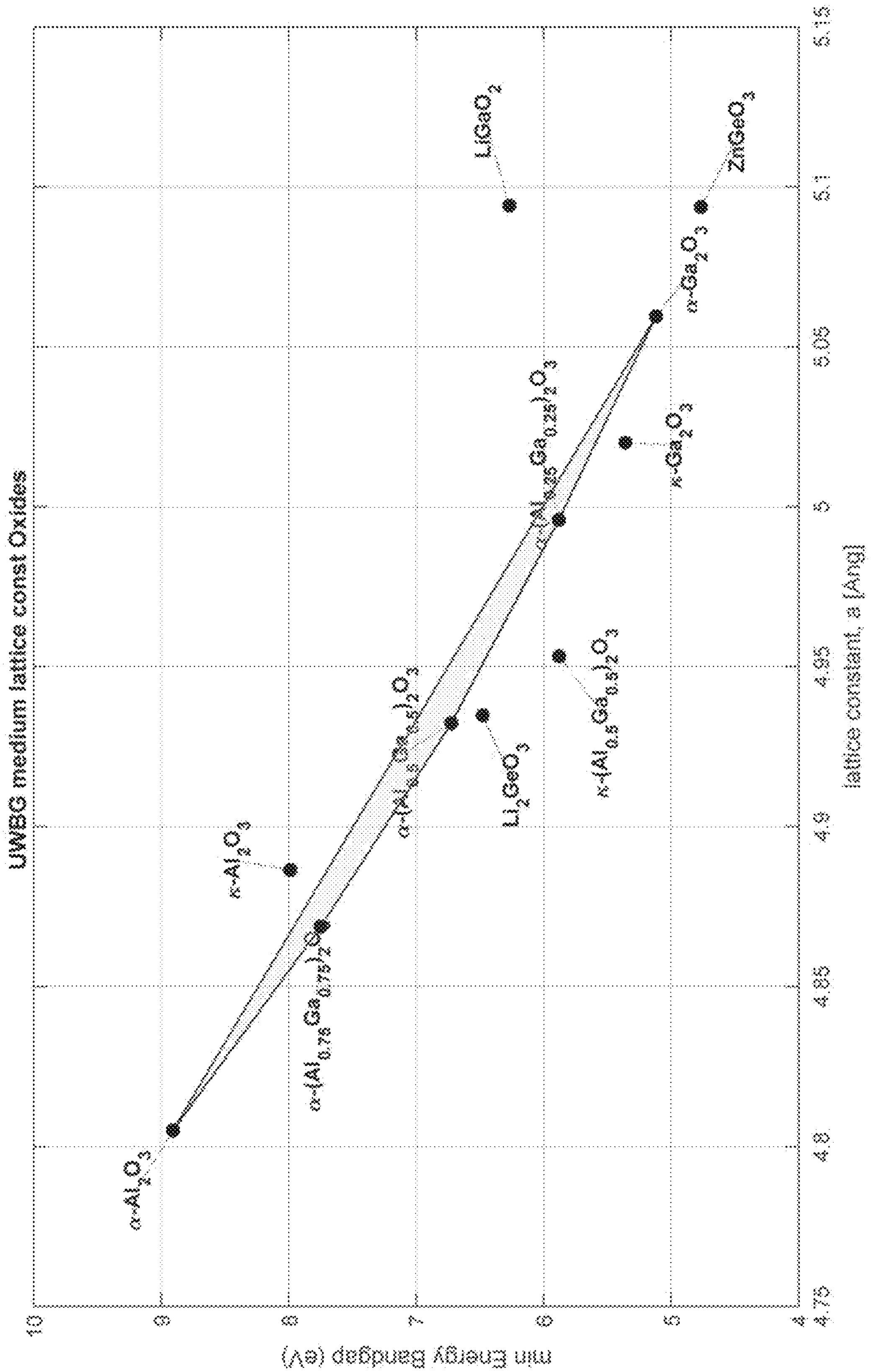

FIG. 108 shows the minimum bandgap energy versus the minor lattice constant "a" of hexagonal $\alpha(Al_xGa_{1-x})_2O_3$.

Figure 109:
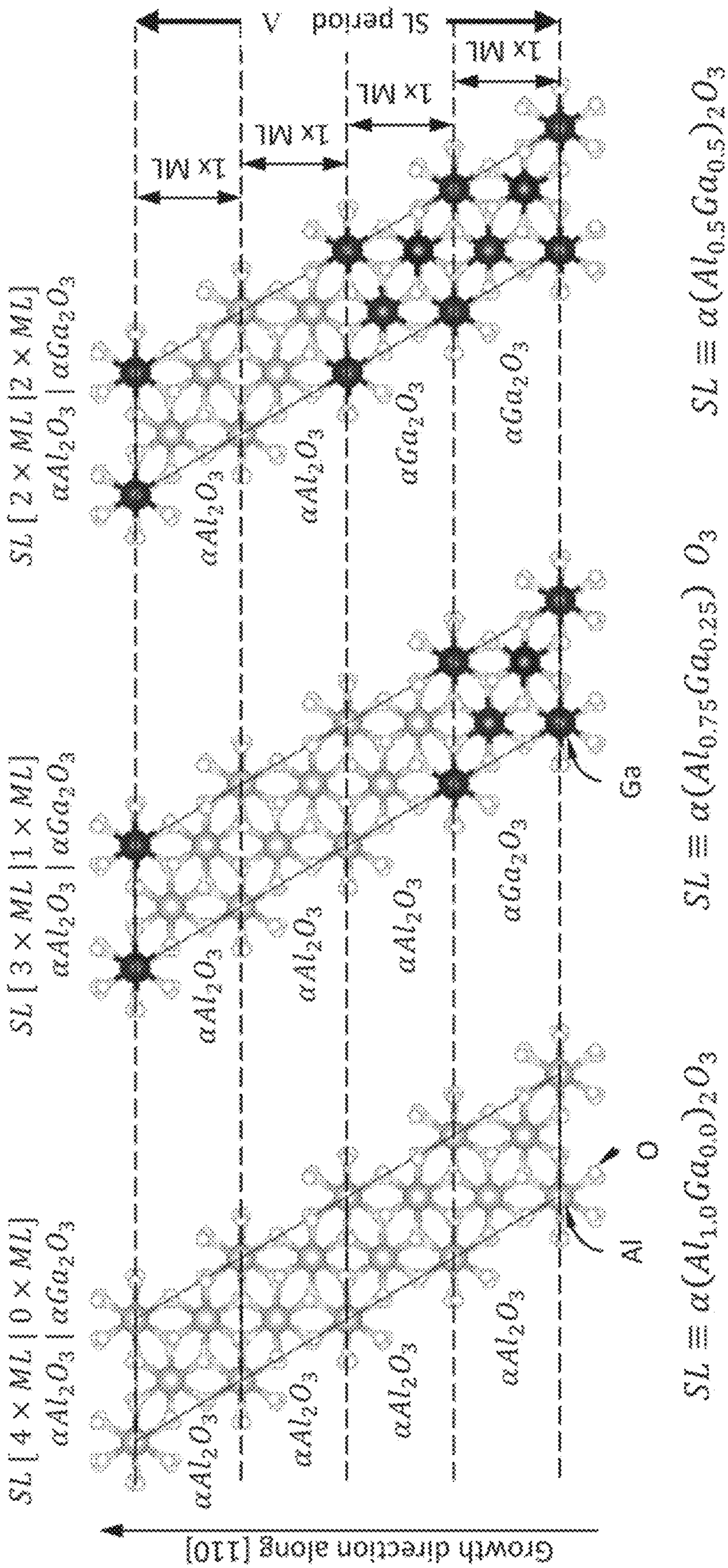

FIG. 109 shows an example of some embodiments of forming R3c $\alpha(Al_xGa_{1-x})_2O_3$ epitaxial structures.

Figure 110:
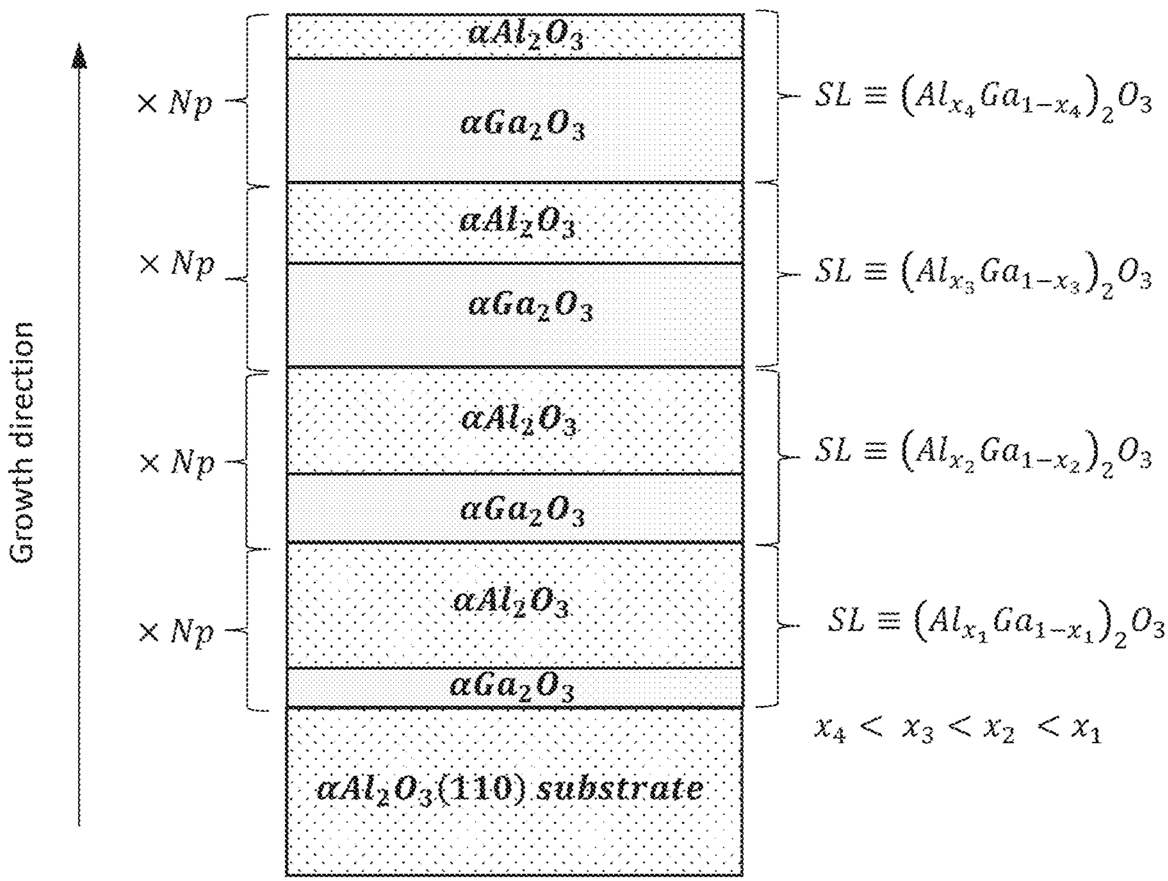

FIG. 110 shows an example implementation of a stepped increment tuning of the effective alloy composition of each SL region along the growth direction of a chirp layer.

Figure 111:
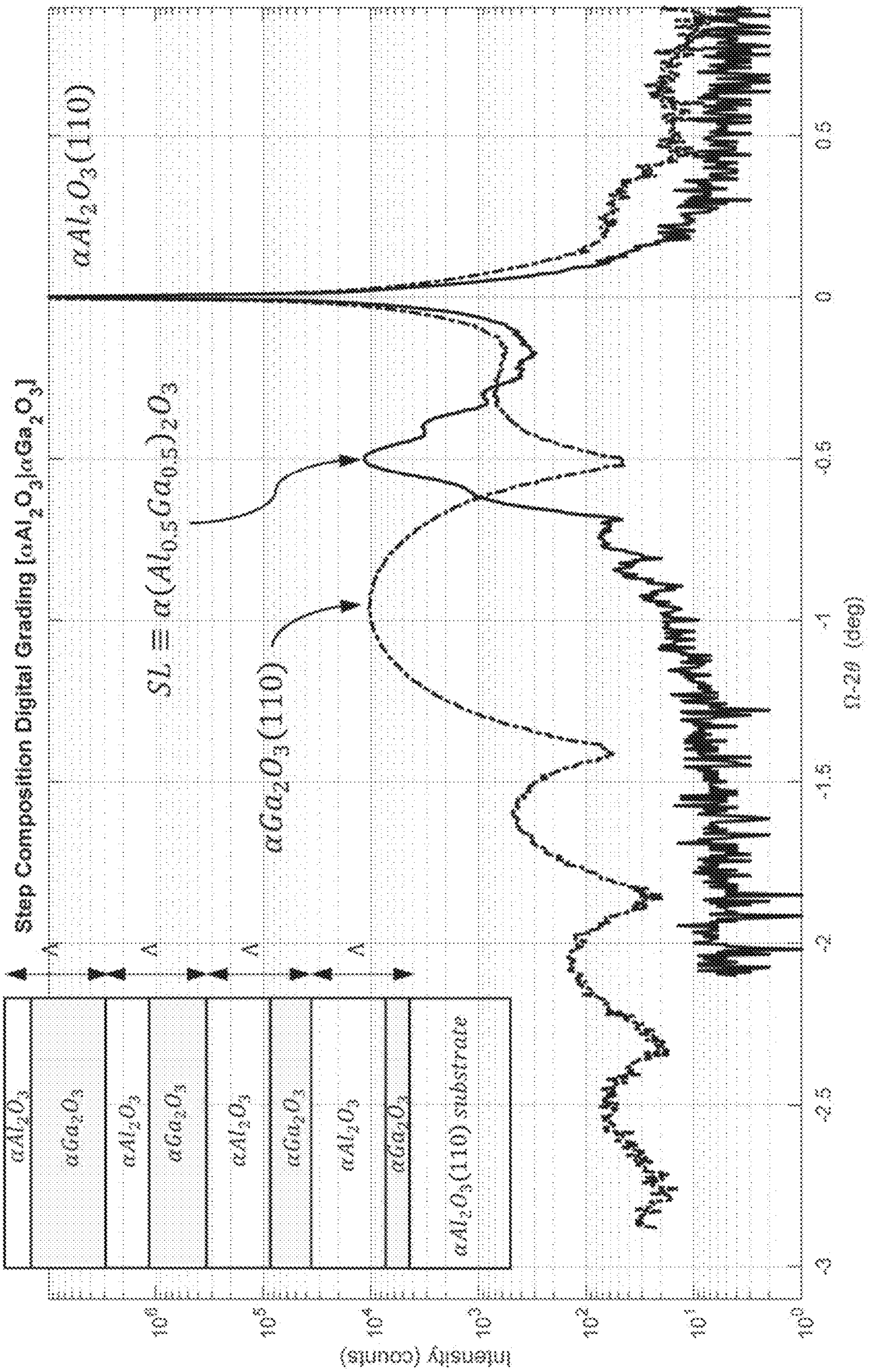

FIG. 111 shows an experimental XRD plot of a step graded SLs (SGSL) structure (that forms a chirp layer) using a digital alloy comprising bilayers of $\alpha Ga_2O_3$ and $\alpha Al_2O_3$ deposited on (110)-oriented sapphire (zero miscut).

Figure 112:
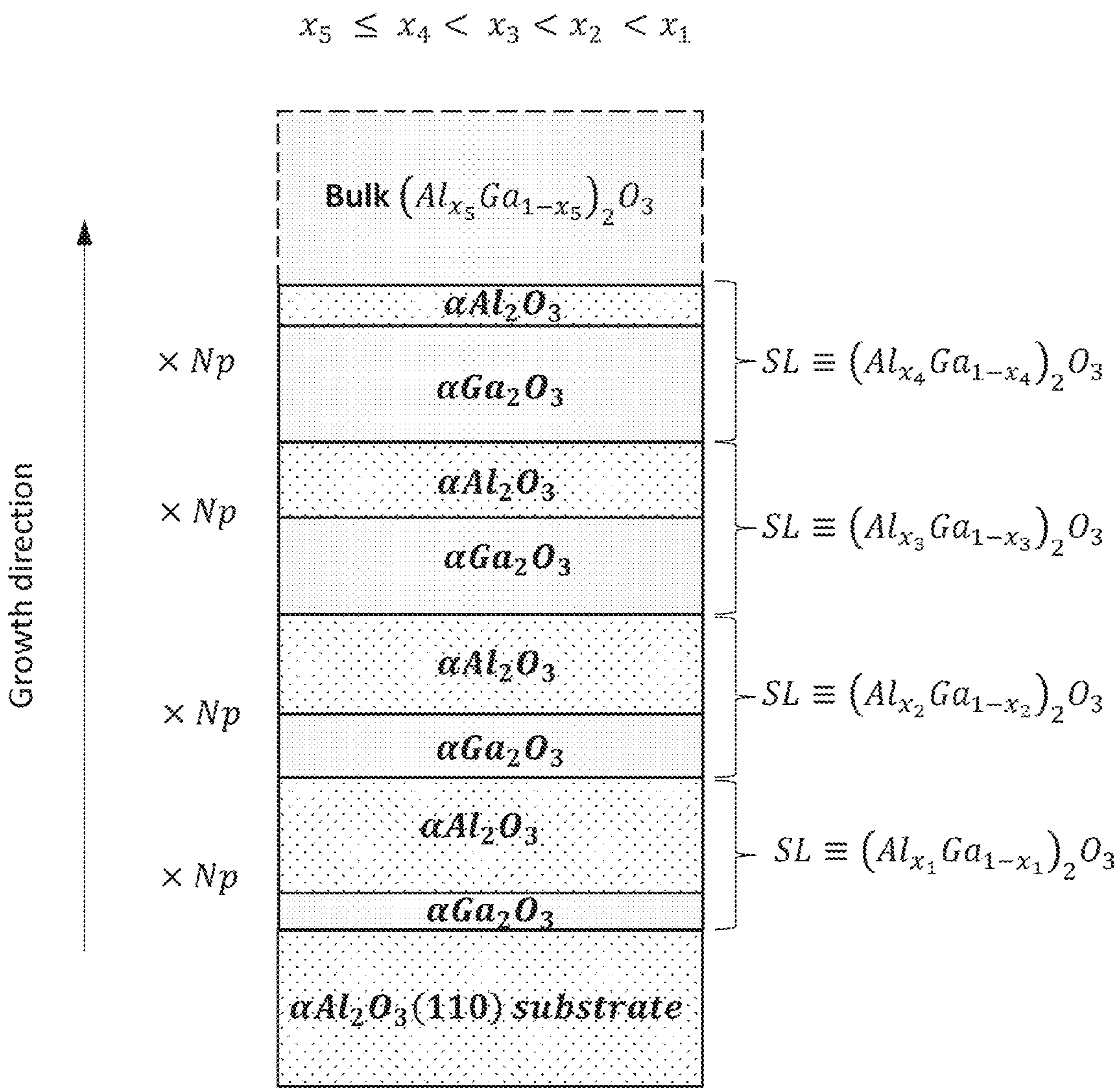

FIG. 112 shows another example of the step graded SLs which can be used to form a pseudo-substrate with a tuned in-plane lattice constant for a subsequent high quality and close lattice matched active layer such as the "bulk" (meaning a single layer rather than an SL) $\alpha(Al_{x5}Ga_{1-x5})_2O_3$.

Figure 113:
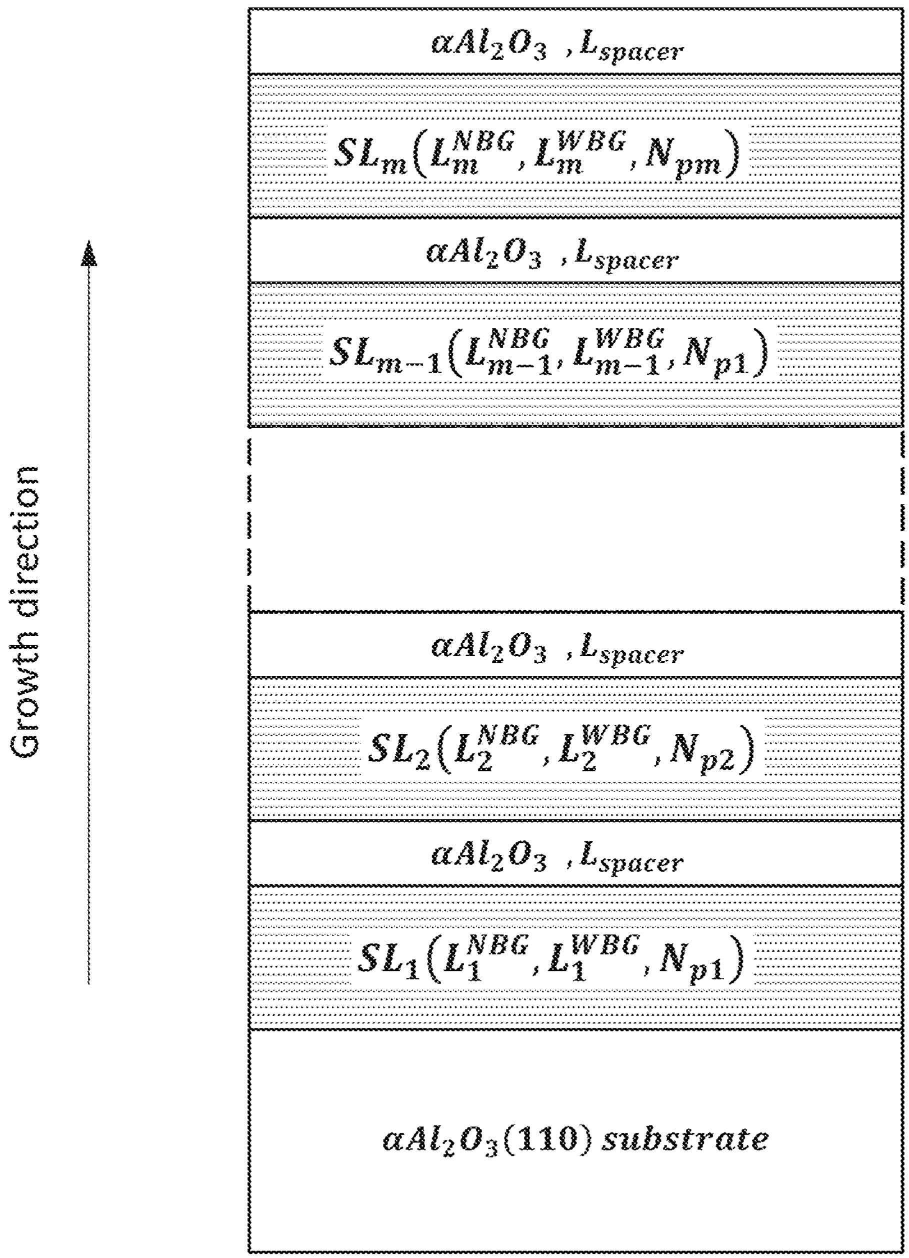

FIG. 113 shows an example of a high complexity digital alloy grading interleaved by a wide bandgap spacer, in this case a $\alpha Al_2O_3$ interposer layer.

Figure 114A:
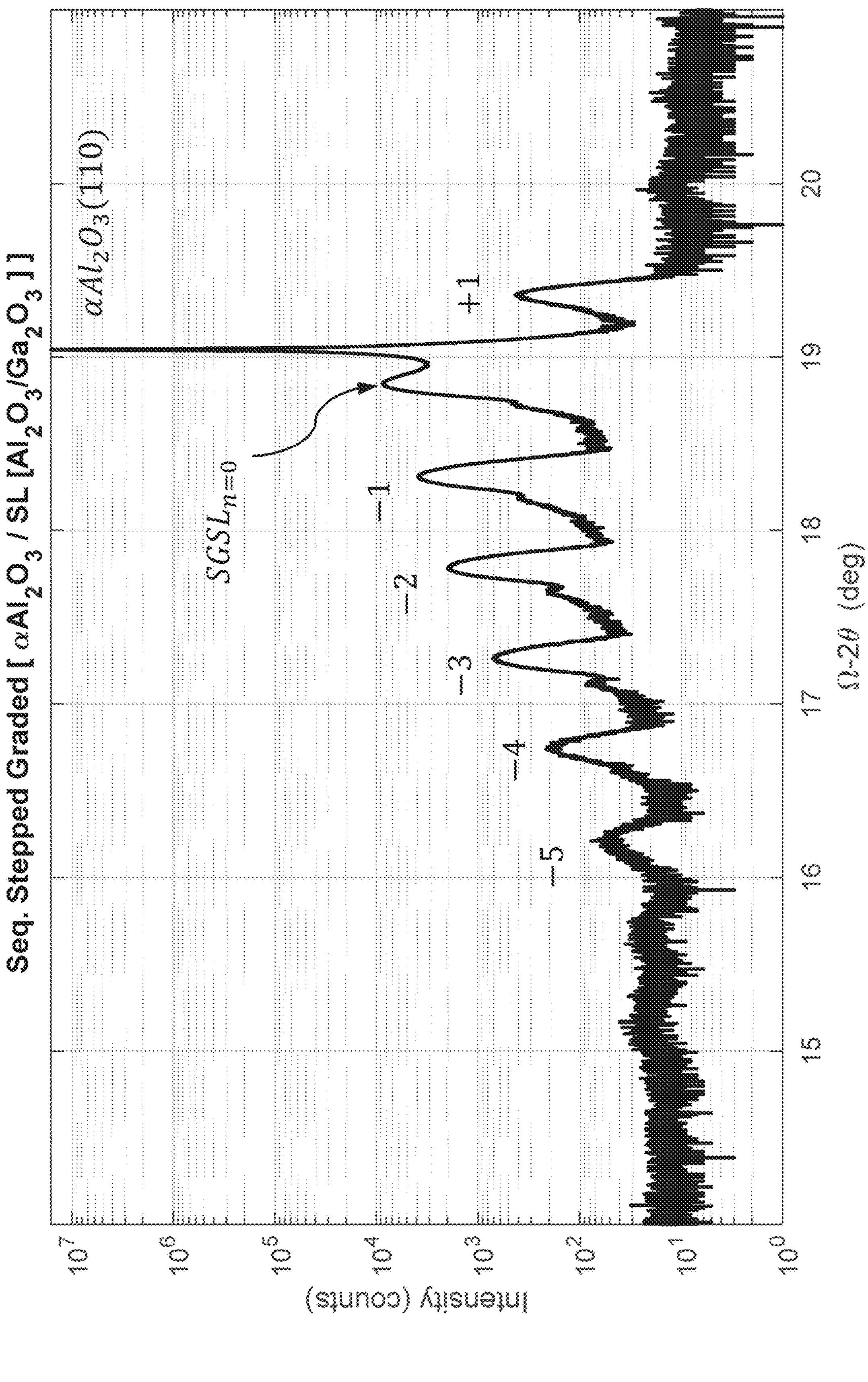
Figure 114B:
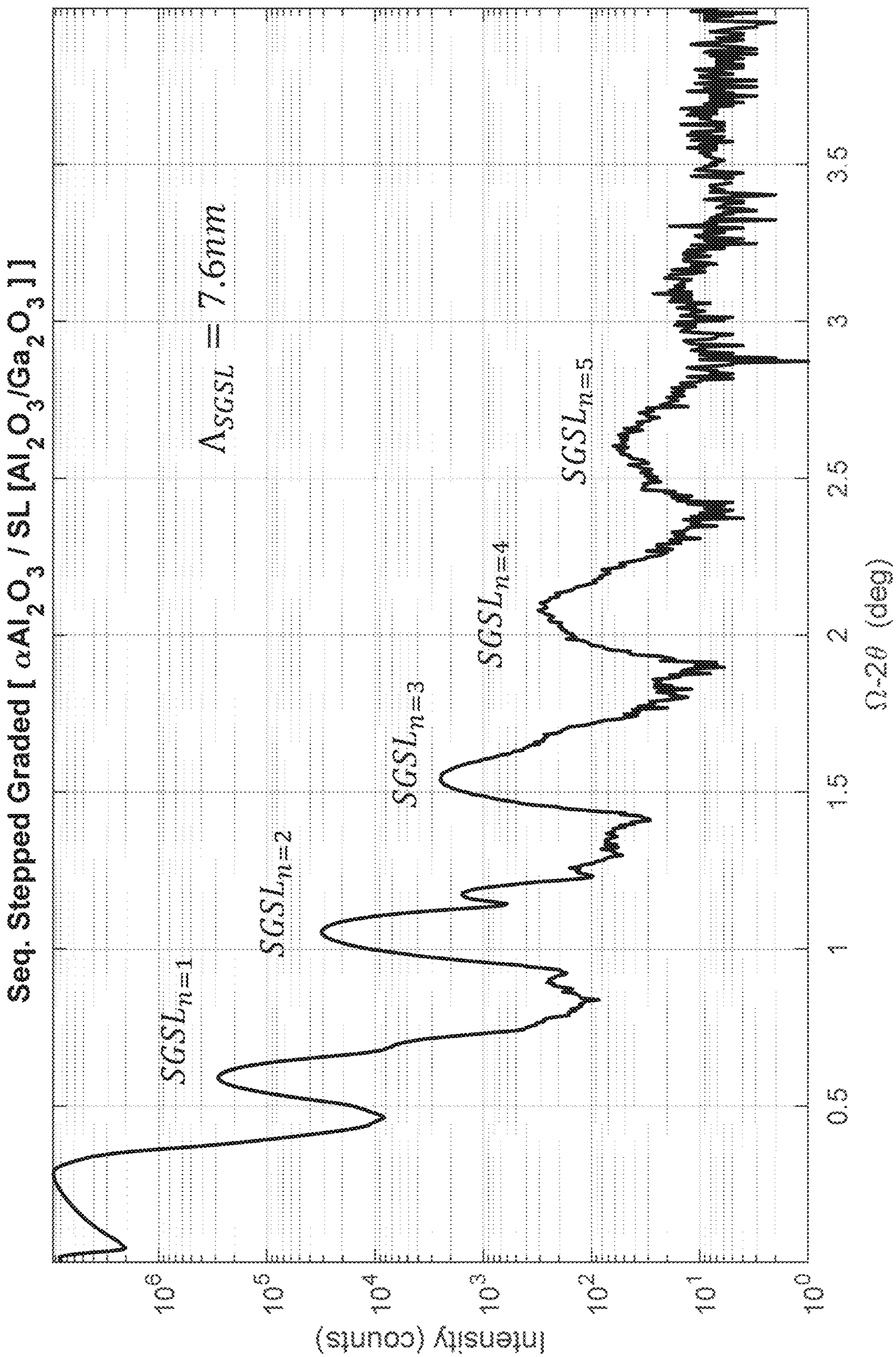

FIGS. 114A and 114B shows plots of the high-resolution Bragg XRD (upper plot) and the grazing incidence x-ray reflection (XRR) (lower plot) of the chirped SL with interposer as described in FIG. 113.

Figure 115A:
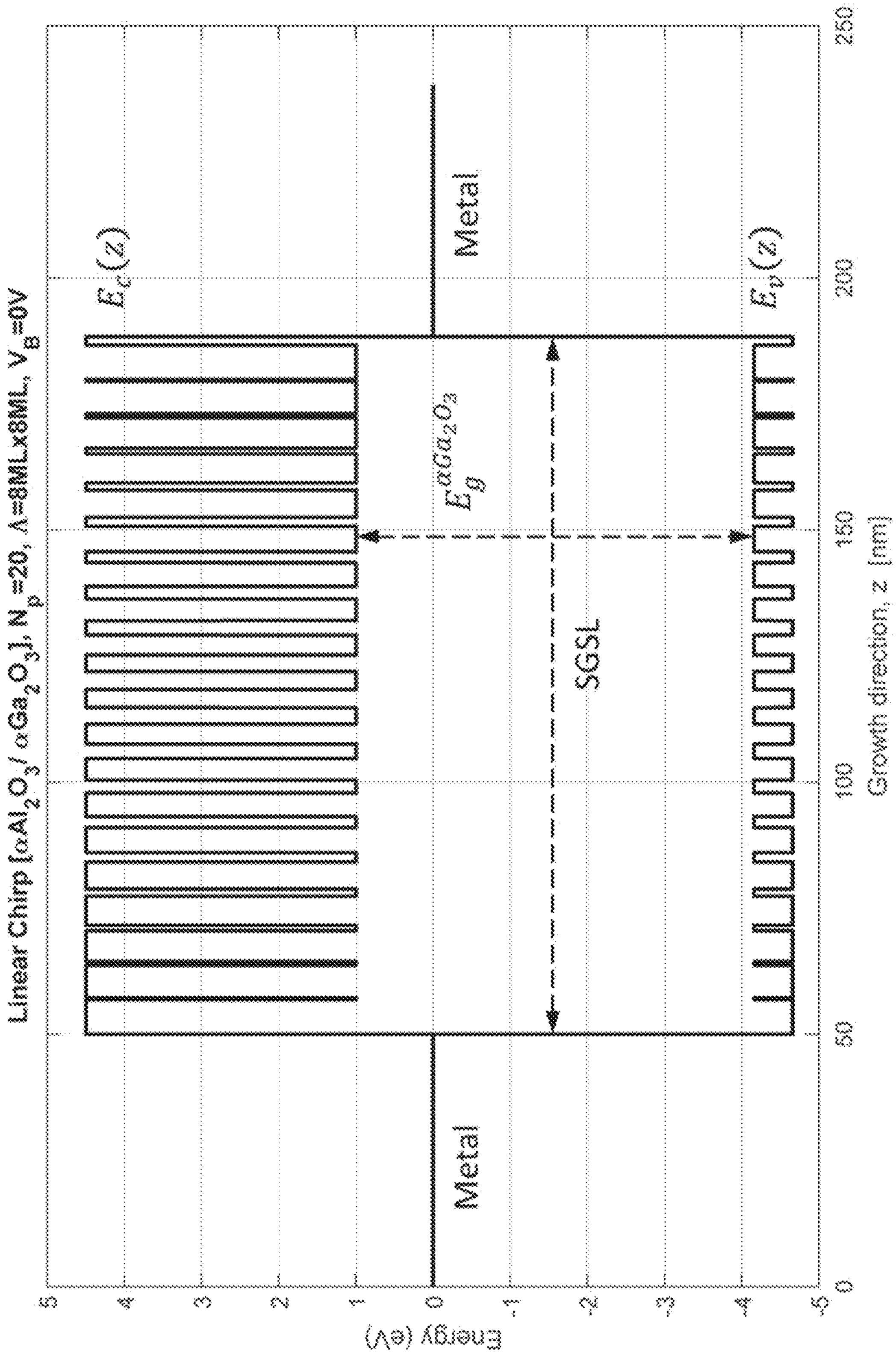
Figure 115B:
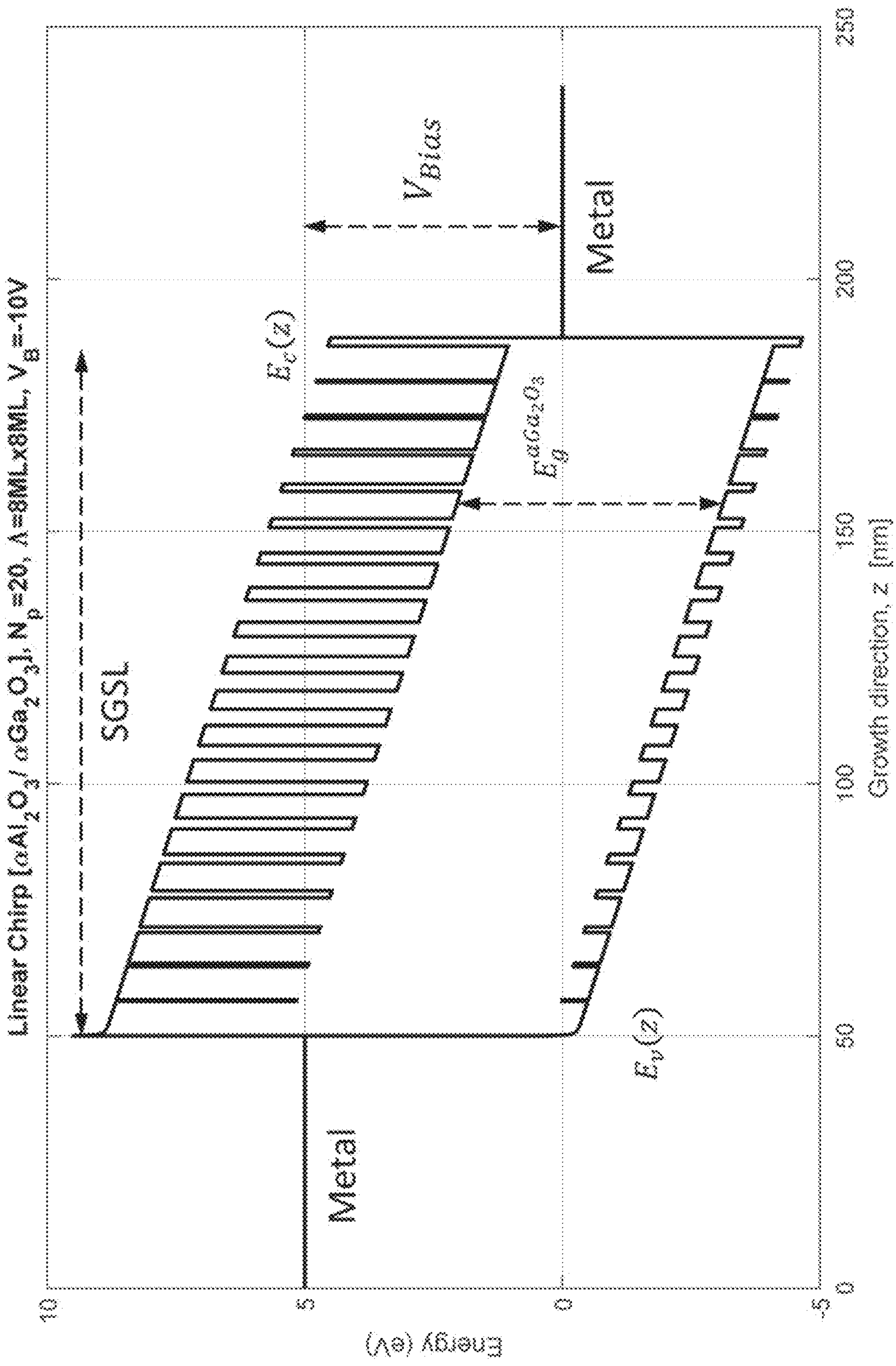

FIGS. 115A and 115B show the electronic band diagram as a function of the growth direction for a chirp layer structure like those of FIGS. 112 and 113.

115C shows the lowest energy quantized energy wavefunction confined within the $\alpha Ga_2O_3$ layers of the chirp layer for a chirp layer structure like those of FIGS. 112 and 113.

Figure 115C:
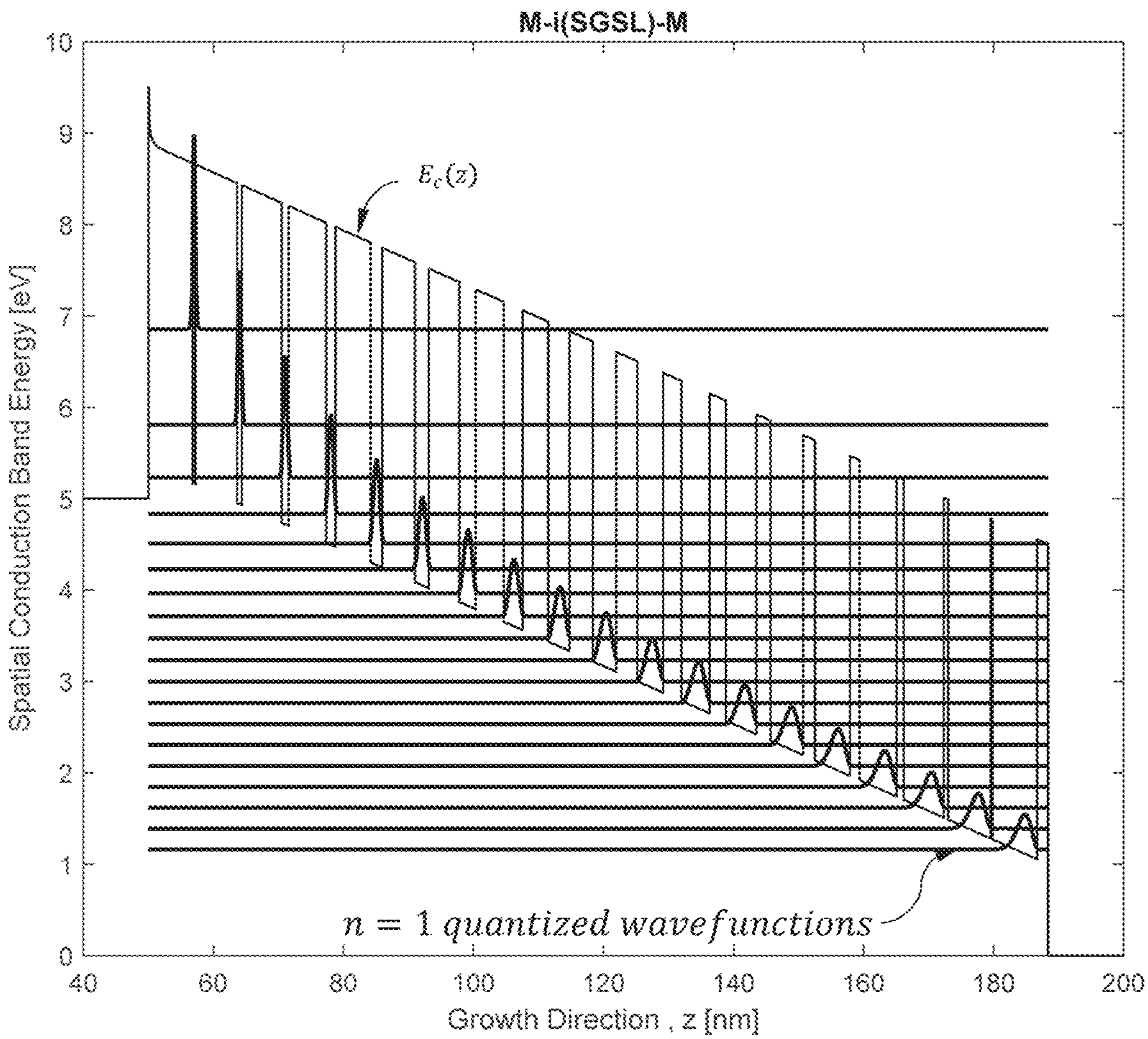
Figure 115D:
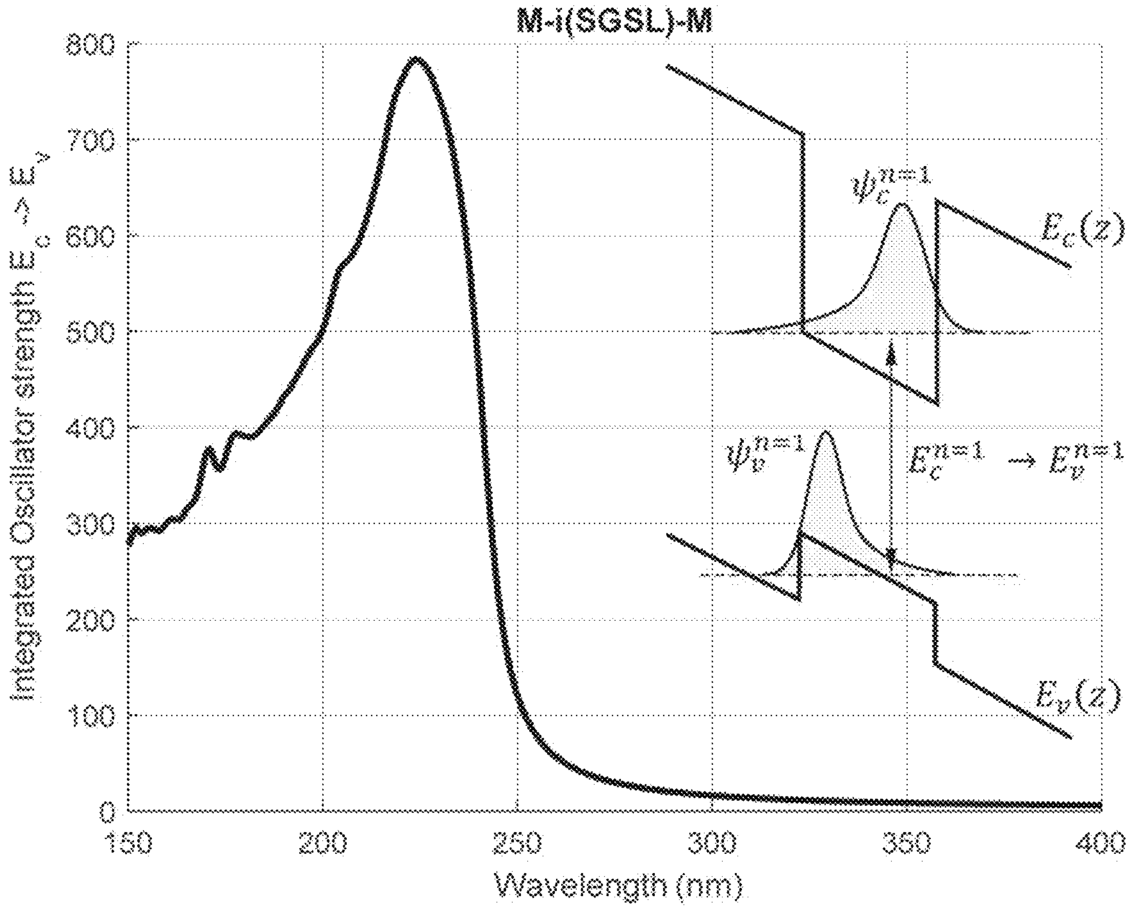

FIG. 115D is the wavelength spectrum of the oscillator strength for electric dipole transitions between the conduction and valence band of the chirp layer modeled in FIGS. 115A-115C.

Figure 116A:
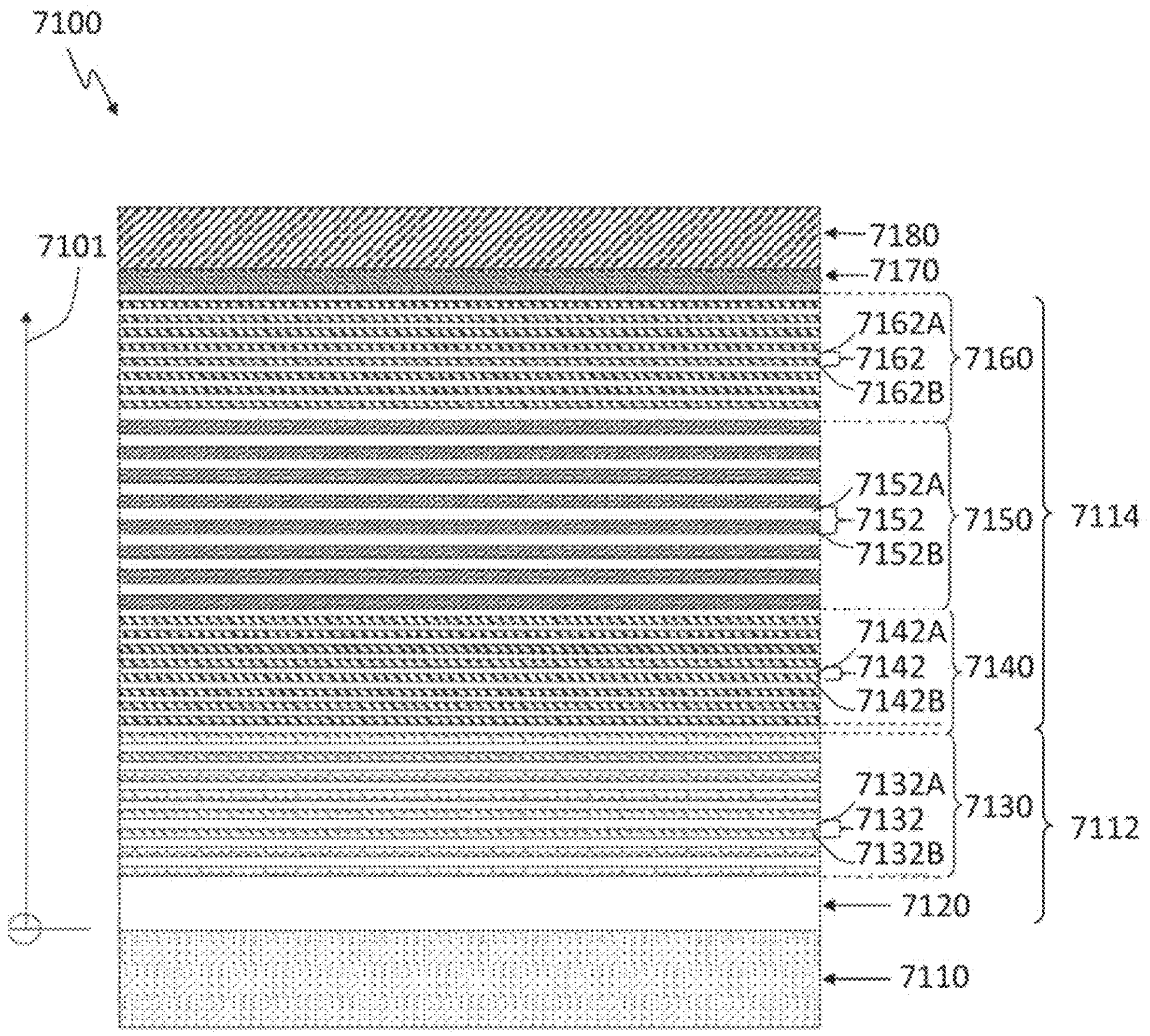

FIG. 116A is a diagram showing a sectional view of a semiconductor structure (or stack) for an optoelectronic device according to some embodiments of the present semiconductor structures with one or more superlattices containing an epitaxial oxide material.

Figure 116B:
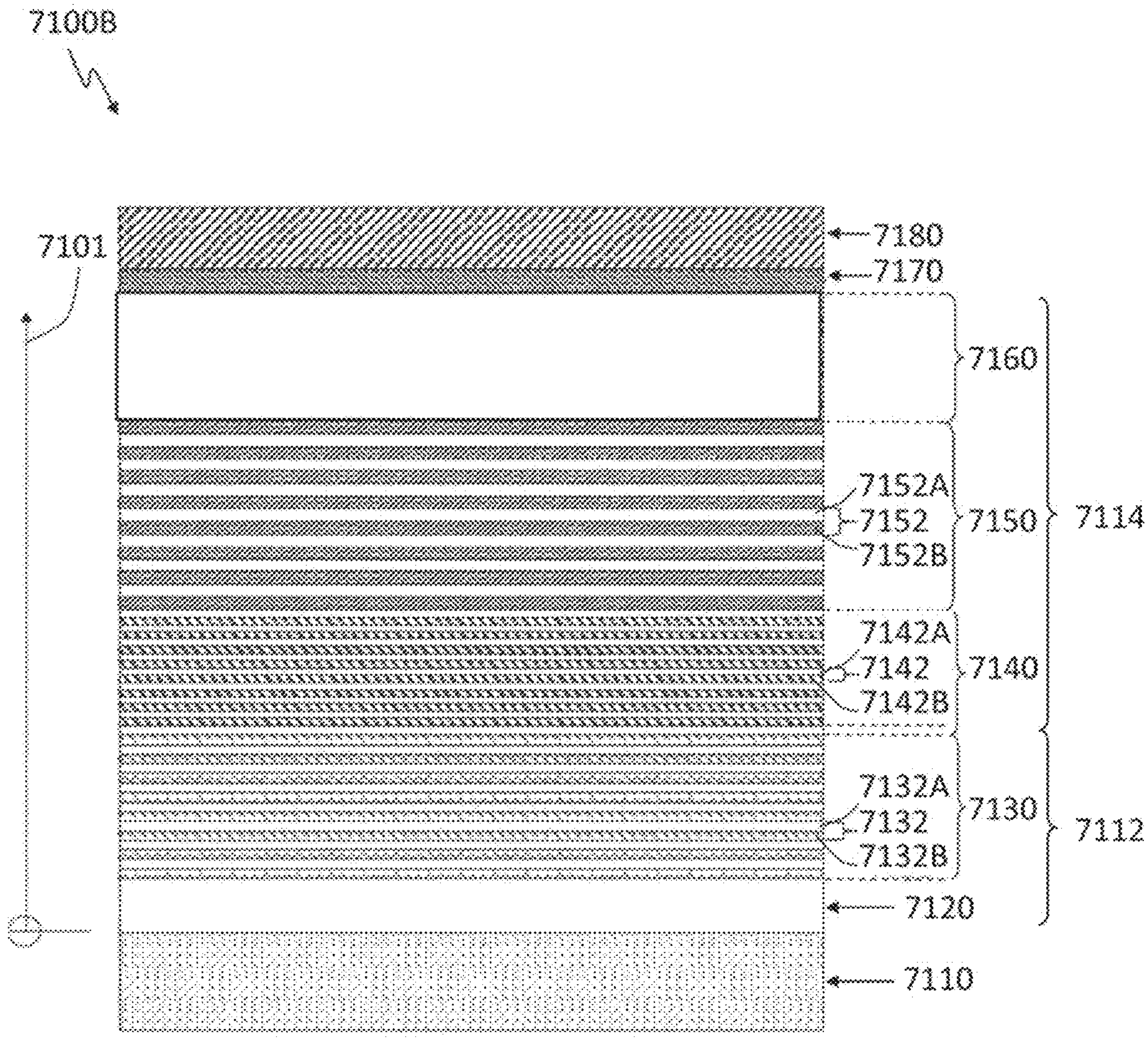

FIG. 116B is a diagram showing a sectional view of a semiconductor structure (or stack) for an optoelectronic device according to some embodiments.

Figure 116C:
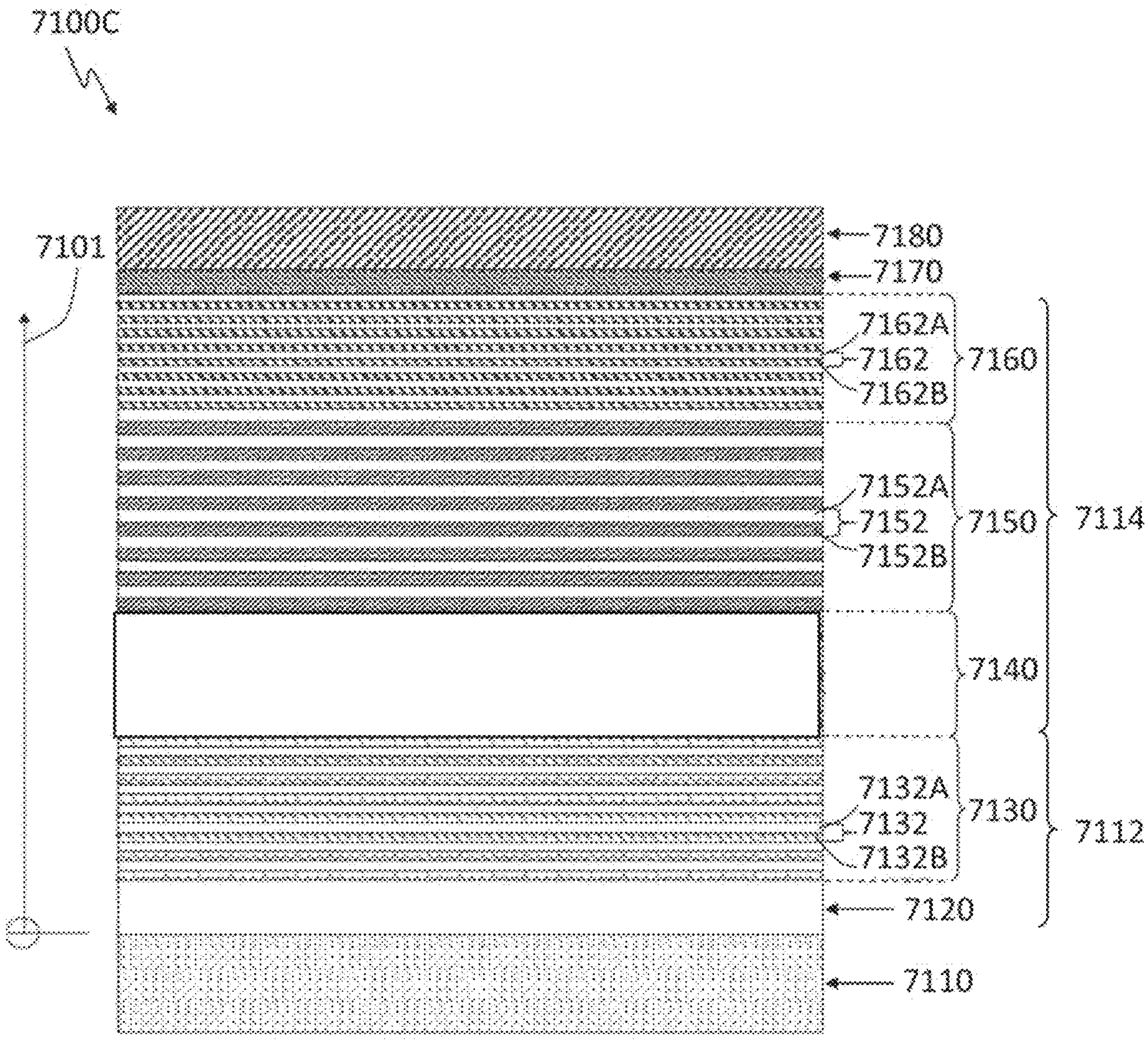

FIG. 116C is a diagram showing a sectional view of a semiconductor structure (or stack) for an optoelectronic device according to some embodiments.

Figure 117:
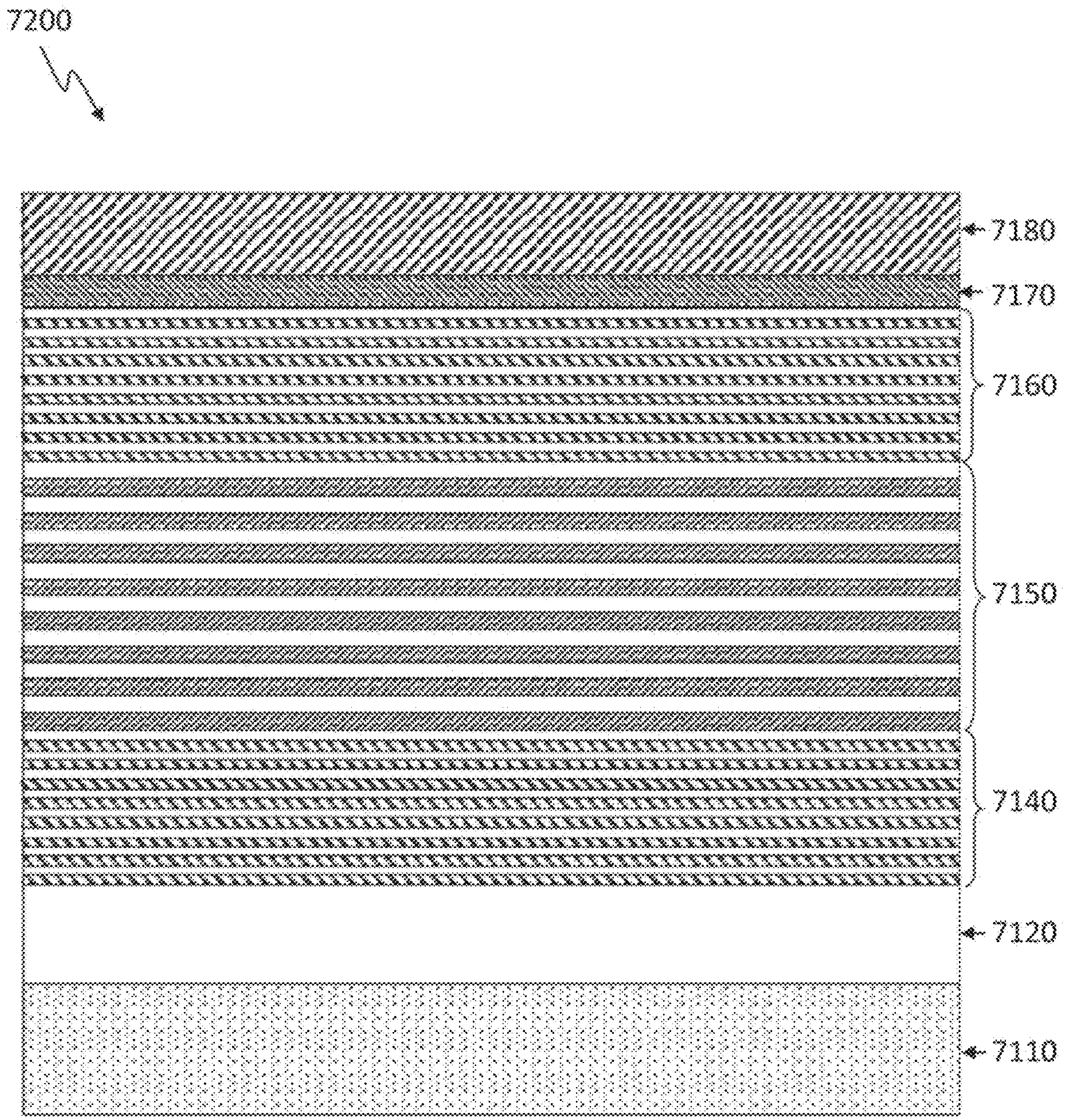

FIG. 117 is a diagram showing a sectional view of a semiconductor structure (or stack) for an optoelectronic device according to an embodiment of the present semiconductor structures with one or more superlattices containing an epitaxial oxide material.

Figure 118:
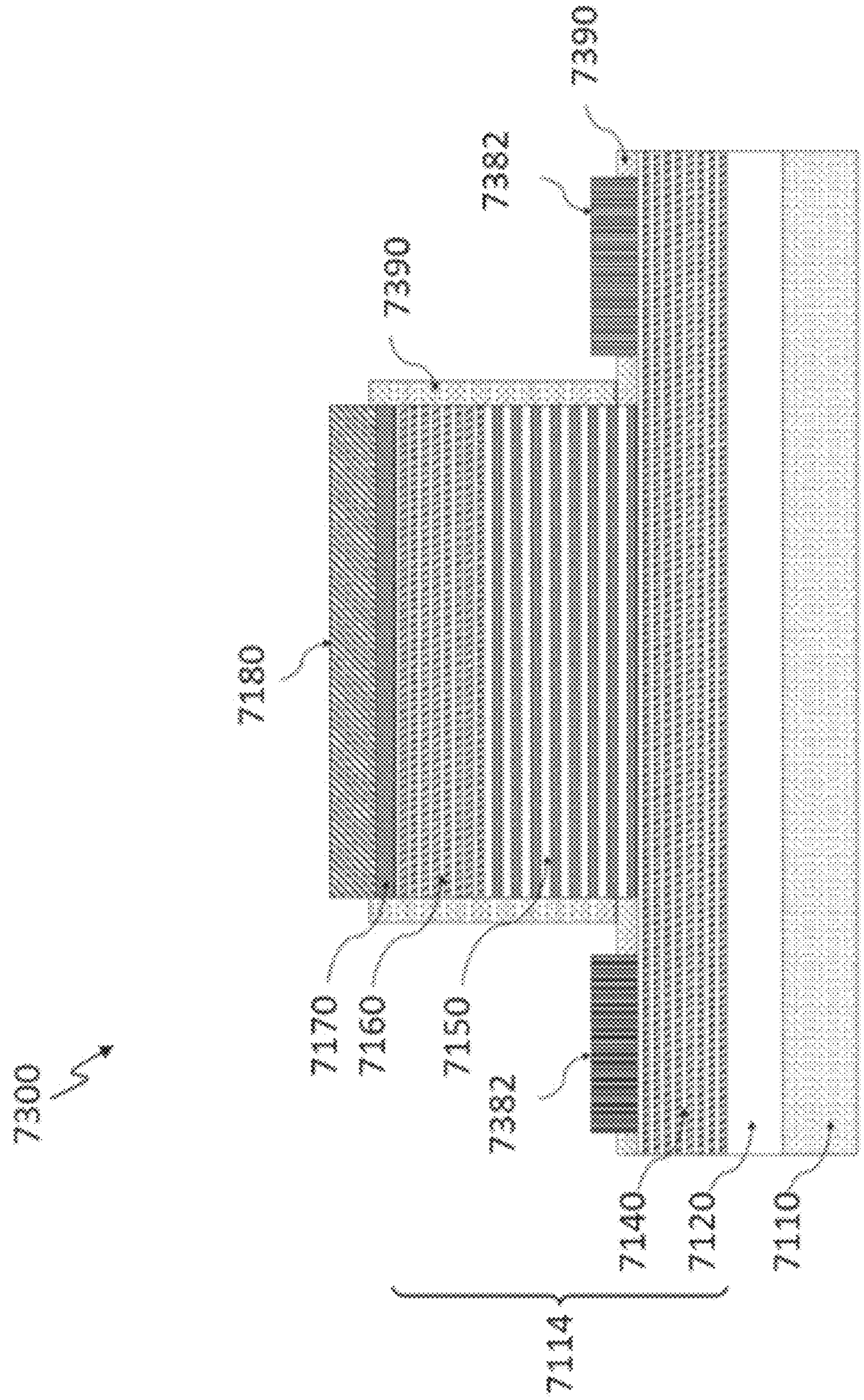

FIG. 118 is a diagram showing a sectional view of an optoelectronic device according to an embodiment of the present semiconductor structures with one or more superlattices containing an epitaxial oxide material.

Figure 119:
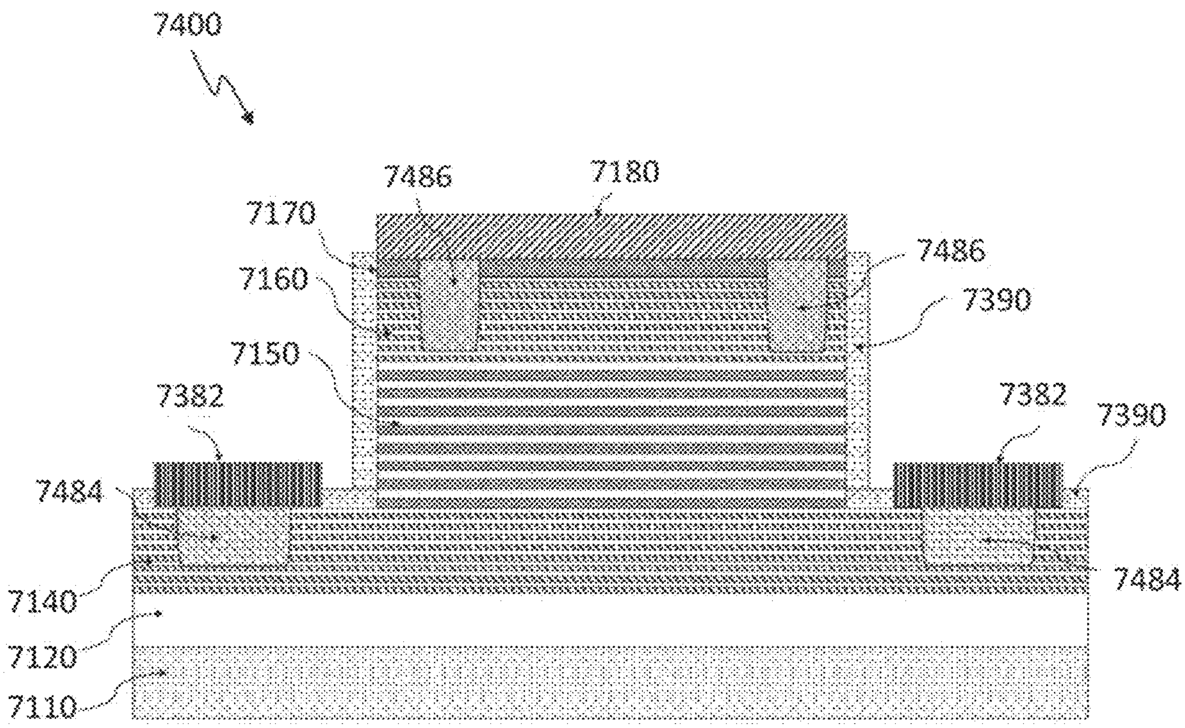

FIG. 119 is a diagram showing a sectional view of an optoelectronic device according to an embodiment of the present semiconductor structures with one or more superlattices containing an epitaxial oxide material.

Figure 120:
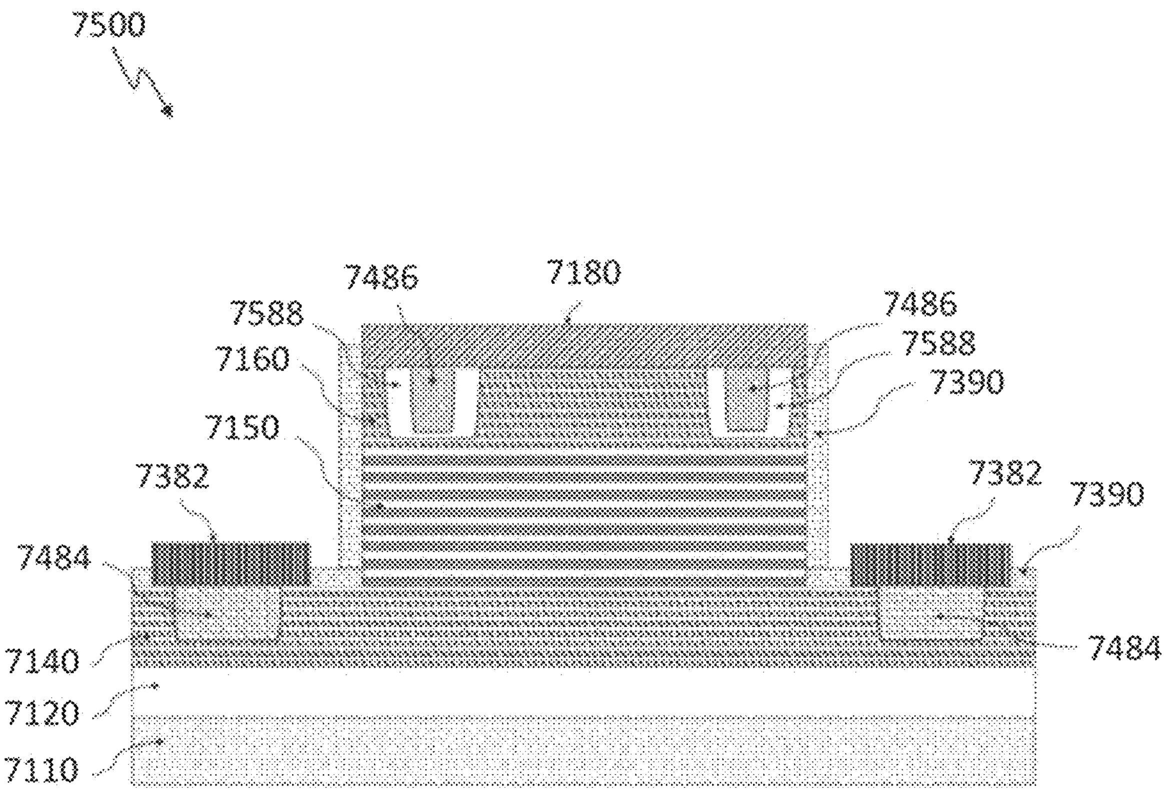

FIG. 120 is a diagram showing a sectional view of an optoelectronic device according to an embodiment of the present semiconductor structures with one or more superlattices containing an epitaxial oxide material.

Figure 121:
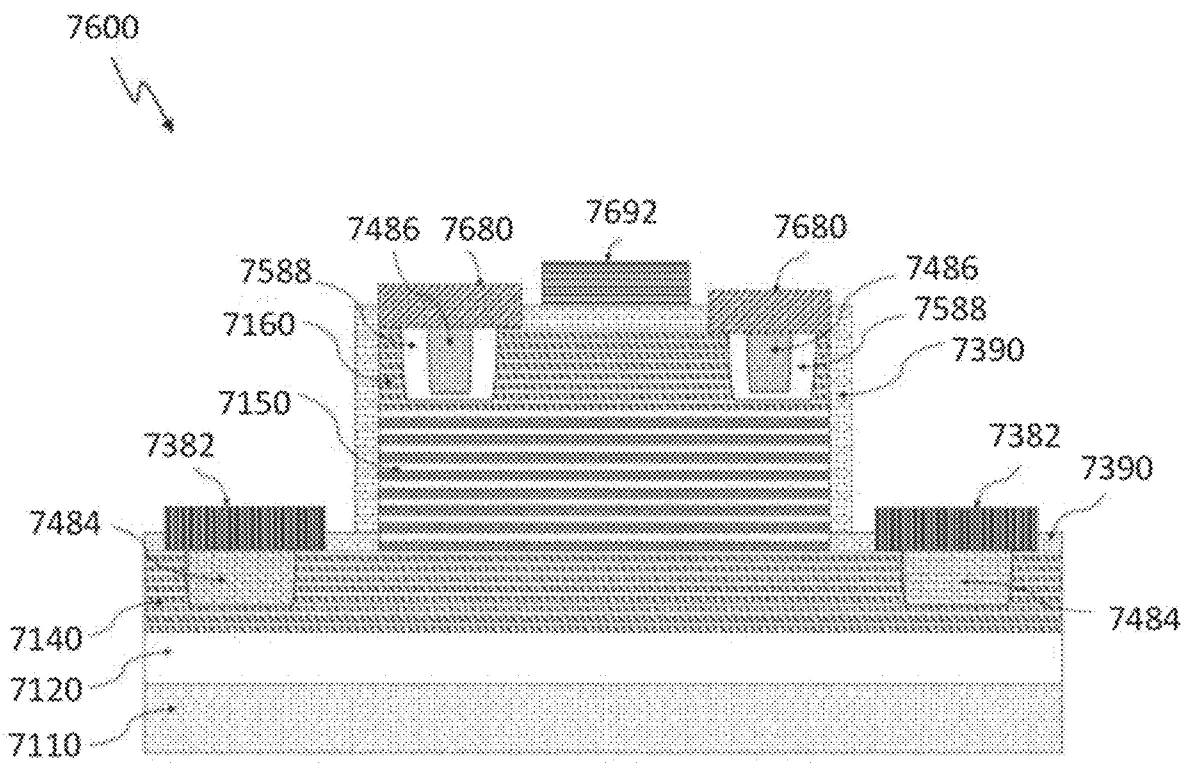

FIG. 121 is diagram showing a sectional view of an optoelectronic device according to an embodiment of the present semiconductor structures with one or more superlattices containing an epitaxial oxide material.

Figure 122:
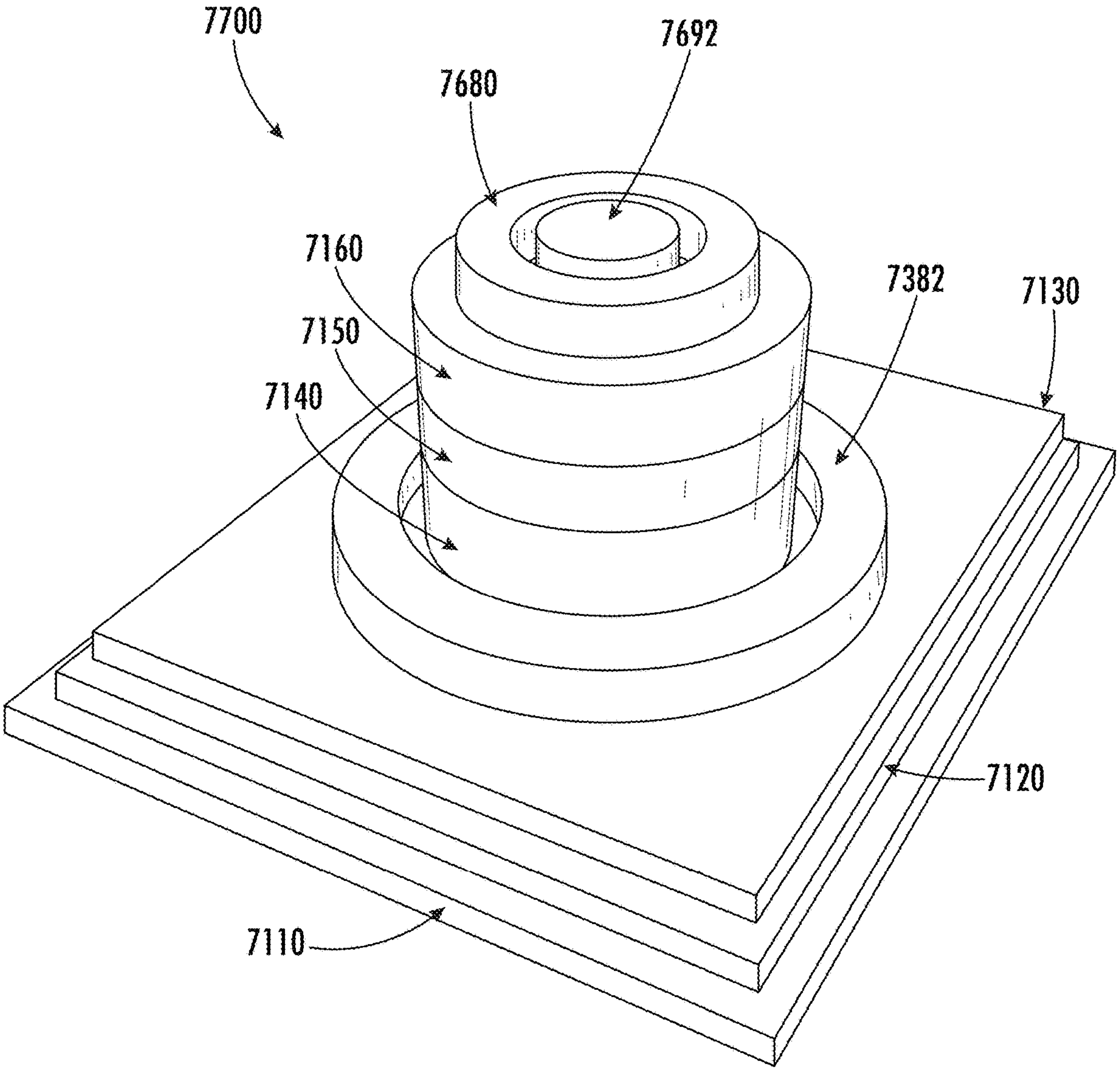

FIG. 122 is a diagram showing a perspective view of an optoelectronic device according to an embodiment of the present semiconductor structures with one or more superlattices containing an epitaxial oxide material.

Figure 123:
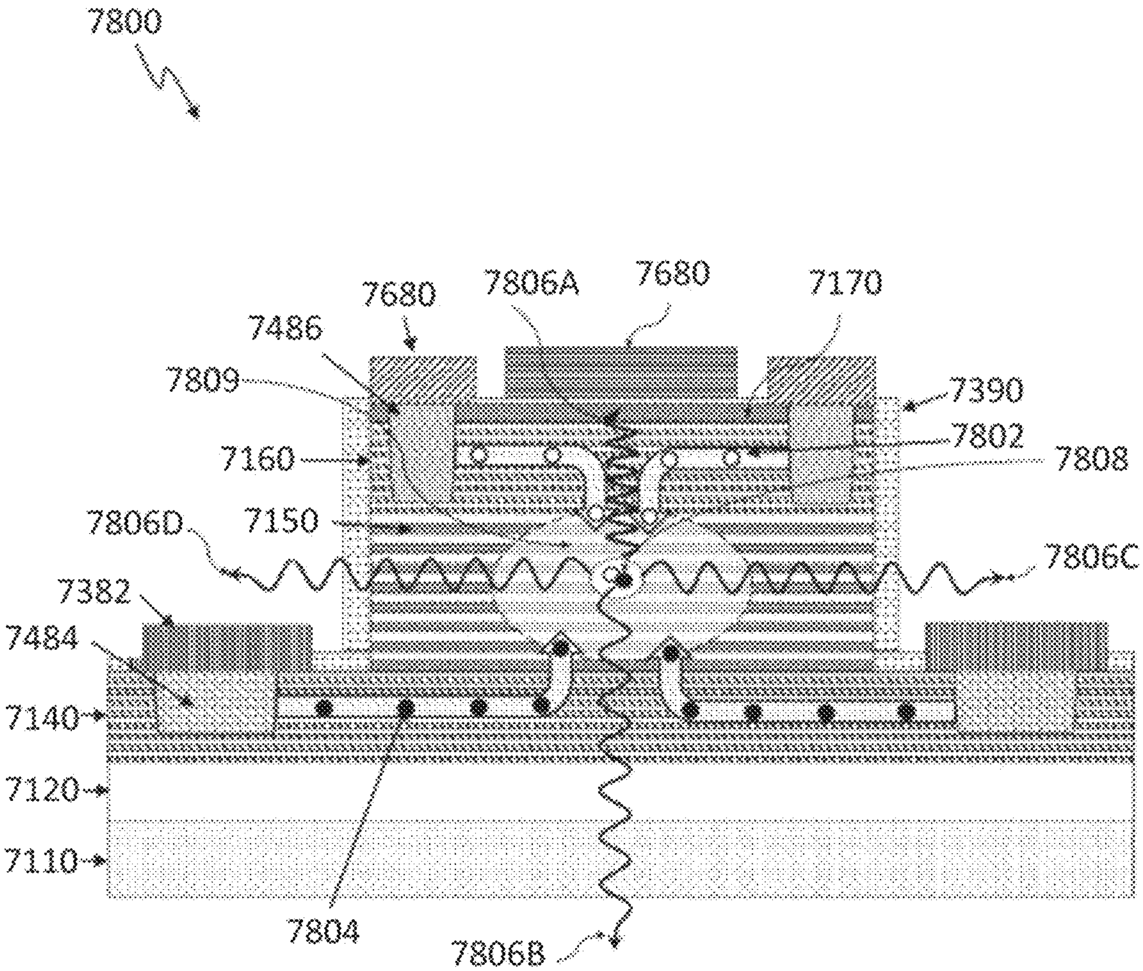

FIG. 123 is a diagram showing a sectional view of an optoelectronic device according to an embodiment of the present semiconductor structures with one or more superlattices containing an epitaxial oxide material.

Figure 124:
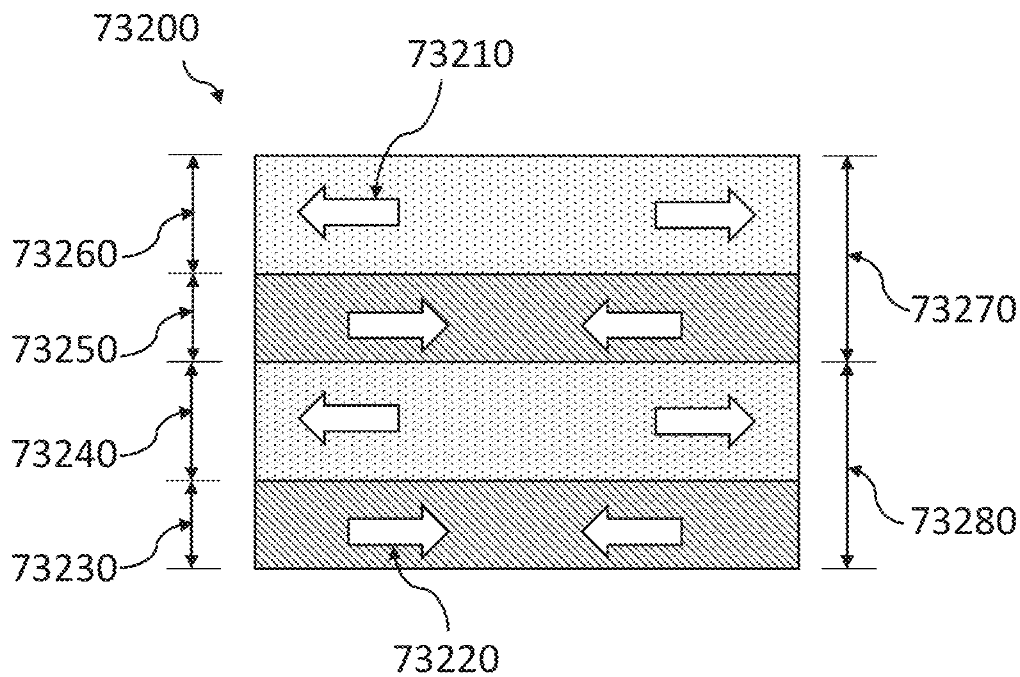

FIG. 124 shows schematically an example of the atomic forces (or stresses) and present in a structure comprising two unit cells.

Figure 125:
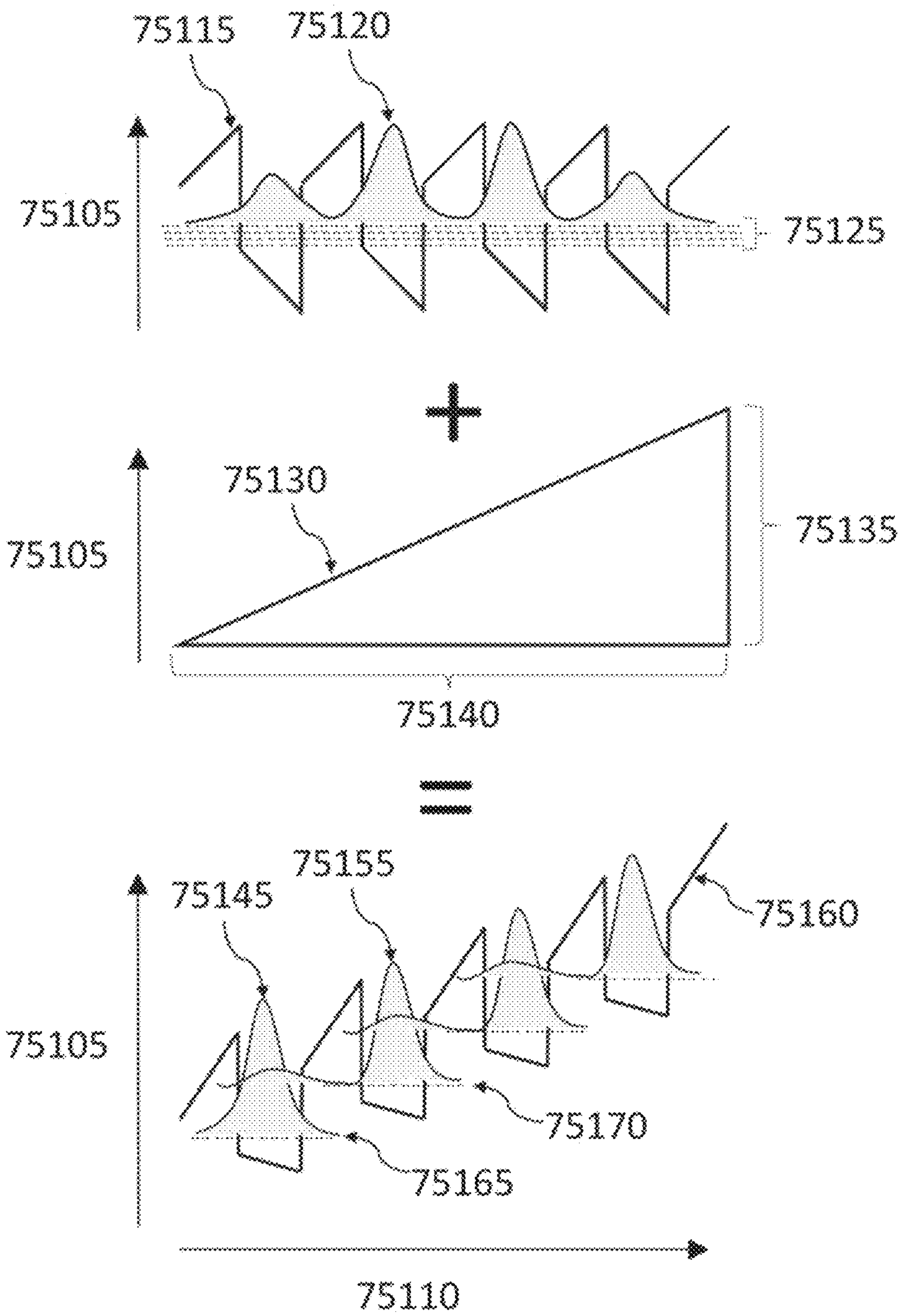

FIG. 125 schematically describes the influence of the built-in depletion field having potential energy along a distance that is parallel to a growth direction in the semiconductor structures with one or more superlattices containing epitaxial oxide materials described herein.

Figure 126:
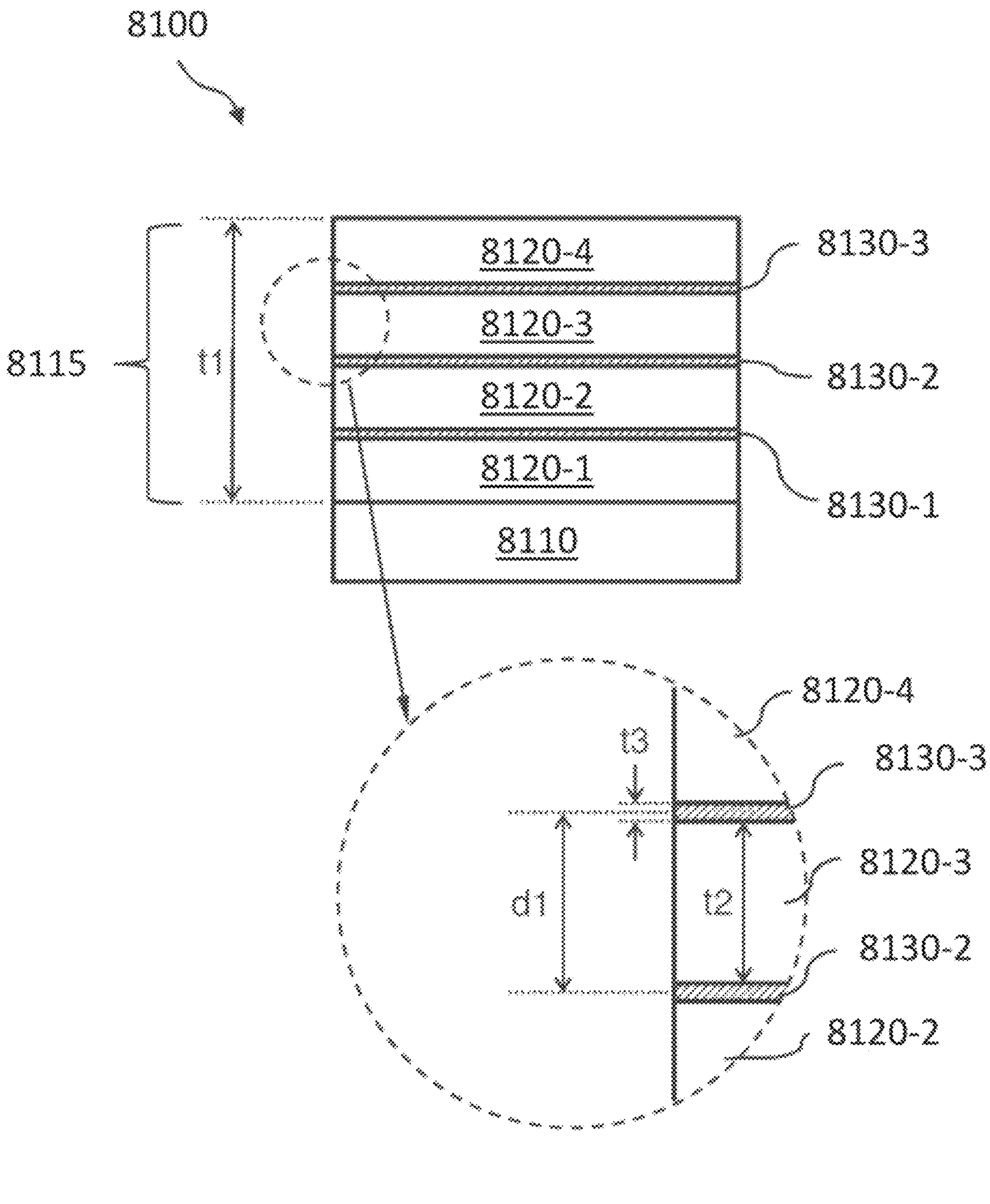

FIG. 126 is a cross-sectional view of a structure comprising a semiconductor layer and a doped superlattice, according to an embodiment.

Figure 127:
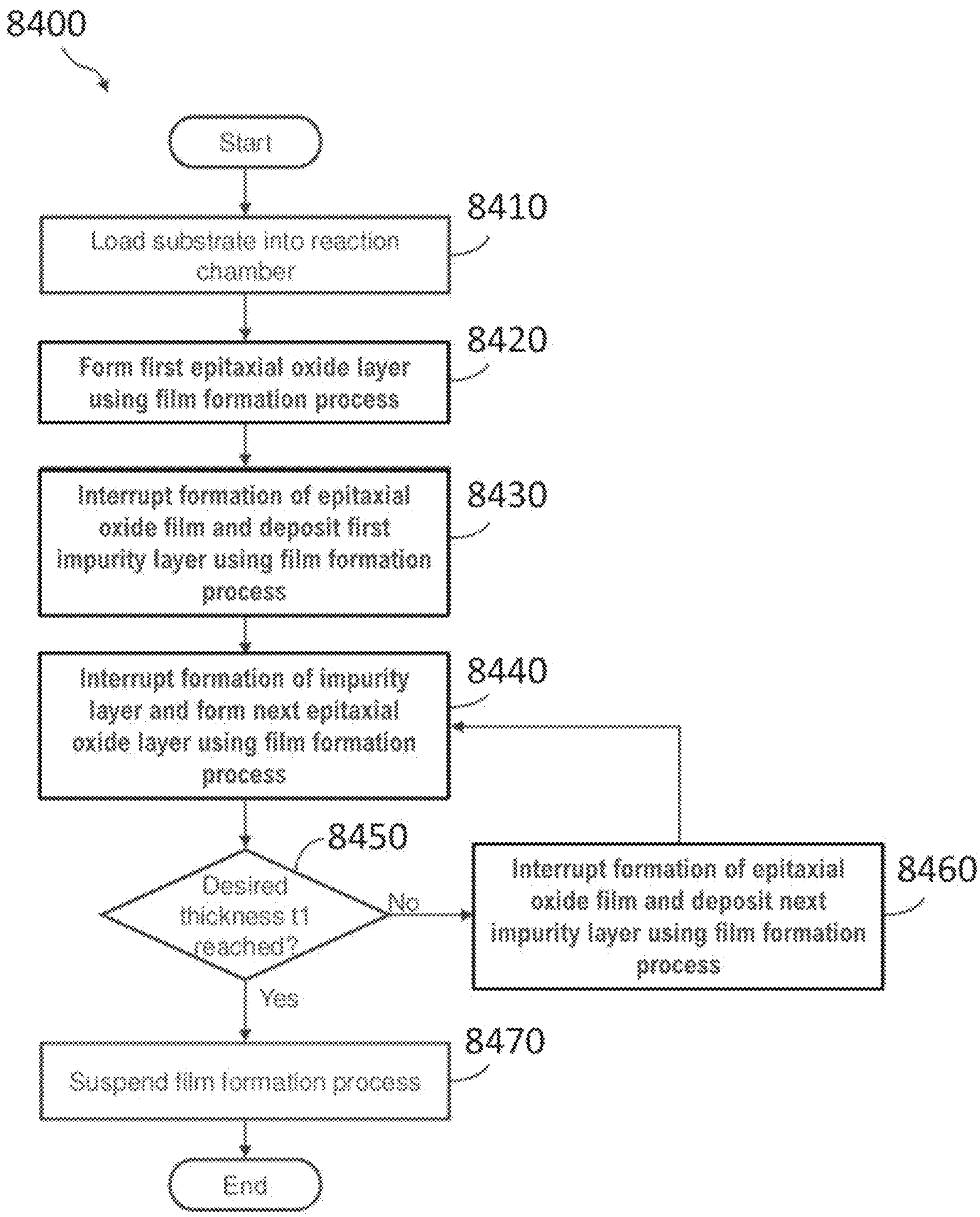

FIG. 127 is a flow diagram of an example of a method of making a doped superlattice described herein via a film formation process.

Figure 128:
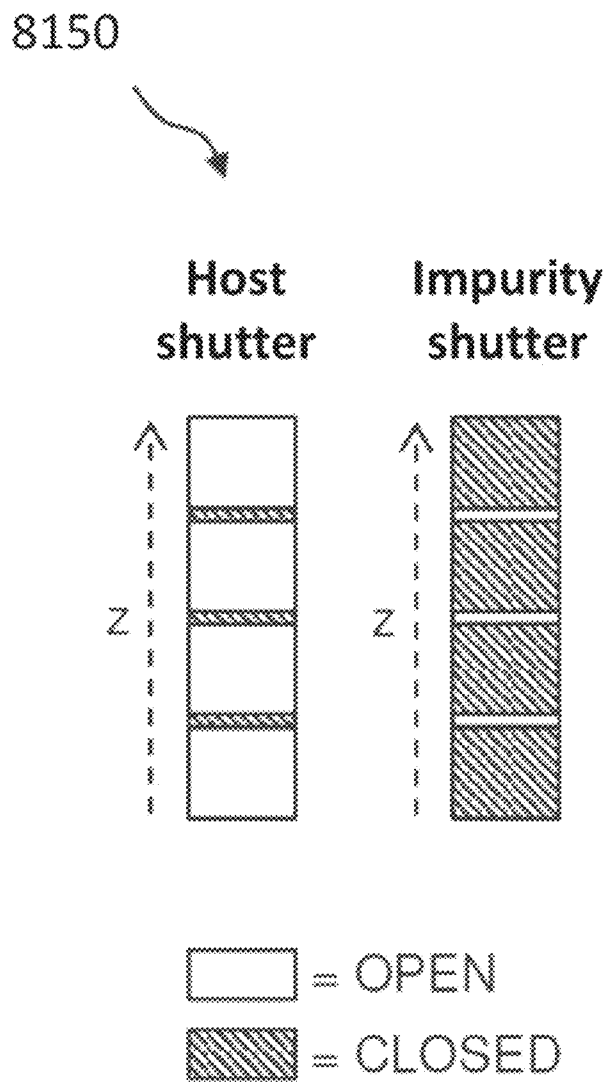

FIG. 128 shows an example of shutter sequences for a film formation process shown in FIG. 127.

Figure 129:
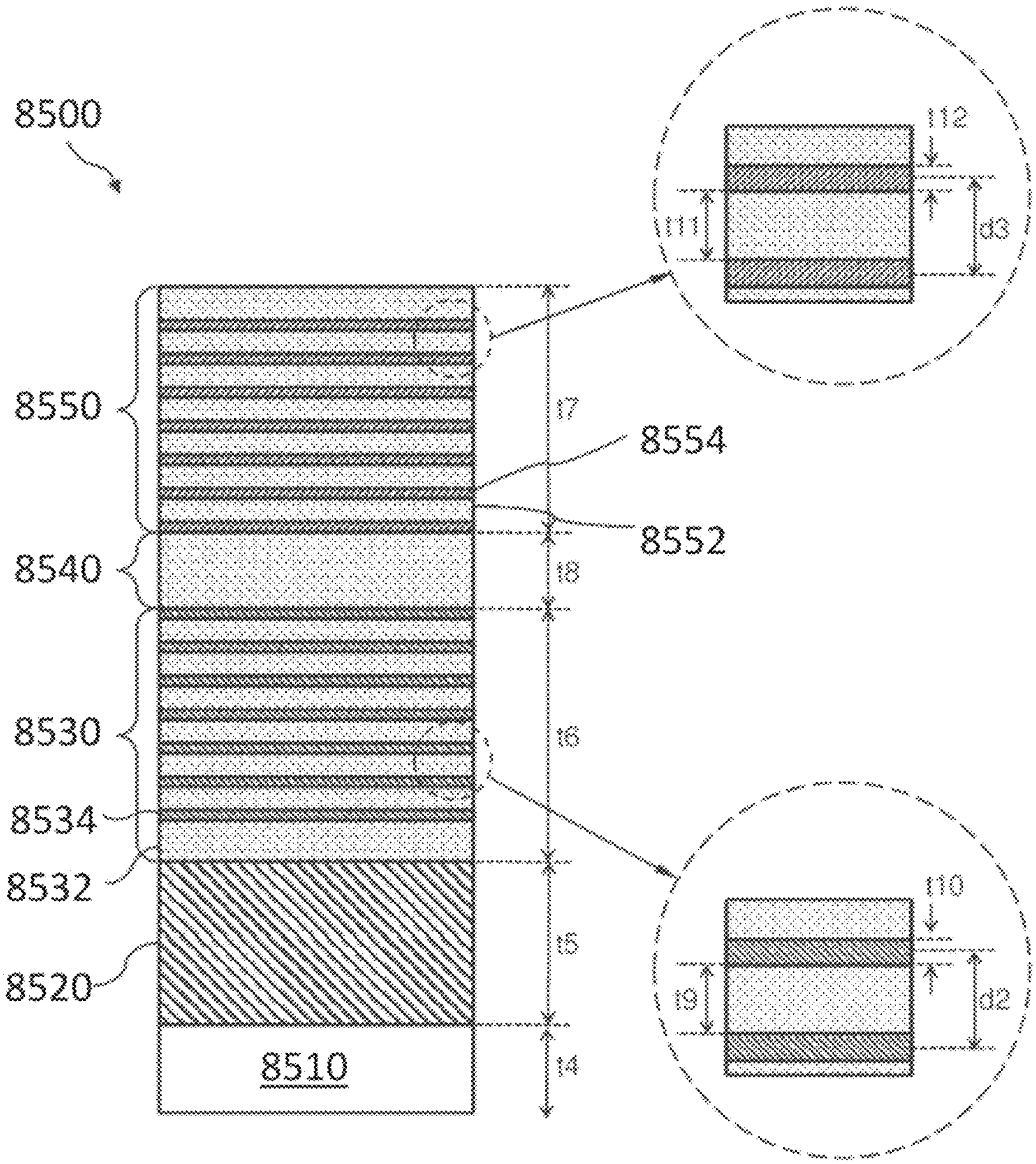

FIG. 129 is a cross-sectional view of an electronic device, according to some embodiments.

Figure 130:
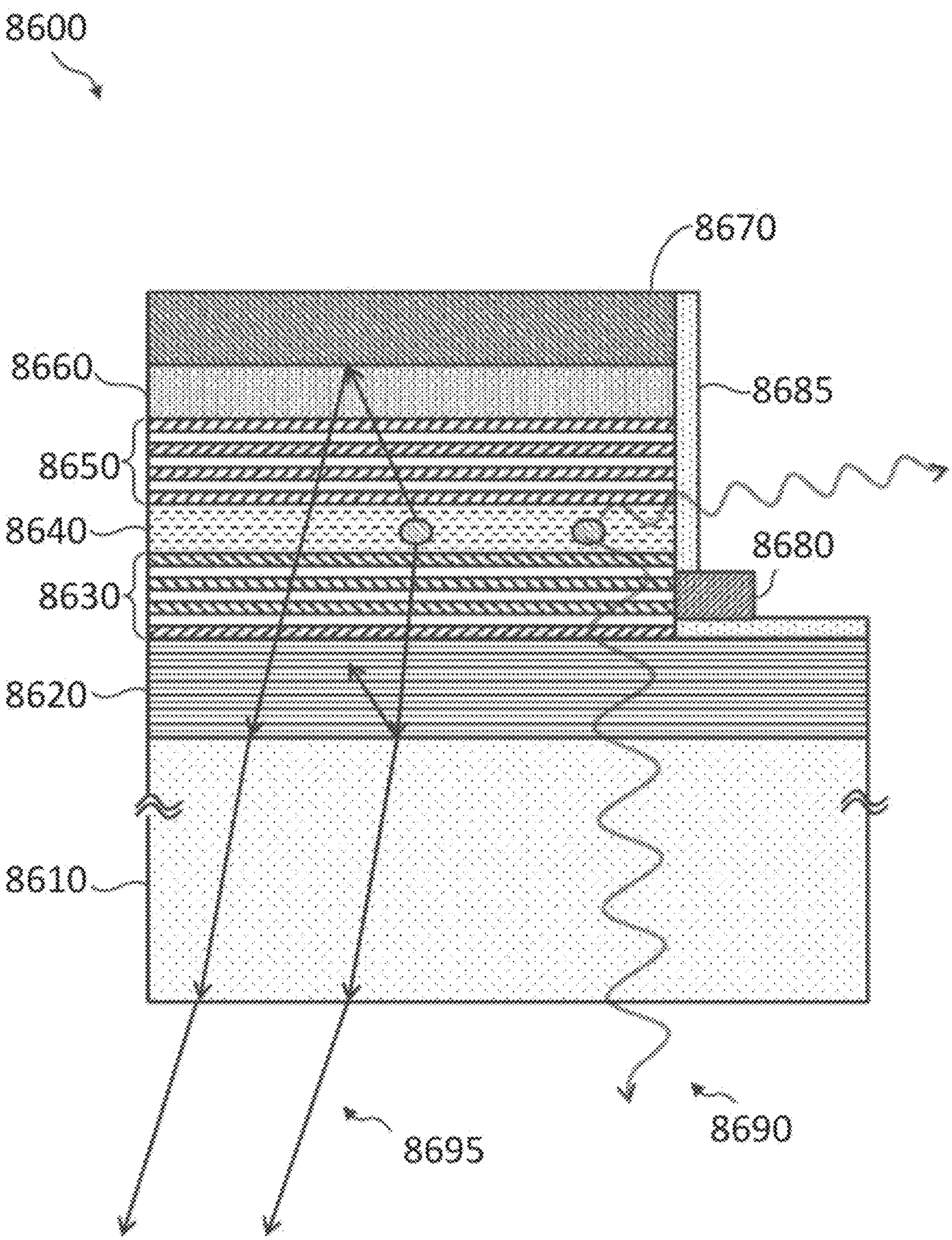

FIG. 130 is a cross-sectional view of an example of an LED device that is based on the structure of the electronic device shown in FIG. 129.

Figure 131:
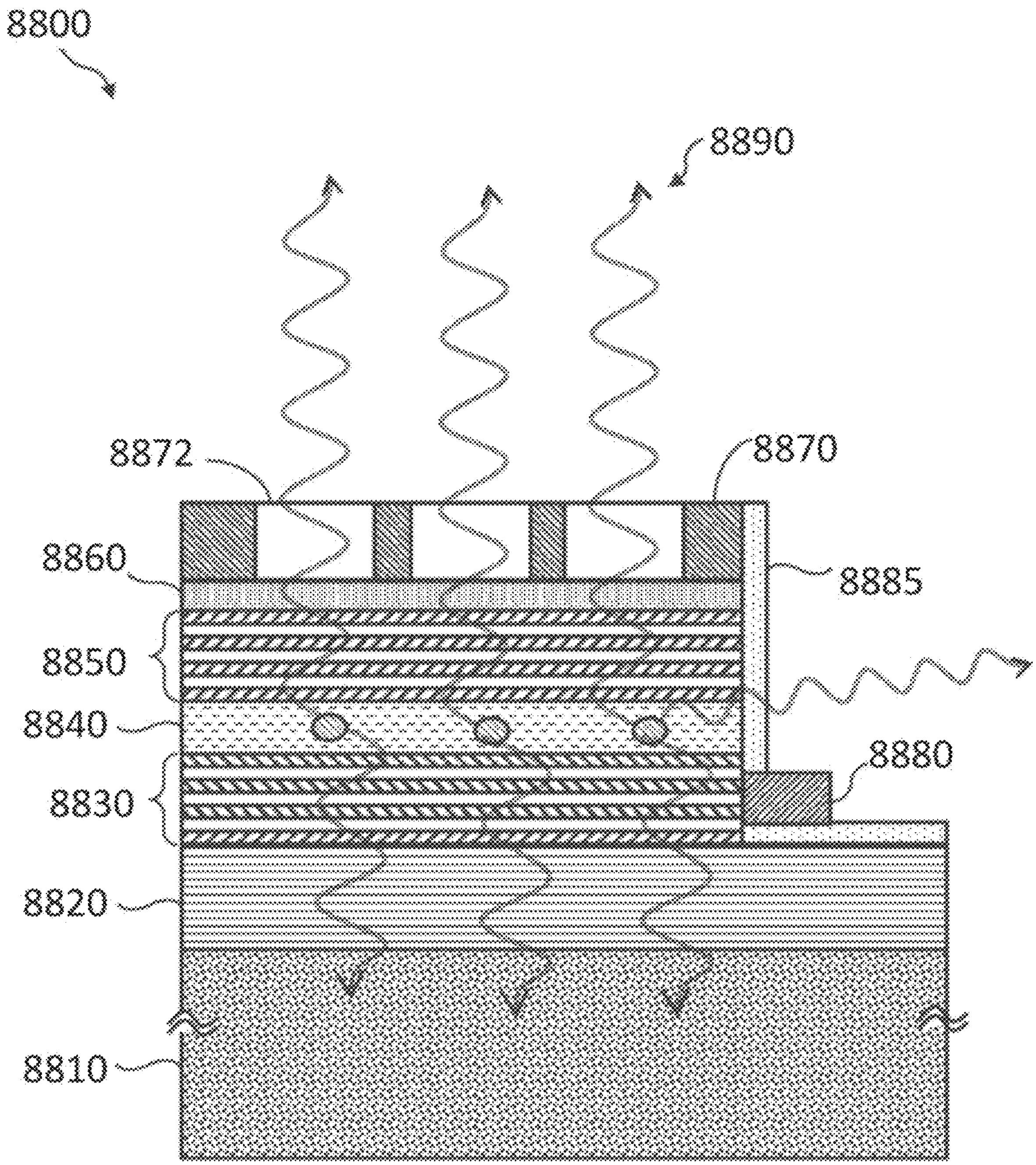

FIG. 131 is a cross-sectional view of an example of an LED device that is based on the electronic device and the LED device shown in FIGS. 129 and 130.

Figure 132:
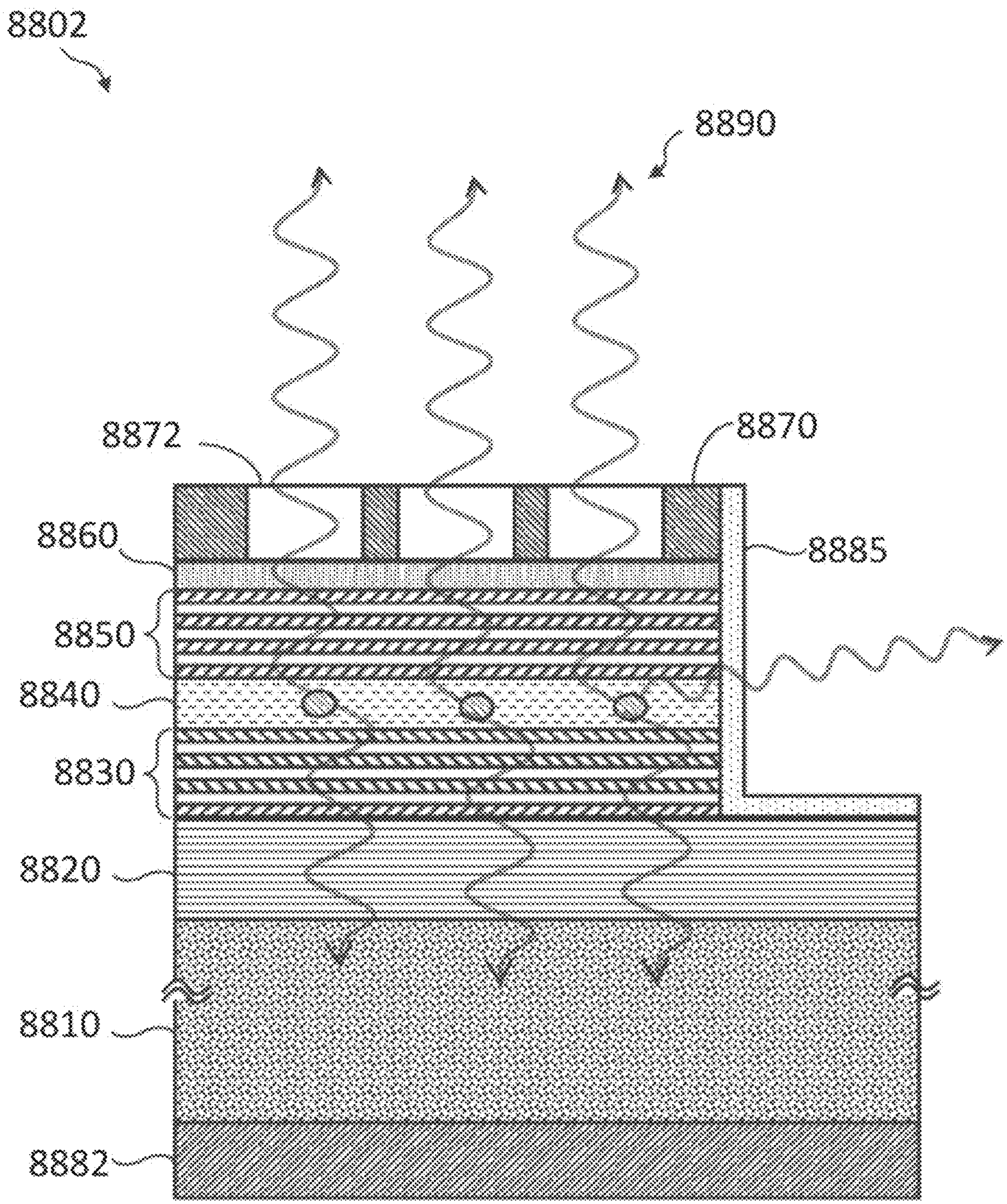

FIG. 132 is a cross-sectional view of an example of an LED device based on the LED device shown in FIG. 131.

Figure 133:
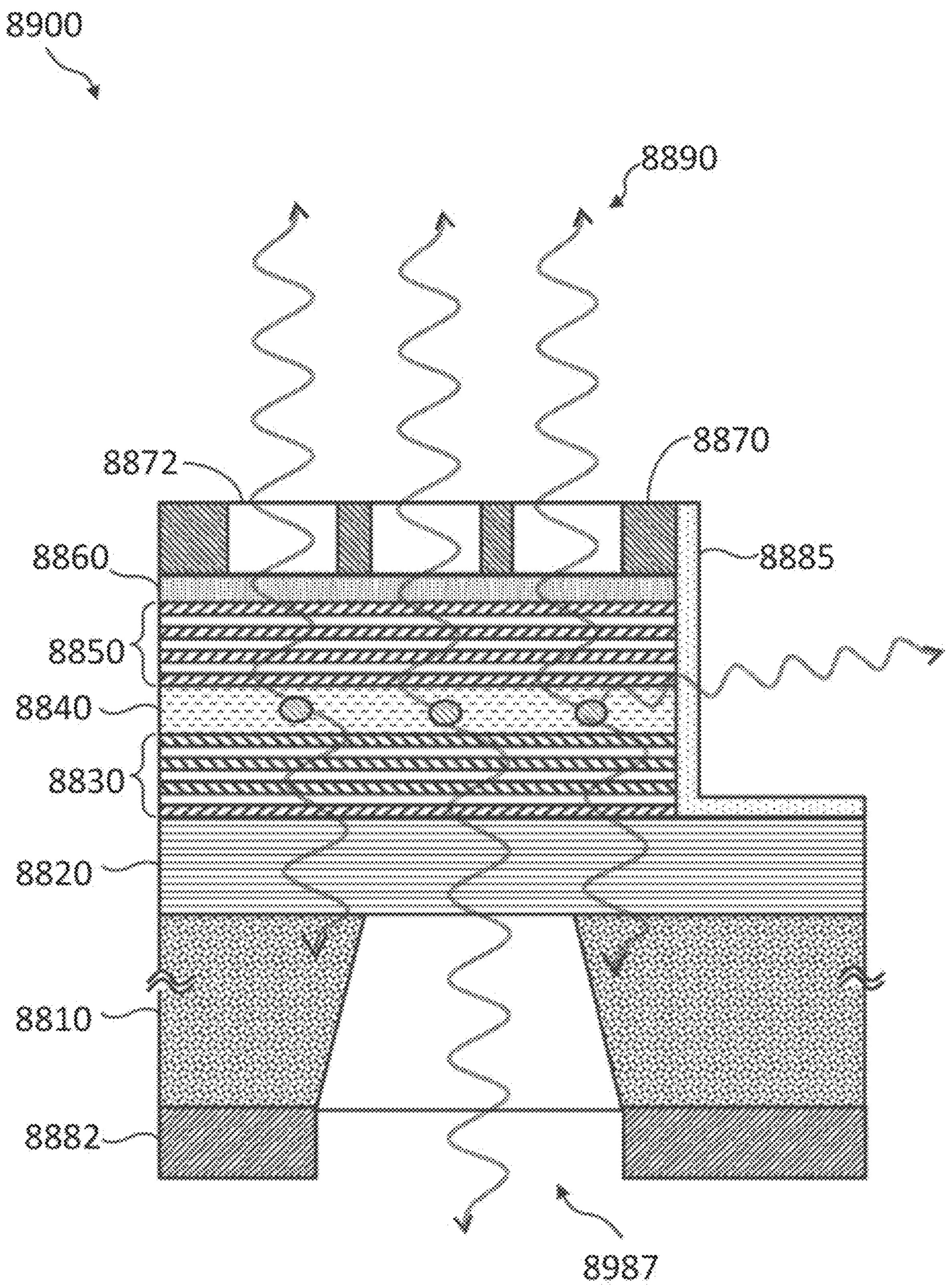

FIG. 133 is a cross-sectional view of an example of an LED device.

Figure 134:
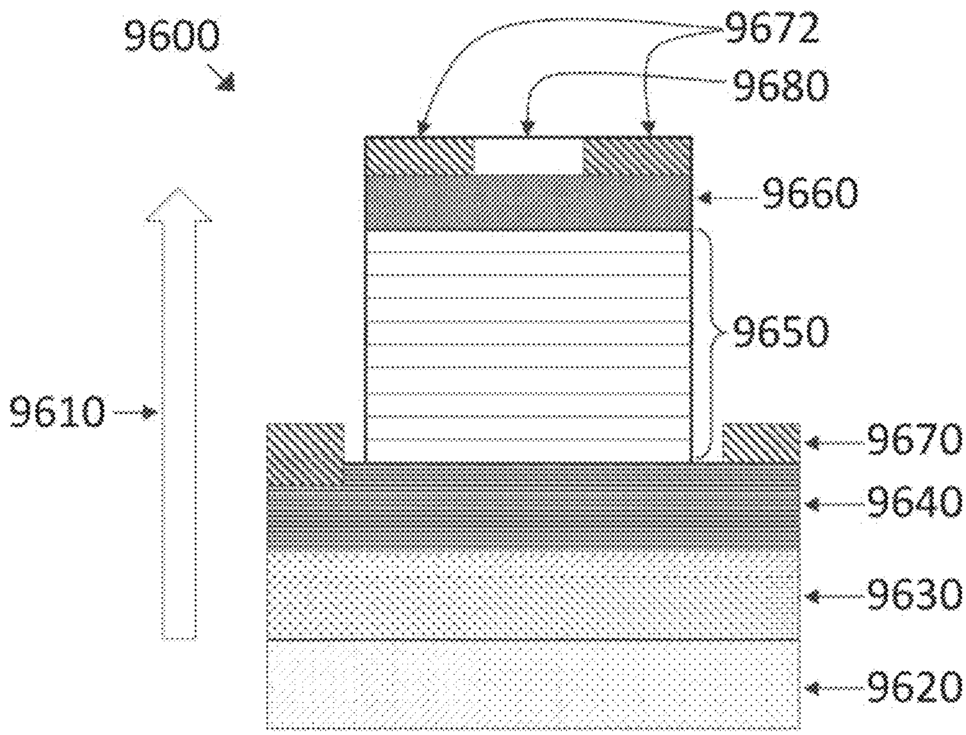

FIG. 134 illustrates a metal-polar 'p-UP' LED structure for a metal-polar epitaxial oxide film growth with respect to a growth axis (sometimes referred to as a growth direction 'z').

Figure 135:
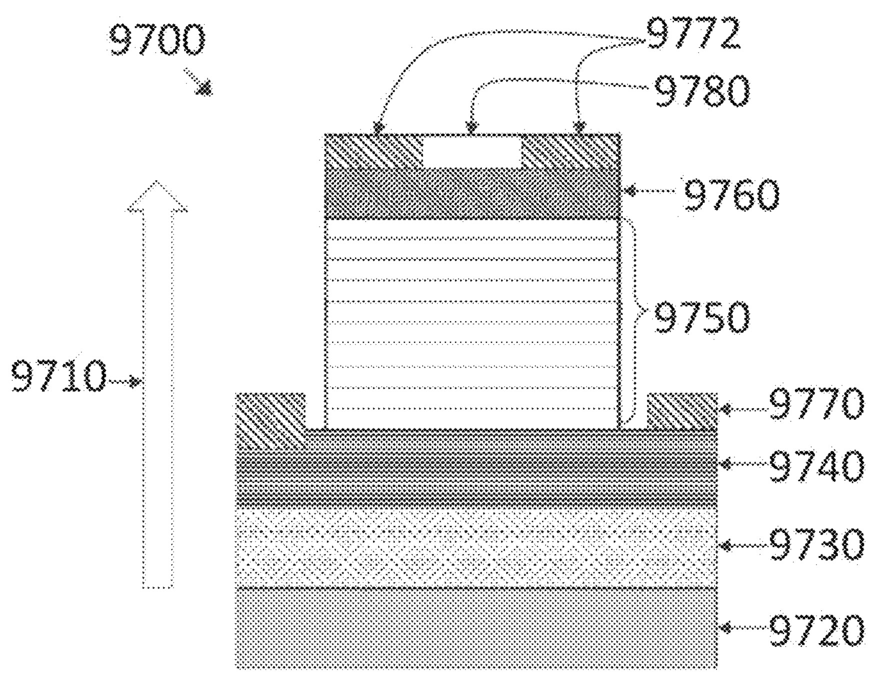

FIG. 135 illustrates an oxygen-polar 'p-DOWN' LED structure for an oxygen-polar epitaxial oxide film growth with respect to a growth axis.

Figure 136:
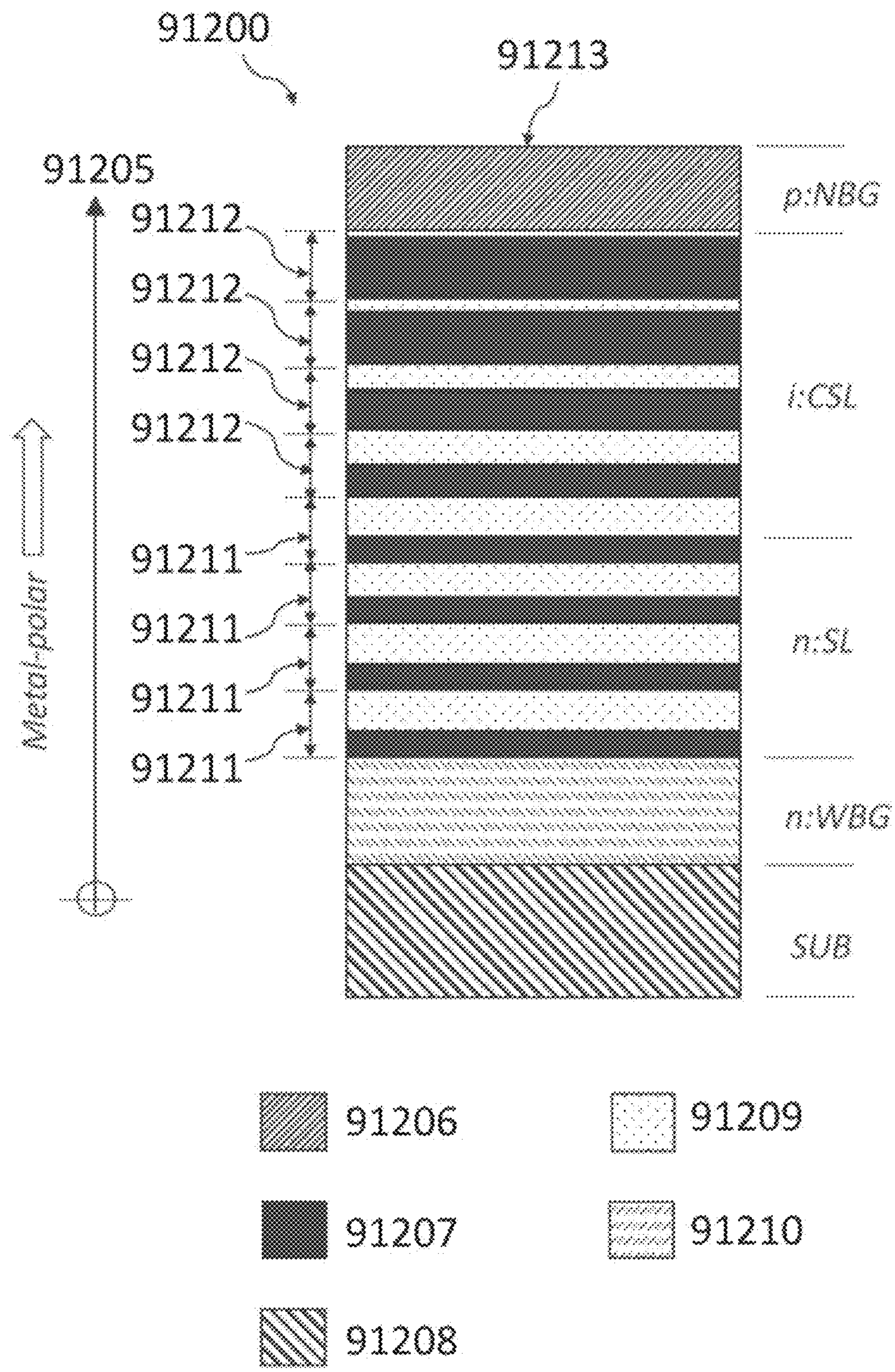

FIG. 136 shows a semiconductor structure (or stack) for generating electrical and optical portions of a p-n diode according to some embodiments.

Figure 137:
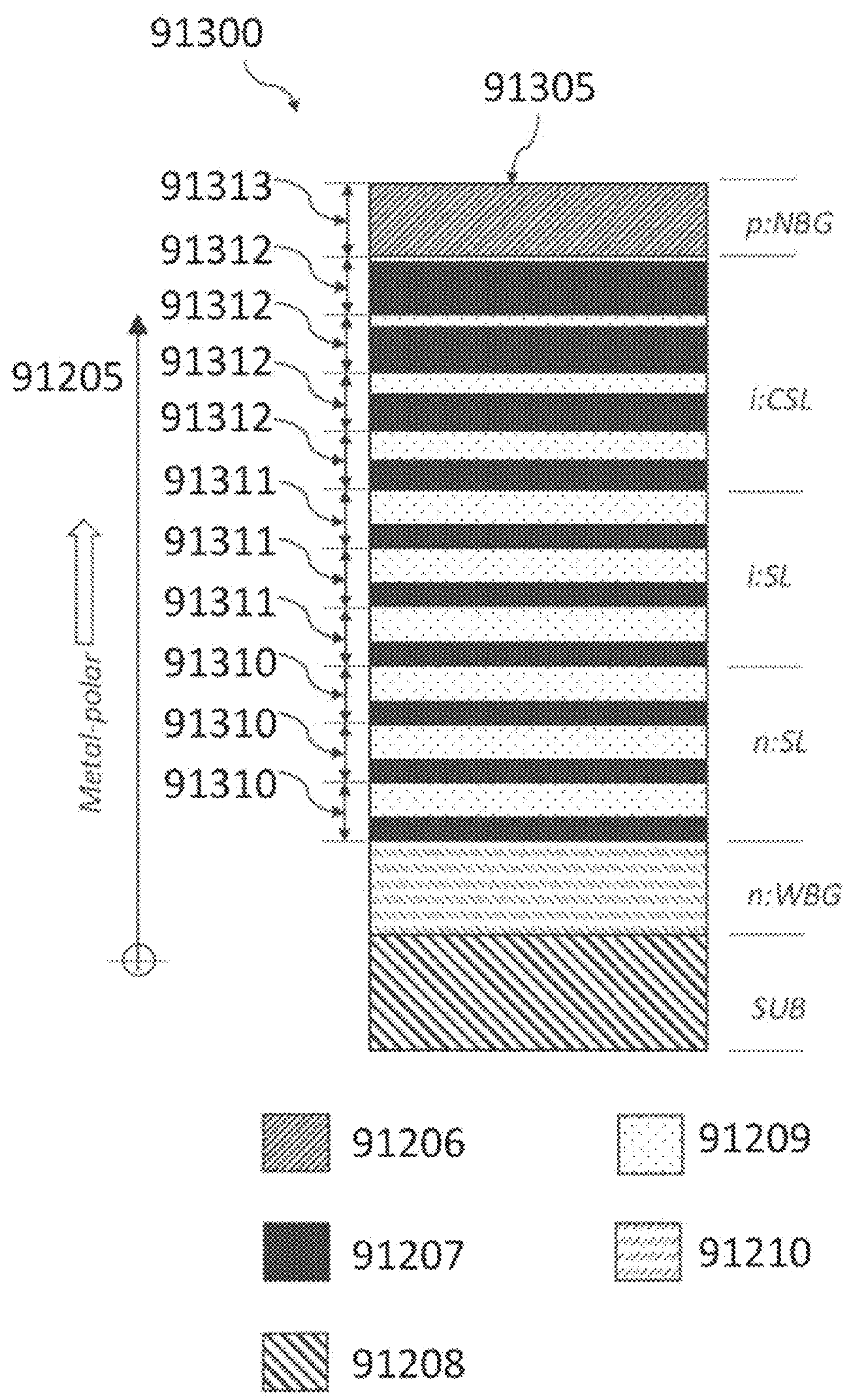

FIG. 137 shows a semiconductor structure (or stack) for generating electrical and optical portions of a p-i-n diode according to some embodiments.

Figures 138, 139:
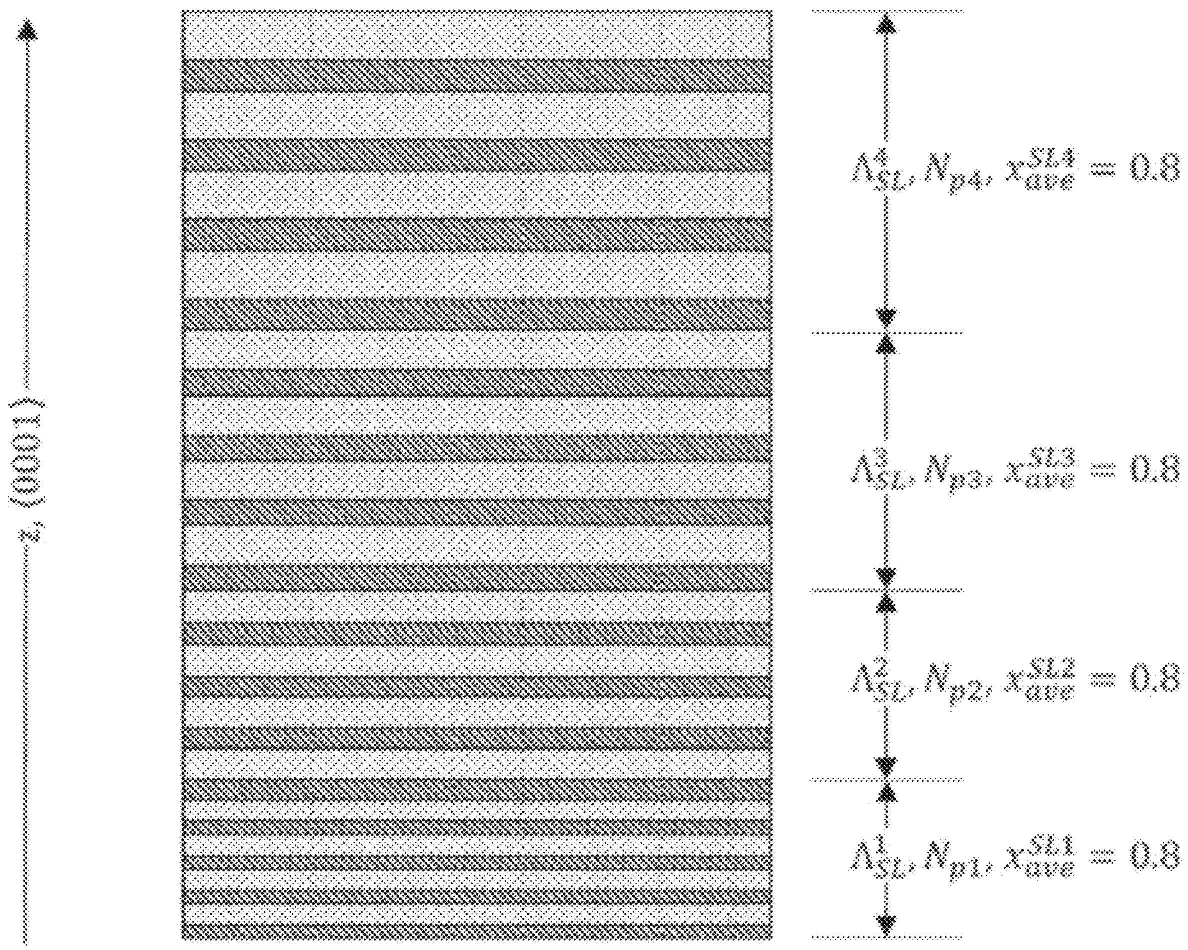

FIG. 138 illustrates a further gradient pattern growth sequence for a gradient region with a chirped bilayer period and constant $x_{ave}$ superlattice structure.

FIG. 139 illustrates a broad flow diagram for forming semiconductor structures having a graded layer or graded region.

Figure 140A:
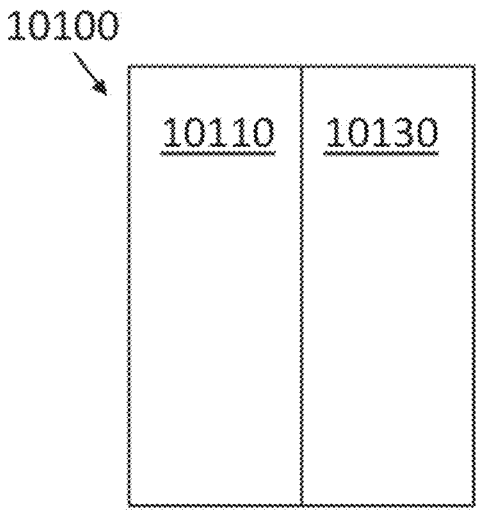

FIG. 140A shows an epitaxial oxide semiconductor structure with an epitaxial oxide layer containing a wide bandgap semiconductor, and an adjacent epitaxial oxide layer containing a narrow bandgap semiconductor.

Figure 140B:
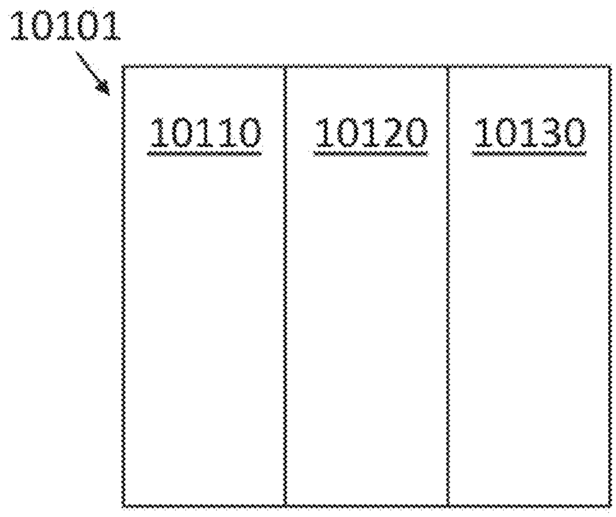

FIG. 140B shows a semiconductor structure with an epitaxial oxide layer containing a wide bandgap semiconductor, an epitaxial oxide layer containing a narrow bandgap semiconductor, and an epitaxial oxide chirp layer between the narrow and wide bandgap epitaxial oxide layers.

Figure 140C:
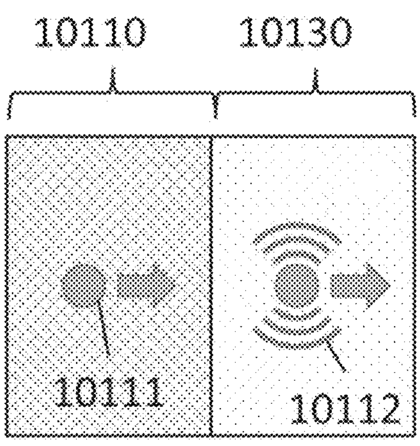

FIG. 140C illustrates an electron moving through the structure from left to right in the figure.

Figure 140D:
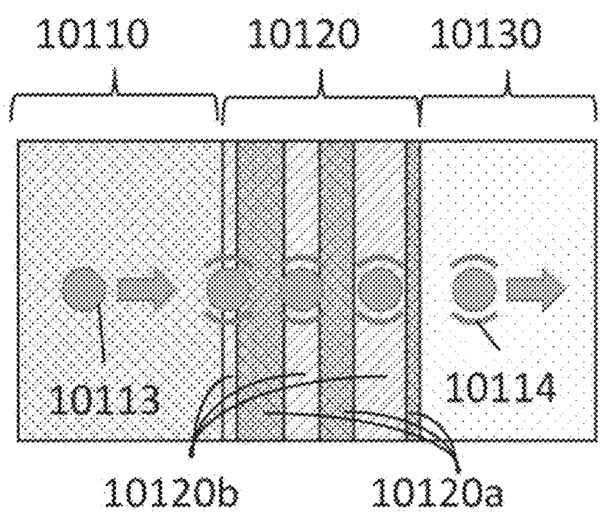

FIG. 140D illustrates an electron moving through the structure (containing the epitaxial oxide chirp layer) from left to right in the figure.

Figure 141A:
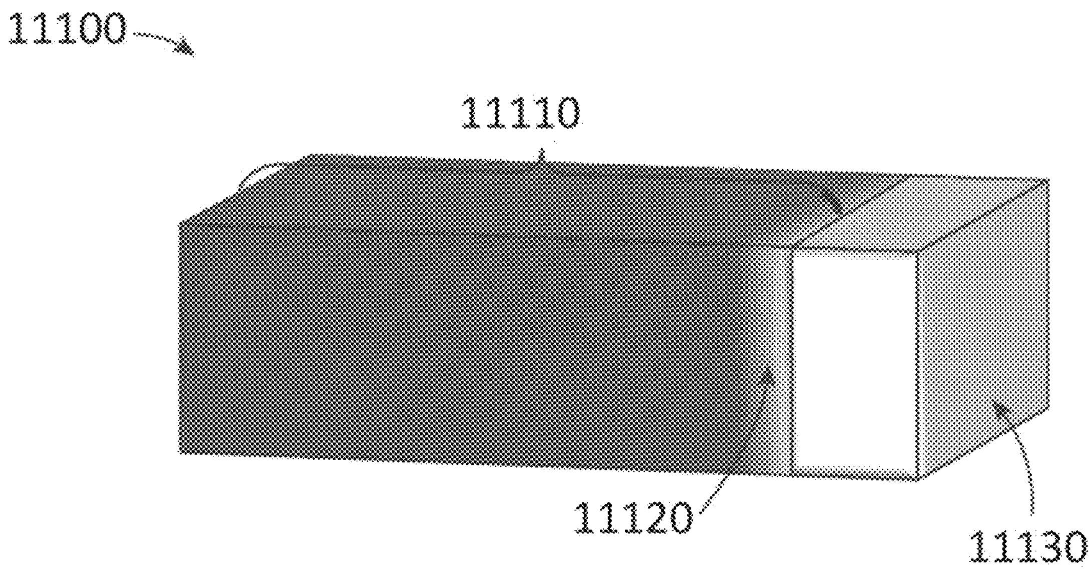

FIG. 141A is a schematic of an example of a semiconductor structure containing an epitaxial oxide semiconductor-metal junction, whose epitaxial oxide semiconductor material is piezoelectric and abruptly graded in composition or graded in strain within contact layer adjacent to an interface with a metal contact, in accordance with some embodiments.

Figure 141B:
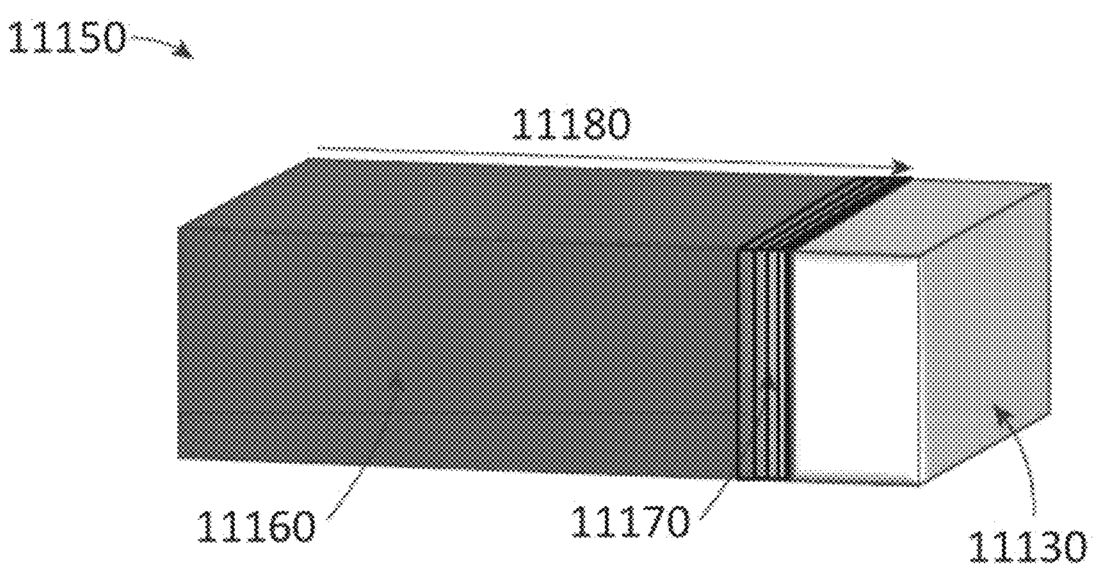

FIG. 141B is a schematic of an example of a semiconductor structure containing an epitaxial oxide semiconductor-metal junction containing a metal contact, a constant composition epitaxial oxide material, and a contact layer.

Figure 142:
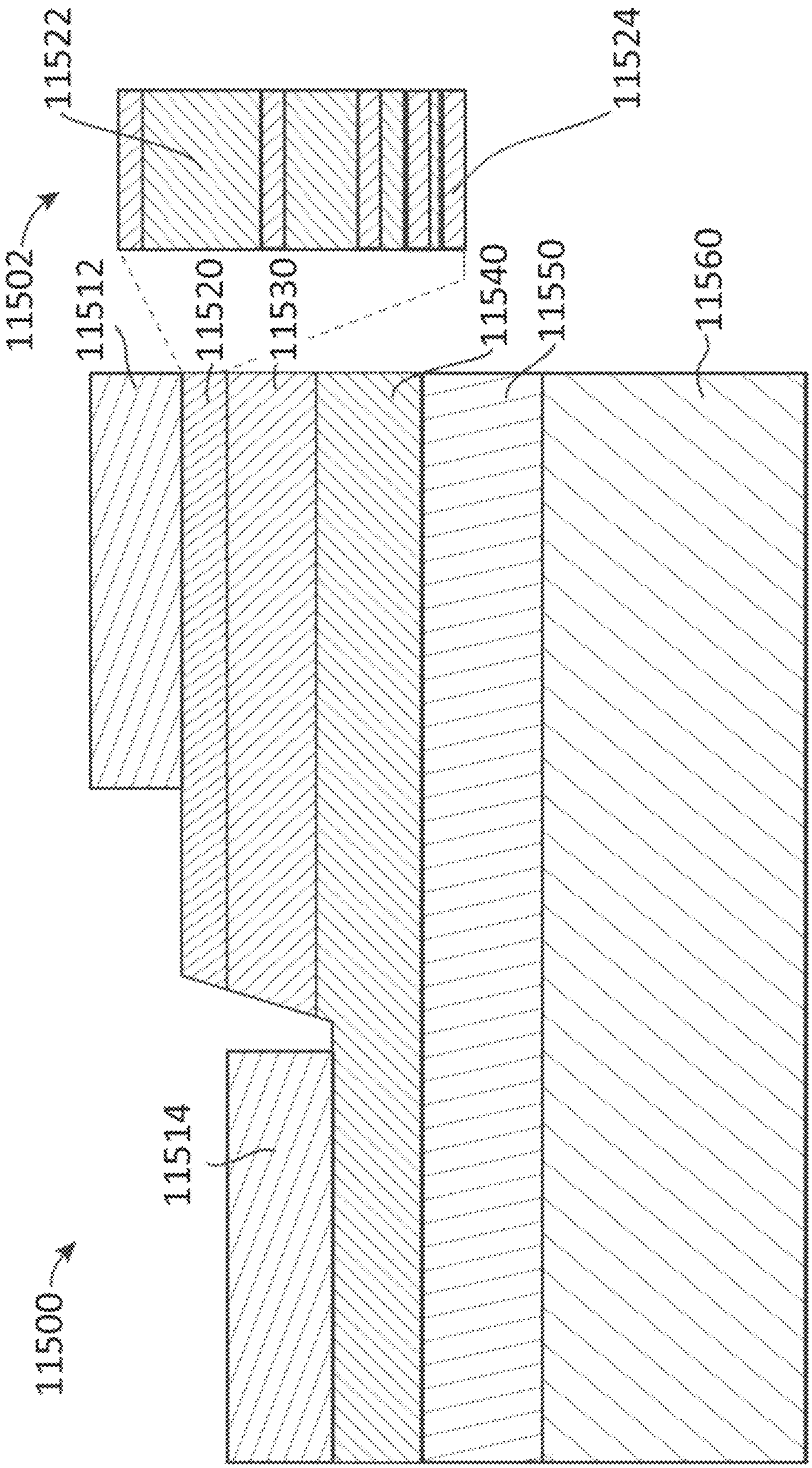

FIG. 142 shows a simplified schematic side view of an LED structure including a mesa structure, and an expanded view of the sublayer thicknesses of an ohmic-chirp layer (or chirp layer).

Figure 143A:
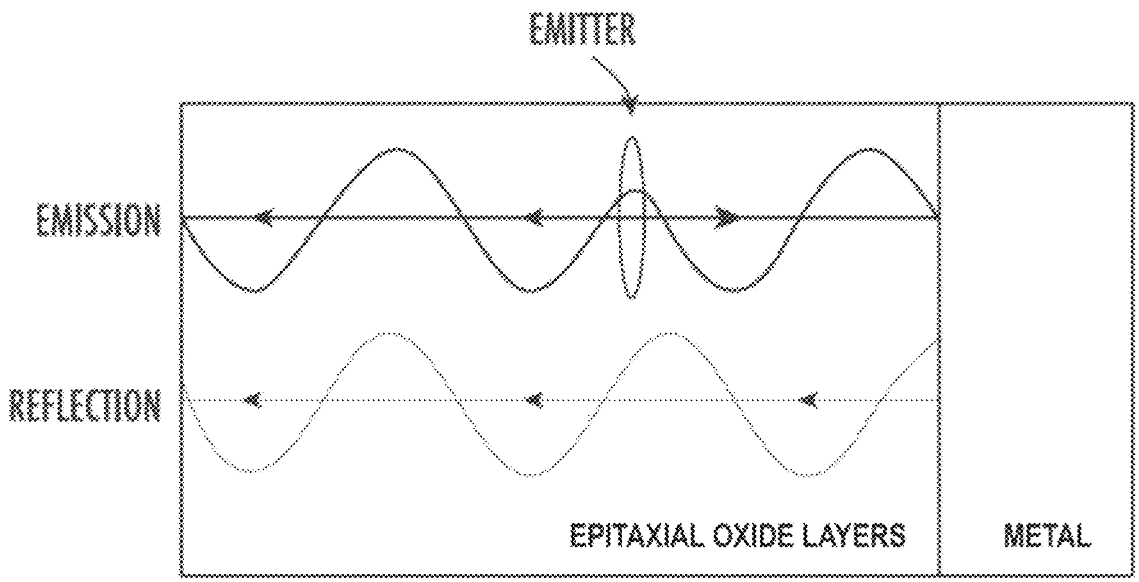
Figure 143B:
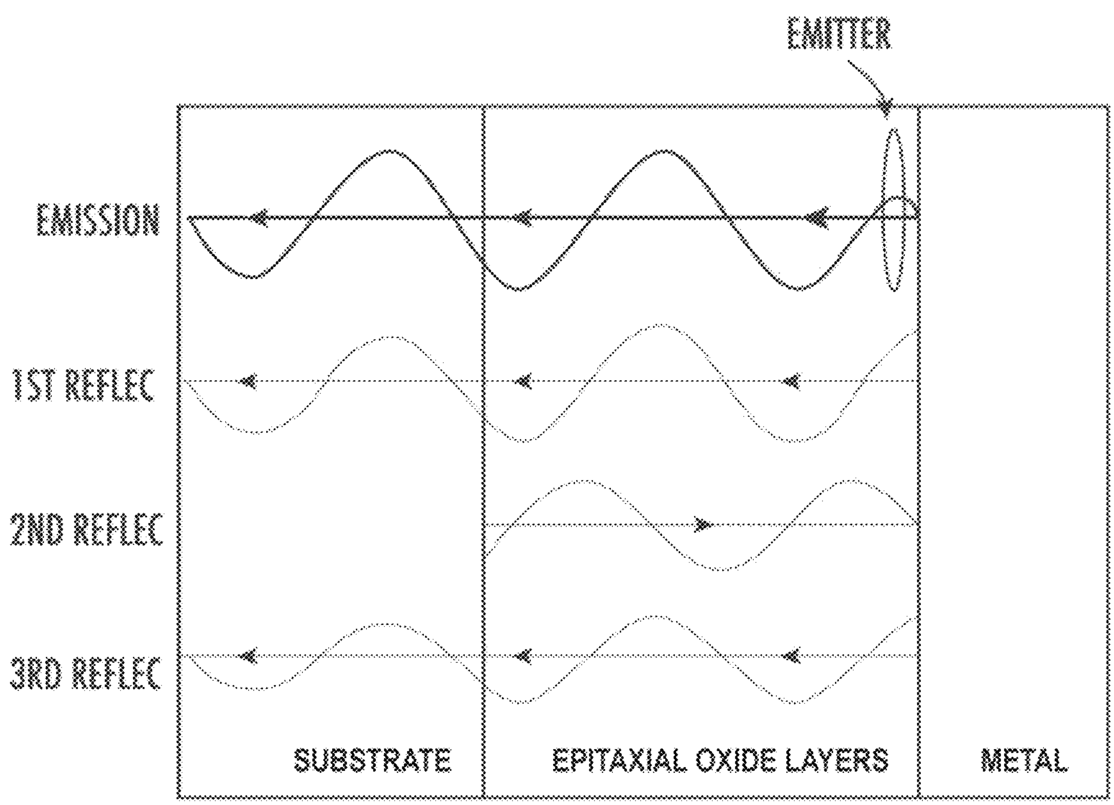

FIGS. 143A and 143B show examples of light extraction optimization via selection of metal contact materials and emitter positioning in LEDs or lasers.

Figure 144A:
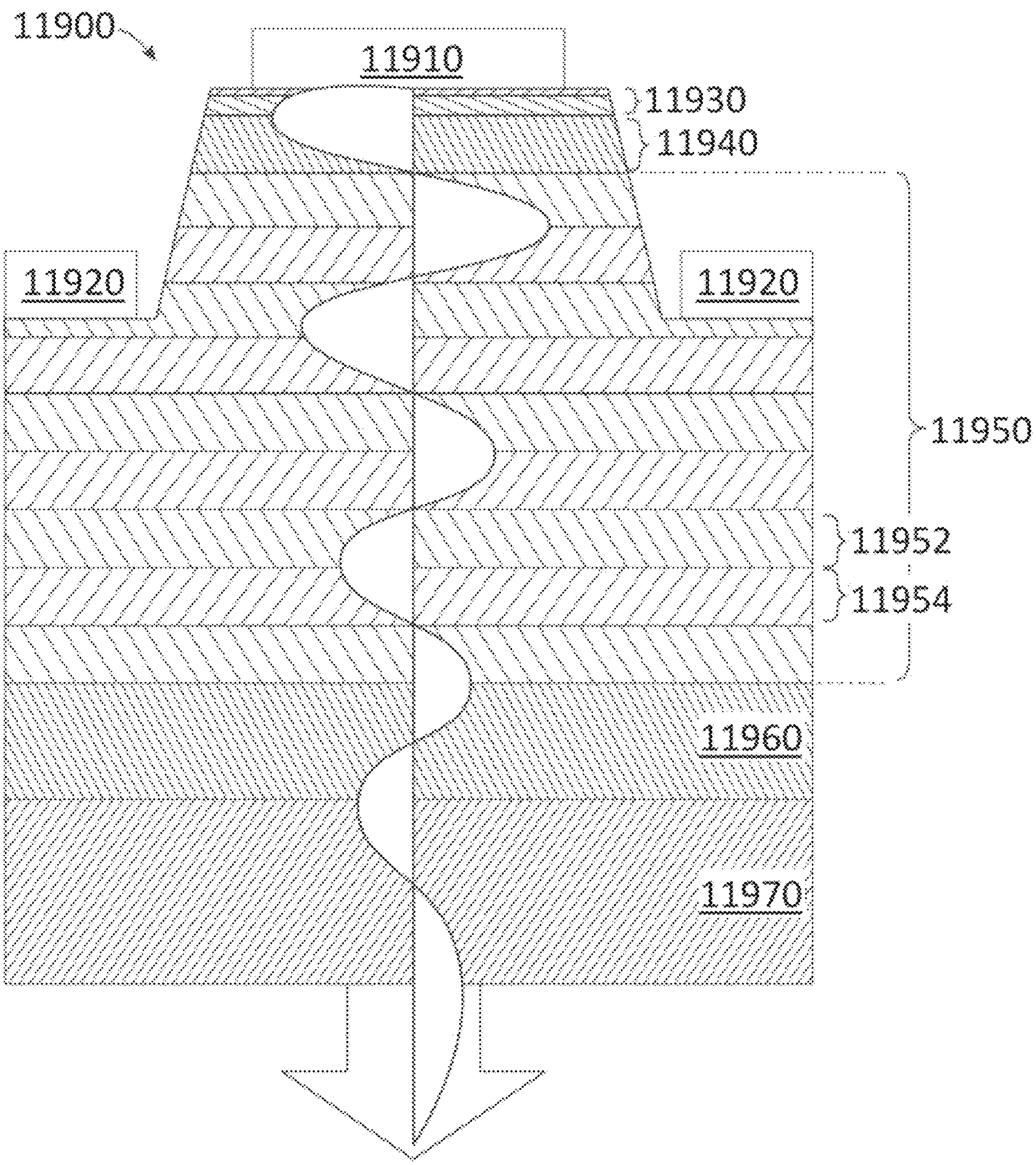
Figure 144B:
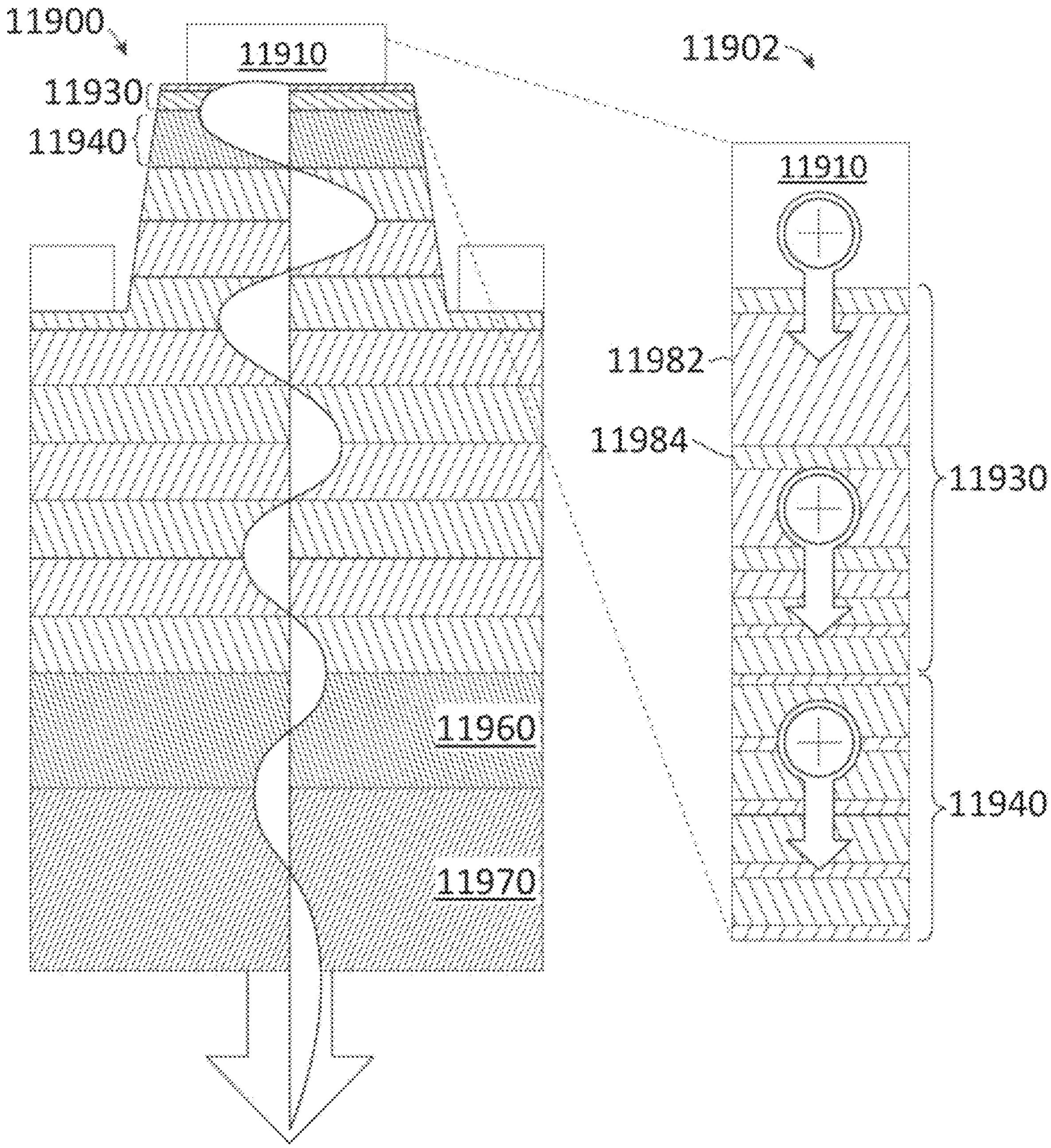

FIGS. 144A and 144B show examples of semiconductor structures with a distributed Bragg reflector (DBR) as part of doped layers in the diode structure.

DETAILED DESCRIPTION

Disclosed herein are embodiments of an optoelectronic semiconductor light emitting device that may be configured to emit light having a wavelength in the range of from about 150 nm to about 280 nm. The devices comprise a metal oxide substrate having at least one epitaxial semiconductor metal oxide layer disposed thereon. The substrate may comprise $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $MgF_2$, $LaAlO_3$, $TiO_2$ or quartz. In certain embodiments, the one or more of the at least one semiconductor layer comprises at least one of $Al_2O_3$ and $Ga_2O_3$.

In a first aspect, the present disclosure provides an optoelectronic semiconductor light emitting device configured to emit light having a wavelength in the range from about 150 nm to about 280 nm, the device comprising a substrate having at least one epitaxial semiconductor layer disposed thereon, wherein each of the one or more epitaxial semiconductor layers comprises a metal oxide.

In another form, the metal oxide of each of the one or more semiconductor layers is selected from the group consisting of $Al_2O_3$, $Ga_2O_3$, MgO, NiO, $Li_2O$, ZnO, $SiO_2$, $GeO_2$, $Er_2O_3$, $Gd_2O_3$, PdO, $Bi_2O_3$, $IrO_2$, and any combination of the aforementioned metal oxides.

In another form, at least one of the one or more semiconductor layers is a single crystal.

In another form, the at least one of the one or more semiconductor layers has rhombohedral, hexagonal or monoclinic crystal symmetry.

In another form, at least one of the one or more semiconductor layers is composed of a binary metal oxide, wherein the metal oxide is selected from $Al_2O_3$ and $Ga_2O_3$.

In another form, at least one of the one or more semiconductor layers is composed of a ternary metal-oxide composition, and the ternary metal oxide composition comprises at least one of $Al_2O_3$ and $Ga_2O_3$, and, optionally, a metal oxide selected from MgO, NiO, $LiO_2$, ZnO, $SiO_2$, $GeO_2$, $Er_2O_3$, $Gd_2O_3$, PdO, $Bi_2O_3$, and $IrO_2$.

In another form, the at least one of the one or more semiconductor layers is composed of a ternary metal-oxide composition of $(Al_xGa_{1-x})_2O_3$ wherein $0 \leq x \leq 1$.

In another form, the at least one of the one or more semiconductor layers comprises uniaxially deformed unit cells.

In another form, the at least one of the one or more semiconductor layers comprises biaxially deformed unit cells.

In another form, the at least one of the one or more semiconductor layers comprises triaxially deformed unit cells.

In another form, the at least one of the one or more semiconductor layer is composed of a quaternary metal oxide composition, and the quaternary metal oxide composition comprises either: (i) $Ga_2O_3$ and a metal oxide selected from $Al_2O_3$, MgO, NiO, $LiO_2$, ZnO, $SiO_2$, $GeO_2$, $Er_2O_3$, $Gd_2O_3$, PdO, $Bi_2O_3$, and $IrO_2$; or (ii) $Al_2O_3$ and a metal oxide selected from $Ga_2O_3$, MgO, NiO, $LiO_2$, ZnO, $SiO_2$, $GeO_2$, $Er_2O_3$, $Gd_2O_3$, PdO, $Bi_2O_3$, and $IrO_2$.

In another form, the at least one of the one or more semiconductor layers is composed of a quaternary metal oxide composition $(Ni_xMg_{1-x})_yGa_{2(1-y)}O_{3-2y}$ where $0 \leq x \leq 1$ and $0 \leq y \leq 1$.

In another form, the surface of the substrate is configured to enable lattice matching of crystal symmetry of the at least one semiconductor layer.

In another form, the substrate is a single crystal substrate.

In another form, the substrate is selected from $Al_2O_3$, $Ga_2O_3$, MgO, LiF, $MgAl_2O_4$, $MgGa_2O_4$, $LiGaO_2$, $LiAlO_2$, $MgF_2$, $LaAlO_3$, $TiO_2$ and quartz.

In another form, the surface of the substrate has crystal symmetry and in-plane lattice constant matching so as to enable homoepitaxy or heteroepitaxy of the at least one semiconductor layer.

In another form, one or more of the at least one semiconductor layer is of direct bandgap type.

In a second aspect, the present disclosure provides an optoelectronic semiconductor device for generating light of a predetermined wavelength comprising a substrate; and an optical emission region having an optical emission region band structure configured for generating light of the predetermined wavelength and comprising one or more epitaxial metal oxide layers supported by the substrate.

In another form, configuring the optical emission region band structure for generating light of the predetermined wavelength comprises selecting the one or more epitaxial metal oxide layers to have an optical emission region band gap energy capable of generating light of the predetermined wavelength.

In another form, selecting the one or more epitaxial metal oxide layers to have an optical emission region band gap energy capable of generating light of the predetermined wavelength comprises forming the one or more epitaxial metal oxide layers of a binary metal oxide of the form $A_xO_y$ comprising a metal specie (A) combined with oxygen (O) in the relative proportions x and y.

In another form, the binary metal oxide is $Al_2O_3$.

In another form, the binary metal oxide is $Ga_2O_3$.

In another form, the binary metal oxide is selected from the group consisting of MgO, NiO, $LiO_2$, ZnO, $SiO_2$, $GeO_2$, $Er_2O_3$, $Gd_2O_3$, PdO, $Bi_2O_3$ and $IrO_2$.

In another form, selecting the one or more epitaxial metal oxide layers to have an optical emission region band gap energy capable of generating light of the predetermined wavelength comprises forming the one or more epitaxial metal oxide layers of a ternary metal oxide.

In another form, the ternary metal oxide is a ternary metal oxide bulk alloy of the form $A_xB_yO_n$ comprising a metal species (A) and (B) combined with oxygen (O) in the relative proportions x, y and n.

In another form, a relative fraction of the metal specie B to the metal specie A ranges from a minority relative fraction to a majority relative fraction.

In another form, the ternary metal oxide is of the form $A_xB_{1-x}O_n$ where $0 \leq x \leq 1.0$.

In another form, the metal specie A is Al and metal specie B is selected from the group consisting of: Zn, Mg, Ga, Ni, Rare Earth, Ir Bi, and Li.

In another form, the metal specie A is Ga and metal specie B is selected from the group consisting of: Zn, Mg, Ni, Al, Rare Earth, Ir, Bi and Li.

In another form, the ternary metal oxide is of the form $(Al_xGa_{1-x})_2O_3$, where $0 \leq x \leq 1$. In other forms, x is about 0.1, or about 0.3, or about 0.5.

In another form, the ternary metal oxide is a ternary metal oxide ordered alloy structure formed by sequential deposition of unit cells formed along a unit cell direction and comprising alternating layers of metal specie A and metal specie B having intermediate O layers to form a metal oxide ordered alloy of the form A-O—B—O-A-O—B-etc.

In another form, the metal specie A is Al and the metal specie B is Ga, and the ternary metal oxide ordered alloy is of the form Al—O—Ga—O—Al-etc.

In another form, the ternary metal oxide is of the form of a host binary metal oxide crystal with a crystal modification specie.

In another form, the host binary metal oxide crystal is selected from the group consisting of $Ga_2O_3$, $Al_2O_3$, MgO, NiO, ZnO, $Bi_2O_3$, r-$GeO_2$, $Ir_2O_3$, $RE_2O_3$ and $Li_2O$ and the crystal modification specie is selected from the group consisting of Ga, Al, Mg, Ni, Zn, Bi, Ge, Ir, RE and Li.

In another form, selecting the one or more epitaxial metal oxide layers to have an optical emission region band gap energy capable of generating light of the predetermined wavelength comprises forming the one or more epitaxial metal oxide layers as a superlattice comprising two or more layers of metal oxides forming a unit cell and repeating with a fixed unit cell period along a growth direction.

In another form, the superlattice is a bi-layered superlattice comprising repeating layers comprising two different metal oxides.

In another form, the two different metal oxides comprise a first binary metal oxide and a second binary metal oxide.

In another form, the first binary metal oxide is $Al_2O_3$ and the second binary metal oxide is $Ga_2O_3$.

In another form, the first binary metal oxide is NiO and the second binary metal oxide is $Ga_2O_3$.

In another form, the first binary metal oxide is MgO and the second binary metal oxide is NiO.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ and wherein the second binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first selected binary metal oxide.

In another form, the two different metal oxides comprise a binary metal oxide and a ternary metal oxide.

In another form, the binary metal oxide is $Ga_2O_3$ and the ternary metal oxide is $(Al_xGa_{1-x})_2O_3$, where $0 \leq x \leq 1.0$.

In another form, the binary metal oxide is $Ga_2O_3$ and the ternary metal oxide is $Al_xGa_{1-x}O_3$, where $0 \leq x \leq 1.0$.

In another form, the binary metal oxide is $Ga_2O_3$ and the ternary metal oxide is $Mg_xGa_{2(1-x)}O_{3-2x}$, where $0 \leq x \leq 1.0$.

In another form, the binary metal oxide is $Al_2O_3$ and the ternary metal oxide is $(Al_xGa_{1-x})_2O_3$, where $0 \leq x \leq 1.0$.

In another form, the binary metal oxide is $Al_2O_3$ and the ternary metal oxide is $Al_xGa_{1-x}O_3$, where $0 \leq x \leq 1.0$.

In another form, the binary metal oxide is $Al_2O_3$ and the ternary metal oxide is $(Al_xEr_{1-x})_2O_3$.

In another form, the ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0 \leq x \leq 1.0$.

In another form, the binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$.

In another form, the two different metal oxides comprise a first ternary metal oxide and a second ternary metal oxide.

In another form, the first ternary metal oxide is $Al_xGa_{1-x}O$ and the second ternary metal oxide is $(Al_xGa_{1-x})_2O_3$ or $Al_yGa_{1-y}O_3$ where $0 \leq x \leq 1$ and $0 \leq y \leq 1$.

In another form, the first ternary metal oxide is $(Al_xGa_{1-x})_2O_3$ and the second ternary metal oxide is $(Al_yGa_{1-y})_2O_3$, where $0 \leq x \leq 1$ and $0 \leq y \leq 1$.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}N_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$, and $(Ga_{2x}Li_{2(1-x)})O_{2x+1}$ absent the first selected ternary metal oxide, where $0 \leq x \leq 1.0$.

In another form, the superlattice is a tri-layered superlattice comprising repeating layers of three different metal oxides.

In another form, the three different metal oxides comprise a first binary metal oxide, a second binary metal oxide and a third binary metal oxide.

In another form, the first binary metal oxide is MgO, the second binary metal oxide is NiO and the third binary metal oxide $Ga_2O_3$.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the second binary metal oxide is selected from the group $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first selected binary metal oxide, and wherein the third binary metal oxide is selected from the group $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first and second selected binary metal oxides.

In another form, the three different metal oxides comprise a first binary metal oxide, a second binary metal oxide and a ternary metal oxide.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the second binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first selected binary metal oxide, and wherein the ternary metal oxide is selected from the group consisting of $(Ga_{2x}N_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0 \leq x \leq 1$.

In another form, the three different metal oxides comprise a binary metal oxide, a first ternary metal oxide and a second ternary metal oxide.

In another form, the binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Z_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, where $0 \leq x \leq 1$.

In another form, the three different metal oxides comprise a first ternary metal oxide, a second ternary metal oxide and a third ternary metal oxide.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}N_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_x{\cdot}Bi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, and wherein the third ternary metal oxide is selected from the group consisting of $(Ga_{2x}N_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first and second selected ternary metal oxides, where $0 \leq x \leq 1$.

In another form, the superlattice is a quad-layered superlattice comprising repeating layers of at least three different metal oxides.

In another form, the superlattice is a quad-layered superlattice comprising repeating layers of three different metal oxides, and a selected metal oxide layer of the three different metal oxides is repeated in the quad-layered superlattice.

In another form, the three different metal oxides comprise a first binary metal oxide, a second binary metal oxide and a third binary metal oxide.

In another form, the first binary metal oxide is MgO, the second binary metal oxide is NiO and the third binary metal oxide is $Ga_2O_3$ forming a quad-layer superlattice comprising MgO—$Ga_2O_3$— NiO—$Ga_2O_3$ layers.

In another form, the three different metal oxides are selected from the group of consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0 \leq x \leq 1.0$.

In another form, the superlattice is a quad-layered superlattice comprising repeating layers of four different metal oxides.

In another form, the four different metal oxides are selected from the group of consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0 \leq x \leq 1.0$.

In another form, respective individual layers of the two or more metal oxide layers forming the unit cell of the superlattice have a thickness less than or approximately equal to an electron de Broglie wavelength in that respective individual layer.

In another form, configuring the optical emission region band structure for generating light of the predetermined wavelength comprises modifying an initial optical emission region band structure of the one or more epitaxial metal oxide layers on forming the optoelectronic device.

In another form, modifying the initial optical emission region band structure of the one or more epitaxial metal oxide layers on forming the optoelectronic device comprises introducing a predetermined strain to the one or more epitaxial metal oxide layers during epitaxial deposition of the one or more epitaxial metal oxide layers.

In another form, the predetermined strain is introduced to modify the initial optical emission region band structure from an indirect band gap to a direct band gap.

In another form, the predetermined strain is introduced to modify an initial bandgap energy of the initial optical emission region band structure.

In another form, the predetermined strain is introduced to modify an initial valence band structure of the initial optical emission region band structure.

In another form, modifying the initial valence band structure comprises raising or lowering a selected valence band with respect to the Fermi energy level of the optical emission region.

In another form, modifying the initial valence band structure comprises modifying the shape of the valence band structure to change localization characteristics of holes formed in the optical emission region.

In another form, introducing the predetermined strain to the one or more epitaxial metal oxide layers comprises selecting a to be strained metal oxide layer having a composition and crystal symmetry type which, when epitaxially formed on an underlying layer having a underlying layer composition and crystal symmetry type, will introduce the predetermined strain into the to be strained metal oxide layer.

In another form, the predetermined strain is a biaxial strain.

In another form, the underlying layer is a metal oxide having a first crystal symmetry type and the to be strained metal oxide layer also has the first crystal symmetry type but with a different lattice constant to introduce the biaxial strain into the to be strained metal oxide layer.

In another form, the underlying layer of metal oxide is $Ga_2O_3$ and the to be strained metal oxide layer is $Al_2O_3$, and biaxial compression is introduced into the $Al_2O_3$ layer.

In another form, the underlying layer of metal oxide is $Al_2O_3$ and the to be strained layer of metal oxide is $Ga_2O_3$, and biaxial tension is introduced into the $Ga_2O_3$ layer.

In another form, the predetermined strain is a uniaxial strain.

In another form, the underlying layer has a first crystal symmetry type having asymmetric unit cells.

In another form, the to be strained metal oxide layer is monoclinic $Ga_2O_3$, $Al_xGa_{1-x}O$ or $Al_2O_3$, where x≤0≤1.

In another form, the underlying layer and the to be strained layer form layers in a superlattice.

In another form, modifying an initial optical emission region band structure of the one or more epitaxial metal oxide layers on forming the optoelectronic device comprises introducing a predetermined strain to the one or more epitaxial metal oxide layers following epitaxial deposition of the one or more epitaxial metal oxide layers.

In another form, the optoelectronic device comprises a first conductivity type region comprising one or more epitaxial metal oxide layers having a first conductivity type region band structure configured to operate in combination with the optical emission region to generate light of the predetermined wavelength.

In another form, configuring the first conductivity type region band structure to operate in combination with the optical emission region to generate light of the predetermined wavelength comprises selecting a first conductivity type region energy band gap greater than the optical emission region energy band gap.

In another form, configuring the first conductivity type region band structure to operate in combination with the optical emission region to generate light of the predetermined wavelength comprises selecting the first conductivity type region to have an indirect bandgap.

In another form, configuring the first conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the first conductivity type region is a n-type region.

In another form, the optoelectronic device comprises a second conductivity type region comprising one or more epitaxial metal oxide layers having a second conductivity type region band structure configured to operate in combination with the optical emission region and the first conductivity type region to generate light of the predetermined wavelength.

In another form, configuring the second conductivity type region band structure to operate in combination with the optical emission region to generate light of the predetermined wavelength comprises selecting a second conductivity type region energy band gap greater than the optical emission region energy band gap.

In another form, configuring the second conductivity type region band structure to operate in combination with the optical emission region to generate light of the predetermined wavelength comprises selecting the second conductivity type region to have an indirect bandgap.

In another form, configuring the second conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the second conductivity type region is a p-type region.

In another form, the substrate is formed from a metal oxide.

In another form, the metal oxide is selected from the group consisting of $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $LaAlO_3$, $TiO_2$ and quartz.

In another form, the substrate is formed from a metal fluoride.

In another form, the metal fluoride is $MgF_2$ or LiF.

In another form, the predetermined wavelength is in the wavelength range of 150 nm to 700 nm.

In another form, the predetermined wavelength is in the wavelength range of 150 nm to 280 nm.

In a third aspect, the present disclosure provides a method for forming an optoelectronic semiconductor device configured to emit light having a wavelength in the range from about 150 nm to about 280 nm, the method comprising: providing a metal oxide substrate having an epitaxial growth surface; oxidizing the epitaxial growth surface to form an activated epitaxial growth surface; and exposing the activated epitaxial growth surface to one or more atomic beams each comprising high purity metal atoms and one or more atomic beams comprising oxygen atoms under conditions to deposit two or more epitaxial metal oxide films.

In another form, the metal oxide substrate comprises an Al or a Ga metal oxide substrate.

In another form, the one or more atomic beams each comprising high purity metal atoms comprise any one or more of the metals selected from the group consisting of Al, Ga, Mg, Ni, Li, Zn, Si, Ge, Er, Y, La, Pr, Gd, Pd, Bi, Ir, and any combination of the aforementioned metals.

In another form, the one or more atomic beams each comprising high purity metal atoms comprise any one or more of the metals selected from the group consisting of Al and Ga, and the epitaxial metal oxide films comprise $(Al_xGa_{1-x})_2O_3$, wherein $0 \le x \le 1$.

In another form, the conditions to deposit two or more epitaxial metal oxide films comprise exposing the activated epitaxial growth surface to atomic beams comprising high purity metal atoms and atomic beams comprising oxygen atoms at an oxygen:total metal flux ratio of >1.

In another form, at least one of the two or more epitaxial metal oxide films provides a first conductivity type region comprising one or more epitaxial metal oxide layers, and at least another of the two or more epitaxial metal oxide films provides a second conductivity type region comprising one or more epitaxial metal oxide layers.

In another form, at least one of the two or more epitaxial $(Al_xGa_{1-x})_2O_3$ films provides a first conductivity type region comprising one or more epitaxial $(Al_xGa_{1-x})_2O_3$ layers, and at least another of the two or more epitaxial $(Al_xGa_{1-x})_2O_3$ films provides a second conductivity type region comprising one or more epitaxial $(Al_xGa_{1-x})_2O_3$ layers.

In another form, the substrate is treated prior to the oxidizing step by high temperature (>800° C.) desorption in an ultrahigh vacuum chamber (less than $5 \times 10^{-10}$ Torr) to form an atomically flat epitaxial growth surface.

In another form, the method further comprises monitoring the surface in real-time to assess atomic surface quality.

In another form, the surface is monitored in real-time by reflection high energy electron diffraction (RHEED).

In another form, oxidizing the epitaxial growth surface comprises exposing the epitaxial growth surface to an oxygen source under conditions to oxidize the epitaxial growth surface.

In another form, the oxygen source is selected from one or more of the group consisting of an oxygen plasma, ozone and nitrous oxide.

In another form, the oxygen source is radiofrequency inductively coupled plasma (RF-ICP).

In another form, the method further comprises monitoring the surface in real-time to assess surface oxygen density.

In another form, the surface is monitored in real-time by RHEED.

In another form, the atomic beams comprising high purity Al atoms and/or high purity Ga atoms are each provided by effusion cells comprising inert ceramic crucibles radiatively heated by a filament and controlled by feedback sensing to monitor the metal melt temperature within the crucible.

In another form, high purity elemental metals of 6N to 7N or higher purity are used.

In another form, the method further comprises measuring the beam flux of each Al and/or Ga and oxygen atomic beam to determine the relative flux ratio prior to exposing the activated epitaxial growth surface to the atomic beams at the determined relative flux ratio.

In another form, the method further comprises rotating the substrate as the activated epitaxial growth surface is exposed to the atomic beams so as to accumulate a uniform amount of atomic beam intersecting the substrate surface for a given amount of deposition time.

In another form, the method further comprises heating the substrate as the activated epitaxial growth surface is exposed to the atomic beams.

In another form, the substrate is heated radiatively from behind using a blackbody emissivity matched to the below bandgap absorption of the metal oxide substrate.

In another form, the activated epitaxial growth surface is exposed to the atomic beams in a vacuum of from about $1 \times 10^{-6}$ Torr to about $1 \times 10^{-5}$ Torr.

In another form, Al and Ga atomic beam fluxes at the substrate surface are from about $1 \times 10^{-8}$ Torr to about $1 \times 10^{-6}$ Torr.

In another form, oxygen atomic beam fluxes at the substrate surface are from about $1 \times 10^{-7}$ Torr to about $1 \times 10^{-5}$ Torr.

In another form, the Al or Ga metal oxide substrate is A-plane sapphire.

In another form, the Al or Ga metal oxide substrate is monoclinic $Ga_2O_3$.

In another form, the two or more epitaxial $(Al_xGa_{1-x})_2O_3$ films comprise corundum type $AlGaO_3$.

In another form, $x \le 0.5$ for each of the two or more epitaxial $(Al_xGa_{1-x})_2O_3$ films.

In a fourth aspect, the present disclosure provides a method for forming a multilayer semiconducting device comprising: forming a first layer having a first crystal symmetry type and a first composition; and depositing in a non-equilibrium environment a metal oxide layer having a second crystal symmetry type and a second composition onto the first layer, wherein depositing the second layer onto the first layer comprises initially matching the second crystal symmetry type to the first crystal symmetry type.

In another form, initially matching the second crystal symmetry type to the first crystal symmetry type comprises matching a first lattice configuration of the first crystal symmetry type with a second lattice configuration of the second crystal symmetry at a horizontal planar growing interface.

In another form, matching the first and second crystal symmetry types comprise substantially matching respective end plane lattice constants of the first and second lattice configurations.

In another form, the first layer is corundum $Al_2O_3$ (sapphire) and the metal oxide layer is corundum $Ga_2O_3$.

In another form, the first layer is monoclinic $Al_2O_3$ and the metal oxide layer is monoclinic $Ga_2O_3$.

In another form, the first layer is R-plane corundum $Al_2O_3$ (sapphire) prepared under O-rich growth conditions and the metal oxide layer is corundum $AlGaO_3$ selectively grown at low temperatures (≤550° C.).

In another form, the first layer is M-plane corundum $Al_2O_3$ (sapphire) and the metal oxide layer is corundum $AlGaO_3$.

In another form, the first layer is A-plane corundum $Al_2O_3$ (sapphire) and the metal oxide layer is corundum $AlGaO_3$.

In another form, the first layer is corundum $Ga_2O_3$ and the metal oxide layer is Corundum $Al_2O_3$ (sapphire).

In another form, the first layer is monoclinic $Ga_2O_3$ and the metal oxide layer is monoclinic $Al_2O_3$ (sapphire).

In another form, the first layer is (−201)-oriented monoclinic $Ga_2O_3$ and the metal oxide layer is (−201)-oriented monoclinic $AlGaO_3$.

In another form, the first layer is (010)-oriented monoclinic $Ga_2O_3$ and the metal oxide layer is (010)-oriented monoclinic $AlGaO_3$.

In another form, the first layer is (001)-oriented monoclinic $Ga_2O_3$ and the metal oxide layer is (001)-oriented monoclinic $AlGaO_3$.

In another form, the first and second crystal symmetry types are different, and matching the first and second lattice configuration comprises reorienting the metal oxide layer to substantially matching the in-plane atomic arrangement at the horizontal planar growing interface.

In another form, the first layer is C-plane corundum $Al_2O_3$ (sapphire) and wherein the metal oxide layer is any one of monoclinic, triclinic or hexagonal $AlGaO_3$.

In another form, the C-plane corundum $Al_2O_3$ (sapphire) is prepared under O-rich growth conditions to selectively grow hexagonal $AlGaO_3$ at lower growth temperatures (≤650° C.).

In another form, the C-plane corundum $Al_2O_3$ (sapphire) is prepared under O-rich growth conditions to selectively grow monoclinic $AlGaO_3$ at higher growth temperatures (>650° C.) with Al % limited to approximately 45-50%.

In another form, where the R-plane corundum $Al_2O_3$ (sapphire) is prepared under O-rich growth conditions to selectively grow monoclinic $AlGaO_3$ at higher growth temperatures (>700° C.) with Al %≤50%.

In another form, the first layer is A-plane corundum $Al_2O_3$ (sapphire) and wherein the metal oxide layer is (110)-oriented monoclinic $Ga_2O_3$.

In another form, the first layer is (110)-oriented monoclinic $Ga_2O_3$ and wherein the metal oxide layer is corundum $AlGaO_3$.

In another form, the first layer is (010)-oriented monoclinic $Ga_2O_3$ and the metal oxide layer is (111)-oriented cubic $MgGa_2O_4$.

In another form, the first layer is (100)-oriented cubic MgO and wherein the metal oxide layer is (100)-oriented monoclinic $AlGaO_3$.

In another form, the first layer is (100)-oriented cubic NiO and the metal oxide layer is (100)-oriented monoclinic $AlGaO_3$.

In another form, initially matching the second crystal symmetry type to the first crystal symmetry type comprises depositing, in a non-equilibrium environment, a buffer layer between the first layer and the metal oxide layer wherein a buffer layer crystal symmetry type is the same as the first crystal symmetry type to provide atomically flat layers for seeding the metal oxide layer having the second crystal symmetry type.

In another form, the buffer layer comprises an O-terminated template for seeding the metal oxide layer.

In another form, the buffer layer comprises a metal terminated template for seeding the metal oxide layer.

In another form, the first and second crystal symmetry types are selected from the group consisting of cubic, hexagonal, orthorhombic, trigonal, rhombic and monoclinic.

In another form, the first crystal symmetry type and first composition of the first layer and the second crystal symmetry type and second composition of the second layer are selected to introduce a predetermined strain into the second layer.

In another form, the first layer is a metal oxide layer.

In another form, the first and second layers form a unit cell that is repeated with a fixed unit cell period to form a superlattice.

In another form, the first and second layers are configured to have substantially equal but opposite strain to facilitate forming of the superlattice without defects.

In another form, the method comprises depositing, in a non-equilibrium environment, an additional metal oxide layer having a third crystal symmetry type and a third composition onto the metal oxide layer.

In another form, the third crystal type is selected from the group consisting of cubic, hexagonal, orthorhombic, trigonal, rhombic and monoclinic.

In another form, the multilayer semiconductor device is an optoelectronic semiconductor device for generating light of a predetermined wavelength.

In another form, the predetermined wavelength is in the wavelength range of 150 nm to 700 nm.

In another form, the predetermined wavelength is in the wavelength range of 150 nm to 280 nm.

In a fifth aspect, the present disclosure provides a method for forming an optoelectronic semiconductor device for generating light of a predetermined wavelength, the method comprising: introducing a substrate; depositing in a non-equilibrium environment a first conductivity type region comprising one or more epitaxial layers of metal oxide; depositing in a non-equilibrium environment an optical emission region comprising one or more epitaxial layers of metal oxide and comprising an optical emission region band structure configured for generating light of the predetermined wavelength; and depositing in a non-equilibrium environment a second conductivity type region comprising one or more epitaxial layers of metal oxide In another form, the predetermined wavelength is in the wavelength range of about 150 nm to about 700 nm. In another form, the predetermined wavelength is in the wavelength range of about 150 nm to about 425 nm. In one example, bismuth oxide can be used to produce wavelengths up to approximately 425 nm.

In another form, the predetermined wavelength is in the wavelength range of about 150 nm to about 280 nm.

In yet another form, the optical emission efficacy is controlled by the selection of the crystal symmetry type of the optically emissive region. The optical selection rule for electric-dipole emission is governed by the symmetry properties of the conduction band and valence band states as well as the crystal symmetry type. An optically emissive region having crystal structure possessing point group symmetry can have a property of either a center-of-inversion symmetry or non-inversion symmetry. Advantageous selection of crystal symmetry to promote electric-dipole or magnetic-dipole optical transitions are claimed herein for application to the optically emissive region. Conversely, advantageous selection of crystal symmetry to inhibit electric-dipole or magnetic-dipole optical transitions are also possible for promoting optically non-absorptive regions of the device.

Figure 1:
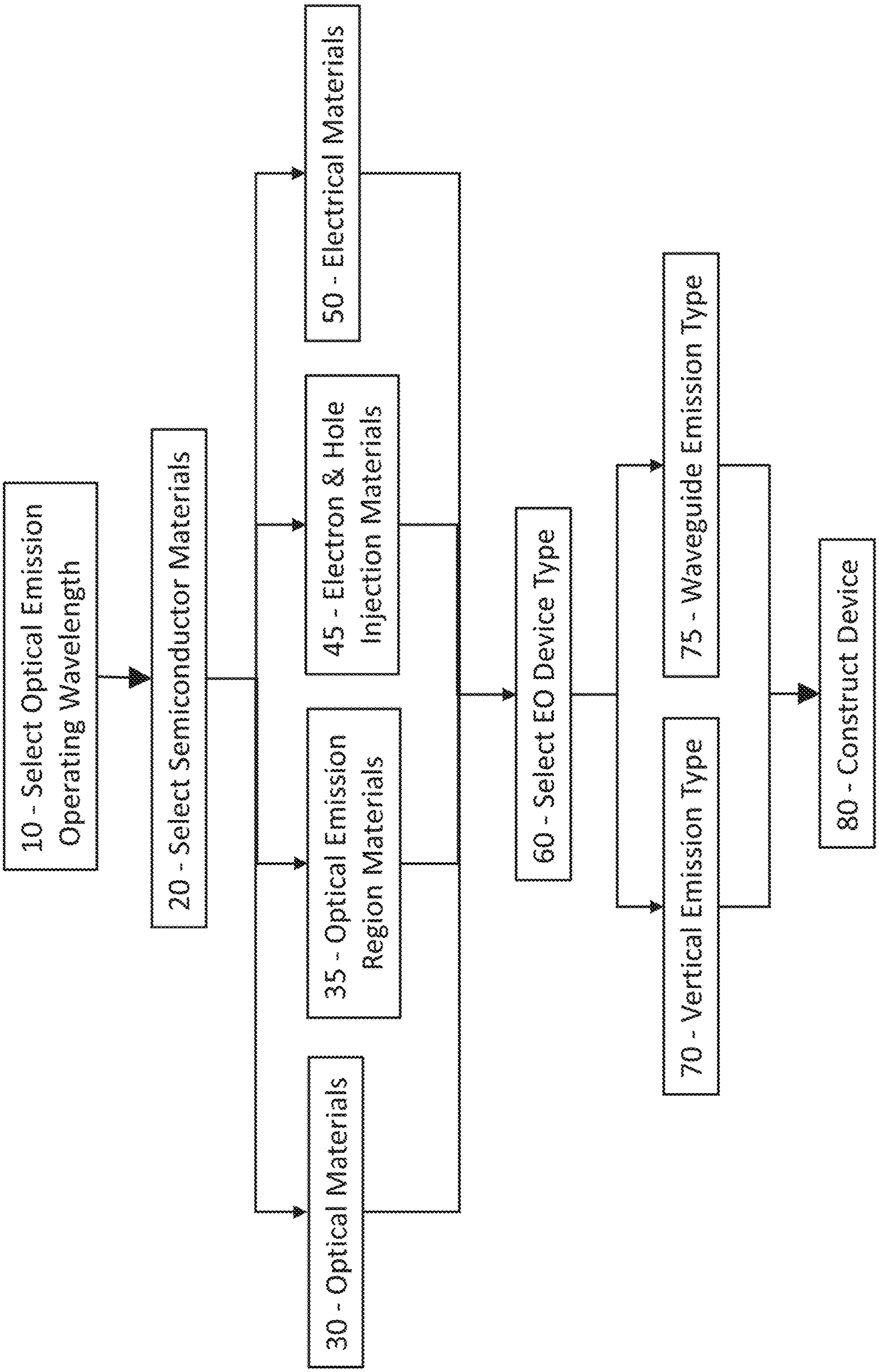
FIG. 1 is process flow diagram for constructing a metal oxide semiconductor-based LED in accordance with an illustrative embodiment of the present disclosure.

By way of overview, FIG. 1 is a process flow diagram for constructing an optoelectronic semiconductor optoelectronic device in accordance with an illustrative embodiment. In one example, the optoelectronic semiconductor device is a UVLED and in a further example, the UVLED is configured to generate a predetermined wavelength in the wavelength region of about 150 nm to about 280 nm. In this example, the construction process comprises selecting initially (i) the operating wavelength desired (e.g., a UVC wavelength or lower wavelength) in step 10 and (ii) the optical configuration of the devices in step 60 (e.g., a vertically emissive device 70 where the light output vector or direction is substantially perpendicular to the plane of the epi-layers, or a waveguide device 75 where the light output vector is substantially parallel to the plane of the epi-layers). The optical emission characteristics of the device is implemented in part by selection of semiconductor materials 20 and optical materials 30.

Taking the example of a UVLED, the optoelectronic semiconductor device constructed in accordance with the process illustrated in FIG. 1 will comprise an optical emission region based on the selected optical emission region material 35 wherein a photon is created by the advantageous spatial recombination of an electron in the conduction band and a hole in the valence band. In one example, the optical emission region comprises one or more metal oxide layers.

The optical emission region may be a direct bandgap type band structure configuration. This can be an intrinsic property of the materials(s) selected or can be tuned using one or more of the techniques of the present disclosure. The optical recombination or optical emission region may be clad by electron and hole reservoirs comprising n-type and p-type conductivity regions. The n-type and p-type conductivity regions are selected from electron and hole injection materials 45 that may have larger bandgaps relative to the optical emission region material 35, or can comprise an indirect bandgap structure that limits the optical absorption at the operating wavelength. In one example, the n-type and p-type conductivity regions are formed of one or more metal oxide layers.

Impurity doping of $Ga_2O_3$ and low Al % $AlGaO_3$ is possible for both n-type and p-type materials. N-type doping is particularly favorable for $Ga_2O_3$ and $AlGaO_3$, whereas p-type doping is more challenging but possible. Impurities suitable for n-type doping are Si, Ge, Sn and rare-earths (e.g., Erbium (Er) and Gadolinium (Gd)). The use of Ge-fluxes for co-deposition doping control is particularly suitable. For p-type co-doping using group-III metals, Ga-sites can be substituted via Magnesium ($Mg^{2+}$), Zinc ($Zn^{2+}$) and atomic-Nitrogen ($N^{3-}$ substitution for O-sites). Further improvements can also be obtained using Iridium (Ir), Bismuth (Bi), Nickel (Ni) and Palladium (Pd).

Digital alloys using NiO, $Bi_2O_3$, $Ir_2O_3$ and PdO may also be used in some embodiments to advantageously aid p-type formation in $Ga_2O_3$-based materials. While p-type doping for $AlGaO_3$ is possible, alternative doping strategies are also possible using cubic crystal symmetry metal oxides (e.g. Li-doped NiO or Ni vacancy $NiO_{x>1}$) and wurtzite p-type Mg:GaN.

Yet a further opportunity is the ability to form highly polar forms of hexagonal crystal symmetry and epsilon-phase $Ga_2O_3$ directly integrated to $AlGaO_3$ thereby inducing polarization doping in accordance with the principles and techniques described and referred to in U.S. Pat. No. 9,691,938. The optical materials 30 necessary for the confinement of light in the device as differential changes in refractive index also requires selection. For far or vacuum ultraviolet, the selection of optically transparent materials ranges from MgO to metal-fluorides, such as $MgF_2$, LiF and the like. It has been found in accordance with the present disclosure that single crystal LiF and MgO substrates are advantageous for the realization of UVLEDs.

The electrical materials 50 forming the contacts to the electron and hole injector regions are selected from low- and high-work function metals, respectively. In one example, the metal ohmic contacts are formed in-situ directly on the final metal oxide surface, as a result reducing any mid-level traps/defects created at the semiconducting oxide-metal interface. The device is then constructed in step 80.

Figure 2B:
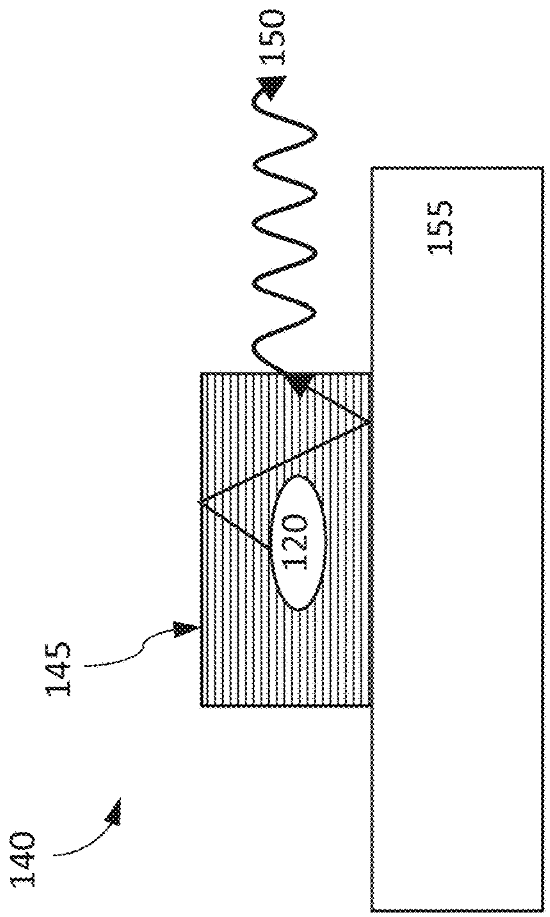
FIGS. 2A and 2B depict schematically two classes of LED devices based on vertical and waveguide optical confinement and emission disposed upon a substrate in accordance with illustrative embodiments of the present disclosure.
Figure 2A:
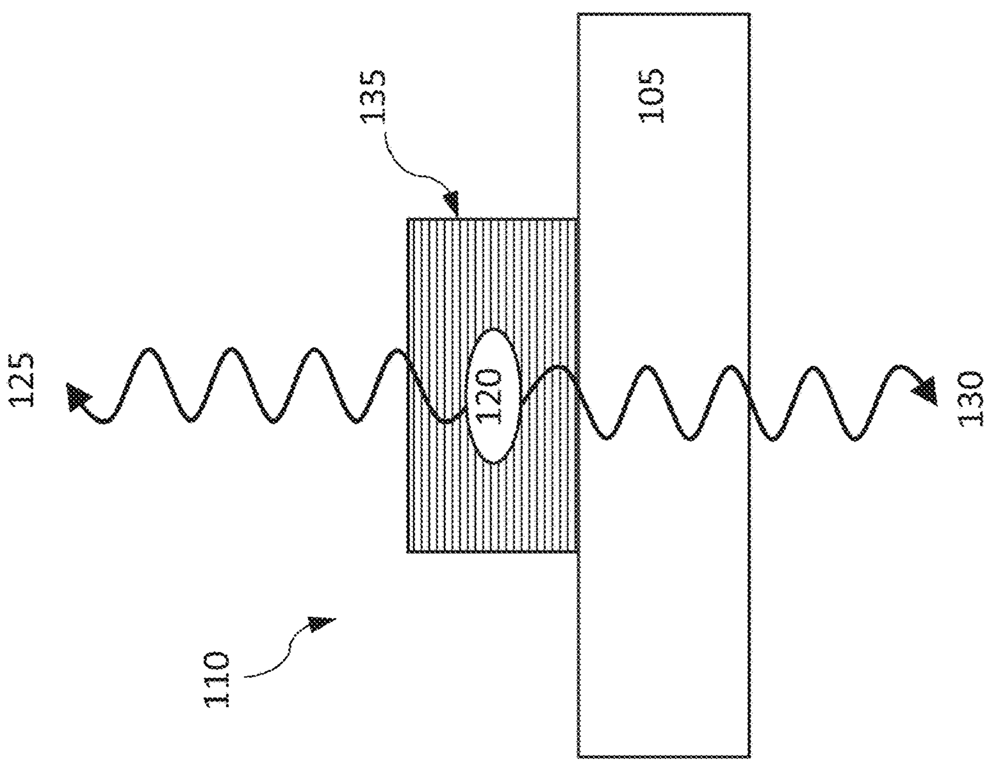

FIGS. 2A and 2B show schematically a vertical emission device 110 and waveguide emissive device 140 in accordance with illustrative embodiments. Device 110 has a substrate 105 and emission structure 135. Similarly, device 140 has a substrate 155 and emission structure 145. Light 125 and 130 from device 110 and light 150 from device 140, generated from the light generation region 120, propagates through the device from region 120 and is confined by a light escape cone defined by the difference in refractive indices at the semiconductor-air interface. As metal oxide semiconductors have extremely large bandgap energy, they have a substantially lower refractive index compared to III-N materials. Therefore, the use of metal oxide materials provides an improved light escape cone and therefore higher optical output coupling efficiency compared to conventional emission devices. Waveguide devices having single mode and multimode operation are also possible.

Broad area stripe waveguides can also be constructed further utilizing elemental metals Al- or Mg-metal to directly form ultraviolet plasmon guiding at the semiconductor-metal interface. This is an efficient method for forming waveguide structures. The E-k band structure for Al, Mg and Ni will be discussed below. Once the desired materials selections are available the process for constructing the semiconductor optoelectronic device may occur at step 80 (see FIG. 1).

Figure 3A:
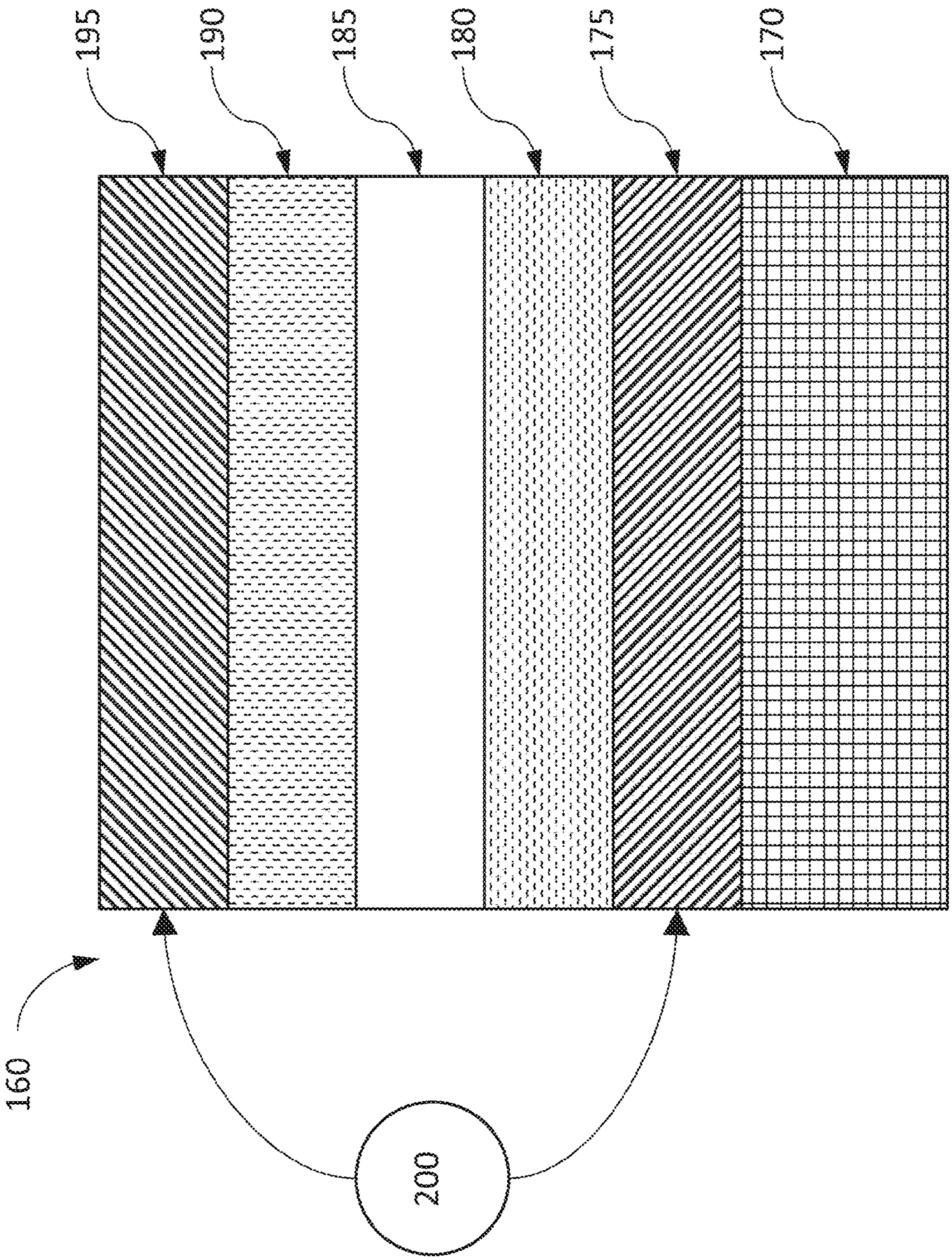
FIGS. 3A-3E are schematic diagrams of different LED device configurations in accordance with illustrative embodiments of the present disclosure comprising a plurality of regions.

FIG. 3A depicts functional regions of the epitaxial structure of an optoelectronic semiconductor device 160 for generating light of a predetermined wavelength according to an illustrative embodiment.

Figure 3B:
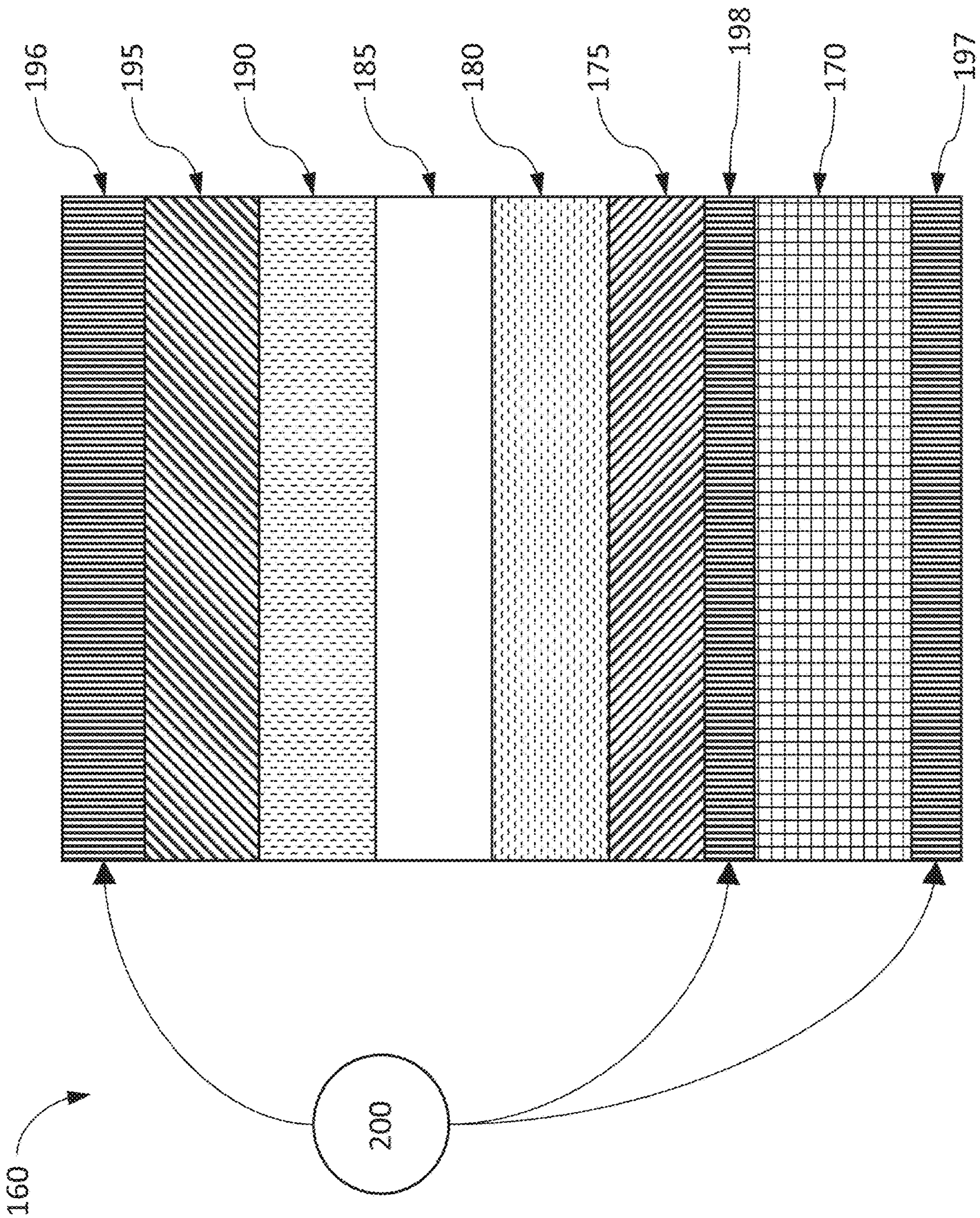

A substrate 170 is provided with advantageous crystal symmetry and in-plane lattice constant matching at the surface to enable homoepitaxy or heteroepitaxy of a first conductivity type region 175 with a subsequent non-absorbing spacer region 180, an optical emission region 185, an optional second spacer region 190 and a second conductivity type region 195. In one example, the in-plane lattice constant and the lattice geometry/arrangement are matched to modify (i.e., reduce) lattice defects. Electrical excitation is provided by a source 200 that is connected to the electron and hole injection regions of the first and second conductivity type regions 175 and 195. ohmic metal contacts and low-bandgap or semi-metallic zero-bandgap oxide semiconductors are shown in FIG. 3B as regions 196, 197, 198 in another illustrative embodiment.

First and second conductivity type regions 175 and 195 are formed in one example using metal oxides having wide bandgap and are electrically contacted using ohmic contact regions 197, 198 and 196 as described herein. In the case of an insulating type substrate 170 the electrical contact configuration is via ohmic contact region 198 and first conductivity type region 175 for one electrical conductivity type (viz., electron or holes) and the other using ohmic contact region 196 and second conductivity type region 195. Ohmic contact region 198 may optionally be made to an exposed portion of first conductivity type region 175. As the insulating substrate 170 may further be transparent or opaque to the operating wavelength, for the case of a transparent substrate the lower ohmic contact region 197 may be utilized as an optical reflector as part of an optical resonator in another embodiment.

For the case of a vertical conduction device, the substrate 170 is electrically conducting and maybe either be transparent or opaque to the operating wavelength. Electrical or ohmic contact regions 197 and 198 are disposed to advantageously enable both electrical connection and optical propagation within the device.

Figure 3C:
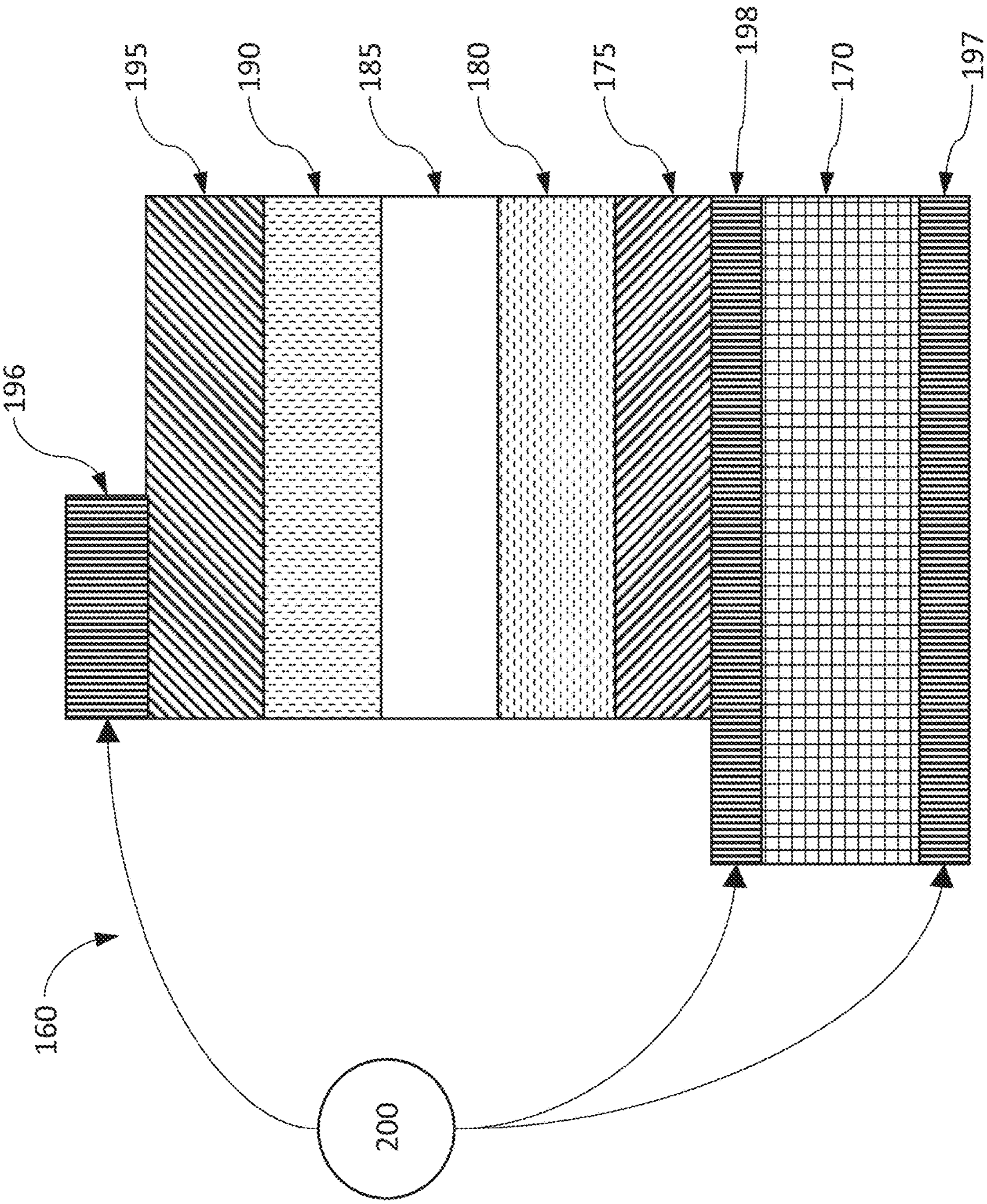

FIG. 3C illustrates schematically further possible electrical arrangements for the electrical contact regions 196 and 198 showing a mesa etched portion to expose lower conductivity type regions 175 and 198. The ohmic contact region 196 may further be patterned to expose a portion of the device for light extraction.

Figure 3D:
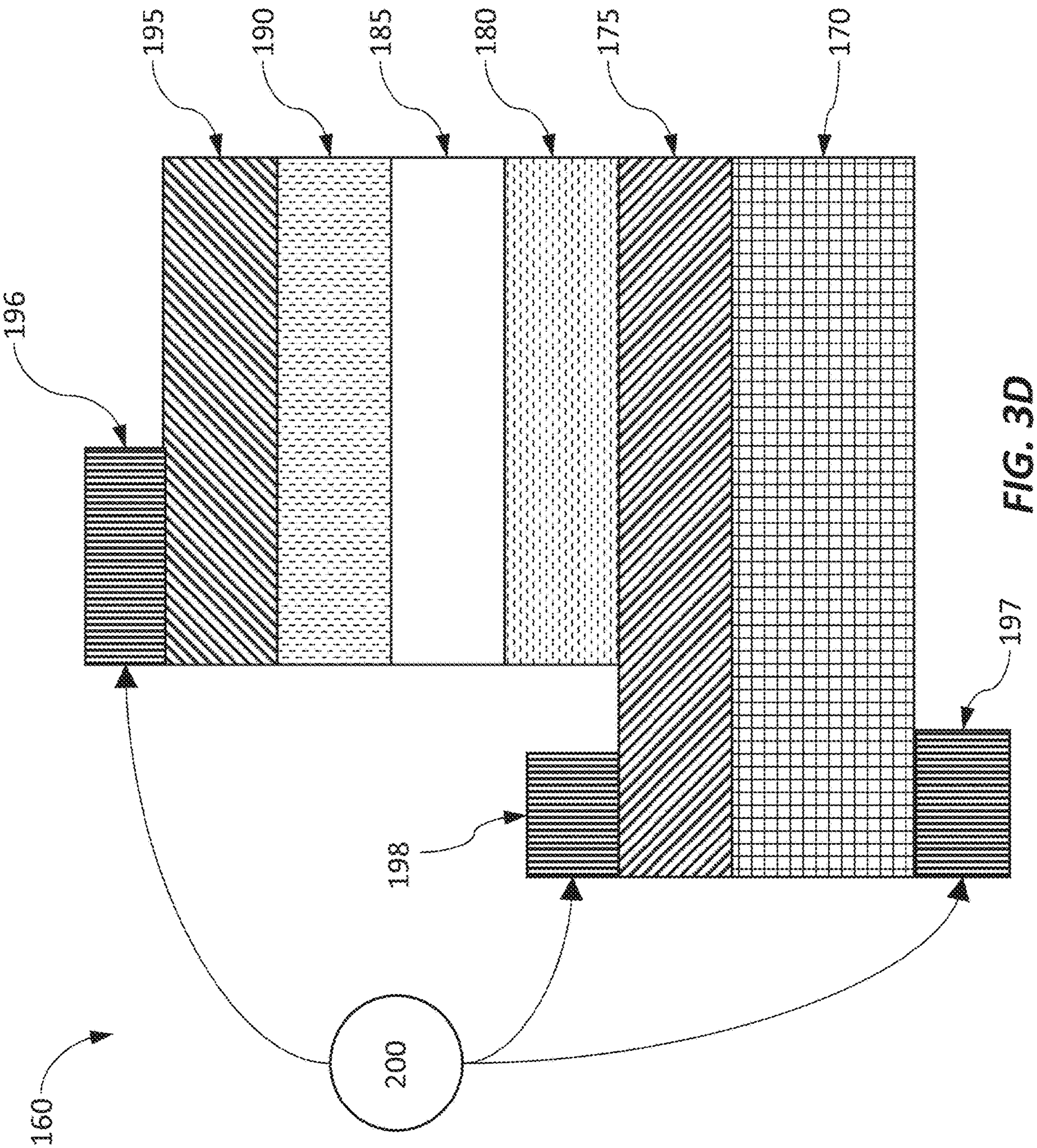

FIG. 3D shows yet a further electrical configuration wherein the insulating substrate 170 is used such that the first conductivity type region 175 is exposed and an electrical contact formed on a partially exposed portion of first conductivity type region 175. For the case of an electrically conductive and transparent substrate contact, ohmic contact region 198 is not required and a spatially disposed electrical contact region 197 is used.

Figure 3E:
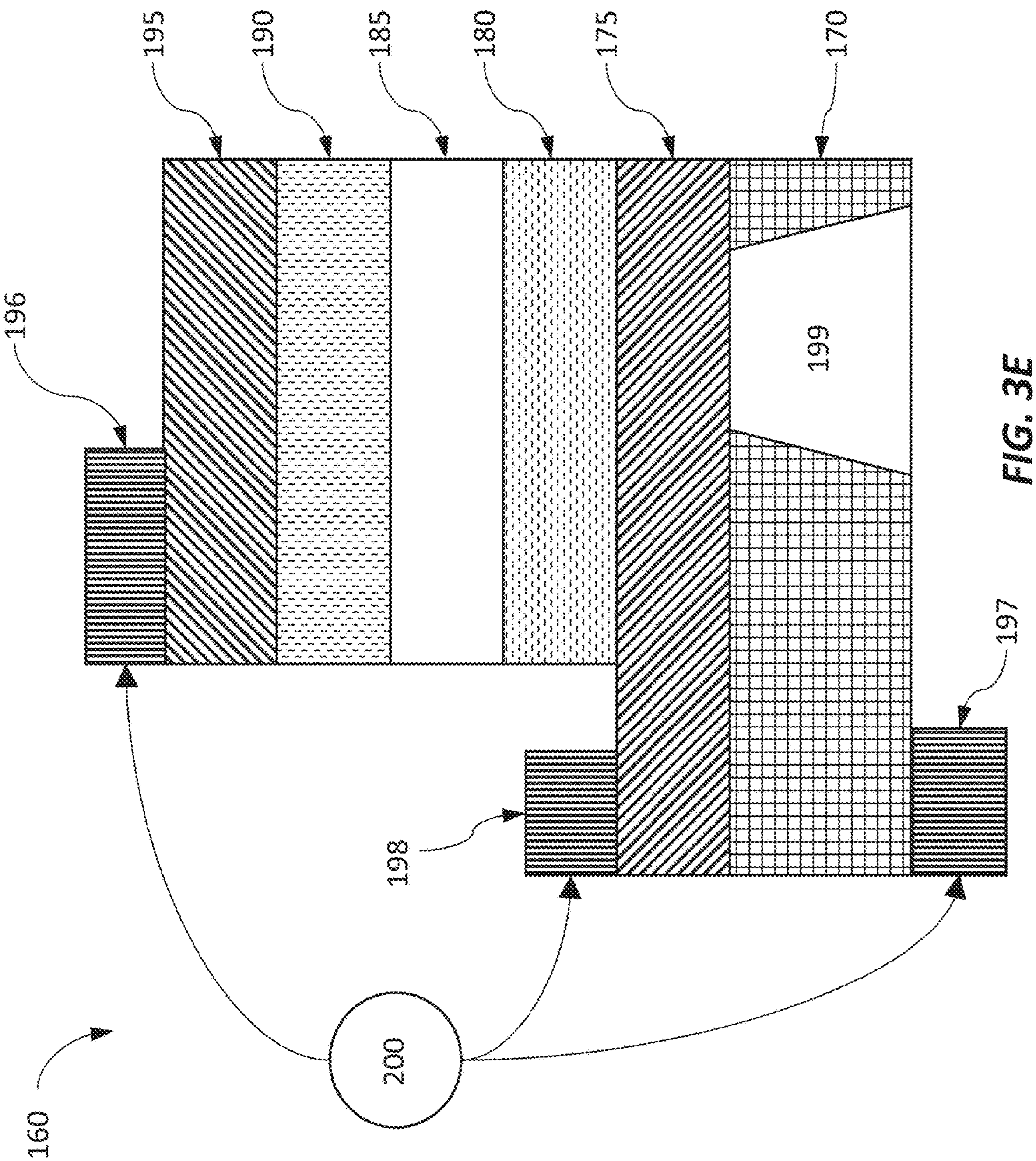

FIG. 3E yet further shows a possible arrangement of an optical aperture 199 etched partially or fully into an optically opaque substrate 170 for the optical coupling of light generated from optical emission region 185. The optical aperture may be utilized with the previous embodiments of FIGS. 3A-3D as well.

Figure 4:
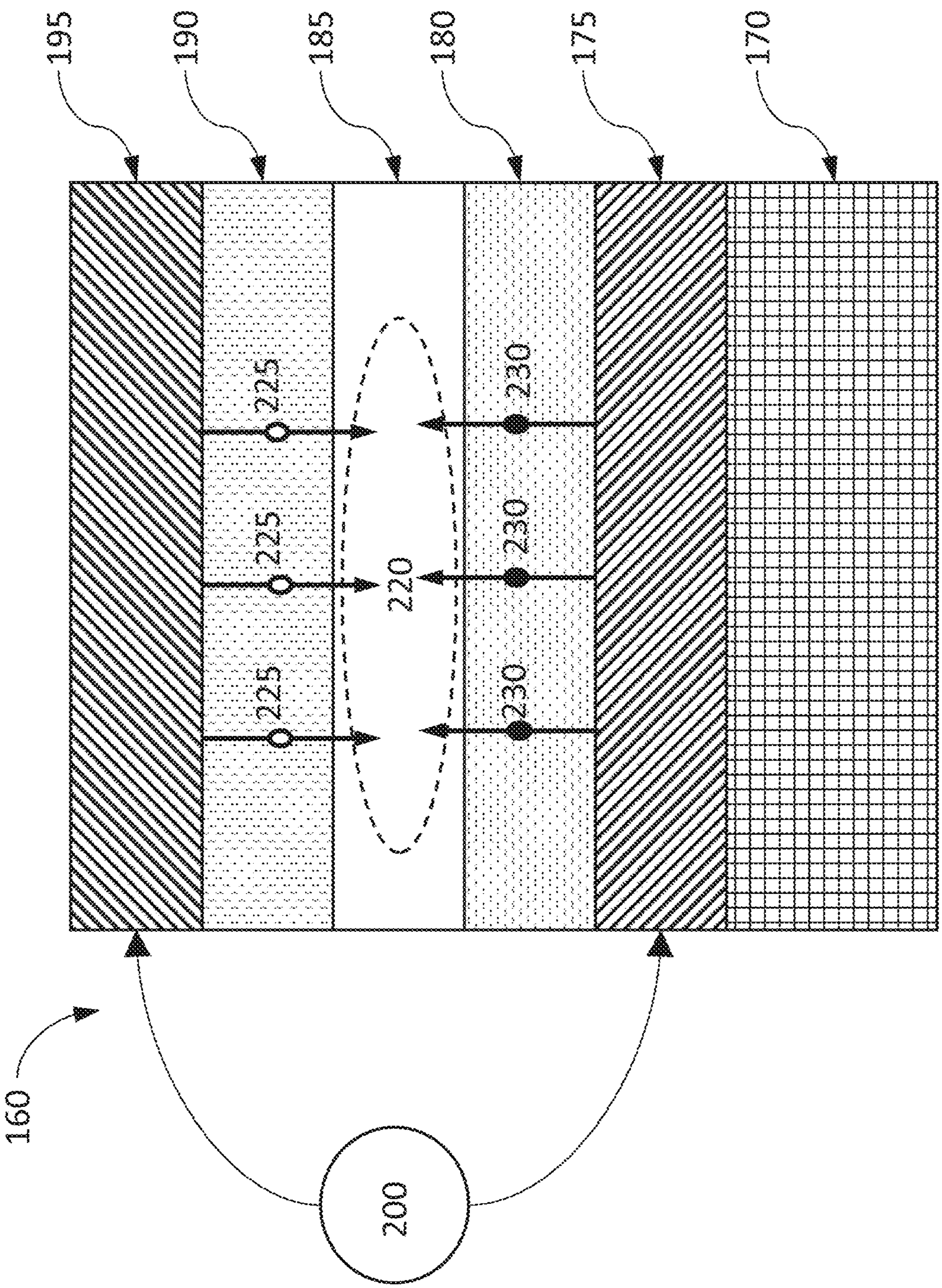
FIG. 4 depicts schematically the injection of oppositely charged carriers from physically separated regions into a recombination region in accordance with an illustrative embodiment of the present disclosure.

FIG. 4 shows schematically operation of optoelectronic semiconductor device 160 wherein an example configuration comprises an electron injection region 180 and a hole injection region 190 with electrical bias 200 to transport and direct mobile electrons 230 and holes 225 into the recombination region 220. The resulting electron and hole recombination forms a spatial optical emission region 185.

Extremely large energy bandgap ($E_G$) metal oxide semiconductors ($E_G$>4 eV) may exhibit low mobility hole-type carriers and may even be highly localized spatially—as a result limiting the spatial extent for hole injection. The region in the vicinity of the hole injection region 190 and recombination region 220 may then become advantageous for recombination process. Furthermore, the hole injection region 190 itself may be the preferred region for injecting electrons such that recombination region 220 is located within a portion of hole injection region 190.

Figure 5:
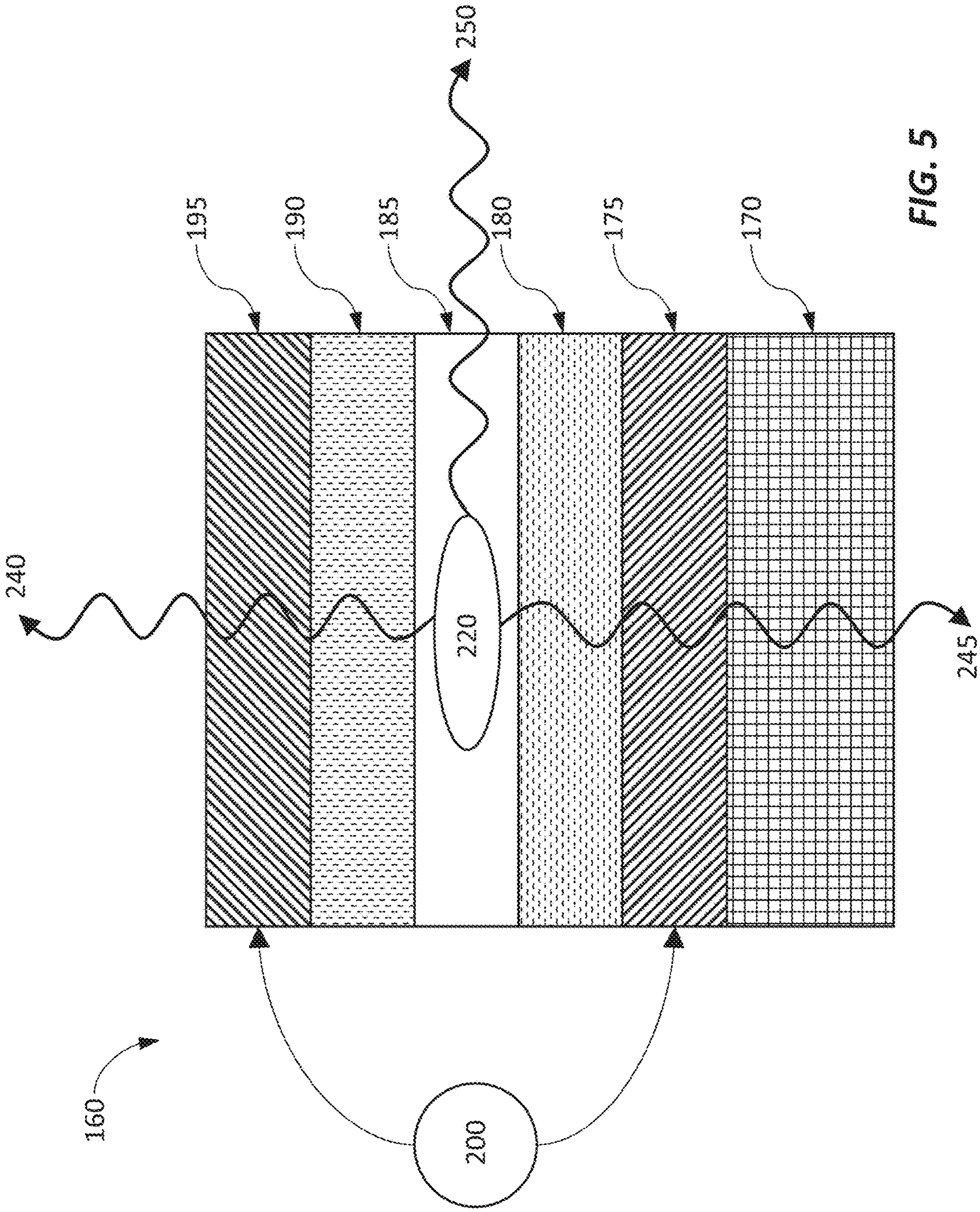
FIG. 5 shows the optical emission directions possible from the emission region of an LED in accordance with an illustrative embodiment of the present disclosure.

Referring now to FIG. 5, light or optical emission is generated within the device 160 by selective spatial recombination of electrons and holes to create high energy photons 240, 245 and 250 of a predetermined wavelength dictated by the configuration of the band structure of the metal oxide layer or layers forming the optical emission region 185 as will be described below. The electrons and holes are both instantaneously annihilated to create a photon that is a property of the band structure of the metal oxide selected.

The light generated within optical emission region 185 can propagate within the device according to the crystal symmetry of the metal oxide host regions. The crystal symmetry group of the host metal oxide semiconductor has definite energy and crystal momentum dispersion known as the E-k configuration that characterizes the band structure of various regions including the optical emission region 185. The non-trivial E-k dispersions are fundamentally dictated by the underlying physical atomic arrangements of definite crystal symmetry of the host medium. In general, the possible optical polarizations, optical energy emitted and optical emission oscillator strengths are directly related to the valence band dispersion of the host crystal. In accordance with the present disclosure, embodiments advantageously configure the band structure including the valence band dispersion of selected metal oxide semiconductors for application to optoelectronic semiconductor devices, such as for, in one example, UVLEDs.

Light 240 and 245 generated vertically requires optical selection rules of the underlying band structure to be fulfilled. Similarly, there are optical selection rules for generation of lateral light 250. These optical selection rules can be achieved by advantageous arrangement of the crystal symmetry types and physical spatial orientation of the crystal for each of the regions within the UVLED. Advantageous orientation of the constituent metal oxide crystals as a function of the growth direction is beneficial for optimal operation of the UVLEDs of the present disclosure. Furthermore, selection of the optical properties 30 in the process flow diagram illustrated in FIG. 1 such as the refractive index forming the waveguide type device is indicated for optical confinement and low loss.

Figure 6:
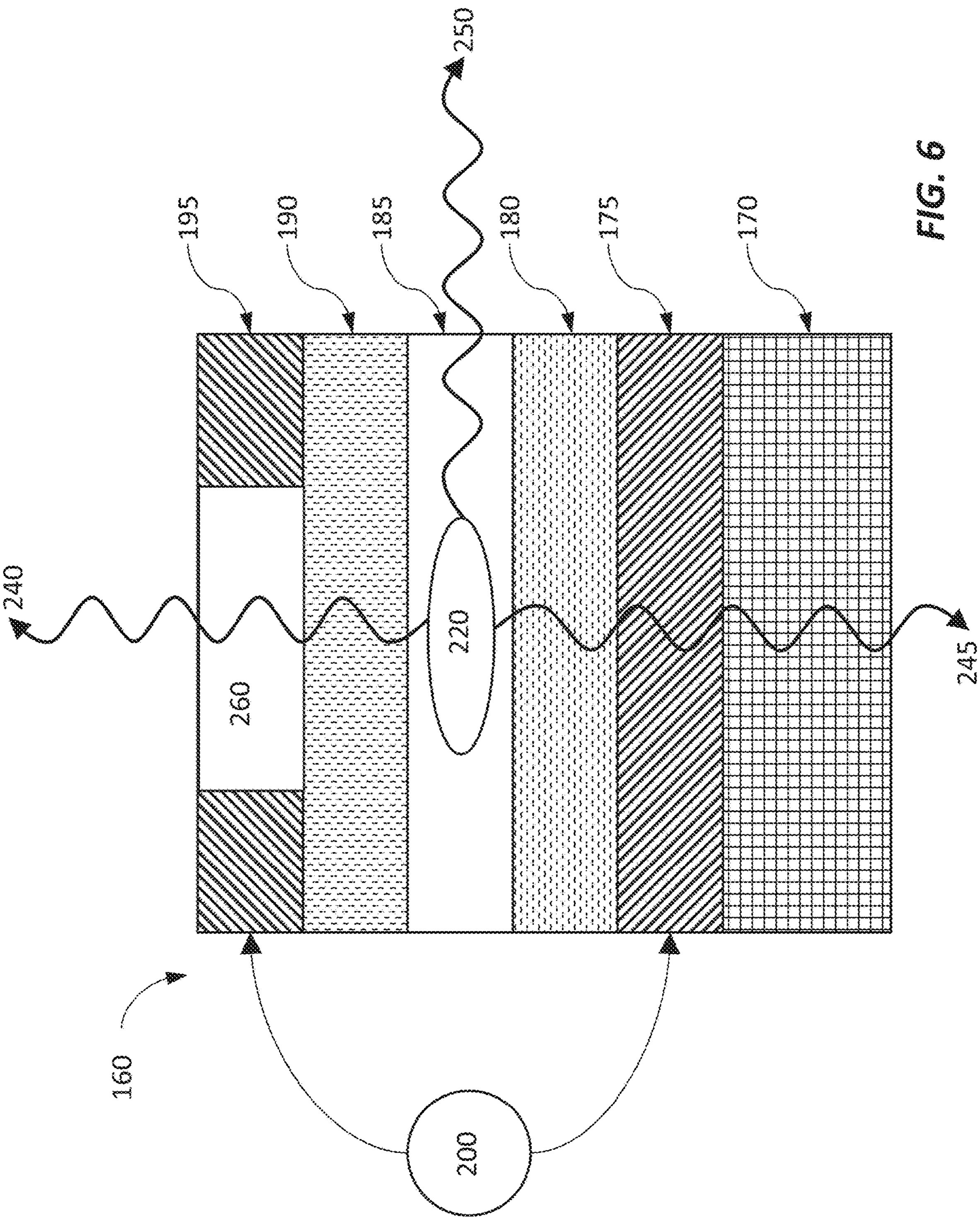
FIG. 6 depicts an aperture through an opaque region to enable light emission from an LED in accordance with an illustrative embodiment of the present disclosure.

FIG. 6 further shows for completeness, another embodiment comprising an optical aperture 260 disposed within optoelectronic semiconductor device 160 to enable the use of materials 195 which are opaque to the operating wavelength to provide optical out coupling from optical emission region 185.

Figure 7:
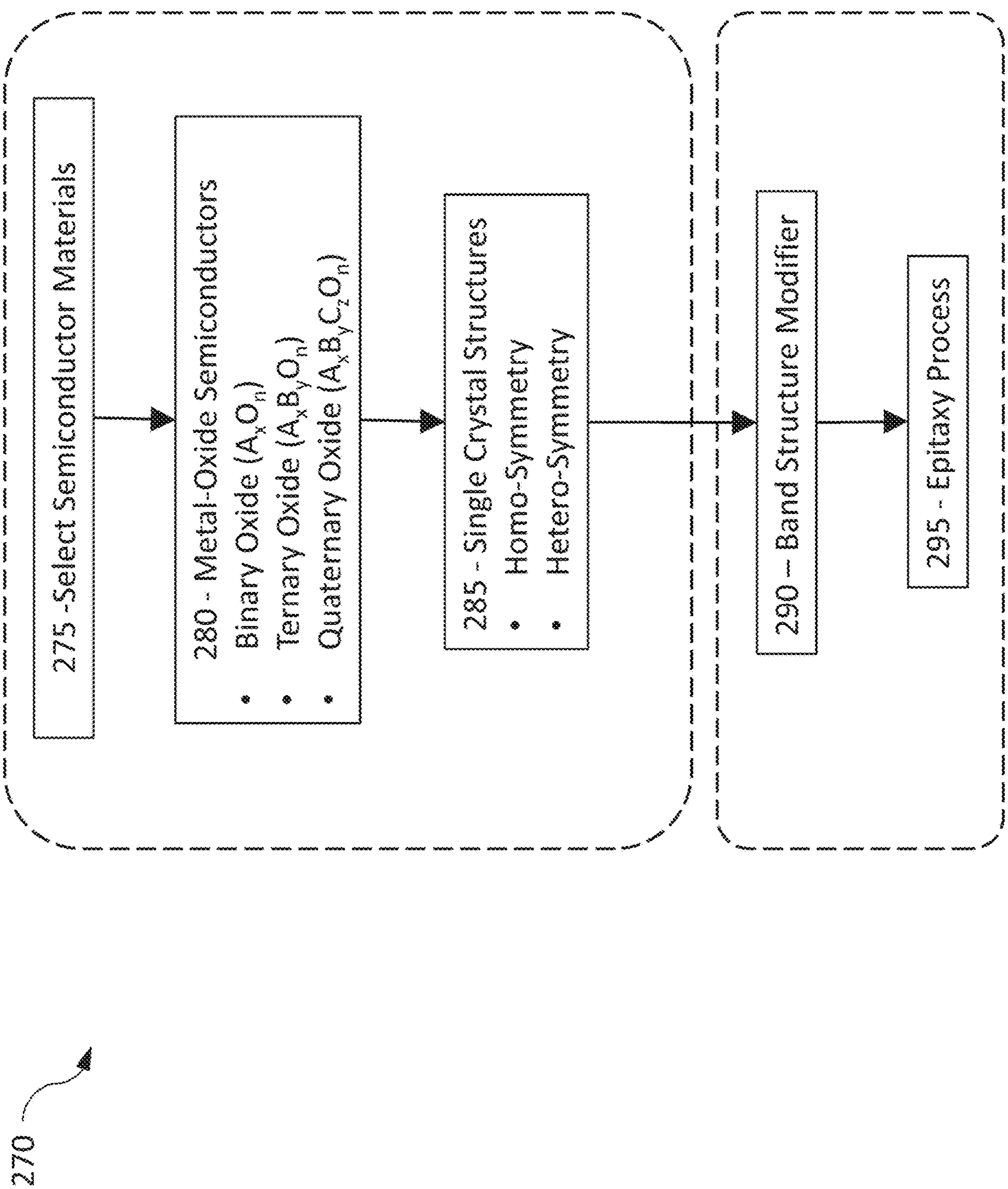
FIG. 7 shows example selection criteria to construct a metal oxide semiconductor structure in accordance with an illustrative embodiment of the present disclosure.

FIG. 7 shows by way of overview, selection criteria 270 for one or more metal oxide crystal compositions in accordance with illustrative embodiments. First, semiconductor materials 275 are selected. The semiconductor materials 275 may include metal-oxide semiconductors 280, which may be one or more of binary oxides, ternary oxides or quaternary oxides. The recombination region 220 forming the optical emission region 185 of optoelectronic semiconductor device 160 (for example see FIG. 5) is selected to exhibit efficient electron-hole recombination whereas the conductivity type regions are selected for their ability to provide sources of electrons and holes. Metal oxide semiconductors can also be created selectively from a plurality of possible crystal symmetry types even with the same species of constituent metals. Binary metal oxides of the form $A_xO_y$ comprising one metal species may be used, wherein the metal specie (A) is combined with oxygen (O) in the relative proportions x and y. Even with the same relative proportions x and y, a plurality of crystal structure configurations are possible having vastly different crystal symmetry groups.

As will be described below, compositions $Ga_2O_3$ and $Al_2O_3$ exhibit several advantageous and distinct crystal symmetries (e.g., monoclinic, rhombohedral, triclinic and hexagonal) but require careful attention to the utility of incorporating them and constructing a UVLED. Other advantageous metal oxide compositions, such as MgO and NiO, exhibit less variation in practically attainable crystal structures, namely cubic crystals.

Addition of advantageous second dissimilar metal species (B) can also augment a host binary metal oxide crystal structure to create a ternary metal oxide of the form $A_xB_yO_n$. Ternary metal oxides range from dilute addition of B-species up to a majority relative fraction. As described below, ternary metal oxides may be adopted for the advantageous formation of direct bandgap optically emissive structures in various embodiments. Yet further materials can be engineered comprising three dissimilar cation-atom species coupled to oxygen forming a quaternary composition $A_xB_yC_zO_n$.

In general, while a larger number (>4) of dissimilar metal atoms can theoretically be incorporated to form complex oxide materials—they are seldom capable of producing high crystallographic quality with exceptionally distinct crystal symmetry structures. Such complex oxides are in general polycrystalline or amorphous and therefore lack optimal utility for the applications to an optoelectronic device. As will be apparent, the present disclosure seeks in various examples substantially single crystal and low defect density configurations in order to exploit the band structure to form UVLED epitaxial formed devices. Some embodiments also include achieving desirable E-k configurations by the addition of another dissimilar metal specie.

Selection of desired bandgap structures for each of the UVLED regions of optoelectronic semiconductor device 160 may also involve integration of dissimilar crystal symmetry types. For example, a monoclinic crystal symmetry host region and a cubic crystal symmetry host region comprising a portion of the UVLED may be utilized. The epitaxial formation relationships then involve attention toward the formation of low defect layer formation. The type of layer formation steps are then classed 285 as homo-symmetry and hetero-symmetry formation. To achieve the goal of providing the materials forming the epilayer structure, band structure modifiers 290 can be utilized such as biaxial strain, uniaxial strain and digital alloys such as superlattice formation.

The epitaxy process 295 is then defined by the types and sequence of material composition required for deposition. The present disclosure describes new processes and compositions for achieving this goal.

Figure 8:
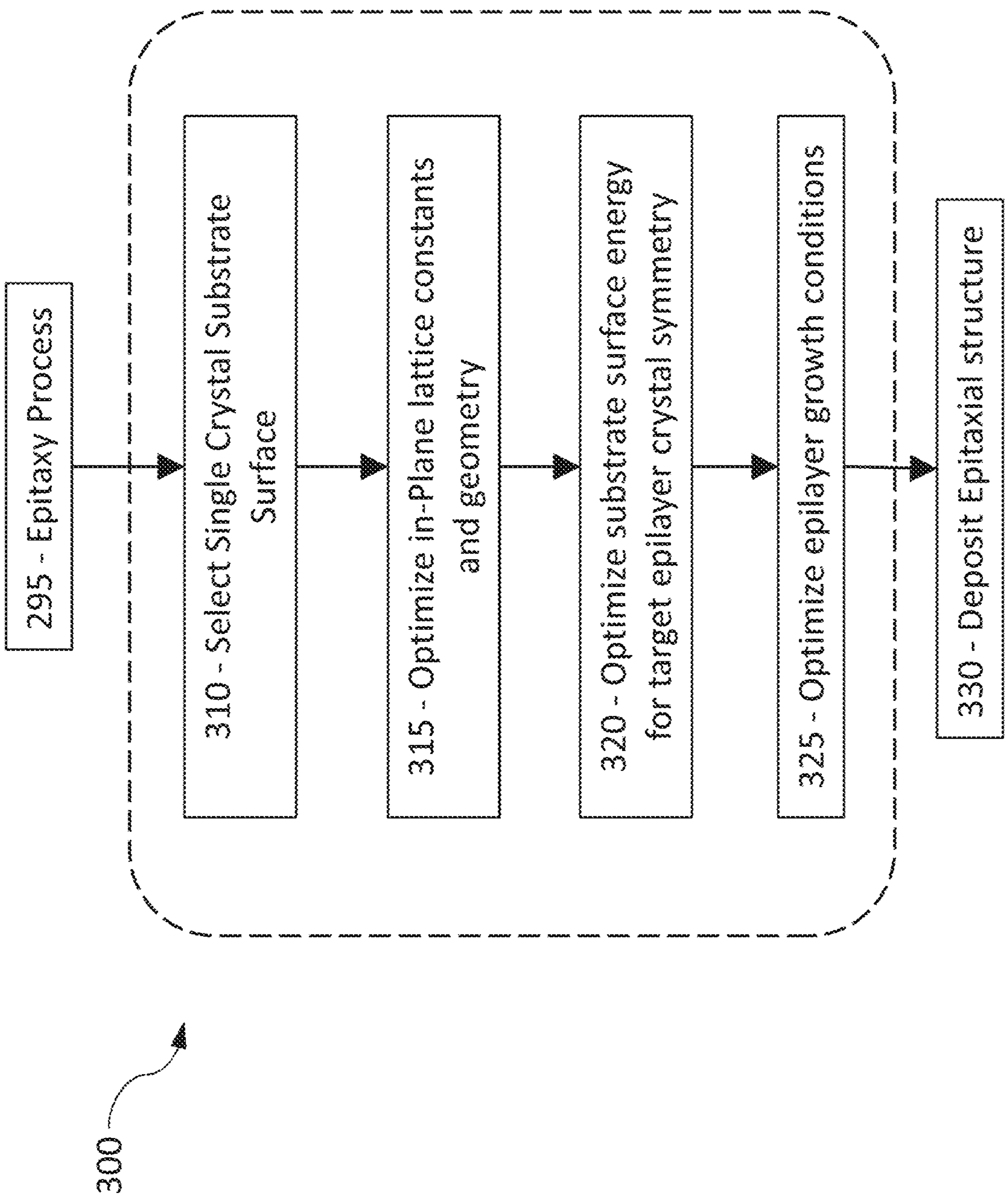
FIG. 8 is an example process flow diagram for selecting and depositing epitaxially a metal oxide structure in accordance with an illustrative embodiment of the present disclosure.

FIG. 8 shows the epitaxy process 300 formation steps. At step 310, a film formation substrate for supporting the optical emission region is selected with desirable properties of crystal symmetry type, and optical and electrical characteristics. In one example, the substrate is selected to be optically transparent to the operating wavelength and a crystal symmetry compatible with the epitaxial crystal symmetry types required. Even though equivalent crystal symmetry of both the substrate and epitaxial film(s) can be used there is also an optimization 315 for matching the in-plane atomic arrangements, such as in-plane lattice constants or advantageous co-incidence of in-plane geometry of respective crystal planes from dissimilar crystal symmetry types.

The substrate surface has a definite 2-dimensional crystal arrangement of terminated surface atoms. In vacuum, on a prepared surface this discontinuity of definite crystal structure results in a minimization of surface energy of the dangling bonds of the terminated atoms. For example, in one embodiment a metal oxide surface can be prepared as an oxygen terminated surface or in another embodiment as a metal-terminated surface. Metal oxide semiconductors can have complex crystal symmetry, and pure specie termination may require careful attention. For example, both $Ga_2O_3$ and $Al_2O_3$ can be O-terminated by high temperature anneal in vacuum followed by sustained exposure to atomic or molecular oxygen at high temperature.

The crystal surface orientation 320 of the substrate can also be selected to achieve selective film formation crystal symmetry type of the epitaxial metal oxide. For example, A-plane sapphire can be used to advantageously select (110)-oriented alpha-phase formation high quality epitaxial $Ga_2O_3$, $AlGaO_3$ and $Al_2O_3$; whereas for C-plane sapphire hexagonal and monoclinic $Ga_2O_3$ and $AlGaO_3$ films are generated. $Ga_2O_3$ oriented surfaces are also used selectively for film formation selection of $AlGaO_3$ crystal symmetry.

The growth conditions 325 are then optimized for the relative proportions of elemental metal and activated oxygen required to achieve the desired material properties. The growth temperature also plays an important role in determining the crystal structure symmetry types possible. The judicious selection of the substrate surface energy via appropriate crystal surface orientation also dictates the temperature process window for the epitaxial process during which the epitaxial structure 330 is deposited.

Figure 9:
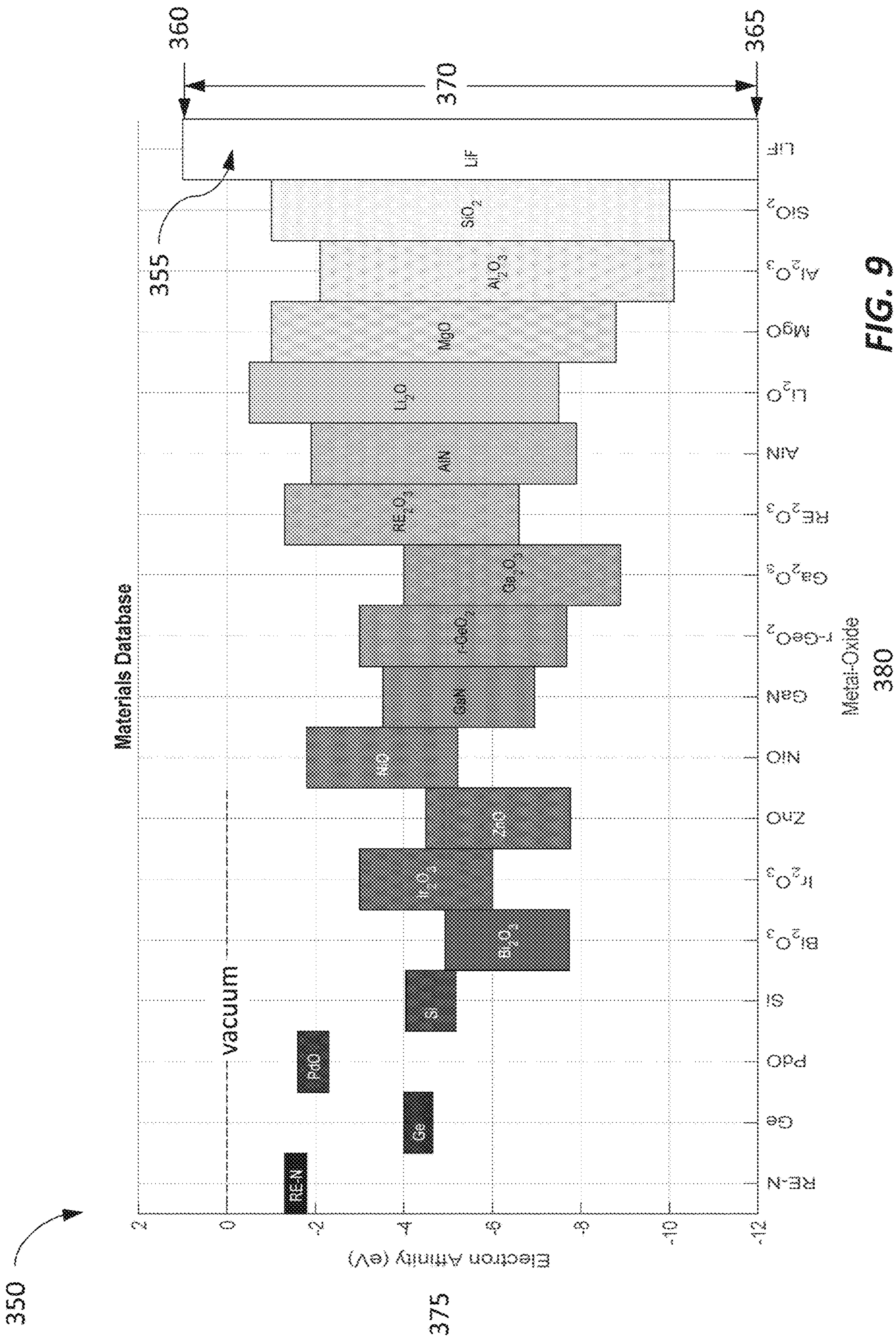
FIG. 9 is a summary of technologically relevant semiconductor bandgaps as a function of electron affinity, showing relative band lineups.

A materials selection database 350 for the application toward UVLED based optoelectronic devices is disclosed in FIG. 9. Metal oxide materials 380 are plotted as a function of their electron affinity energy 375 relative to vacuum. Ordered from left to right, the semiconductor materials have increasing optical bandgap and accordingly have greater utility for shorter wavelength operation UVLEDs. Using lithium fluoride (LiF) as an example in this graph, LiF has a bandgap 370 (represented as the box for each material) which is the energy difference in electron volts between conduction band minimum 360 and valence band maximum 365. The absolute energy positions represented by conduction band minimum 360 and valence band maximum 365 are plotted with respect to the vacuum energy. While narrow bandgap material such as rare-earth nitride (RE-N), germanium (Ge), palladium-oxide (PdO) and silicon (Si) do not offer suitable host properties for the optical emission region, they can be used advantageously for electrical contact formation. The use of intrinsic electron affinity of given materials can be used to form ohmic contacts and metal-insulator-semiconductor junctions as required.

Desirable materials combinations for use as a substrate are bismuth-oxide ($Bi_2O_3$), nickel-oxide (NiO), germanium-oxide ($GeO_{x-2}$), gallium-oxide ($Ga_2O_3$), lithium-oxide ($Li_2O$), magnesium-oxide (MgO), aluminum-oxide ($Al_2O_3$), single crystal quartz $SiO_2$, and ultimately lithium-fluoride 355 (LiF). In particular, $Al_2O_3$ (sapphire), $Ga_2O_3$, MgO and LiF are available as large high-quality single crystal substrates and may be used as substrates for UVLED type optoelectronic devices in some embodiments. Additional embodiments for substrates for UVLED applications also include single crystal cubic symmetry magnesium aluminate ($MgAl_2O_4$) and magnesium gallate ($MgGa_2O_4$). In some embodiments, the ternary form of $AlGaO_3$ may be deployed as a bulk substrate in monoclinic (high Ga %) and corundum (high Al %) crystal symmetry types using large area formation methods such as Czochralski (CZ) and edge-fed growth (EFG).

Considering host metal oxide semiconductors of $Ga_2O_3$ and $Al_2O_3$, in some embodiments alloying and/or doping via elements selected from database 350 are advantageous for film formation properties.

Therefore elements selected from Silicon (Si), Germanium (Ge), Er (Erbium), Gd (Gadolinium), Pd (Palladium), Bi (Bismuth), Ir (Iridium), Zn (Zinc), Ni (Nickel), Li (Lithium), Magnesium (Mg) are desirable crystal modification specie to form ternary crystal structures or dilute additions to the $Al_2O_3$, $AlGaO_3$ or $Ga_2O_3$ host crystals (see semiconductors 280 of FIG. 7).

Further embodiments include selection of the group of crystal modifiers selected from the group of Bi, Ir, Ni, Mg, Li.

For application to the host crystals $Al_2O_3$, $AlGaO_3$ or $Ga_2O_3$ multivalence states possible using Bi and Ir can be added to enable p-type impurity doping. The addition of Ni and Mg cations can also enable p-type impurity substitutional doping at Ga or Al crystal sites. In one embodiment, Lithium may be used as a crystal modifier capable of increasing the bandgap and modifying the crystal symmetry possible, ultimately toward orthorhombic crystal symmetry lithium gallate ($LiGaO_2$) and tetragonal crystal symmetry aluminum-gallate ($LiAlO_2$). For n-type doping Si and Ge may be used as impurity dopants, with Ge offering improved growth processes for film formation.

While other materials are also possible, the database 350 provides advantageous properties for application to UVLED.

Figure 10:
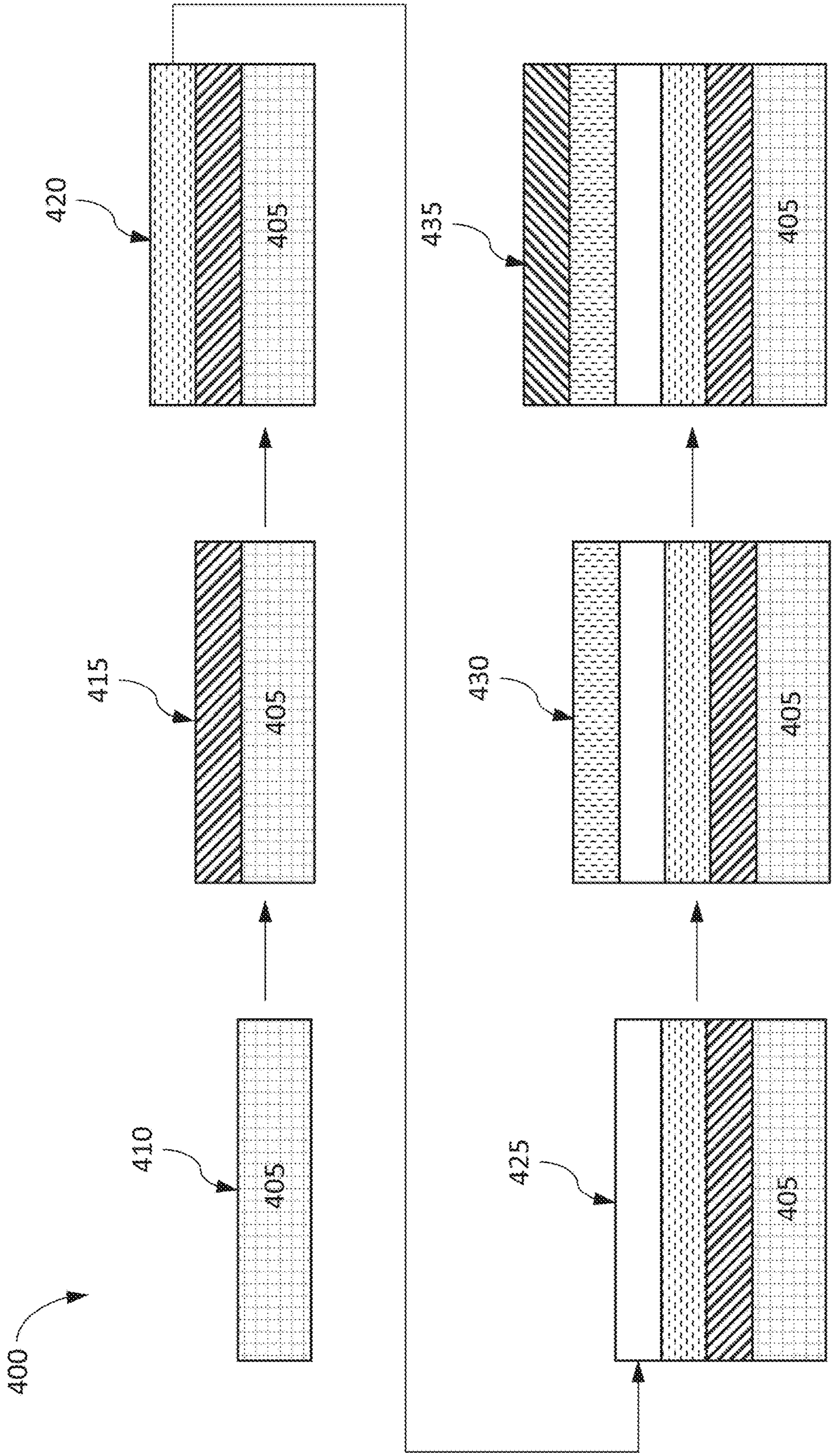
FIG. 10 is an example schematic process flow for depositing a plurality of layers for forming a plurality of regions comprising an LED in accordance with an illustrative embodiment of the present disclosure.

FIG. 10 depicts a sequential epitaxial layer formation process flow 400 utilized to epitaxially integrate the material regions as defined in optoelectronic semiconductor device 160 according to an illustrative embodiment.

A substrate 405 is prepared with surface 410 configured to accept a first conductivity type crystal structure layer(s) 415 which may comprise a plurality of epitaxial layers. Next first spacer region composition layer(s) 420 which may comprise a plurality of epitaxial layers is formed on layer 415. An optical emission region 425 is then formed on layer 420, in which region 425 may comprise a plurality of epitaxial layers. A second spacer region 430 which may comprise a plurality of epitaxial layers is then deposited on region 425. A second conductivity type cap region 435 which may comprise a plurality of epitaxial layers then completes a majority of the UVLED epitaxial structure. Other layers may be added to complete the optoelectronic semiconductor device, such as ohmic metal layers and passive optical layers, such as for optical confinement or antireflection.

Figure 11:
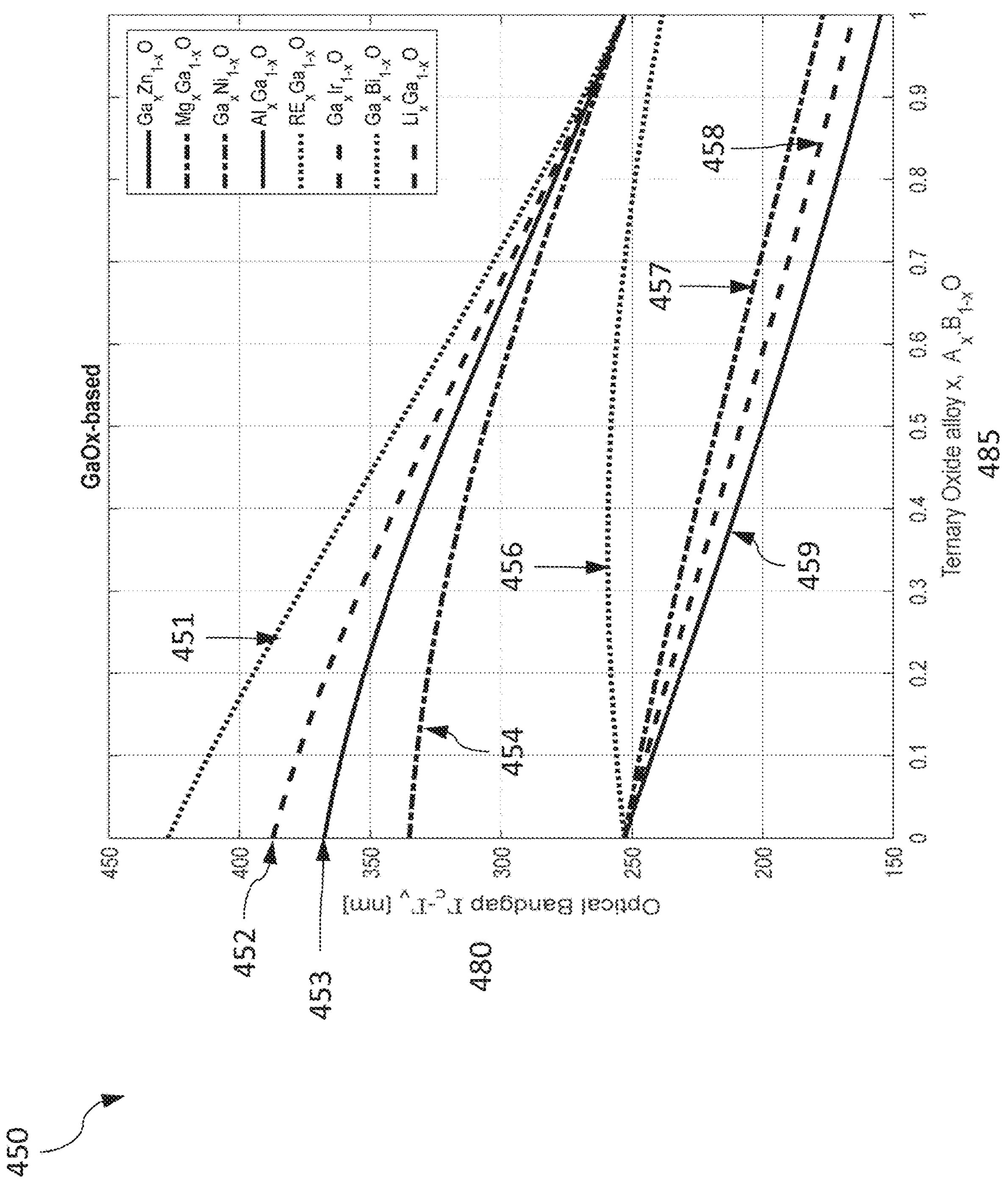
FIG. 11 is a ternary alloy optical bandgap tuning curve for metal oxide semiconductor ternary compositions based on Gallium-Oxide in accordance with illustrative embodiments of the present disclosure.

Referring to FIG. 11, a possible selection of ternary metal oxide semiconductors 450 is shown for the cases of Gallium-Oxide-based (GaOx-based) compositions 485. Optical bandgap 480 for various values of x in ternary oxide alloys $A_xB_{1-x}O$ are graphed. As previously stated, metal oxides may exhibit several stable forms of crystal symmetry structure which is further complicated by the addition of another specie to form a ternary. However, the example general trend can be found by selectively incorporating or alloying Aluminum, group-II cations {Mg, Ni, Zn}, Iridium, Erbium and Gadolinium atoms, as well as Lithium atoms advantageously with Ga-Oxide. Ni and Ir typically form deep d-bands but for high Ga % can form useful optical structures. Ir is capable of multiple valence states, where in some embodiments the $Ir_2O_3$ form is utilized.

Alloying one of X={Ir, Ni, Zn, Bi} into $Ga_xX_{1-x}O$ decreases the available optical bandgap (refer to curves labelled 451, 452, 453, 454). Conversely, alloying one of Y={Al, Mg, Li, RE} increases the available bandgap of the ternary $Ga_xY_{1-x}O$ (refer to curves 456, 457, 458, 459).

FIG. 11 can therefore be understood with application toward forming the optically emissive and conductivity type regions in accordance with the present disclosure.

Figure 12:
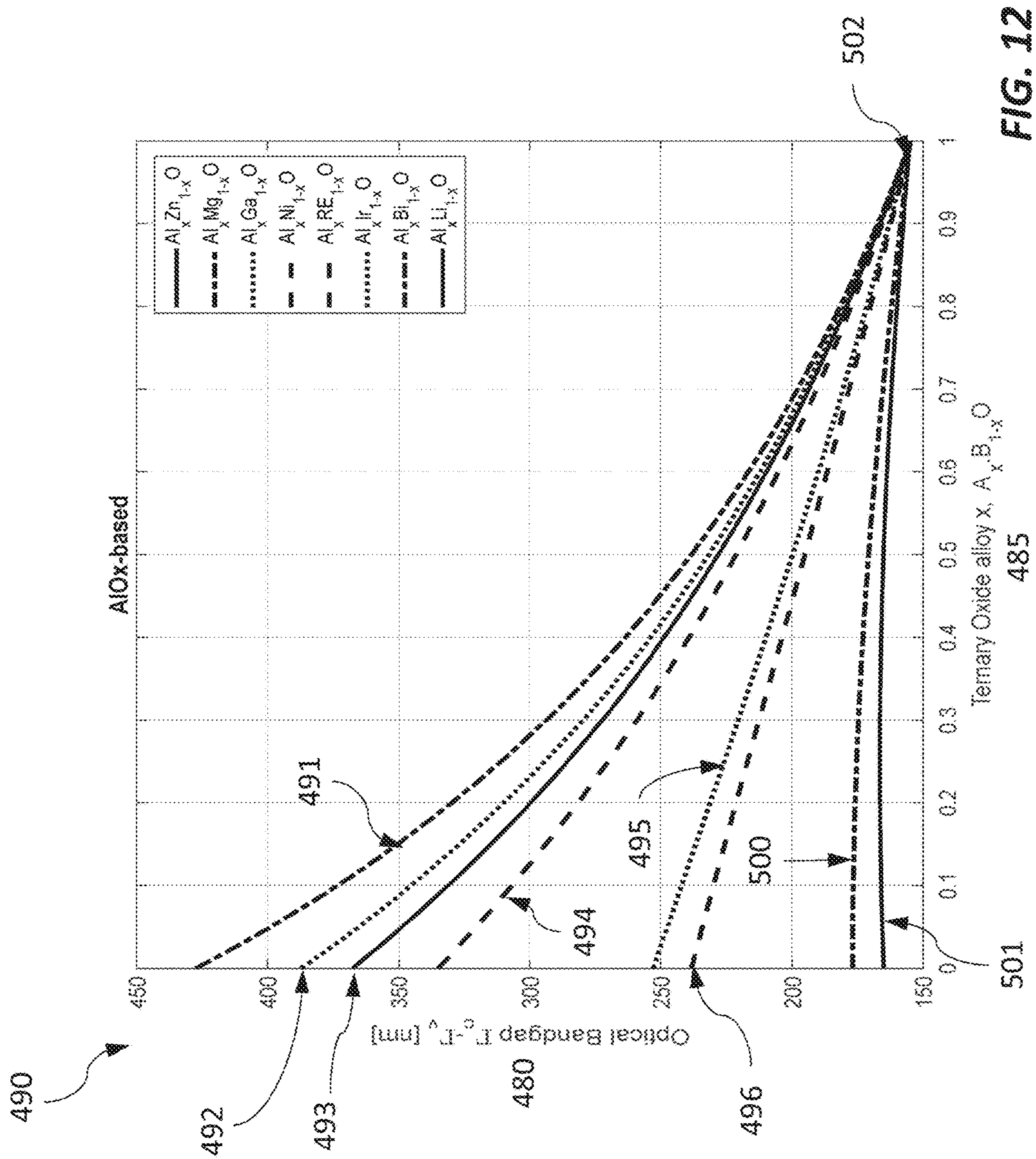
FIG. 12 is a ternary alloy optical bandgap tuning curve for metal oxide semiconductor ternary compositions based on Aluminum-Oxide in accordance with illustrative embodiments of the present disclosure.

Similarly, FIG. 12 discloses a possible selection of ternary metal oxide semiconductors 490 for the cases of Aluminum-Oxide-based (AlOx-based) compositions 485 in relation to optical bandgap 480. Scrutinizing the curves, it can be seen that alloying one of X={Ir, Ni, Zn, Mg, Bi, Ga, RE, Li} into $Al_xX_{1-x}O$ decreases the available optical bandgap. The group of Y={Ni, Mg, Zn} form spinel crystal structures but all decreases the available bandgap of the ternary $Al_xY_{1-x}O$ (refer to curves 491, 492, 493, 494, 495, 496, 500, 501). FIG. 12 also shows the energy gap 502 of the alpha-phase aluminum oxide ($Al_2O_3$) having rhombohedral crystal symmetry.

FIG. 12 can therefore be understood with application to forming the optically emissive and conductivity type regions in accordance with the present disclosure. Shown in FIG. 28 is a chart 2800 of potential ternary oxide combinations for ($0 \leq x \leq 1$) that may be adopted in accordance with the present disclosure. Chart 2800 shows the crystal growth modifier down the left-hand column and the host crystal across the top of the chart.

Figure 13B:
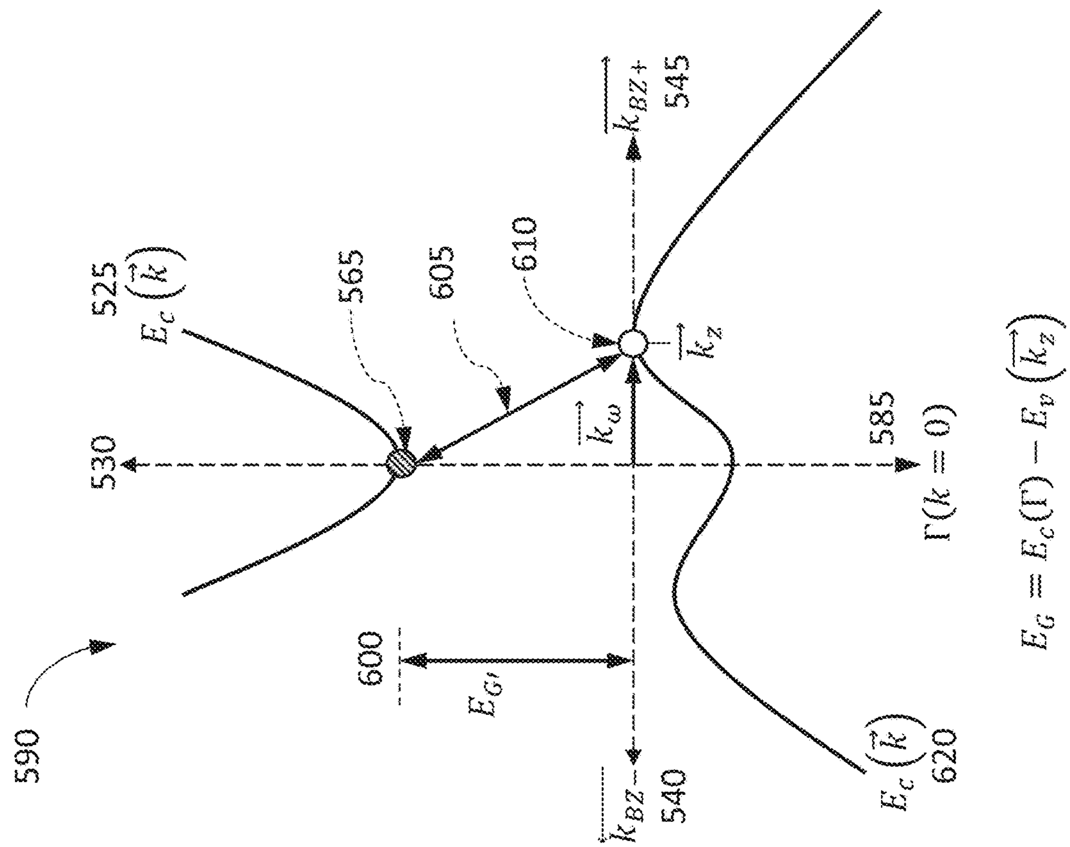
FIGS. 13A and 13B are electron energy-vs.-crystal momentum representations of metal oxide based optoelectronic semiconductors showing a direct bandgap (FIG. 13A) and indirect bandgap (FIG. 13B) in accordance with illustrative embodiments of the present disclosure.
Figure 13A:
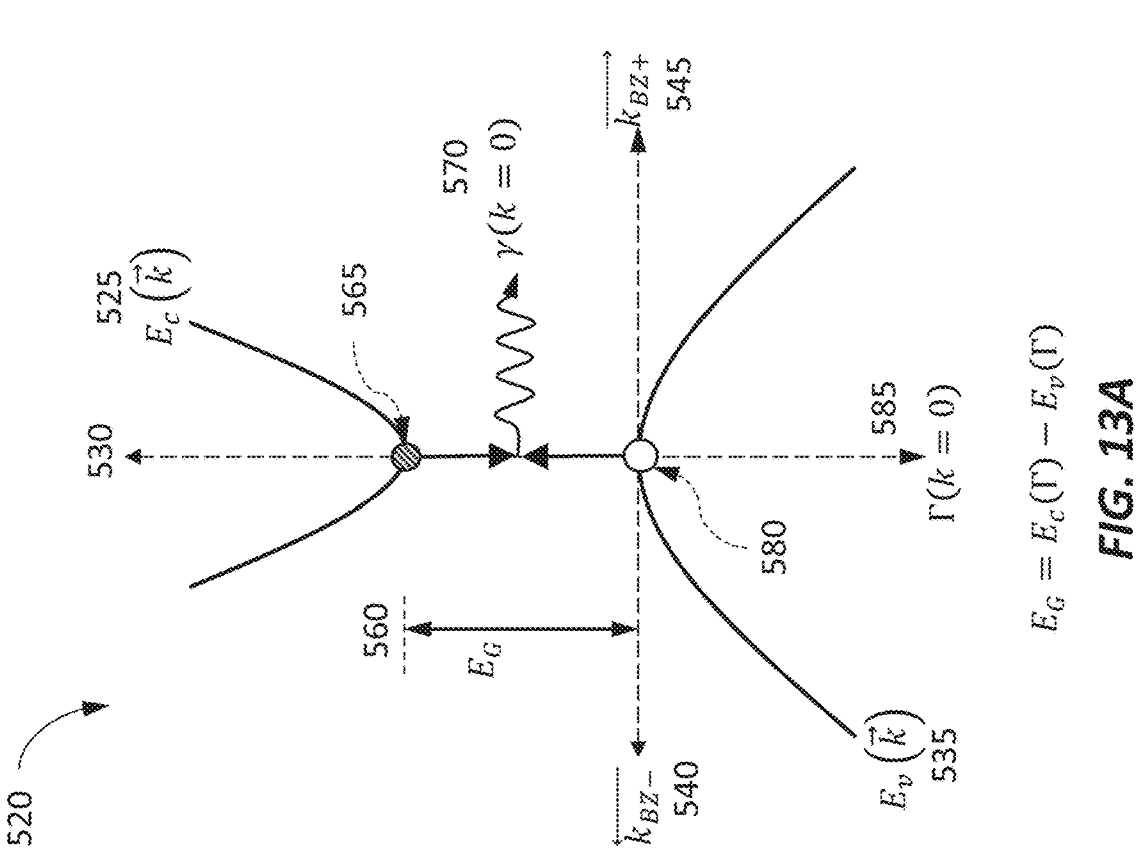

FIGS. 13A and 13B are electron energy-vs-crystal momentum representations of possible metal oxide based semiconductors showing a direct bandgap (FIG. 13A) and indirect bandgap (FIG. 13B) and are illustrative of concepts related to the formation of optoelectronic devices in accordance with the present disclosure. It is known by workers in the field of quantum mechanics and crystal structure design that symmetry directly dictates the electronic configuration or band structure of a single crystal structure.

In general, for application to optically emissive crystal structures, there exists two classes of electronic band structure as shown in FIGS. 13A and 13B. The fundamental process utilized in optoelectronic devices of the present disclosure is the recombination of physical (massive) electron and hole particle-like charge carriers which are manifestations of the allowed energy and crystal momentum. The recombination process can occur conserving crystal momentum of the incident carriers from their initial state to the final state.

To achieve a final state, wherein the electron and hole annihilate to form a massless photon (i.e., momentum $k_\gamma$ of final state massless photon $k_\gamma=0$), requires a special E-k band structure which is shown in FIG. 13A. A metal oxide semiconductor structure having pure crystal symmetry can be calculated using various computational techniques. One such method is the Density Function Theory wherein first principles can be used to construct an atomic structure comprising distinction pseudopotentials attached to each constituent atom comprising the structure. Iterative computational schemes for ab initio total-energy calculations using a plane-wave basis can be used to calculate the band structure due to the crystal symmetry and spatial geometry.

FIG. 13A represents the reciprocal space energy-versus-crystal momentum or band structure 520 for a crystal structure. The lowest lying conduction band 525 having energy dispersion $E_c(\vec{k})$ with respect to crystal momentum vector $k=\vec{k}=(k_xk_yk_z)$ describes the allowed configuration space for electrons. The highest lying valence band 535 having energy dispersion $E_v(\vec{k})$ also describes the allowed energy states for holes (positively charged crystal particles).

The dispersions 525 and 535 are plotted with respect to the electron energy (increasing direction 530, decreasing direction 585) in units of electron volts and the crystal momentum in units of reciprocal space (positive $K_{BZ}$ 545 and negative $K_{BZ}$ 540 representing distinct crystal wavevectors from the Brillouin zone center). The band structure 520 is shown at the highest symmetry point of the crystal labelled as the Γ-point representing the band structure at k=0. The bandgap is defined by the energy difference between the minima and maxima of 525 and 535, respectively. An electron propagating through the crystal will minimize energy and relax to the conduction band minimum 565, similarly a hole will relax to the lowest energy state 580.

If 565 and 580 are simultaneously located at k=0 then a direct recombination process can occur wherein the electron and hole annihilate and create a new massless photon 570 with energy approximately equal to the bandgap energy 560. That is, electron and holes at k=0 can recombine and conserve crystal moment to create a massless particle—termed a 'direct' bandgap material. As will be disclosed, this situation is rare in practice with only a small subset of all crystal symmetry type semiconductors exhibiting this advantageous configuration.

Referring now to crystal structure 590 of FIG. 13B, where the primary bands 525 and 620 of the band structure do not have their respective minima 565 and maxima 610 at k=0, this is termed an 'indirect' configuration. The minimum bandgap energy 600 is still defined as the energy difference between the conduction band minimum and the valence band maximum which do occur at the same wavevector, and is known as the indirect bandgap energy 600. Optical emission processes are clearly not favorable as crystal momentum cannot be conserved for the recombination event and requires secondary particles to conserve crystal momentum, such as crystal vibrational quanta phonons. In metal oxides, the longitudinal optical phonon energy scales with bandgap and are in comparison very large to those found in for example, GaAs, Si and the like.

It is therefore challenging to use indirect E-k configurations for the purpose of optically emissive regions. The present disclosure describes methods to manipulate an otherwise indirect bandgap of a specific crystal symmetry structure and transform or modify the zone-center k=0 character of the band structure into direct bandgap dispersion suitable for optical emission. These methods are now disclosed for application to the manufacture of optoelectronic devices and in particular to the fabrication of UVLEDs.

Even if there exists a direct bandgap configuration, the design selection is then confronted by specific crystal symmetry of given metal oxide having electric dipole selection rules governed by the symmetry character group assigned to each of the energy bands. For the case of $Ga_2O_3$ and $Al_2O_3$ the optical absorption is governed between the lowest conduction band and the three topmost valence bands.

Figure 13E:
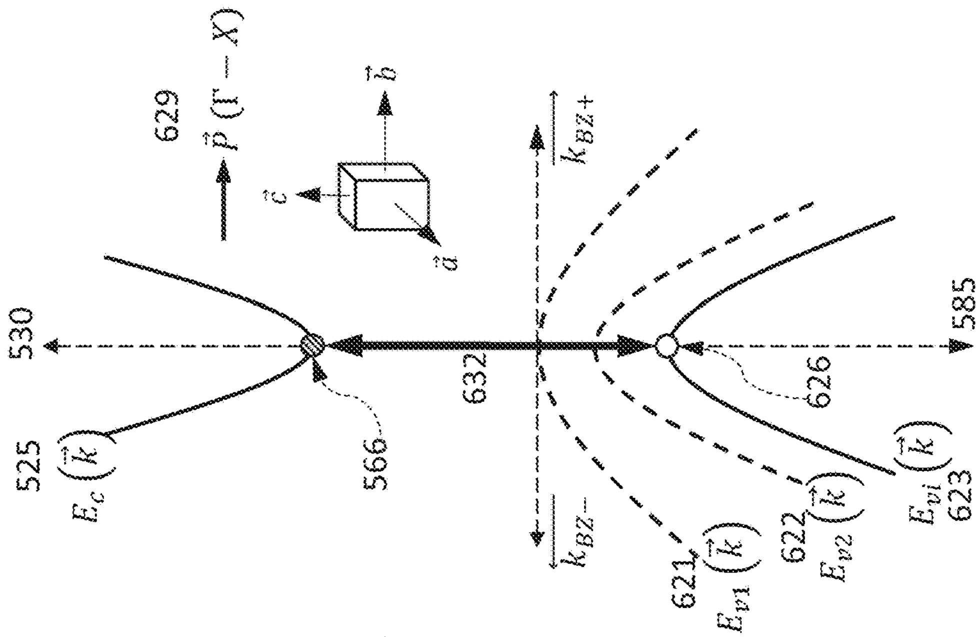
FIGS. 13C-13E are electron energy-vs.-crystal momentum representations showing allowed optical emission and absorption transitions at k=0 with respect to the axes of $Ga_2O_3$ monoclinic crystal symmetry in accordance with an illustrative embodiment of the present disclosure.
Figure 13D:
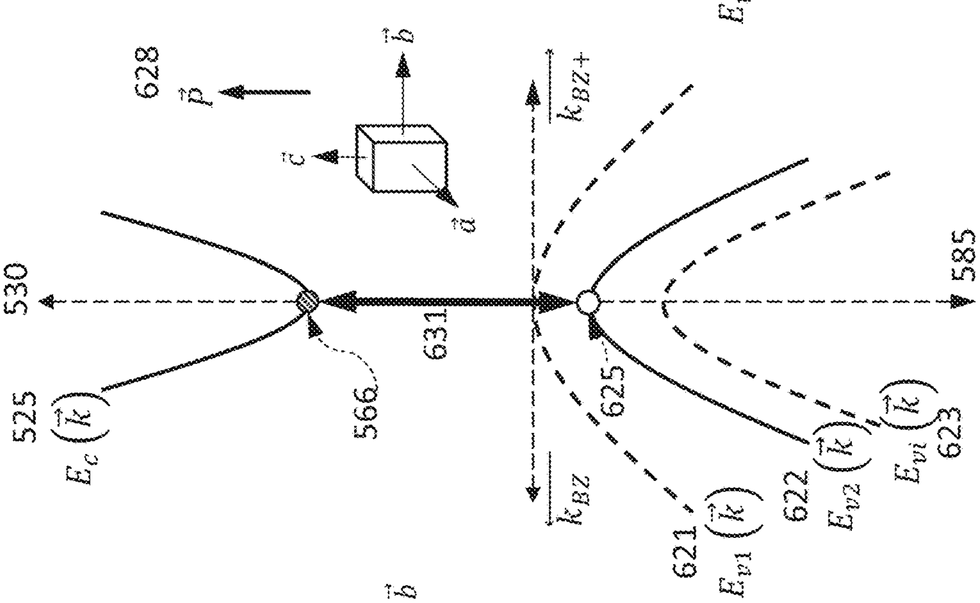
Figure 13C:
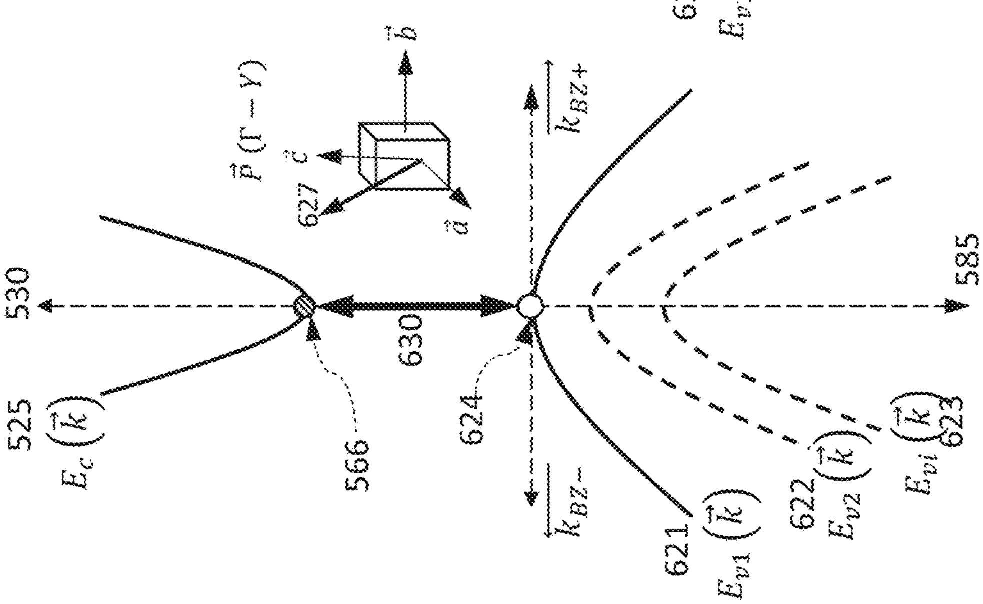

FIGS. 13C-13E show the optical emission and absorption transition at k=0 with respect to a $Ga_2O_3$ monoclinic crystal symmetry. FIGS. 13C-13E each show three valence bands $E_{vi}(k)$ 621, 622 and 623. In FIG. 13C, the optically allowed electric dipole transition are shown for an electron 566 and a hole 624 being allowed for optical polarization vectors within the a-axis and c-axis of the monoclinic unit cell. With respect to the reciprocal space E-k this corresponds to wave vector 627 in the Γ-Y branches. Similarly, electric-dipole transition between electron 566 and hole 625 in FIG. 13D are allowed for polarizations along the c-axis 628 of the crystal unit cell. Furthermore, higher energy transitions between electron 566 and hole 626 in FIG. 13E are allowed for optical polarization fields along the b-axis 629 of the unit cell corresponding to the E-k (Γ-X) branch.

Clearly, the magnitude of the energy transitions 630, 631 and 632 in FIGS. 13C, 13D and 13E respectively are increasing with only the lowest energy transition favorable for optical light emission. If, however, the Fermi energy level ($E_F$) is configured such that the lowest lying valence band 621 is above $E_F$ and 622 below $E_F$, then optical emission can occur at energy 631. These selection rules are particularly useful when designing waveguide devices which are optical polarization dependent for specific TE, TM and TEM modes of operation.

Figure 14B:
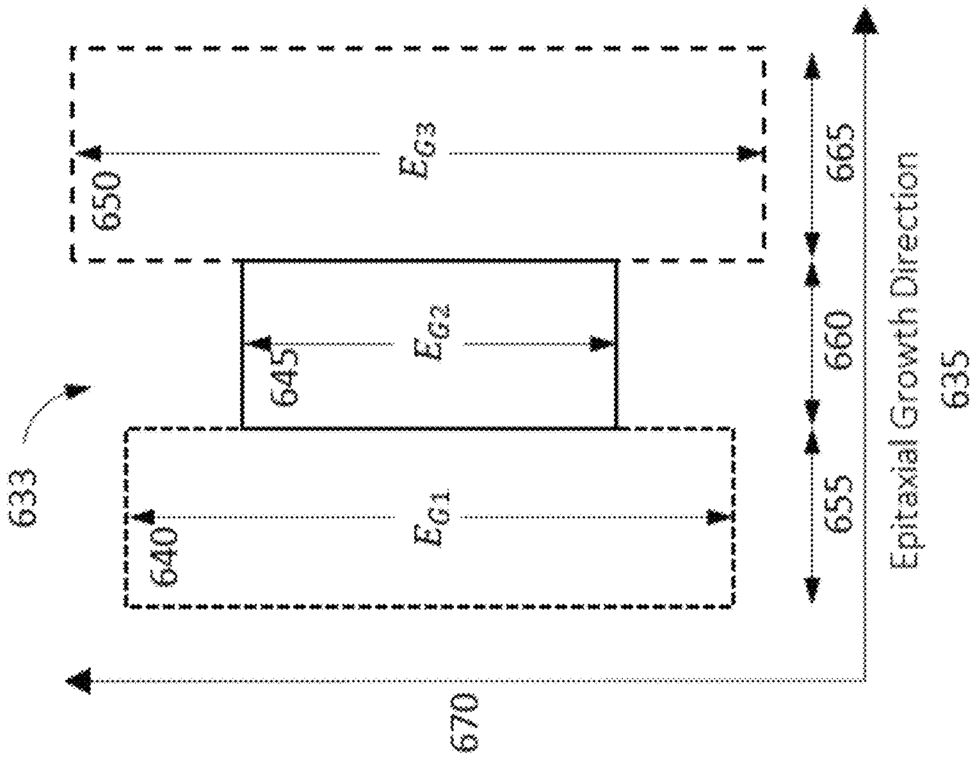
FIGS. 14A and 14B depict sequential deposition of a plurality of heterogenous metal oxide semiconductor layers having dissimilar crystal symmetry types to embed an optical emission region in accordance with an illustrative embodiment of the present disclosure.
Figure 14A:
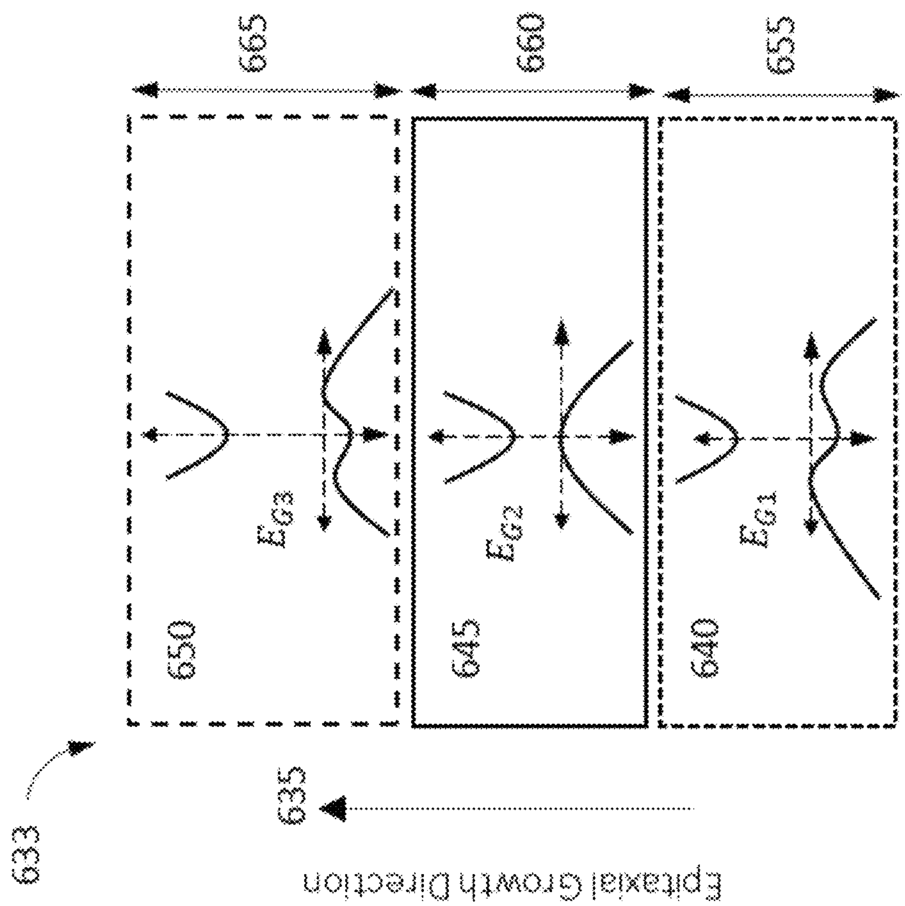

By reference to the explanations above relating to band structure, referring now to FIGS. 14A-14B these diagrams show how these complex elements may be incorporated in the device structure 160. Each functional region of the UVLED has a specific E-k dispersion having both indirect and direct type materials—which can also be due to dramatically different crystal symmetry types. This then allows the optically emissive region to be embedded advantageously within the device.

FIGS. 14A and 14B show the representations of complex E-k materials by single blocks 633 defined by the layer thickness 655, 660 and 665 and the fundamental bandgap energy 640, 645 and 650, respectively. The relative alignments of the conduction and valence band edges are shown in blocks 633. FIG. 14B represents the electron energy 670 versus a spatial growth direction 635 for three distinct materials having bandgap energies 640, 645 and 650. For example, a first region deposited along a growth direction 635 using an indirect type crystal but otherwise having a final surface lattice constant geometry capable of providing mechanical elastic deformation of the subsequent crystal 645 is possible. For example, this can occur for the growth of $AlGaO_3$ directly on $Ga_2O_3$.

Epitaxial Fabrication Methods

Figure 15:
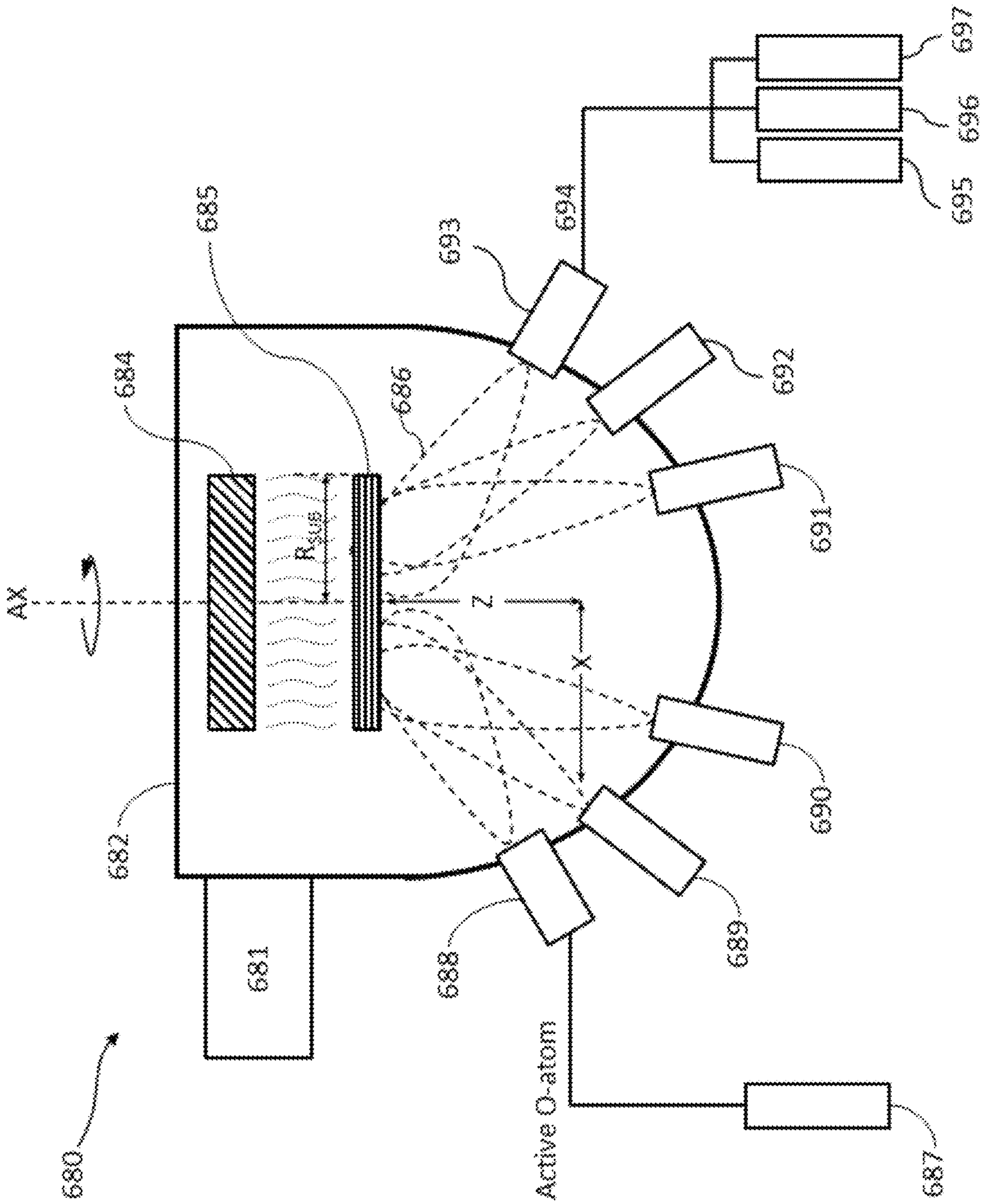
FIG. 15 is a schematic representation of an atomic deposition tool for the creation of multi-layered metal oxide semiconductor films comprising a plurality of material compositions in accordance with illustrative embodiments of the present disclosure.

Non-equilibrium growth techniques are known in the prior art and are called Atomic and Molecular Beam Epitaxy, Chemical Vapor Epitaxy or Physical Vapor Epitaxy. Atomic and Molecular Beam Epitaxy utilizes atomic beams of constituents directed toward a growth surface spatially separate as shown FIG. 15. While molecular beams are also used it is the combination of molecular and atomic beams which may be used in accordance with the present disclosure.

One guiding principle is the use of pure constituent sources that can be multiplexed at a growth surface through favorable condensation and kinematically favored growth conditions to physically build a crystal atomic layer by layer. While the growth crystal can be substantially self-assembled, the control of the present methods can also intervene at the atomic level and deposit single specie atomic thick epilayers. Unlike equilibrium growth techniques which rely on the thermodynamic chemical potentials for bulk crystal formation, the present techniques can deposit extraordinarily thin atomic layers at growth parameters far from the equilibrium growth temperature for a bulk crystal.

In one example, $Al_2O_3$ films are formed at film formation temperature in the range of 300-800° C., whereas the conventional bulk equilibrium growth of $Al_2O_3$(Sapphire) is produced well in excess of 1500° C. requiring a molten reservoir containing Al and O liquid which can be configured to position a solid seed crystal in close proximity to the molten surface. Careful positioning of a seed crystal orientation is placed in contact to the melt which forms a recrystallized portion in the vicinity of the melt. Pulling the seed and partially solidified recrystallized portion away from the melt forms a continuous crystal boule.

Such equilibrium growth methods for metal oxides limit the possible combinations of metals and the complexity of discontinuous regions possible for heteroepitaxial formation of complex structures. The non-equilibrium growth techniques in accordance with the present disclosure can operate at growth parameters well away from the melting point of the target metal oxide and can even modulate the atomic specie present in a single atomic layer of a unit cell of crystal along a preselected growth direction. Such non-equilibrium growth methods are not bound by equilibrium phase diagrams. In one example, the present methods utilize evaporated source materials comprising the beams impinging upon the growth surface to be ultrapure and substantially charge neutral. Charged ions are in some cases created but these should be minimized as best possible.

For the growth of metal oxides the constituent source beams can be altered in a known way for their relative ratio. For example, oxygen-rich and metal-rich growth conditions can be attained by control of the relative beam flux measured at the growth surface. While nearly all metal oxides grow optimally for oxygen-rich growth conditions, analogous to arsenic-rich growth of gallium arsenide GaAs, some materials are different. For example, GaN and AlN require metal rich growth conditions with extremely narrow growth window, which are one of the most limiting reasons for high volume production.

While metal oxides favor oxygen-rich growth with wide growth windows—there are opportunities to intervene and create intentional metal-deficient growth conditions. For example, both $Ga_2O_3$ and NiO favor cation vacancies for the production of active hole conductivity type. A physical cation vacancy can produce an electronic carrier type hole and thus favor p-type conduction.

Figure 41:
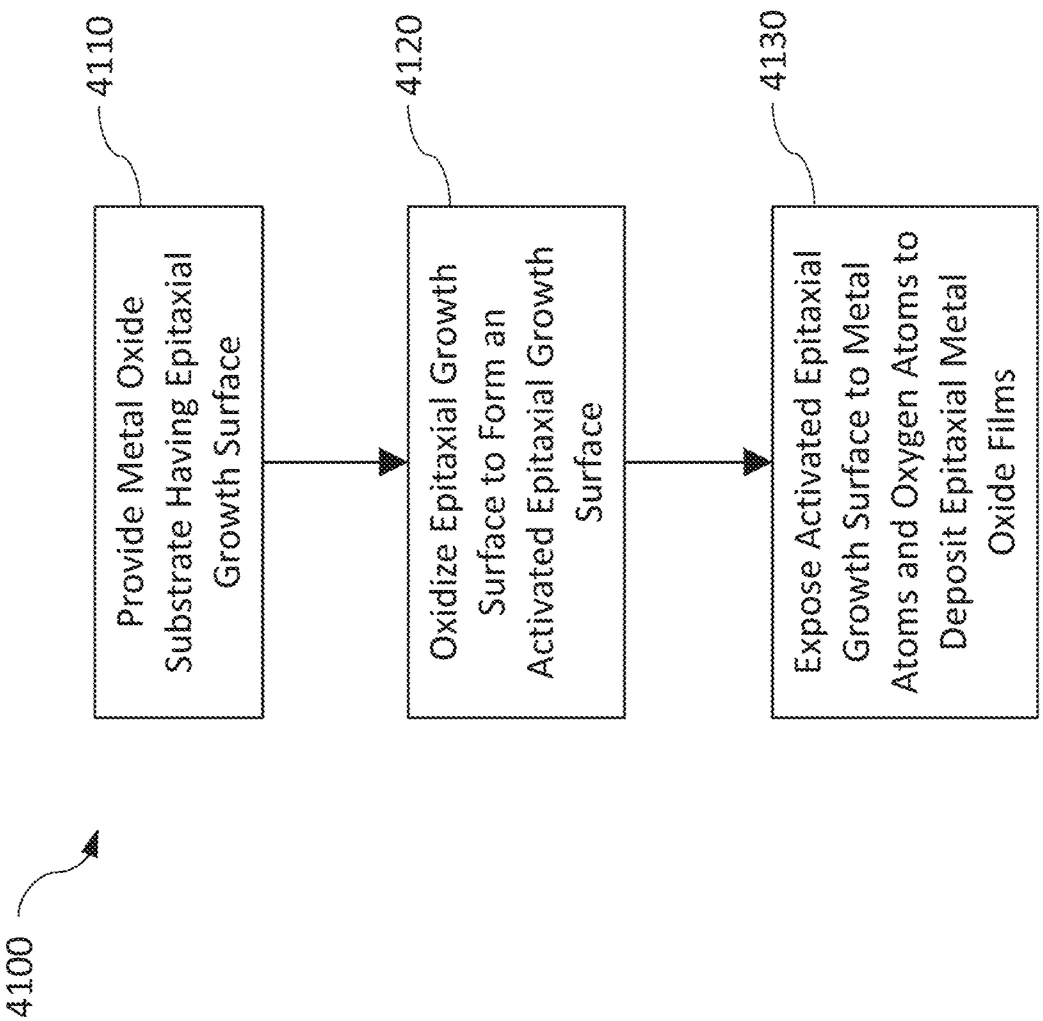
FIG. 41 is a process flow diagram for forming an optoelectronic semiconductor device in accordance with an illustrative embodiment of the present disclosure.

Referring now to FIG. 41, and by way of overview, there is shown a process flow diagram of a method 4100 for forming an optoelectronic semiconductor device according to the present disclosure. In one example the optoelectronic semiconductor device is configured to emit light in the wavelength of about 150 nm to about 280 nm.

At step 4110 a metal oxide substrate is provided having an epitaxial growth surface. At step 4120, the epitaxial growth surface is oxidized to form an activated epitaxial growth surface. At step 4130, the activated epitaxial growth surface is exposed to one or more atomic beams each comprising high purity metal atoms and one or more atomic beams comprising oxygen atoms under conditions to deposit two or more epitaxial metal oxide films or layers.

Referring again to FIG. 15 there is shown an epitaxial deposition system 680 for providing Atomic and Molecular Beam Epitaxy in accordance with, in one example, method 4100 referred to in FIG. 41.

In one example, a substrate 685 rotates about an axis AX and is heated radiatively by a heater 684 with emissivity designed to match the absorption of a metal oxide substrate. The high vacuum chamber 682 has a plurality of elemental sources 688, 689, 690, 691, 692 capable of producing atomic or molecular species as beams of a pure constituent of atoms. Also shown are plasma source or gas source 693, and gas feed 694 which is a connection to gas source 693.

For example, sources 689-692 may comprise effusion type sources of liquid Ga and Al and Ge or precursor based gases. The active oxygen sources 687 and 688 may be provided via plasma excited molecular oxygen (forming atomic-O and $O_2$*), ozone ($O_3$), nitrous oxide ($N_2O$) and the like. In some embodiments, plasma activated oxygen is used as a controllable source of atomic oxygen. A plurality of gases can be injected via sources 695, 696, 697 to provide a mixture of different species for growth. For example, atomic and excited molecular nitrogen enable n-type, p-type and semi-insulating conductivity type films to be created in GaOxide-based materials. The vacuum pump 681 maintains vacuum, and mechanical shutters intersecting the atomic beams 686 modulate the respective beam fluxes providing line of sight to the substrate deposition surface.

This method of deposition is found to have particular utility for enabling flexibility toward incorporating elemental species into Ga-Oxide based and Al-Oxide based materials.

Figure 16:
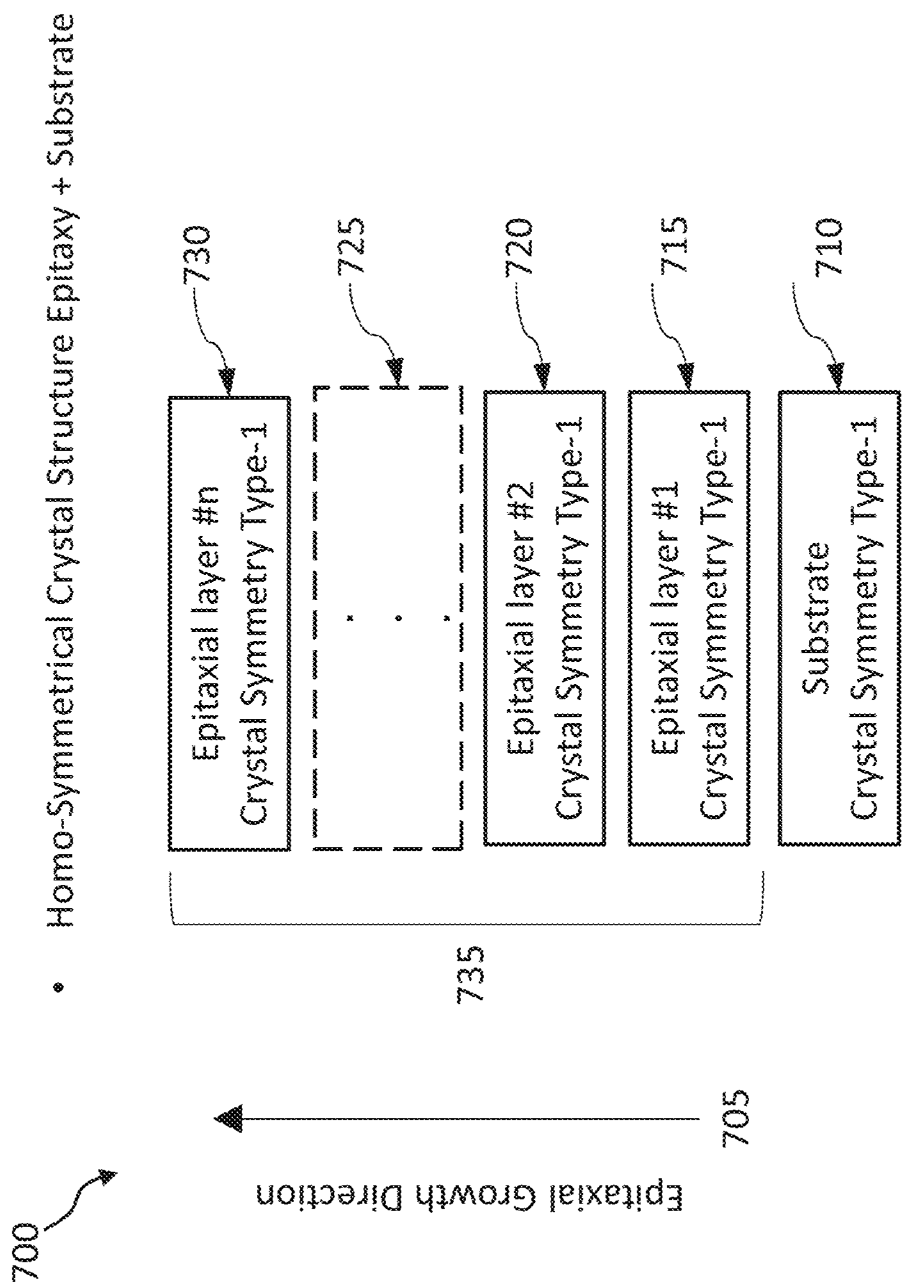
FIG. 16 is a representation of sequential deposition of layers and regions having similar crystal symmetry types matching the substrate in accordance with an illustrative embodiment of the present disclosure.

FIG. 16 shows an embodiment of an epitaxial process 700 for constructing UVLEDs as a function of the growth direction 705. Homo-symmetry type layers 735 can be formed using a native substrate 710. The substrate 710 and crystal structure epitaxy layers 735 are homo-symmetrical, being labeled here as Type-1. For example, a corundum type sapphire substrate can be used to deposit corundum crystal symmetry type layers 715, 720, 725, 730. Yet another example is the use of a monoclinic substrate crystal symmetry to form monoclinic type crystal symmetry layers 715-730. This is readily possible using native substrates for growth of the target materials disclosed herein (e.g., see Table I of FIG. 43A). Of particular interest is the growth of epitaxial layer formations such as corundum $AlGaO_3$ having a plurality of compositions of layers 715-730. Alternatively, a monoclinic $Ga_2O_3$ substrate 710 can be used to form a plurality of monoclinic AlGaO3 compositions of layers 715-730.

Figure 17:
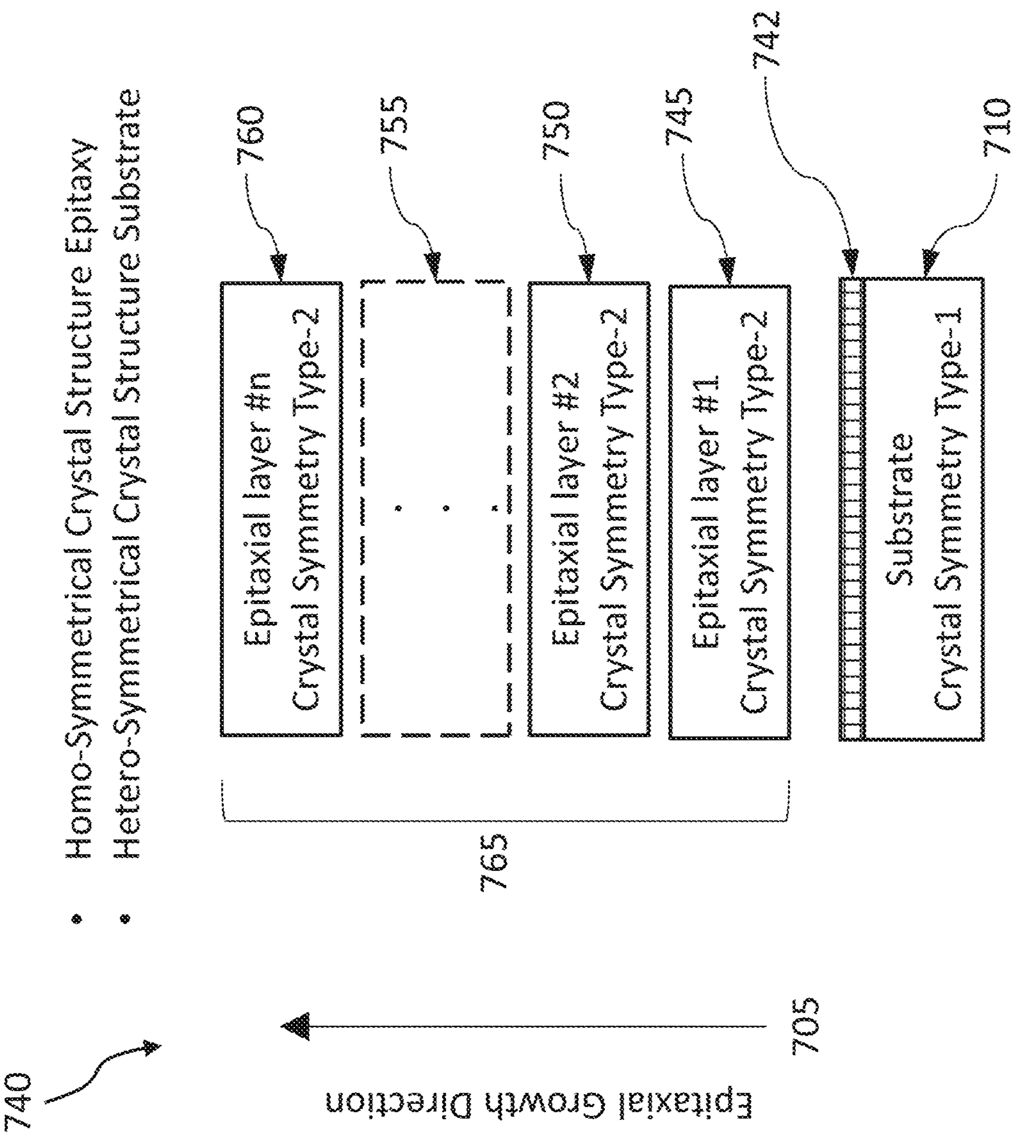
FIG. 17 depicts sequential deposition of regions having a different crystal symmetry to an underlying first surface of a substrate where a surface modification to the substrate is shown in accordance with an illustrative embodiment of the present disclosure.

Referring now to FIG. 17, a further epitaxial process 740 is illustrated that uses a substrate 710 with crystal symmetry that is inherently dissimilar to the target epitaxial metal oxide epilayer crystal types of layers 745, 750, 755, 760. That is, the substrate 710 is of crystal symmetry Type-1 which is hetero-symmetrical to the crystal structure epitaxy 765 that is made of layers 745, 750, 755, 760 that are all Type-2.

For example, C-plane corundum sapphire can be used as a substrate to deposit at least one of a monoclinic, triclinic or hexagonal $AlGaO_3$ structure. Another example is the use of (110)-oriented monoclinic $Ga_2O_3$ substrate to epitaxially deposit corundum $AlGaO_3$ structure. Yet a further example is the use of a MgO (100) oriented cubic symmetry substrate to epitaxially deposit (100)-oriented monoclinic $AlGaO_3$ films.

Process 740 can also be used to create corundum $Ga_2O_3$ modified surface 742 by selectively diffusing Ga-atoms into the surface structure provided by the $Al_2O_3$ substrate. This can be done by elevating the growth temperature of the substrate 710 and exposing the $Al_2O_3$ surface to an excess of Ga while also providing an O-atom mixture. For Ga-rich conditions and elevated temperatures Ga-adatoms attach selectively to O-sites and form a volatile sub-oxide $Ga_2O$, and further excess Ga diffuses Ga-adatoms into the $Al_2O_3$ surface. Under suitable conditions a corundum $Ga_2O_3$ surface structure results enabling lattice matching of Ga-rich $AlGaO_3$ corundum constructions or thicker layers can result in monoclinic $AlGaO_3$ crystal symmetry.

Figure 18:
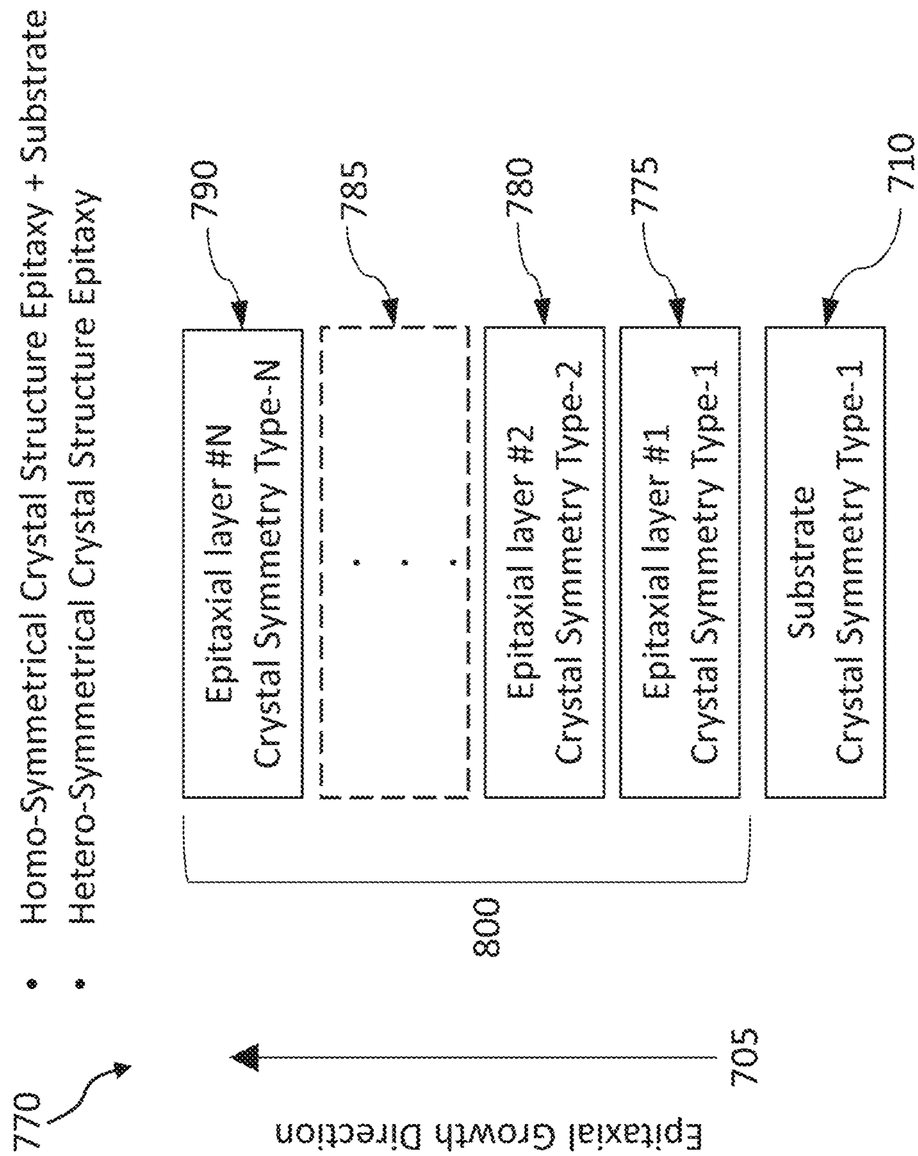
FIG. 18 depicts a buffer layer deposited with the same crystal symmetry as an underlying substrate to enable subsequent hetero-symmetry deposition of oxide materials in accordance with an illustrative embodiment of the present disclosure.

FIG. 18 describes yet another embodiment of a process 770 wherein a buffer layer 775 is deposited on the substrate 710, the buffer layer 775 having the same crystal symmetry type as substrate 710 (Type-1), thereby enabling atomically flat layers to seed alternate crystal symmetry types of layers 780, 785, 790 (Type 2, 3 . . . N). For example, a monoclinic buffer 775 is deposited upon a monoclinic bulk $Ga_2O_3$ substrate 710. Then cubic MgO and NiO layers 780-790 are formed. In this figure, the hetero-symmetrical crystal structure epitaxy with the homo-symmetrical buffer layer is labeled as structure 800.

Figure 19:
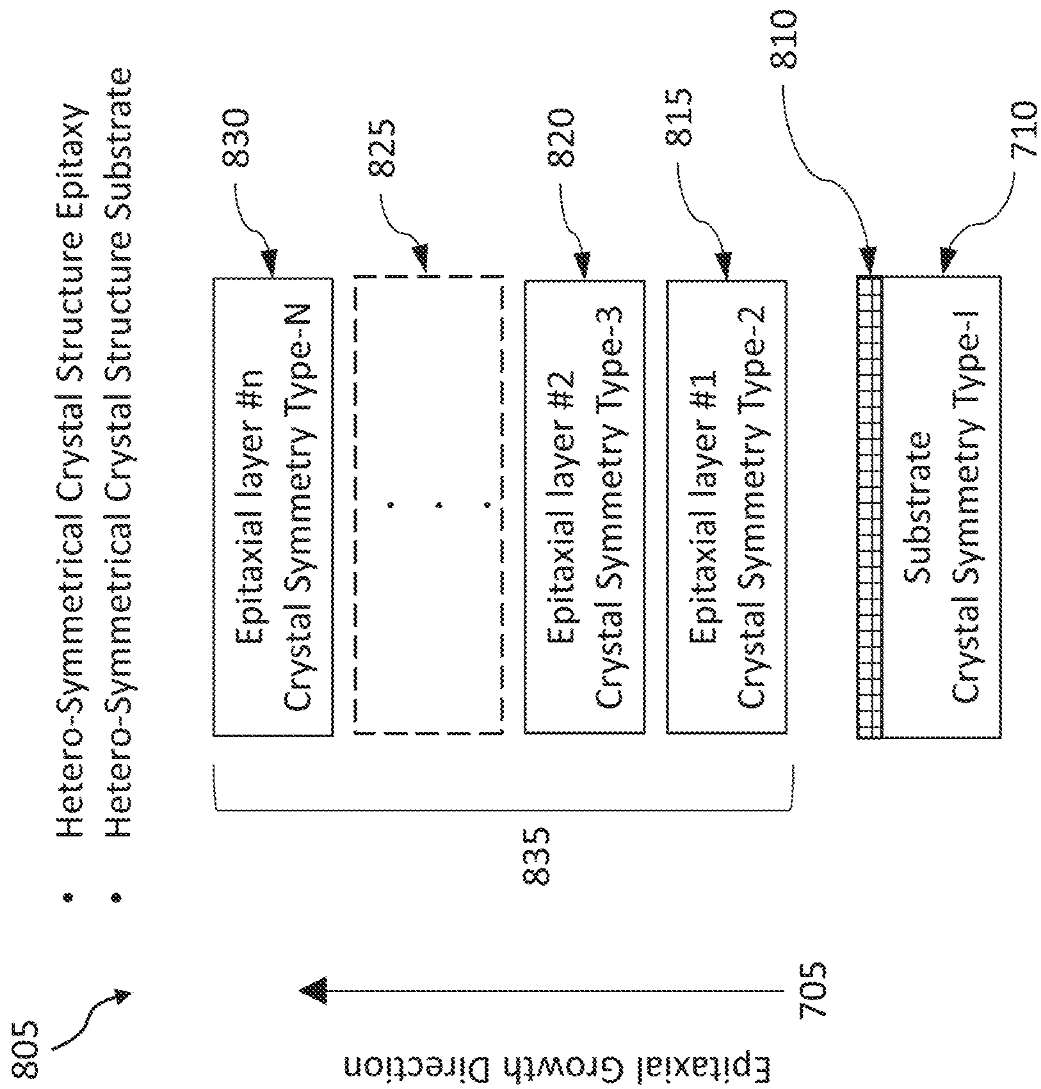
FIG. 19 depicts a structure comprising a plurality of hetero-symmetrical regions sequentially deposited as a function of the growth direction in accordance with an illustrative embodiment of the present disclosure.

FIG. 19 depicts yet a further embodiment of a process 805 showing sequential variation along a growth direction 705 of a plurality of crystal symmetry types. For example, a corundum $Al_2O_3$ substrate 710 (Type-1) creates an O-terminated template 810 which then seeds a corundum $AlGaO_3$ layer 815 of Type-2 crystal symmetry. A hexagonal $AlGaO_3$ layer 820 of Type-3 crystal symmetry can then be formed followed by cubic crystal symmetry type (Type-N) such as a MgO or NiO layer 830. The layers 815, 820, 825 and 830 are collectively labeled in this figure as hetero-symmetrical crystal structure epitaxy 835. Such crystal growth matching is possible using vastly different crystal symmetry type layers if in-plane lattice co-incidence geometry can occur. While rare, this is found to be possible in the present disclosure with (100)-oriented cubic $Mg_xNi_{1-x}O$ ($0 \le x \le 1$) and monoclinic $AlGaO_3$ compositions. This procedure can then be repeated along a growth direction.

Figure 20A:
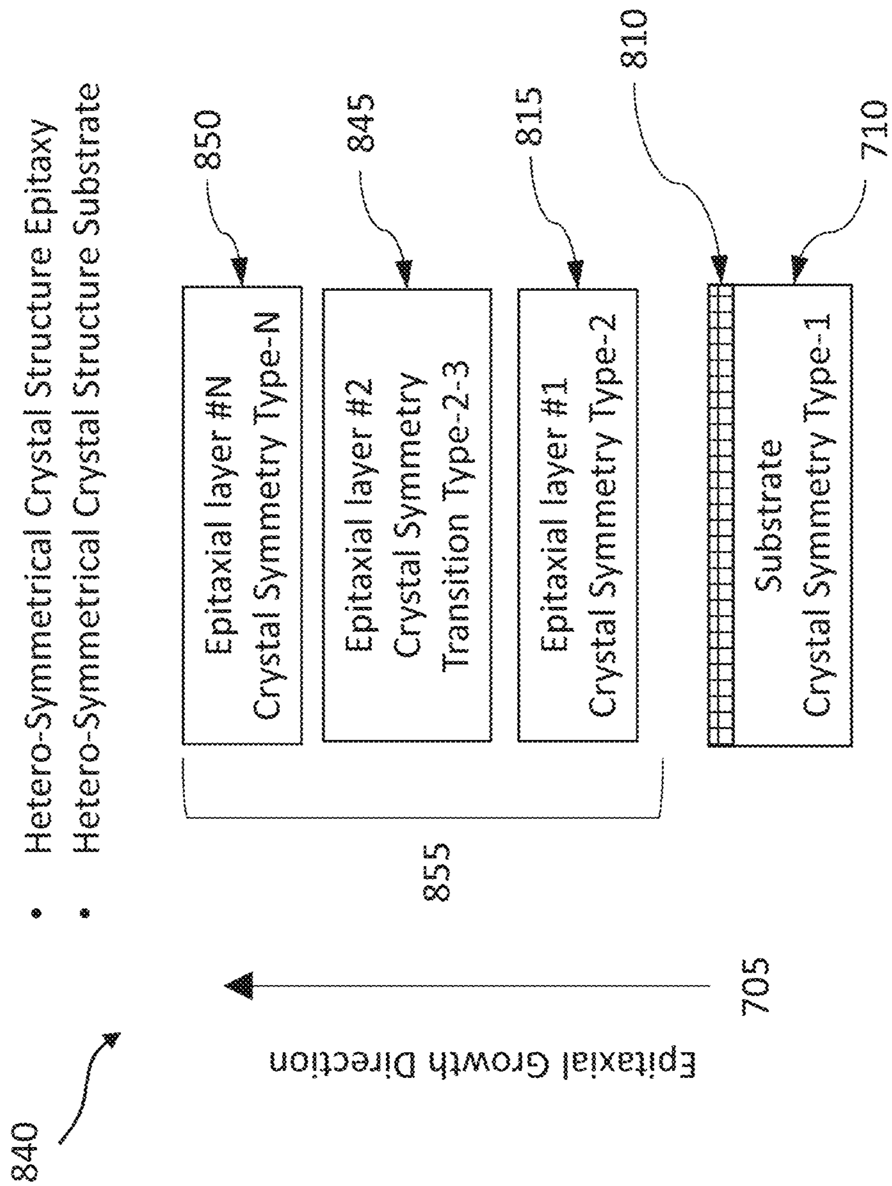
FIG. 20A shows a crystal symmetry transition region linking two deposited crystal symmetry types in accordance with an illustrative embodiment of the present disclosure.

Yet another embodiment is shown in FIG. 20A where the substrate 710 of Type-1 crystal symmetry has a prepared surface (template 810) seeding a first crystal symmetry type 815 (Type-2) which then can be engineered to transition to another symmetry type 845 (Transition Type 2-3) over a given layer thickness. An optional layer 850 can then be grown with yet another crystal symmetry type (Type-N). For example, C-plane sapphire substrate 710 forms a corundum $Ga_2O_3$ layer 815 which then relaxes to a hexagonal $Ga_2O_3$ crystal symmetry type or a monoclinic crystal symmetry type. Further growth of layer 850 then can be used to form a high quality relaxed layer of high crystal structure quality. The layers 815, 845 and 850 are collectively labeled in this figure as hetero-symmetrical crystal structure epitaxy 855.

Figure 20B:
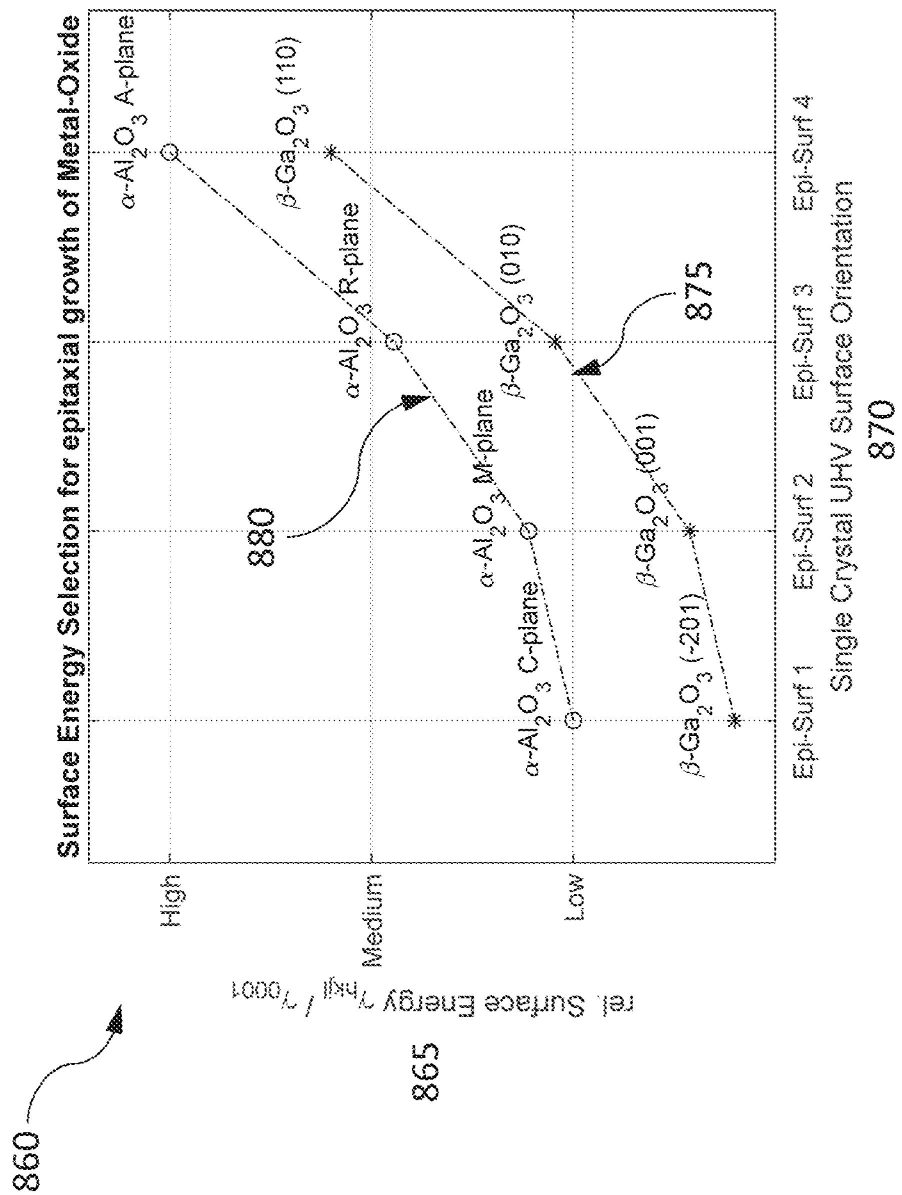
FIG. 20B shows the variation in a particular crystal surface energy as a function of crystal surface orientation for the cases of corundum-Sapphire and monoclinic Gallia single crystal oxide materials in accordance with an illustrative embodiment of the present disclosure.

Referring now to FIG. 20B, there is shown a chart 860 of the variation in a particular crystal surface energy 865 as a function of crystal surface orientation 870 for the cases of corundum-Sapphire 880 and monoclinic Gallia single crystal oxide materials 875. It has been found in accordance with the present disclosure that the crystal surface energy for technologically relevant corundum $Al_2O_3$ 880 and monoclinic substrates can be used to selectively form $AlGaO_3$ crystal symmetry types.

For example, Sapphire C-plane can be prepared under O-rich growth conditions to selectively grow hexagonal $AlGaO_3$ at lower growth temperature (≤650° C.) and monoclinic $AlGaO_3$ at higher temperatures (>650° C.). Monoclinic $AlGaO_3$ is limited to Al % of approximately 45-50% owing to the monoclinic crystal symmetry having approximately 50% tetrahedrally coordinated bonds (TCB) and 50% octahedrally coordinated bonds (OCB). While Ga can accommodate both TCB and OCB, Al seeks in preference the OCB sites. R-plane sapphire can accommodate corundum $AlGaO_3$ compositions with Al % ranging 0-100% grown at low temperatures of less than about 550° C. under O-rich conditions and monoclinic $AlGaO_3$ with Al≤50% at elevated temperatures >700° C.

M-plane sapphire surprisingly provides yet an even more stable surface which can grow exclusively corundum $AlGaO_3$ composition for Al %=0-100%, providing atomically flat surfaces.

Even more surprising is the discovery of A-plane sapphire surfaces presented for $AlGaO_3$ which are capable of extremely low defect density corundum $AlGaO_3$ compositions and superlattices (see discussion below). This result is fundamentally due to the fact that corundum $Ga_2O_3$ and corundum $Al_2O_3$ both share exclusive crystal symmetry structure formed by OCBs. This translates into very stable growth conditions with a growth temperature window ranging from room temperature to 800° C. This clearly shows attention toward crystal symmetry designs that can create new structural forms applicable to LEDs such as UVLEDs.

Similarly, native monoclinic $Ga_2O_3$ substrates with (−201)-oriented surfaces can only accommodate monoclinic $AlGaO_3$ compositions. The Al % for (−201)-oriented films is significantly lower owing to the TCB presented by the growing crystal surface. This does not favor large Al fractions but can be used to form extremely shallow MQWs of $AlGaO_3/Ga_2O_3$.

Surprisingly the (010)- and (001)-oriented surface of monoclinic $Ga_2O_3$ can accommodate monoclinic $AlGaO_3$ structures of exceedingly high crystal quality. The main limitation for $AlGaO_3$ Al % is the accumulation of biaxial strain. Careful strain management in accordance with the present disclosure using $AlGaO_3/Ga_2O_3$ superlattices also finds a limiting Al %≤40%, with higher quality films achieved using (001)-oriented $Ga_2O_3$ substrate. Yet a further example of (010)-oriented monoclinic $Ga_2O_3$ substrates is the extremely high quality lattice matching of $MgGa_2O_4$ (111)-oriented films having cubic crystal symmetry structures.

Similarly, $MgAl_2O_4$ crystal symmetry is compatible with corundum $AlGaO_3$ compositions. It is also found experimentally in accordance with the present disclosure that (100)-oriented $Ga_2O_3$ provides an almost perfect coincidence lattice match for cubic MgO(100) and NiO(100) films. Even more surprising is the utility of (110)-oriented monoclinic $Ga_2O_3$ substrates for the epitaxial growth of corundum $AlGaO_3$.

These unique properties provide for the selective utility of $Al_2O_3$ and $Ga_2O_3$ crystal symmetry type substrates, as an example, with the selective use of crystal surface orientations to offer many advantages for the fabrication of LEDs and in particular UVLED.

In some embodiments, conventional bulk crystal growth techniques may be adopted to form corundum $AlGaO_3$ composition bulk substrates having corundum and monoclinic crystal symmetry types. These ternary $AlGaO_3$ substrates can also prove valuable for application to UVLED devices.

Band Structure Modifiers

Optimizing the $AlGaO_3$ band structure can be achieved by careful attention to the structural deformations of a given crystal symmetry type. For application to a solid-state, and in particular a semiconductor-based electro-optically driven ultraviolet emissive device, the valence band structure (VBS) is of major importance. It is typically the VBS E-k dispersion which determines the efficacy for the creation of optical radiation by direct recombination of electrons and holes. Therefore, attention is now directed toward valence band tuning options for achieving in one example UVLED operation.

Configuring of the Band Structure by Bi-Axial Strain

In some embodiments, selective epitaxial deposition of $AlGaO_3$ crystal structures can be formed under the elastic structural deformation by the use of composition control or by using a surface crystal geometric arrangement that can epitaxially register the $AlGaO_3$ film while still maintaining an elastic deformation of the $AlGaO_3$ unit cell.

Figures 21A, 21B, 21C:
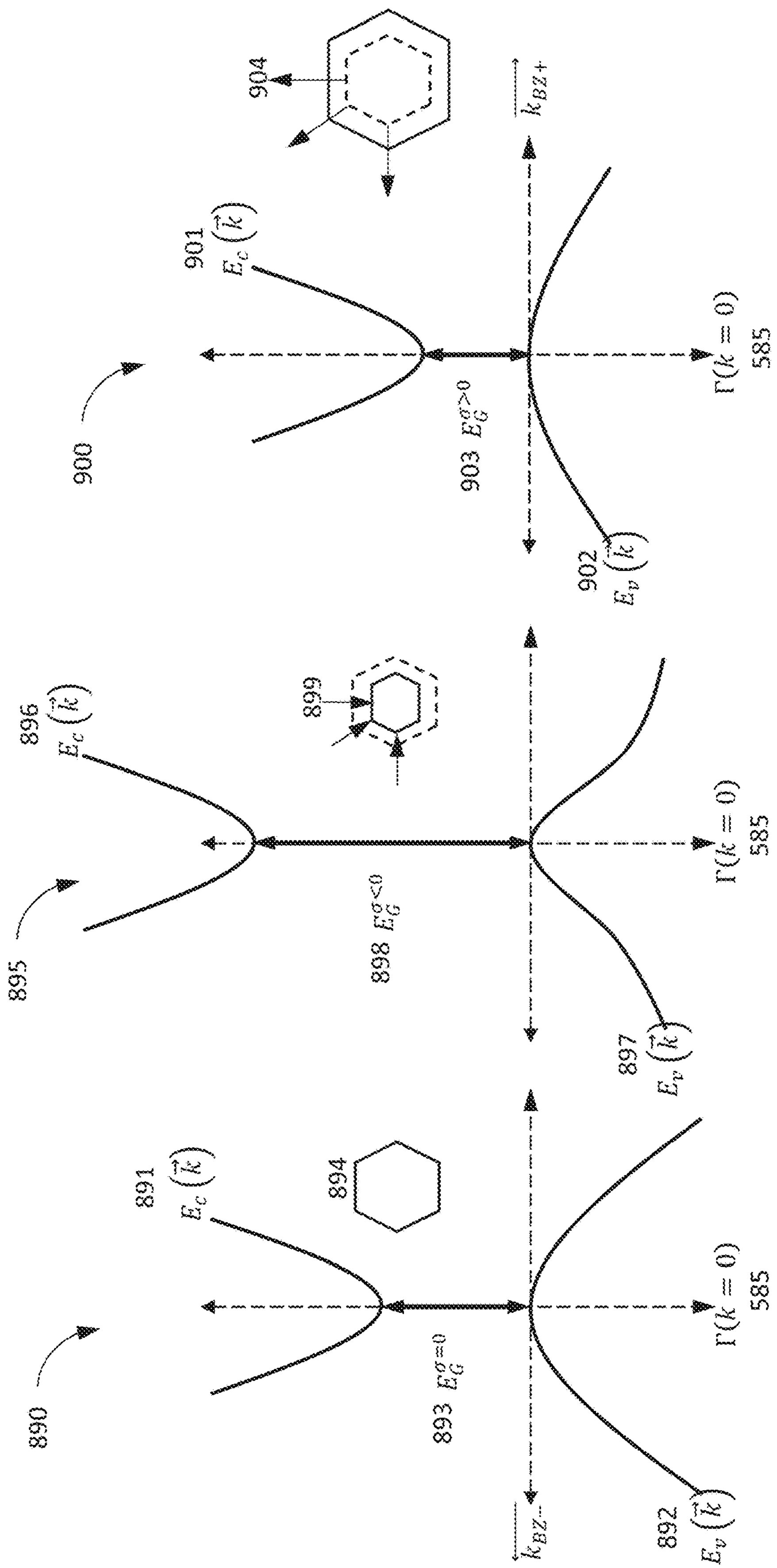
FIGS. 21A-21C depict schematically the change in electronic energy configuration or band structure of a metal oxide semiconductor under the influence of bi-axial strain applied to the crystal unit cell in accordance with an illustrative embodiment of the present disclosure.

For example, FIGS. 21A-21C depict the change in E-k band structure in the vicinity of the Brillouin zone-center (k=0) which favors e-h recombination for generating bandgap energy photons under the influence of bi-axial strain applied to the crystal unit cell. The band structures for both corundum and monoclinic $Al_2O_3$ are direct. Depositing $Al_2O_3$, $Ga_2O_3$ or $AlGaO_3$ thin films onto a suitable surface which can elastically strain the in-plane lattice constant of the film may be achieved and engineered in accordance with the present disclosure.

The lattice constant mismatches between $Al_2O_3$ and $Ga_2O_3$ are shown in Table II of FIG. 43B. The ternary alloys can be roughly interpolated between the end point binaries for the same crystal symmetry type. In general, an $Al_2O_3$ film deposited on a $Ga_2O_3$ substrate conserving crystal orientations will create the $Al_2O_3$ film in biaxial tension, whereas a $Ga_2O_3$ film deposited on an $Al_2O_3$ substrate having the same crystal orientation will be in a state of compression.

The monoclinic and corundum crystals have non-trivial geometric structures with relatively complex strain tensors compared to conventional cubic, zinc-blende or even wurtzite crystals. The general trend observed on E-k dispersion in vicinity of the BZ center is shown in FIGS. 21A-21B. For example, diagram 890 of FIG. 21A describes a c-plane corundum crystal unit cell 894 having a strain free (σ=0) E-k dispersion, with conduction band 891 and valence band 892 separated by a bandgap 893. Biaxial compression of the unit cell 899 in diagram 895 of FIG. 21B changes the dispersion by hydrostatically lifting the conduction band, e.g., see conduction band 896 and warping the E-k curvature of the valence band 897. The compressively strained (σ≤0) bandgap 898 is generally increased $E_G^{\sigma\leq 0}>E_G^{\sigma=0}$.

Conversely, as shown in diagram 900 of FIG. 21C, biaxial tension applied to the unit cell 904 has the effect of reducing the bandgap 903 $E_G^{\sigma\leq 0}\leq E_G^{\sigma=0}$, lowering the conduction band 901 and flattening the valence band curvature 902. As the valence band curvature is directly related to the hole effective mass, a larger curvature decreases the effective hole mass, whereas smaller curvature (i.e., flatter E-k bands) increase the hole effective mass (note: a totally flat valence band dispersion potentially creates immobile holes). Therefore, it is possible to improve the $Ga_2O_3$ valence band dispersion by judicious choice of biaxial strain via the epitaxy on a suitable crystal surface symmetry and in-plane lattice structure.

Configuring of the Band Structure by Uni-Axial Strain

Figure 22B:
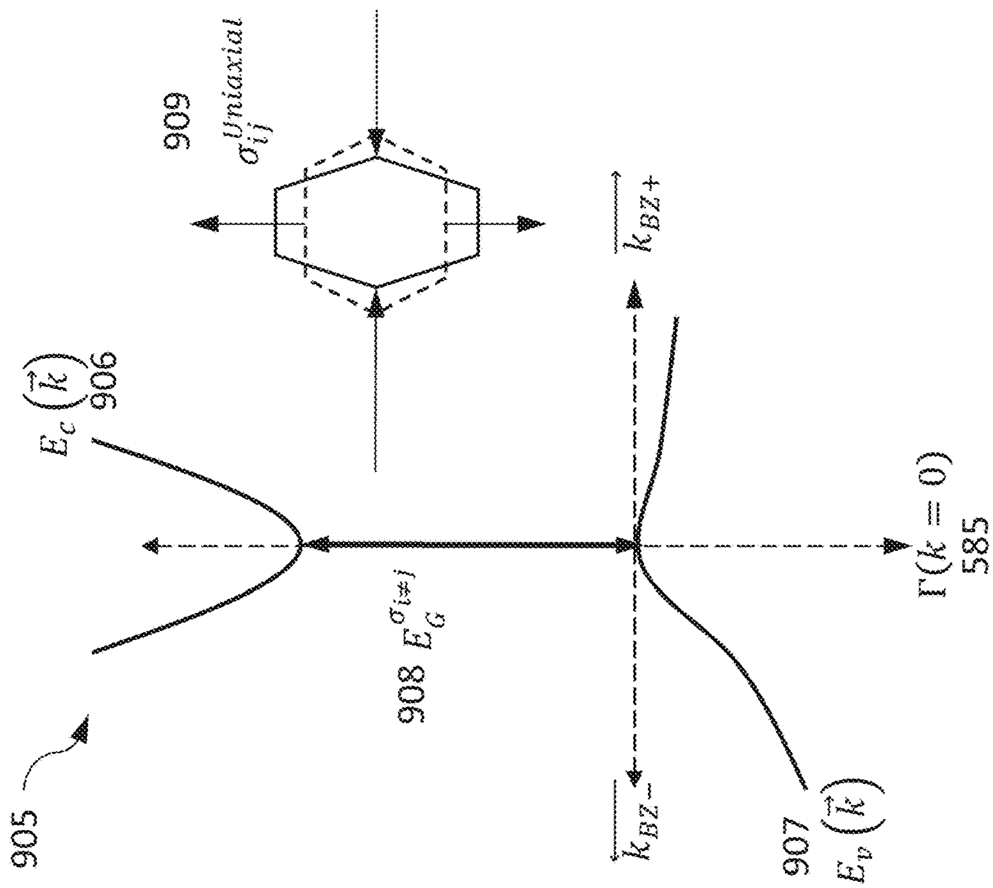
FIGS. 22A and 22B depict schematically the change in band structure of a metal oxide semiconductor under the influence of uniaxial strain applied to the crystal unit cell in accordance with an illustrative embodiment of the present disclosure.
Figure 22A:
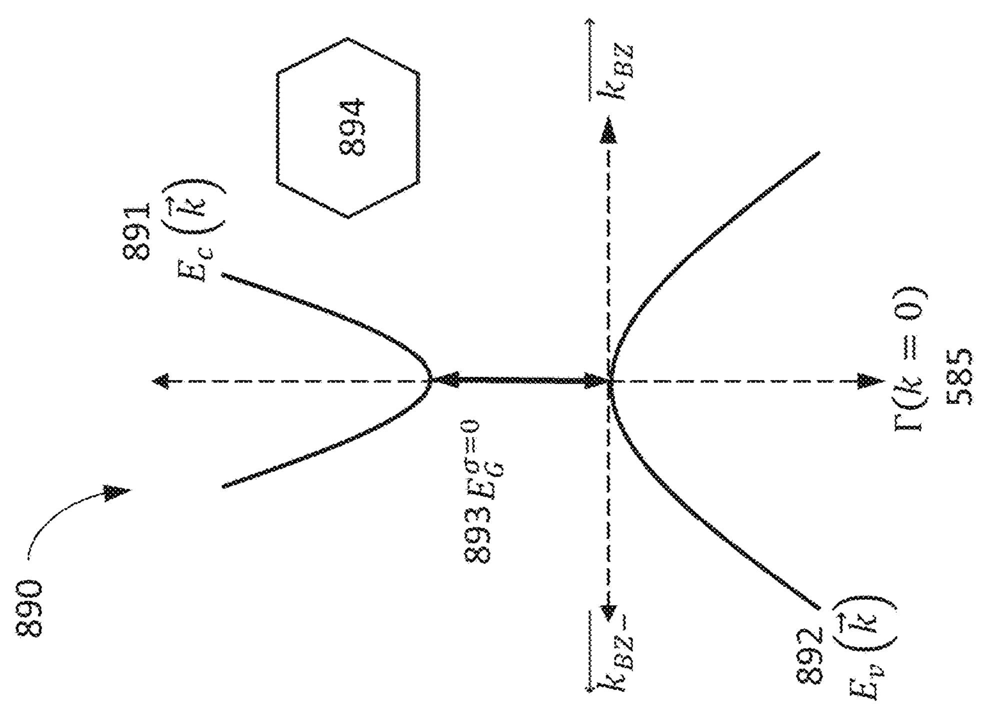

Of particular interest is the possibility of using uniaxial strain to advantageously modify the valence band structure as shown in FIGS. 22A and 22B, where reference numbers in FIG. 22A correspond to those of FIG. 21A. For example, in-plane uniaxial deformation of the unit cell 894 along substantially one crystal direction as shown in unit cell 909 will asymmetrically deform the valence band 907 as shown in diagram 905, which also shows conduction band 906 and bandgap 908.

For the case of monoclinic and corundum crystal symmetry films, similar behavior will occur and can be shown via the growth of elastically strained superlattice structures comprising $Al_2O_3/Ga_2O_3$, $Al_xGa_{1-x}O_3/Ga_2O_3$ and $Al_xGa_{1-x}O_3/Al_2O_3$ on $Al_2O_3$ and $Ga_2O_3$, substrates. Such structures have been grown in relation to the present disclosure, and the critical layer thickness (CLT) was found to depend on the surface orientation of the substrate and be in the range of 1-2 nm to about 50 nm for binary $Ga_2O_3$ on Sapphire. For monoclinic $Al_xGa_{1-x}O_{3\ x}$, x≤10% the CLT can exceed 100 nm on $Ga_2O_3$.

Uniaxial strain can be implemented by growth on crystal symmetry surface with surface geometries having asymmetric surface unit cells. This is achieved in both corundum and monoclinic crystals under various surface orientations as described in FIG. 20B, although other surface orientation and crystals are also possible, for example, MgO(100), $MgAl_2O_4$(100), 4H—SiC(0001), ZnO(111), $Er_2O_3$(222) and AlN(0002) among others.

Figures 23A, 23B, 23C:
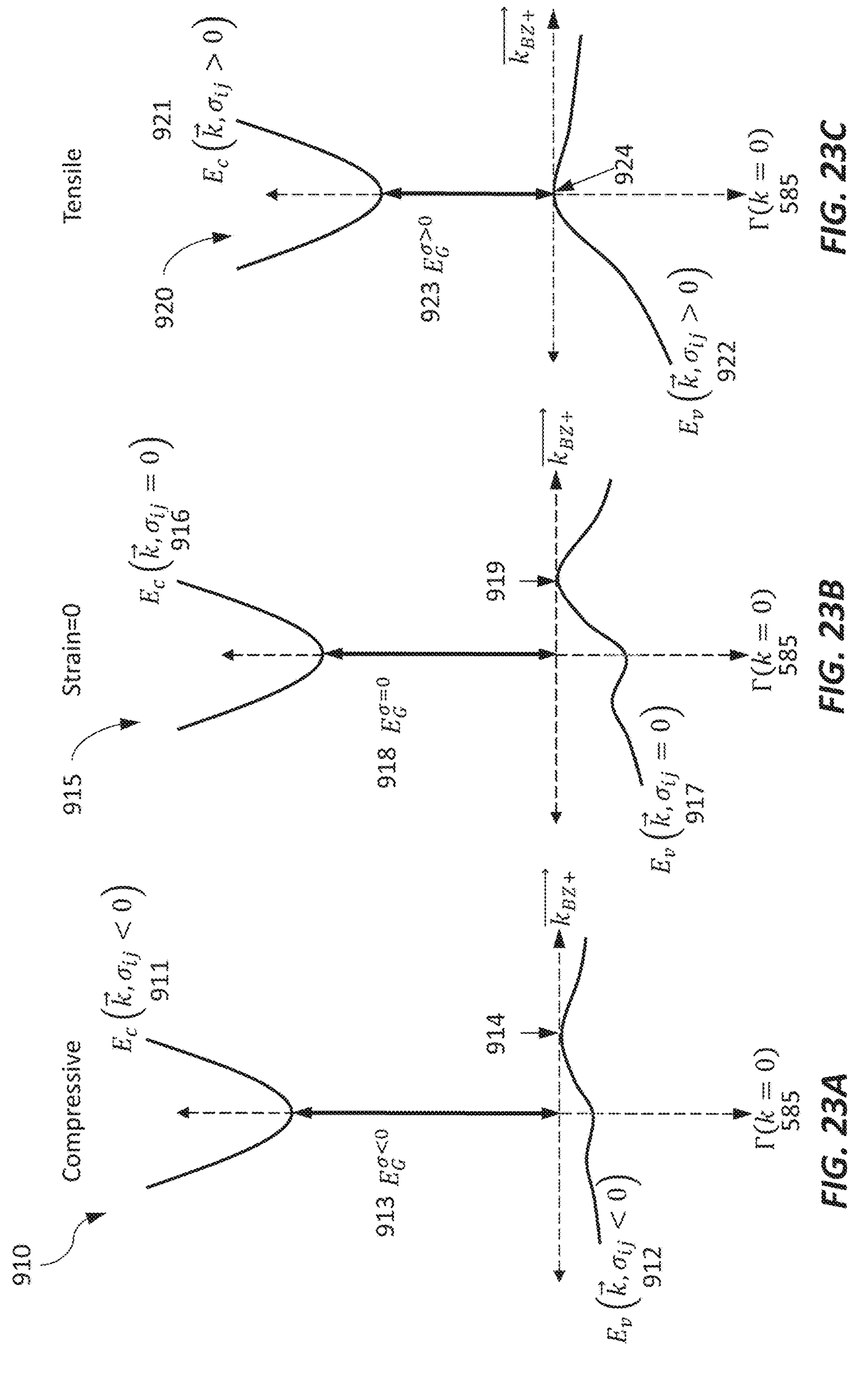
FIGS. 23A-23C show the effect on the band structure of monoclinic gallium-oxide as a function of applied uniaxial strain to the crystal unit cell in accordance with an illustrative embodiment of the present disclosure.

FIG. 22B shows the advantageous deformation of the valence band structure for the case of a direct bandgap. For the case of an indirect bandgap E-k dispersion, such as, thin monolayered monoclinic $Ga_2O_3$, the valence band dispersion can be tuned from an indirect to a direct band gap as shown in FIG. 23A or 23B transitioning to FIG. 23C. Consider the strain-free band structure 915 of FIG. 23B having conduction band 916, valence band 917, bandgap 918 and valence band maximum 919. Similarly, compressive structure 910 of FIG. 23A shows conduction band 911, valence band 912, bandgap 913 and valence band maximum 914. Tensile structure 920 of FIG. 23C shows conduction band 921, valence band 922, bandgap 923 and valence band maximum 924. Detailed calculations and experimental angle resolved photoelectron spectroscopy (ARPES) can show that compressive and tensile strain applied to thin films of $Ga_2O_3$ can warp the valence band as shown in structures 910 and 920 for the cases of compressive (valence band 912) and tensile (valence band 922) uniaxial strain applied along the b-axis or c-axis of the monoclinic $Ga_2O_3$ unit cell.

As shown by these figures, strain plays an important role which typically will require management for complex epitaxy structure. Failure to manage the strain accumulation is likely to result in relief of the elastic energy within the unit cell by the creation of dislocations and crystallographic defects which reduce the efficiency of the UVLED.

Configuration of the Band Structure by Application of Post Growth Stress

While the above techniques involve the introduction of stresses in the form of uni-axial or bi-axial strain during forming of the layers, in other embodiments external stress may be applied following formation or growing of the layers or layers of metal oxide to configure the band structure as required. Illustrative techniques that may be adopted to introduce these stresses are disclosed in U.S. Pat. No. 9,412,911.

Configuration of the Band Structure by Selection of Compositional Alloy

Figure 24B:
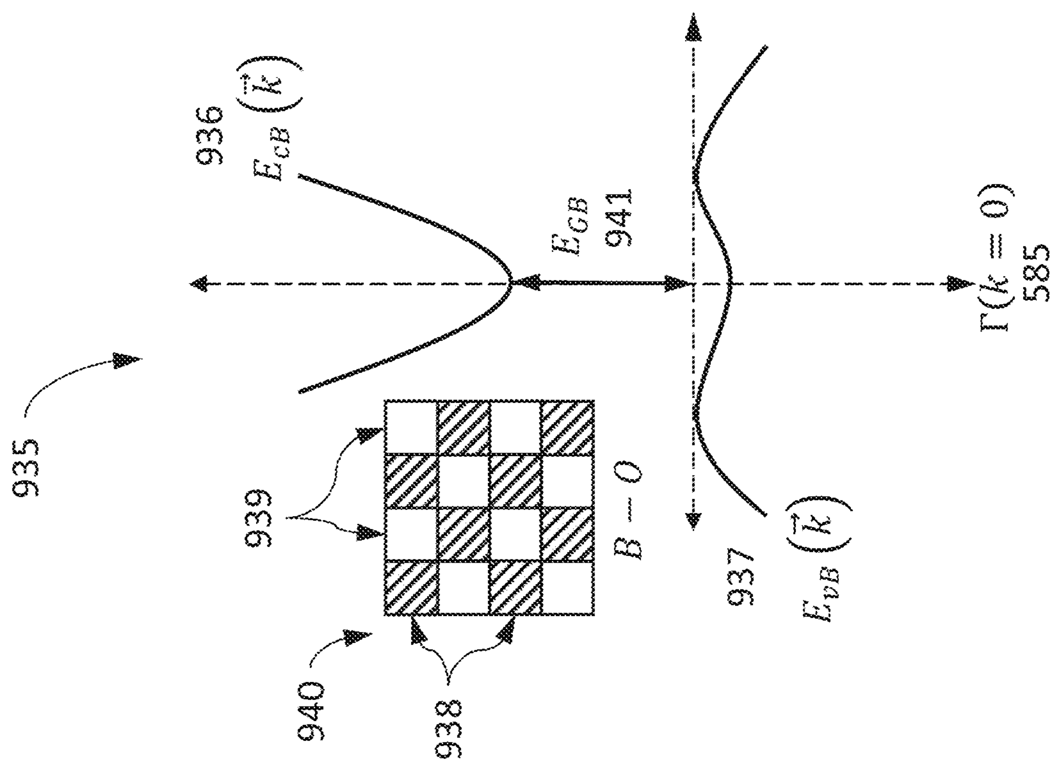
FIGS. 24A and 24B depict the E-k electronic configuration of two dissimilar binary metal oxides in accordance with an illustrative embodiment of the present disclosure: one having a wide direct-bandgap material and the other a narrow indirect-bandgap material.
Figure 24A:
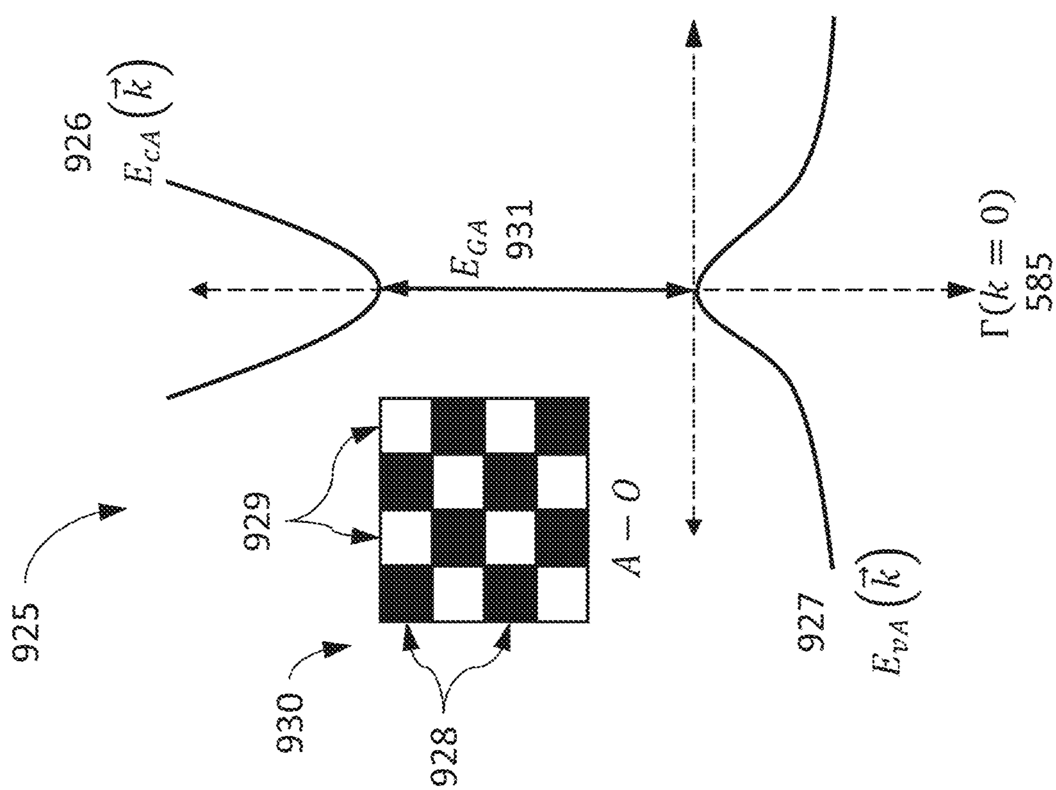

Yet another mechanism which is utilized in the present disclosure and applied to optically emissive metal oxide based UVLEDs is the use of compositional alloying to form ternary crystal structures with a desirable direct bandgap. In general, two distinct binary oxide material compositions are shown in FIGS. 24A and 24B. Band structure 925 comprises metal oxide A-O with crystal structure material 930 built from metal atoms 928 and oxygen atoms 929 having conduction band 926, valence band dispersion 927 and direct bandgap 931. Another binary metal oxide B—O has a crystal structure material 940 built from a different metal cation 938 of type B and oxygen atoms 939 and has an indirect band structure 935 with conduction band 936, bandgap 941 and valence band dispersion 937. In this example, the common anion is oxygen, and both A-O and B—O have the same underlying crystal symmetry type.

Figures 25A, 25B, 25C:
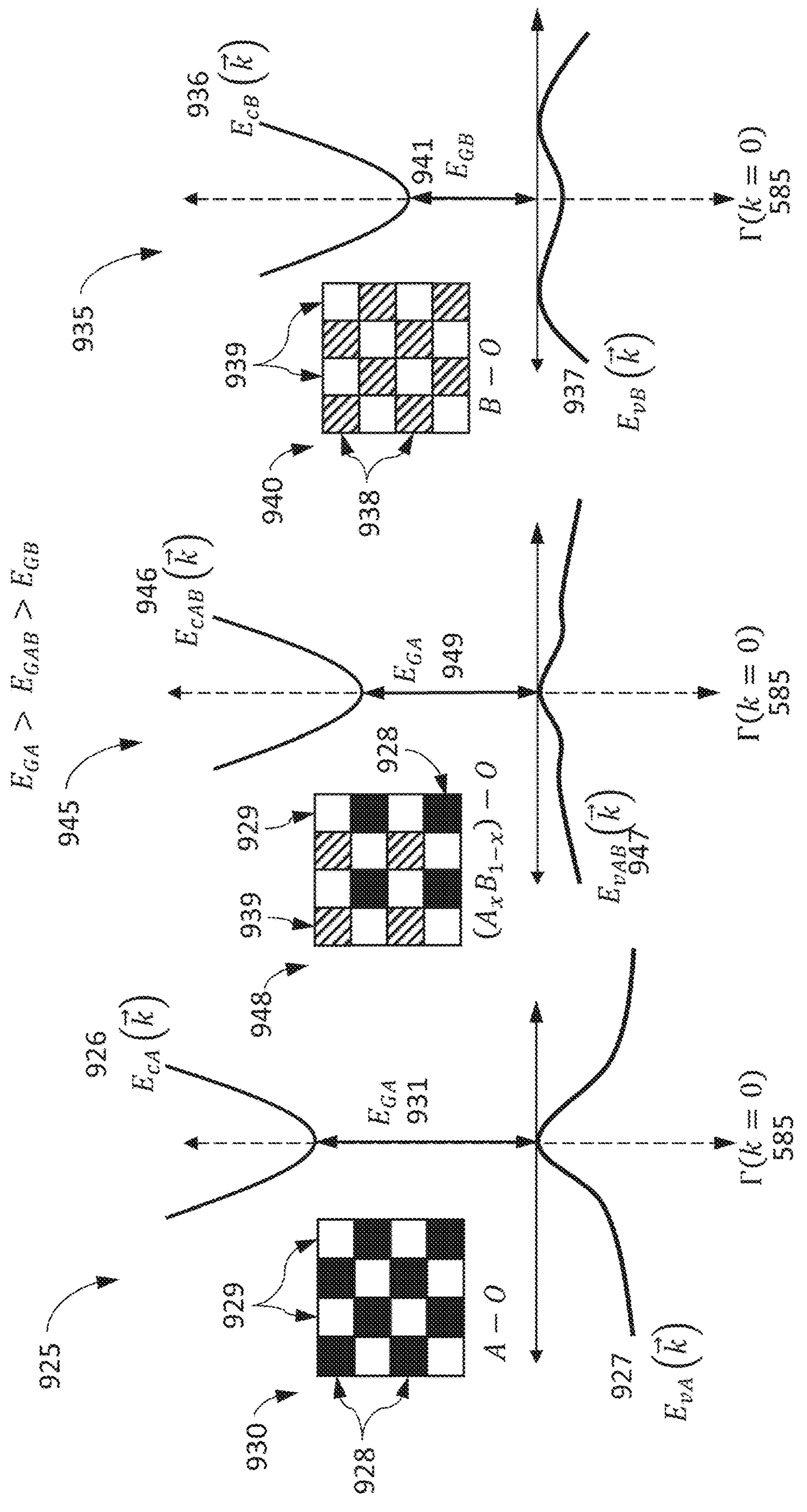
FIGS. 25A-25C show the effect of valence band mixing of two binary dissimilar metal oxide materials that together form a ternary metal oxide alloy in accordance with an illustrative embodiment of the present disclosure.

In the case where a ternary alloy may be formed by mixing cation sites with metal atoms A and B within an otherwise similar oxygen matrix to form $(A\text{-}O)_x(B\text{—}O)_{1-x}$ this will result in an $A_xB_{1-x}O$ composition with the same underlying crystal symmetry. $O_n$ this basis, it is then possible to form a ternary metal oxide with valence band mixing effect as shown in FIG. 25B (Note: FIGS. 25A and 25C reproduce FIGS. 24A and 24B). The direct valence band dispersion 927 of A-O crystal structure material 930 alloyed with B—O crystal structure material 940 having indirect valence band dispersion 937 can produce a ternary material 948 that exhibits improved valence band dispersion 947, and having conduction band 946 and bandgap 949. That is, atomic species A of material 930 incorporated into B-sites of material 940 can augment the valence band dispersion. Atomistic Density Functional Theory calculations can be used to simulate this concept which will fully account for the pseudopotentials of the constituent atoms, strain energy and crystal symmetry.

Accordingly, alloying corundum $Al_2O_3$ and $Ga_2O_3$ can result in a direct bandgap for the band structure of the ternary metal oxide alloy and can also improve the valence band curvature of monoclinic crystal symmetry compositions.

Configuration of the Band Structure by Selection of Digital Alloy Fabrication

Figure 27B:
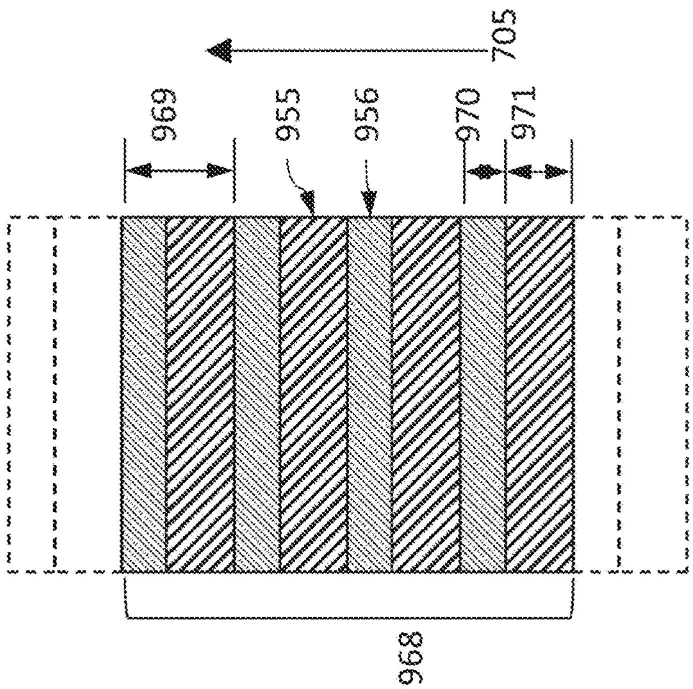
FIGS. 27A-27B show an effect of a superlattice (SL) in one dimension on the E-k configuration for a layered structure having a superlattice period equal to approximately twice the bulk lattice constant of the host metal oxide semiconductors, depicting the creation of a superlattice Brillouin-zone that opens an artificial bandgap at a zone center in accordance with an illustrative embodiment of the present disclosure.
Figure 27A:
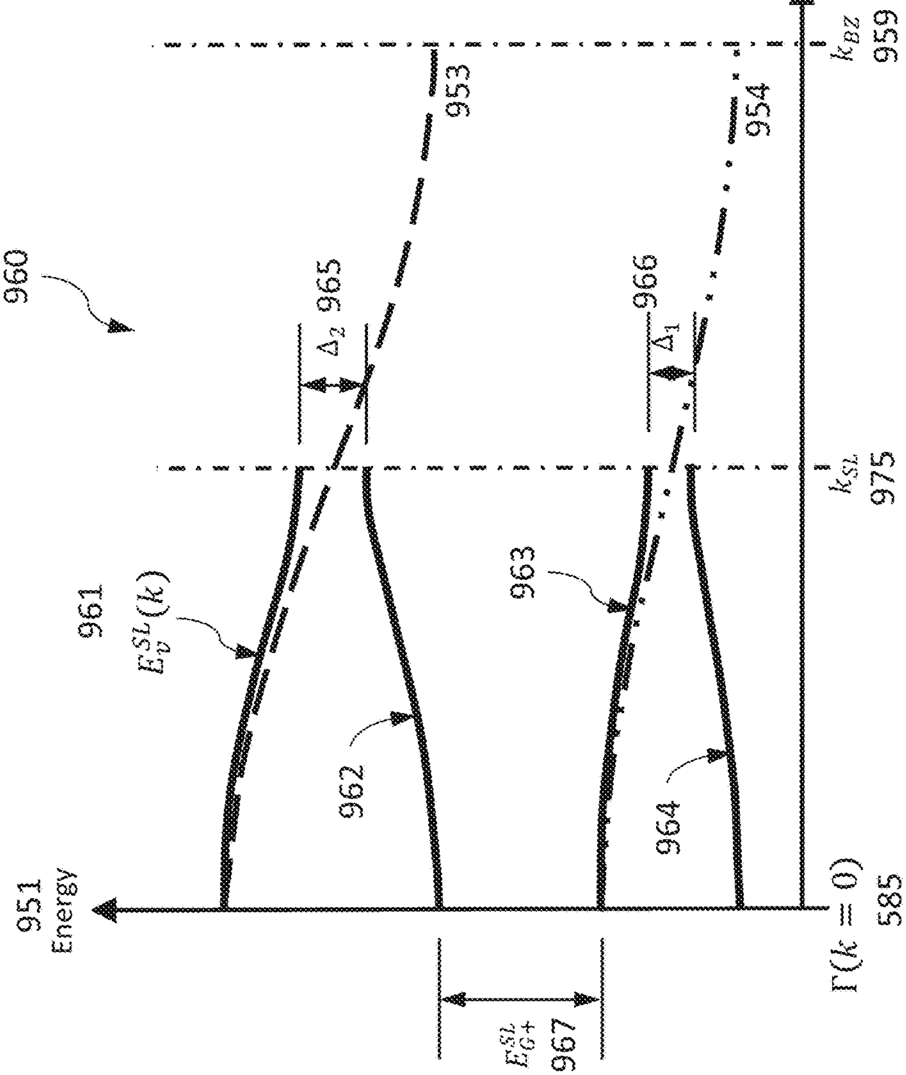

While ternary alloy compositions such as $AlGaO_3$ are desirable, an equivalent method for creating a ternary alloy is by the use of digital alloy formation employing superlattices (SLs) built from periodic repetitions of at least two dissimilar materials. If the each of the layers comprising the repeating unit cell of the SL are less than or equal to the electron de Broglie wavelength (typically about 0.1 to 10's of nm) then the superlattice periodicity forms a 'mini-Brillouin zone' within the crystal band structure as shown in FIG. 27A. In effect, a new periodicity is superimposed over the inherent crystal structure by the formation of the predetermined SL structure. The SL periodicity is typically in the one-dimension of the epitaxial film formation growth direction.

Figure 26:
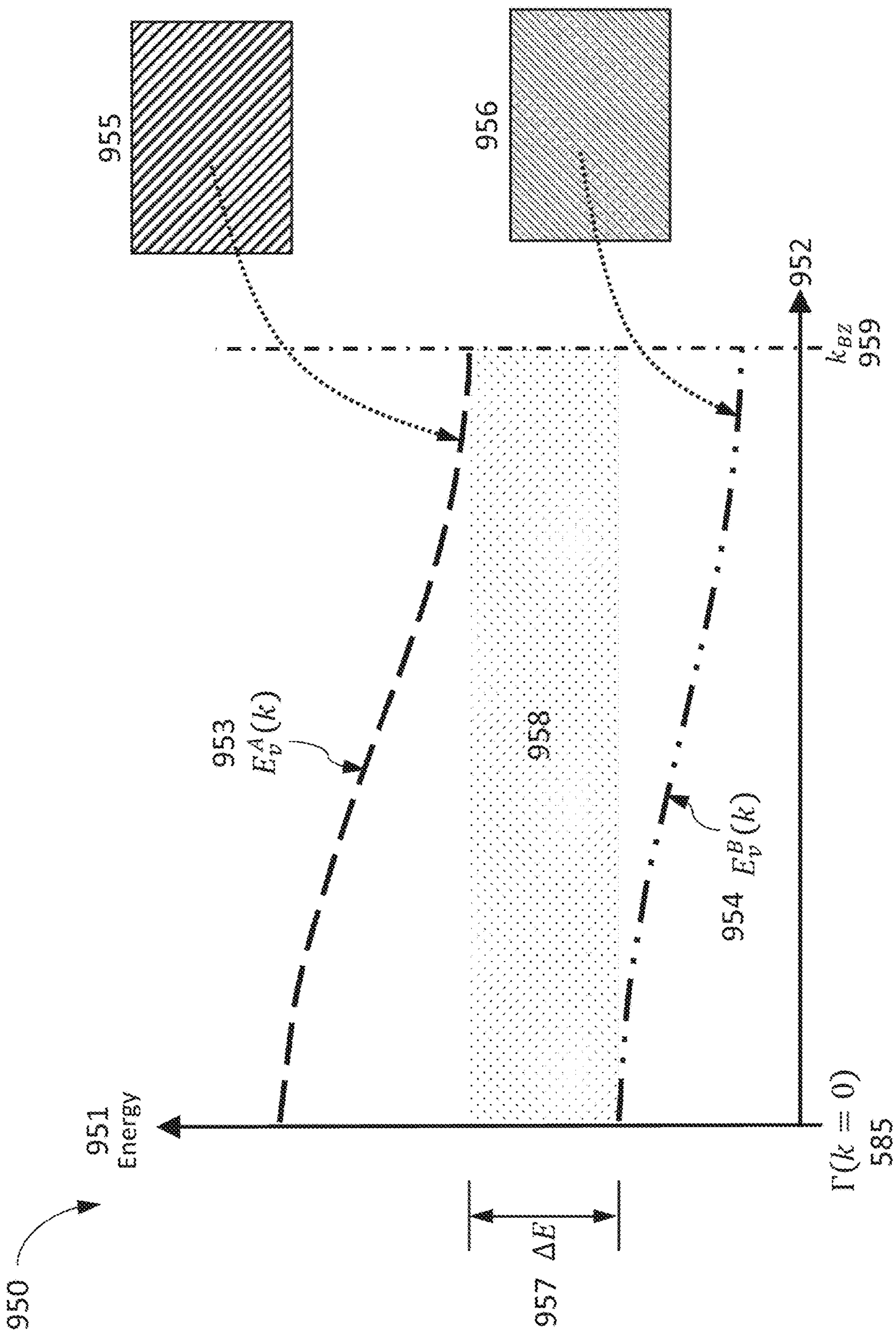
FIG. 26 depicts schematically a portion of the energy-vs-crystal momentum of dominant valence bands sourced from two bulk-like metal oxide semiconductor materials up to the first Brillouin zone in accordance with an illustrative embodiment of the present disclosure.

In the graph 950 of FIG. 26, consider the valence band states 953 native to material 955, and valence band states 954 from material 956. The E-k dispersion shows an energy gap 957 along the energy axis 951 for region 958, and a first Brillouin zone edge 959 relative to k=0. Region 958 is a forbidden energy gap (ΔE) between the energy band states 953 and 954, which are the bulk-like energy bands of materials 955 and 956. If material A and B form a superlattice 968 as shown in FIG. 27B and the SL period $L_{SL}$ is selected to be a multiple (e.g., $L_{SL}=2a_{AB}$) of the average lattice constant $a_{AB}$ of A and B, then new states 961, 962, 963 and 964 are generated as shown in FIG. 27A. The superlattice energy potential therefore creates a SL band gap 967 at k=0. This effectively folds the energy band 953 from the first bulk Brillouin zone edge 959 to k=0. That is, when making a superlattice using the two materials 955 and 956 into ultrathin layers (thicknesses 970 and 971, respectively) forming a periodic repeating unit 969, the original bulk-like valence band states 953 and 954 are folded into new energy band states 961, 962 and 963 and 964. Stated another way, the superlattice potential creates a new energy dispersion structure comprising band states 961, 962, 963 and 964. As the superlattice period imposes a new spatial potential, the Brillouin zone is contracted to wavevector 975.

This type of SL structure in FIG. 27B can be created using bi-layered pairs comprising in different examples: $Al_xGa_{1-x}O/Ga_2O_3$, $Al_xGa_{1-x}O_3/Al_2O_3$, $Al_2O_3/Ga_2O_3$ and $Al_xGa_{1-x}O_3/Al_yGa_{1-y}O_3$.

The general use of SLs to configure an optoelectronic device is disclosed in U.S. Pat. No. 10,475,956.

Figure 27C:
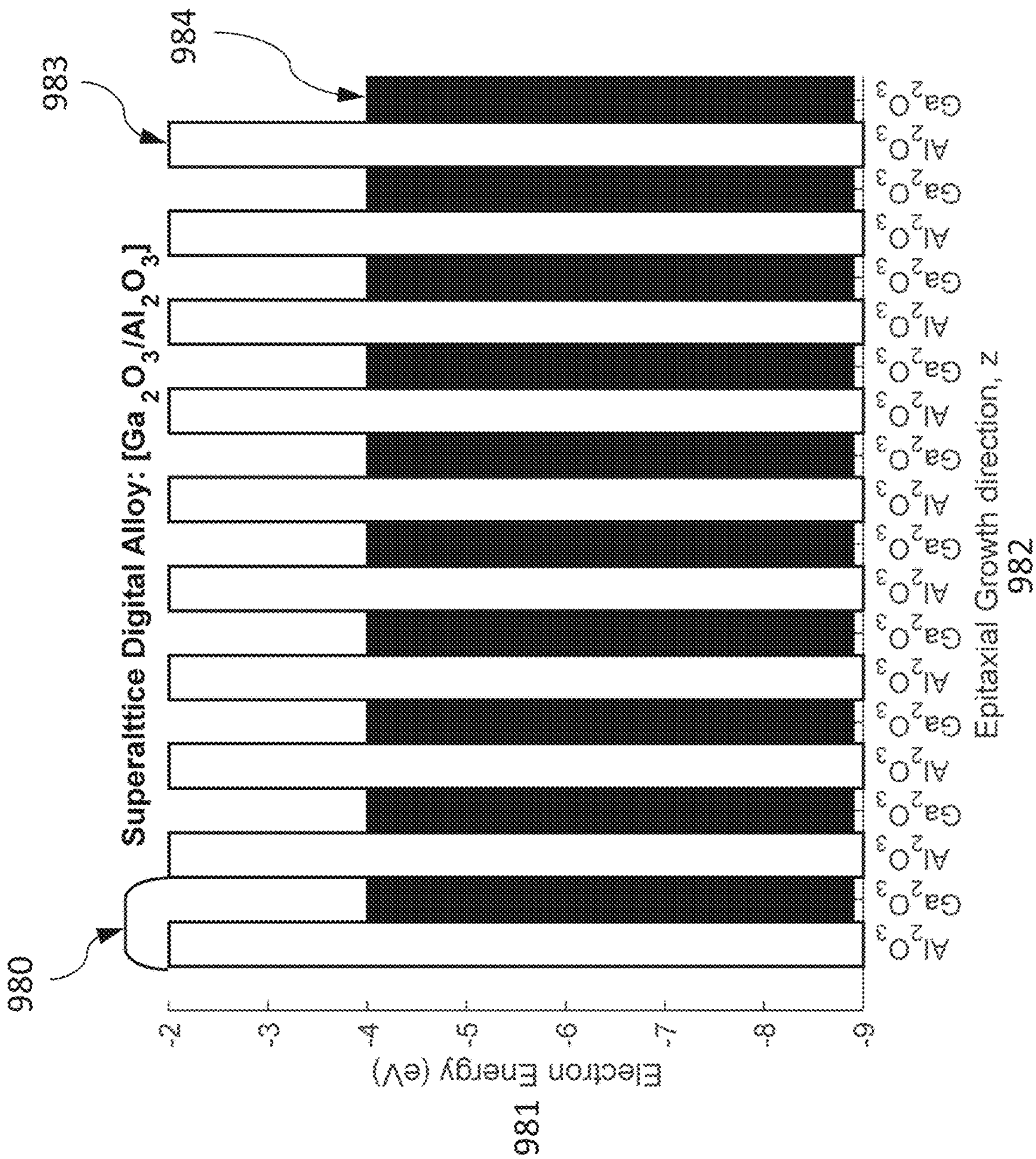
FIG. 27C shows a bi-layered binary superlattice comprising a plurality of thin epitaxial layers of $Al_2O_3$ and $Ga_2O_3$ repeating with a fixed unit cell period where the digital alloy simulates an equivalent ternary $Al_xGa_{1-x}O_3$ bulk alloy depending on the constituent layer thickness ratio of the superlattice period in accordance with an illustrative embodiment of the present disclosure.

FIG. 27C shows the SL structure for the case of a digital binary metal oxide comprising $Al_2O_3$ layers 983 and $Ga_2O_3$ layers 984. The structure is shown in terms of electron energy 981 as a function of epitaxial growth direction 982. The period of the SL forming the repeating unit cell 980 is repeated in integer or half-integer repetitions. For example, the number of repetitions can vary from 3 or more periods and even up to 100 or 1000 or more. The average Al % content of the equivalent digital alloy $Al_xGa_{1-x}O$ is calculated as $$x_{Al}^{SL} = \frac{L_{Al_2O_3}}{L_{Al_2O_3} + L_{Ga_2O_3}},$$

where $L_{Al_2O_3}$ is the layer thickness of $Al_2O_3$ and $L_{Ga_2O_3}$=thickness of $Ga_2O_3$ layer.

Figure 27D:
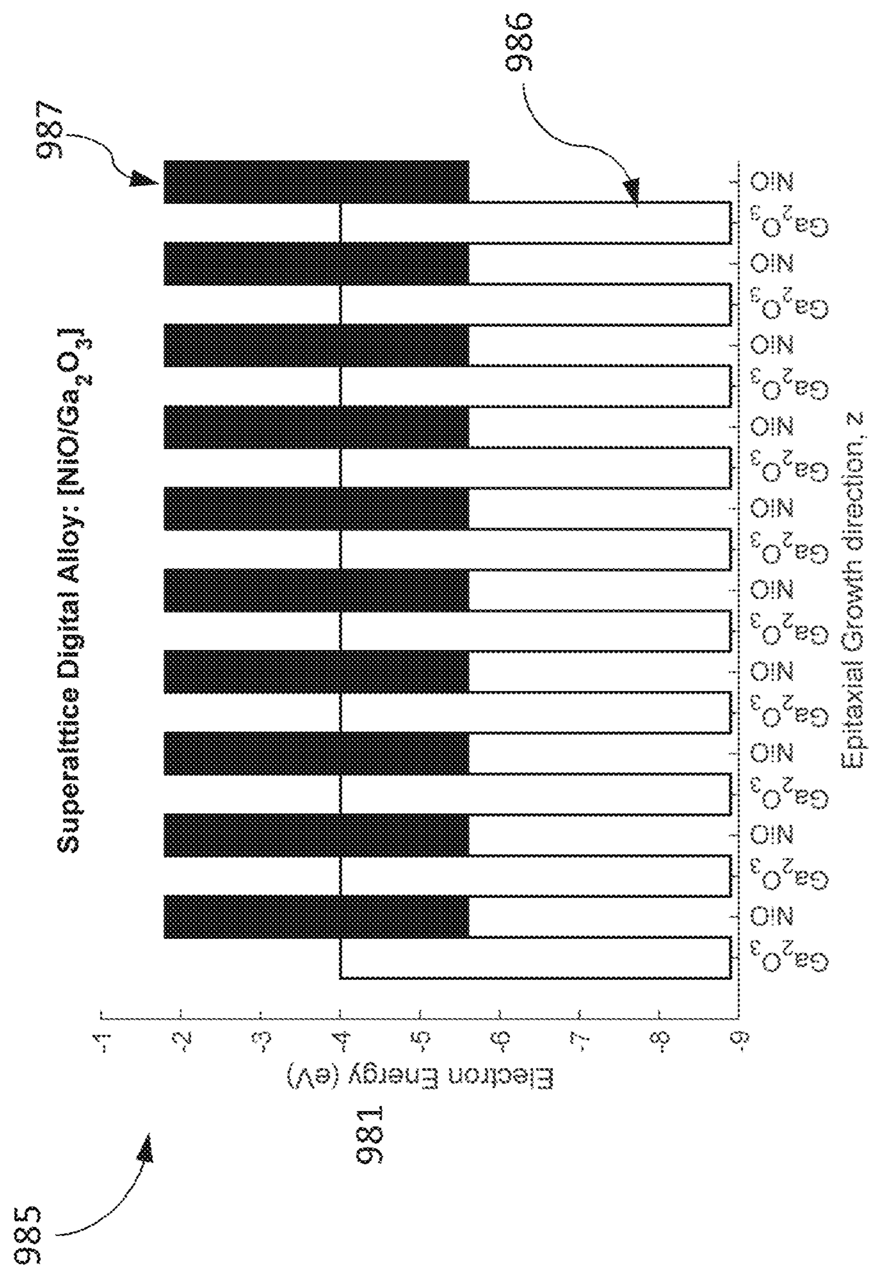
FIG. 27D shows another bi-layered binary superlattice comprising a plurality of thin epitaxial layers of NiO and $Ga_2O_3$ repeating with a fixed unit cell period where the digital alloy simulates an equivalent ternary $(NiO)_x(Ga_2O_3)_{1-x}$ bulk alloy depending on the constituent layer thickness ratio of the superlattice period in accordance with an illustrative embodiment of the present disclosure.
Figure 27E:
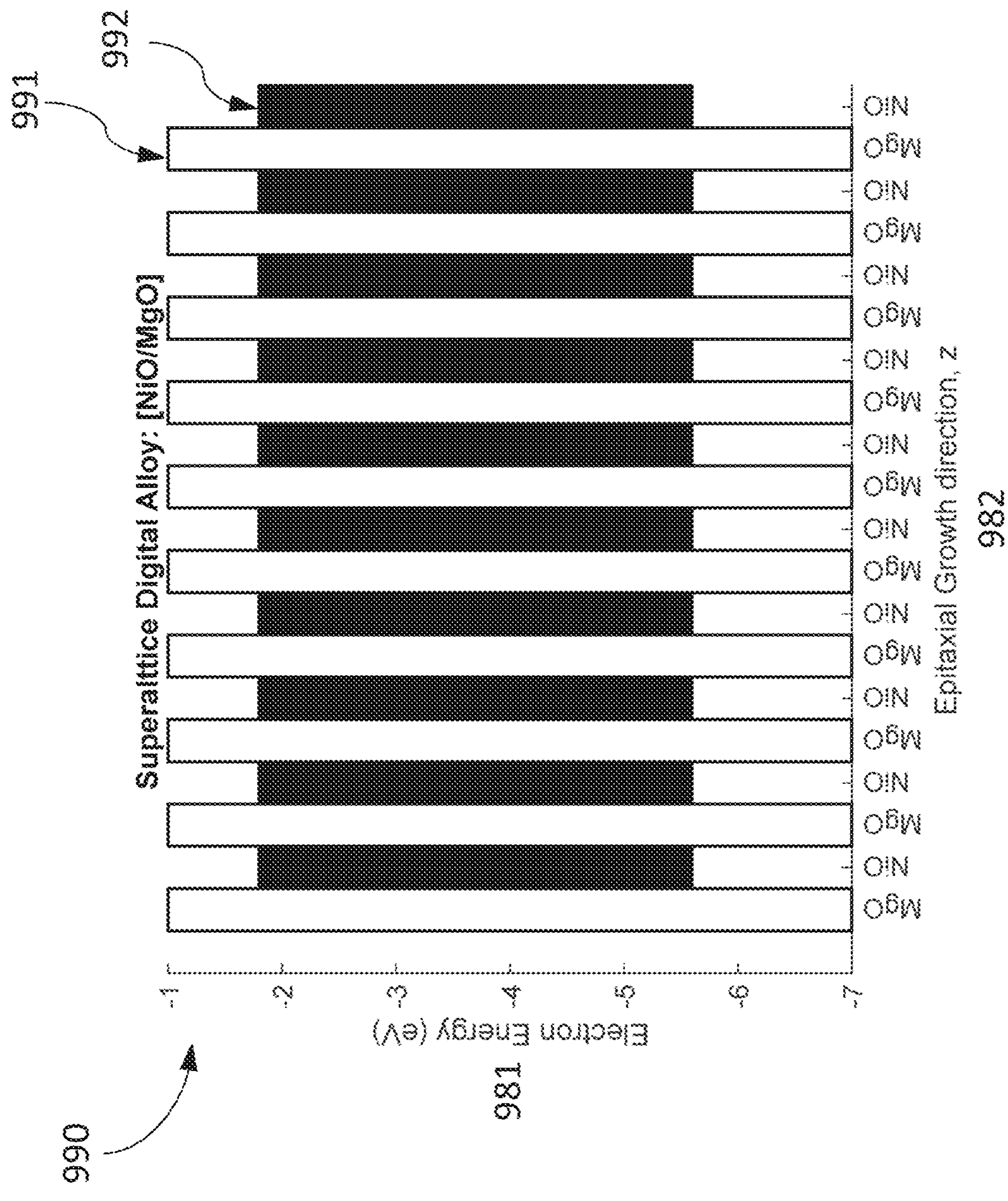
FIG. 27E shows yet another triple material binary superlattice comprising a plurality of thin epitaxial layers of MgO, NiO repeating with a fixed unit cell period where the digital alloy simulates an equivalent ternary bulk alloy $(NiO)_x(MgO)_{1-x}$ depending on the constituent layer thickness ratio of the superlattice period and where the binary metal oxides used for the repeating unit are each selected to vary from between 1 to 10 unit cells in thickness respectively to together comprise the unit cell of the SL in accordance with an illustrative embodiment of the present disclosure.
Figure 27F:
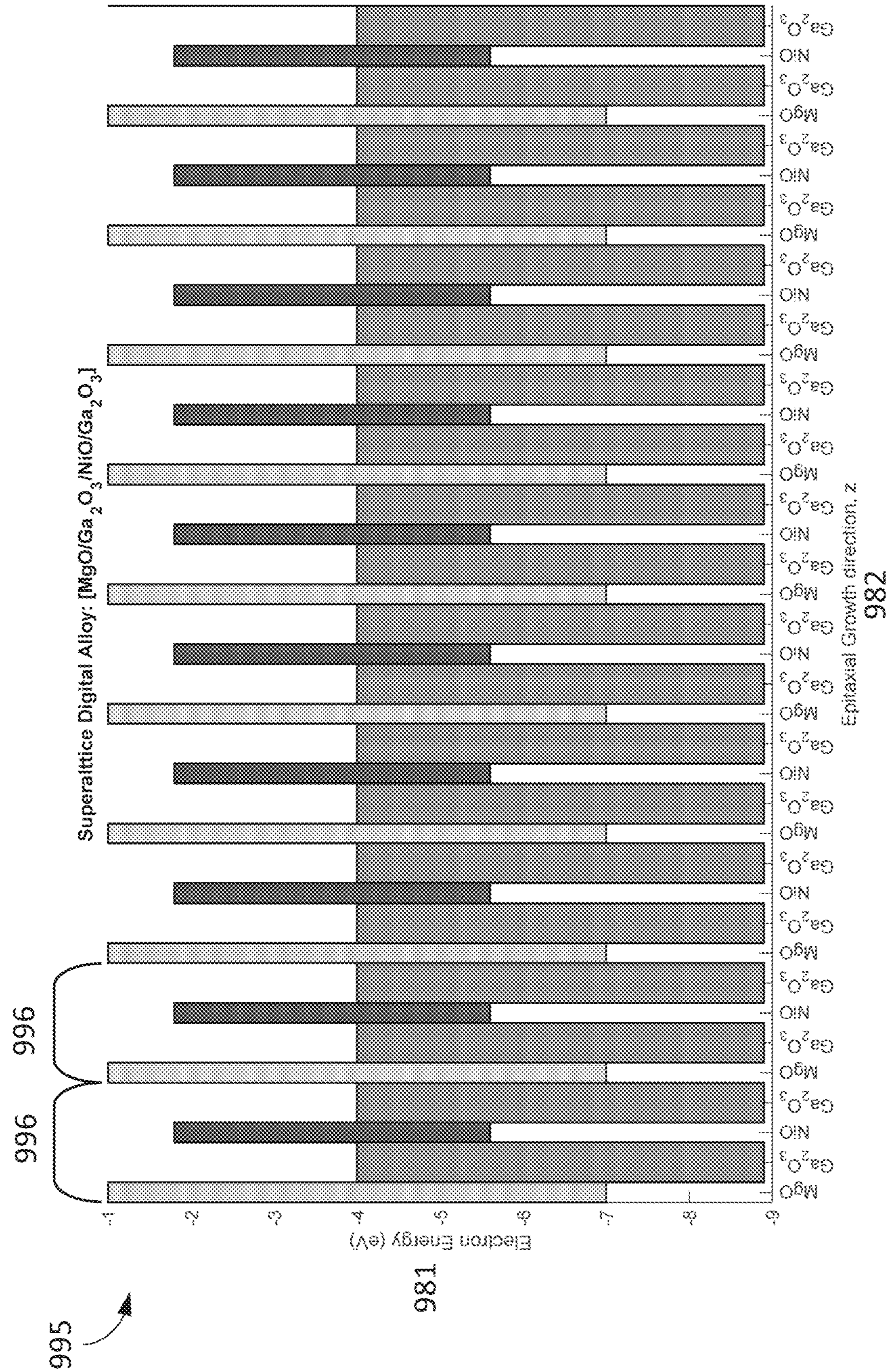
FIG. 27F shows yet another possible four-material binary superlattice comprising plurality of thin epitaxial layers of MgO, NiO and $Ga_2O_3$ repeating with a fixed unit cell period where the digital alloy simulates an equivalent quaternary bulk alloy $(NiO)_x(Ga_2O_3)_y(MgO)_z$ depending on the constituent layer thickness ratio of the superlattice period where the binary metal oxides used for the repeating unit are each selected to vary from between 1 to 10 unit cells in thickness respectively to comprise the unit cell of the SL in accordance with an illustrative embodiment of the present disclosure.

Yet further examples of SL structures possible are shown in FIGS. 27D-27F.

The digital alloy concept can be expanded to other dissimilar crystal symmetry types, for example cubic NiO 987 and monoclinic $Ga_2O_3$ 986 as shown in FIG. 27D where the digital alloy 985 simulates an equivalent ternary $(NiO)_x(Ga_2O_3)_{1-x}$ bulk alloy.

Yet a further example is shown in digital alloy 990 of FIG. 27E using cubic MgO layers 991 and cubic NiO layers 992 comprising the SL. In this example, MgO and NiO have a very close lattice match, unlike $Al_2O_3$ and $Ga_2O_3$ which are high lattice mismatched.

A four layer period SL996 is shown in the digital alloy 995 of FIG. 27F where cubic MgO and NiO with oriented growth along (100) can coincidence lattice match for (100)-oriented monoclinic $Ga_2O_3$. Such a SL would have an effective quaternary composition of $Ga_xNi_yMg_zO_n$.

Al—Ga-Oxide Band Structures

Figure 29:
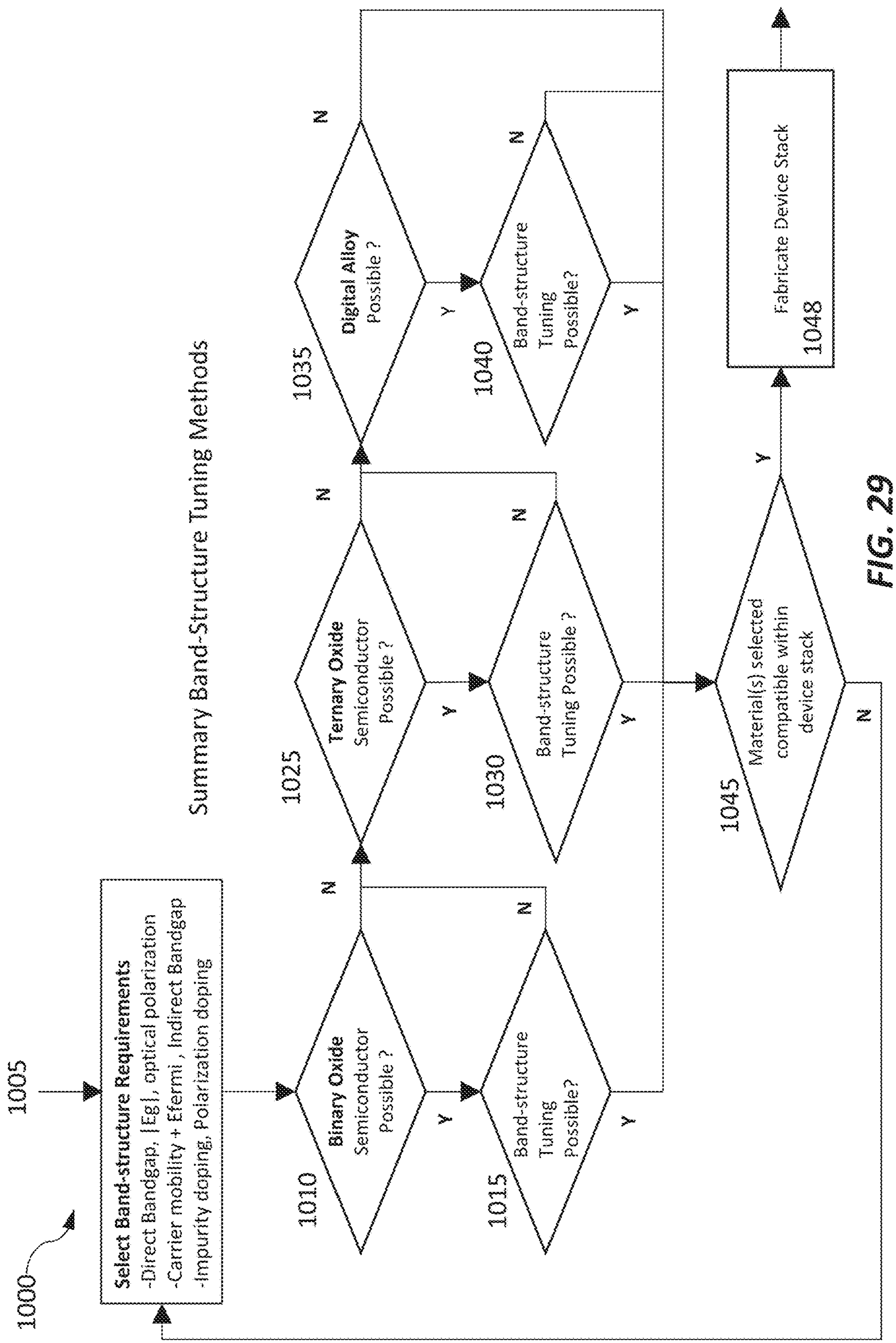
FIG. 29 is an example design flow diagram for tuning and constructing optoelectronic functionality of LED regions in accordance with an illustrative embodiment of the present disclosure.

The UVLED component regions can be selected using binary or ternary $Al_xGa_{1-x}O_3$ compositions either bulk-like or via digital alloy formation. Advantageous valence band tuning using bi-axial or uniaxial strain is also possible as described above. An example process flow 1000 is shown in FIG. 29 describing the possible selection criteria for selecting at least one of the crystal modification methods to form the bandgap regions of the UVLED.

At step 1005, the configuration of the band structure is selected including, but not limited to, band structure characteristics such as whether the band gap is direct or indirect, band gap energy, $E_{fermi}$, carrier mobility, and doping and polarization. At step 1010, it is determined whether a binary oxide may be suitable and further whether that band structure of the binary oxide may be modified (i.e., tuned) at step 1015 to meet requirements. If the binary oxide material meets the requirements then this material is selected for the relevant layer at step 1045 in the optoelectronic device. If a binary oxide is not suitable, then it is determined whether a ternary oxide may be suitable at step 1025 and further whether the band structure of the ternary oxide may be modified at step 1030 to meet requirements. If the ternary oxide meets requirements then this material is selected for the relevant layer at step 1045.

If a ternary oxide is not suitable, then it is determined whether a digital alloy may be suitable at step 1035 and further whether the band structure of the digital alloy may be modified at step 1040 to meet requirements. If the digital alloy meets requirements then this material is selected for the relevant layer at step 1045. Following determination of the layers by this method, then the optoelectronic device stack is fabricated at step 1048.

Figure 30:
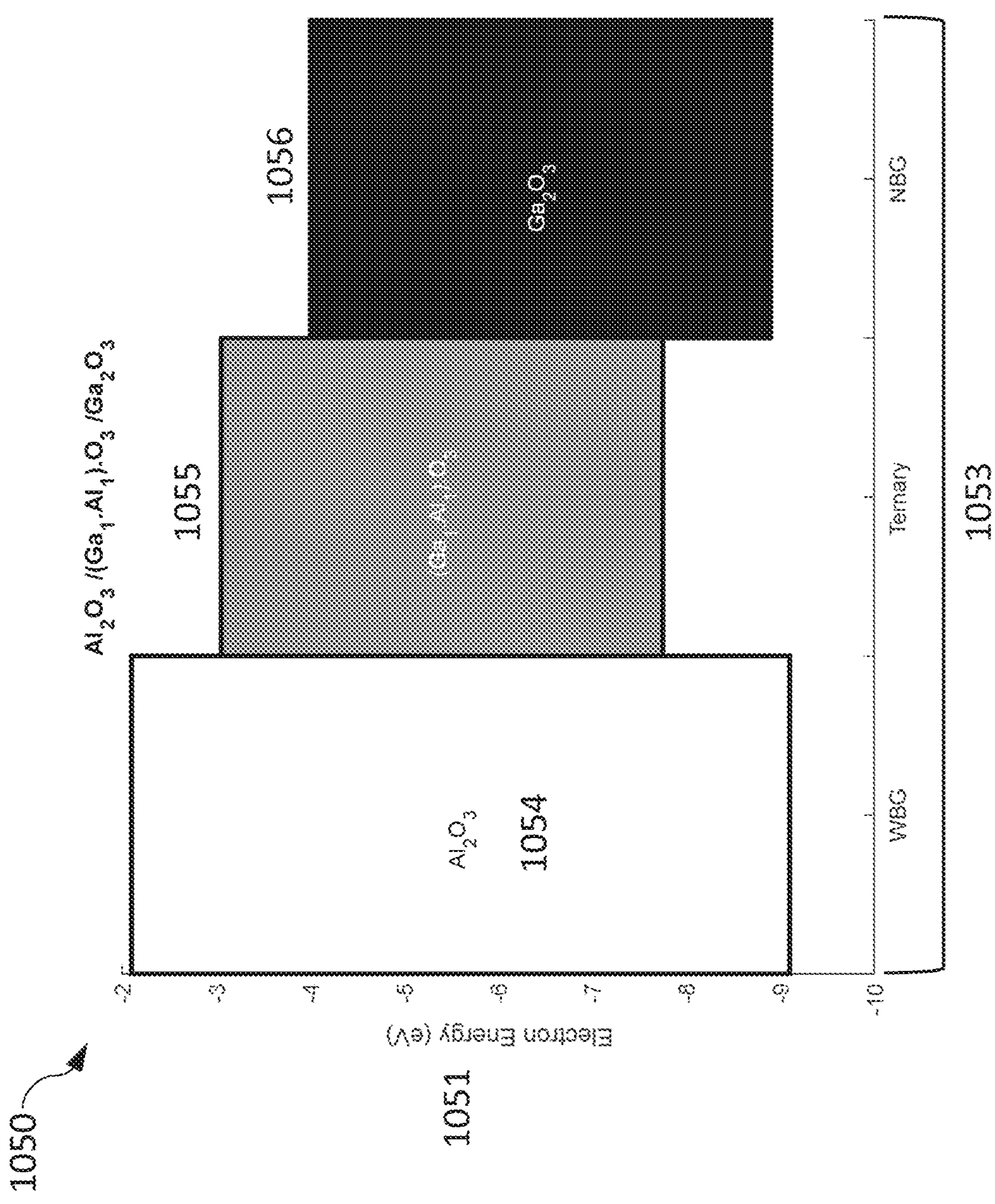
FIG. 30 shows a heterojunction band lineup for the binary $Al_2O_3$, ternary alloy $(Al,Ga)O_3$ and binary $Ga_2O_3$ semiconducting oxides in accordance with an illustrative embodiment of the present disclosure.

An embodiment of an energy band lineup for $Al_2O_3$ and $Ga_2O_3$ with respect to the ternary alloy $Al_xGa_{1-x}O_3$ is shown in diagram 1050 of FIG. 30 and varies in conduction and valence band offsets for corundum and monoclinic crystal symmetry. In diagram 1050 the y-axis is electron energy 1051 and the x-axis is different material types 1053 ($Al_2O_3$ 1054, $(Ga_1Al_1)O_3$ 1055 and $Ga_2O_3$ 1056). Corundum and monoclinic heterojunctions both appear to have type-I and type-II offsets whereas FIG. 30 simply plots the band alignment using existing values for the electron affinity of each material.

The theoretical electronic band structures of corundum and monoclinic bulk crystal forms of $Al_2O_3$ and $Ga_2O_3$ are known in the prior art. The application of strain to thin epitaxial films is however unexplored and is a subject of the present disclosure. By way of reference to the bulk band structures of $Ga_2O_3$ 1056 and $Al_2O_3$ 1054, embodiments of the present disclosure utilize how strain engineering can be applied advantageously for the application to UVLEDs. Incorporation of the monoclinic and trigonal strain tensor into a k.p-like Hamiltonian is necessary for understanding how the valence band is affected. Prior-art k.p crystal models as applied to zinc-blende and wurtzite crystal symmetry systems lack maturity for simulation of both the monoclinic and trigonal systems. Current efforts are being directed to perform a calculation of in the quadratic approximation to a valence band Hamiltonian at the center of the Brillioun zone of materials where this center possess the symmetry of the point group $C2_h$.

Single Crystal Aluminum-Oxide

The two main crystal forms of monoclinic (C2m) and corundum (R3c) crystal symmetry is discussed herein for both $Al_2O_3$ and $Ga_2O_3$; however, other crystal symmetry types are also possible such as triclinic and hexagonal forms. The other crystal symmetry forms can also be applied in accordance with the principles set out in the present disclosure.

(a) Corundum Symmetry $Al_2O_3$

Figure 31:
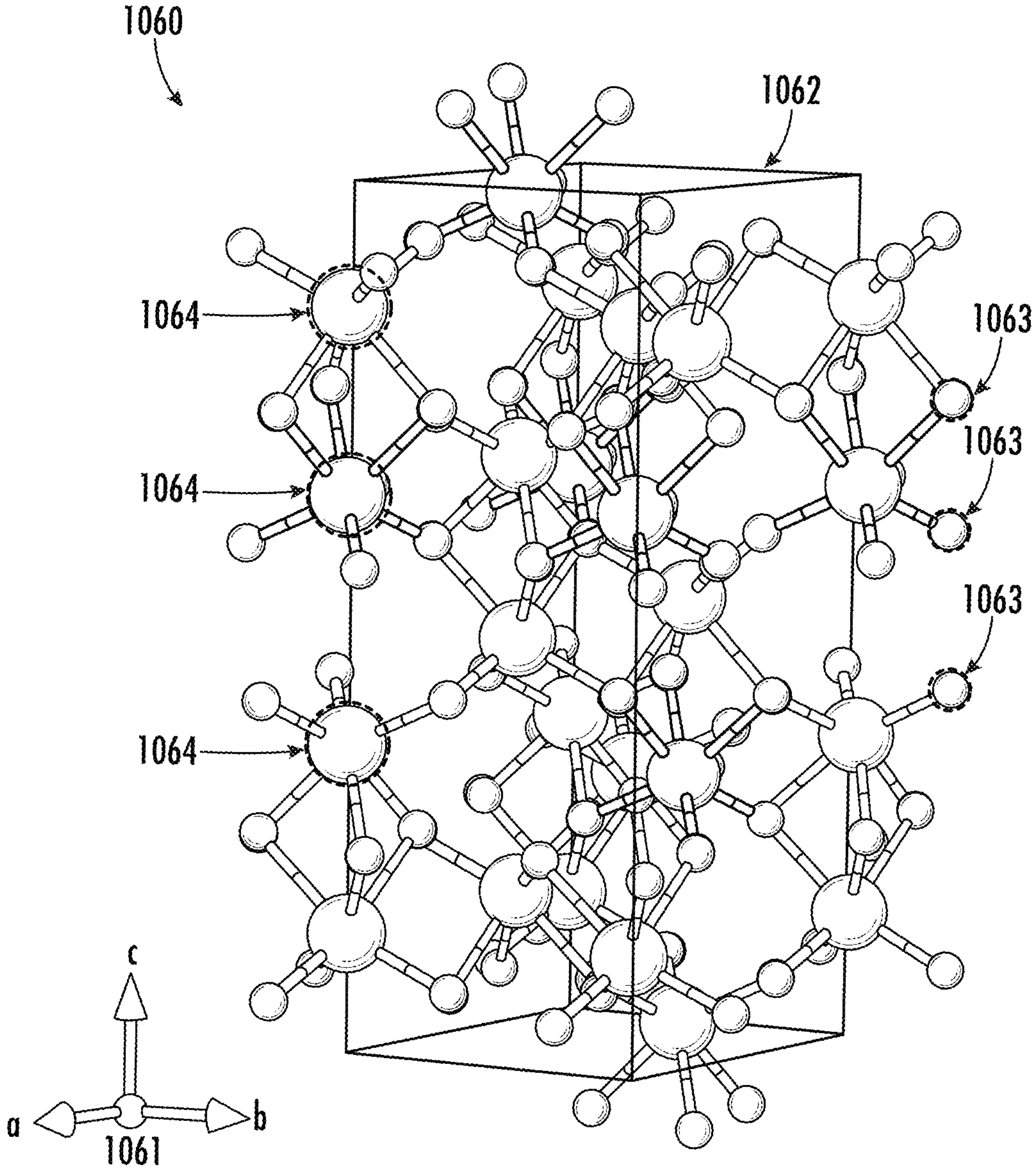
FIG. 31 shows a 3-dimensional crystal unit cell of corundum symmetry crystal structure (alpha-phase) $Al_2O_3$ used to calculate the E-k band structure in accordance with an illustrative embodiment of the present disclosure.
Figure 32B:
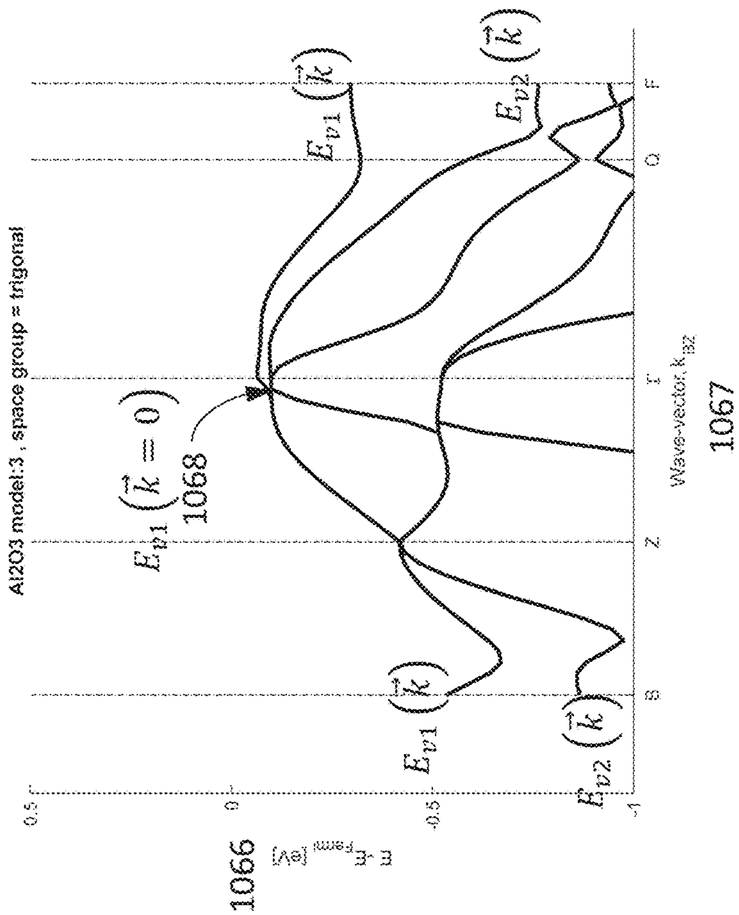
FIGS. 32A and 32B show a calculated energy-momentum configuration of alpha-$Al_2O_3$ in the vicinity of the Brillouin zone center in accordance with an illustrative embodiment of the present disclosure.
Figure 32A:
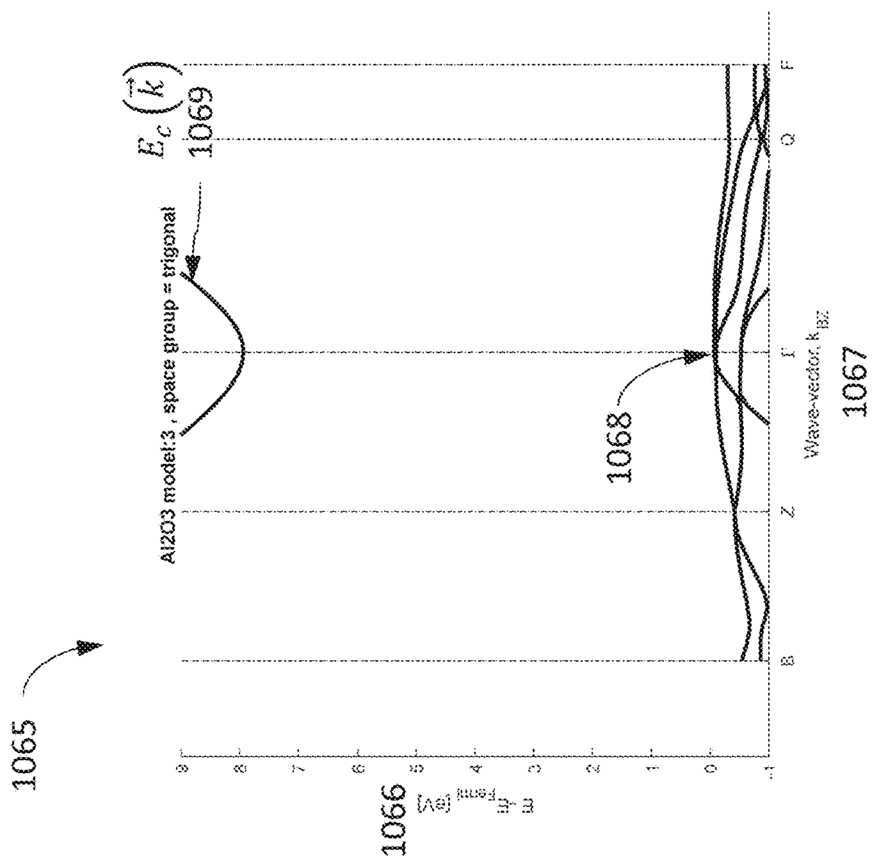

The crystal structure of trigonal $Al_2O_3$ (corundum) 1060 is shown in FIG. 31. The larger spheres represent Al-atoms 1064 and the smaller spheres are oxygen 1063. The unit cell 1062 has crystal axes 1061. Along the c-axis there are layers of Al atoms and O atoms. This crystal structure has a computed band structure 1065 as shown in FIGS. 32A-32B. The electron energy 1066 is plotted as a function of the crystal wave vectors 1067 within the Brillouin zone. The high symmetry points within the Brillouin zone are labelled as shown in the vicinity of the zone center k=0 which is applicable to understand the optical emission properties of the material.

The direct bandgap has valence band maximum 1068 and conduction band minimum 1069 at k=0. A detailed picture of the valence band in FIG. 32B shows a complex dispersion for the two uppermost valence bands. The topmost valence band determines the optical emission character if electrons and holes are indeed capable of being injected simultaneously into the $Al_2O_3$ band structure.

(b) Monoclinic Symmetry $Al_2O_3$

Figure 33:
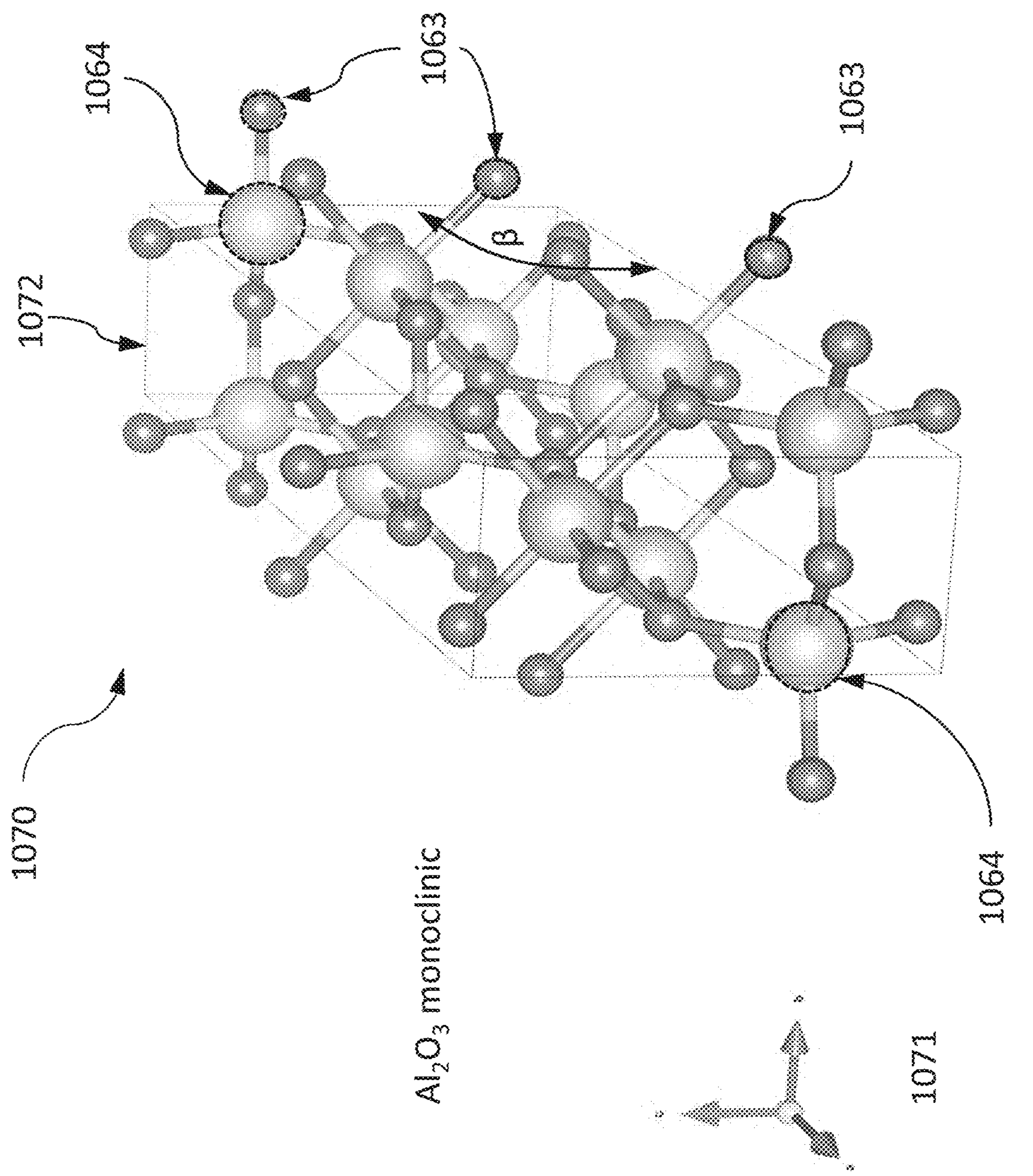
FIG. 33 shows a 3-dimensional crystal unit cell of a monoclinic symmetry crystal structure $Al_2O_3$ used to calculate the E-k band structure in accordance with an illustrative embodiment of the present disclosure.
Figure 34B:
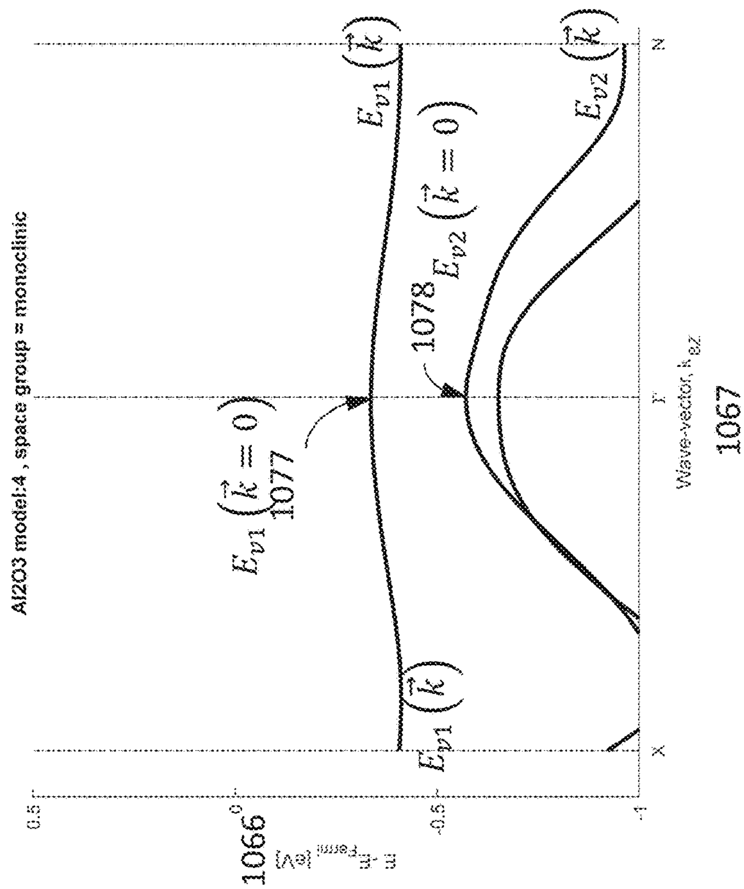
FIGS. 34A and 34B show calculated energy-momentum configurations of theta-$Al_2O_3$ in the vicinity of the Brillouin zone center in accordance with an illustrative embodiment of the present disclosure.
Figure 34A:
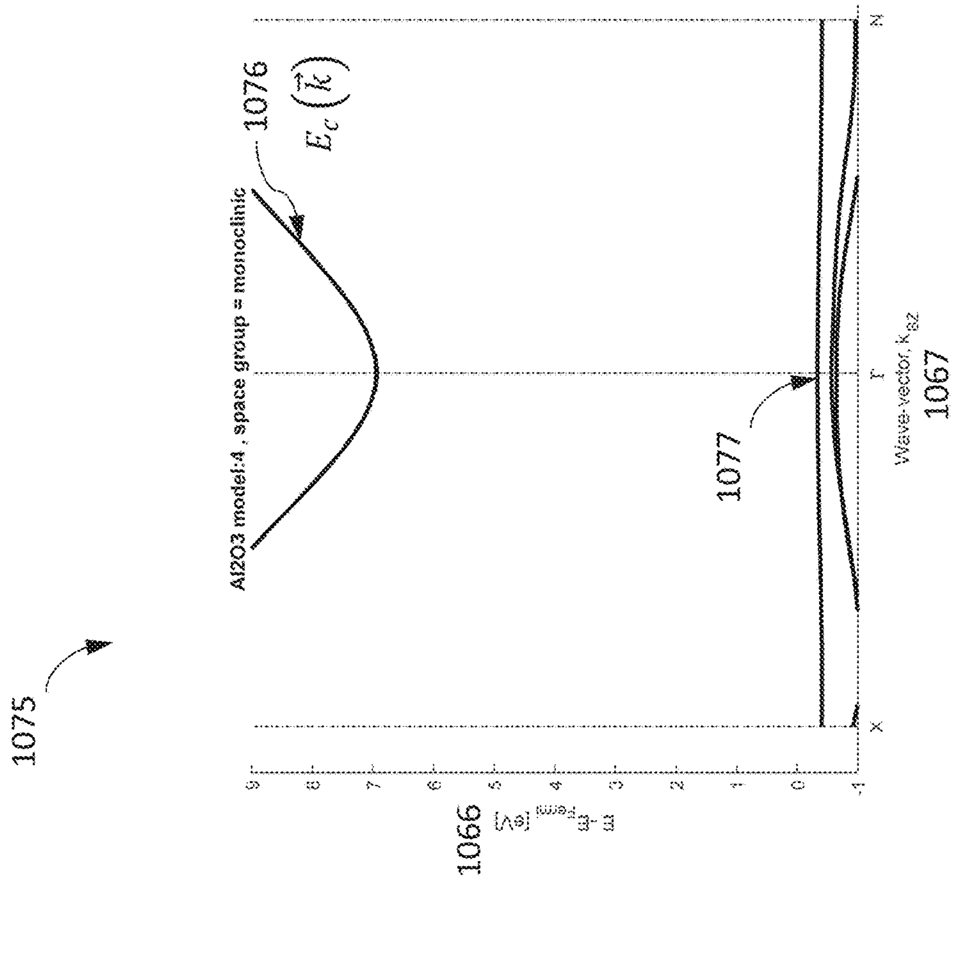

The crystal structure 1070 of monoclinic $Al_2O_3$ is shown in FIG. 33. The larger spheres represent Al-atoms 1064 and the smaller spheres are oxygen 1063. The unit cell 1072 has crystal axes 1071. This crystal structure has a computed band structure 1075 as shown in FIGS. 34A-34B, where FIG. 34B is a detailed picture of the valence band. FIG. 34A also shows conduction band 1076. The high symmetry points within the Brillouin zone are labelled as shown in the vicinity of the zone center k=0 which is applicable for understanding the optical emission properties of the material.

The monoclinic crystal structure 1070 is relatively more complex than the trigonal crystal symmetry and has lower density and smaller bandgap than the corundum Sapphire 1060 form illustrated in FIG. 31.

The monoclinic $Al_2O_3$ form also has a direct bandgap with clear split-off highest valence band 1077 which has lower curvature with respect to the E-k dispersion along the G-X and G-N wave vectors. The monoclinic bandgap is ~1.4 eV smaller than the corundum form. The second highest valence band 1078 is symmetry split from the upper most valence band.

Single Crystal Gallium-Oxide (a) Corundum Symmetry $Ga_2O_3$

Figure 35:
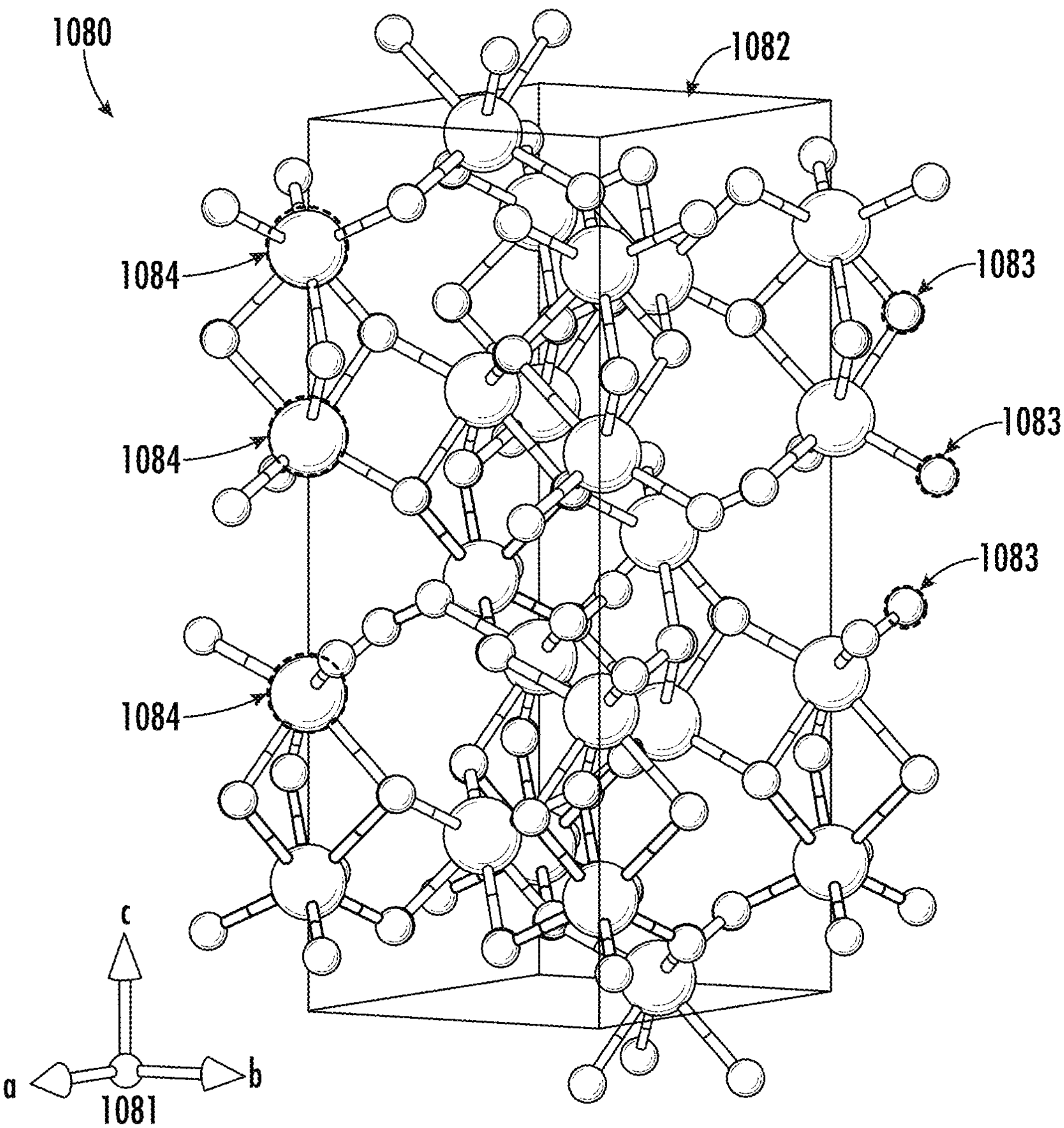
FIG. 35 shows a 3-dimensional crystal unit cell of a corundum symmetry crystal structure (alpha-phase) $Ga_2O_3$ used to calculate the E-k band structure in accordance with an illustrative embodiment of the present disclosure.

The crystal structure of trigonal $Ga_2O_3$ (corundum) 1080 is shown in FIG. 35. The larger spheres represent Ga-atoms 1084 and the smaller spheres are oxygen 1083. The unit cell 1082 has crystal axes 1081. The corundum (trigonal crystal symmetry type) is also known as the alpha-phase. The crystal structure is identical to Sapphire 1060 of FIG. 31 with lattice constants defining the unit cell 1082 shown in Table II of FIG. 43B. The $Ga_2O_3$ unit cell 1082 is larger than $Al_2O_3$. The corundum crystal has octahedrally bonded Ga-atoms.

Figure 36B:
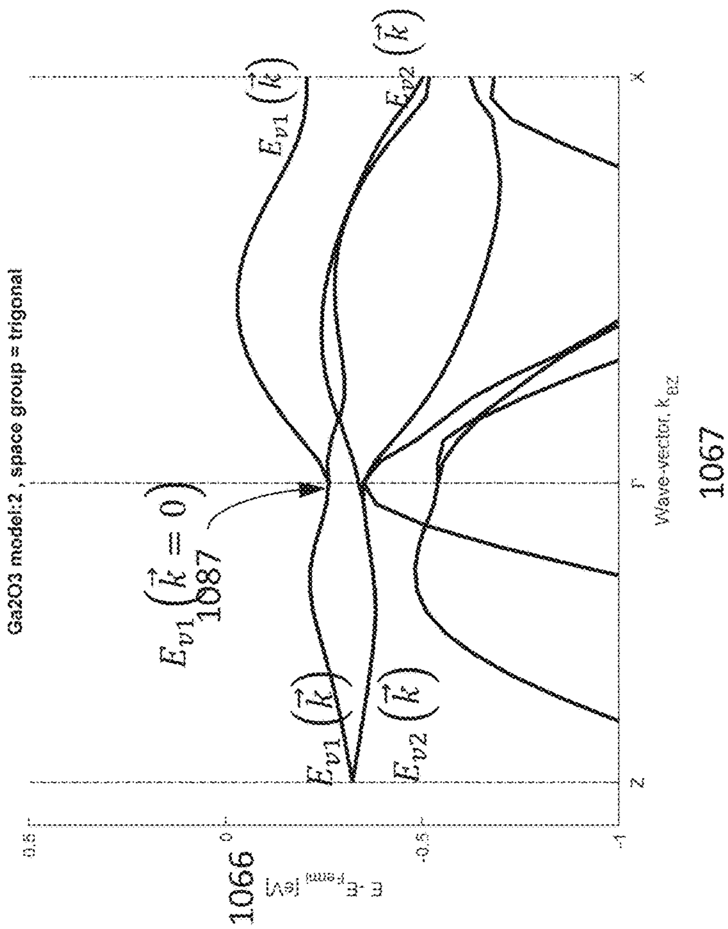
FIGS. 36A and 36B show calculated energy-momentum configurations of corundum alpha-$Ga_2O_3$ in the vicinity of the Brillouin zone center in accordance with an illustrative embodiment of the present disclosure.
Figure 36A:
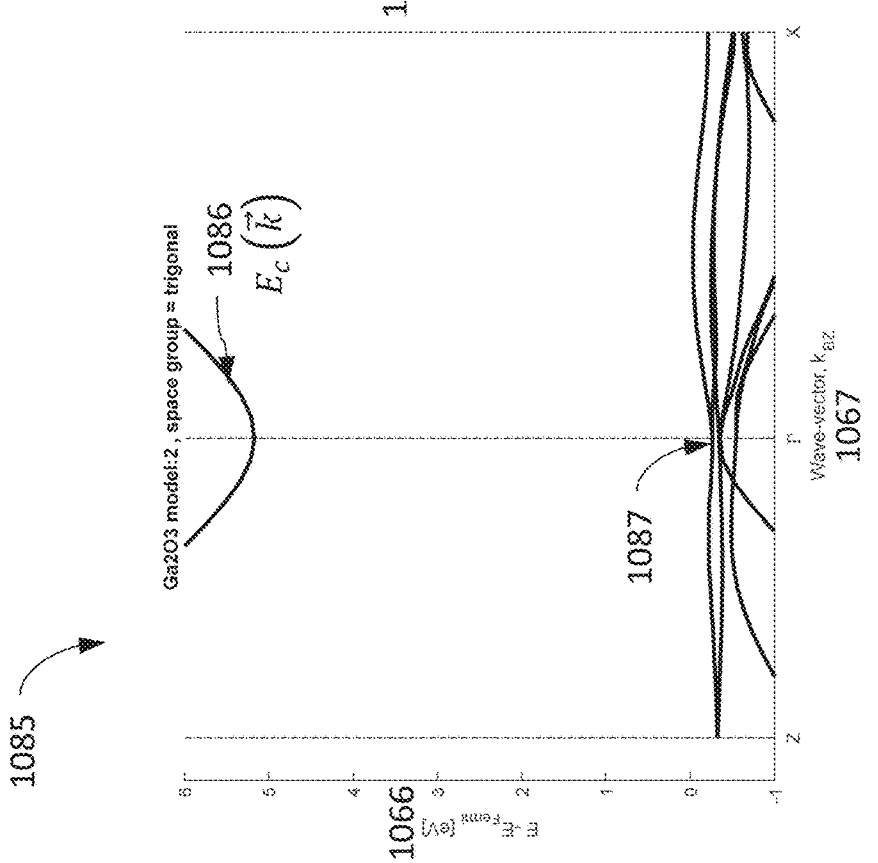

The calculated band structure 1085 for corundum $Ga_2O_3$ is shown in FIGS. 36A and 36B which is pseudo-direct having only a very small energy difference between the valence band maximum and the valence band energy 1087 at the zone center k=0. Conduction band 1086 is also shown in FIG. 36A.

Biaxial and uniaxial strain when applied to corundum $Ga_2O_3$ using the methods described above may then be used to modify the band structure and valence band into a direct bandgap. Indeed it is possible to use tensile strain applied along the b- and/or c-axes crystal to shift the valence band maximum to the zone center. It is estimated that ~5% tensile strain can be accommodated within a thin $Ga_2O_3$ layer comprising an $Al_2O_3/Ga_2O_3$ SL.

(b) Monoclinic Symmetry $Ga_2O_3$

Figure 37:
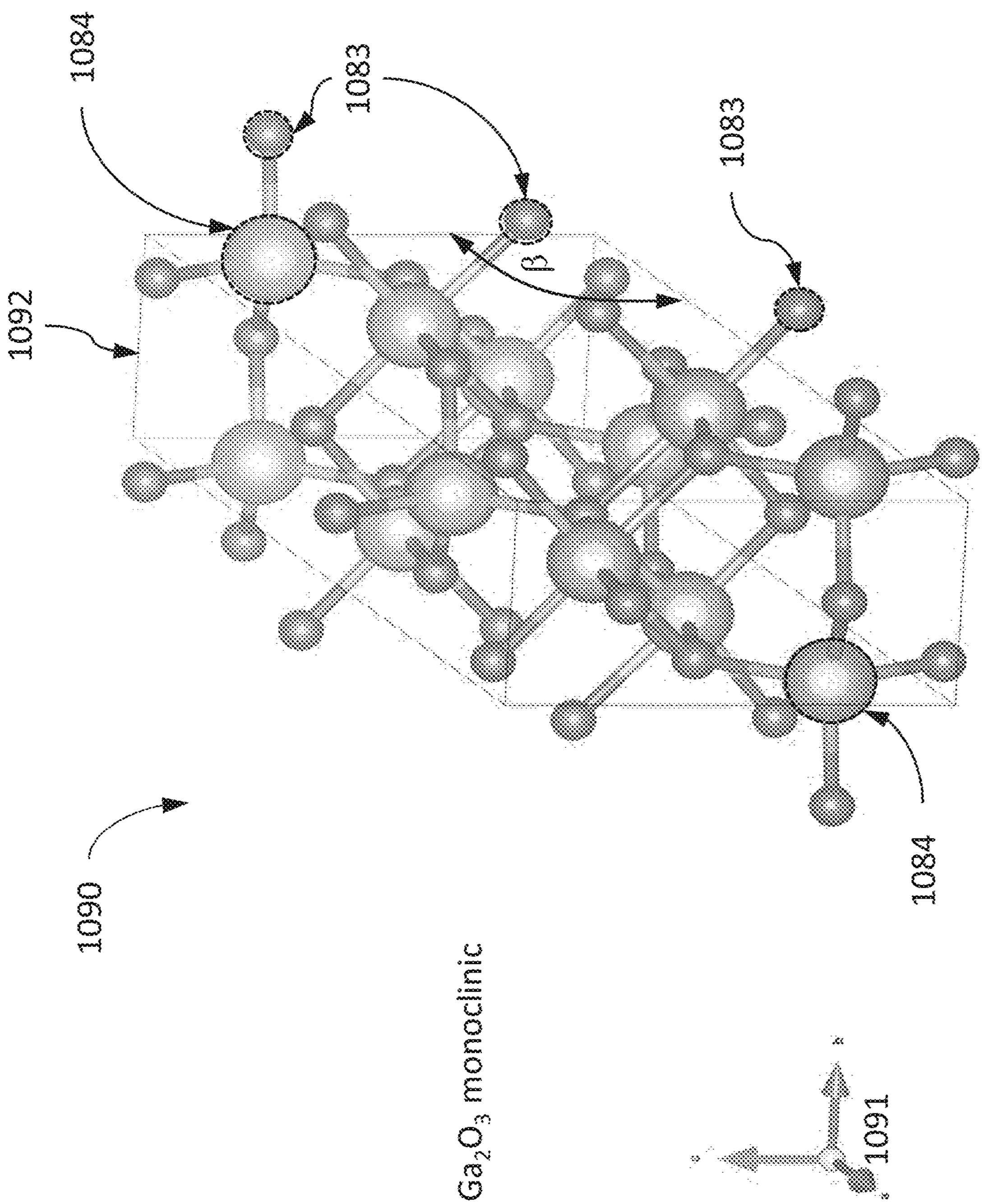
FIG. 37 shows a 3-dimensional crystal unit cell of a monoclinic symmetry crystal structure (beta-phase) $Ga_2O_3$ used to calculate the E-k band structure in accordance with an illustrative embodiment of the present disclosure.
Figure 38B:
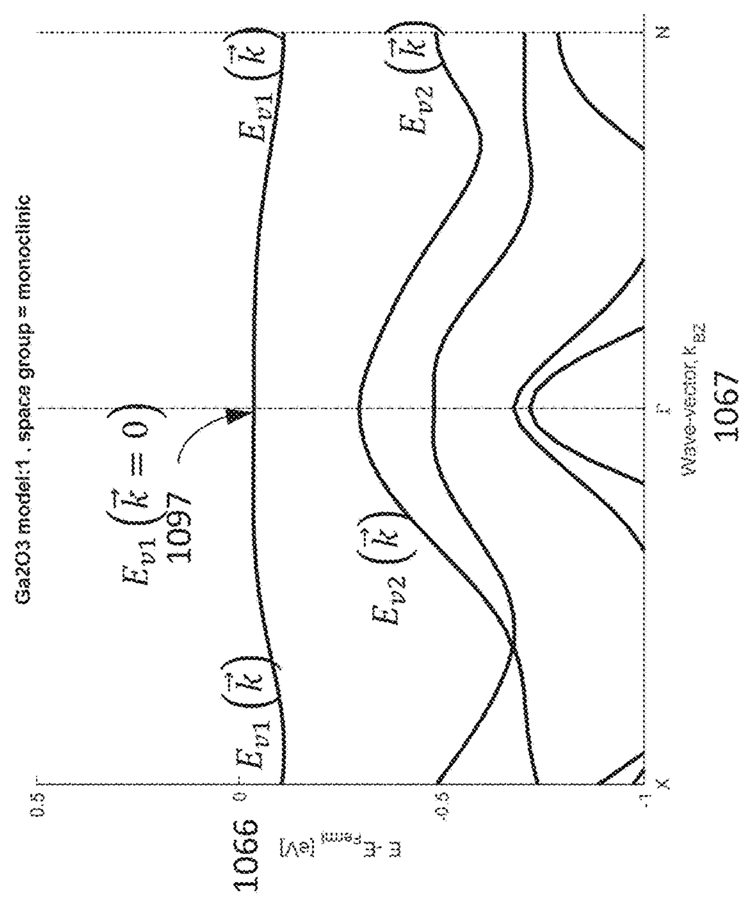
FIGS. 38A and 38B show calculated energy-momentum configurations of beta-$Ga_2O_3$ in the vicinity of the Brillouin zone center in accordance with an illustrative embodiment of the present disclosure.
Figure 38A:
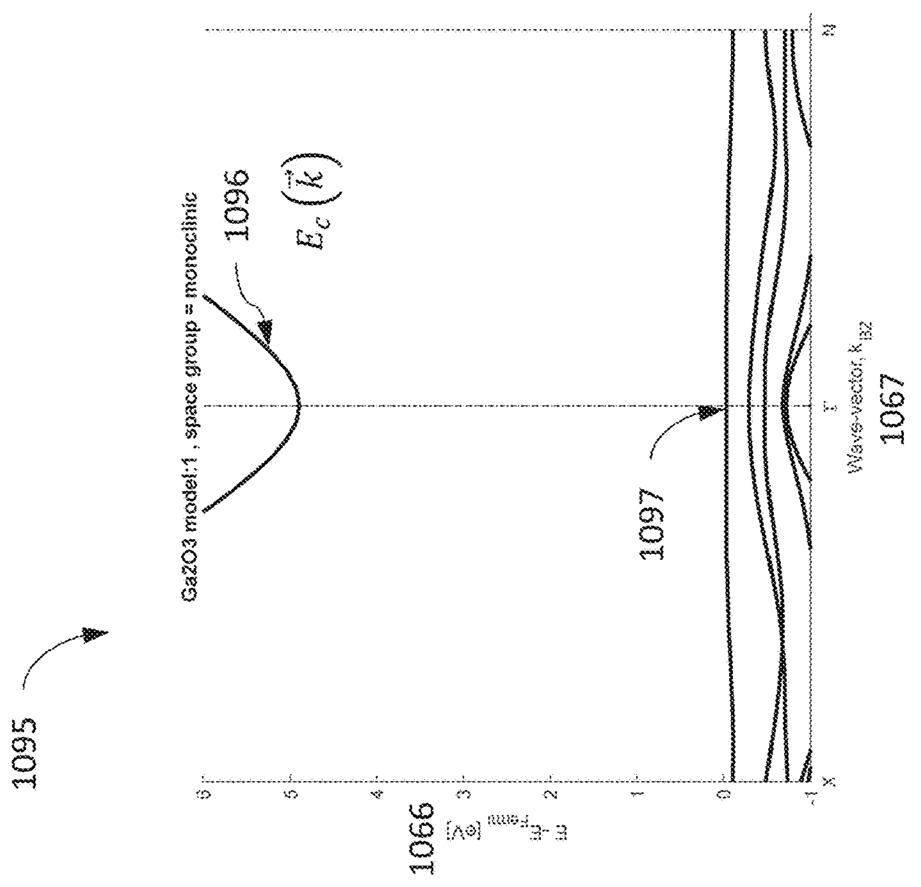

The crystal structure of monoclinic $Ga_2O_3$ (corundum) 1090 is shown in FIG. 37. The larger spheres represent Ga-atoms 1084 and the smaller spheres are oxygen 1083. The unit cell 1092 has crystal axes 1091. This crystal structure has a computed band structure 1095 as shown in FIGS. 38A-38B. The high symmetry points within the Brillouin zone are labelled as shown in the vicinity of the zone center k=0 which is applicable for understanding the optical emission properties of the material. Conduction band 1096 is also shown in FIG. 38A.

Monoclinic $Ga_2O_3$ has an uppermost valence 1097 with a relatively flat E-k dispersion. Close inspection reveals a few eV (less than the thermal energy $k_BT$~25 meV) variation in the actual maximum position of the valence band. The relatively small valence dispersion provides insight to the fact that monoclinic $Ga_2O_3$ will have relatively large hole effective masses and will therefore be relatively localized with potentially low mobility. Thus, strain can be used advantageously to improve the band structure and in particular the valence band dispersion.

Ternary Aluminum-Gallium-Oxide

Figure 39:
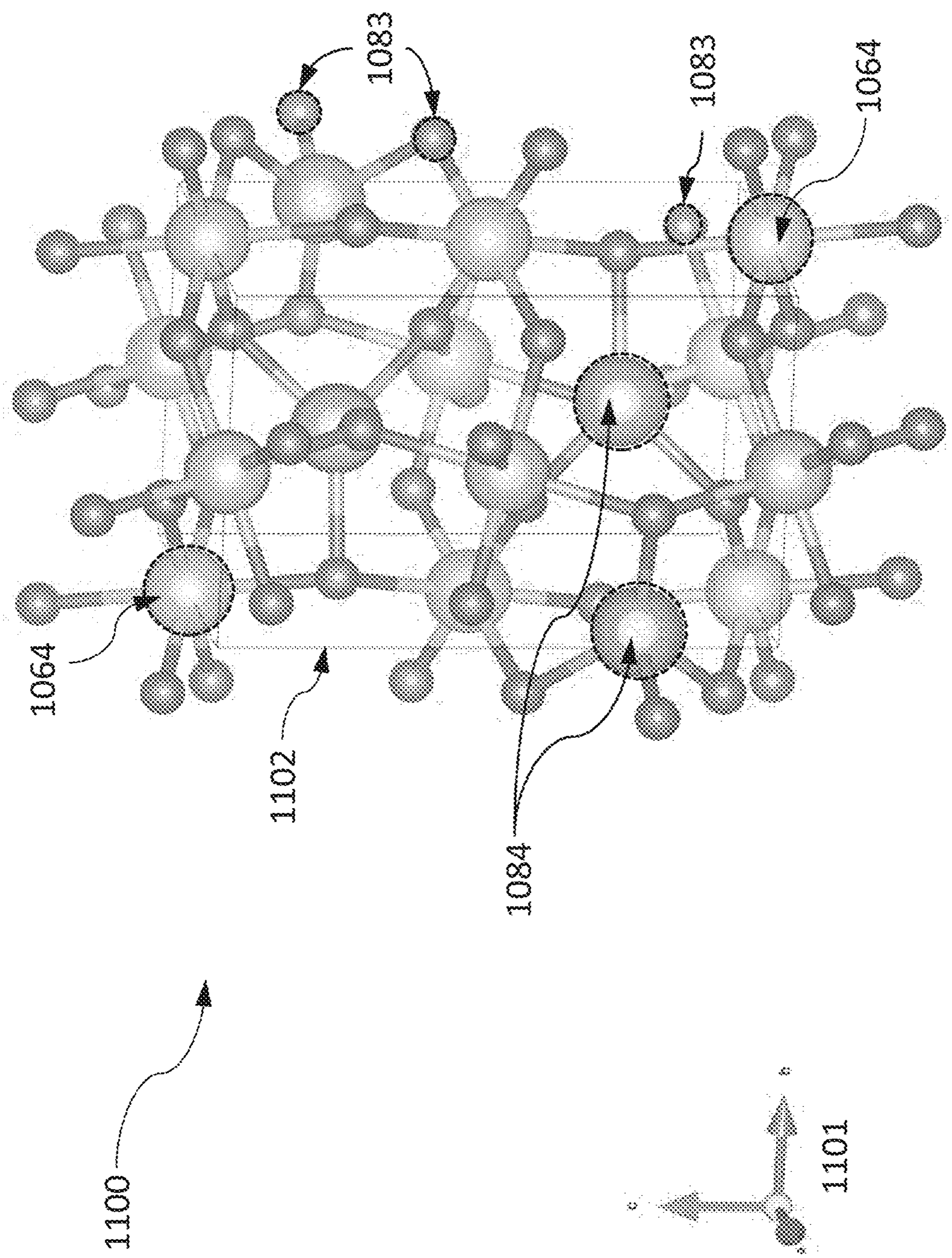
FIG. 39 shows a 3-dimensional crystal unit cell of an orthorhombic symmetry crystal structure of bulk ternary alloy of $(Al, Ga)O_3$ used to calculate the E-k band structure in accordance with an illustrative embodiment of the present disclosure.

Yet another example of the unique properties of the $AlGaO_3$ materials system is demonstrated by the crystal structures 1100 as shown in FIG. 39, having crystal axes 1101 and unit cell 1102. The ternary alloy comprises a 50% Al composition.

$(Al_xGa_{1-x})_2O_3$, where x=0.5 and can be deformed into substantially different crystal symmetry form having rhombic structure. The Ga atoms 1084 and Al atoms 1064 are disposed within the crystal as shown with oxygen atoms 1083. Of particular interest is the layered structure of Al and Ga atom planes. This type of structure can also be built using atomic layer techniques to form an ordered alloy as described throughout this disclosure.

Figure 40:
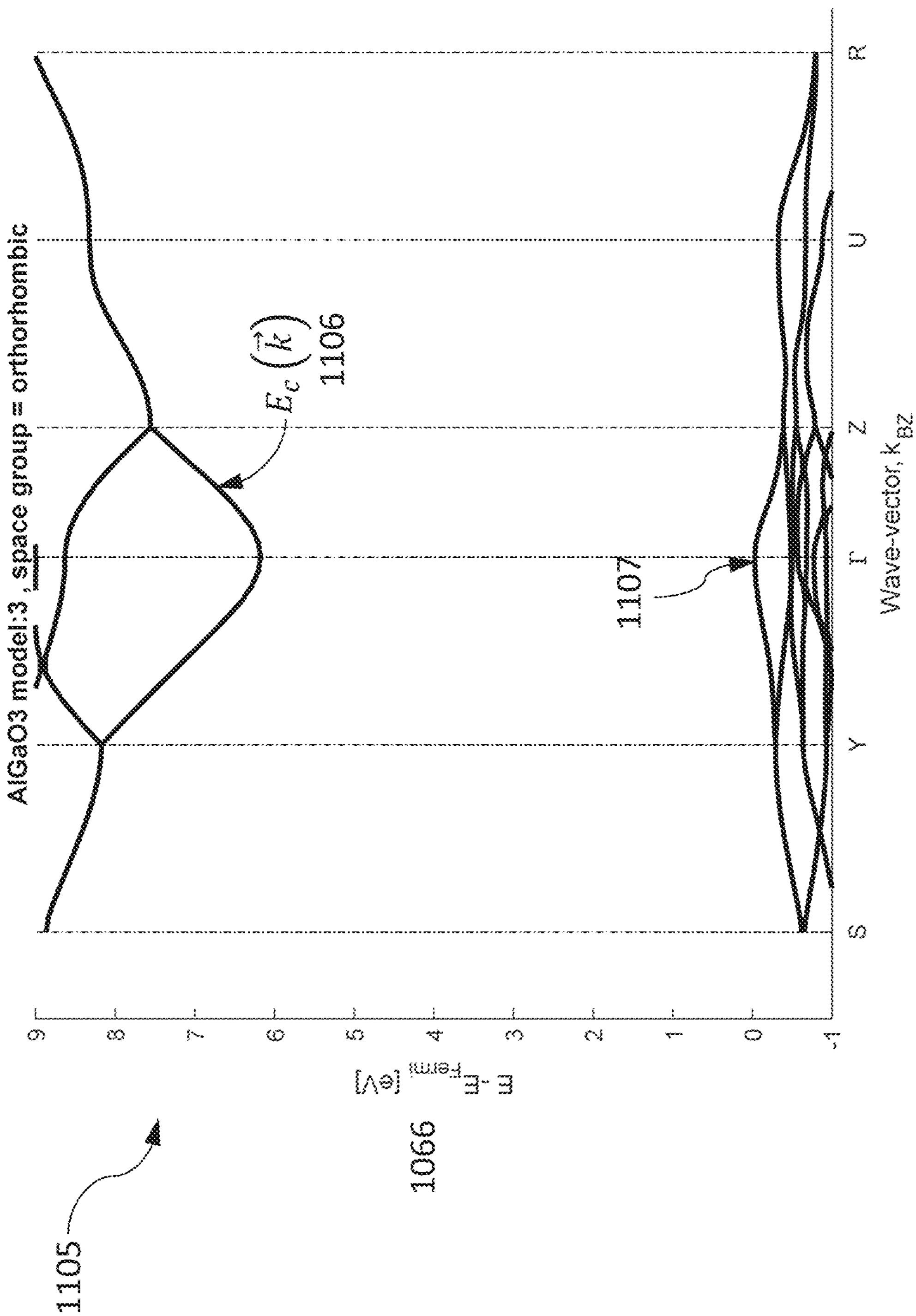
FIG. 40 shows a calculated energy-momentum configuration of $(Al, Ga)O_3$ in the vicinity of the Brillouin zone center showing a direct bandgap in accordance with an illustrative embodiment of the present disclosure.

The calculated band structure of 1105 is shown in FIG. 40. The conduction band minimum 1106 and valence band maximum 1107 exhibits a direct bandgap.

Ordered Ternary $AlGaO_3$ Alloy

Figure 42:
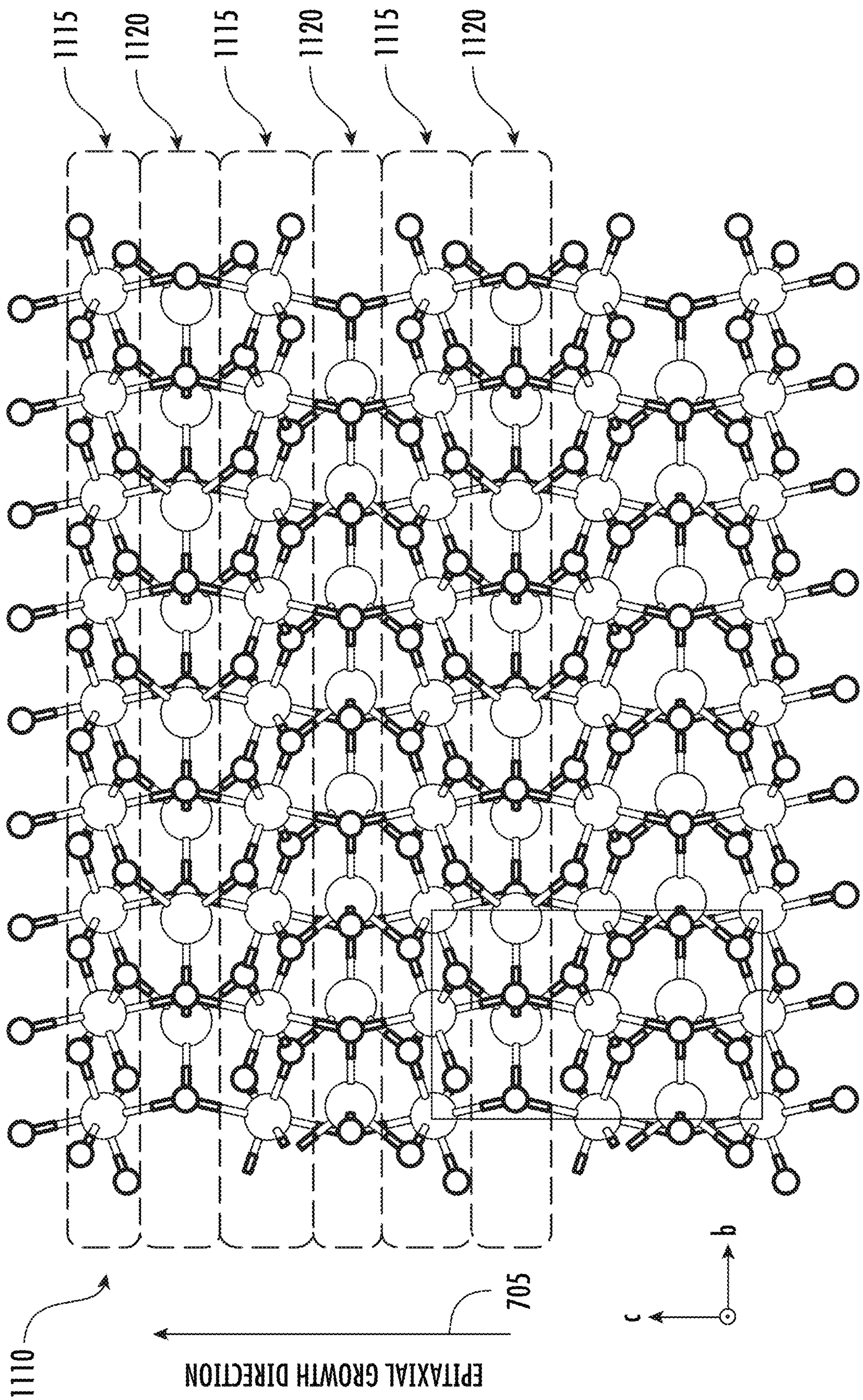
FIG. 42 depicts a cross-sectional portion of a $(Al,Ga)O_3$ ternary structure formed by sequentially depositing Al—O—Ga—O— . . . —O—Al epilayers along a growth direction in accordance with an illustrative embodiment of the present disclosure.

Using atomic layer epitaxy methods further enables new types of crystal symmetry structures to be formed. For example, some embodiments include ultrathin epilayers comprising alternate sequences along a growth direction of the form of [Al—O—Ga—O—Al— . . . ]. Structure 1110 of FIG. 42 shows one possible extreme case of creating ordered ternary alloys using alternate sequences 1115 and 1120. It has been demonstrated in relation to the present disclosure that growth conditions can be created where self-ordering of Al and Ga can occur. This condition can occur even under coincident Al and Ga fluxes simultaneously applied to the growing surface resulting in a self-assembled ordered alloy. Alternatively, a predetermined modulation of the Al and Ga fluxes arriving at the epilayer surface can also create an ordered alloys structure.

The ability to configure the band structure for optoelectronic devices, and in particular UVLEDS, by selecting from bulk-like metal oxides, ternary compositions or further still digital alloys are all contemplated to be within the scope of the present disclosure.

Yet another example is the use of biaxial and uniaxial strain to modify the band structure, with one example being the use of the $(Al_xGa_{1-x})_2O_3$ material system employing strained layer epitaxy on $Al_2O_3$ or $Ga_2O_3$ substrates.

Substrate Selection for AlGaO-Based UVLEDs

The selection of a native metal oxide substrate is one advantage of the present disclosure applied to the epitaxy of the $(Al_xGa_{1-x})_2O_3$ material systems using strained layer epitaxy on $Al_2O_3$ or $Ga_2O_3$ substrates.

Example substrates are listed in Table I in FIG. 43A. In some embodiments, intermediate $AlGaO_3$ bulk substrates may also be utilized and are advantageous for application to UVLEDs.

A beneficial utility for monoclinic $Ga_2O_3$ bulk substrates is the ability to form monoclinic $(Al_xGa_{1-x})_2O_3$ structures having high Ga % (e.g., approximately 30-40%), limited by strain accumulation. This enables vertical devices due to the ability of having an electrically conductive substrate. Conversely, the use of corundum $Al_2O_3$ substrates enable corundum epitaxial films $(Al_xGa_{1-x})_2O_3$ with $0 \leq x \leq 1$.

Other substrates such as MgO(100), $MgAl_2O_4$ and $MgGa_2O_4$ are also favorable for the epitaxial growth of metal oxide UVLED structures.

Selection and Action of Crystal Growth Modifiers

Examples of metal oxide structures are now discussed for optoelectronic applications and in particular to the fabrication of UVLEDs. The structures disclosed in FIGS. 44A-44Z, which shall be described subsequently, are not limiting as the possible crystal structure modifiers may be selected from either elemental cation and anion constituents into a given metal oxide M-O (where M=Al, Ga), such as binary $Ga_2O_3$, ternary $(Al_xGa_{1-x})_2O_3$ and binary $Al_2O_3$.

It is found both theoretically and experimentally in accordance with the present disclosure that the cation specie crystal modifiers into M-O defined above may be selected from at least one of the following:

Germanium (Ge)

Ge is beneficially supplied as pure elemental species to incorporate via co-deposition of M-O species during non-equilibrium crystal formation process. In some embodiments, elemental pure ballistic beams of atomic Ga and Ge are co-deposited along with an active Oxygen beam impinging upon the growth surface. For example, Ge has a valence of +4 and can be introduced in dilute atomic ratio by substitution onto metal cation M-sites of the M-O host crystal to form stoichiometric composition of the form $(Ge^{+4}O_2)_m(Ga_2O_3)_n=(Ge^{+4}O_2)_{m/(m+n)}(Ga_2O_3)_{n/(m+n)}=(Ge^{+4}O_2)_x(Ga_2O_3)_{1-x}=Ge_xGa_{2(1-x)}O_{3-x}$, wherein for dilute Ge compositions $x \leq 0.1$.

In accordance with the present disclosure, it was found that for Ge $x \leq 0.1$, a dilute ratio of Ge provides sufficient electronic modification to the intrinsic M-O for manipulating the Fermi-energy ($E_F$), thereby increasing the available electron free carrier concentration and altering the crystal lattice structure to impart advantageous strain during epitaxial growth. For dilute compositions the host M-O physical unit cell is substantially unperturbed. Further increase in Ge concentration results in modification of the host $Ga_2O_3$ crystal structure through lattice dilation or even resulting in a new material composition.

For example, for Ge $x \leq 1/3$ a monoclinic crystal structure of the host $Ga_2O_3$ unit cell can be maintained. For example, x=0.25 forming monoclinic $Ge_{0.25}Ga_{1.50}O_{2.75}=Ge_1Ga_6O_{11}$ is possible. Advantageously, monoclinic $Ge_xGa_{2(1-x)}O_{3-x}$ (x=1/3) crystal exhibits an excellent direct bandgap in excess of 5 eV. The lattice deformation by introducing Ge increases the monoclinic unit cell preferentially along the b-axis and c-axis while retaining the a-axis lattice constant in comparison to strain-free monoclinic $Ga_2O_3$.

The lattice constants for monoclinic $Ga_2O_3$ are (a=3.08 A, b=5.88 A, c=6.41 A) and for monoclinic $Ge_1Ga_6O_{11}$ (a=3.04 A, b=6.38 A, c=7.97 A). Therefore, introducing Ge creates biaxial expansion of the free-standing unit cell along the b- and c-axes. Therefore, if $Ge_xGa_{2(1-x)}O_{3-x}$ is epitaxially deposited upon a bulk-like monoclinic $Ga_2O_3$ surface oriented along the b- and c-axis (that is, deposited along the a-axis), then a thin film of $Ge_xGa_{2(1-x)}O_{3-x}$ can be elastically deformed to induce biaxial compression, and therefore warp the valence band E-k dispersion advantageously, as discussed herein.

Beyond x>1/3 the higher Ge % transforms the crystal structure to cubic, for example, $GeGa_2O_5$.

In some embodiments, incorporation of Ge into $Al_2O_3$ and $(Al_xGa_{1-x})_2O_3$ are also possible.

For example, a direct bandgap $Ge_xAl_{2(1-x)}O_{3-x}$ ternary can also be epitaxially formed by co-deposition of elemental Al and Ge and active Oxygen so as to form a thin film of monoclinic crystal symmetry. In accordance with the present disclosure it was found that the monoclinic structure is stabilized for Ge % x~0.6 creating a free-standing lattice that has a large relative expansion along the a-axis and along the c-axis, while moderate decrease along the b-axis when compared to monoclinic $Al_2O_3$.

The lattice constants for monoclinic $Ge_2Al_2O_7$ are (a=5.34 A, b=5.34 A, c=9.81 A) and for monoclinic $Al_2O_3$ (a=2.94 A, b=5.671 A, c=6.14 A). Therefore, $Ge_xAl_{2(1-x)}O_3$ deposited along a growth direction oriented along the b-axis and deposited further on a monoclinic $Al_2O_3$ surface, for sufficiently thin films to maintain elastic deformation, will undergo biaxial tension.

Silicon (Si)

Elemental Si may also be supplied as a pure elemental species to incorporate via co-deposition of M-O species during non-equilibrium crystal formation process. In some embodiments, elemental pure ballistic beams of atomic Ga and Si are co-deposited along with an active Oxygen beam impinging upon the growth surface. For example, Si has a valence of +4 and can be introduced in dilute atomic ratio by substitution onto metal cation M-sites of the M-O host crystal to form stoichiometric composition of the form $(Si^{+4}O_2)_m(Ga_2O_3)_n=(Si^{+4}O_2)_{n/(m+n)}(Ga_2O_3)_{n/(m+n)}=(Si^{+4}O_2)_x(Ga_2O_3)_{1-x}=Si_xGa_{2(1-x)}O_{3-x}$, wherein for dilute Si compositions $x \leq 0.1$.

In accordance with the present disclosure, it was found that for Si $x \leq 0.1$, a dilute ratio of Si provides sufficient electronic modification to the intrinsic M-O for manipulating the Fermi-energy ($E_F$), thereby increasing the available electron free carrier concentration and altering the crystal lattice structure to impart advantageous strain during epitaxial growth. For dilute compositions the host M-O physical unit cell is substantially unperturbed. Further increase in Si concentration results in modification of the host $Ga_2O_3$ crystal structure through lattice dilation or even resulting in a new material composition.

For example, for Si $x \leq 1/3$ a monoclinic crystal structure of the host $Ga_2O_3$ unit cell can be maintained. For example, for the case of Si % x=0.25, forming monoclinic $Si_{0.25}Ga_{1.50}O_{2.75}=Si_1Ga_6O_{11}$ is possible. The lattice deformation by introducing Si increases the monoclinic unit cell preferentially along the b-axis and c-axis while retaining the a-axis lattice constant in comparison to strain-free monoclinic $Ga_2O_3$. The lattice constants for monoclinic $SiiGa_6O_1$ are (a=6.40 A, b=6.40 A, c=9.40 A) compared to monoclinic $Ga_2O_3$ (a=3.08 A, b=5.88 A, c=6.41 A).

Therefore, introducing Si creates biaxial expansion of the free-standing unit cell along all the a-, b- and c-axes. Therefore, if $Si_xGa_{2(1-x)}O_{3-x}$ is epitaxially deposited upon a bulk-like monoclinic $Ga_2O_3$ surface oriented along the b- and c-axis (that is, deposited along the a-axis), then a thin film of $Si_xGa_{2(1-x)}O_{3-x}$ can be elastically deformed to induce asymmetric biaxial compression, and therefore warp the valence band E-k dispersion advantageously, as discussed herein.

Beyond x>1/3 the higher Si % transforms the crystal structure to cubic, for example, $SiGa_2O_5$.

In some embodiments, incorporation of Si into $Al_2O_3$ and $(Al_xGa_{1-x})_2O_3$ are also possible. For example, orthorhombic $(Si^{+4}\ O_2)_x(Al_2O_3)_{1-x}=Si_xAl_{2(1-x)}O_{3-x}$ is possible by direct co-deposition of elemental Si and Al with an active Oxygen flux onto a deposition surface. If the deposition surface is selected from the available trigonal alpha-$Al_2O_3$ surfaces (e.g., A-, R-, M-plane) then it is possible to form orthorhombic crystal symmetry $Al_2SiO_5$ (i.e., x=0.5) which reports a large direct bandgap at the Brillouin-zone center. The lattice constants for orthorhombic are (a=5.61 A, b=7.88 A, c=7.80 A) and trigonal (R3c) $Al_2O_3$ (a=4.75 A, b=4.75 A, c=12.982 A).

Deposition of oriented $Al_2SiO_5$ films on $Al_2O_3$ can therefore result in large biaxial compression for elastically strained films. Exceeding the elastic energy limit creates deleterious crystalline misfit dislocations and is generally to be avoided. To achieve elastically deformed film on $Al_2O_3$, in particular, films of thickness less than about 10 nm are preferred.

Magnesium (Mg)

Some embodiments include the incorporation of Mg elemental species with $Ga_2O_3$ and $Al_2O_3$ host crystals, where Mg is selected as a preferred group-II metal specie. Furthermore, incorporation of Mg into $(Al_xGa_{1-x})_2O_3$ up to and including the formation of a quaternary $Mg_x(Al,Ga)_yO_z$ may also be utilized. Particular useful compositions of $Mg_xGa_{2(1-x)}O_{3-2x}$, wherein x≤0.1, enable the electronic structure of the $Ga_2O_3$ and $(Al_xGa_{1-x})_2O_3$ host to be made p-type conductivity type by substituting $Ga^{3+}$ cation sites by $Mg^{2+}$ cations. For $(Al_yGa_{1-y})_2O_3$ y=0.3 the bandgap is about 6.0 eV, and Mg can be incorporated up to about y~0.05 to 0.1 enabling the conductivity type of the host to be varied from intrinsic weak excess electron n-type to excess hole p-type.

Ternary compounds of the type $Mg_xGa_{2(1-x)}O_{3-2x}$ and $Mg_xAl_{2(1-x)}O_{3-2x}$ and $(Ni_xMg_{1-x})O$ are also example embodiments of active region materials for optically emissive UVLEDs.

In some embodiments, both stoichiometric compositions of $Mg_xGa_{2(1-x)}O_{3-2x}$ and $Mg_xAl_{2(1-x)}O_{3-2x}$ wherein x=0.5 producing cubic crystal symmetry structure exhibit advantageous direct bandgap E-k dispersion are suitable for optically emissive region.

Furthermore, in accordance with the present disclosure it was found that the $Mg_xGa_{2(1-x)}O_{3-2x}$ and $Mg_xAl_{2(1-x)}O_{3-2x}$ compositions are epitaxially compatible with cubic MgO and monoclinic, corundum and hexagonal crystal symmetry forms of $Ga_2O_3$.

Using non-equilibrium growth techniques enables a large miscibility range of Mg within both $Ga_2O_3$ and $Al_2O_3$ hosts spanning MgO to the respective M-O binary. This is in contradistinction with equilibrium growth techniques such as CZ wherein phase separation occurs due to the volatile Mg specie.

For example, the lattice constants of cubic and monoclinic forms of $Mg_xGa_{2(1-x)}O_{3-2x}$ for x~0.5 are (a=b=c=8.46 A) and (a=10.25 A, b=5.98, c=14.50 A), respectively. In accordance with the present disclosure, it was found that the cubic $Mg_xGa_{2(1-x)}O_{3-2x}$ form can orient as a thin film having (100)- and (111)-oriented films on monoclinic $Ga_2O_3$(100) and $Ga_2O_3$ (001) substrates. Also, $Mg_xGa_{2(1-x)}O_{3-2x}$ thin epitaxial films can be deposited upon MgO substrates. Furthermore, $Mg_xGa_{2(1-x)}O_{3-2x}$ 0≤x≤1 films can be deposited directly onto $MgAl_2O_4$(100) spinel crystal symmetry substrates.

In further embodiments, both $Mg_xAl_{2(1-x)}$ $O_{3-2x}$ and $Mg_xGa_{2(1-x)}O_{3-2x}$ high quality (i.e., low defect density) epitaxial films can be deposited directly onto Lithium Fluoride (LiF) substrates.

Zinc (Zn)

Some embodiments include incorporation of Zn elemental species into $Ga_2O_3$ and $Al_2O_3$ host crystals, where Zn is another preferred group-II metal specie. Furthermore, incorporation of Zn into $(Al_xGa_{1-x})_2O_3$ up to and including the formation of a quaternary $Zn_x(Al,Ga)_yO_z$ may also be utilized.

Yet further quaternary compositions advantageous for tuning the direct bandgap structure are the compounds of the most general form:

$$(Mg_xZn_{1-x})_z(Al_yGa_{1-y})_{2(1-z)}O_{3-2z}, \text{ where } 0\leq x,y,z\leq 1.$$

In accordance with the present disclosure, it was found that the cubic crystal symmetry composition forms of z~0.5 can be used advantageously for a given fixed y composition between Al and Ga. By varying the Mg to Zn ratio x, the direct bandgap can be tuned from about 4 eV≤$E_G$(x)≤7 eV. This can be achieved by disposing advantageously separately controllable fluxes of pure elemental beams of Al, Ga, Mg and Zn and providing an activated Oxygen flux for the anions species. In general, an excess of atomic oxygen is desired with respect to the total impinging metal flux. Control of the Al:Ga flux ratio and Mg:Zn ratio arriving at the growth surface can then be used to preselect the composition desired for bandgap tuning the UVLED regions.

Surprisingly, while Zinc-Oxide (ZnO) is generally a wurtzite hexagonal crystal symmetry structure, when introduced into $(Mg_xZn_{1-x})_z(Al_yGa_{1-y})_{2(1-z)}O_{3-2z}$, cubic and spinel crystal symmetry forms are readily possible using non-equilibrium growth methods described herein. The bandgap character at the Brillouin-zone center can be tuned by alloy composition (x, y, z) ranging from indirect to direct character. This is advantageous for application to substantially non-absorbing electrical injection regions and optical emissive regions, respectively. Furthermore, bandgap modulation is possible for bandgap engineered structures, such as superlattices and quantum wells described herein.

Nickel (Ni)

The incorporation of Ni elemental species into $Ga_2O_3$ and $Al_2O_3$ host crystals is yet another preferred group-II metal specie. Furthermore, incorporation of Ni into $(Al_xGa_{1-x})_2O_3$ up to and including the formation of a quaternary $Ni_x$(Al, Ga)$_yO_z$ may be utilized.

Yet further quaternary compositions advantageous for tuning the direct bandgap structure are the compounds of the most general form:

$$(Mg_xNi_{1-x})_z(Al_yGa_{1-y})_{2(1-z)}O_{3-2z}, \text{ where } 0\leq x,y,z\leq 1.$$

In accordance with the present disclosure, it was discovered that the cubic crystal symmetry composition forms of z~0.5 can be used advantageously for a given fixed y composition between Al and Ga. By varying the Mg to Ni ratio x, the direct bandgap can be tuned from about 4.9 eV≤$E_G$(x)≤7 eV. This can be achieved by disposing advantageously separately controllable fluxes of pure elemental beams of Al, Ga≤Mg and Ni and providing an activated oxygen flux for the anion species. Control of the Al:Ga flux ratio and Mg:Ni ratio arriving at the growth surface can then be used to preselect the composition desired for bandgap tuning the UVLED regions.

Of enormous utility herein is the specific band structure and intrinsic conductivity type of cubic NiO. Nickel-Oxide (NiO) exhibits a native p-type conductivity type due to the Ni d-orbital electrons. The general cubic crystal symmetry form $(Mg_xNi_{1-x})_z(Al_yGa_{1-y})_{2(1-z)}O_{3-2z}$ are possible using non-equilibrium growth methods described herein.

Both $Ni_zGa_{2(1-z)}O_{3-2z}$ and $Ni_zAl_{2(1-z)}O_{3-2z}$ are advantageous for application to UVLED formation. Dilute composition of z≤0.1 was found in accordance with the present disclosure to be advantageous for p-type conductivity creation, and for z~0.5 the ternary cubic crystal symmetry compounds also exhibit direct bandgap at the Brillouin-zone center.

Lanthanides

There exists a large selection of the Lanthanide-metal atomic species available which can be incorporated into the binary $Ga_2O_3$, ternary $(Al_xGa_{1-x})_2O_3$ and binary $Al_2O_3$. The Lanthanide group metals range from the 15 elements starting with Lanthanum (Z=57) to Lutetium (Z=71). In some embodiments, Gadolinium Gd(Z=64) and Erbium Er(Z=68) are utilized for their distinct 4f-shell configuration and ability to form advantageous ternary compounds with $Ga_2O_3$, $GaAlO_3$ and $Al_2O_3$. Again, dilute impurity incorporation of exclusively one specie selected from RE={Gd or Er} incorporated into cation sites of $(RE_xGa_{1-x})_2O_3$, $(RE_xGa_yAl_{1-x-y})_2O_3$ and $(RE_xAl_{1-x})_2O_3$ where 0≤x, y, z≤1 enable tuning of the Fermi energy to form n-type conductivity type material exhibiting corundum, hexagonal and monoclinic crystal symmetry. The inner 4f-shell orbitals of Gd provide opportunity for the electronic bonding to circumvent parasitic optical 4f-to-4f energy level absorption for wavelengths below 250 nm.

Surprisingly, it was found both theoretically and experimentally in accordance with the present disclosure that ternary compounds of $(Er_xGa_{1-x})_2O_3$, and $(Er_xAl_{1-x})_2O_3$ for the case of x~0.5 exhibit cubic crystal symmetry structures with direct bandgaps. It is known to have a bixbyite crystal symmetry for binary Erbium-Oxide $Er_2O_3$ which can be formed epitaxially as single crystal films on Si(111) substrates. However, the lattice constant available by bixbyite $Er_2O_3$ is not readily applicable for seeding epitaxial films of $Ga_2O_3$, $GaAlO_3$ and $Al_2O_3$. In accordance with the present disclosure, it was discovered that graded composition incorporation along a growth direction of Er increasing from 0 to 0.5 is necessary for creating the necessary final surface commensurate for epitaxy of monoclinic $Ga_2O_3$. Cubic crystal symmetry forms of $(Er_xGa_{1-x})_2O_3$, 0≤x≤0.5 may be utilized, such as compositions exhibiting direct bandgap.

Of particular interest is the orthorhombic ternary composition of $(Er_xAl_{1-x})_2O_3$ with x~0.5 having lattice constants (a=5.18 A, b=5.38 A, c=7.41) and exhibiting a well-defined direct energy bandgap of $E_G$(k=0) of approximately 6.5 to 7 eV. Such a structure can be deposited on monoclinic $Ga_2O_3$ and corundum $Al_2O_3$ substrates or epilayers. As mentioned, the inner $Er^{3+}$4f-4f transitions are not presented in the E-k band structure and are therefore classed as non-parasitic absorption for the application of UVLEDs.

Bismuth (Bi)

Bismuth is a known specie which acts as a surfactant for GaN non-equilibrium epitaxy of thin Gallium-Nitride GaN films. Surfactants lower the surface energy for an epitaxial film formation but in general are not incorporated within the growing film. Incorporation of Bi even in Gallium Arsenide is low. Bismuth is a volatile specie having high vapor pressure at low growth temperatures and would appear to be a poor adatom for incorporation into a growing epitaxial film. Surprisingly however, the incorporation of Bi into $Ga_2O_3$, (Ga, Al)$O_3$ and $Al_2O_3$ at dilute levels x≤0.1 is extremely efficient using the non-equilibrium growth methods described in the present disclosure. For example, elemental sources of Bi, Ga and Al can be co-deposited with an overpressure ratio of activated Oxygen (namely, atomic Oxygen, Ozone and Nitrous Oxide). It was found in accordance with the present disclosure that Bi incorporation in the monoclinic and corundum crystal symmetry $Ga_2O_3$ and $(Ga_x,Al_{1-x})_2O_3$ for x≤0.5 exhibits a conductivity type character that creates an activated hole carrier concentration suitable as a p-type conductivity region for UVLED function.

Yet higher Bi atomic incorporation x>0.1 enables band structure tuning of $(Bi_xGa_{1-x})_2O_3$ and $(Bi_xAl_{1-x})_2O_3$ ternary compositions and indeed all the way to stoichiometric binary Bismuth Oxide $Bi_2O_3$. Monoclinic $Bi_2O_3$ forms lattice constants of (a=12.55 A, b=5.28 and c=5.67 A) which is commensurate with strained layer film growth directly on monoclinic $Ga_2O_3$.

Furthermore, orthorhombic and trigonal forms may be utilized in some embodiments, exhibiting native p-type conductivity character and indirect bandgap.

Particular interest is toward the orthorhombic crystal symmetry composition of $(Bi_xAl_{1-x})_2O_3$ where for the case of x=1/3 exhibits an E-k dispersion that is direct and having $E_G$=4.78-4.8 eV.

Palladium (Pd)

The addition of Pd to Ga2$O_3$, (Ga, Al)$O_3$ and $Al_2O_3$ may be utilized in some embodiments to create metallic behavior and is applicable for the formation of ohmic contacts. In some embodiments, Palladium Oxide PdO can be used as an in-situ deposited semi-metallic ohmic contact for n-type wide bandgap metal oxide owing to the intrinsically low work function of the compound (refer to FIG. 9).

Iridium (Ir)

Iridium is a preferred Platinum-group metal for incorporation into $Ga_2O_3$, (Ga, Al)$O_3$ and $Al_2O_3$. It was found in accordance with the present disclosure that Ir may bond in a large variety of valence states. In general, the rutile crystal symmetry form of $IrO_2$ composition is known and exhibits a semi-metallic character. Surprisingly, the triply charged $Ir^{3+}$ valence state is possible using non-equilibrium growth methods and is a preferred state for application to incorporation with $Ga_2O_3$ and in particular corundum crystal symmetry. Iridium has one of the highest melting points and lowest vapor pressures when heated. The present disclosure utilizes electron-beam evaporation to form an elemental pure beam of Ir specie impinging upon a growth surface. If activated oxygen is supplied in coincidence and a corundum $Ga_2O_3$ surface presented for epitaxy, corundum crystal symmetry form of $Ir_2O_3$ composition can be realized. Furthermore, by co-depositing with pure elemental beams of Ir and Ga with activated oxygen, compounds of $(Ir_xGa_{1-x})_2O_3$ for 0≤x≤1.0 can be formed. Furthermore, by co-depositing with pure elemental beams of Ir and Al with activated oxygen, ternary compounds of $(Ir_xAl_{1-x})_2O_3$ for 0≤x≤1.0 can be formed. The addition of Ir to a host metal oxide comprising at least one of $Ga_2O_3$, (Ga, Al)$O_3$ and $Al_2O_3$ can reduce the effective bandgap. Furthermore, for Ir fractions of x>0.25 the bandgap is exclusively indirect in nature.

Lithium (Li)

Lithium is a unique atomic specie especially when incorporated with oxygen. Pure Lithium metal readily oxidizes, and Lithium Oxide ($Li_2O$) is readily formed using non-equilibrium growth methods of pure elemental Li beam and activated oxygen directed toward a growth surface of definite surface crystal symmetry. Cubic crystal symmetry $Li_2O$ exhibits a large indirect bandgap Eg~6.9 eV with lattice constants (a=b=c=4.54 A). Lithium is a mobile atom if present in a defective crystal structure, and it is this property which is exploited in Li-ion battery technology. The present disclosure, in contradistinction, seeks to rigidly incorporate Li-atoms within a host crystal matrix comprising at least one of $Ga_2O_3$, (Ga, Al)$O_3$ and $Al_2O_3$. Again, dilute Li concentrations can be incorporated onto substitutional metal sites of $Ga_2O_3$, (Ga, Al)$O_3$ and $Al_2O_3$. For example, for a valence state of $Li^{+1}$ these compositions may be utilized:

$$(Li_2O)_x(Ga_2O_3)_{1-x}=Li_{2x}Ga_{2(1-x)}O_{3-2x}, \text{ where } 0\leq x\leq 1;$$
and $$(Li_2O)_x(Al_2O_3)_{1-x}=Li_{2x}Al_{2(1-x)}O_{3-2x}, \text{ where } 0\leq x\leq 1.$$

Stoichiometric forms of $Li_{2x}Ga_{2(1-x)}O_{3-2x}$ for x=0.5 provide for $LiGaO_2$, and $Li_{2x}Al_{2(1-x)}O_{3-2x}$ for x=0.5 provide for $LiAlO_2$.

Both $LiGaO_2$ and $LiAlO_2$ crystalize in preferred orthorhombic and trigonal forms having direct and indirect bandgap energies, respectively, with $E_G(LiGaO_2)$=5.2 eV and $E_G(LiALO_2)$~8 eV.

Of particular interest is the relatively small valence band curvature in both suggesting a smaller hole effective mass compared to $Ga_2O_3$.

The lattice constants of $LiGaO_2$ (a=5.09 A, b=5.47, c=6.46 A) and $LiAlO_2$ are (a=b=2.83 A, c=14.39 A). As bulk Li(Al, Ga)$O_2$ substrates may be utilized, orthorhombic and trigonal quaternary compositions such as $Li(Al_xGa_{1-x})O_2$ may also be utiliized thereby enabling UVLED operation for the optical emissive region.

Li impurity incorporation within even cubic NiO can enable improved p-type conduction and can serve as a possible electrical injector region for holes applied to the UVLED.

Yet a further composition in some embodiments is ternary comprising Lithium-Nickel-Oxide $Li_xNi_yO_z$. Theoretical calculations provide insight toward the possible higher valence states of $Ni^{2+}$ and $Li^{2+}$. An electronic composition comprising $Li_2^{(+4)}Ni^{+2}O_3^{(-6)}=Li_2NiO_3$ may be utilized to create via non-equilibrium growth techniques forming a monoclinic crystal symmetry. It was found in accordance with the present disclosure that $Li_2NiO_3$ forms an indirect bandgap of $E_G$~5 eV. Yet another composition is the trigonal crystal symmetry (R3m) where $Li^{+1}$ and $Ni^{+1}$ valence states form the composition $Li_2NiO_2$ having a direct bandgap between s-like and p-like states of $E_G$=8 eV, however the strong d-like states from Ni create crystal momentum independent mid bandgap energy states continuous across all the Brillouin zones.

Nitrogen and Fluorine Anion Substitution

Furthermore, it has been found in accordance with the present disclosure that selected anion crystal modifiers to the disclosed metal oxide compositions may be selected from at least one of a nitrogen (N) and fluorine (F) specie. Similar to p-type activated hole concentration creation in binary $Ga_2O_3$ and ternary $(Ga_xAl_{1-x})_2O_3$ by substitutional incorporation of a group-III metal cation site by a group-II metal specie, it is further possible to substitute an oxygen anion site during epitaxial growth by an activated Nitrogen atom (e.g., neutral atomic nitrogen species in some embodiments). In accordance with the present disclosure, dilute nitrogen incorporation within a $Ga_2O_3$ host was surprisingly been found to stabilize monoclinic $Ga_2O_3$ compositions during epitaxy. Prolonged exposure of $Ga_2O_3$ during growth to a combination of elemental Ga and neutral atomic fluxes of simultaneous oxygen and nitrogen was found to form competing GaN-like precipitates.

It was also found in accordance with the present disclosure that periodically modulating the $Ga_2O_3$ growth by interrupting the Ga and O fluxes periodically and preferentially exposing the terminated surface exclusively with activated atomic neutral nitrogen enables a portion of the surface to incorporate N on otherwise available O-sites within the $Ga_2O_3$ growth. Spacing these N-layer growth interruptions by a distance greater than 5 or more unit cells of $Ga_2O_3$ along the growth direction enables high density impurity incorporation aiding the achievement of p-type conductivity character in $Ga_2O_3$.

This process may be utilized for both corundum and trigonal forms of $Ga_2O_3$.

In some embodiments, a combination approach of group-II metal cation substation and Nitrogen anion substation may be utilized for controlling the p-type conductivity concentration in $Ga_2O_3$.

Fluorine impurity incorporation into $Ga_2O_3$ is also possible, however elemental fluorine sources are challenging. The present disclosure uniquely utilizes the sublimation of Lithium-Fluoride LiF bulk crystal within a Knudsen cell to provide a compositional constituent of both Li and F which is co-deposited during elemental Ga and Al beams under an activated oxygen environment supplying the growth surface. Such a technique enables the incorporation of Li and F atoms within an epitaxially formed $Ga_2O_3$ or $LiGaO_2$ host.

Figure 44A:
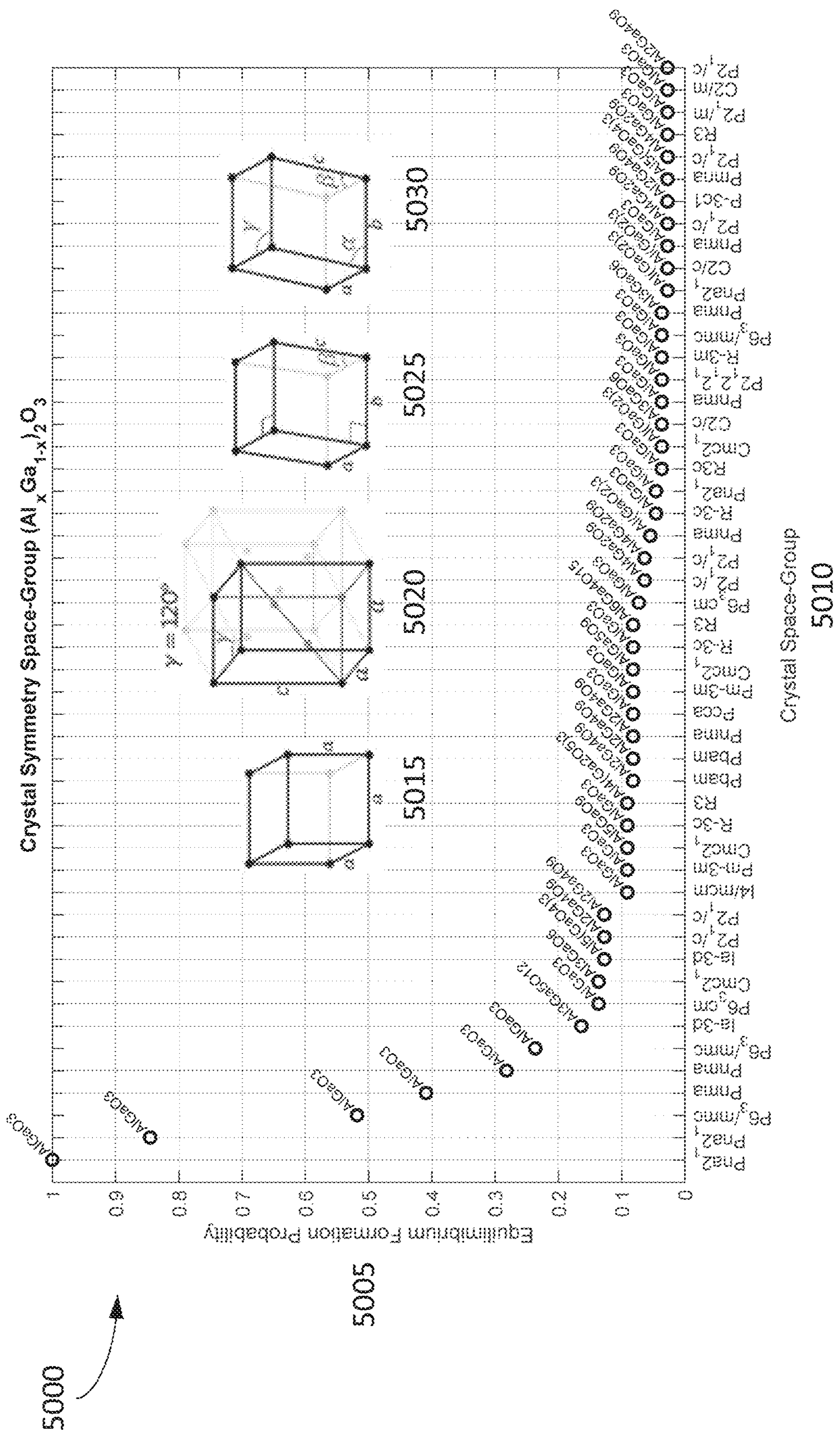
FIG. 44A depicts a calculated formation energy of Aluminum-Gallium-Oxide ternary alloy as a function of composition and crystal symmetry in accordance with an illustrative embodiment of the present disclosure.
Figure 44B:
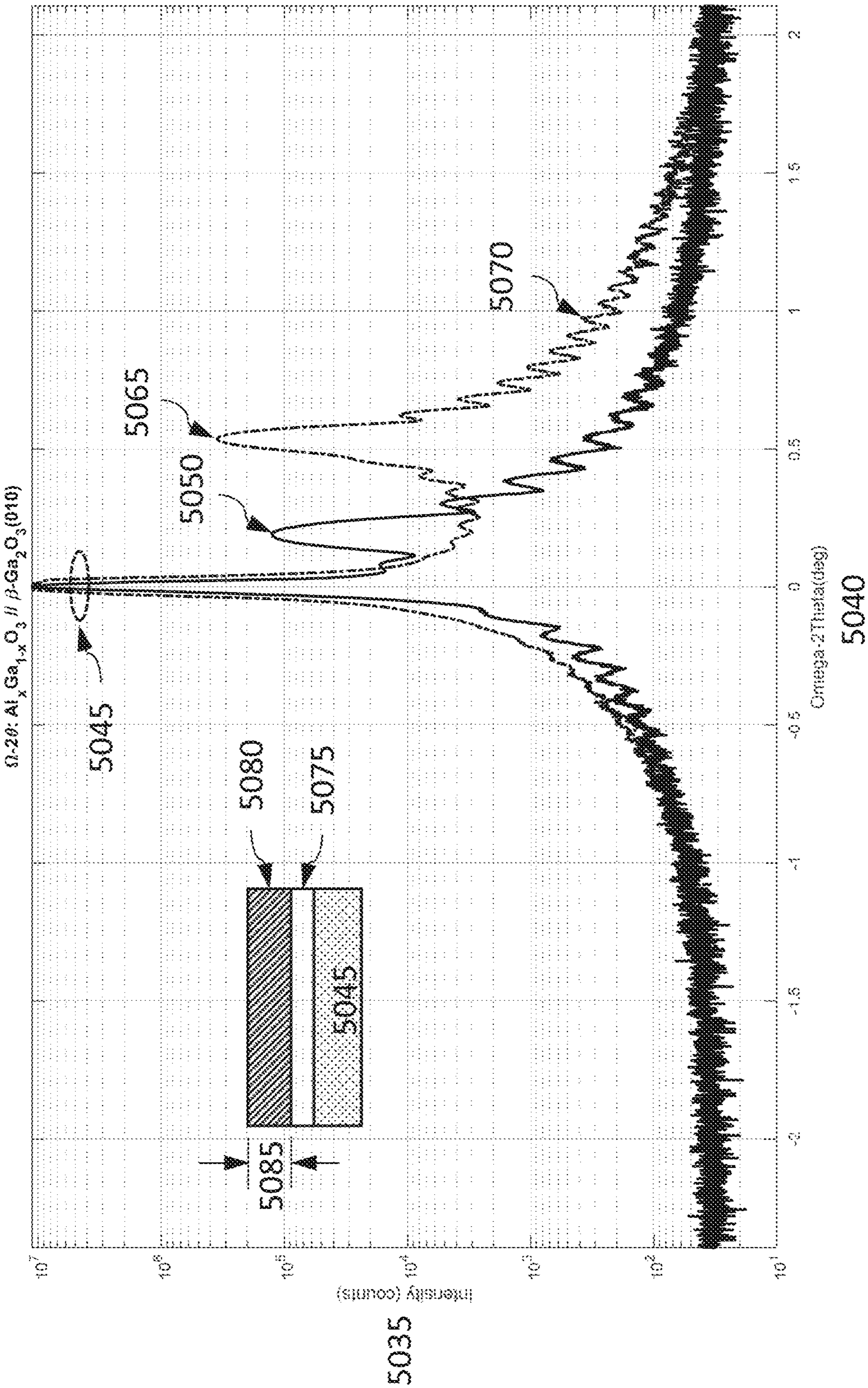
FIG. 44B shows an experimental high-resolution x-ray diffraction (HRXRD) of two example distinct compositions of high-quality single crystal ternary $(Al_xGa_{1-x})_2O_3$ deposited epitaxially on a bulk (010)-oriented $Ga_2O_3$ substrate in accordance with an illustrative embodiment of the present disclosure.
Figure 44C:
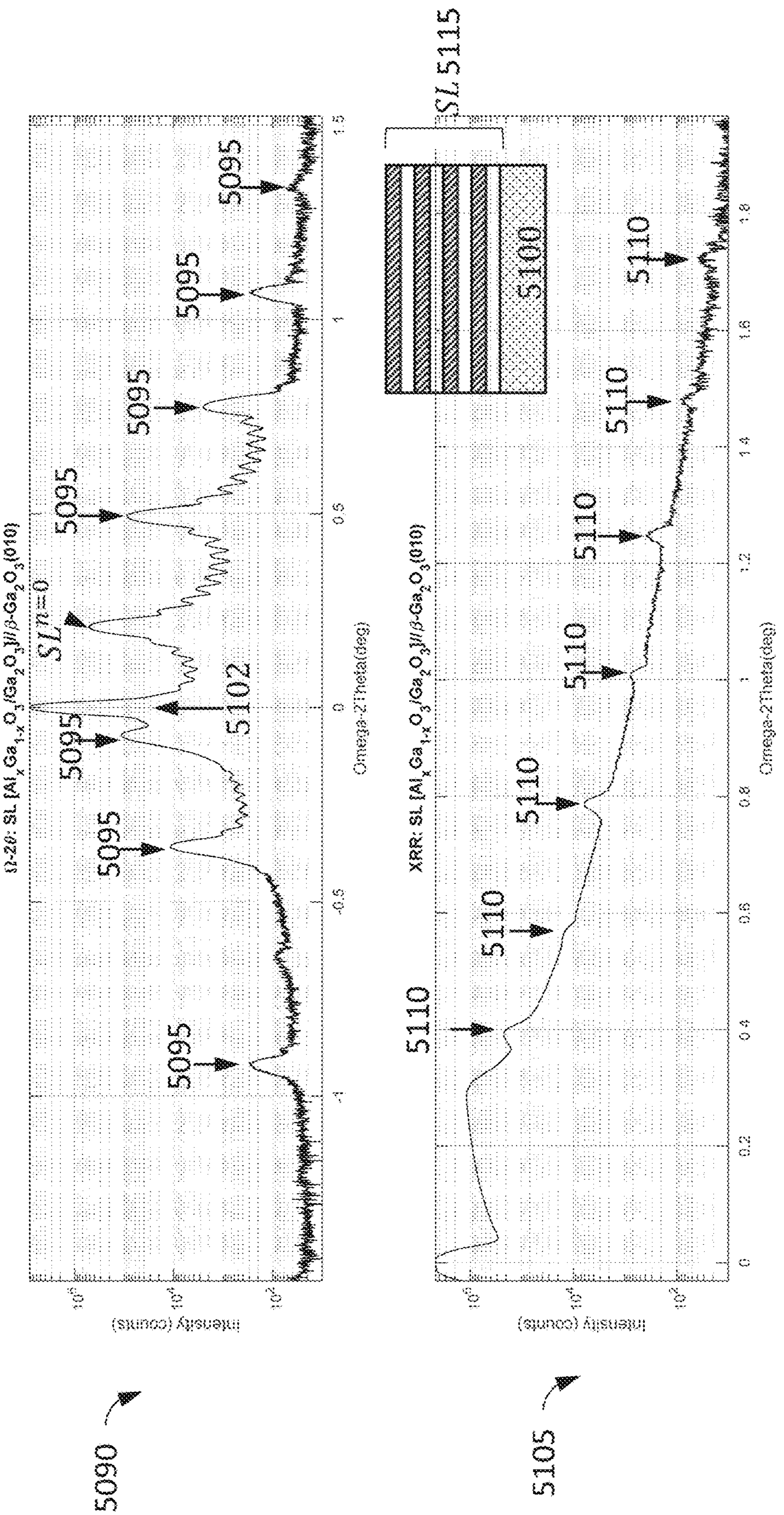
FIG. 44C shows an experimental HRXRD and x-ray grazing incidence reflection (GIXR) of an example superlattice comprising repeating unit cells of bilayers selected from a $[(Al_xGa_{1-x})_2O_3/Ga_2O_3]$ elastically strained to a β-$Ga_2O_3$ (010)-oriented substrate in accordance with an illustrative embodiment of the present disclosure.
Figure 44D:
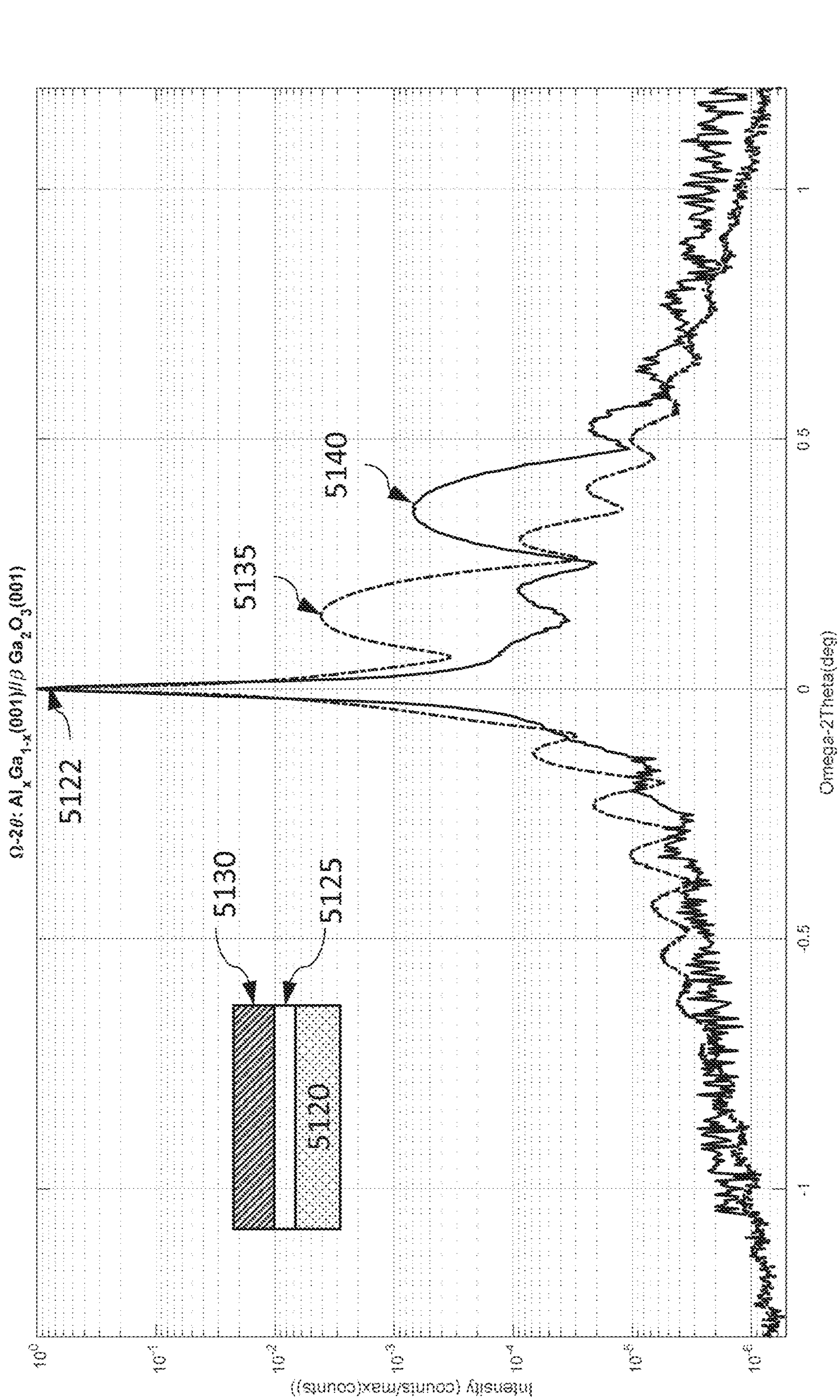
FIG. 44D shows an experimental HRXRD and GIXR of two example distinct compositions of high-quality single crystal ternary $(Al_xGa_{1-x})_2O_3$ layers deposited epitaxially on a bulk (001)-oriented $Ga_2O_3$ substrate in accordance with an illustrative embodiment of the present disclosure.
Figure 44E:
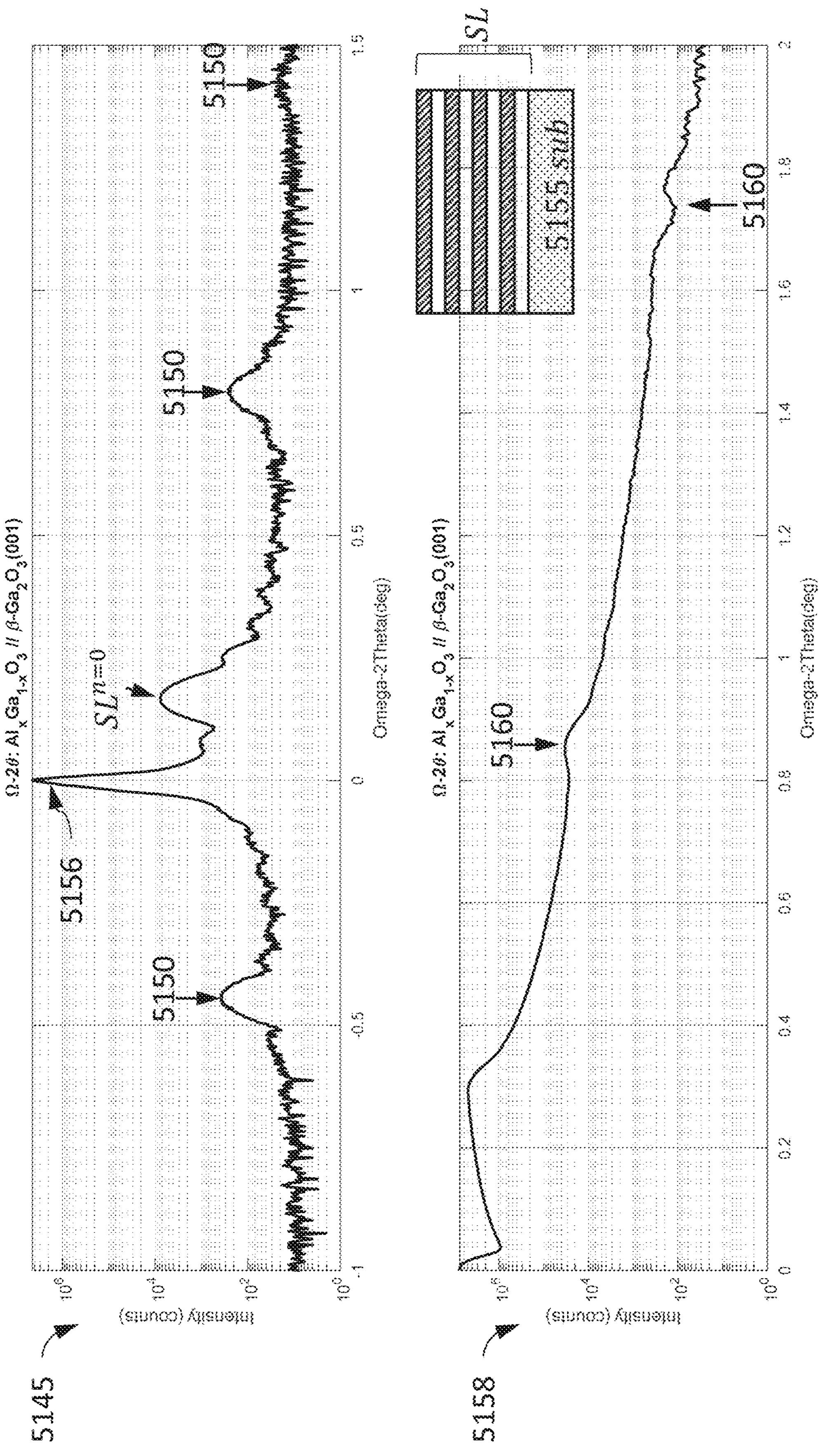
FIG. 44E shows an experimental HRXRD and GIXR of a superlattice comprising repeating unit cells of bilayers selected from a $[(Al_xGa_{1-x})_2O_3/Ga_2O_3]$ elastically strained to a β-$Ga_2O_3$(001)-oriented substrate in accordance with an illustrative embodiment of the present disclosure.
Figure 44F:
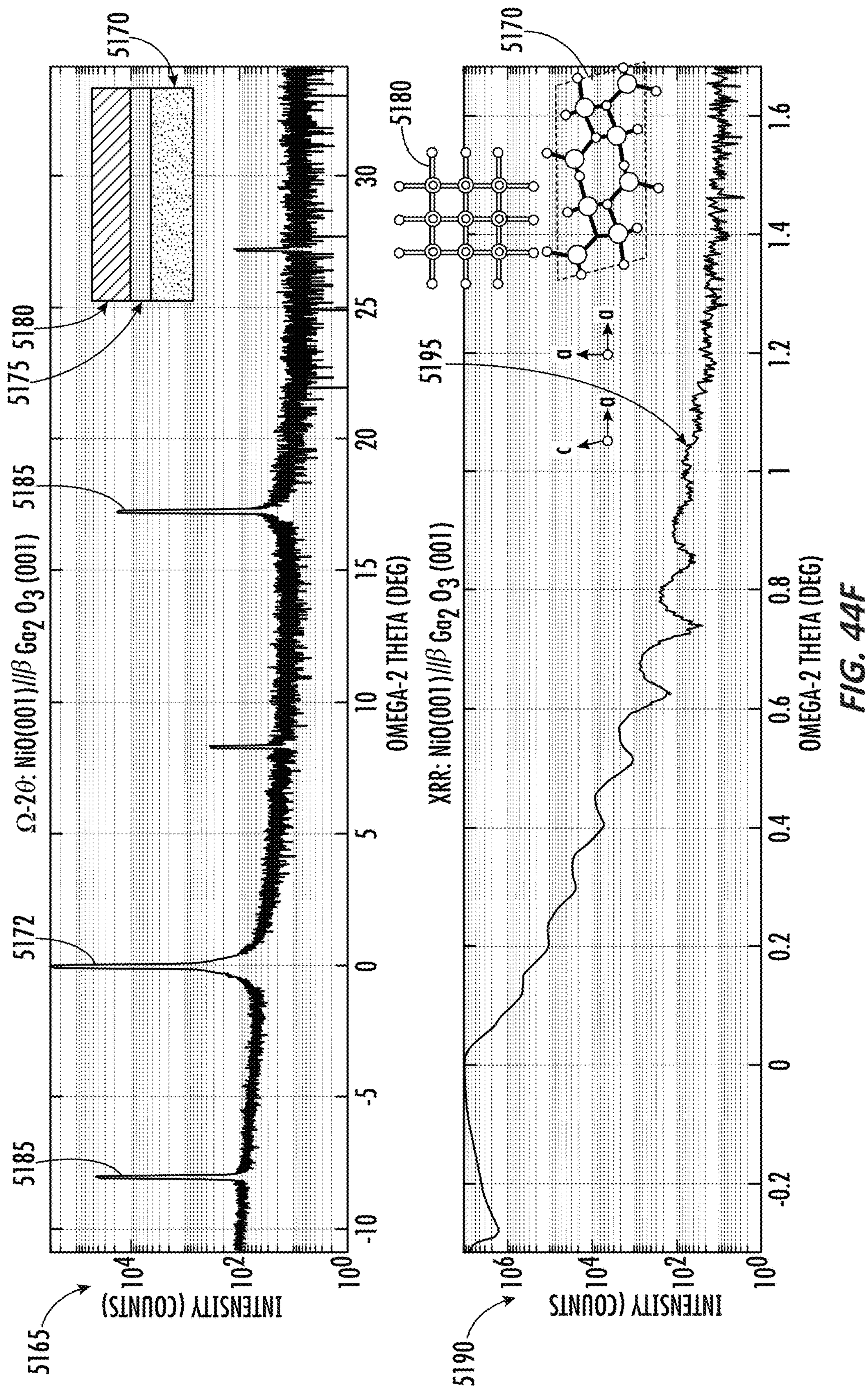
FIG. 44F shows an experimental HRXRD and GIXR of a cubic crystal symmetry binary Nickel Oxide (NiO) epilayer elastically strained to a monoclinic crystal symmetry β-$Ga_2O_3$(001)-oriented substrate in accordance with an illustrative embodiment of the present disclosure.
Figure 44G:
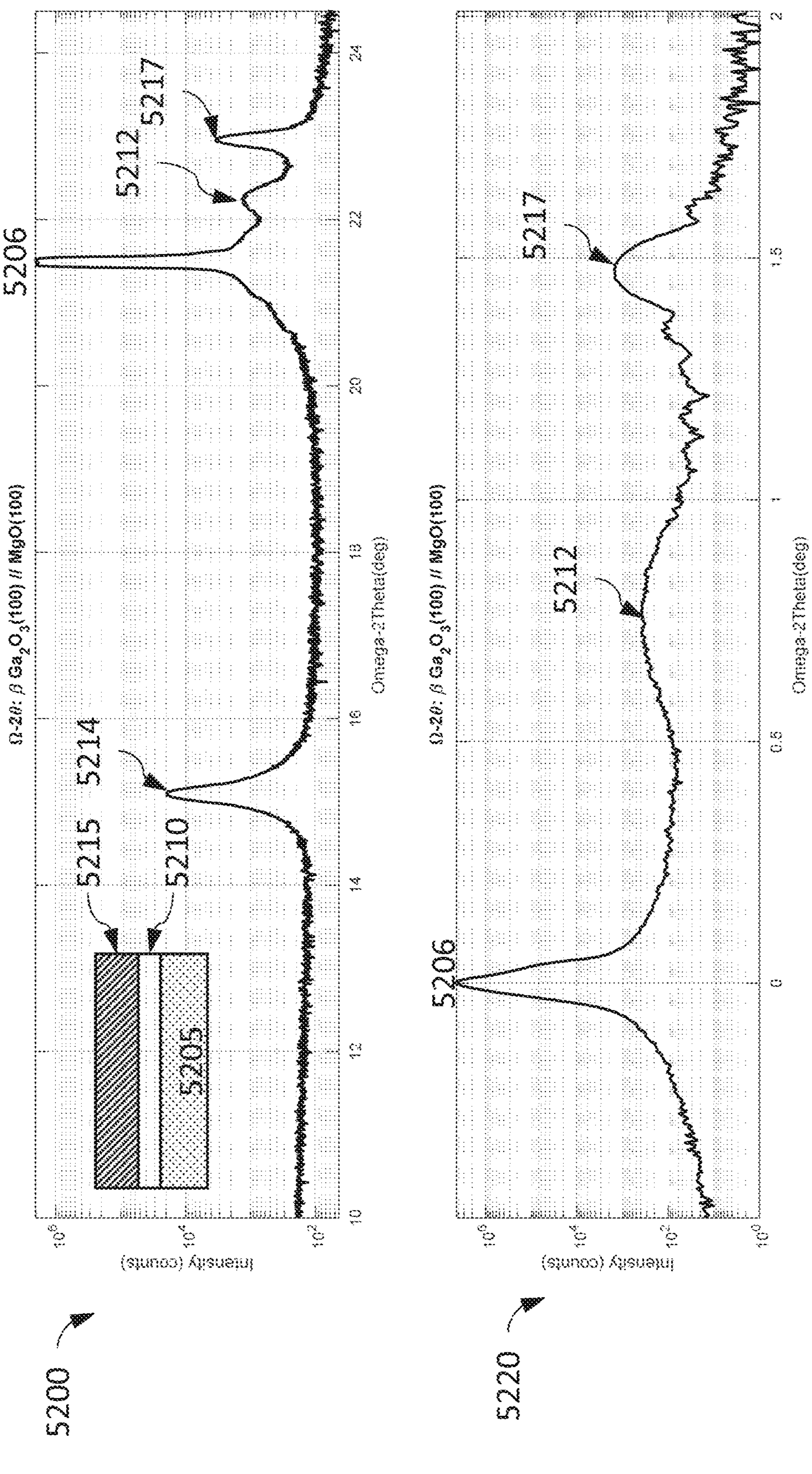
FIG. 44G shows an experimental HRXRD and GIXR of a monoclinic crystal symmetry $Ga_2O_3$(100)-oriented epilayer elastically strained to a cubic crystal symmetry MgO (100)-oriented substrate in accordance with an illustrative embodiment of the present disclosure.
Figure 44H:
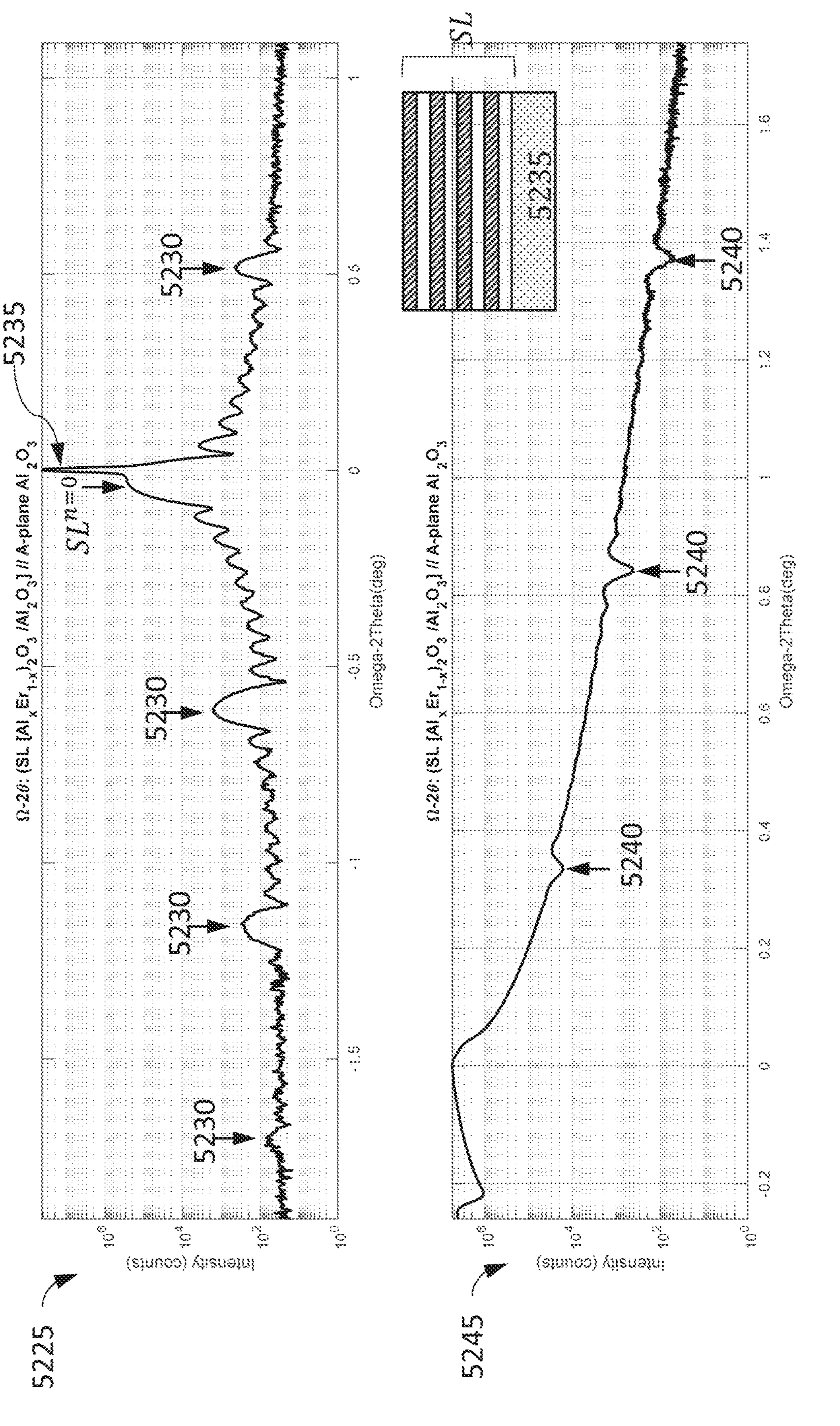
FIG. 44H shows an experimental HRXRD and GIXR of a superlattice comprising repeating unit cells of bilayers selected from a $[(Al_xEr_{1-x})_2O_3/Al_2O_3]$ elastically strained to a corundum crystal symmetry $\alpha$-$Al_2O_3$(001)-oriented substrate in accordance with an illustrative embodiment of the present disclosure.
Figure 44I:
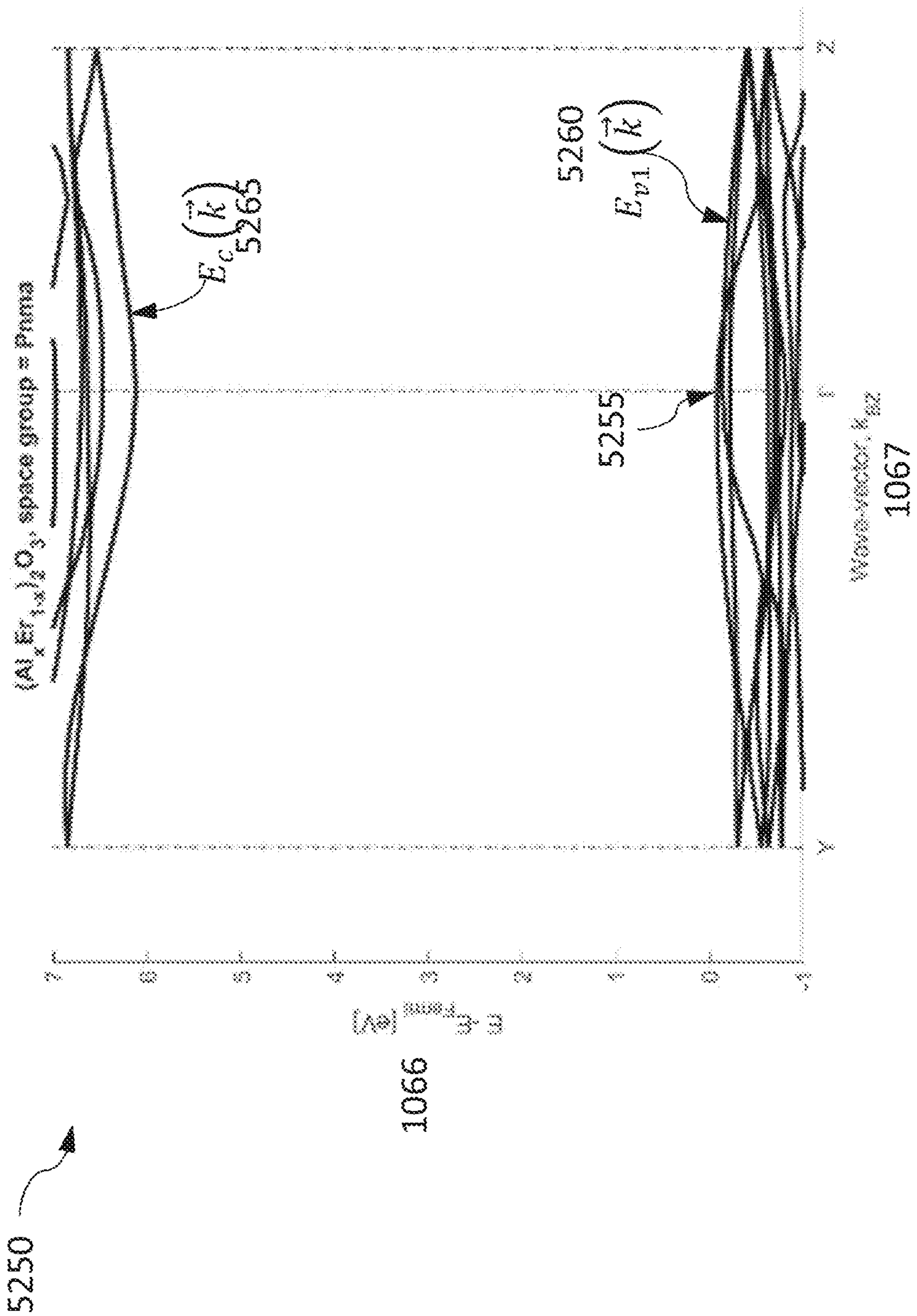
FIG. 44I shows a strain-free energy-crystal momentum (E-k) dispersion in the vicinity of the Brillouin-zone center for the case of a ternary Aluminum-Erbium-Oxide $(Al_xEr_{1-x})_2O_3$ illustrating the direct bandgap at $\Gamma$(k=0) in accordance with an illustrative embodiment of the present disclosure.
Figure 44J:
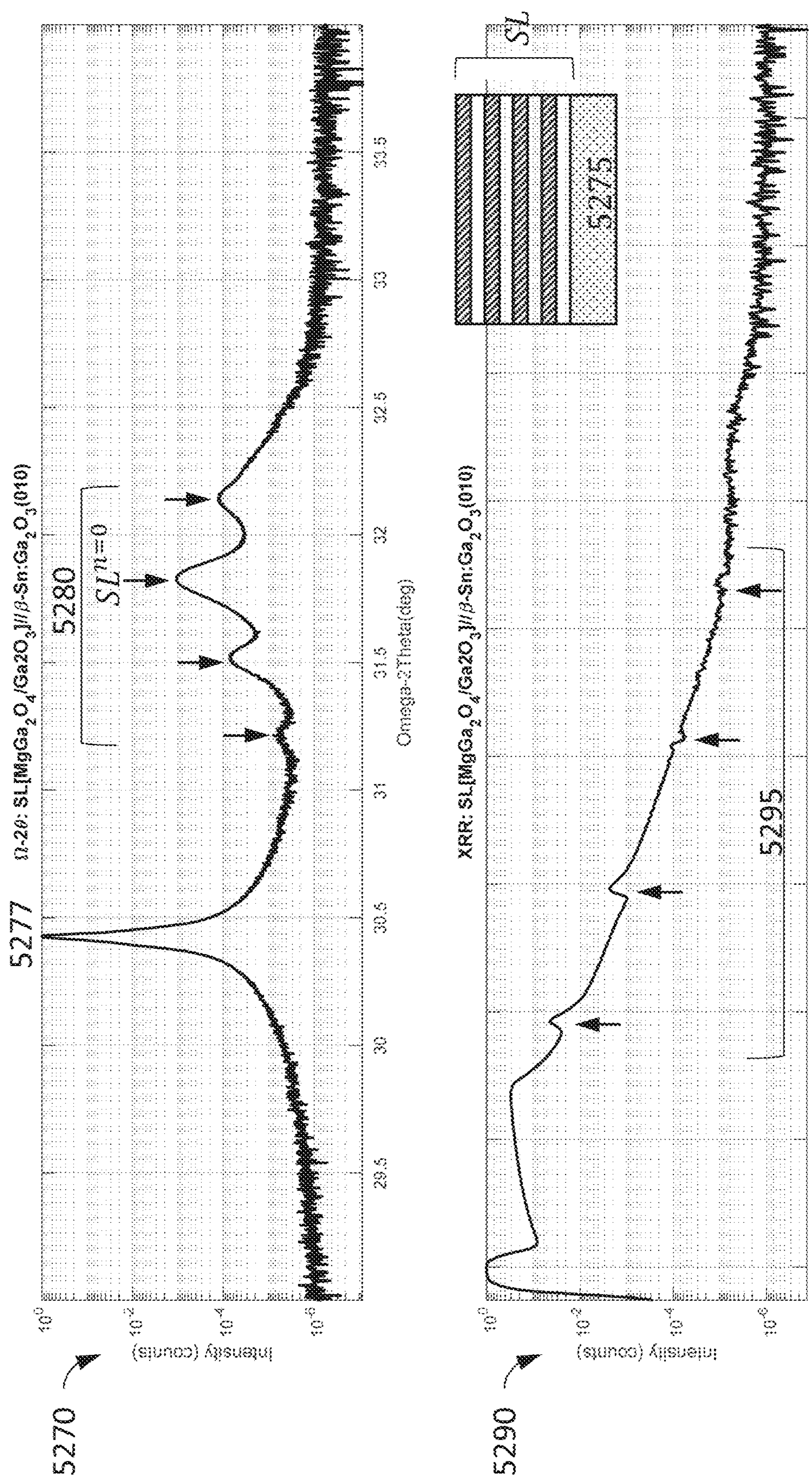
FIG. 44J shows an experimental HRXRD and GIXR of a superlattice comprising bilayered unit cells of a monoclinic crystal symmetry $Ga_2O_3$(100)-oriented film coupled to a cubic (spinel) crystal symmetry ternary composition of Magnesium-Gallium-Oxide, $Mg_xGa_{2(1-x)}O_{3-2x}$ where the SL is epitaxially deposited upon a monoclinic $Ga_2O_3$(010)-oriented substrate in accordance with an illustrative embodiment of the present disclosure.
Figure 44K:
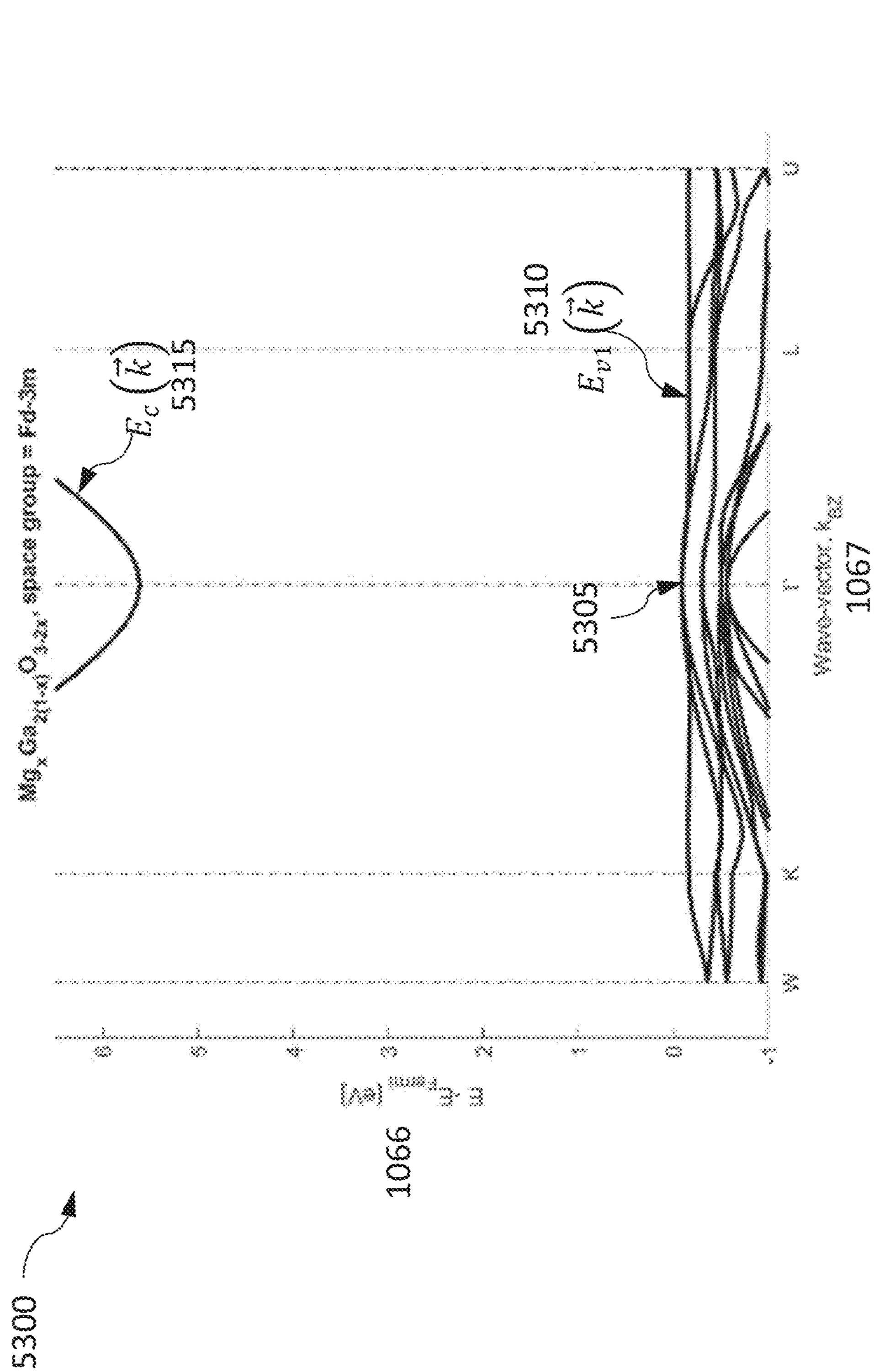
FIG. 44K shows a strain-free energy-crystal momentum (E-k) dispersion in the vicinity of the Brillouin-zone center for the case of ternary Magnesium-Gallium-Oxide $Mg_xGa_{2(1-x)}O_{3-2x}$ illustrating the direct bandgap at $\Gamma$(k=0) in accordance with an illustrative embodiment of the present disclosure.
Figure 44L:
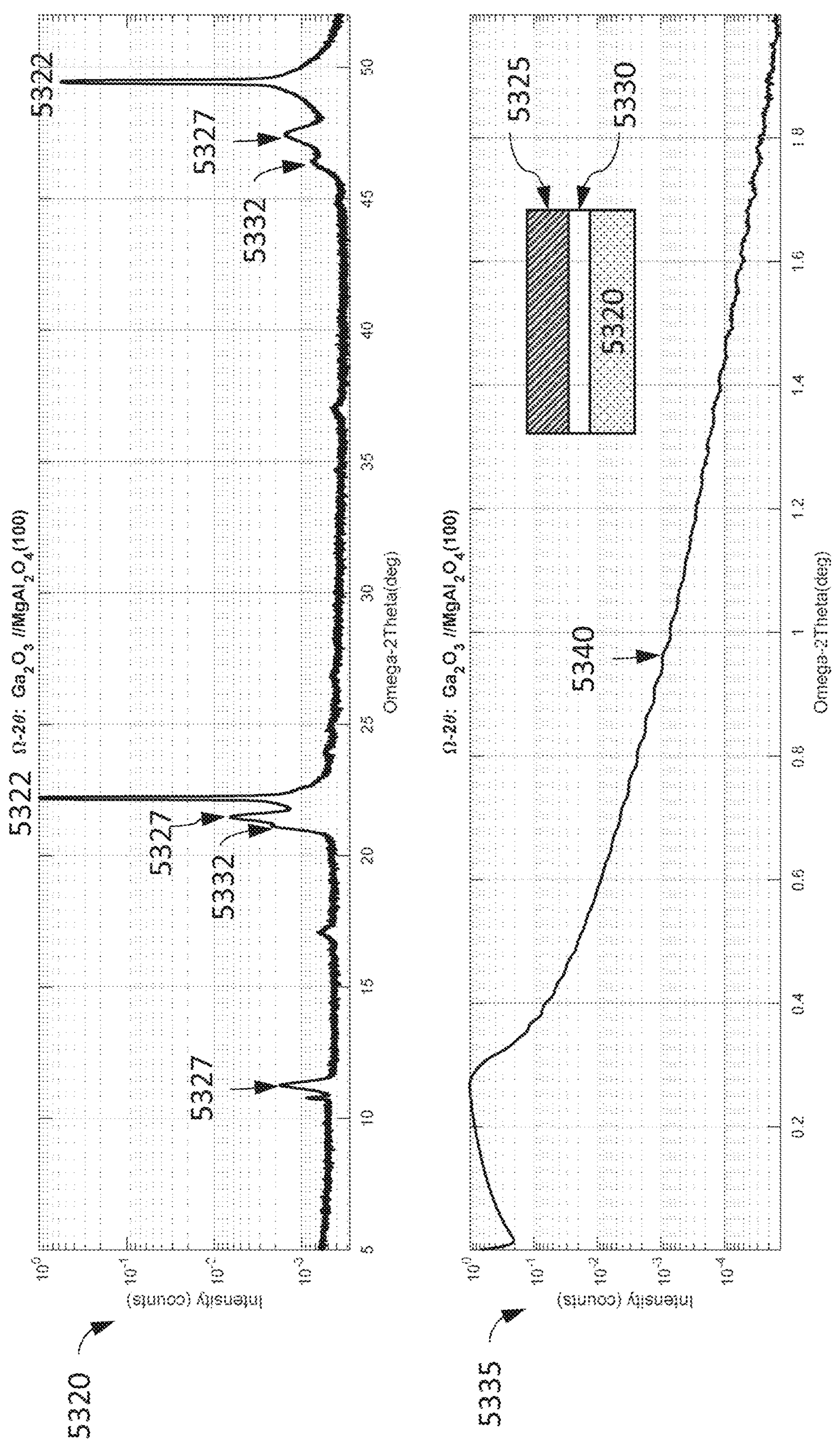
FIG. 44L shows an experimental HRXRD and GIXR of an orthorhombic $Ga_2O_3$ epilayer elastically strained to a cubic crystal symmetry Magnesium-Aluminum-Oxide $MgAl_2O_4$(100)-oriented substrate in accordance with an illustrative embodiment of the present disclosure.
Figure 44M:
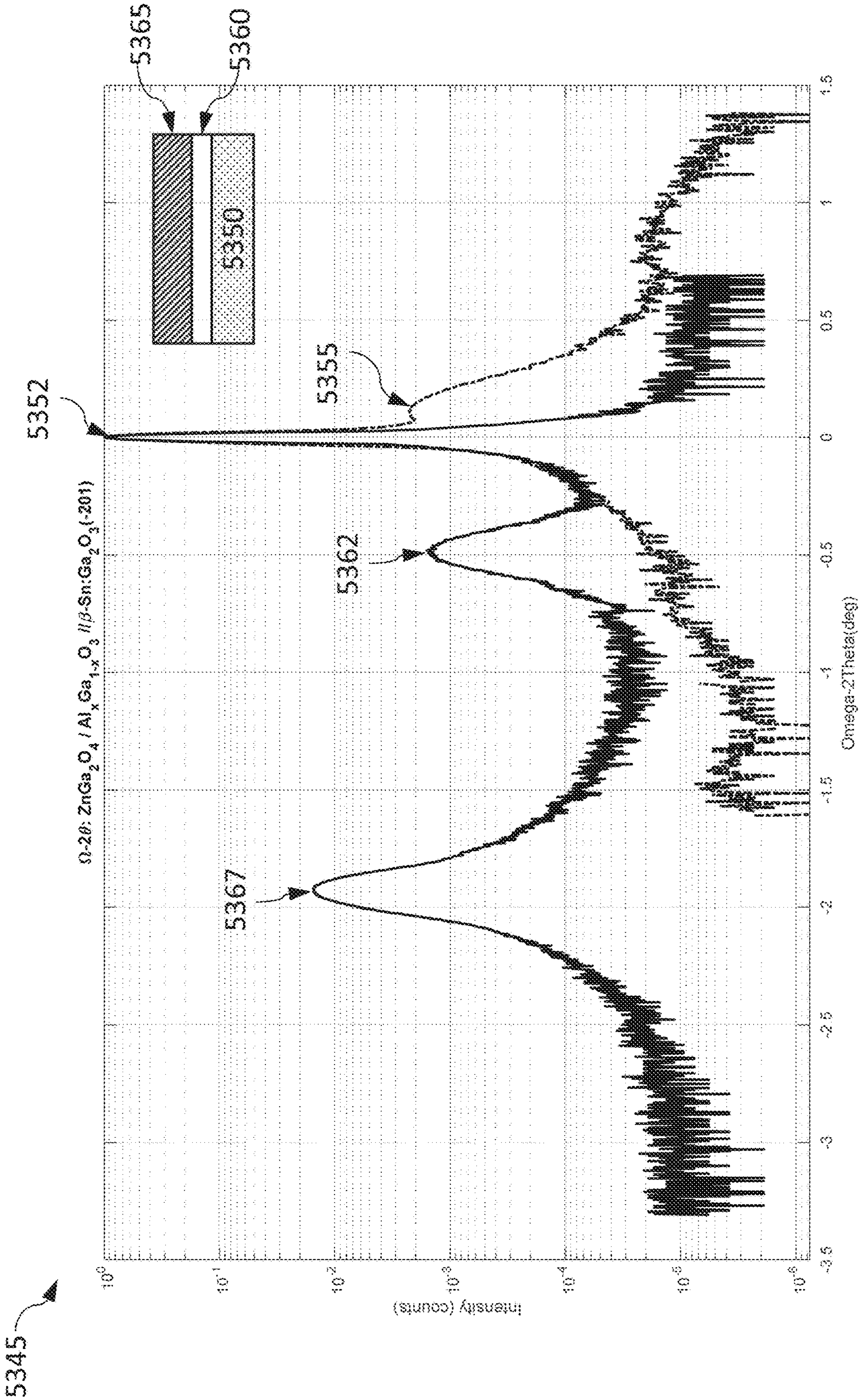
FIG. 44M shows an experimental HRXRD of a ternary Zinc-Gallium-Oxide $ZnGa_2O_4$ epilayer elastically strained to a wurtzite Zinc-Oxide ZnO layer deposited upon a monoclinic crystal symmetry Gallium-Oxide (−201)-oriented substrate in accordance with an illustrative embodiment of the present disclosure.
Figure 44N:
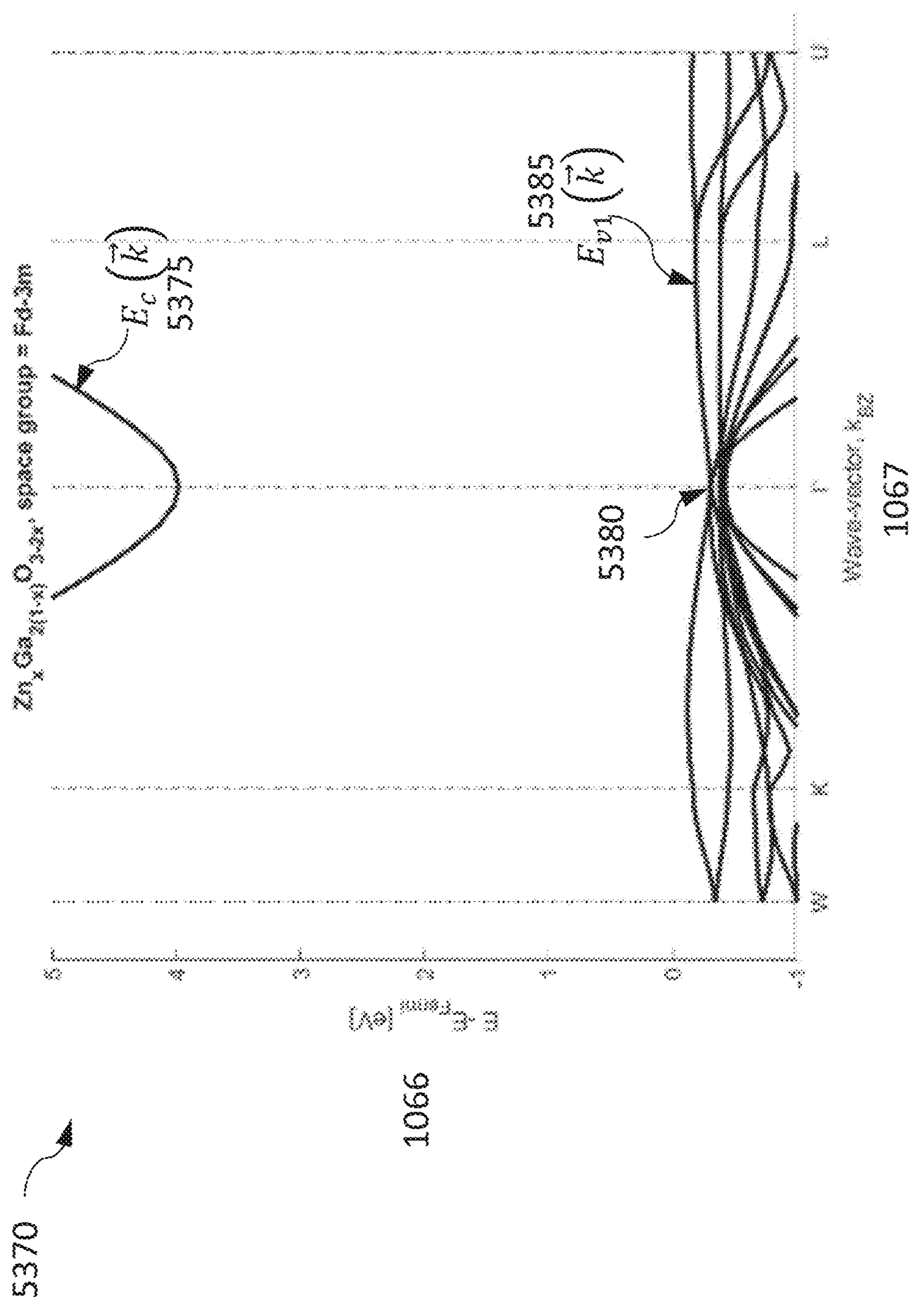
FIG. 44N shows an energy-crystal momentum (E-k) dispersion in the vicinity of the Brillouin-zone center for the case of ternary cubic Zinc-Gallium-Oxide $Zn_xGa_{2(1-x)}O_{3-2x}$, where x=0.5 illustrating the indirect bandgap at $\Gamma$(k=0) in accordance with an illustrative embodiment of the present disclosure.
Figure 44O:
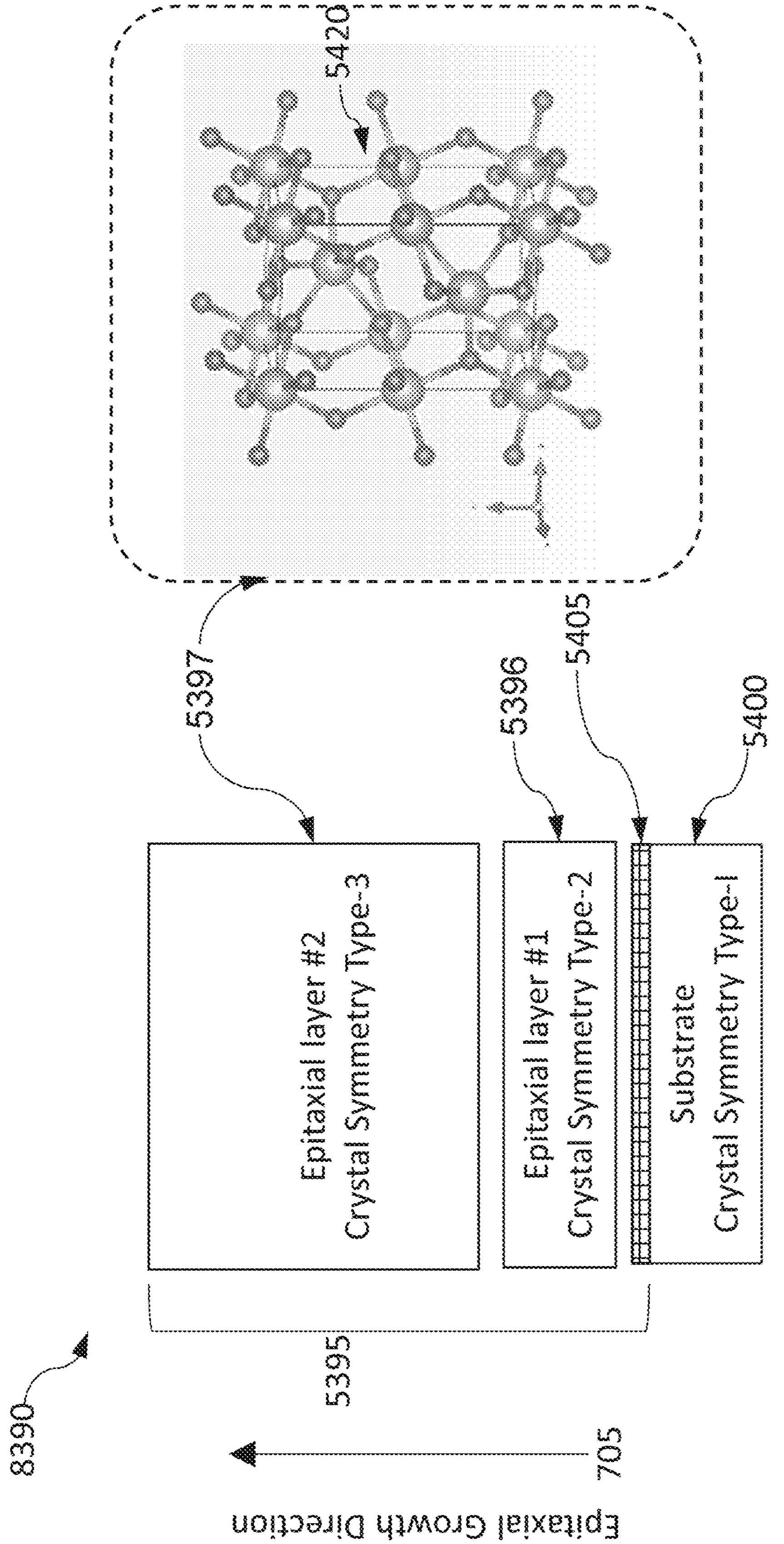
FIG. 44O shows an epitaxial layer stack deposited along a growth direction for the case of an orthorhombic $Ga_2O_3$ crystal symmetry film using an intermediate layer and a prepared substrate surface in accordance with an illustrative embodiment of the present disclosure.
Figure 44P:
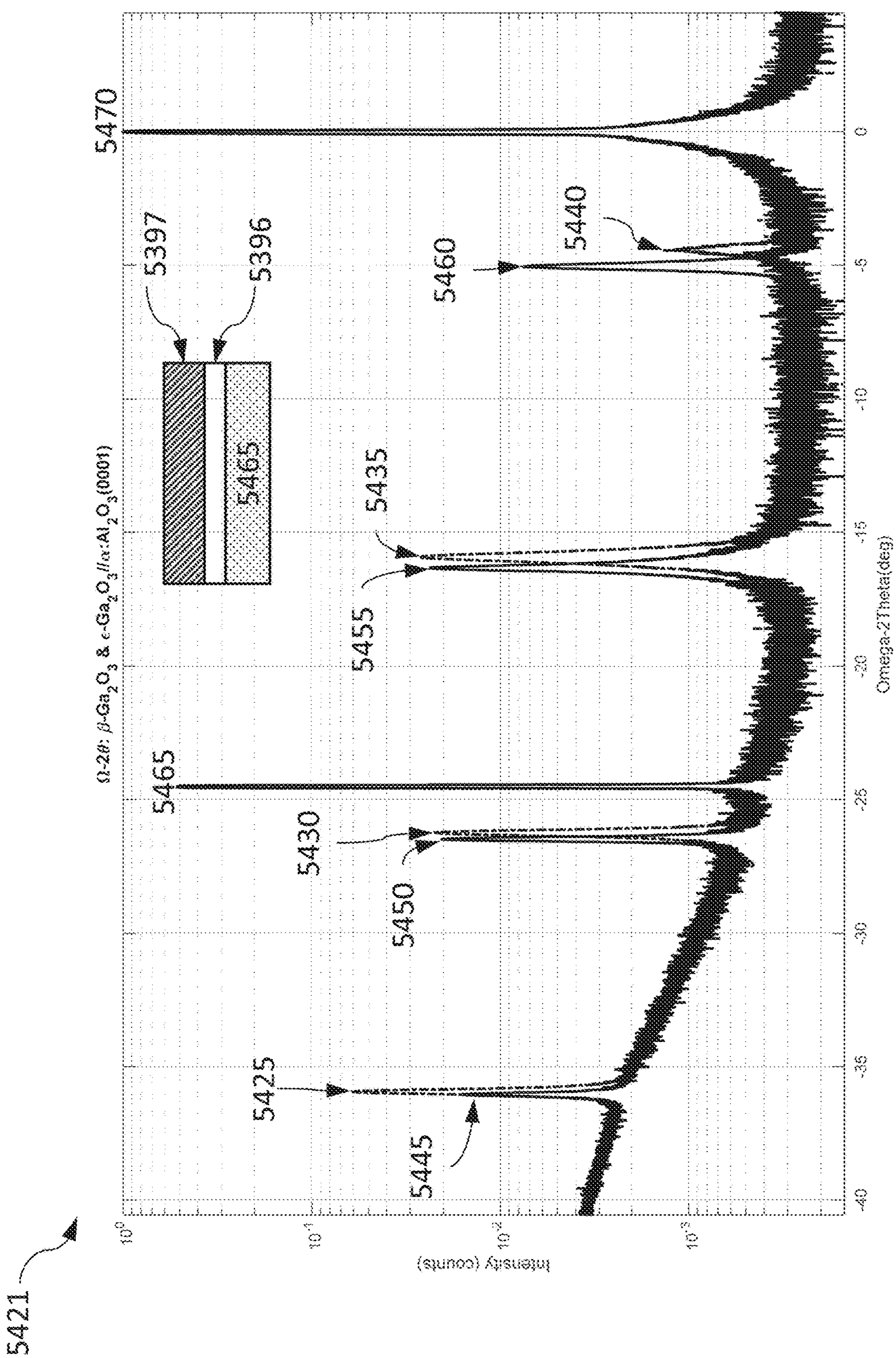
FIG. 44P shows an experimental HRXRD of two distinctly different crystal symmetry binary $Ga_2O_3$ compositions deposited upon a rhombic Sapphire $\alpha$-$Al_2O_3$(0001)-oriented substrate controlled via growth conditions in accordance with an illustrative embodiment of the present disclosure.
Figure 44Q:
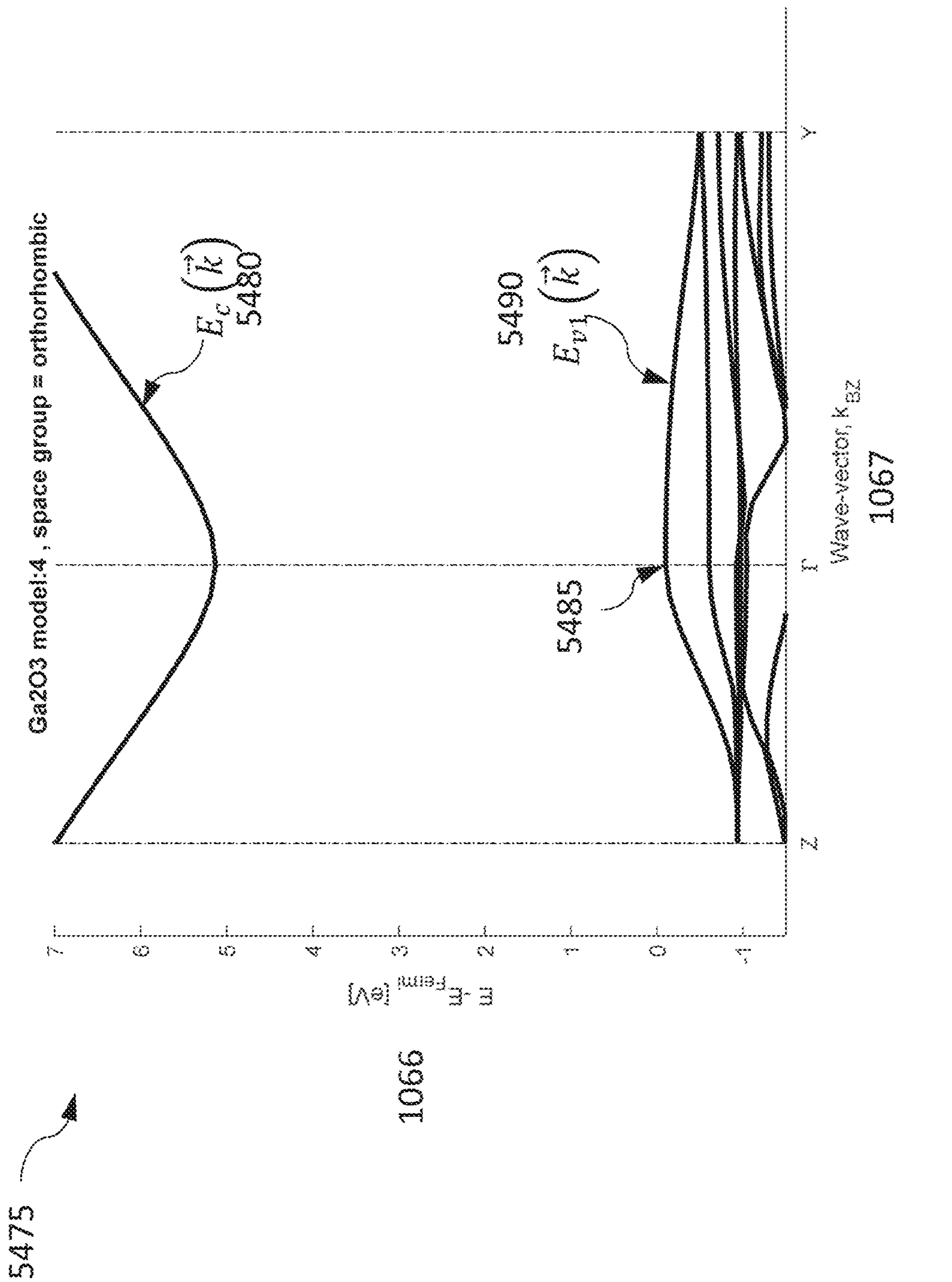
FIG. 44Q shows a strain-free energy-crystal momentum (E-k) dispersion in the vicinity of the Brillouin-zone center for the case of binary orthorhombic Gallium-Oxide illustrating the direct bandgap at $\Gamma$(k=0) in accordance with an illustrative embodiment of the present disclosure.
Figure 44R:
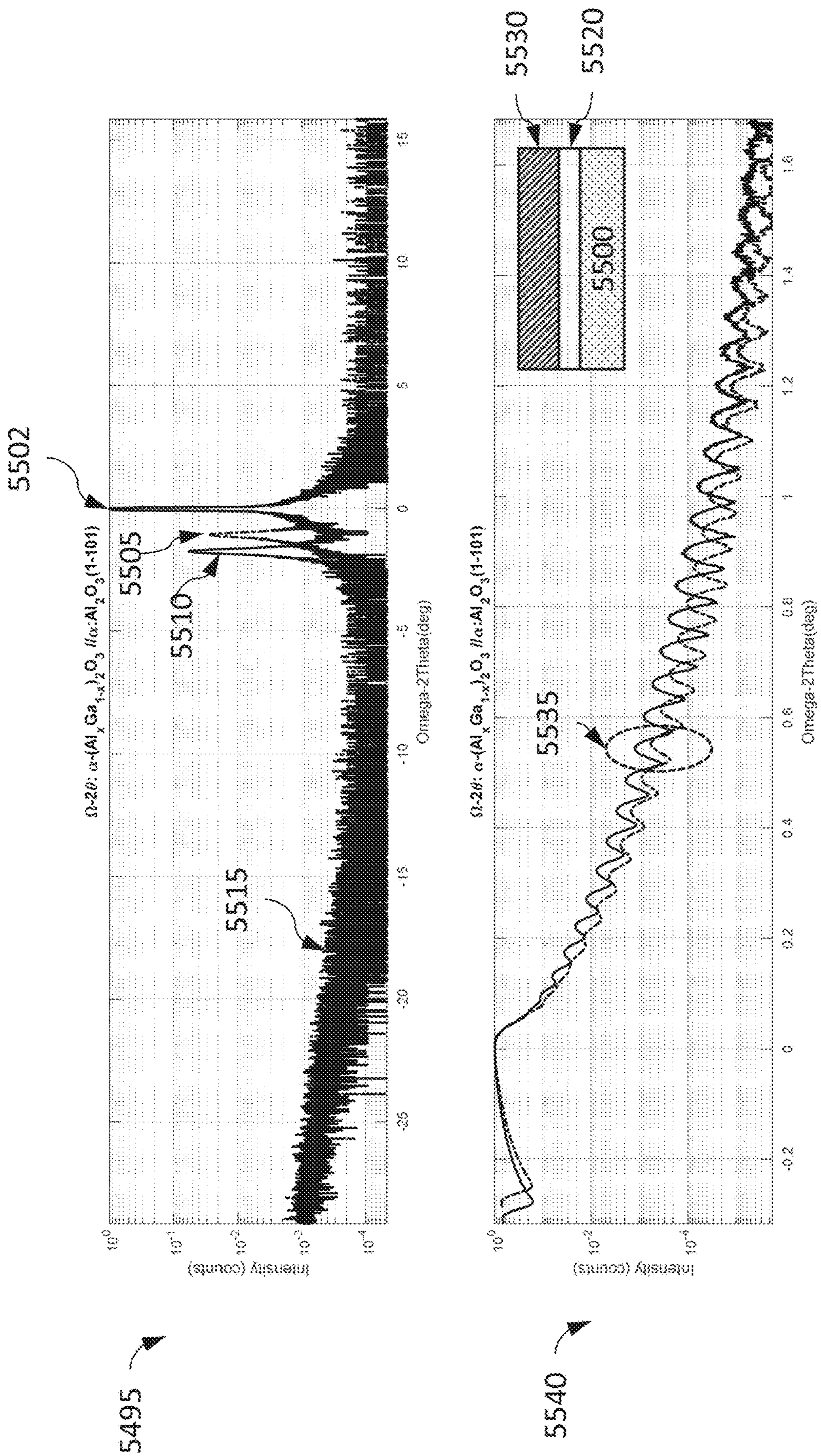
FIG. 44R shows an experimental HRXRD and GIXR of two example distinct compositions of high-quality single crystal corundum symmetry ternary $(Al_xGa_{1-x})_2O_3$ deposited epitaxially on a bulk (1-100)-oriented corundum crystal symmetry $Al_2O_3$ substrate in accordance with an illustrative embodiment of the present disclosure.
Figure 44S:
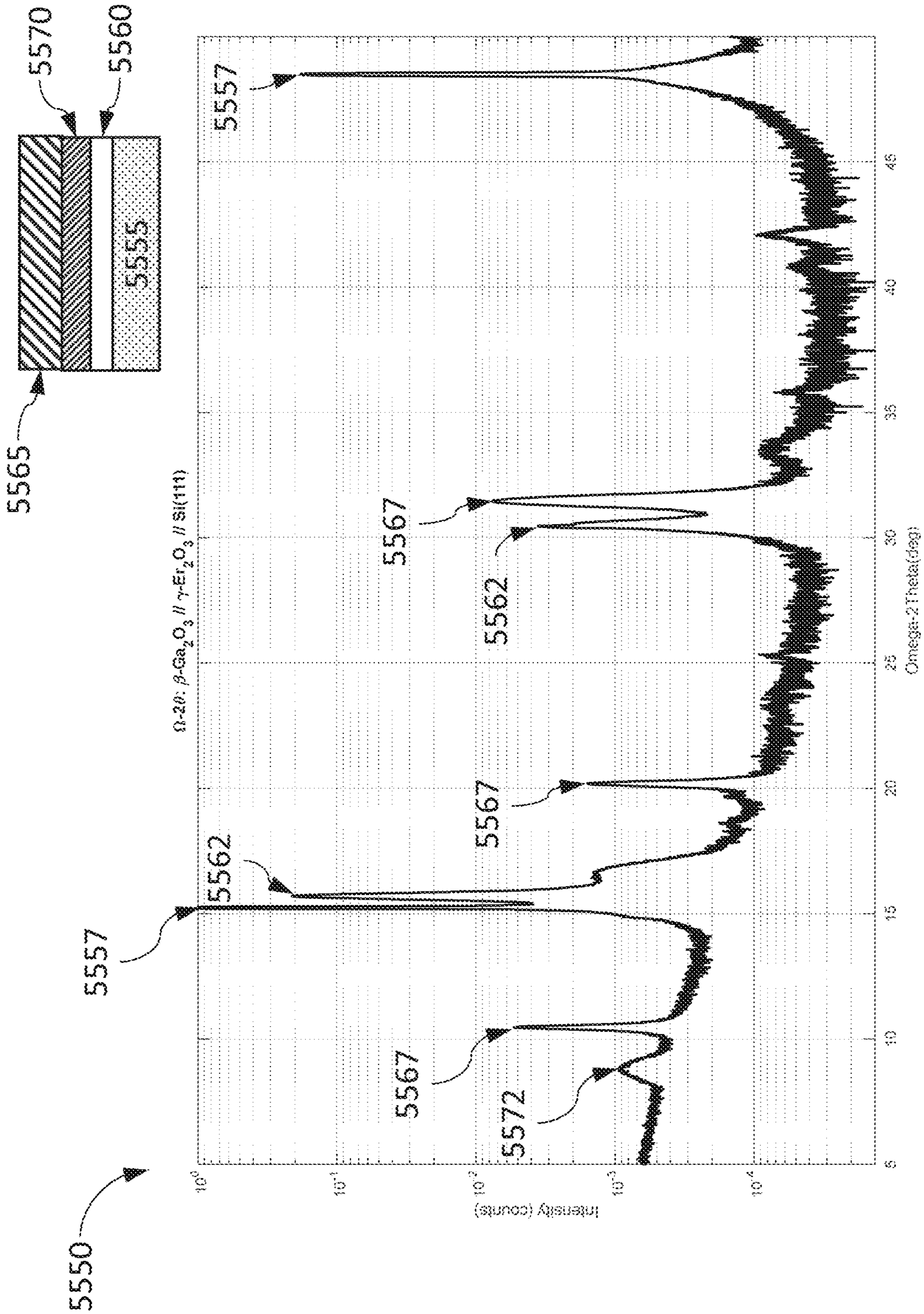
FIG. 44S shows an experimental HRXRD of a monoclinic topmost active $Ga_2O_3$ epilayer deposited upon a ternary Erbium-Gallium-Oxide $(Er_xGa_{1-x})_2O_3$ transition layer deposited upon a single crystal Silicon (111)-oriented substrate in accordance with an illustrative embodiment of the present disclosure.
Figure 44T:
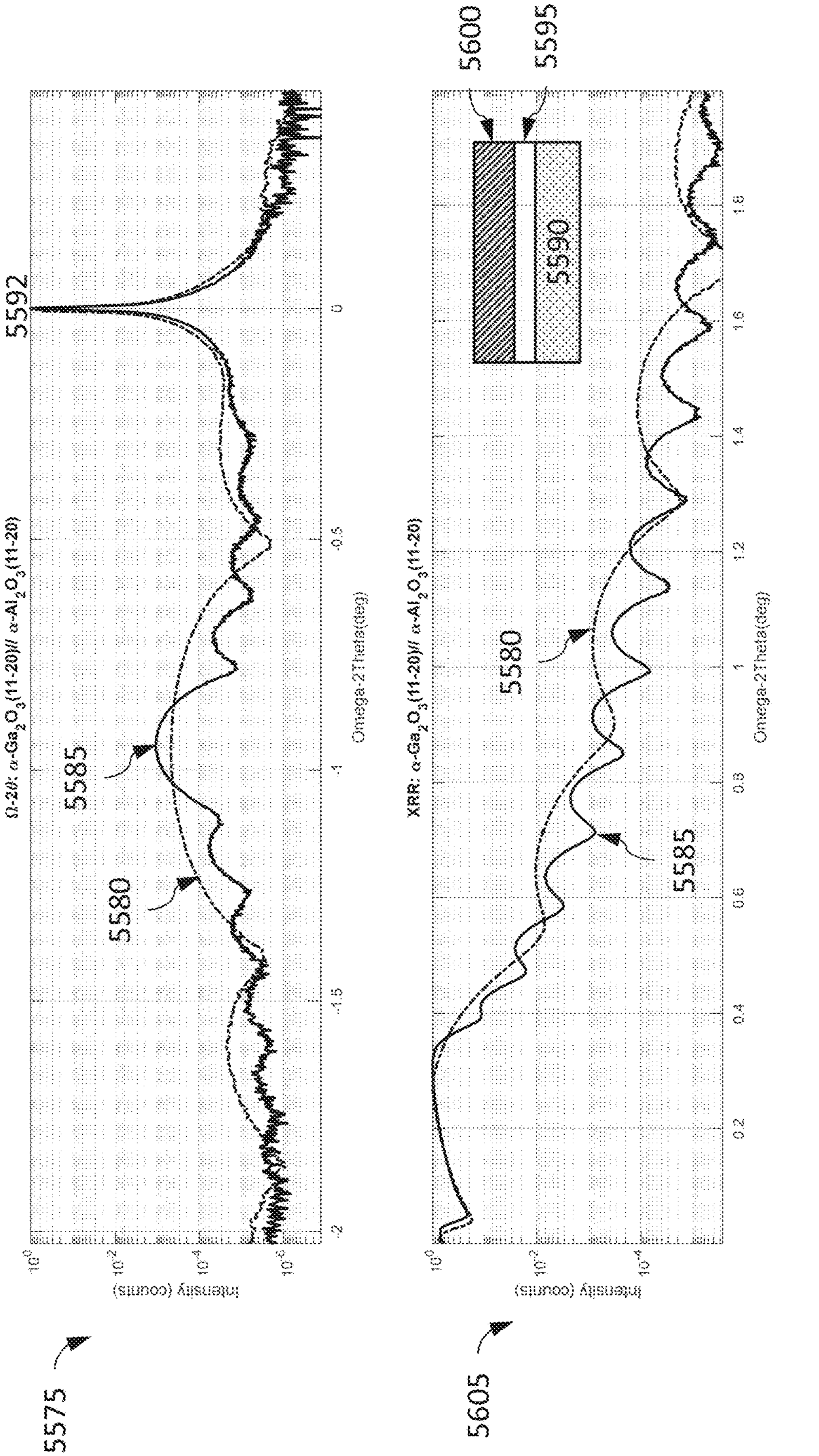
FIG. 44T shows an experimental HRXRD and GIXR of an example high-quality single crystal corundum symmetry binary $Ga_2O_3$ deposited epitaxially on a bulk (11-20)-oriented corundum crystal symmetry $Al_2O_3$ substrate where the two thicknesses of $Ga_2O_3$ are shown pseudomorphically strained (i.e., elastic deformation of the bulk $Ga_2O_3$ unit cell) to the underlying $Al_2O_3$ substrate in accordance with an illustrative embodiment of the present disclosure.
Figure 44U:
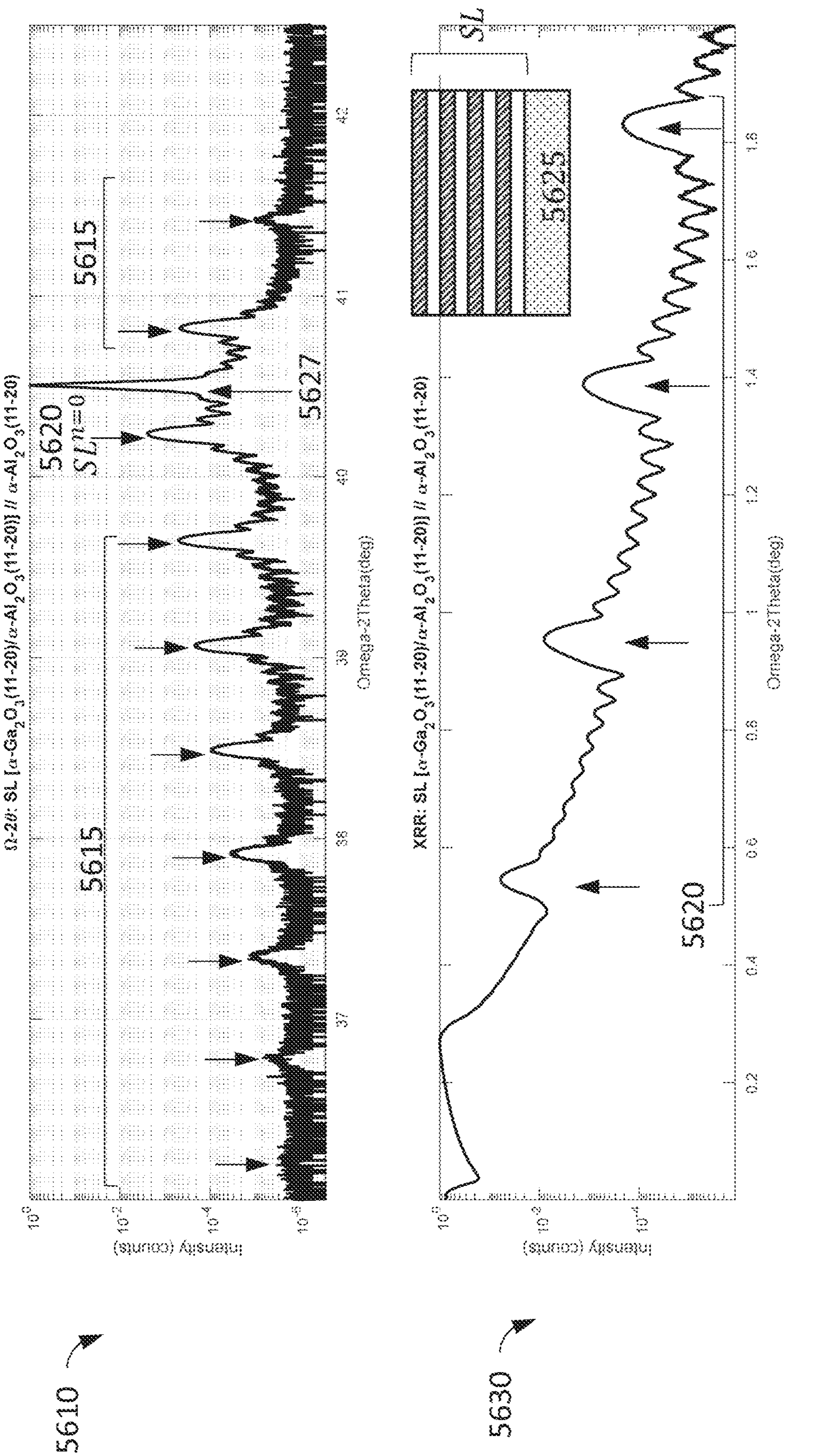
FIG. 44U shows an experimental HRXRD and GIXR of an example high-quality single crystal corundum symmetry superlattice comprising bilayers of binary pseudomorphic $Ga_2O_3$ and $Al_2O_3$ deposited epitaxially on a bulk (11-20)-oriented corundum crystal symmetry $Al_2O_3$ substrate where the superlattice $[Al_2O_3/Ga_2O_3]$ demonstrates the unique properties of the corundum crystal symmetry in accordance with an illustrative embodiment of the present disclosure.
Figure 44V:
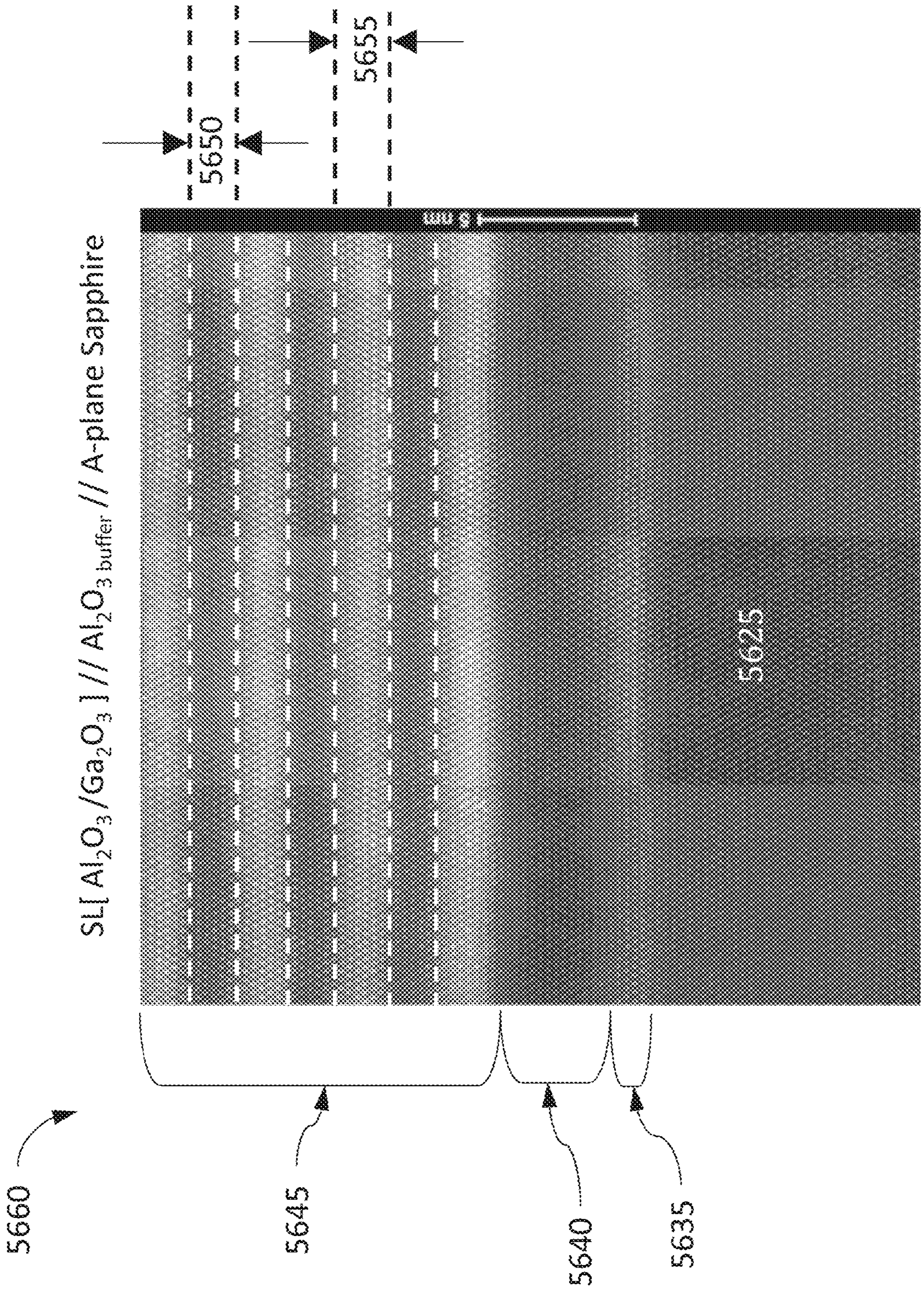
FIG. 44V shows an experimental transmission electron micrograph (TEM) of a high-quality single crystal superlattice comprising SL $[Al_2O_3/Ga_2O_3]$ deposited upon a corundum $Al_2O_3$ substrate depicting the low dislocation defect density in accordance with an illustrative embodiment of the present disclosure.
Figure 44W:
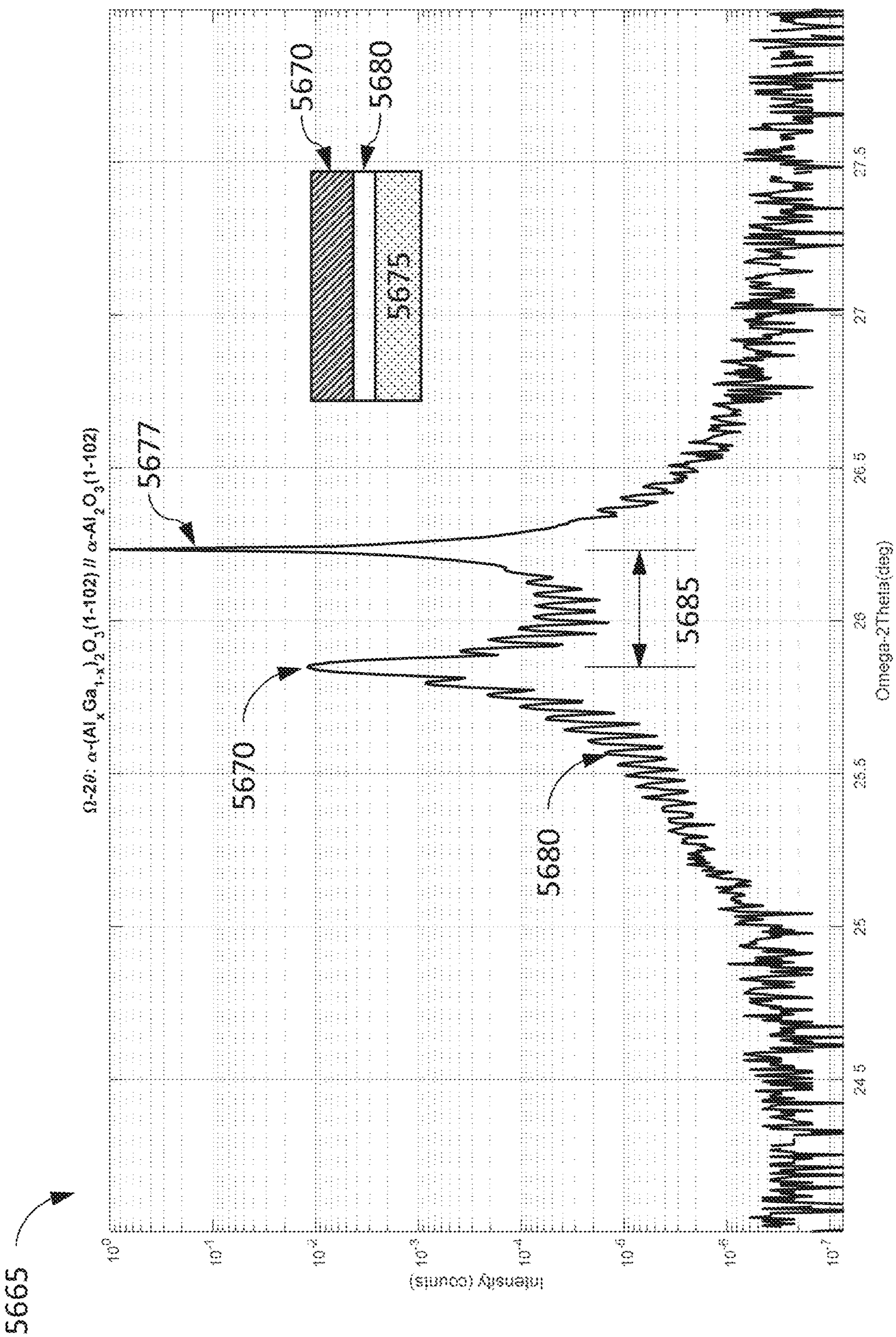
FIG. 44W shows an experimental HRXRD of a corundum crystal symmetry topmost active $(Al_xGa_{1-x})_2O_3$ epilayer deposited upon a single corundum $Al_2O_3$(1-102)-oriented substrate in accordance with an illustrative embodiment of the present disclosure.
Figure 44X:
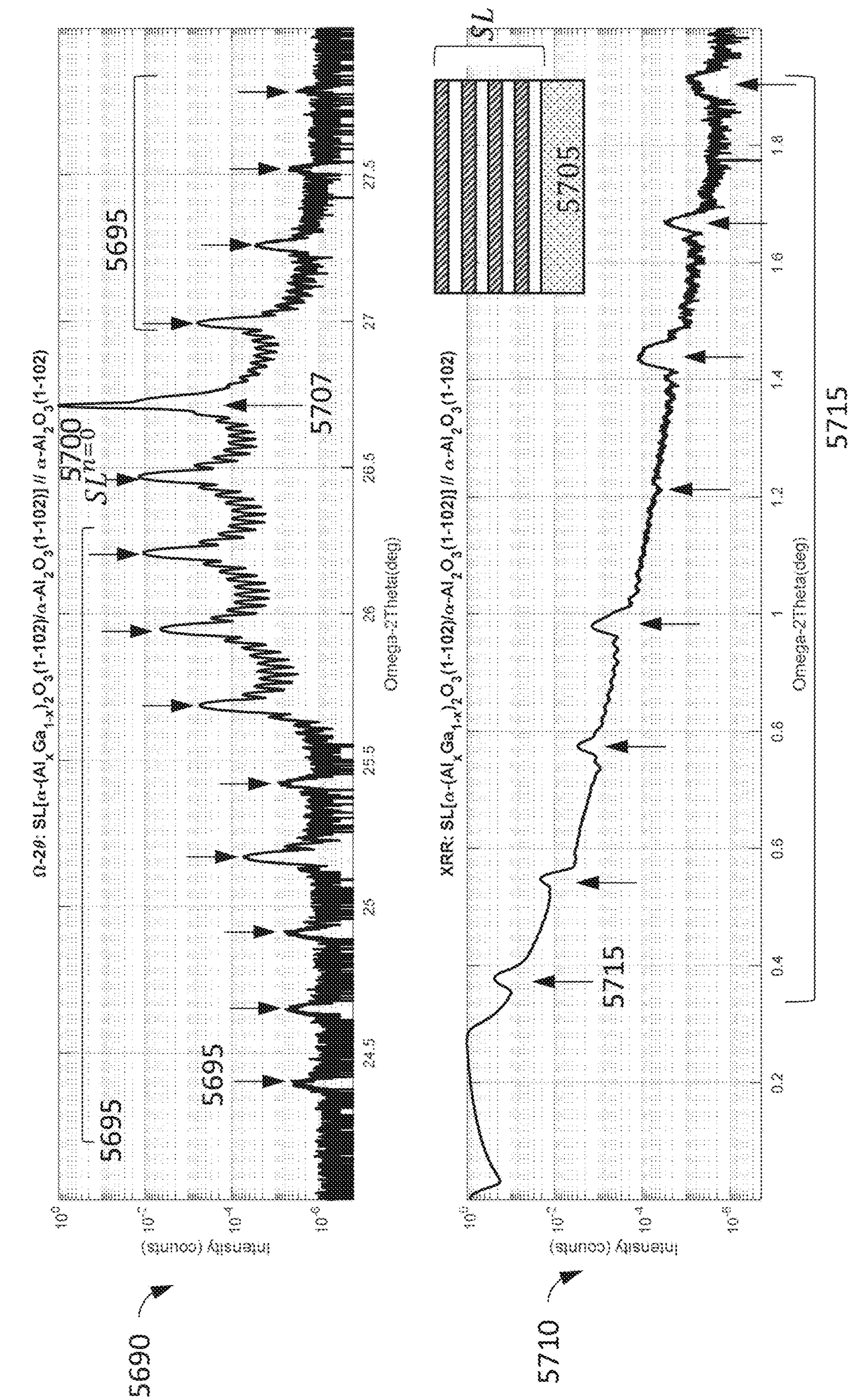
FIG. 44X shows an experimental HRXRD and GIXR of an example high-quality single crystal corundum symmetry superlattice comprising bilayers of ternary pseudomorphic $(Al_xGa_{1-x})_2O_3$ and $Al_2O_3$ deposited epitaxially on a bulk (1-102)-oriented corundum crystal symmetry $Al_2O_3$ substrate in accordance with an illustrative embodiment of the present disclosure, where the superlattice $[Al_2O_3/(Al_xGa_{1-x})_2O_3]$ demonstrates the unique properties of the corundum crystal symmetry.
Figure 44Y:
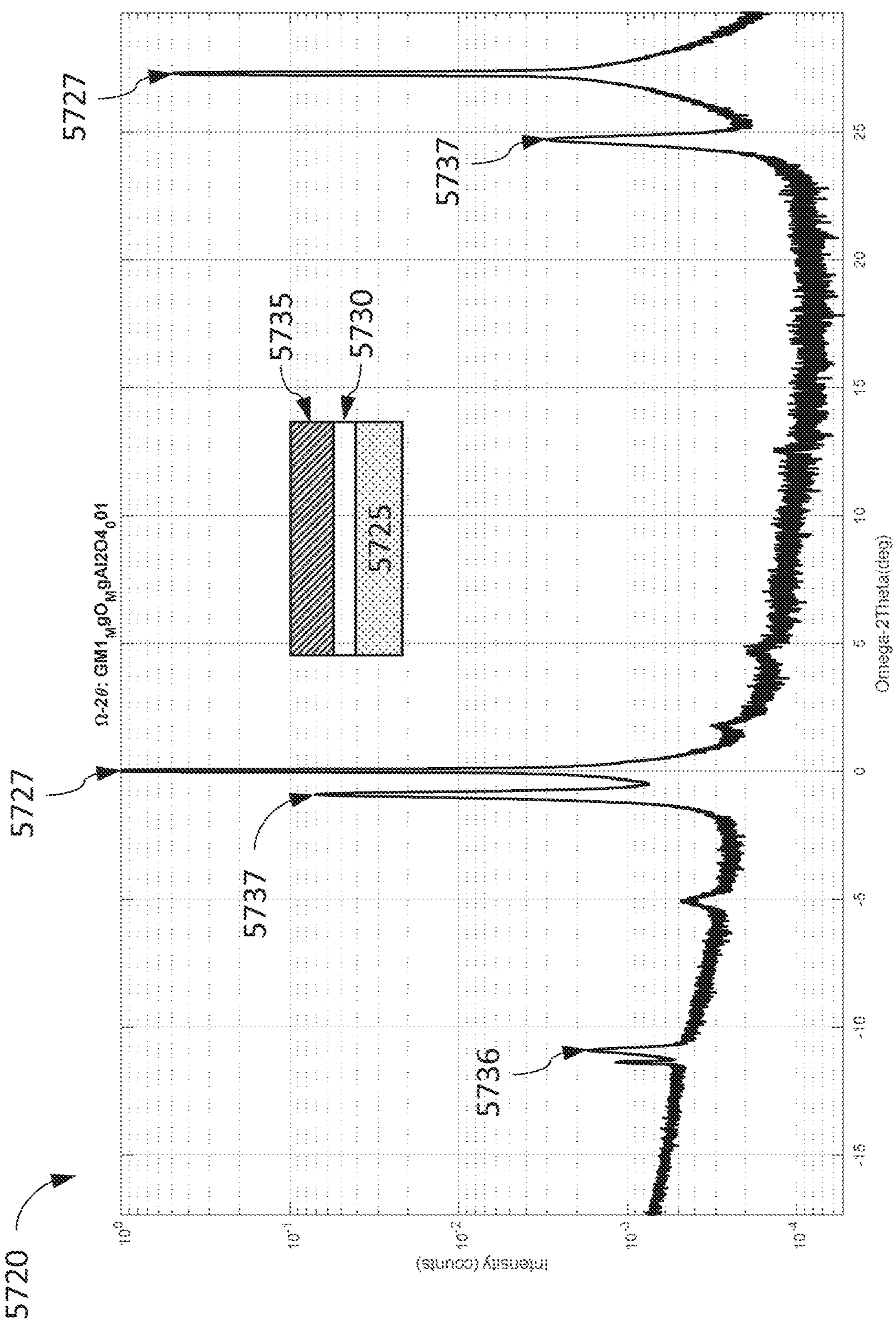
FIG. 44Y shows an experimental wide angle HRXRD of a cubic crystal symmetry topmost active Magnesium-Oxide MgO epilayer deposited upon a single crystal cubic (spinel) Magnesium-Aluminum-Oxide $MgAl_2O_4$ (100)-oriented substrate in accordance with an illustrative embodiment of the present disclosure.
Figure 44Z:
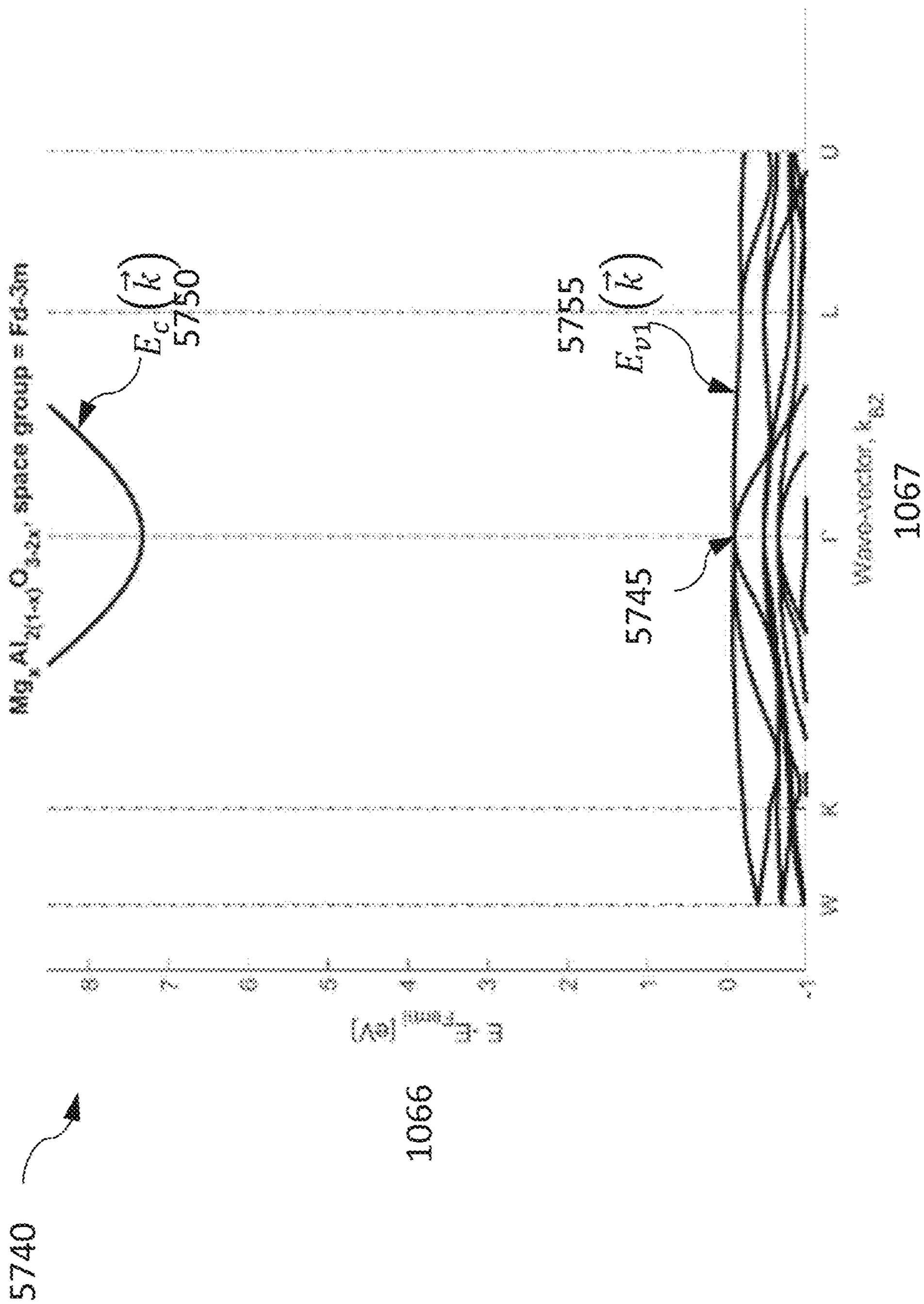
FIG. 44Z shows a strain-free energy-crystal momentum (E-k) dispersion in the vicinity of the Brillouin-zone center for the case of ternary Magnesium-Aluminum-Oxide $Mg_xAl_{2(1-x)}O_{3-2x}$, x=0.5 illustrating the direct bandgap at $\Gamma$(k=0) in accordance with an illustrative embodiment of the present disclosure.

Examples of crystal symmetry structures formed using example compositions are now described and referred to in FIGS. 44A-44Z. The compositions shown are not intended to be limiting as discussed in the previous section using the crystal modifiers.

An example of crystal symmetry groups 5000 that are possible for the ternary composition of $(Al_xGa_{1-x})_2O_3$ is shown in FIG. 44A. The calculated equilibrium crystal formation probability 5005 is a measure of the probability the structure will form for a given crystal symmetry type. The space group nomenclature 5010 used in FIG. 44A is understood by those skilled in the art.

The non-equilibrium growth methods described herein can potentially select crystal symmetry types that are otherwise not accessible using equilibrium growth methods (such as CZ). The general crystal classes of cubic 5015, tetragonal, trigonal (rhombohedral/hexagonal) 5020, monoclinic 5025, and triclinic 5030 are shown in the inset of FIG. 44A.

For example, it was found in accordance with the present disclosure that monoclinic, trigonal and orthorhombic crystal symmetry types can be made energetically favorable by providing the kinematic growth conditions favoring exclusively a particular space group to be epitaxially formed. For example, as set out in TABLE I shown in FIG. 43A, the surface energy of a substrate can be selected by judicious preselection of the surface orientation presented for epitaxy.

FIG. 44B shows an example high-resolution x-ray Bragg diffraction (HRXRD) curves of a high quality, coherently strained, elastically deformed unit cell (i.e., the epilayer is termed pseudomorphic with respect to the underlying substrate) strained ternary $(Al_xGa_{1-x})_2O_3$ epilayer 5080 formed on a monoclinic $Ga_2O_3$(010)-oriented surface 5045. The graph shows intensity 5035 as a function of $\Omega$-2 $\theta$ 5040. Two compositions $(Al_xGa_{1-x})_2O_3$ x=0.15 (5050) and x=0.25 (5065) are shown. The substrate is initially prepared by high temperature (>800° C.) desorption in an ultrahigh vacuum chamber (less than $5\times10^{-10}$ Torr) of surface impurities.

The surface is monitored in real-time by reflection high energy electron diffraction (RHEED) to assess atomic surface quality. Once a bright and streaky RHEED pattern indicative of an atomically flat surface of predetermined surface reconstruction of the discontinuous surface atom dangling bond is apparent, the activated Oxygen source comprising a radiofrequency inductively coupled plasma (RF-ICP) is ignited to produce a stream of substantially neutral atomic-Oxygen (O*) species and excited molecular neutral oxygen ($O_2$*) directed toward the heated surface of the substrate.

The RHEED is monitored to show an oxygen-terminated surface. The source of elemental and pure Ga and Al atoms are provided by effusion cells comprising inert ceramic crucibles radiatively heated by a filament and controlled by feedback sensing of a thermocouple advantageously positioned relative to the crucible to monitor the metal melt temperature within the crucible. High purity elemental metals are used, such as 6N to 7N or higher purity.

Each source beam flux is measured by a dedicated nude ion gauge that can be spatially positioned in the vicinity of the center of the substrate to sample the beam flux at the substrate surface. The beam flux is measured for each elemental specie so the relative flux ratio can be predetermined. During beam flux measurements a mechanical shutter is positioned between the substrate and the beam flux measurement. Mechanical shutters also intersect the atomic beams emanating from each crucible containing each elemental specie selected to comprise epitaxial film.

During deposition the substrate is rotated so as to accumulate a uniform amount of atomic beam intersecting the substrate surface for a given amount of deposition time. The substrate is heated radiatively from behind by an electrically heated filament, in preference for oxide growth is the advantageous use of a Silicon-Carbide (SiC) heater. A SiC heater has the unique advantage over refractory metal filament heaters in that a broad near-to-mid infrared emissivity is possible.

Not well known to workers in the field of epitaxial film growth, is that most metal oxides have the attribute of relatively large optical absorption for near to far infrared wavelengths. The deposition chamber is preferentially actively and continuously pumped to achieve and maintain vacuum in vicinity of 1e-6 to 1e-5 Torr during growth of epitaxial films. Operating in this vacuum range, the evaporating metals particles from the surface of each effusion crucible acquire a velocity that is essentially non-interacting and ballistic.

Advantageously positioning the effusion cell beam formed by the Clausing factor of the crucible aperture and UHV large mean free path, the collisionless ballistic transport of the effusion specie toward the substrate surface is ensured. The atomic beam flux from effusion type heated sources is determined by the Arrhenius behavior of the particular elemental specie placed in the crucible. In some embodiments, Al and Ga fluxes in the range of $1\times10^{-6}$ Torr are measured at the substrate surface. The oxygen plasma is controlled by the RF power coupled to the plasma and the flow rate of the feedstock gas.

RF plasma discharges typically operate from 10 milliTorr to 1 Torr. These RF plasma pressures are not compatible with atomic layer deposition process reported herein. To achieve activated oxygen beam fluxes in the range of $1\times10^{-7}$ Torr to $1\times10^{-5}$ Torr, a sealed fused quartz bulb with laser drilled apertures of the order of 100 microns in diameter are disposed across a circular end-face of the sealed cylindrical bulb. The said bulb is coupled to a helical wound copper tube and water-cooled RF antenna driven by an impedance matching network and a high power 100 W-1 kW RF oscillator operating at, for example, 2 MHz to 13.6 MHz or even 20 MHz.

The plasma is monitored using optical emission from the plasma discharge which provides accurate telemetry of actual species generated within the bulb. The size and number of the apertures on the bulb end face are the interface of the plasma to the UHV chamber and can be predetermined to achieve compatible beam fluxes so as to maintain ballistic transport conditions for long mean free path in excess of the source to substrate distance. Other in-situ diagnostics enabling accurate control and repeatability of film composition and uniformity include the use of ultraviolet polarized optical reflectometry and ellipsometry as well as a residual gas analyzer to monitor the desorption of species from the substrate surface.

Other forms of activated oxygen include the use of oxidizers such as Ozone ($O_3$) and nitrous oxide ($N_2O$). While all forms work relatively well, namely RF-plasma, $O_3$ and $N_2O$, RF plasma may be used in certain embodiments owing to the simplicity of point of use activation. RF-plasma, however, does potentially create very energetic charged ion species which can affect the material background conductivity type. This is mitigated by removing the apertures directly in the vicinity of the center of the plasma end plate coupled to the UHV chamber. The RF induced oscillating magnetic field at the center of the solenoid of the cylindrical discharge tube will be maximal along the center axis. Therefore, removing the apertures providing line of sight from the plasma interior toward the growth surface removes the charged ions specie ballistically delivered to the epilayer.

Having briefly described the growth method, refer again to FIG. 44B. The monoclinic $Ga_2O_3$(010)-oriented substrate 5045 is cleaned in-situ via high temperature in UHV conditions, such as at −800° C. for 30 mins. The cleaned surface is then terminated with activated oxygen adatoms forming a surface reconstruction comprising oxygen atoms.

An optional homoepitaxial $Ga_2O_3$ buffer layer 5075 is deposited and monitored for crystallographic surface improvement by in-situ RHEED. In general, $Ga_2O_3$ growth conditions using elemental Ga and activated oxygen requires a flux ratio of $\phi(Ga):\phi(O^*)\leq1$, that is atomic oxygen rich conditions.

For flux ratios of $\Phi(Ga):\Phi(O^*)>1$ an excess Ga atoms on the growth surface is capable of attaching to surface bonded oxygen that can potentially form a volatile $Ga_2O_{(g)}$ suboxide species—which then desorbs from the surface and can remove material from the surface and even etch the surface of $Ga_2O_3$. It was found in accordance with the present disclosure that for high Al content $AlGaO_3$ this etching process is reduced if not eliminated for Al %>50%. The etching process can be used to clean a virgin $Ga_2O_3$ substrate for example to aid in the removal of chemical mechanical polish (CMP) damage.

To initiate growth of $AlGaO_3$ the activated oxygen source is optionally initially exposed to the surface followed by opening both shutters for each of the Ga and Al effusion cells. It was found experimentally in accordance with the present disclosure that the sticking coefficient for Al is near unity whereas the sticking coefficient on the growth surface is kinetically dependent on the Arrhenius behavior of the desorbing Ga adatoms which depend on the growth temperature.

The relative x=Al % of the epitaxial $(Al_xGa_{1-x})_2O_3$ film is related to $x=\Phi(Al)/[\Phi(Ga)+\Phi(Al)]$. Clear high quality RHEED surface reconstruction streaks are evident during deposition of $(Al_xGa_{1-x})_2O_3$. The thickness can be monitored by in-situ ultraviolet laser reflectometry and the pseudomorphic strain state monitored by RHEED. As the free-standing in-plane lattice constant of monoclinic crystal symmetry $(Al_xGa_{1-x})_2O_3$ is smaller than the underlying $Ga_2O_3$ lattice, the $(Al_xGa_{1-x})_2O_3$ is grown under tensile strain during elastic deformation.

The thickness 5085 of epilayer 5080 at which the elastic energy can be matched or reduced by inclusion of misfit dislocation within the growth plane is called the critical layer thickness (CLT), beyond this point the film can begin to grow as a partially or fully relaxed bulk-like film. The curves 5050 and 5065 are for the case of coherently strained $(Al_xGa_{1-x})_2O_3$ films with thickness below the CLT. For the case of x=0.15 the CLT is >400 nm and for x=0.25 CLT~100 nm. The thickness oscillations 5070 are also known as Pendellosung interference fringes and are indicative of highly coherent and atomically flat epitaxial film.

In experiments performed in relation to the present disclosure, growth of pure monoclinic $Al_2O_3$ epitaxial films directly on monoclinic $Ga_2O_3(010)$ surface achieved CLT≤1 nm. It was further found experimentally that Al %>50% achieved low growth rate owing to the unique monoclinic bonding configuration of cations partitioned approximately as 50% tetrahedral bonding sites and 50% octahedral bonding sites. It was found that Al adatoms prefer to incorporate at octahedral bonding sites during crystal growth and have bonding affinity for tetrahedral sites.

Superlattices (SLs) are created and directly applicable to UVLED operation utilizing the quantum size effect tuning mechanism for quantization of allowed energy levels within a narrower bandgap material sandwiched between two potential energy barriers. Furthermore, SLs are example vehicles for creating pseudo ternary alloys as discussed herein, further enabling strain management of the layers.

For example, monoclinic $(Al_xGa_{1-x})_2O_3$ ternary alloy experiences an asymmetric in-plane biaxial tensile strain when epitaxial deposited upon monoclinic $Ga_2O_3$. This tensile strain can be managed by ensuring the thickness of ternary is kept below the CLT within each layer comprising the SL. Furthermore, the strain can be balanced by tuning the thickness of both $Ga_2O_3$ and ternary layer to manage the built-in strain energy of the bilayer pair.

Yet a further embodiment of the present disclosure is the creation of a ternary alloy as bulk-like or SL grown sufficiently thick so as to exceed the CLT and form an essentially free-standing material that is strain-free. This virtually strain-free relaxed ternary layer possesses an effective in-plane lattice constant $a_{SL}$ which is parameterized by the effective Al % composition. If then a first relaxed ternary layer is formed, followed by yet another second SL deposited directly upon the relaxed layer then the bilayer pair forming the second SL can be tuned such that the layers comprising the bilayer are in equal and opposite strain states of tensile and compressive strain with respect to the first in-plane lattice constant.

FIG. 44C show an example SL 5115 formed directly on a $Ga_2O_3$ (010)-oriented substrate 5100.

The bilayer pairs comprising the SL 5115 are both monoclinic crystal symmetry $Ga_2O_3$ and ternary $(Al_xGa_{1-x})_2O_3$ (x=0.15) with SL period $\Delta_{SL}$=18 nm. The HRXRD 5090 shows the symmetric Bragg diffraction, and the GIXR 5105 shows the grazing incidence reflectivity of the SL. Ten periods are shown with extremely high crystal quality indicative of the $(Al_xGa_{1-x})_2O_3$ having thickness≤CLT.

The plurality of narrow SL diffraction peaks 5095 and 5110 is indicative of coherently strained films registered with in-plane lattice constant matching the monoclinic $Ga_2O_3$ (010)-oriented bulk substrate 5100. The monoclinic crystal structure (refer to FIG. 37) having growth surface exposed of (010) exhibits a complex array of Ga and O atoms. In some embodiments, the starting substrate surface is prepared by O-terminations as described previously. The average Al % alloy content of the SL represents a pseudo-bulk-like ternary alloy which can be thought of as an order atomic plane ternary alloy.

The SL comprising bilayers of $[(Al_{xB}Ga_{1-xB})_2O_3/Ga_2O_3]$ has an equivalent Al % defined as:

$$x_{Al}^{SL} = \frac{L_B \cdot x_B}{\Delta_{SL}},$$

where $L_B$ is the thickness of the wider bandgap $(Al_{xB}Ga_{1-xB})_2O_3$ layer. This can be directly determined by reference to the angular separation and position of the zeroth-order diffraction peak $SL^{n=0}$ of the SL with respect to the substrate peak 5102. Reciprocal lattice maps show that the in-plane lattice constant is pseudomorphic with the underlying substrate and provides excellent application for the UVLED.

The tensile strain as shown in FIGS. 23A-23C can be used advantageously towards the formation of the optical emission region.

FIG. 44D shows yet further flexibility toward depositing ternary monoclinic 5130 alloy $(Al_xGa_{1-x})_2O_3$ directly upon yet another crystal orientation of monoclinic $Ga_2O_3(001)$ substrate 5120.

Again, the best results are obtained by careful attention to high quality CMP surface preparation of the cleaved substrate surface. The growth recipe in some embodiments utilizes in-situ activated oxygen polish at high temperatures (e.g., 700-800° C.) using a radiatively heated substrate via a high power and oxygen resistant radiatively coupled heater. The SiC heater possesses the unique property of having high near-to-far infrared emissivity. The SiC heater emissivity closely matches the intrinsic $Ga_2O_3$ absorption features and thus couples well to the radiative blackbody emission spectrum presented by the SiC heater. Region 5125 represents the O-termination process and the homoepitaxial growth of a high quality $Ga_2O_3$ buffer layer. The SL is then deposited showing two separate growths with different ternary alloy compositions.

Shown in FIG. 44D are coherently strained epilayers of $(Al_xGa_{1-x})_2O_3$ having thickness≤CLT and achieving x~15% (5135) and x~30% (5140), relative to the (002) substrate peak 5122. Again, the high quality films are indicated by the presence of thickness interference fringes.

Discovering further that SL structures are also possible on the (001) oriented monoclinic $Ga_2O_3$ substrate 5155, the results are shown in FIG. 44E.

Clearly, HRXRD 5145 and GIXR 5158 demonstrate a high quality coherently deposited SL. Peak 5156 is the substrate peak. The SL diffraction peaks 5150 and 5160 enable direct measurement of the SL period, and the $SL^{n=0}$ peak enables the effective Al % of SL to be determined. For this case a ten period $SL[(Al_{0.18}Ga_{0.92})_2O_3/Ga_2O_3]$ having period $\Delta_{SL}$=8.6 nm is shown.

Demonstrating an example application of the versatility of the metal oxide film deposition method disclosed herein, refer to FIG. 44F. Two dissimilar crystal symmetry type structures are epitaxially formed along a growth direction as defined by FIG. 18. A substrate 5170 (peak 5172) comprising monoclinic $Ga_2O_3(001)$-oriented surface is presented for homoepitaxy of a monoclinic $Ga_2O_3$ 5175. Next a cubic crystal symmetry NiO epilayer 5180 is deposited. The HRXRD 5165 and GIXR 5190 show the topmost NiO film peak 5185 of thickness 50 nm has excellent atomic flatness and thickness fringes 5195.

In one example, mixing-and-matching crystal symmetry types can be favorable to a given material composition that is advantageous for a given function comprising the UVLED (refer FIG. 1) thereby increasing the flexibility for optimizing the UVLED design. $Ni_xO$ ($0.5 \le x \le 1$ representing metal vacancy structures are possible), $Li_xNi_yO_n$, $Mg_xNi_{1-x}O$ and $Li_xMg_yNi_zO_n$ are compositions that may be utilized favorably for integration with $AlGaO_3$ materials comprising the UVLED.

As NiO and MgO share very close cubic crystal symmetry and lattice constants, they are advantageous for bandgap tuning application from about 3.8 to 7.8 eV. The d-states of Ni influence the optical and conductivity type of the MgNiO alloy and can be tailored for application to UVLED type devices. A similar behavior is found for the selective incorporation of Ir into corundum crystal symmetry ternary alloy $(Ir_xGa_{1-x})_2O_3$ which exhibits advantageous energy position within the E-k dispersion due to the Iridium d-state orbitals for creation of p-type conductivity.

Yet a further example of the metal oxide structures is shown in FIG. 44G. A cubic crystal symmetry MgO (100)-oriented surface of a substrate 5205 (corresponding to peak 5206) is presented for direct epitaxy of $Ga_2O_3$. It was found in accordance with the present disclosure that the surface of MgO can be selectively modified to create a cubic crystal symmetry form of $Ga_2O_3$ epilayer 5210 (peaks 5212 for gamma $Ga_2O_3$) that acts as an intermediate transition layer for subsequent epitaxy of monoclinic $Ga_2O_3(100)$ 5215 (peaks 5214 and 5217). Such a structure is represented by the growth process shown in FIG. 20A.

First a prepared clean MgO (100) surface is presented for MgO homoepitaxy. The magnesium source is a valved effusion source comprising 7N purity Mg with a beam flux of $\sim 1\times 10^{-10}$ Torr in the presence of active-oxygen supplied with $\phi(Mg): \phi(O^*) \le 1$ and substrate surface growth temperature from 500-650° C.

The RHEED is monitored to show improved and high quality surface reconstruction of MgO surface of the epitaxial film. After about 10-50 nm of MgO homoepitaxy the Mg source is closed and the substrate elevated to a growth temperature of about 700° C. while under a protective flux of O*. Then the Ga source is exposed to the growth surface and the RHEED is observed to instantaneous change surface reconstruction toward a cubic crystal symmetry $Ga_2O_3$ epilayer 5210. After about 10-30 nm of cubic $Ga_2O_3$ (known also as the gamma-phase) it is observed via direct observation of RHEED the characteristic monoclinic surface reconstruction of $Ga_2O_3(100)$ appears and remains as the most stable crystal structure. A $Ga_2O_3$ (100)-oriented film of 100 nm is deposited, with HRXRD 5200 and GIXR 5220 showing peak 5214 for beta-$Ga_2O_3(200)$ and peak 5217 for beta-$Ga_2O_3(400)$. Such fortuitous crystal symmetry alignments are rare but highly advantageous for the application toward UVLED.

Yet another example of a complex ternary metal oxide structure applied for UVLED is disclosed in FIG. 44H. The HRXRD 5225 and GIXR 5245 show experimental realization of a superlattice comprising a lanthanide-aluminum-oxide ternary integrated with corundum $Al_2O_3$ epilayers.

The SL comprises corundum crystal symmetry $(Al_xEr_{1-x})_2O_3$ ternary composition with the lanthanide selected from Erbium grown pseudomorphically with corundum $Al_2O_3$. Erbium is presented to the non-equilibrium growth via a sublimating 5N purity Erbium source using an effusion cell. The flux ratio of $\phi(Er): \phi(Al) \sim 0.15$ was used with the oxygen-rich condition of $[\phi(Er)+\phi(Al)]: \phi(O^*)] \le 1$ at a growth temperature of about 500° C.

Of particular note is the ability for Er to crack molecular oxygen at the epilayer surface and therefore the total oxygen overpressure is larger than the atomic oxygen flux. An A-plane Sapphire (11-20) substrate 5235 is prepared and heated to about 800° C. and exposed to an activated Oxygen polish. It was found in this example that the activated oxygen polish of the bare substrate surface dramatically improves the subsequent epilayer quality. Next a homoepitaxial corundum $Al_2O_3$ layer is formed and monitored by RHEED showing excellent crystal quality and atomically flat layer-by-layer deposition. Then a ten period SL is deposited and shown as the satellite peaks 5230 and 5240 in the HRXRD 5225 and GIXR 5245 scans. Clearly evident are the Pendellosung fringes indicating excellent coherent growth.

The effective alloy composition of the $(Er_{xSL}Al_{1-xSL})_2O_3$ of the SL can be deduced by position of the zeroth order SL peak $SL^{n=0}$ relative to the (110) substrate peak 5235. It is found xSl~0.15 is possible and that the $(Al_xEr_{1-x})_2O_3$ layer forming the SL period has corundum crystal symmetry. This discovery is particularly important for application to UVLED wherein FIG. 44I discloses the E-K band structure 5250 of corundum $(Al_xEr_{1-x})_2O_3$ is indeed a direct bandgap material having $E_G \ge 6$ eV. The electron energy 1066 is plotted as a function of the crystal wave vectors 1067. The conduction band minimum 5265 and valence band 5260 is maximum at the Brillouin-zone center 5255 (k=0).

Next in FIG. 44J is demonstrated yet a further ternary magnesium-gallium-oxide cubic crystal symmetry $Mg_xGa_{2(1-x)}O_{3-2x}$ material composition integrable with $Ga_2O_3$. Shown is the HRXRD 5270 and GIXR 5290 experimental realization of a superlattice comprising a 10 period $SL[Mg_xGa_{2(1-x)}O_{3-2x}/Ga_2O_3]$ deposited upon a monoclinic $Ga_2O_3(010)$ oriented substrate 5275 (corresponding to peak 5277). The SL ternary alloy composition is selected from x=0.5 with thickness of 8 nm and $Ga_2O_3$ of 8 nm. The SL period is $\Delta_{SL}=16$ nm with average Mg % of $$x_{Mg}^{SL} = \frac{x.L_{MgGaO}}{\Delta_{SL}}.$$

The diffraction satellite peaks 5280 and 5295 report slight diffusion of Mg across the SL interfaces which can be alleviated by growing at a lower temperature. The band structure of $Mg_xGa_{2(1-x)}O_{3-2x}$ x=0.5 is particularly useful for application toward UVLED. FIG. 44K reports the calculated energy band structure 5300 is direct in character (refer to band extrema 5315 and 5310 and k=0 5305) with bandgap of $E_G \sim 5.5$ eV.

The ability for the monoclinic $Ga_2O_3$ crystal symmetry to integrate with cubic $MgAl_2O_4$ crystal symmetry substrates is presented in FIG. 44L. A high quality single crystal substrate 5320 (peak 5322) comprising $MgAl_2O_4$ spinel is cleaved and polished to expose the (100)-oriented crystal surface. The substrate is prepared and polished using active oxygen at elevated temperature (~700° C.) under UHV conditions (≤1e-9 Torr). Keeping the substrate at growth temperature of 700° C. the $MgGa_2O_4$ film 5330 is initiated showing excellent registration to the substrate. After about 10-20 nm the Mg is shuttered and only $Ga_2O_3$ is deposited as the topmost film 5325. The GIXR film flatness is excellent showing thickness fringes 5340 indicating a >150 nm film. The HRXRD shows transition material $MgGa_2O_4$ corresponding to peaks 5332 and $Ga_2O_3(100)$-oriented epilayer of peaks 5327 indicative of monoclinic crystal symmetry. In some embodiments, hexagonal $Ga_2O_3$ can also be deposited epitaxially.

The monoclinic $Ga_2O_3$ (−201)-oriented crystal plane features unique attributes of a hexagonal oxygen surface matrix with in-plane lattice spacing acceptable for registering wurtzite-type hexagonal crystal symmetry materials. For example, as shown in diagram 5345 of FIG. 44M wurtzite ZnO 5360 (peak 5367) is deposited on an oxygen terminated $Ga_2O_3$(−201)-oriented surface of a substrate $Zn_xGa_{2(1-x)}O_{3-2x}$ 5350 (peak 5352). The Zn is supplied by sublimation of 7N purity Zn contained within an effusion cell. The growth temperature is selected from 450-650° C. for ZnO and exhibits extremely bright and sharp narrow RHEED streaks indicative high crystal quality. Peak 5362 represents $(Al_xGa_{1-x})_2O_3$. Peak 5355 represents a transition layer.

Next a ternary zinc-gallium-oxide epilayer $Zn_xGa_{2(1-x)}O_{3-2x}$ 5365 is deposited by co-deposition of Ga and Zn and active oxygen at 500° C. The flux ratio of [$\phi$(Zn)+$\phi$(Ga)]: $\phi(O^*)\leq 1$ and the metal beam flux ratio $\phi$(Zn): $\phi$(Ga) is chosen to achieve x~0.5. Zn desorbs at much lower surface temperatures than Ga and is controlled in part by absorption limited process depending on surface temperature dictated by the Arrhenius behavior of Zn adatoms.

Zn is a group metal and substitutes advantageously on available Ga-sites of the host crystal. In some embodiments, Zn can be used to alter the conductivity type of the host for dilute x<0.1 concentrations of incorporated Zn. The peak 5355 labelled $Zn_xGa_{2(1-x)}O_{3-2x}$ shows the transition layer formed on the substrate showing low Ga % formation of $Zn_xGa_{2(1-x)}O_{3-2x}$. This suggests strongly a high miscibility of Ga and Zn in the ternary offering non-equilibrium growth of full range of alloys $0\leq x\leq 1$. For the case of x=0.5 $Zn_xGa_{2(1-x)}O_{3-2x}$ offers the cubic crystal symmetry form an E-k band structure as shown in diagram 5370 of FIG. 44N.

The indirect bandgap shown by band extrema 5375 and 5380 can be shaped using SL band engineering as shown in FIG. 27. The valence band dispersion 5385 showing maxima at k≠0 can be used to create a SL period that can advantageously map the maxima back to an equivalent energy at zone center thereby creating a pseudo-direct bandgap structure. Such a method is claimed in its entirety for application to the formation of optoelectronic devices such as UVLEDs as referred to in the present disclosure.

As explained in the present disclosure, there is a large design space available for crystal modifiers to the $Ga_2O_3$ and $Al_2O_3$ host crystals that can be exploited for application to UVLEDs.

Yet a further example is now disclosed where the growth conditions can be tuned to preselect a unique crystal symmetry type of $Ga_2O_3$, namely monoclinic (beta-phase) or hexagonal (epsilon or kappa phase).

FIG. 44O shows a specific application of the more general method disclosed in FIG. 19.

A prepared and clean surface of corundum crystal symmetry type of sapphire C-plane substrate 5400 is presented for epitaxy.

The substrate surface is polished via active oxygen at elevated temperature >750° C. and such as ~800-850° C. This creates an oxygen terminated surface 5405. While maintaining the high growth temperature, a Ga and active oxygen flux is directed toward the epi-surface and the surface reconstruction of bare $Al_2O_3$ is modified to either a corundum $Ga_2O_3$ thin template layer 5396 or a low Al % corundum $(Al_xGa_{1-x})_2O_3$ $x\leq 0.5$ is formed by an additional co-deposited Al flux. After about 10 nm of the template layer 5396 the Al flux is closed and $Ga_2O_3$ is deposited. Maintaining a high growth temperature and a low Al % template $0\leq x\leq 0.1$ favors exclusive film formation of monoclinic crystal structure epilayer 5397.

If after the initial template layer 5396 formation the growth temperature is reduced to about 650-750° C. then the $Ga_2O_3$ favors exclusively the growth of a new type of crystal symmetry structure having hexagonal symmetry. The hexagonal phase of $Ga_2O_3$ is also favored by x>0.1 template layer. The unique properties of the hexagonal crystal symmetry $Ga_2O_3$ 5420 composition is discussed later. The experimental evidence for the disclosed process of growing the epitaxial structure 5395 is provided in FIG. 44P, showing the HRXRD 5421 for two distinct growth process outcomes of phase pure monoclinic $Ga_2O_3$ and hexagonal crystal symmetry $Ga_2O_3$. The HRXRD scan shows the C-plane $Al_2O_3$(0001)-oriented substrate Bragg diffraction peaks of corundum $Al_2O_3$(0006) 5465 and $Al_2O_3$(0012) 5470. For the case of monoclinic $Ga_2O_3$ topmost epitaxial film, the diffraction peaks indicated by 5445, 5450, 5455, and 5460 represent sharp single crystal monoclinic $Ga_2O_3$ (−201), $Ga_2O_3$ (−204), $Ga_2O_3$ (−306) and $Ga_2O_3$ (−408).

The orthorhombic crystal symmetry can further exhibit an advantageous property of possessing a non-inversion symmetry. This is particularly advantageous for allowing electric dipole transition between the conduction and valence band edges of the band structure at zone-center. For example, wurtzite ZnO and GaN both exhibit crystal symmetry having non-inversion symmetry. Likewise, orthorhombic (namely the space group 33 Pna21 crystal symmetry) has a non-inversion symmetry which enables electric dipole optical transitions.

Conversely, for the growth process of hexagonal $Ga_2O_3$, the peaks 5425, 5430, 5435 and 5440 represent sharp single crystal hexagonal crystal symmetry $Ga_2O_3$(002), $Ga_2O_3$(004), $Ga_2O_3$(006), and $Ga_2O_3$(008).

The importance of achieving hexagonal crystal symmetry $Ga_2O_3$ and also hexagonal $(Al_xGa_{1-x})_2O_3$ is shown in FIG. 44Q.

The energy band structure 5475 shows the conduction band 5480 and valence band 5490 extrema are both located at the Brillouin-zone center 5485 and is therefore advantageous for application to UVLED.

Single crystal sapphire is one of the most mature crystalline oxide substrates. Yet another form of Sapphire is the corundum M-plane surface which can be used advantageously to form $Ga_2O_3$ and $AlGaO_3$ and other metal oxides discussed herein.

For example, it has been found experimentally in accordance with the present disclosure that the surface energy of Sapphire exhibited by specific crystal planes presented for epitaxy can be used to preselect the type of crystal symmetry of $Ga_2O_3$ that is epitaxially formed thereon.

Consider now FIG. 44R disclosing the utility of an M-plane corundum $Al_2O_3$ substrate 5500. The M-plane is the (1-100) oriented surface and can be prepared as discussed previously and atomically polished in-situ at elevated growth temperature of 800° C. while exposed to an activated oxygen flux. The oxygen terminated surface is then cooled to 500-700° C., such as 500° C. in one embodiment, and a $Ga_2O_3$ film is epitaxially deposited. It was found that in excess of 100-150 nm of corundum crystal symmetry $Ga_2O_3$ can be deposited on M-plane sapphire and about 400-500 nm of corundum $(Al_xGa_{1-x})_2O_3$ for x~0.3-0.45. Of particular interest, corundum $(Al_{0.3}Ga_{0.7})_2O_3$ exhibits a direct bandgap and is equivalent to the energy gap of wurtzite AlN.

The HRXRD 5495 and GIXR 5540 curves show two separate growths on M-plane sapphire 5500. High quality single crystal corundum $Ga_2O_3$ 5510 and $(Al_{0.3}Ga_{0.7})_2O_3$ 5505 are clearly shown with respect to the corundum $Al_2O_3$ substrate peak 5502. Therefore, M-plane oriented $AlGaO_3$ films are possible on M-plane Sapphire. The GIXR thickness oscillation 5535 is indicative of atomically flat interfaces 5520 and films 5530. Curve 5155 shows that there are no other crystal phases of $Ga_2O_3$ other than the corundum phase (rhombohedral crystal symmetry).

For completeness, it has also been found in accordance with the present disclosure that various metal oxides can also be used to exploit even the most technologically mature semiconductor substrate, namely Silicon. For example, while bulk $Ga_2O_3$ substrates are desirable for their crystallographic and electronic properties, they are still more expensive to produce than single crystal substrates and furthermore cannot scale as easily as Si to large wafer diameter substrates, for example up to 450 mm diameter for Si.

Therefore, embodiments include developing functional electronic $Ga_2O_3$ films directly on Silicon. To this end a process has been developed specifically for this application.

Referring now to FIG. 44S, there are shown the results of one experimentally developed process for depositing monoclinic $Ga_2O_3$ films on large area Silicon substrates.

A single crystal high quality monoclinic $Ga_2O_3$ epilayer 5565 is formed on a cubic transition layer 5570 comprising ternary $(Ga_{1-x}Er_x)_2O_3$. The transition layer is deposited using a compositional grading which can be abrupt or continuous. The transition layer can also be a digital layer comprising a SL of layers of $[(Ga_{1-x}Er_x)_2O_3/(Ga_{1-y}Er_y)_2O_3]$ wherein x and y are selected from $0 \leq x, y \leq 1$. The transition layer is deposited optionally on a binary bixbyite crystal symmetry $Er_2O_3(111)$-oriented template layer 5560 deposited on a Si(111)-oriented substrate 5555. Initially the Si(111) is heated in UHV to 900° C. or more but less than 1300° C. to desorb the native $SiO_2$ oxide and remove impurities.

A clear temperature dependent surface reconstruction change is observed and can be used to in-situ calibrate the surface growth temperature which occurs at 830° C. and is only observable for a pristine Si surface devoid of surface $SiO_2$. Then the temperature of the Si substrate is reduced to 500-700° C. to deposit the $(Ga_{1-y}Er_y)_2O_3$ film(s) and then increased slightly to favor epitaxial growth of monoclinic $Ga_2O_3$ (−201)-oriented active layer film. If $Er_2O_3$ binary is used, then activated oxygen is not necessary and pure molecular oxygen can be used to co-deposit with pure Er beam flux. As soon as Ga is introduced the activated oxygen flux is necessary. Other transition layers are also possible and can be selected from a number of ternary oxides described herein. The HRXRD 5550 shows the cubic $(Gaiy\text{-}Ery)_2O_3$ peak 5572 along with the bixbyite $Er_2O_3(111)$ and (222) peaks 5562. The monoclinic $Ga_2O_3$ (−201), (−201), (−402) peaks are also observed as peaks 5567, and the Si(111) substrate as peaks 5557.

One application of the present disclosure is the use of cubic crystal symmetry metal oxides for the use of transition layers between Si(001)-oriented substrate surfaces to form $Ga_2O_3(001)$ and $(Al,Ga)_2O_3(001)$-oriented active layer films. This is particularly advantageous for high volume manufacture.

Interest herein is directed toward exploiting transparent substrates that can accommodate a wide variety of metal oxide compositions and crystal symmetry types. In particular, again it is reiterated that the $Al_2O_3$, $(Al_xGa_{1-x})_2O_3$ and $Ga_2O_3$ materials are of great interest and the opportunity for accessing the entire miscibility range of Al % x in $(Al_xGa_{1-x})_2O_3$ and Ga % y in $(Al_{1-y}Ga_y)_2O_3$ can be addressed by corundum crystal symmetry type compositions.

Reference shall now be made to the examples in FIGS. 44T-44X.

FIG. 44T discloses high quality single crystal epitaxy of corundum $Ga_2O_3(110)$-oriented film on $Al_2O_3(11\text{-}20)$-oriented substrate (i.e., A-plane Sapphire). The surface energy of the A-plane $Al_2O_3$ surface can be used to grow exceptionally high quality corundum $Ga_2O_3$ and ternary films of corundum $(Al_xGa_{1-x})_2O_3$ where $0 \leq x \leq 1$ for the entire alloy range. $Ga_2O_3$ can be growth up to a CLT of about 45-80 nm and the CLT increases dramatically with the introduction of Al to form the ternary $(Al_xGa_{1-x})_2O_3$.

Homoepitaxial growth of corundum $Al_2O_3$ is possible at a surprisingly wide growth window range. Corundum $AlGaO_3$ can be grown from room temperature up to about 750° C. All growths, however, require an activated oxygen (viz., atomic oxygen) flux to be well in excess of the total metal flux, that is, oxygen rich growth conditions. Corundum crystal symmetry $Ga_2O_3$ films are shown in the HRXRD 5575 and GIXR 5605 scan of two separate growths for different thickness films on A-plane $Al_2O_3$ substrates. The substrate 5590 surface (corresponding to peak 5592) is oriented in the (11-20) plane and O-polished at elevated temperature at about 800° C.

The activated oxygen polish is maintained while the growth temperature is reduced to an optimal range of 450-600° C., such as 500° C. Then an $Al_2O_3$ buffer 5595 is optionally deposited for 10-100 nm and then the ternary $(Al_xGa_{1-x})_2O_3$ epilayer 5600 is formed by co-depositing with suitably arranged Al and Ga fluxes to achieve the desired Al %. Oxygen-rich conditions are mandatory. Curves 5580 and 5585 show example x=0 $Ga_2O_3$ films 5600 of 20 and 65 nm respectively.

The Pendellosung interference fringes in both the HRXRD and GIXR demonstrate excellent coherent growth, and transmission electron microscopy (TEM) confirm off-axis XRD measurements that defect densities below $10^7$ $cm^{-3}$ are possible.

Corundum $Ga_2O_3$ films on A-plane $Al_2O_3$ in excess of about 65 nm show relaxation as evidenced in reciprocal lattice mapping (RSM) but however maintain excellent crystal quality for film >CLT.

Yet other methods for further improvement in the CLT of binary $Ga_2O_3$ films on A-plane $Al_2O_3$ are also possible. For example, during the high temperature O-polish step of a virgin $Al_2O_3$ substrate surface, the substrate temperature can be maintained at about 750-800° C. At this growth temperature the Ga flux can be presented along with the activated oxygen and a high temperature phenomenon can occur. It was found in accordance with the present disclosure that Ga effectively diffuses into the topmost surface of the $Al_2O_3$ substrate forming an extremely high quality corundum $(Al_xGa_{1-x})_2O_3$ template layer with $0 \leq x \leq 1$. The growth can either be interrupted or continued while the substrate temperature is reduced to about 500° C. The template layer then acts as an in-plane lattice matching layer that is closer to $Ga_2O_3$ and thus a thicker CLT is found for the epitaxial film.

Having established the unique properties of A-plane surfaces and with reference to the surface energy trend disclosed in FIG. 20B, bandgap modulated superlattice structures are also shown to be possible.

FIG. 44U shows unique attributes of binary $Ga_2O_3$ and binary $Al_2O_3$ epilayers used to form a SL structure on an A-plane $Al_2O_3$ substrate 5625 (corresponding to peak 5627). The excellent SL HRXRD 5610 and GIXR 5630 data show a plurality of high quality SL Bragg diffraction satellite peaks 5615 and 5620 having period $\Delta_{SL}$=9.5 nm. Not only are the full width at half maximum (FWHM) of each satellite peak 5615 very small, there are also clearly observed the inter-peak oscillations of the Pendellosung fringes. For N=10 periods of SL, there exist N−2 Pendellosung oscillations as shown in both the HRDRD and GIXR. The zeroth order SL peak $SL^{n=0}$ is indicative of the average alloy Al % of the digital alloy formed by the SL and is $x_{Al}^{SL}$=0.85. This level of crystalline perfection is rarely observed in many other non-oxide commercially relevant material systems and is noted to be comparable to extremely mature GaAs/AlAs group-III-Arsenide material systems deposited on GaAs substrates. Such low defect density SL structures are necessary for high performance UVLED operation.

Image 5660 in FIG. 44V demonstrates the crystal quality observed for an example [$Al_2O_3$/$Ga_2O_3$] SL 5645 deposited on A-plane sapphire 5625. Clearly evident is the contrast in Ga and Al specie showing the abrupt interfaces between the nanometer scale films 5650 and 5655 comprising the SL period.

Closer inspection of image 5660 shows the region labelled 5635 which is due to the high temperature Ga intermixing process described above. The $Al_2O_3$ buffer layer 5640 imparts a small strain to the SL stack. Careful attention is paid to maintaining the $Ga_2O_3$ film thickness to well below the CLT to create high quality SL. However, strain accumulation can result and other structures such as growing the SL structure on a relaxed buffer composition midway between the composition endpoints of the materials comprising the SL is possible in some embodiments.

This enables strain symmetrization to be engineered wherein the layer pairs forming the period of the superlattice can have equal and opposite in-plane strain. Each layer is deposited below the CLT and experiences biaxial elastic strain (thereby inhibiting dislocation formation at the interfaces). Therefore some embodiments include engineering a SL disposed on a relaxed buffer layer that enables the SL to accumulate zero strain and thus can be grown effectively strain-free with theoretically infinite thickness.

Yet a further application of corundum film growth can be demonstrated on yet another advantageous $Al_2O_3$ crystal surface, namely the R-plane (1-102).

FIG. 44W shows the ability to epitaxially deposit thick ternary corundum $(Al_xGa_{1-x})_2O_3$ films on R-plane corundum $Al_2O_3$. The HRXRD 5665 shows an R-plane $Al_2O_3$ substrate 5675 that is prepared using a high temperature O-polish and co-deposition of Al and Ga while reducing the growth temperature from 750 to 500° C. forming region 5680. Region 5680 is an optional surface layer modification to the sapphire substrate surface, such as an oxygen-terminated surface. The excellent high quality ternary epilayer 5670 (corresponding to XRD peak 5672) demonstrates sharp Pendellosung fringes 5680 and provides an alloy composition of x=0.64 with respect to the substrate peak 5677. The film thickness for this case is about 115 nm. Also shown in FIG. 44W is the angular separation of symmetric Bragg peaks 5685 of the pseudomorphic corundum $Ga_2O_3$ epilayer.

Again, high utility is placed on creating bandgap epilayer films that may be configured or engineered to construct the required functional regions for the UVLED. In this manner, strain and composition are tools that may be employed for manipulating known functional properties of the materials for application to UVLEDs in accordance with the present disclosure.

FIG. 44X shows an example of a high quality superlattice structure possible for R-plane $Al_2O_3$(1-102) oriented substrates.

The HRXRD 5690 and GIXR 5710 are shown for an example SL epitaxially formed on R-plane $Al_2O_3$(1-102) substrate 5705 (corresponding to peak 5707).

The SL comprises a 10 period [ternary/binary] bilayer pair of [$(Al_xGa_{1-x})_2O_3$/$Al_2O_3$] where x=0.50. The SL period $\Delta_{SL}$=20 nm. The plurality of SL Bragg diffraction peaks 5695 and reflectivity peaks 5715 indicate coherently grown pseudomorphic structure. The zeroth order SL diffraction peak $SL^{n=0}$ 5700 indicates an effective digital alloy $x_{SL}$ of the SL as comprising $(Al_{xSL}Ga_{1-xSL})_2O_3$ where $x_{SL}$=0.2.

Such highly coherent and largely dissimilar bandgap materials used to create epitaxial SL with abrupt discontinuities at the interfaces may be employed for the formation of quantum confined structures as disclosed herein for application to optoelectronic devices such as UVLEDs.

The conduction and valence band energy discontinuity available at the $Al_2O_3$/$Ga_2O_3$ heterointerface for corundum crystal symmetry (R3c) is:

$$\Delta E_{R3c}^{C}=E_{Al_2O_3}^{C}-E_{Ga_2O_3}^{C}=3.20\text{ eV}$$

$$\Delta E_{R3c}^{V}=E_{Al_2O_3}^{V}-E_{Ga_2O_3}^{V}=0.12\text{ eV}$$

Also, for the monoclinic crystal symmetry (C2m) heterointerface the band offsets are:

$$\Delta E_{C2m}^{C}=E_{Al_2O_3}^{C}-E_{Ga_2O_3}^{C}=2.68\text{ eV}$$

$$\Delta E_{C2m}^{V}=E_{Al_2O_3}^{V}-E_{Ga_2O_3}^{V}=0.34\text{ eV}$$

Some embodiments also include creating a potential energy discontinuity by creation of $Ga_2O_3$ layers having an abrupt change in crystal symmetry.

For example, it is disclosed herein that corundum crystal symmetry $Ga_2O_3$ can be directly epitaxially deposited on monoclinic $Ga_2O_3$ (110)-oriented surfaces. Such a heterointerface produces band offsets given by:

$$\Delta E_{Ga_2O_3}^{C}=E_{R3c}^{C}-E_{C2m}^{C}\sim 0.50\text{ eV}$$

$$\Delta E_{Ga_2O_3}^{V}=E_{R3c}^{V}-E_{C2m}^{V}\sim 0.10\text{ eV}$$

These band offsets are sufficient to create quantum confined structures as will be described below.

As yet another example of embodiments of complex metal oxide heterostructures, refer to FIG. 44Y wherein a cubic MgO epilayer 5730 is formed directly on a spinel $MgAl_2O_4$(100) oriented substrate 5725. The HRXRD 5720 shows the cubic $MgAl_2O_4$ (h 0 0), h=4, 8 substrate Bragg diffraction peaks 5727 and the epitaxial cubic MgO peaks 5737 corresponding to the MgO epilayer 5730. The lattice constant of MgO is almost exactly twice the lattice constant of $MgAl_2O_4$ and thus creates unique epitaxial coincidence for in-plane lattice registration at the heterointerface.

Clearly a high quality MgO(100)-oriented epilayer is formed as evidenced by the narrow FWHM. Next a monoclinic layer of $Ga_2O_3$ 5735 is formed on the MgO layer 5730. The $Ga_2O_3$(100) oriented film is evidenced by the 5736 Bragg diffraction peak.

The interest in cubic $MgAl_2O_4$ and $Mg_xAl_{2(1-x)}O_{3-2x}$ ternary structures is due to the direct and large bandgap possible.

Graph 5740 of FIG. 44Z shows the energy band structure for $Mg_xAl_{2(1-x)}O_{3-2x}$ x~0.5 showing a direct bandgap 5745 formed between the conduction band 5750 and valence band 5755 extrema.

Some embodiments also include growing directly $Ga_2O_3$ on Lanthanum-Aluminum-Oxide $LaAlO_3$(001) substrates.

The example structures disclosed in FIGS. 44A-44Z are for the purpose of demonstrating some of the possible configurations applicable for use in at least a portion of a UVLED structure. The wide variety of compatible mixed symmetry type heterostructures is a further attribute of the present disclosure. As would be appreciated, other configurations and structures are also possible and consistent with the present disclosure.

Figure 45:
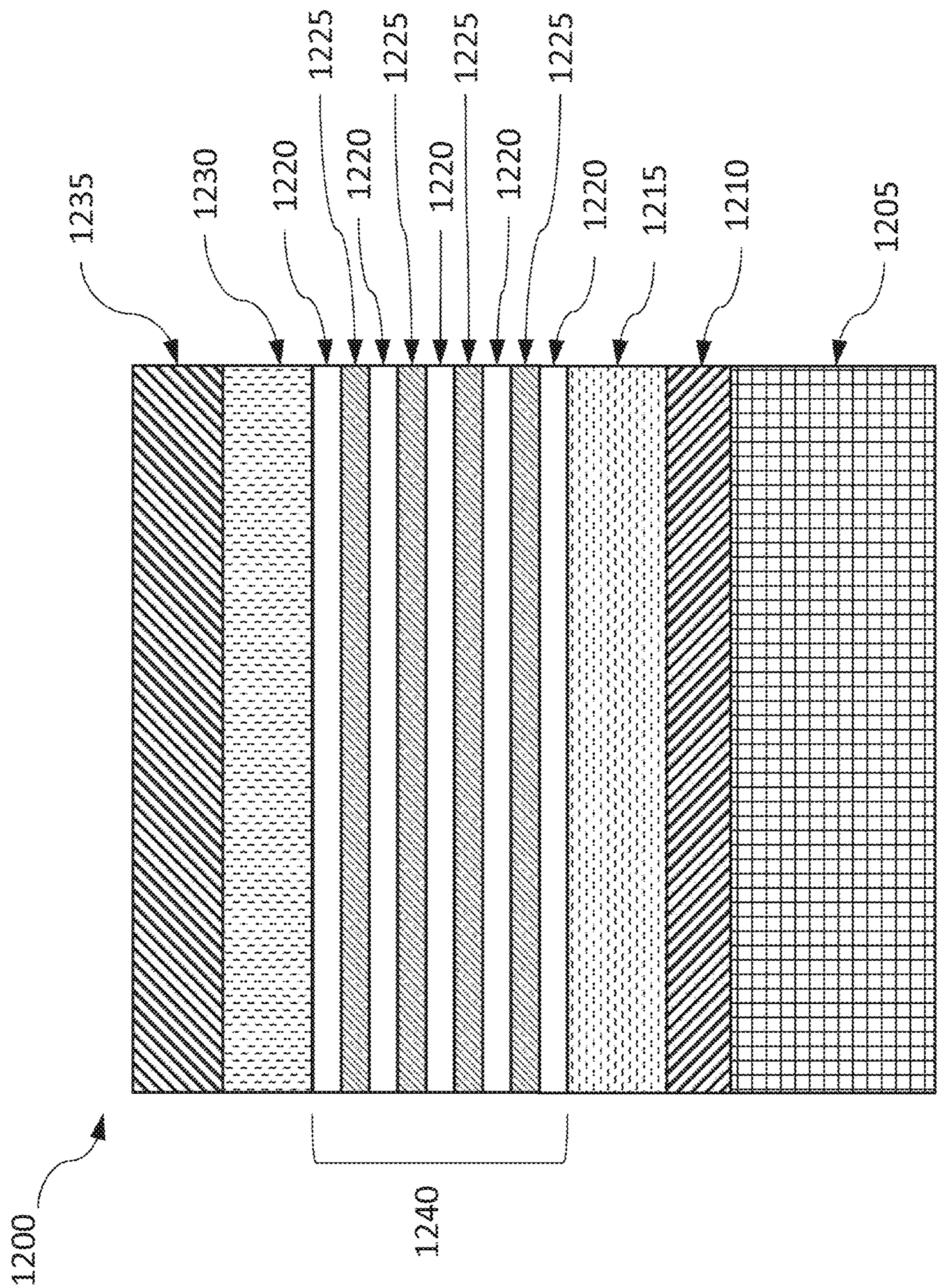
FIG. 45 shows schematically a construction of epitaxial regions for a metal oxide UVLED comprising a p-i-n heterojunction diode and multiple quantum wells to tune the optical emission energy in accordance with an illustrative embodiment of the present disclosure.
Figure 46:
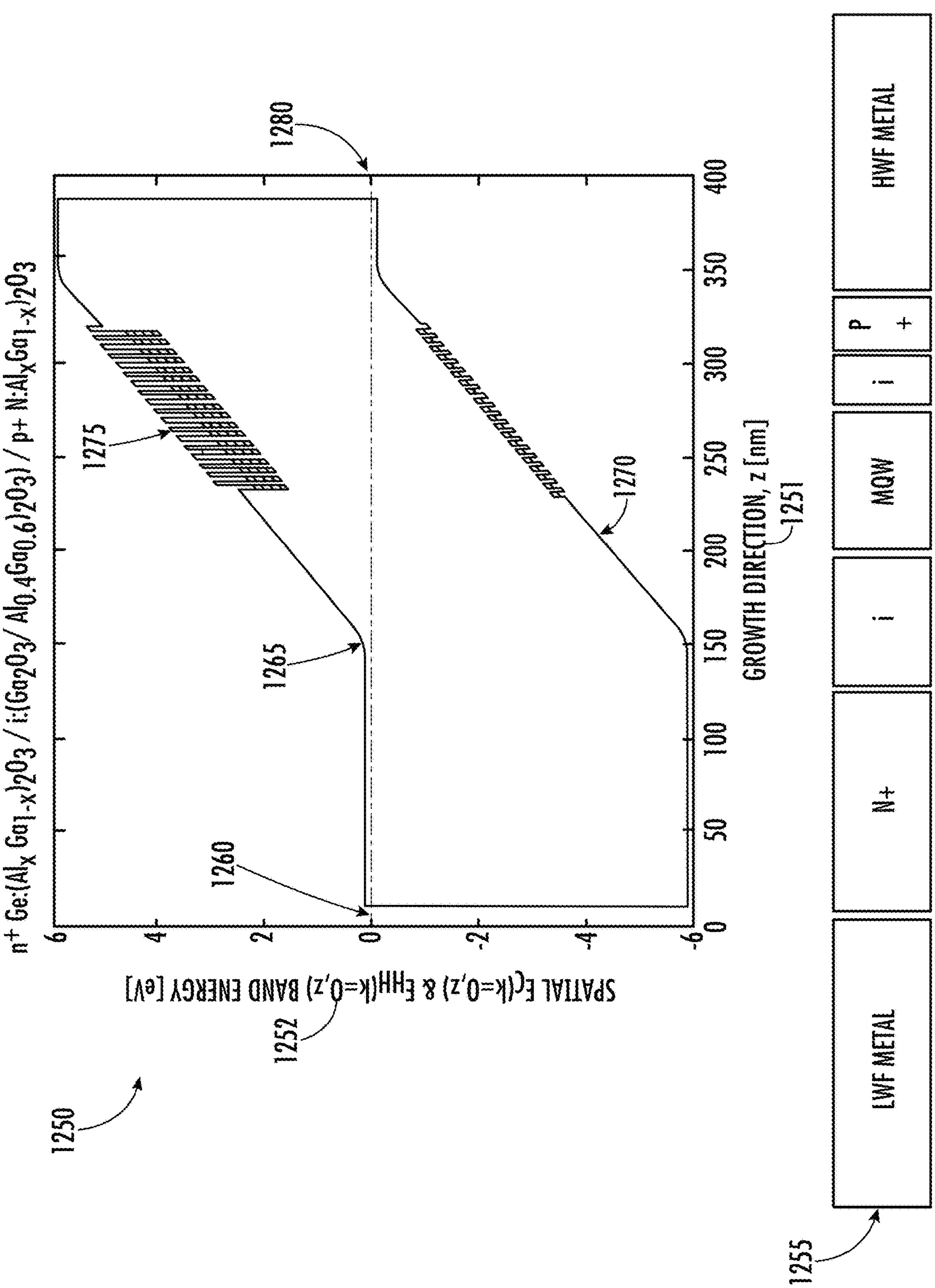
FIG. 46 is an energy band diagram versus growth direction of the epitaxial metal oxide UVLED structure illustrated in FIG. 45 where the k=0 representation of the band structure is plotted in accordance with an illustrative embodiment of the present disclosure.

The aforementioned unique properties of the $AlGaO_3$ material system can be applied to formation of a UVLED. FIG. 45 shows an example light emitting device structure 1200 in accordance with the present disclosure. Light emitting device 1200 is designed to operate such that optically generated light can be out-coupled vertically through the device. Device 1200 comprises a substrate 1205, a first conductivity n-type doped $AlGaO_3$ region 1210, followed by a not-intentionally doped (NID) intrinsic $AlGaO_3$ spacer region 1215, followed by a multiple quantum well (MQW) or superlattice 1240 formed using periodic repetitions of $(Al_xGa_{1-x})_2O_3/(Al_yGa_{1-y})_2O_3$ wherein the barrier layer comprises the larger bandgap composition 1220 and the well layer comprises the narrower bandgap composition 1225.

The total thickness of the MQW or SL 1240 is selected to achieve the desired emission intensity. The layer thicknesses comprising the unit cell of the MQW or SL 1240 are configured to produce a predetermined operating wavelength based on the quantum confinement effect. Next an optional $AlGaO_3$ spacer layer 1230 separates the MQW/SL from the p-type $AlGaO_3$ layer 1235.

Figure 53:
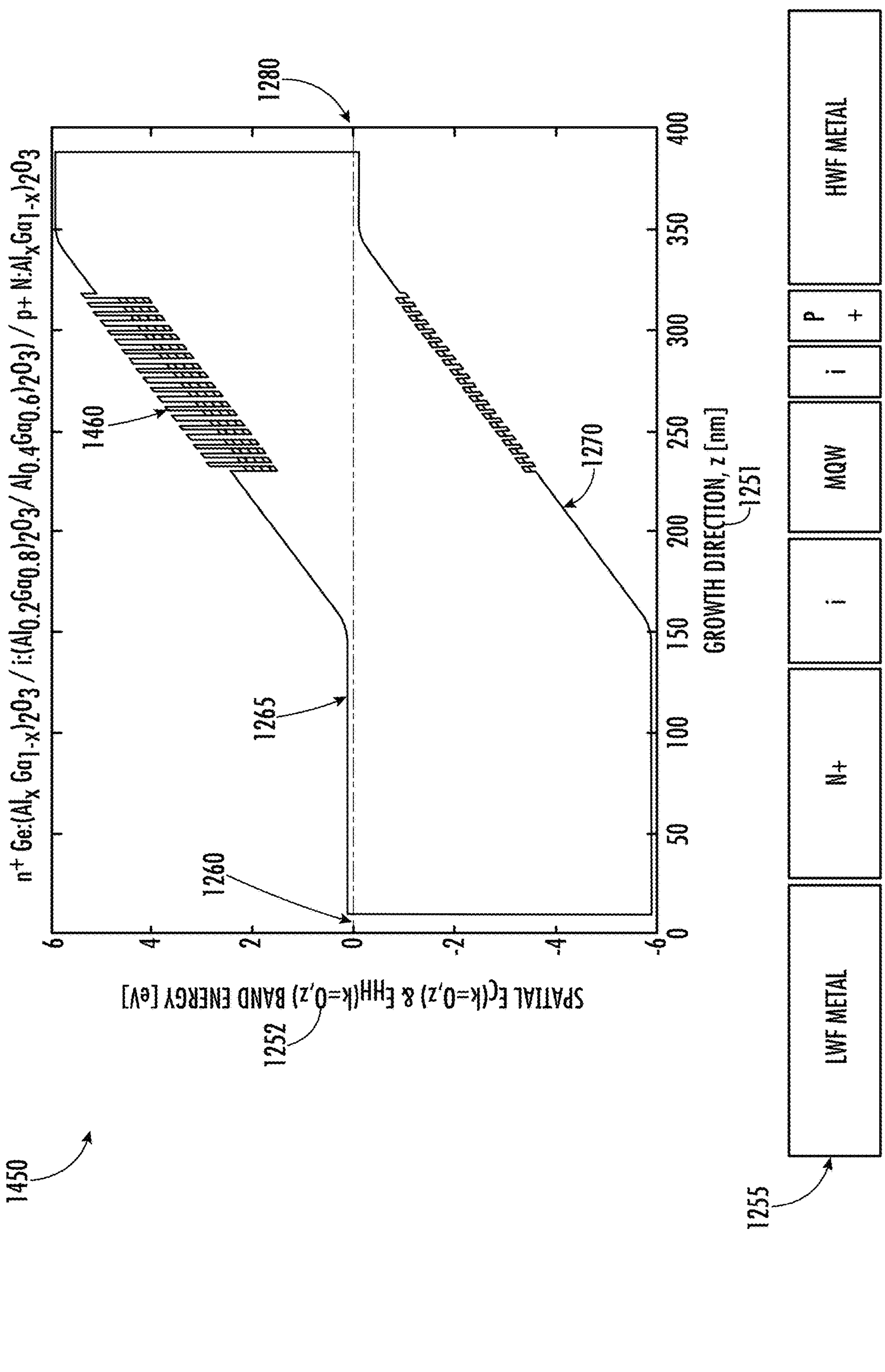
FIG. 53 is an energy band diagram versus growth direction of an epitaxial metal oxide UVLED structure where the MQW region has a narrow bandgap material comprising $(Al_{0.2}Ga_{0.8})_2O_3$ in accordance with an illustrative embodiment of the present disclosure.

Spatial energy band profiles using the k=0 representation are disclosed in FIGS. 46, 47, 49, 51 and 53 which are graphs of spatial band energy 1252 as a function of growth direction 1251. The n-type and p-type conductivity regions 1210 and 1235 are selected from monoclinic or corundum compositions of $(Al_xGa_{1-x})_2O_3$, where x=0.3, followed by a NID 1215 of the same composition x=0.3. The MQW or SL 1240 is tuned by keeping the thickness of both the well and barrier layers the same in each design 1250 (FIGS. 46, 47), 1350 (FIG. 49), 1390 (FIG. 51) and 1450 (FIG. 53).

Figure 47:
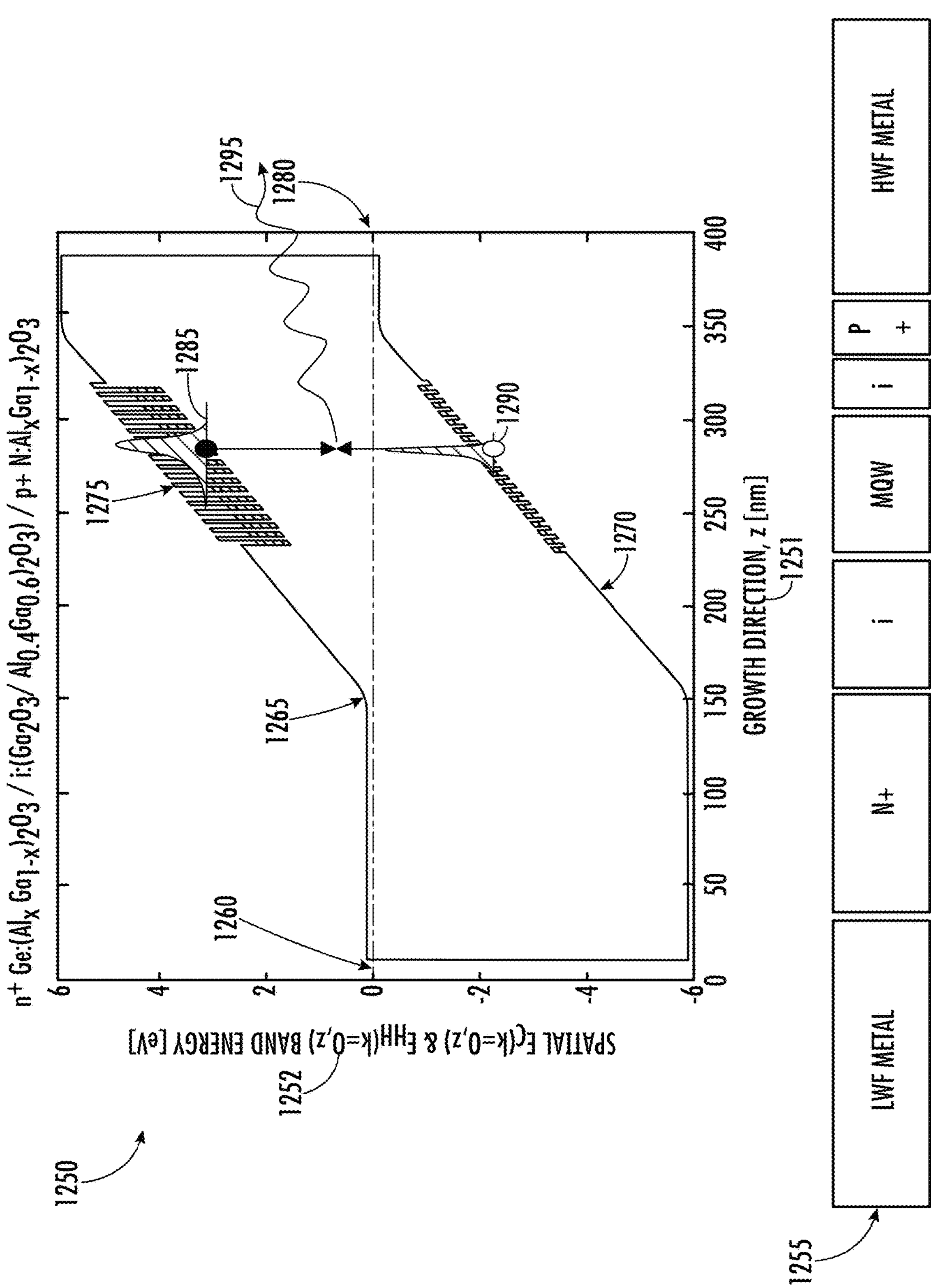
FIG. 47 shows a spatial carrier confinement structure of the multiple quantum well (MQW) regions of FIG. 46 having quantized electron and hole wavefunctions which spatially recombine in the MQW region to generate a predetermined emitted photon energy determined by the respective quantized states in the conduction and valence bands where the MQW region has a narrow bandgap material comprising $Ga_2O_3$ in accordance with an illustrative embodiment of the present disclosure.
Figure 49:
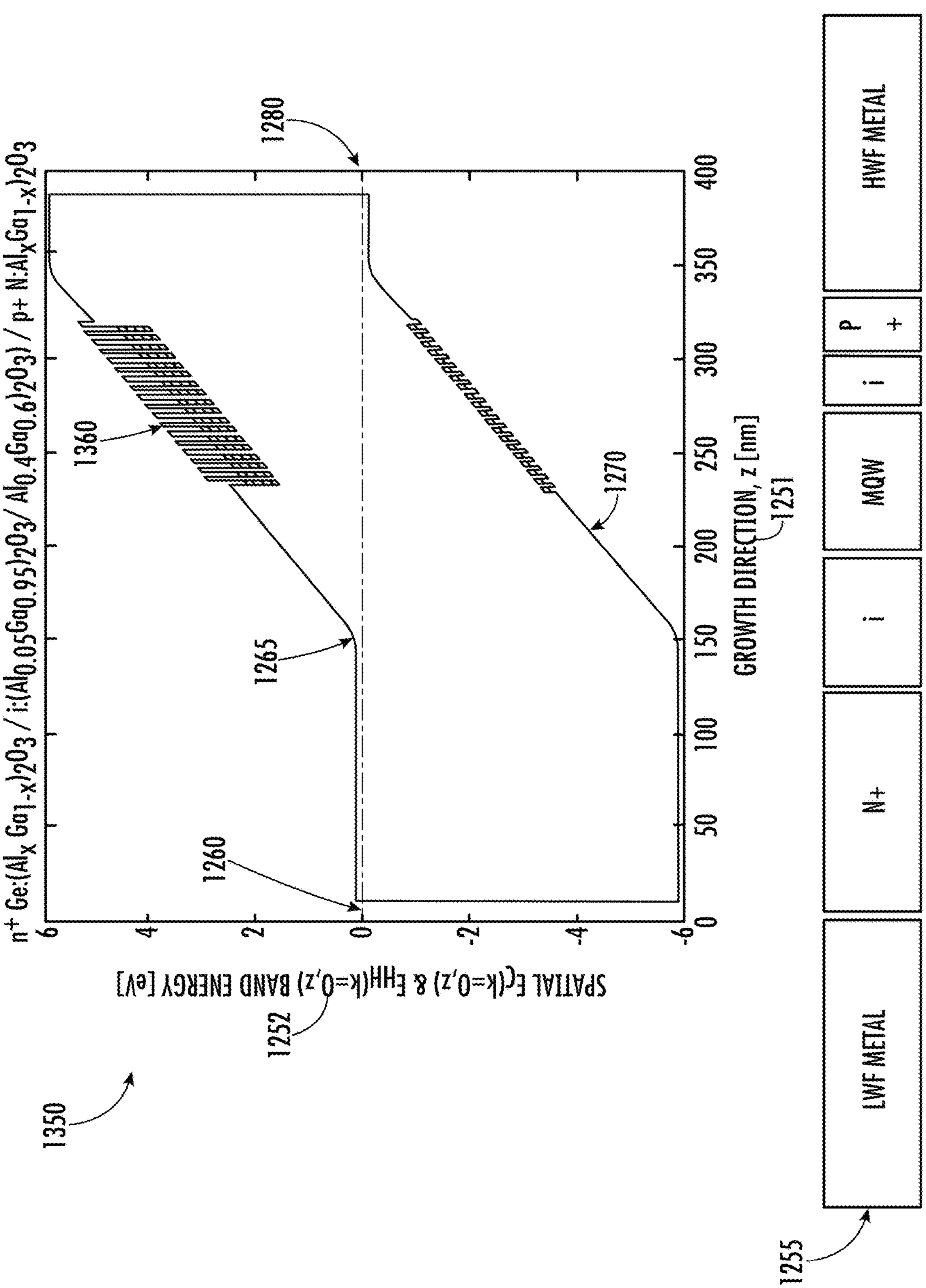
FIG. 49 is an energy band diagram versus growth direction of an epitaxial metal oxide UVLED structure where the MQW region has a narrow bandgap material comprising $(Al_{0.05}Ga_{0.95})_2O_3$ in accordance with an illustrative embodiment of the present disclosure.
Figure 51:
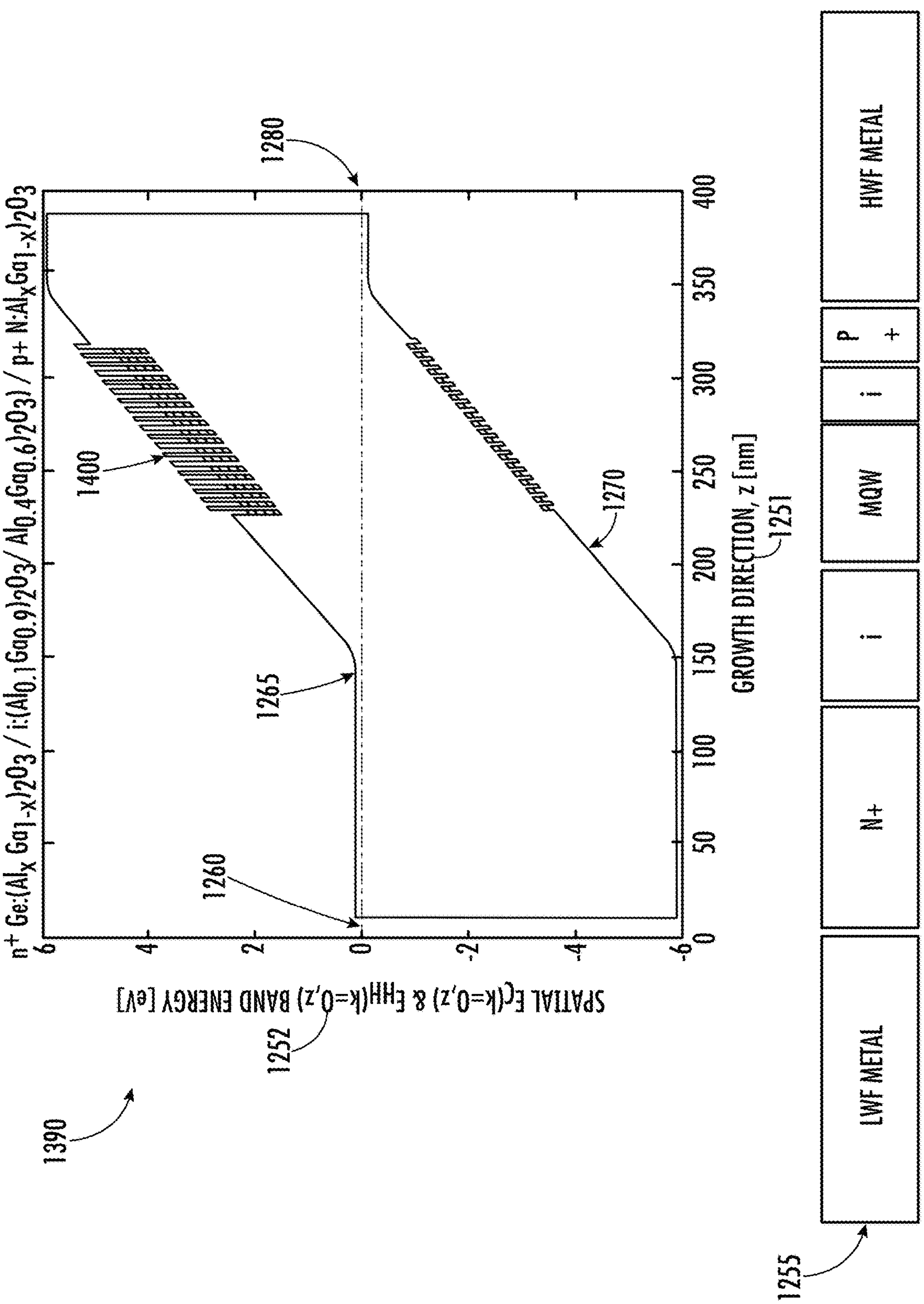
FIG. 51 is an energy band diagram versus growth direction of an epitaxial metal oxide UVLED structure where the MQW region has a narrow bandgap material comprising $(Al_{0.1}Ga_{0.9})_2O_3$ in accordance with an illustrative embodiment of the present disclosure.

The composition of the well is varied from x=0.0, 0.05, 0.10 and 0.20, and the barrier is fixed to y=0.4 for the bi-layer pairs $(Al_xGa_{1-x})_2O_3/(Al_yGa_{1-y})_2O_3$. These MQW regions are located at 1275, 1360, 1400 and 1460. The thickness of the well layer is selected from at least $0.5xa_w$ to $10xa_w$ the unit cell (aw lattice constant) of the host composition. For the present case, one unit cell is chosen. The periodic unit cell thickness can be relatively large as the corundum and monoclinic unit cells are relatively large. However, sub-unit-cell assemblies may be utilized in some embodiments. MQW region 1275 in FIG. 47 is configured for intrinsic or non-intentionally doped layer combination comprising $Ga_2O_3/(Al_{0.4}Ga_{0.6})_2O_3$. MQW region 1360 in FIG. 49 is configured for intrinsic or non-intentionally doped layer combination comprising $(Al_{0.05}Ga_{0.95})_2O_3/(Al_{0.4}Ga_{0.6})_2O_3$. MQW region 1400 in FIG. 51 is configured for intrinsic or non-intentionally doped layer combination comprising $(Al_{0.1}Ga_{0.9})_2O_3/(Al_{0.4}Ga_{0.6})_2O_3$. MQW region 1460 in FIG. 53 is configured for intrinsic or non-intentionally doped layer combination comprising $(Al_{0.2}Ga_{0.9})_2O_3/(Al_{0.4}Ga_{0.6})_2O_3$.

Also shown are ohmic contact metals 1260 and 1280. The conduction band edge $E_C(z)$ 1265 and the valence band edges $E_V(z)$ 1270 and the MQW region 1400 shows the modulation in bandgap energy with respect to the spatially modulated composition. This is yet another particular advantage of atomic layer epitaxy deposition techniques which make such structures possible.

FIG. 47 shows schematically the confined electron 1285 and hole 1290 wavefunctions within the MQW region 1275. The electric-dipole transition due to spatial recombination of electron 1285 and hole 1290 creates photon 1295.

Figure 48:
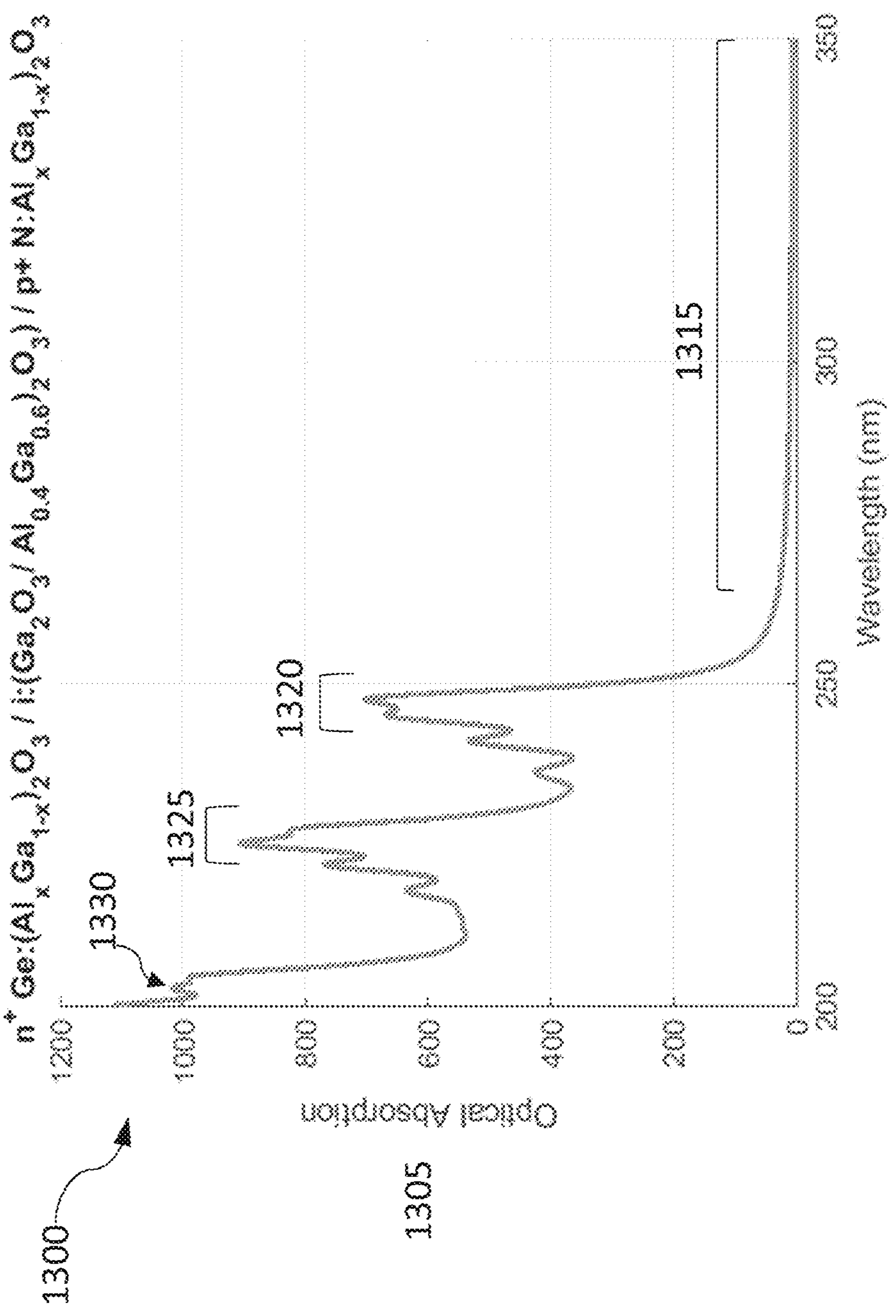
FIG. 48 shows a calculated optical absorption spectrum for the device structure in FIG. 47 where the lowest energy electron-hole recombination is determined by the quantized energy levels within the MQW giving rise to sharp and discrete absorption/emission energy in accordance with an illustrative embodiment of the present disclosure.

The emission spectrum can be calculated and is shown in FIG. 48, plotted in graph 1300 as the emission wavelength 1310 and the oscillator absorption strength 1305 due to the wavefunction overlap integrals for the spatially dependent quantized electron and holes states (also indicative of the emission strength). A plurality of peaks 1320, 1325 and 1330 are generated due to recombination of quantized energy states with the MQW. In particular, the lowest energy electron-hole recombination peak 1320 is the most probable and occurs at ~245 nm. Region 1315 shows that below the energy gap of the MQW there is no absorption or optical emission. The first onset of optical activity in moving toward shorter wavelengths is the n=1 exciton peak 1320 determined by the MQW configuration.

Figure 50:
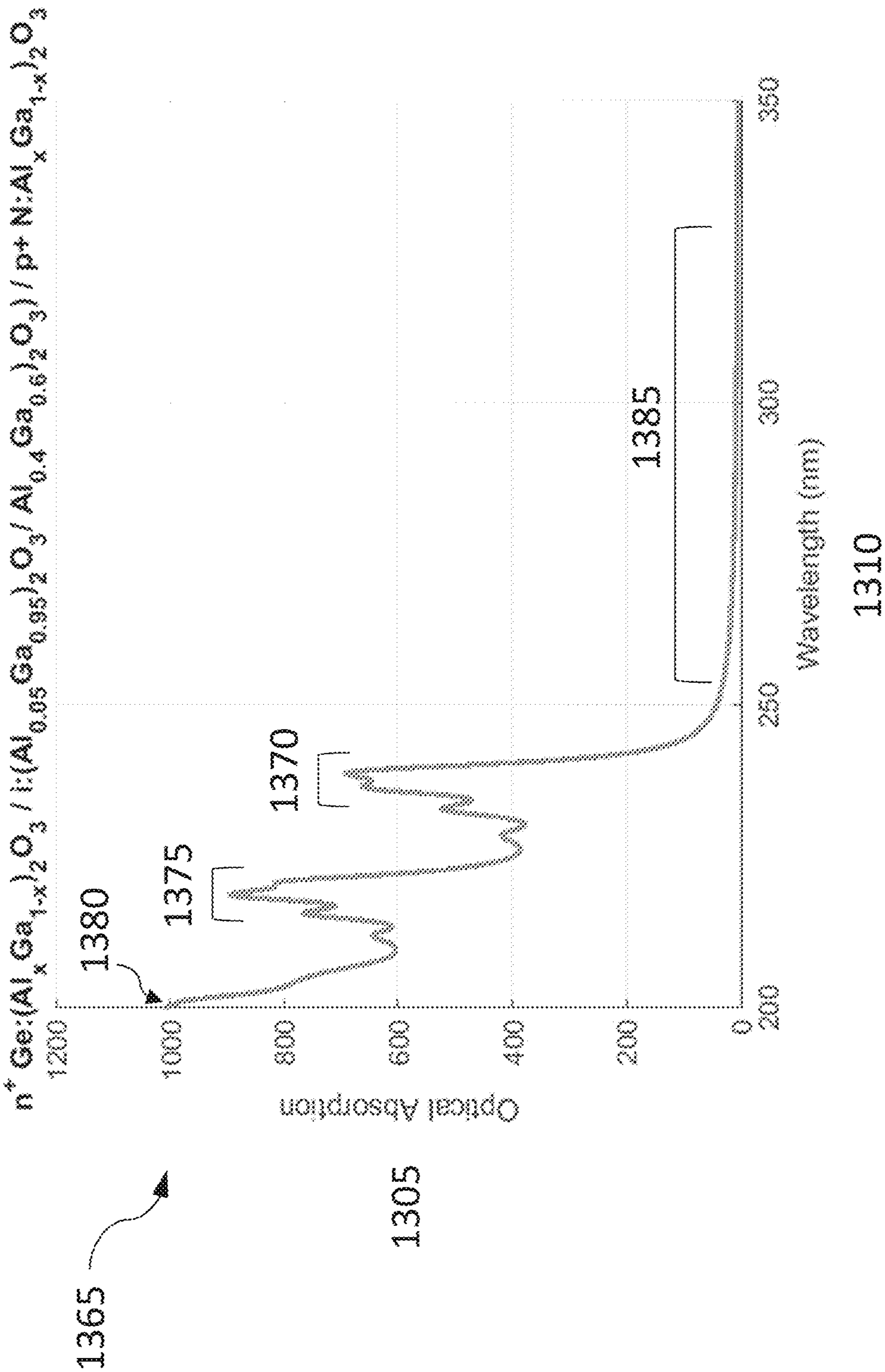
FIG. 50 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure.
Figure 52:
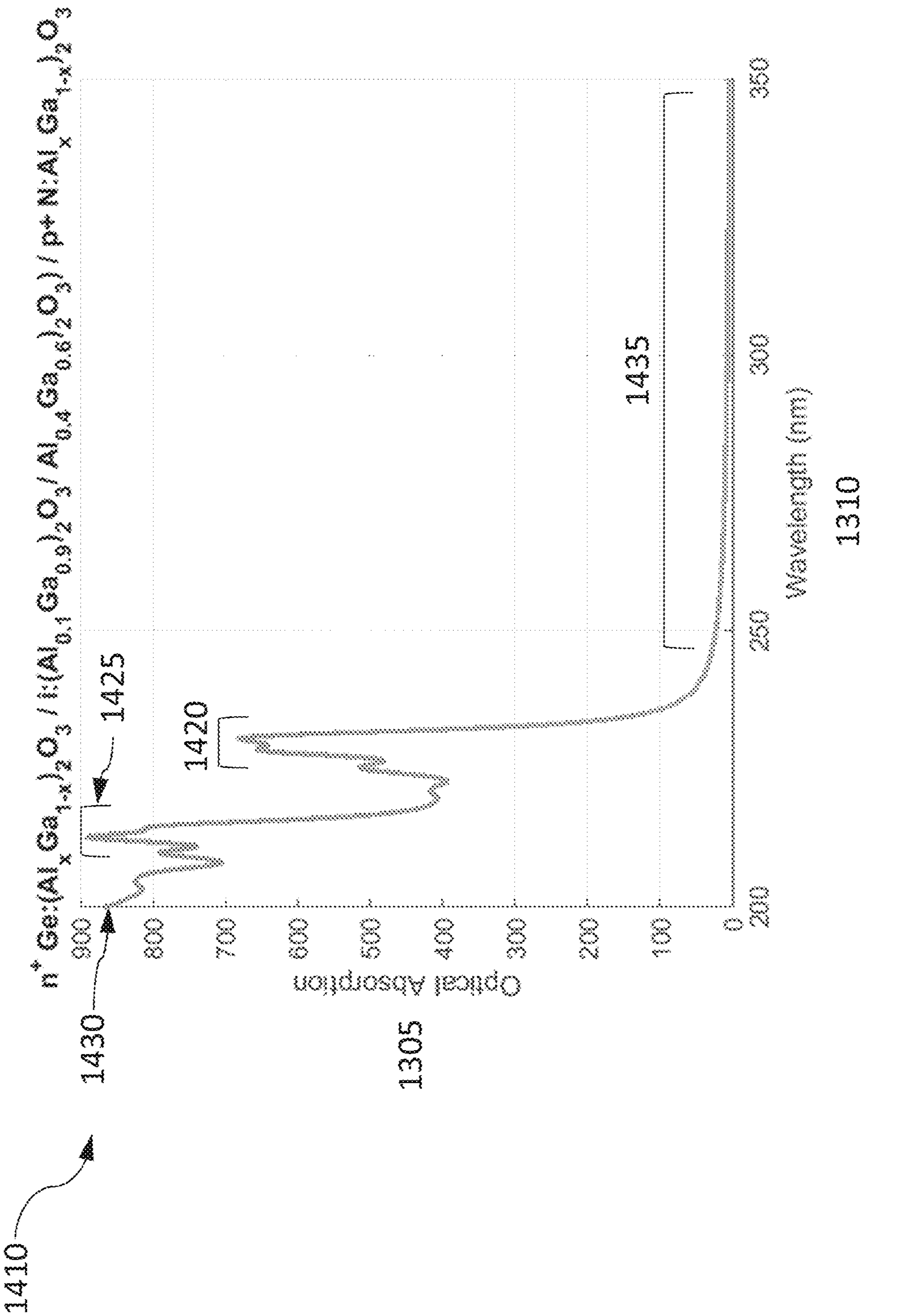
FIG. 52 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure.
Figure 54:
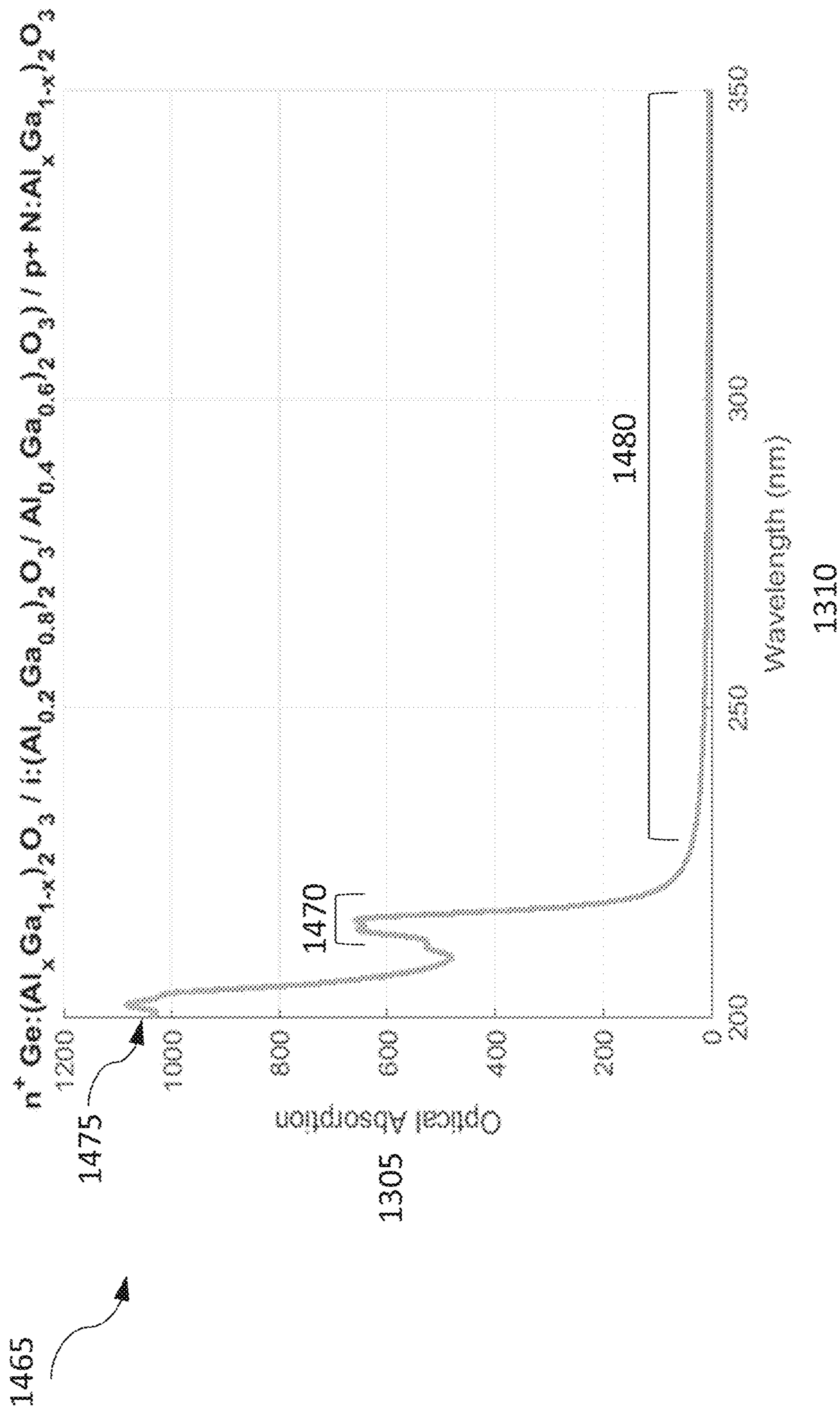
FIG. 54 shows a calculated optical absorption spectrum for the device structure in FIG. 53 where the lowest energy electron-hole recombination is determined by the quantized energy levels within the MQW giving rise to sharp and discrete absorption/emission energy in accordance with an illustrative embodiment of the present disclosure.

The MQW configurations 1275, 1360, 1400 and 1460 result in light emission energy peaks 1320 (FIG. 48), 1370 (FIG. 50), 1420 (FIG. 52) and 1470 (FIG. 54) having peak operating wavelengths of 245 nm, 237 nm, 230 nm and 215 nm, respectively. Graph 1365 of FIG. 50 also shows peaks 1375 and 1380 along with region 1385. Graph 1410 of FIG. 52 also shows peaks 1425 and 1430 along with region 1435. Graph 1465 of FIG. 54 also shows peak 1475 along with region 1480. Regions 1385, 1435 and 1480 show that there is no optical absorption or emission for photon energy/wavelengths below the energy gap of the MQW.

Yet a further feature of extremely wide bandgap metal oxide semiconductors is the configuration of ohmic contacts to n-type and p-type regions. The example diode structures 1255 comprise high work-function metal 1280 and low work-function metal 1260 (ohmic contact metals). This is because of the relative electron affinity of the metal-oxides with respect to vacuum (refer to FIG. 9).

FIGS. 48, 50, 52 and 54 show the optical absorption spectrum for the MQW regions contained within the diode structures 1255. The MQW comprises two layers of a narrower bandgap material and a wider bandgap material. The thickness of the layers, and in particular the narrow bandgap layer, are selected such that they are small enough to exhibit quantization effects along the growth direction within the conduction and valence potentials wells that are formed. The absorption spectrum represents the creation of an electron and hole in the quantized state of the MQW upon resonant absorption of an incident photon.

The reversible process of photon creation is where the electron and hole are spatially localized in their respective quantum energy levels of the MQW and recombine by virtue of the direct bandgap. The recombination produces a photon with energy that equals approximately that of the bandgap of the layer acting as the potential well having a direct energy gap in addition to the energy separation of the quantized levels within the potentials wells relative to the conduction and valence band edges. The emission/absorption spectra therefore show the lowest lying energy resonance peak indicative of the UVLED primary emission wavelength and is engineered to be the desired operating wavelength of the device.

Figure 55:
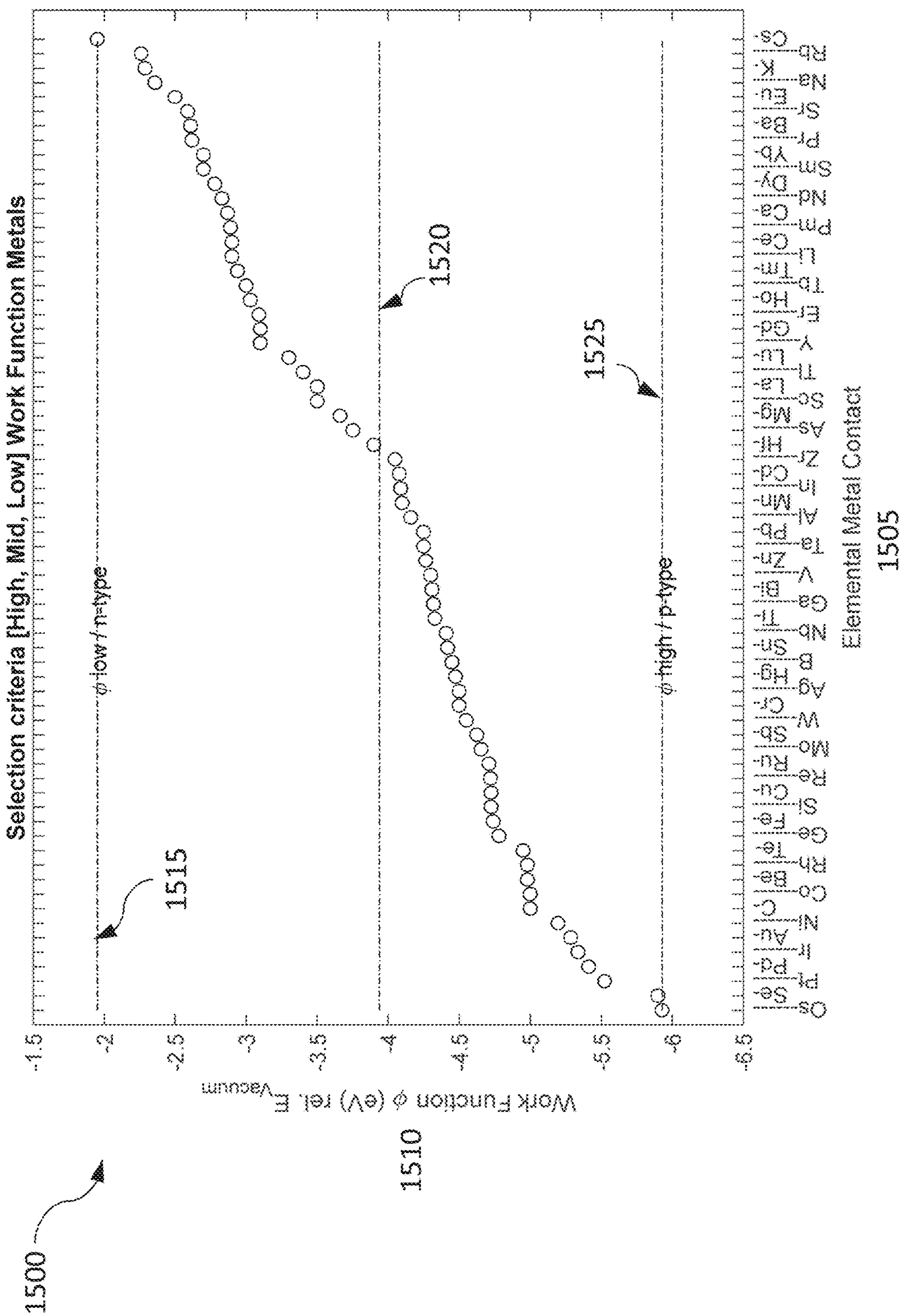
FIG. 55 plots pure metal work-function energy and sorts the metal species from high to low work function for application to p-type and n-type ohmic contacts to metal oxides in accordance with illustrative embodiments of the present disclosure.

FIG. 55 shows a plot 1500 of the known pure metal work-function energy 1510 and sorts the metal species (elemental metal contact 1505) from high 1525 to low 1515 work function for application to p-type and n-type ohmic contacts and provides selection criteria for the metal contacts for each of the conductivity type regions required by the UVLED. Line 1520 represents the mid-point work function energy with respect to the high 1525 and low 1515 limits depicted in FIG. 55.

In some embodiments, Ni, Os, Se, Pt, Pd, Ir, Au, W and alloys thereof are used for the p-type regions, and low work-function metals selected from Ba, Na, Cs, Nd and alloys thereof can be used. Other selections are also possible. For example, in some cases, Al, Ti, Ti—Al alloys, and titanium nitride (TiN) being common metals can also be used as contacts to an n-type epitaxial oxide layer.

Intermediary contact materials such as semi-metallic palladium oxide PdO, degenerately doped Si or Ge and rare-earth nitrides can be used. In some embodiments, ohmic contacts are formed in-situ to the deposition process for at least a portion of the contact materials to preserve the [metal contact/metal oxide] interface quality. In fact, single crystal metal deposition is possible for some metal oxide configurations.

Figure 56:
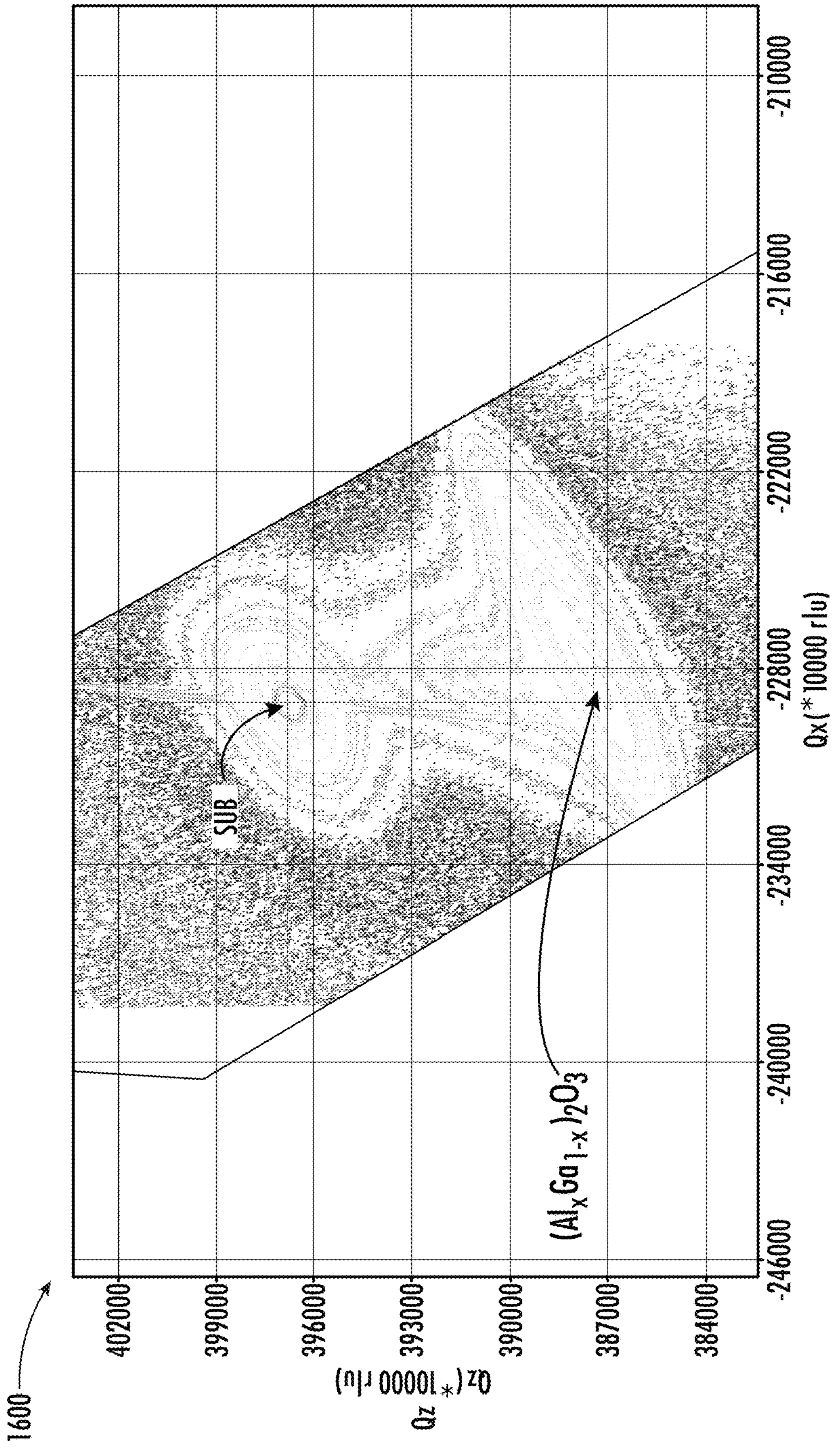
FIG. 56 is a reciprocal lattice map 2-axis x-ray diffraction pattern for pseudomorphic ternary $(Al_{0.5}Ga_{0.5})_2O_3$ on an A-plane $Al_2O_3$ substrate in accordance with an illustrative embodiment of the present disclosure.
Figure 57:
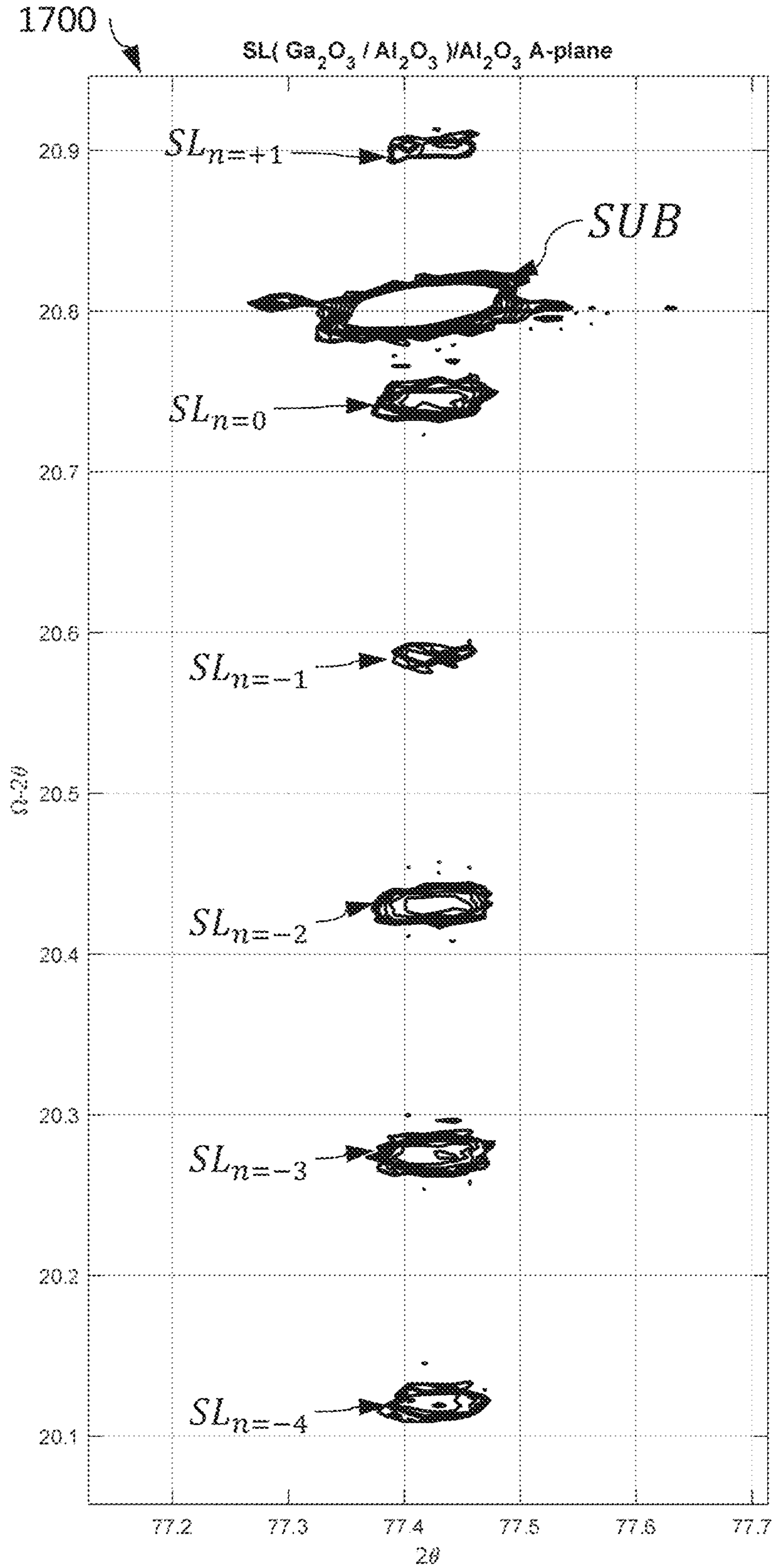
FIG. 57 is a 2-axis x-ray diffraction pattern of a pseudomorphic 10 period SL [$Al_2O_3$/$Ga_2O_3$] on an A-plane $Al_2O_3$ substrate showing in-plane lattice matching throughout the structure in accordance with an illustrative embodiment of the present disclosure.

X-ray diffraction (XRD) is one of the most powerful tools available to crystal growth analysis to directly ascertain crystallographic quality and crystal symmetry type. FIGS. 56 and 57 show the two-dimensional XRD data of example materials of ternary $AlGaO_3$ and a binary $Al_2O_3/Ga_2O_3$ superlattice. Both structures are deposited pseudomorphically on corundum crystal symmetry substrates having an A-plane oriented surface.

Referring now to FIG. 56, there is shown a reciprocal lattice map 2-axis x-ray diffraction pattern 1600 for a 201 nm thick epitaxial ternary $(Al_{0.5}Ga_{0.5})_2O_3$ on an A-plane $Al_2O_3$ substrate. Clearly, the in-plane and perpendicular mismatch of the ternary film is well matched to the underlying substrate. The in-plane mismatch parallel to the plane of growth is ~4088 ppm, and the perpendicular lattice mismatch of the film is ~23440 ppm. The relatively vertical displacement of the ternary layer peak $(Al_xGa_{1-x})_2O_3$ with respect to the substrate (SUB) shows excellent film growth compatibility and is directly advantageous for UVLED application.

Referring now to FIG. 57, there is shown a 2-axis x-ray diffraction pattern 1700 of a 10 period SL[$Al_2O_3/Ga_2O_3$] on an A-plane $Al_2O_3$ substrate showing excellent strained $Ga_2O_3$ layers (no spread in 2theta angle)=>elastically strained SL. The SL period=18.5 nm and an effective SL digital Al % ternary alloy, x_Al~18%.

In further illustrative embodiments, an optoelectronic semiconductor device in accordance with the present disclosure may be implemented as an ultraviolet laser device (UVLAS) based upon metal oxide semiconducting materials.

The metal oxide compositions having bandgap energy commensurate with operation in the UVC (150-280 nm) and far/vacuum UV wavelengths (120-200 nm) have the general distinguishing feature of having intrinsically small optical refractive index far from the fundamental band edge absorption. For operation as optoelectronic devices with energy states in the immediate vicinity of the conduction and valence band edges the effective refractive index is governed by the Krammers-Kronig relations.

FIGS. 58A-58B show a section of a metal-oxide semiconductor material 1820 having optical length 1850 along a one-dimensional optical axis in accordance with an illustrative embodiment of the present disclosure. An incident light vector 1805 enters the material 1820 from air having refractive index $n_{Mox}$. The light within the material 1820 is transmitted and reflected (beams 1810) at the refractive index discontinuities at each surface with a transmitted optical beam 1815.

The material slab of length 1850 can support a number of optical longitudinal modes 1825 as shown in FIG. 58A. The transmission 1815 as a function of the optical wavelength incident upon the slab shows a Fabry-Perot mode structure having modes 1825. For a photon trapped within the optical cavity defined by the one-dimensional slab it is possible in accordance with the present disclosure to determine the roundtrip losses of the slab and the required minimum optical gain required to overcome these losses and enable a net gain.

The threshold gain is calculated in FIG. 58B showing the transmission factor β as a function of optical gain within the slab for the forward 1830 and reverse 1835 propagating light beams 1810. For this simple Fabry-Perot case the low refractive index $n_{Mox}$=2.5 of slab length $L_{cav}$=1 micrometer requires a threshold gain 1845 calculated by the full-width-half max point of the peak gain at 1840.

Some embodiments implement semiconductor cavities contained with a vertical-type structure 110 (e.g., see FIG. 2A) with sub-micron length scales. This is because of the desire to localize the electron and hole recombination into a narrow region. Confining the physical thickness of the slab, where the carrier recombination occurs and light emission is generated, aids in reducing the threshold current density required to achieve lasing. It is therefore instructive to understand the required threshold gain by reducing the gain slab length.

FIGS. 59A-59B show the same optical material as FIGS. 58A-58B, but for the case of $L_{cav}$=500 nm. The smaller cavity length 1860 compared to length 1850 results in fewer allowed optical modes 1870. The required threshold gain required to overcome cavity losses is increased to 1865 compared to the gain 1845 of FIG. 58A, referring to the peaks 1877 calculated for forward and reverse propagating modes 1880 and 1885, respectively, shown in FIG. 59B.

The increase in required threshold gain for a slab of metal oxide material can be reduced dramatically by increasing the slab length of the optical gain medium—in this case the metal-oxide semiconducting region responsible for the optical emission process.

Referring again to FIGS. 2A and 2B, instead of using vertical type 110 emission devices (i.e., FIG. 2A), some embodiments utilize planar waveguide structures where the optical mode overlaps an optical gain layer along the plane parallel length. That is, even though the gain material is still a thin slab the optical propagation vector is substantially parallel to the plane of the gain slab.

Figure 74:
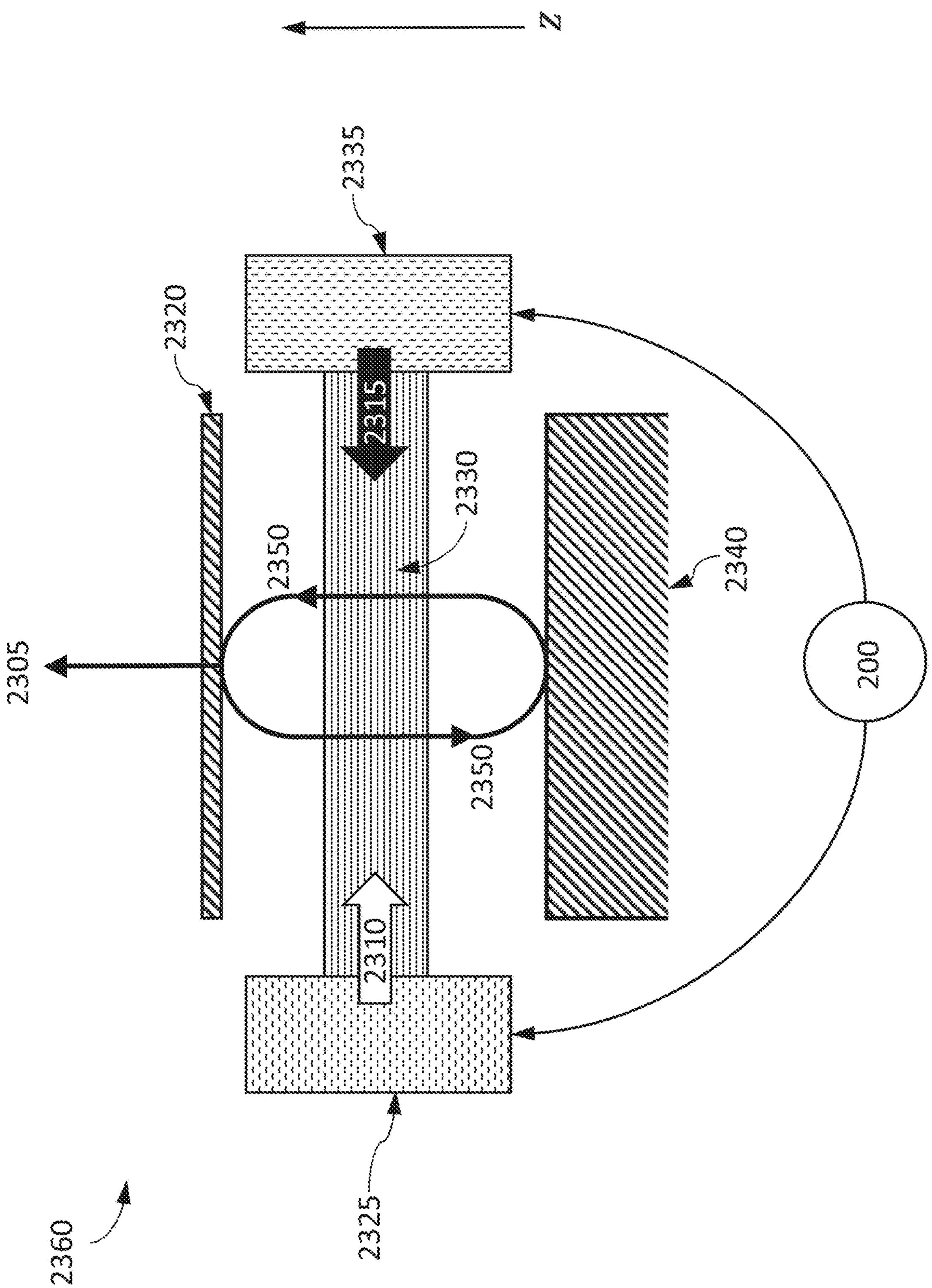
FIG. 74 shows a vertical type ultraviolet laser structure in accordance with an illustrative embodiment of the present disclosure where the reflectors forming the optical cavity are decoupled from the electrical circuit.

This is shown schematically for structure 140 in FIG. 2B and structure 2360 in FIG. 74. Waveguide structures having optical gain region layer thicknesses well below 500 nm are possible and can even be as thin as 1 nanometer supporting a quantum well (refer to FIGS. 64 to 68). The longitudinal length of the waveguide can then be of the order of several microns to even a few millimeters or even a centimeter. This is an advantage of the waveguide structure. An added requirement is the ability to confine and guide optical modes along the major axis length of the waveguide, which can be achieved by use of suitable refractive index discontinuities. Optical modes prefer to be guided in a higher refractive index medium compared to the surrounding non-absorptive cladding regions. This can be achieved using metal-oxide compositions as set out in the present disclosure which can be preselected to exhibit advantageous E-k band structure.

A UVLAS requires, in the most fundamental configuration, at least one optical gain medium and an optical cavity for recycling generated photons. The optical cavity must also present a high reflector (HR) with low loss and an output coupling reflector (OC) that can transmit a portion of the optical energy generated with in the gain medium. The HR and OC reflectors are in general plane parallel or enable focusing of the energy within the cavity into the gain medium.

Figure 60:
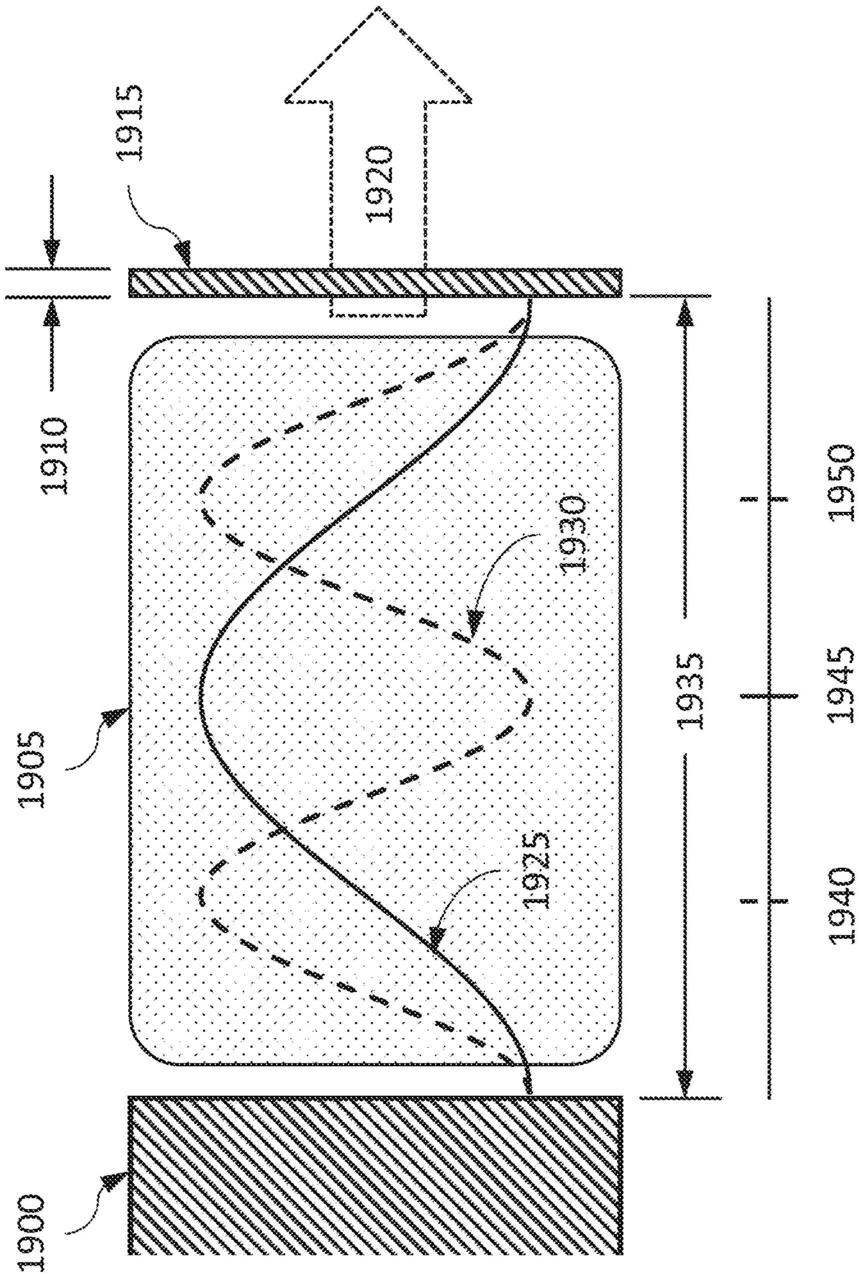
FIG. 60 shows an optical cavity formed using an optical gain medium embedded between two optical reflectors in accordance with an illustrative embodiment of the present disclosure.

FIG. 60 shows schematically an embodiment of an optical cavity having HR 1900, gain medium 1905 substantially filling the cavity of length 1935, and an OC 1915 having physical thickness 1910. The standing waves 1925 and 1930 show two distinct optical wavelength optical fields that are matched to the cavity length. The outcoupled light 1920 is due to the OC leaking a portion of the trapped energy within the cavity gain medium 1905. In one example, Aluminum metal of low thickness≤15 nm is utilized in the far or vacuum UV wavelength regions and the transmission can be tuned accurately by the Al-film thickness 1910. The lowest energy standing wave 1925 has a node (peak intensity of the optical field) at the center node 1945 of the cavity. The $1^{st}$ harmonic (standing wave 1930) exhibits to nodes 1940 and 1950, as shown.

Figure 61:
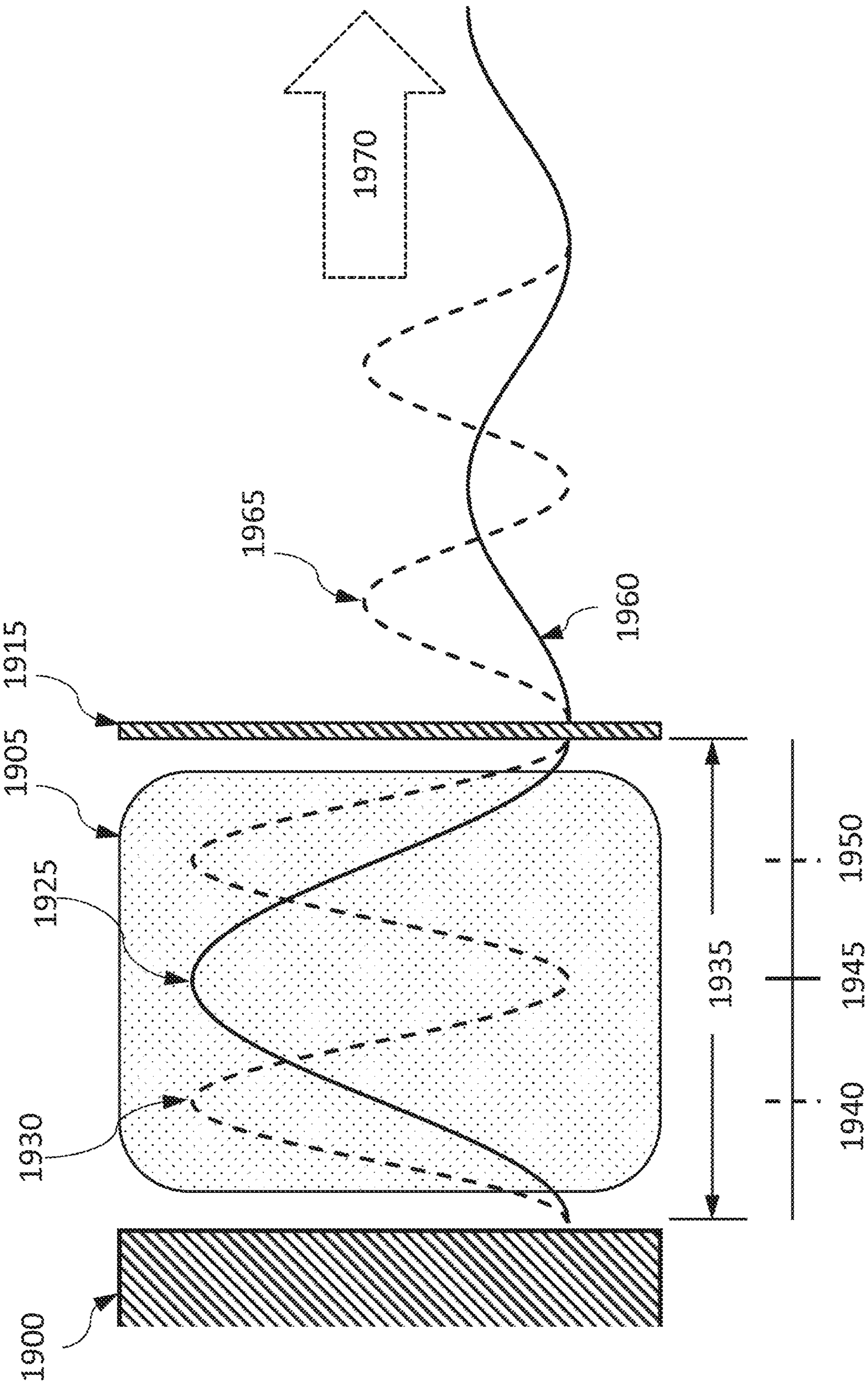
FIG. 61 shows an optical cavity formed using an optical gain medium embedded between two optical reflectors in accordance with an illustrative embodiment of the present disclosure, illustrating that two optical wavelengths can be supported by the gain medium and cavity length.

FIG. 61 shows output wavelengths 1960 and 1965 from the cavity with energy flow 1970. The cavity length 1935 is the same as in FIG. 60. FIG. 61 shows that the cavity length 1935 can support two optical modes forming standing waves 1930 and 1925 of two different wavelengths. FIG. 61 shows the emission or outcoupling of both wavelength modes (standing waves 1930 and 1925) as wavelengths 1965 and 1960, respectively. That is, both modes propagate. Optical gain medium 1905 substantially fills the optical cavity length 1935. Only the peak optical field intensity nodes 1940, 1945 and 1950 couples to the spatial portions of the gain medium 1905. It is therefore possible in accordance with the present disclosure to configure the gain medium within the optical cavity as shown in FIG. 62.

Figure 62:
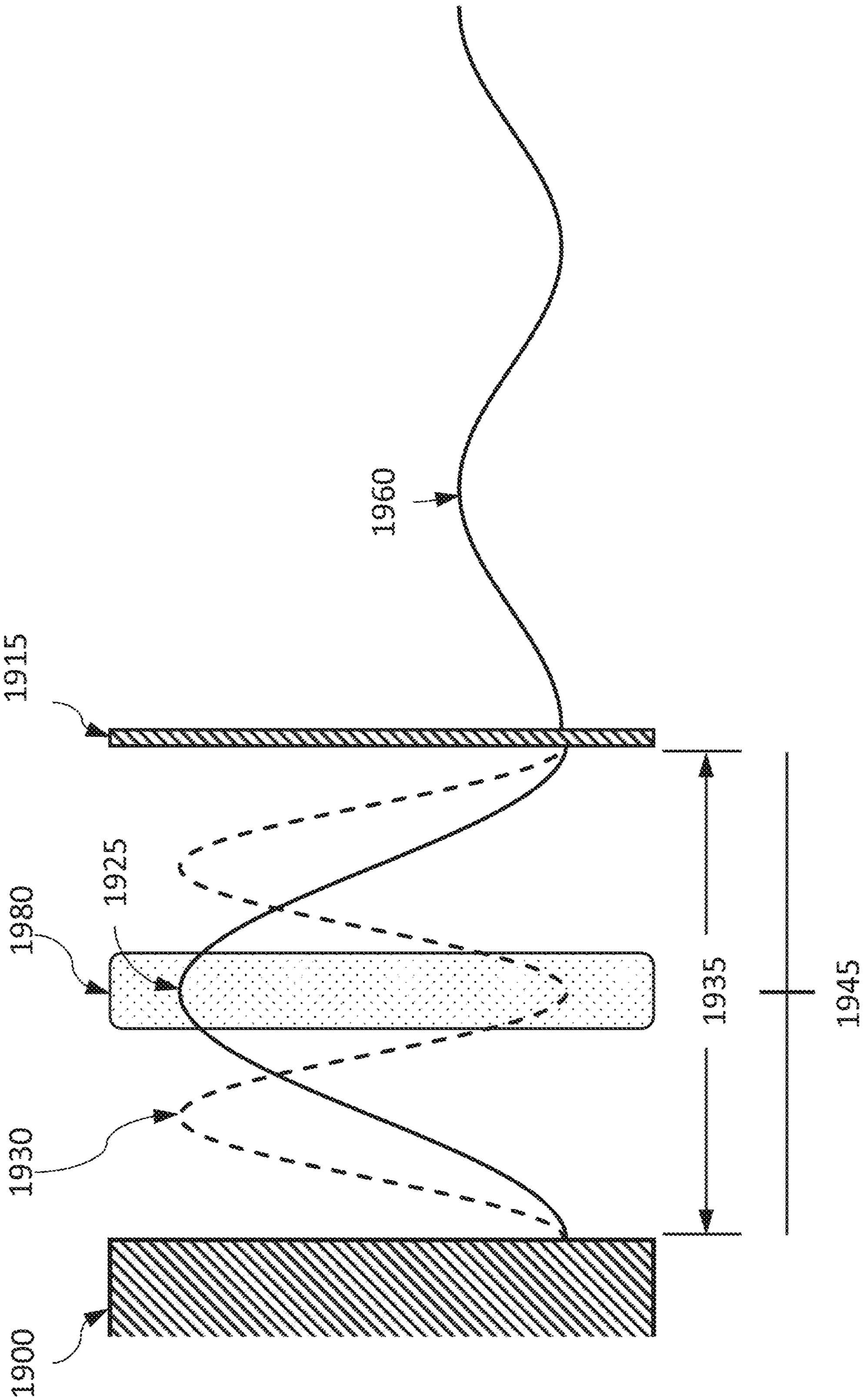
FIG. 62 shows an optical cavity formed using an optical gain medium of finite thickness embedded between two optical reflectors and positioned at the peak electric field intensity of a fundamental wavelength mode in accordance with an illustrative embodiment of the present disclosure, showing that only one optical wavelength can be supported by the gain medium and cavity length.

FIG. 62 shows a spatially selective gain medium 1980 which is contracted in length compared to optical gain medium 1905 of FIGS. 60-61 and is positioned advantageously within cavity length 1935 to amplify only the mode 1925. That is, optical gain medium 1980 favors the outcoupling of wavelength 1960 as the optical mode. The cavity thus preferentially provides gain to the fundamental mode 1925 with output energy selected as wavelength 1960.

Figure 63:
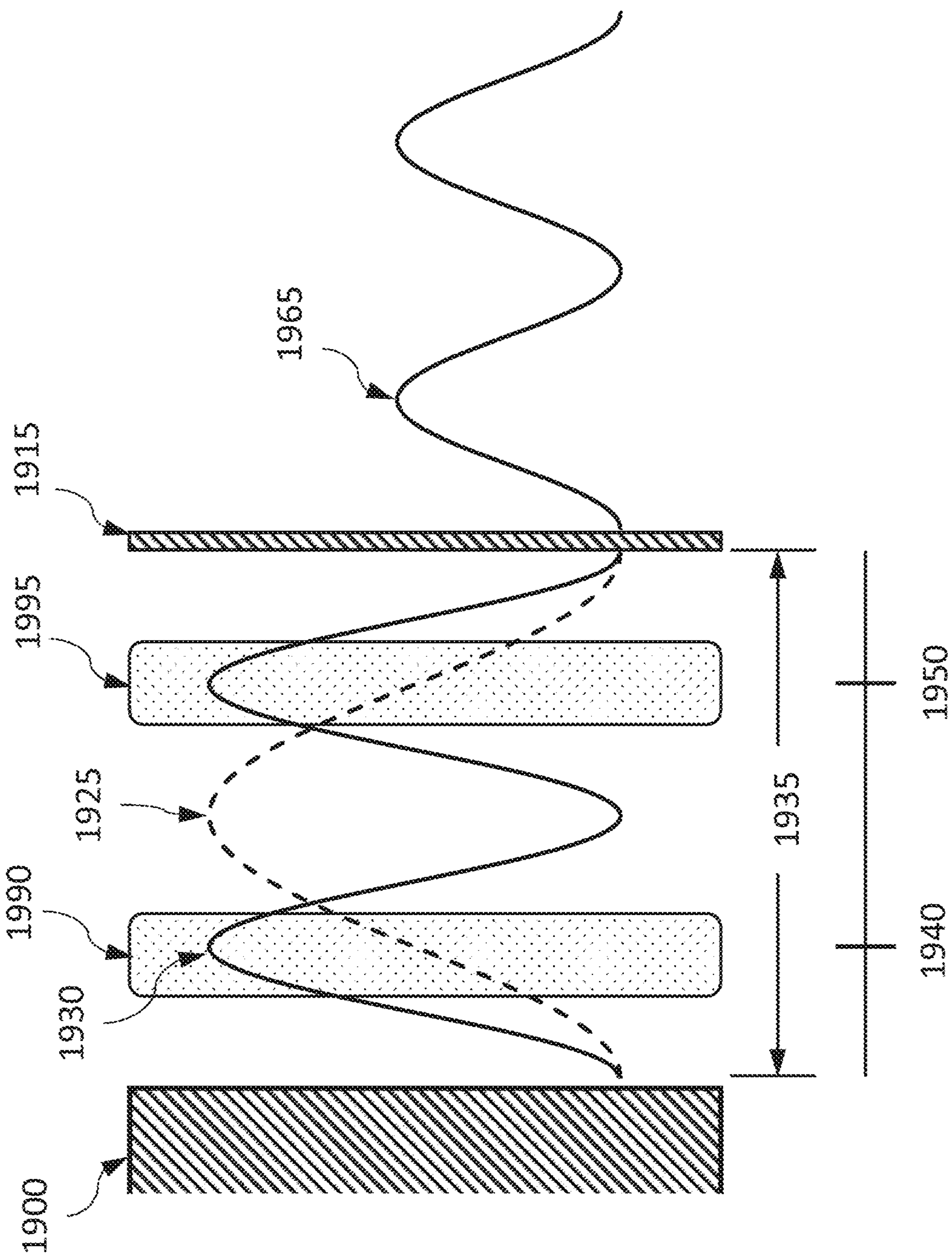
FIG. 63 shows an optical cavity formed using two optical gain media of finite thickness embedded between two optical reflectors in accordance with an illustrative embodiment that is positioned at the peak electric field intensity of a shorter wavelength mode, illustrating that only one optical wavelength can be supported by the gain medium and cavity length.

Similarly, FIG. 63 shows two spatially selective gain media 1990 and 1995 positioned advantageously to amplify only the mode of standing wave 1930. The cavity preferentially provides gain to the mode of standing wave 1930 with output energy selected as 1965.

This method involving spatially positioning the gain regions within the optical cavity is one example embodiment of the present disclosure. This can be achieved by predetermining the functional regions as a function of the growth direction during film formation process as described herein. A spacer layer between the gain sections can comprise substantially non-absorbing metal-oxide compositions and otherwise provide electronic carrier transport functions, and aid in the optical cavity tuning design.

Attention is now directed towards the optical gain medium design for application to UVLAS using metal-oxide compositions set out in the present disclosure.

FIGS. 64A-64B and 65A-65B disclose bandgap engineered quantum confinement structures of a single quantum well (QW). It is to be understood a plurality of QWs is possible, as is a superlattice. The wide bandgap electronic barrier cladding layers are selected from metal-oxide material composition $A_xB_yO_z$ and the potential well material is selected as $C_pD_qO_r$. Metal cations A, B, C and D are selected from the compositions set out in the present disclosure (0≤x, y, z, p, q, r≤1).

Figure 64B:
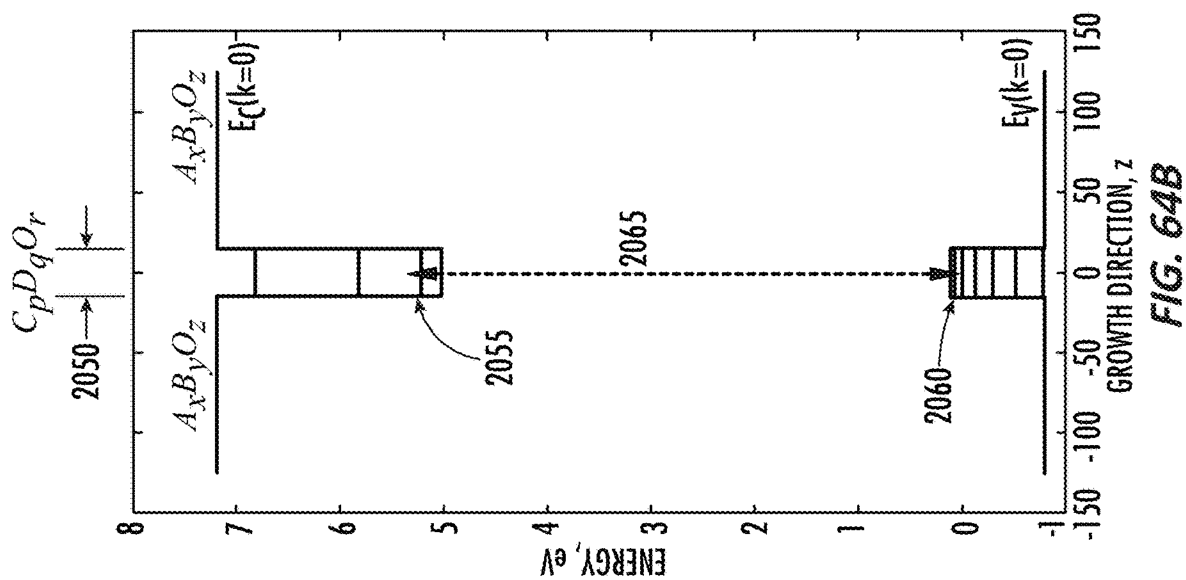
FIGS. 64A and 64B show single quantum well structures comprising metal-oxide ternary materials with quantized electron and holes states in accordance with an illustrative embodiment of the present disclosure depicting two different quantum well thicknesses.
Figure 64A:
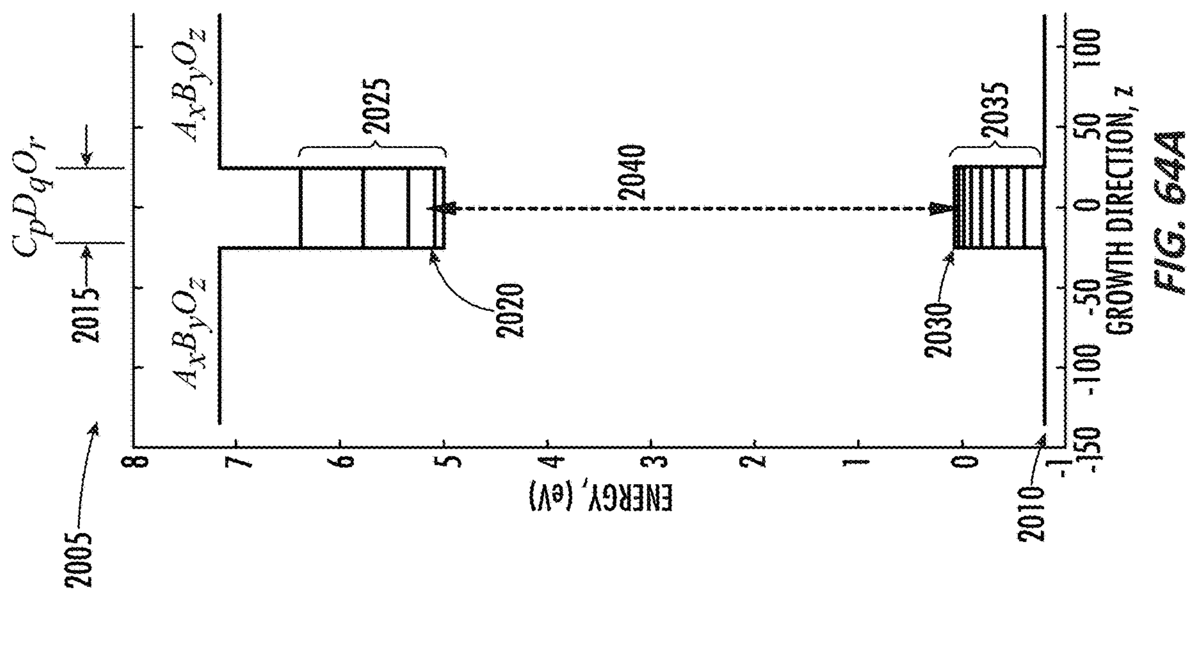

Predetermined selection of materials can achieve the conduction and valence band offsets as shown in FIGS. 64A and 64B. The case of A=Al, B=Ga to form $(Al_{0.95}B_{0.05})_2O_3{=}Al_{1.9}Ga_{0.1}O_3$ and C=Al, D=Ga to form $(Al_{0.05}B_{0.95})_2O_3{=}Al_{0.1}Ga_{1.9}O_3$ is shown. The conduction 2005 and valence 2010 band spatial profile along a growth direction, z is shown using the k=0 representation of the respective E-k curves for each material.

FIG. 64A shows the QW having thickness 2015 of $L_{QW}$=5 nm generating quantized energy states 2025 and 2035 for the allowed states of the electrons and holes in the conduction and valence bands, respectively. The lowest lying quantized electron state 2020 and highest quantized valence state 2030 participate in the spatial recombination process to create a photon of energy equal to 2040.

Similarly, FIG. 64B shows the QW having thickness 2050 of $L_{QW}$=2 nm generating quantized energy states within the potential well for the allowed states of the electrons and holes in the conduction and valence bands, respectively. The lowest lying quantized electron state 2055 and highest quantized valence state 2060 participate in the spatial recombination process to create a photon of energy equal to 2065.

Figure 65B:
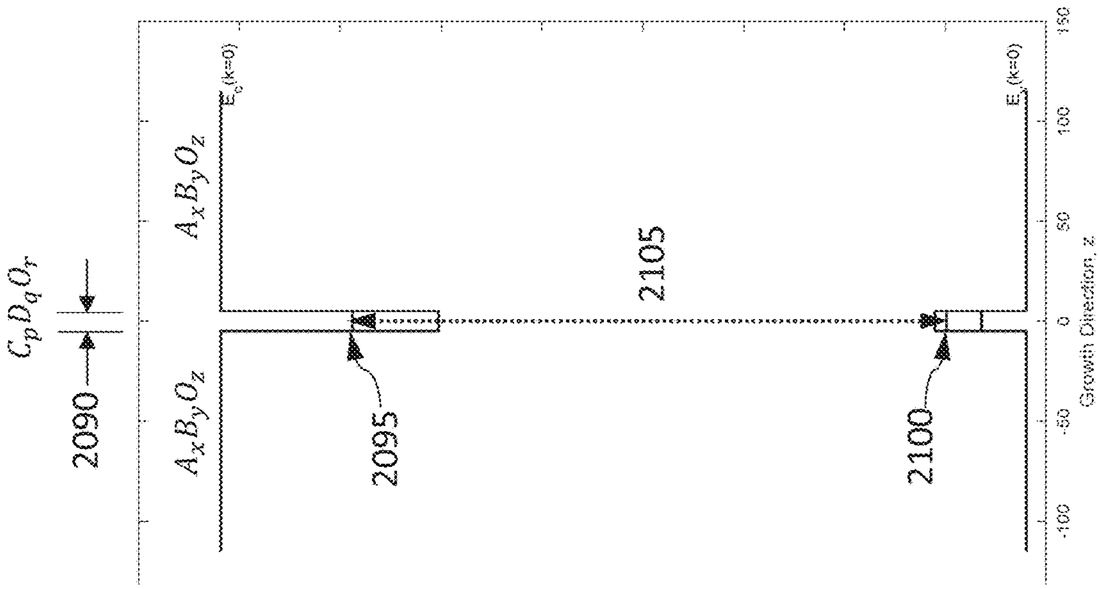
FIGS. 65A and 65B show single quantum well structures comprising metal-oxide ternary materials with quantized electron and hole states in accordance with an illustrative embodiment of the present disclosure depicting two different quantum well thicknesses.
Figure 65A:
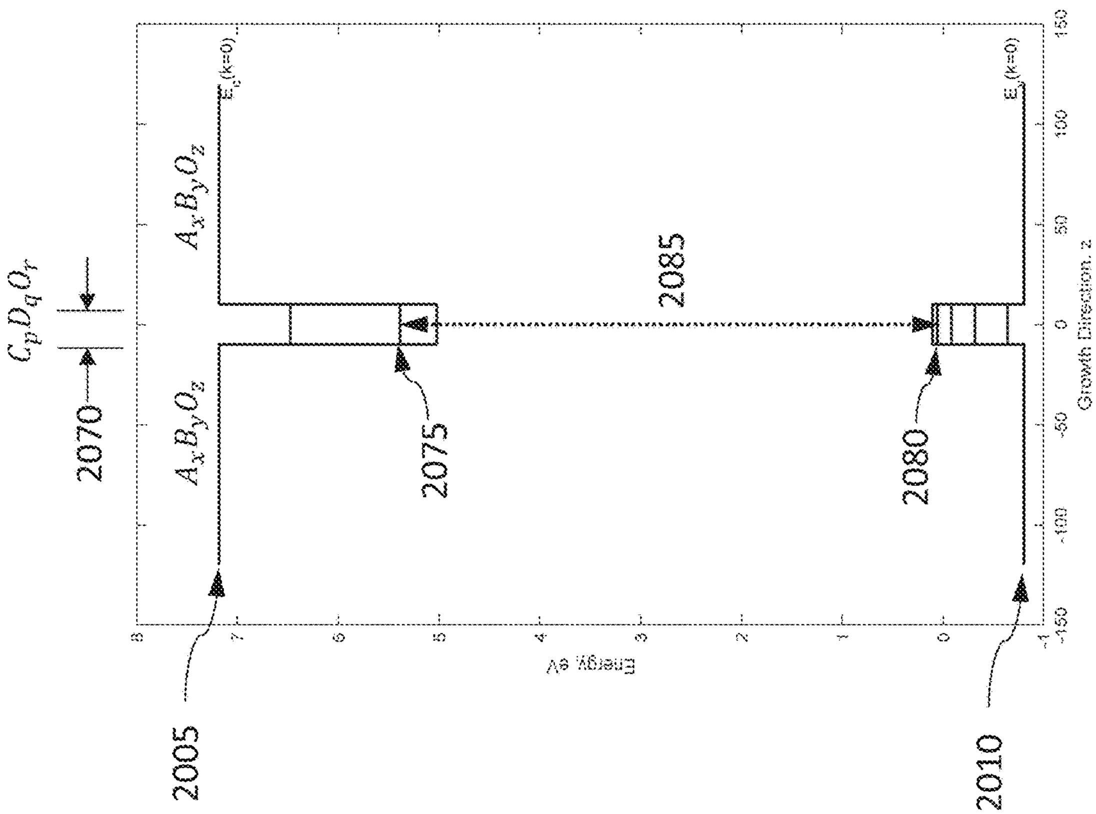

Reducing the QW thickness yet further results in the spatial band structures of FIGS. 65A and 65B. FIG. 65A shows the QW having thickness 2070 of $L_{QW}$=1.5 nm generating quantized energy states within the potential well for the allowed states of the electrons and holes in the conduction 2005 and valence 2010 bands, respectively. The lowest lying quantized electron state 2075 and highest quantized valence state 2080 participate in the spatial recombination process to create a photon of energy equal to 2085.

FIG. 65B shows the QW having thickness 2090 of $L_{QW}$=1.0 nm generating quantized energy states within the potential well for the allowed states of the electrons and holes in the conduction and valence bands, respectively. The QW can only support a single quantized electron state 2095 which participates with the highest quantized valence state 2100 in the spatial recombination process to create a photon of energy equal to 2105.

Figure 66:
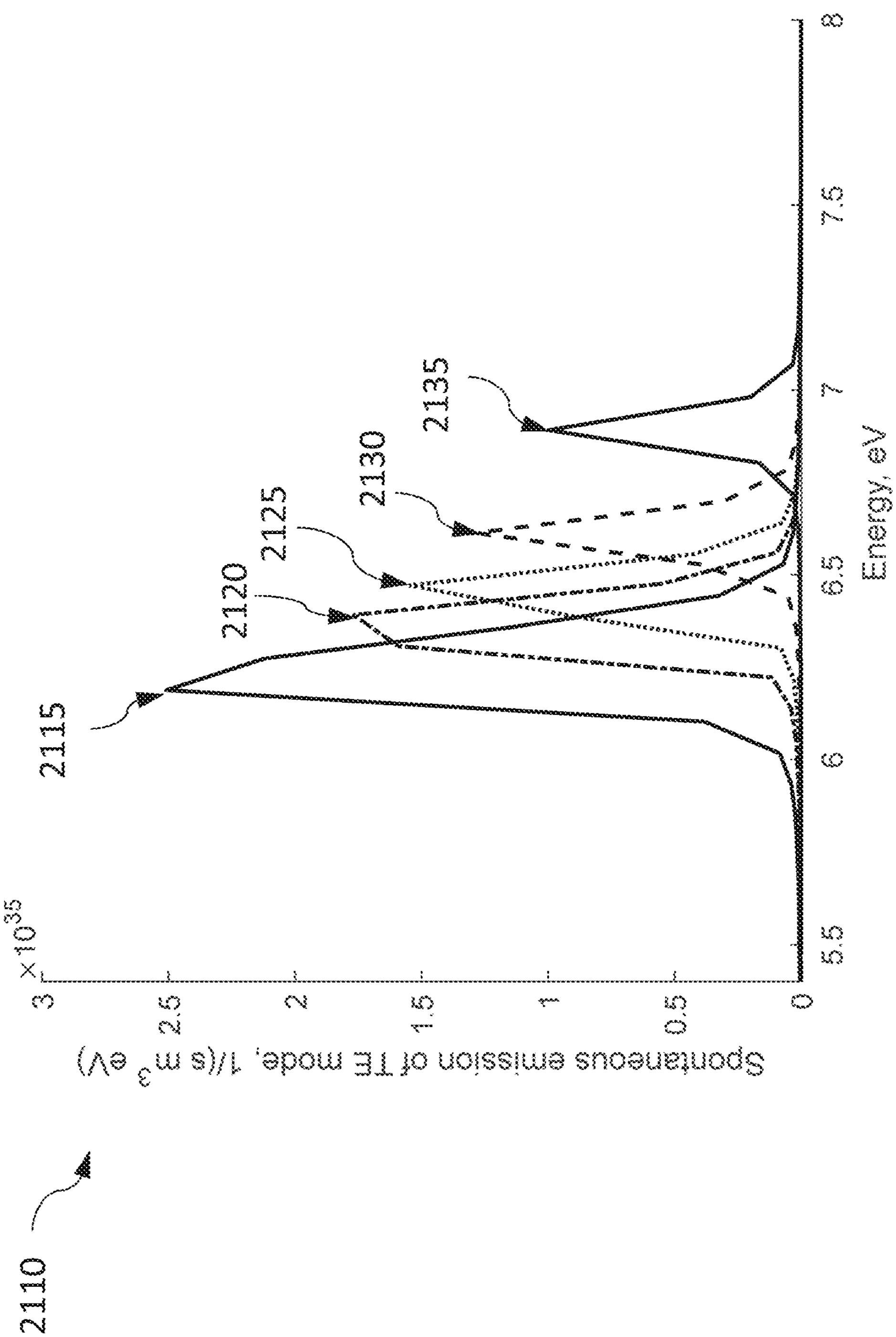
FIG. 66 shows spontaneous emission spectra from the quantum well structures disclosed in FIGS. 64A, 64B, 65A and 65B.

The spontaneous emission due to the spatial recombination of the quantized electron and hole states for the QW structures of FIGS. 64A, 64B, 65A and 65B are shown in FIG. 66. The annihilation of the electron and hole pair creates energetic photons of wavelengths peaked at 2115, 2120, 2125, 2130 and 2135 for the cases of $L_{QW}$=5.0, 2.5, 2.0, 1.5 and 1 nm, respectively. Evident from the emission spectra of 2110 is the excellent tunability of the operating wavelength possible for the gain medium by virtue of using the same barrier and well compositions but controlling $L_{QW}$.

Figures 67A, 67B:
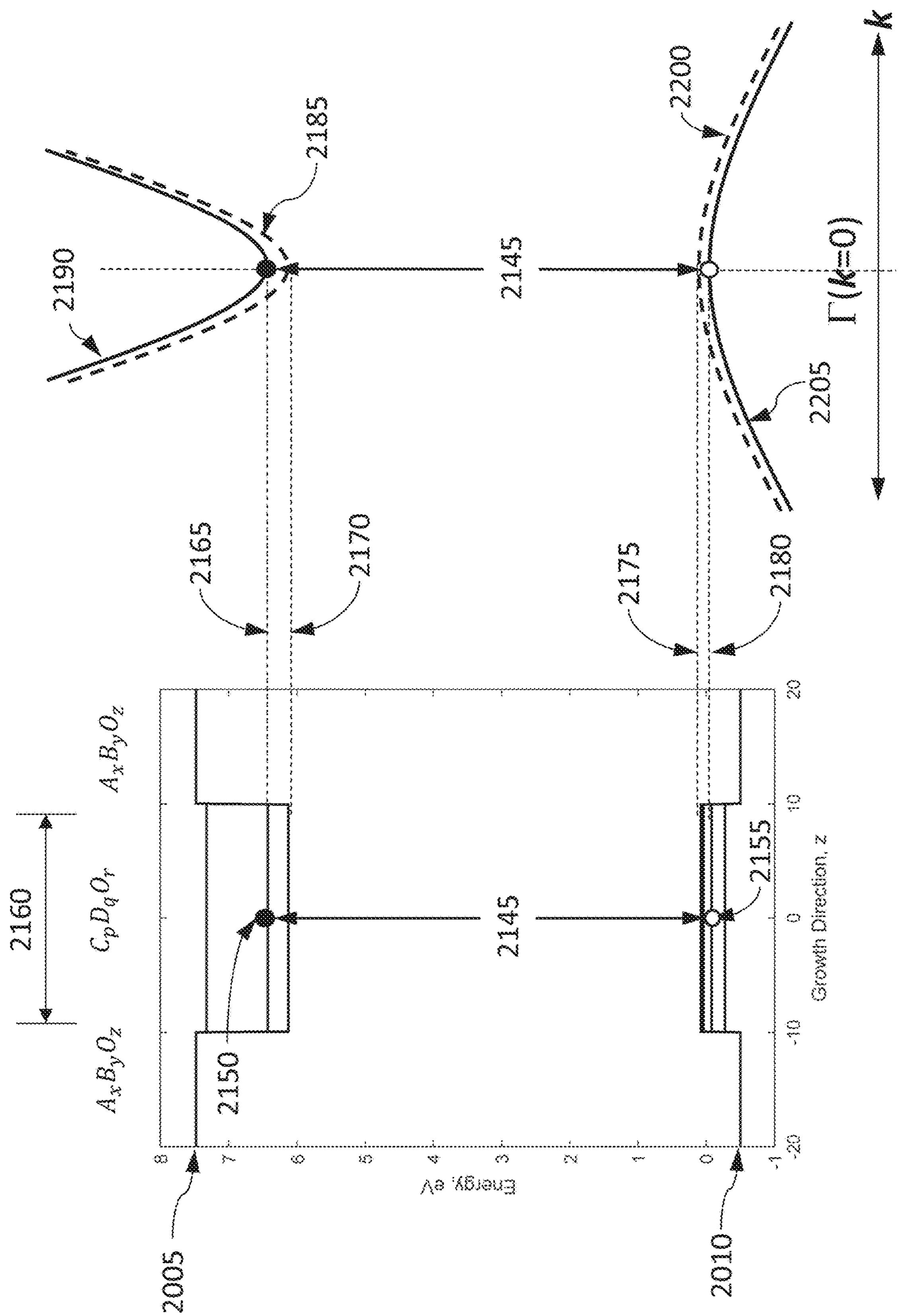
FIG. 67A and FIG. 67B show a spatial energy band structure of a metal oxide quantum well and the associated energy-crystal momentum band structure in accordance with an illustrative embodiment of the present disclosure.

Having fully described the utility of configuring metal-oxide compositions for direct application to UVLAS gain media, refer now to FIGS. 67A and 67B which describe in further detail the electronic configuration of the gain medium. FIG. 67A shows again a QW configured using metal-oxide layers to form an example QW structure as described previously.

The QW thickness 2160 is tuned to achieve recombination energy 2145. The k=0 representation of the QW in FIG. 67A is representative of the non-zero crystal wave vector dispersion of the quantized energy states 2165 and 2180 for the electron (conduction band 2190) and hole (valence band 2205) states. For completeness, the underlying bulk E-k dispersion are also shown as 2170 and 2175 at k=0 and 2185 and 2200 for non-zero k. The schematic E-k diagram is critical for describing the population inversion mechanism for creating excess electrons and holes in the conduction and valence band necessary for providing optical gain.

Figure 68B:
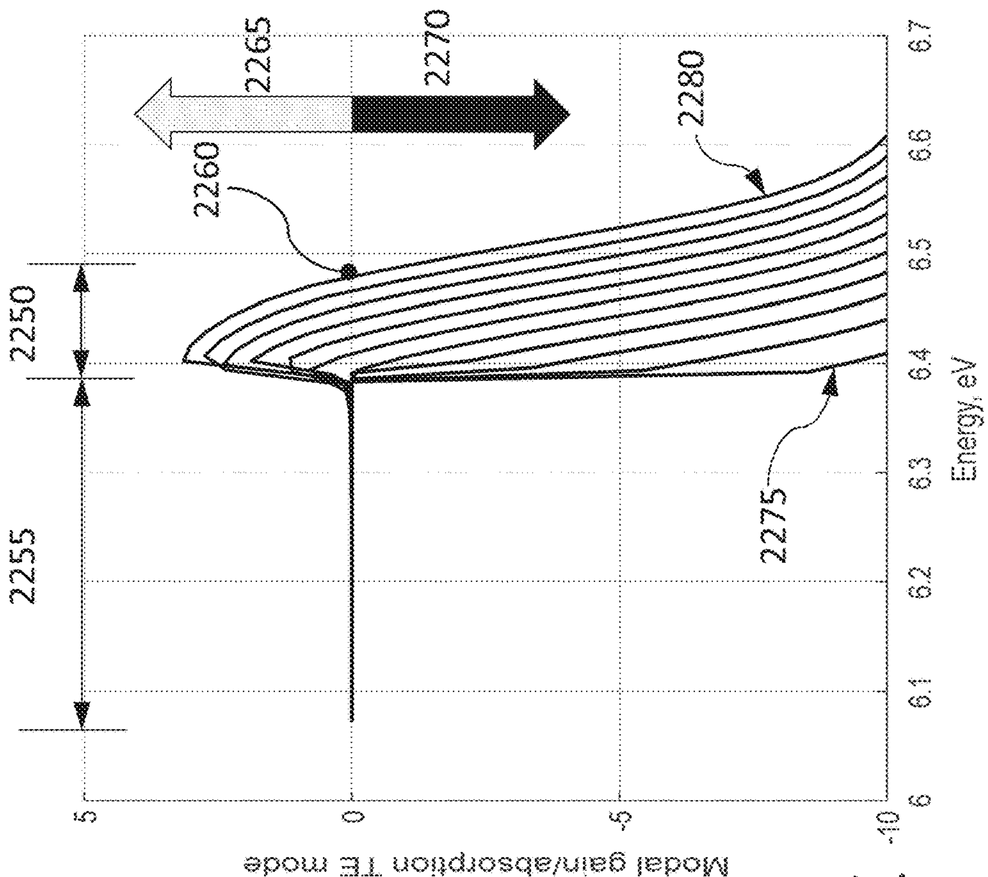
FIGS. 68A and 68B show a population inversion mechanism for the electrons and holes in a quantum well band structure and the resulting gain spectrum for the quantum well.
Figure 68A:
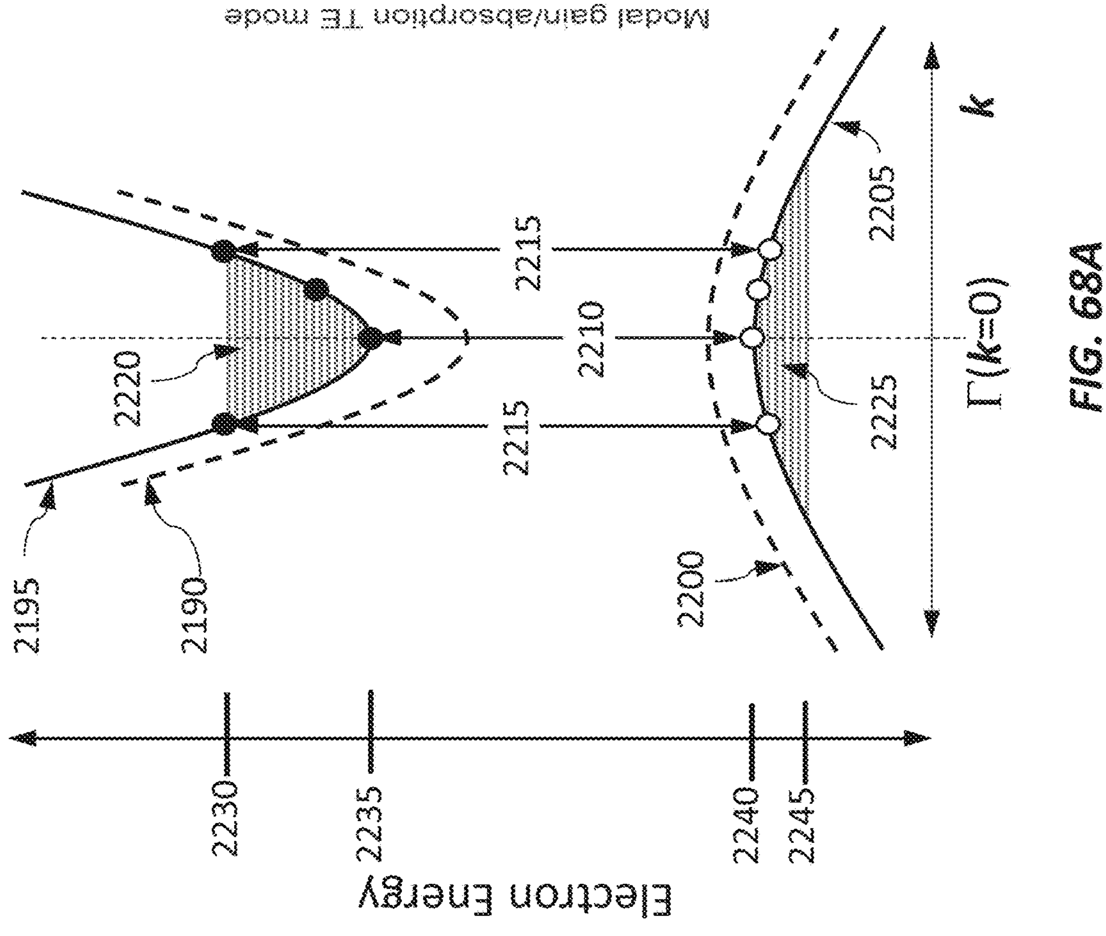

The band structure shown in FIG. 68A describes the electronic energy configuration states when the conduction band quasi-Fermi energy level 2230 is positioned such that it is above the electronic quantized energy state 2235. Similarly, the valence band quasi-Fermi energy is selected to penetrate the valence band level 2245 creating an excess hole density 2225. The E-k curve of conduction band 2195 shows that electron states 2220 are filled with electrons having non-zero crystal momentum states $|k|>0$ being possible. Valence band level 2240 is the valence band edge of the bulk material used in the narrow bandgap region of the MQW. When the narrow bandgap material is confined in the MQW, the energy states are quantized, creating the band structure dispersion for conduction band 2195 and valence band 2205. Valence band level 2240 is then the valence band maximum of the MQW region. Valence band level 2245 represents the Fermi energy level of the valence band when configured as a p-type material. This makes excess hole density 2225 region filled with holes that can participate in optical gain.

Optical recombination process can occur for 'vertical transitions' wherein the change in crystal momentum between the electron and holes state is identically zero. The allowed vertical transitions are shown as 2210 at k=0 and 2215 k≠0. Calculation of the integrated gain spectrum for the representative band structure of FIG. 68A is shown in FIG. 68B. Specific input parameters for the gain spectra are $L_{QW}$=2 nm, an electron to hole concentration ratio of 1.0, a carrier relaxation time of $\tau$=1 ns and an operating temperature of T=300 K. Curves 2275 to 2280 show an increase in the electron concentration Ne where $0 \leq N_e \leq 5\times10^{24}$ $m^{-3}$.

Net positive gain 2250 is achievable under high electron concentrations with threshold $N_e \sim 4\times10^{24}$ $m^{-3}$. These parameters are of the order achievable by other technologically mature semiconductors such as GaAs and GaN. In some embodiments, the metal oxide semiconductor by virtue of having an intrinsically high bandgap will also be less susceptible to gain reduction with operating temperature. This is evidenced by conventional optically pumped high power solid-state Ti-doped $Al_2O_3$ laser crystals.

FIG. 68B shows the net gain 2265 and net absorption 2270 as a function of $N_e$. The range of crystal wave vectors which can contribute to vertical transitions determines the width of the net gain region 2250. This is fundamentally determined by the achievable excess electron 2220 and hole 2225 states possible by manipulating the quasi-Fermi energies.

The region 2255 is below the fundamental bandgaps of the host QW and is therefore non absorbing. Optical modulators are therefore also possible using metal-oxide semiconductor QWs. Of note is the point of induced transparency 2260 where the QW achieves zero loss.

Figure 69B:
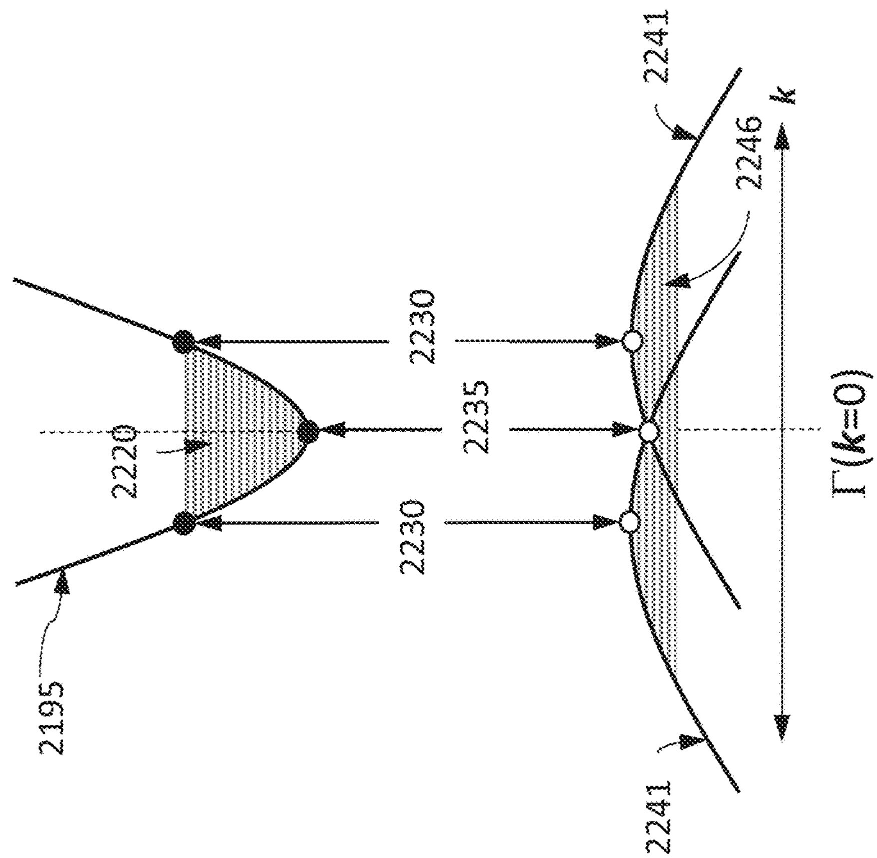
FIGS. 69A and 69B show electron and hole energy states for filled conduction and valence bands in the energy-momentum space for the case of a direct and pseudo-direct bandgap metal oxide structure in accordance with an illustrative embodiment of the present disclosure.
Figure 69A:
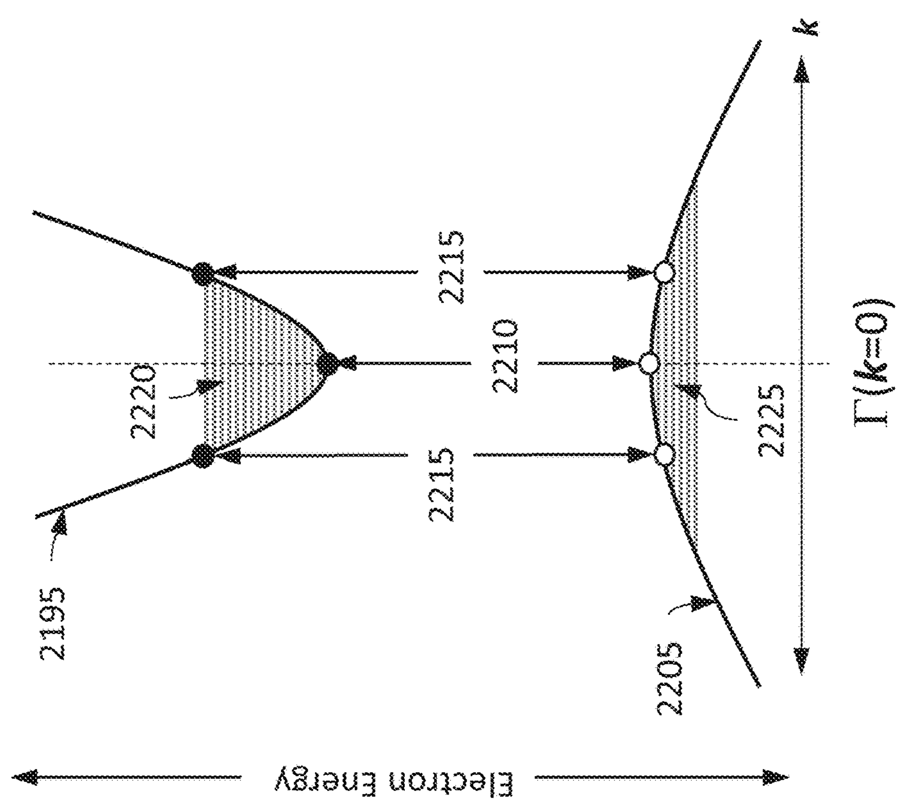

Manipulating the quasi-Fermi energy is not the only method available for creating excess electron and hole pairs in the vicinity of the zone-center band structure enabling optical emission. Consider FIGS. 69A and 69B showing the E-k band structures for the case of direct bandgap materials (FIG. 69A) and pseudo-direct bandgap materials, for example, metal-oxide SL with period selected to create valence maxima as shown in curves 2241 with hole states 2246 of FIG. 69B.

Assuming similar conduction band dispersions 2195, for both valence band types of 2205 and 2241, a configuration can be achieved wherein the same vertical transitions are possible. Substantially similar gain spectra as disclosed in FIG. 68B are possible for both types shown in FIGS. 69A and 69B.

Yet a further method is disclosed for an alternative method of creating electron and hole states suitable for creating optical emission and optical gain with metal-oxide semiconductor structures.

Figure 70B:
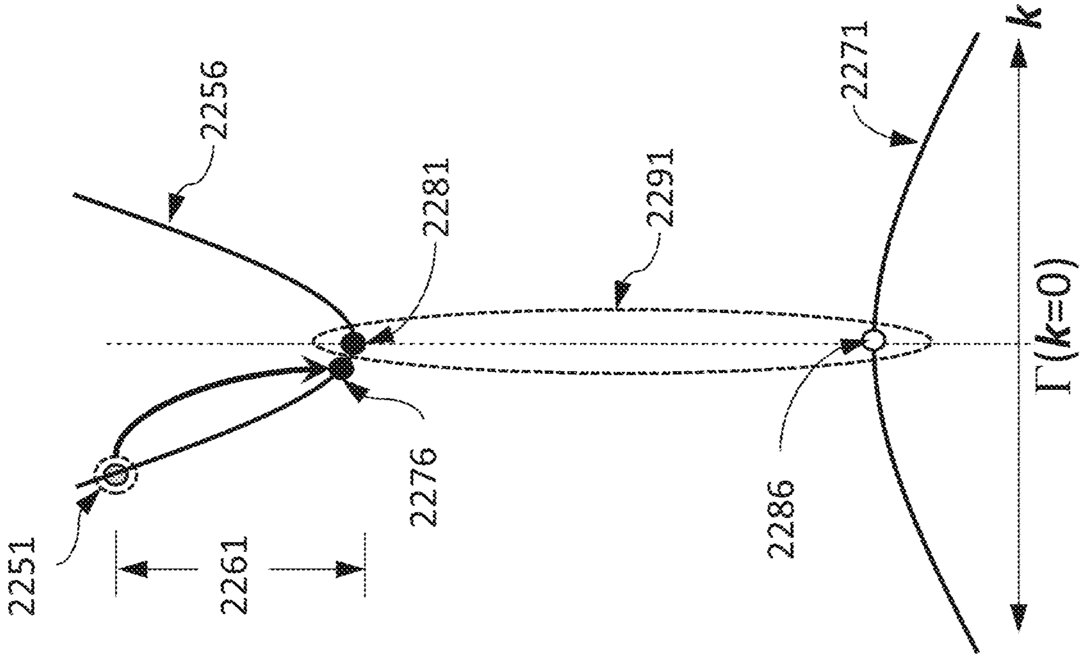
FIGS. 70A and 70B show an impact ionization process for metal oxide injected hot electrons resulting in pair production in accordance with an illustrative embodiment of the present disclosure.
Figure 70A:
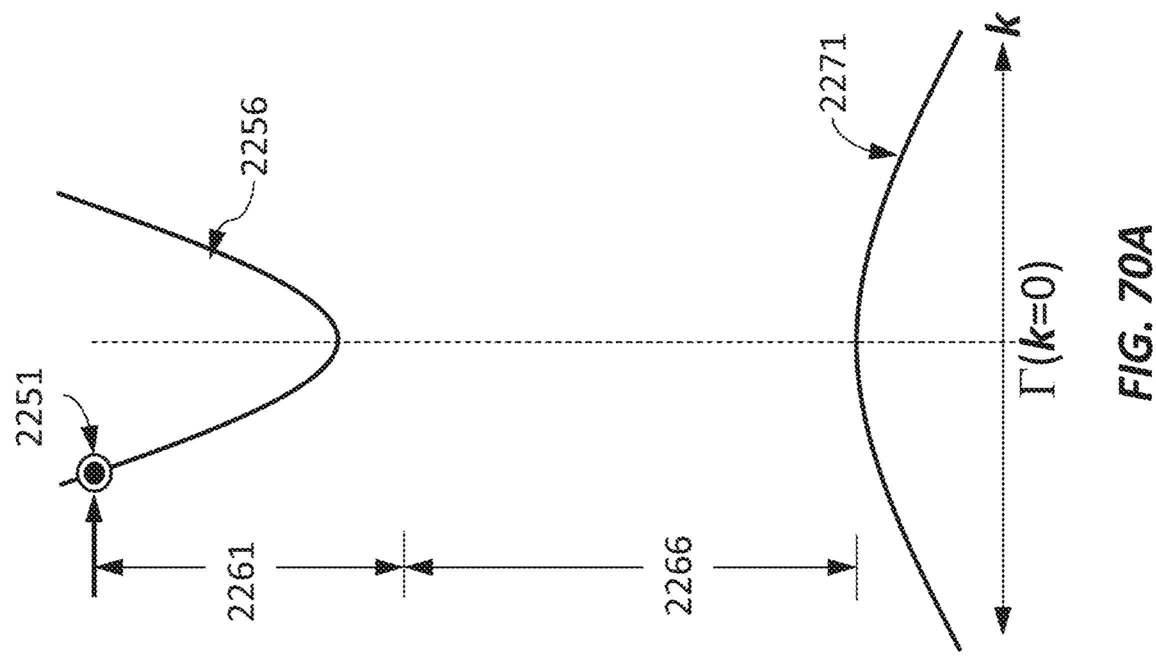

Consider FIGS. 70A and 70B, which show an impact ionization process with a metal-oxide semiconductor having a direct bandgap. While impact ionization is a known phenomenon and process in semiconductors, not so well known is the advantageous properties of extremely wide energy bandgap metal oxides. One of the most promising properties that has been found in accordance with the present disclosure is the exceedingly high dielectric breakdown strength of metal-oxides.

In prior art small bandgap semiconductors such as Si, GaAs and the like, impact ionization processes when leveraged in device functions tend to wear-out the materials by the creation of crystallographic defects/damage. This degrades the material over time and limits the number of breakdown events possible before catastrophic device failure.

Extreme wide bandgap gap metal oxides with Eg>5 eV possess advantageous properties for creating impact ionization light emission devices.

FIG. 70A shows a metal oxide direct bandgap of 2266 with a 'hot' (high energy) electron injected into the conduction band at electron state 2251 with excess kinetic energy 2261 with respect to the conduction band 2256 edge. Metal-oxides can easily withstand excessively high electrical fields placed across thin films ($V_{br}$>1 to 10 MV/cm).

Operating with a metal oxide slab biased at below and close to the breakdown voltage enables an impact ionization event as shown in FIG. 70B. The energetic electron 2251 interacts with the crystal symmetry of the host and can produce a lower energy state by coupling to the available thermalizing with lattice vibration quanta called phonons and pair production. That is, the impact ionization event comprising a hot electron 2251 is converted into two lower energy electron states 2276 and 2281 near the conduction band minimum as well as a new hole state 2286 created at the top of the valence band 2271. The electron-hole pair produced 2291 is a potential recombination pair to create a photon of energy 2266.

It has been found in accordance with the present disclosure that impact ionization pair production is possible for excess electron energy 2261 of about half the bandgap energy 2266. For example, if $E_G$=5 eV 2266 then hot electrons with respect to the conduction band edge of ~2.5 eV can initiate pair production process as described. This is achievable for $Al_2O_3/Ga_2O_3$ heterostructures wherein an electron from $Al_2O_3$ is injected into the $Ga_2O_3$ across the heterojunction. Impact ionization is a stochastic process and requires a minimum interaction length to create a finite energy distribution of electron-hole pairs. In general, 100 nm to 1 micron of interaction length is useful for creating significant pair production.

Figure 71B:
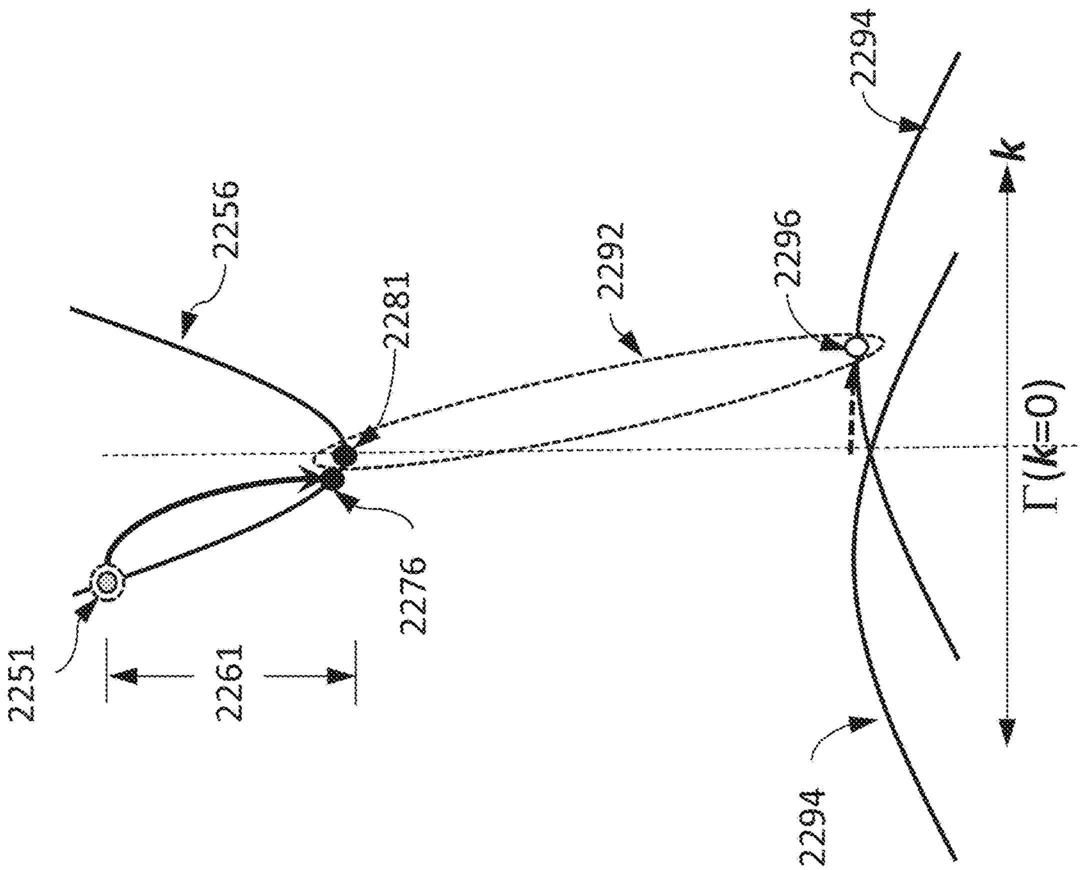
FIGS. 71A and 71B show an impact ionization process for metal oxide injected hot electrons resulting in pair production in accordance with another illustrative embodiment of the present disclosure.
Figure 71A:
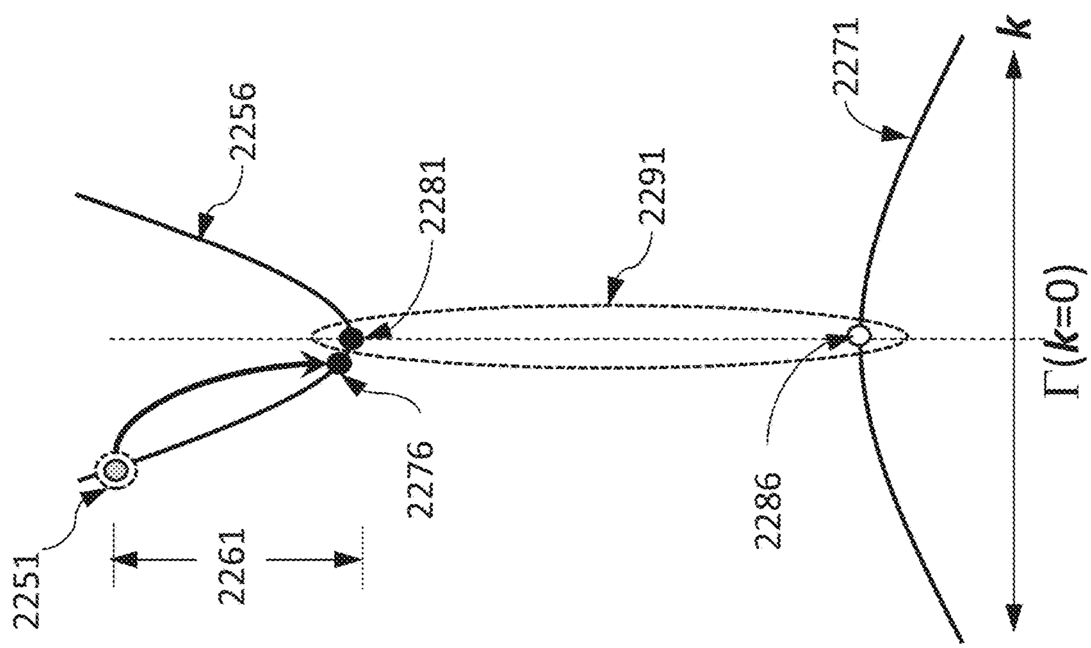

FIGS. 71A and 71B show that impact ionization is also possible in pseudo-direct and indirect band structure metal oxides. FIG. 71A recites the case previously for direct bandgap, and FIG. 71B shows the same process for an indirect bandgap valence band 2294 wherein the electron-hole pair production 2292 requires a k≠0 hole state 2296 to be created, necessitating a phonon for momentum conservation. As such, FIG. 71B demonstrates that an optical gain medium is also possible in pseudo-direct band structures such as 2294.

Figure 72A:
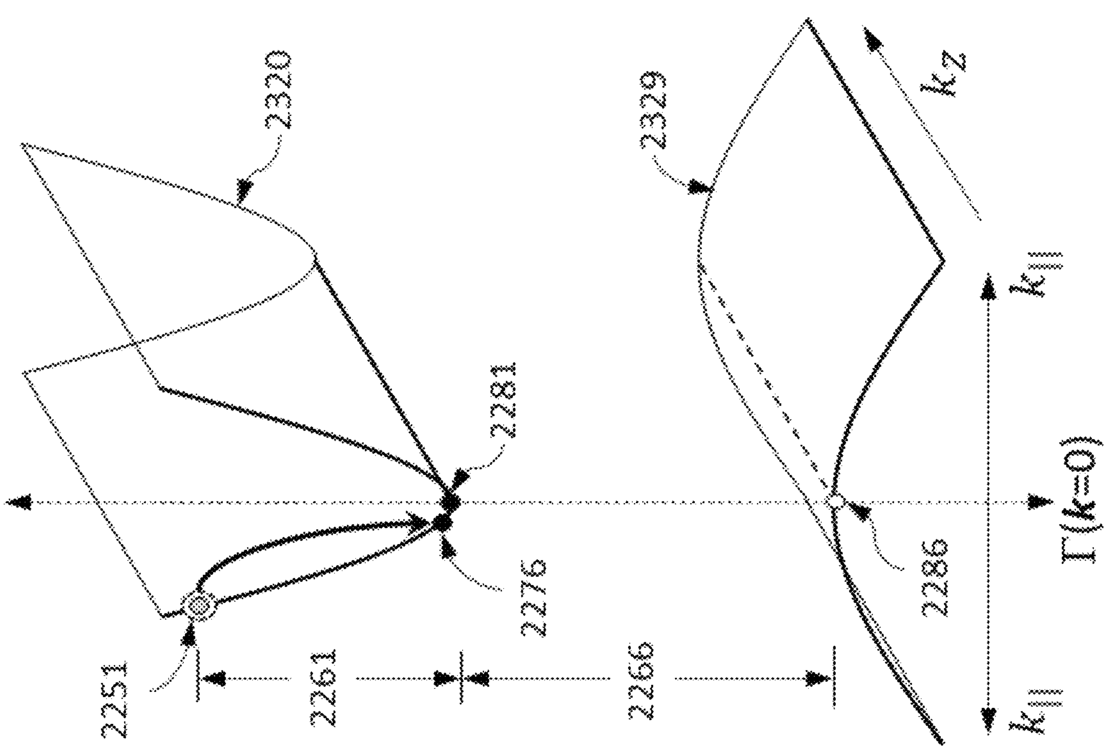
FIGS. 72A and 72B show an effect of an electric field applied to metal oxide creating a plurality of impact ionization events in accordance with another illustrative embodiment of the present disclosure.
Figure 72B:
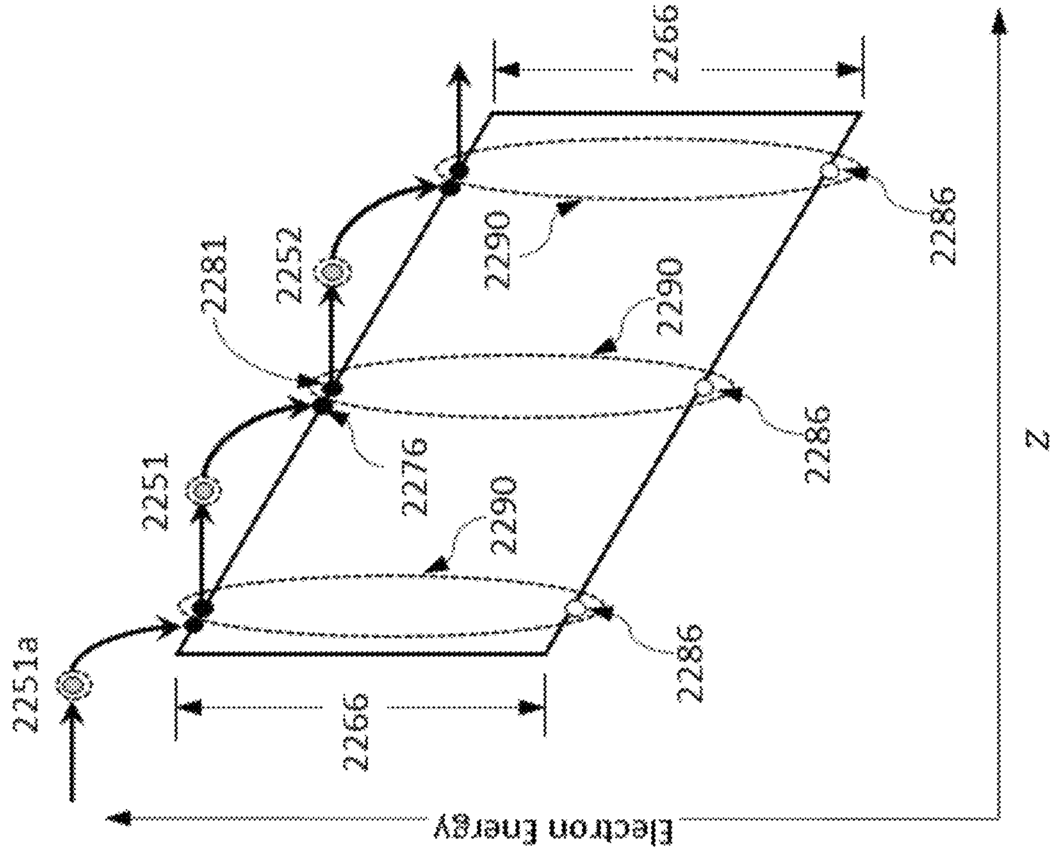

FIGS. 72A and 72B disclose further detail of the disclosure using impact ionization processes for optical gain medium by selecting advantageous properties of the band structure.

FIG. 72A describes the band structure of FIGS. 68A-68B, 69A-69B, 70A-70B and 71A-71B for in-plane crystal wave vectors $k_{\|}$ and the wavevector along the quantization axis $k_Z$ that is parallel to the epilayer growth direction z.

The conduction 2320 and valence 2329 band dispersions are shown along $k_Z$ in FIG. 72A. If the k=0 spatial band structure of material having bandgap 2266 depicted in FIG. 72A is plotted along the growth direction, the resulting spatial-energy band diagram is shown in FIG. 72B. Along the growth direction z, the hot electron 2251*a* is injected into the conduction band producing impact ionization process and pair production 2290. If a slab of the metal-oxide material is subjected to a large electric field directed along z, the band structure has a potential energy along z that is linearly decreasing. An impact ionization event producing electron 2276 and hole 2286 pair quasi-particle production 2290 can undergo recombination and produce a bandgap energy photon.

The remaining electron 2276 can be accelerated by the applied electric field to create another hot electron 2252. The hot electron 2252 can then impact ionize and repeat the process. Therefore, the energy supplied by the external electric field can generate the pair product and photon generation process. This process is particularly advantageous for metal-oxide light emission and optical gain formation.

Lastly, there are three laser topologies that can be utilized advantageously in accordance with the principle set out in the present disclosure.

The basic components are: (i) an electronic region forming and generating an optical gain region; and (ii) an optical cavity containing the optical gain region.

Figure 73:
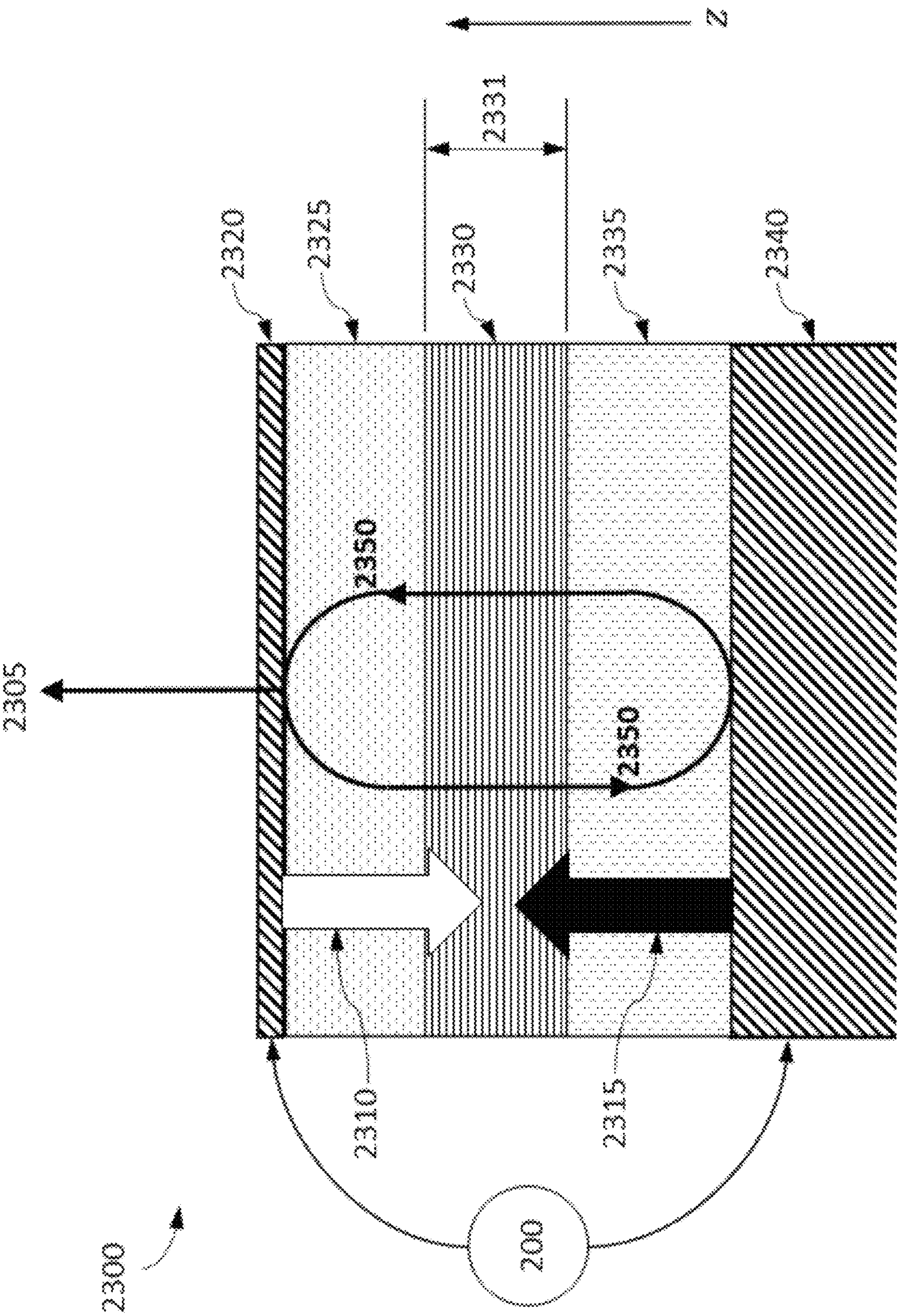
FIG. 73 shows a vertical type ultraviolet laser structure in accordance with an illustrative embodiment of the present disclosure where the reflectors form part of the cavity and electrical circuit.

FIG. 73 shows a semiconductor optoelectronic device in the form of a vertical emission type UVLAS 2300 comprising an optical gain region 2330 of thickness 2331; an electron injector 2310 region 2325; a hole injector 2315 region 2335. Regions 2325 and 2335 may be n-type and p-type metal oxide semiconductors and substantially transparent to the operating wavelength emitted from the device along axis 2305. The electrical excitation source 200 is operably connected to the device via conductive layers 2340 and 2320 which are also operable as a high reflector and output coupler, respectively. The optical cavity between the reflectors (conductive layers 2340 and 2320) is formed by the sum of the stack of layers 2325, 2330 and 2335.

A portion of the thickness of the reflectors is also included as the cavity thickness if they are partially absorbing and of multilayer dielectric type. For the case of pure and ideal metal reflectors, the mirror thickness can be neglected. Therefore, the optical cavity thickness is governed by the layers 2325, 2330 and 2335, of which the optical gain region 2330 is advantageously positioned with respect to the cavity modes as described in FIGS. 61, 62 and 63. The photon recycling 2350 is shown by the optical reflection from the mirrors/reflectors 2340 and 2320.

Yet another option for creating a UVLAS structure as shown in FIG. 73 is an embodiment in which the reflectors 2320 and 2340 form part of the electrical circuit and therefore must be conducting and must also be operable as reflectors forming the optical cavity. This can be achieved by using elemental Aluminum layers to act as at least one of the HR or OC.

An alternative UVLAS configuration decouples the optical cavity from the electrical portion for the structure. For example, FIG. 74 discloses a UVLAS 2360 having an optical cavity formed comprising HR 2340 and OC 2320 that are not part of the electrical circuit. The optical gain region 2330 is positioned with the cavity enabling photon recycling 2350. The optical axis is directed along axis 2305. Insulating spacer layer metal oxide regions may be provided within the cavity to tailor the position of the gain region 2330 between the reflectors 2340 and 2320. The electron 2325 and hole injectors 2335 provide laterally transported carriers into the gain region 2330.

Such as structure can be achieved for a vertical emitting UVLAS by creating p-type and n-type regions laterally disposed to connect only a portion of the gain region. The reflectors may be positioned also on a portion of the optical gain region to create the cavity photon recycling 2350.

Figure 75:
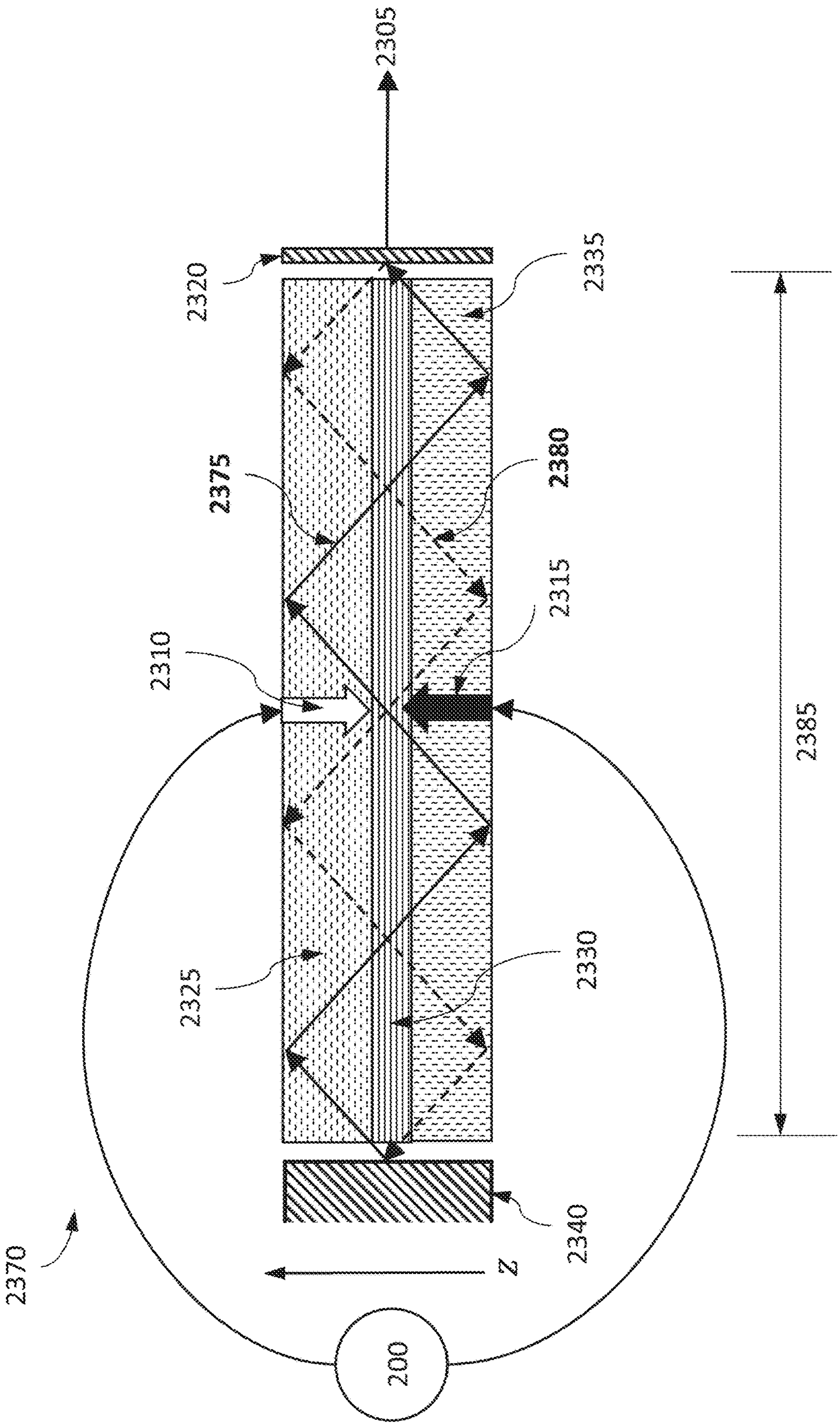
FIG. 75 shows a waveguide type ultraviolet laser structure in accordance with an illustrative embodiment of the present disclosure where the reflectors forming the optical cavity are decoupled from the electrical circuit and where the optical gain medium embedded within the lateral cavity can have a length optimized for a low threshold gain.

Yet even a further illustrative embodiment is the waveguide device 2370 shown in FIG. 75.

FIG. 75 shows the waveguide structure 2370 having a major axis 2305 with epitaxial regions formed sequentially along the growth direction z comprising of electron injector 2325, optical gain region 2330 and hole injector region 2335. Single-mode or multi-mode waveguide structures having refractive indices are selected to create confined optical radiation of forward and reverse propagating modes 2375 and 2380. The cavity length 2385 is terminated at each end with reflectors 2340 and 2320. High reflector 2340 can be metallic or distributed feedback type comprising etched grating or multilayer dielectric conformally coated to a ridge. The OC 2320 can be a metallic semi-transparent film of dielectric coating or even a cleaved facet of the semiconductor slab.

As would be appreciated, optical gain regions may be formed using metal-oxide semiconductors in accordance with the present disclosure that are electrically stimulated and/or optically pumped/stimulated where the optical cavity may be formed in both vertical and waveguide structures as required.

The present disclosure teaches new materials and processes for realizing optoelectronic light emitting devices based on metal oxides capable of generating light deep into the UVC and far/vacuum UV wavelength bands. These processes include tuning or configuring the band structure of different regions of the device using a number of different methods including, but not limited to, composition selection to achieve desired band structure including forming effective compositions by the use of superlattices comprising different layers of repeating metal oxides. The present disclosure also teaches the use of biaxial strain or uniaxial strain to modify band structures of relevant regions of the semiconductor device as well as strain matching between layers, e.g., in a superlattice, to reduce crystal defects during the formation of the optoelectronic device.

As would be appreciated, metal oxide based materials are commonly known in the prior-art for their insulating properties. Metal oxide single crystal compositions, such as Sapphire (corundum-$Al_2O_3$) are available with extremely high crystal quality and are readily grown in large diameter wafers using bulk crystal growth methods, such as Czochralski (CZ), Edge-fed growth (EFG) and Float-zone (FZ) growth. Semiconducting gallium-oxide having monoclinic crystal symmetry has been realized using essentially the same growth methods as Sapphire. The melting point of $Ga_2O_3$ is lower than Sapphire so the energy required for the CZ, EFG and FZ methods is slightly lower and may help reduce the large scale cost per wafer. Bulk alloys of $AlGaO_3$ bulk substrates have not yet been attempted using CZ or EFG. As such, metal oxide layers of the optoelectronic devices may be based on these metal oxide substrates in accordance with examples of the present disclosure.

The two binary metal oxide materials $Ga_2O_3$ and $Al_2O_3$ exist in several technologically relevant crystal symmetry forms. In particular, the alpha-phase (rhombohedral) and beta-phase (monoclinic) are possible for both $Al_2O_3$ and $Ga_2O_3$. $Ga_2O_3$ energetically favors the monoclinic structure whereas $Al_2O_3$ favors the rhombohedral for bulk crystal growth. In accordance with the present disclosure atomic beam epitaxy may be employed using constituent high purity metals and atomic oxygen. As demonstrated in this disclosure, this enables many opportunities for flexible growth of heterogeneous crystal symmetry epitaxial films.

Two example classes of device structures that are particularly suitable to UVLED include: high Al-content $Al_xGa_{1-x}O_3$ deposited on $Al_2O_3$ substrates and high Ga-content $AlGaO_3$ on bulk $Ga_2O_3$ substrates. As has been demonstrated in this disclosure, the use of digital alloys and superlattices further extends the possible designs for application to UVLEDs. As has also been demonstrated in some examples of the present disclosure, the selection of various $Ga_2O_3$ and $Al_2O_3$ surface orientations when presented for $AlGaO_3$ epitaxy can be used in conjunction with growth conditions such as temperature and metal-to-atomic-oxygen ratio and relative metal ratio of Al to Ga in order to predetermine the crystal symmetry type of the epitaxial films which may be exploited to determine the band structure of the optical emission or conductivity type regions.

Epitaxial Oxide Materials and Semiconductor Structures

Epitaxial oxide materials, semiconductor structures comprising epitaxial oxide materials, and devices containing structures comprising epitaxial oxide materials are described herein.

Figure 76B:
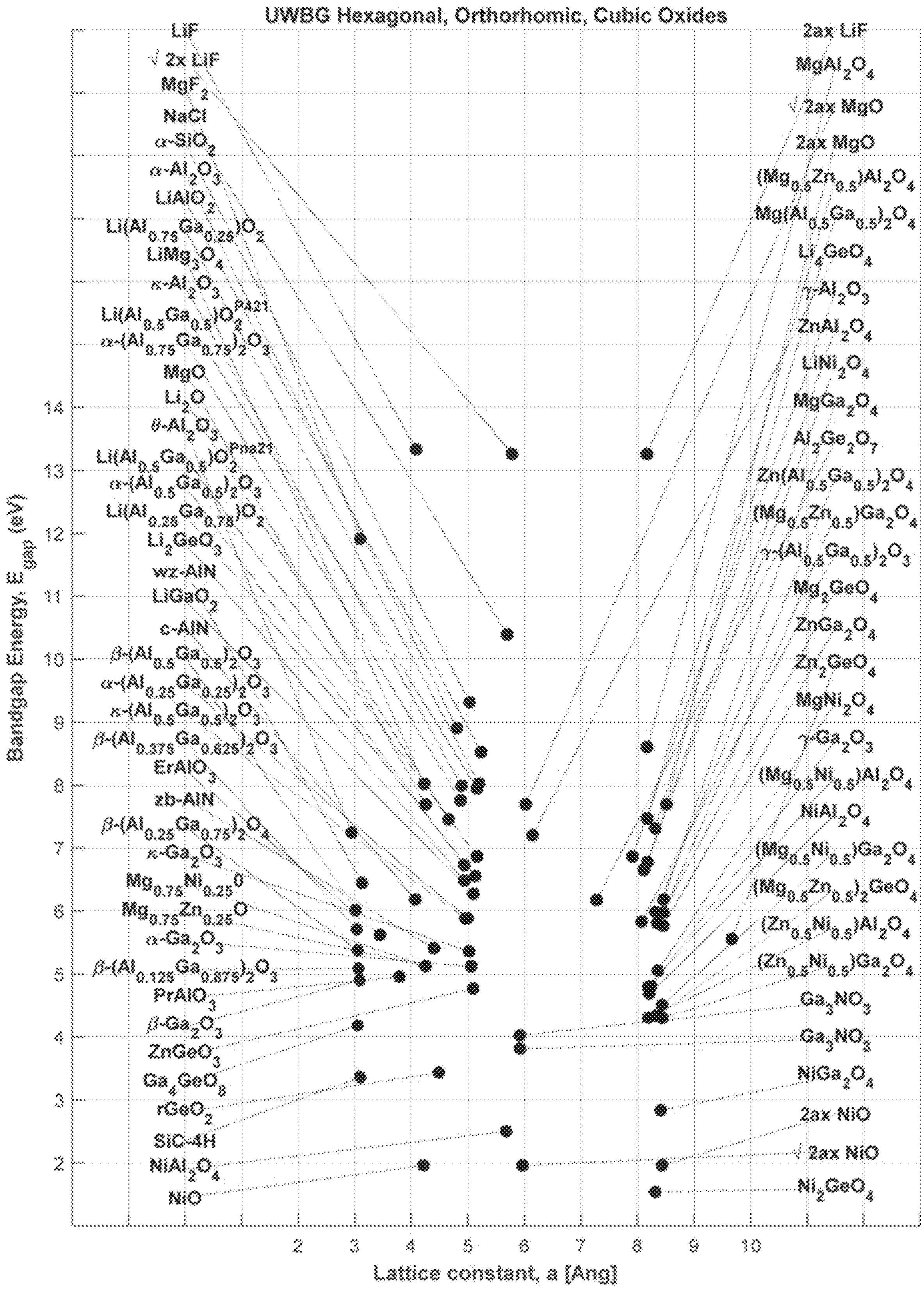
Figure 76C:
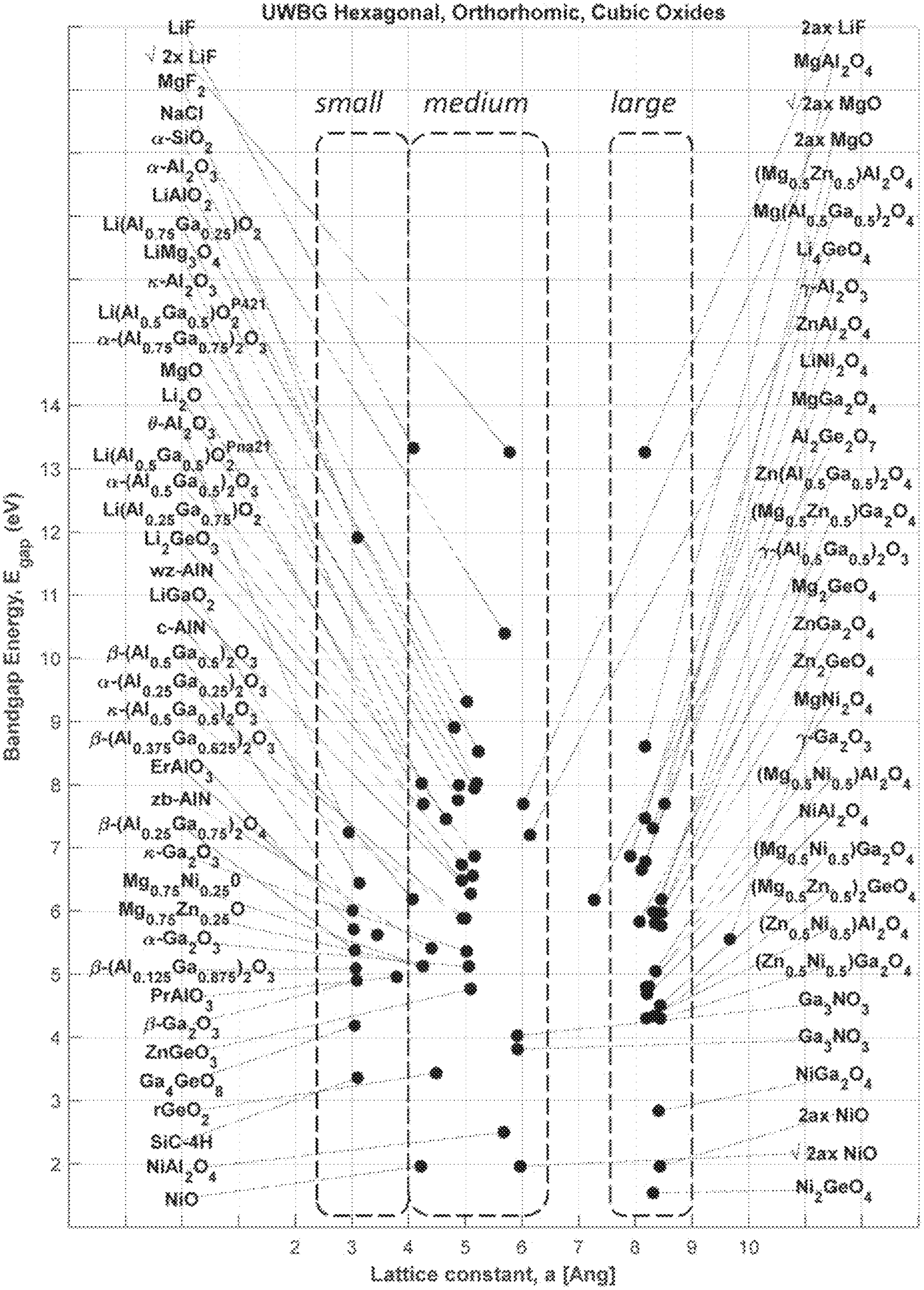
Figure 76D:
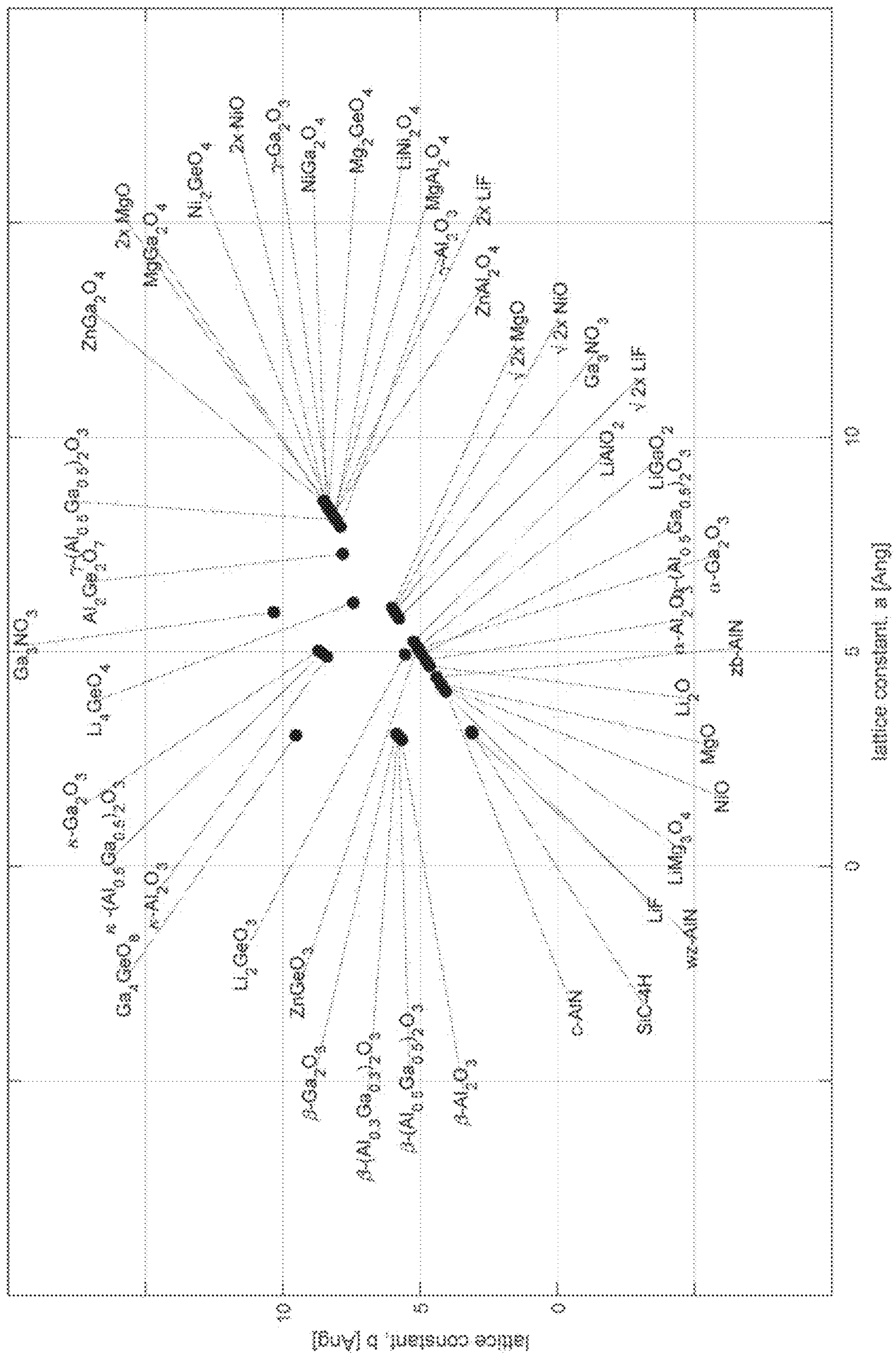

FIGS. 76A-1 through 76D show charts and tables of DFT calculated minimum bandgap energies and lattice parameters for some examples of epitaxial oxide materials. The epitaxial oxide materials described herein can be any of those shown in the table in FIG. 28 and in FIGS. 76A-1, 76A-2 and 76B. Some examples of epitaxial oxide materials are $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$ (with a space group that is R3c (i.e., $\alpha$), pna21 (i.e., $\kappa$), C2m (i.e., $\beta$), Fd3m (i.e., $\gamma$), and/or Ia3 (i.e., $\delta$)); NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; and $(Mg_xZn_{1-x-y}Ni_y)_2GeO_4$ where $0 \le x \le 1$, $0 \le y \le 1$.

An "epitaxial oxide" material described herein is a material comprising oxygen and other elements (e.g., metals or non-metals) having an ordered crystalline structure configured to be formed on a single crystal substrate, or on one or more layers formed on the single crystal substrate. Epitaxial oxide materials have defined crystal symmetries and crystal orientations with respect to the substrate. Epitaxial oxide materials can form layers that are coherent with the single crystal substrate and/or with the one or more layers formed on the single crystal substrate. Epitaxial oxide materials can be in layers of a semiconductor structure that are strained, wherein the crystal of the epitaxial oxide material is deformed compared to a relaxed state. Epitaxial oxide materials can also be in layers of a semiconductor structure that are unstrained or relaxed.

In some embodiments, the epitaxial oxide materials described herein are polar and piezoelectric, such that the epitaxial oxide materials can have spontaneous or induced piezoelectric polarization. In some cases, induced piezoelectric polarization is caused by a strain (or strain gradient) within the multilayer structure of the chirp layer. In some cases, spontaneous piezoelectric polarization is caused by a compositional gradient within the multilayer structure of the chirp layer. For example, $(Al_xGa_{1-x})_yO_z$, where $0 \le x \le 1$, $1 \le y \le 3$, and $2 \le z \le 4$, and with a Pna21 space group is a polar and piezoelectric material. Some other epitaxial oxide materials that are polar and piezoelectric are $Li(Al_xGa_{1-x})O_2$ where $0 \le x \le 1$, with a Pna21 or a P421212 space group. Additionally, the crystal symmetry of an epitaxial oxide layer (e.g., comprising materials shown in the table in FIG. 28 and in FIGS. 76A-1, 76A-2 and 76B) can be changed when the layer is in a strained state. In some cases, such an asymmetry in the crystal symmetry caused by strain can change the space group of an epitaxial oxide material. In some cases, an epitaxial oxide layer (e.g., comprising materials shown in the table in FIG. 28 and in FIGS. 76A-1, 76A-2 and 76B) can become polar and piezoelectric, when the layer is in a strained state.

In some embodiments, the epitaxial oxide materials described herein can each have a cubic, tetrahedral, rhombohedral, hexagonal, and/or monoclinic crystal symmetry. In some embodiments, the epitaxial oxide materials in the semiconductor structures described herein comprise $(Al_xGa_{1-x})_yO_z$, where $0 \le x \le 1$, $1 \le y \le 3$, and $2 \le z \le 4$, with a space group that is R3c, Pna21, C2m, Fd3m and/or Ia3.

The epitaxial oxide materials described herein can be formed using an epitaxial growth technique such as molecular beam epitaxy (MBE), metal organic chemical vapor deposition (MOCVD), atomic layer deposition (ALD), and other physical vapor deposition (PVD) and chemical vapor deposition (CVD) techniques.

The semiconductor structures comprising epitaxial oxide materials described herein can be a single layer on a substrate or multiple layers on a substrate. Semiconductor structures with multiple layers can include a single quantum well, multiple quantum wells, a superlattice, multiple superlattices, a compositionally varied (or graded) layer, a compositionally varied (or graded) multilayer structure (or region), a doped layer (or region), and/or multiple doped layers (or regions). Such semiconductor structures with one or more doped layers (or regions) can include layers (or regions) that are doped p-n, p-i-n, n-i-n, p-i-p, n-p-n, p-n-p, p-metal (to form a Schottky junction), and/or n-metal (to form a Schottky junction). Other types of devices, such as m-s-m (metal-semiconductor-metal) where the semiconductor comprises an epitaxial oxide material doped n-type, p-type, or not intentionally doped (i-type).

In this specification, the term "superlattice" (SL) refers to a layered structure comprising a plurality of repeating SL unit cells each including two or more layers, where the thickness of each SL unit cell may vary or remain constant and where the thickness of the individual layers in the SL unit cells may vary or be constant. Furthermore, the two or more layers of each SL unit cell may be small enough to allow wavefunction penetration between the constituent layers of a SL unit cell such that quantum tunnelling of electrons and/or holes can readily occur. A wavefunction is a probability amplitude in quantum mechanics that describes the quantum state of a particle and how it behaves.

The semiconductor structures described herein can include similar or dissimilar epitaxial oxide materials. In some cases, the crystal symmetry of the substrate and the epitaxial layers in the semiconductor structure will all have the same crystal symmetry. In other cases, the crystal symmetry can vary between the substrate and the epitaxial layers in the semiconductor structure.

The epitaxial oxide layers in the semiconductor structures described herein can be i-type (i.e., intrinsic, or not intentionally doped), n-type, or p-type. The epitaxial oxide layers that are n-type or p-type can contain impurities that act as extrinsic dopants. In some cases, the n-type or p-type layers can contain a polar epitaxial oxide material (e.g., $(Al_xGa_{1-x})_yO_z$, where $0 \le x \le 1$, $1 \le y \le 3$, and $2 \le z \le 4$, and with a Pna21 space group), and the n-type or p-type conductivity can be formed via polarization doping (e.g., due to a strain or composition gradient within the layer(s)).

The semiconductor structures with doped layers (or regions) comprising epitaxial oxide materials can be doped in several ways. In some embodiments, a dopant impurity (e.g., an acceptor impurity, or a donor impurity) can be co-deposited with the epitaxial oxide material to form a layer such that the dopant impurity is incorporated into the crystalline layer (e.g., substituted in the lattice, or in an interstitial position) and forms active acceptors or donors to provide the material p-type or n-type conductivity. In some embodiments, a dopant impurity layer can be deposited adjacent to a layer comprising an epitaxial oxide material such that the dopant impurity layer includes active acceptors or donors that provide the epitaxial oxide material p-type or n-type conductivity. In some cases, a plurality of alternating dopant impurity layers and layers comprising epitaxial oxide materials form a doped superlattice, where the dopant impurity layers provide p-type or n-type conductivity to the doped superlattice.

Suitable substrates for the formation of the semiconductor structures comprising epitaxial oxide materials described herein include those that have crystal symmetries and lattice parameters that are compatible with the epitaxial oxide materials deposited thereon. Some examples of suitable substrates include $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where $0 \le x \le 1$, $1 \le y \le 3$, and $2 \le z \le 4$ (any crystal symmetry), $MgF_2$, $LaAlO_3$, $TiO_2$, or quartz.

The crystal symmetry of the substrate and the epitaxial oxide material can be compatible if they have the same type of crystal symmetry and the in-plane (i.e., parallel with the surface of the substrate) lattice parameters and atomic positions at the surface of the substrate provide a suitable template for the growth of the subsequent epitaxial oxide materials. For example, a substrate and an epitaxial oxide material can be compatible if the in-plane lattice constant mismatch between the substrate and the epitaxial oxide material are less than 0.5%, 1%, 1.5%, 2%, 5% or 10%. For example, in some embodiments the crystal structure of the substrate material has a lattice mismatch of less than or equal to 10% with the epitaxial layer. In some cases, the crystal symmetry of the substrate and the epitaxial oxide material can be compatible if they have a different type crystal symmetry but the in-plane (i.e., parallel with the surface of the substrate) lattice parameters and atomic positions at the surface of the substrate provide a suitable template for the growth of the subsequent epitaxial oxide materials. In some cases, multiple (e.g., 2, 4 or other integer) unit cells of a substrate surface atomic arrangement can provide a suitable surface for the growth of an epitaxial oxide material with a larger unit cell than that of the substrate. In another case, the epitaxial oxide layer can have a smaller lattice constant (e.g., approximately half) than the substrate. In some cases, the unit cells of the epitaxial oxide layer may be rotated (e.g., by 45 degrees) compared to the unit cells of the substrate.

In the case of epitaxial oxide materials with cubic crystal symmetries, the lattice constants in all three directions of the crystal are the same, and the orthogonal in-plane lattice constants will be also be the same. In some cases, the epitaxial material has a crystal symmetry where two lattice constants are the same (e.g., a=b≠c) and the crystal is oriented such that those lattice constants (a and b) are at an interface of a heterostructure between dissimilar epitaxial oxide materials (e.g., with different compositions, different bandgaps, and either the same or a different crystal symmetry). In other cases, the epitaxial oxide materials can have two different lattice constants (e.g., a≠b≠c, or a=b≠c and oriented such that lattice constants a and c, or b and c, are at the interface). In such cases, where the orthogonal in-plane lattice constants are different, the lattice constants in both orthogonal directions need to be within a certain percentage mismatch (e.g., within 0.5%, 1%, 1.5%, 2%, 5% or 10%) of the lattice constants in both orthogonal directions of another material with which it is compatible.

In some cases, the epitaxial oxide materials of the semiconductor structures described herein and the substrate material upon which the semiconductor structures described herein are grown are selected such that the layers of the semiconductor structure have a predetermined strain, or strain gradient. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate.

In other cases, a buffer layer including a graded layer or region can be used to reset the lattice constant (or crystal plane spacing) of the substrate, and the layers of the semiconductor structure have in-plane lattice constants (or crystal plane spacings) that are within 0.5%, 1%, 1.5%, 2%, 5% or 10% of the final (or topmost) lattice constant (or crystal plane spacing) of the buffer layer. In such cases, the materials in the semiconductor structure may have lattice constants and/or crystal symmetries that are different from those of the substrate. In such cases, even though the materials in the semiconductor structure are not compatible with the substrate, the materials in the semiconductor structure can still be grown on the substrate using the buffer layer including the graded layer or region to reset the lattice constant.

The devices comprising the semiconductor structures comprising the epitaxial oxide materials described herein can include electronic and optoelectronic devices. For example, the devices described herein can be resistors, capacitors, inductors, diodes, transistors, amplifiers, photodetectors, LEDs or lasers.

In some embodiments, the devices comprising the semiconductor structures comprising the epitaxial oxide materials described herein are optoelectronic devices, such as photodetectors, LEDs and lasers, that detect or emit UV light (e.g., with a wavelength from 150 nm to 280 nm). In some cases, the device comprises an active region wherein the detection or emission of light occurs, and the active region comprises an epitaxial oxide material with a bandgap selected to detect or emit UV light (e.g., with a wavelength from 150 nm to 280 nm).

In some embodiments, the devices comprising the semiconductor structures comprising the epitaxial oxide materials described herein utilize carrier multiplication, for example from impact ionization mechanisms. The bandgaps of the epitaxial oxide materials are wide (e.g., from about 2.5 eV to about 10 eV, or from about 3 eV to about 9 eV). The wide bandgaps provide high dielectric breakdown strengths due to the epitaxial oxide materials described herein. Devices including wide bandgap epitaxial oxide materials can have large internal fields and/or be biased at high voltages without damaging the materials of the device due to the high dielectric breakdown strengths of the constituent epitaxial oxide materials. The large electric fields present in such devices can lead to carrier multiplication through impact ionization, which can improve the characteristics of the device. For example, an avalanche photodetector (APD) can be made to detect low intensity signals, or an LED or laser can be made with high electrical power to optical power conversion efficiency.

Density functional theory (DFT) enables prediction and calculation of the crystal oxide band structure on the basis of quantum mechanics without requiring phenomenological parameters. DFT calculations applied to understanding the electronic properties of solid-state oxide crystals is based fundamentally on treating the nuclei of the atoms comprising the crystal as fixed via the Born-Oppenheimer approximation, thereby generating a static external potential in which the many-body electron fields are embedded. The crystal structure symmetry of the atomic positions and species imposes a fundamental structure effective potential for the interacting electrons. The effective potential for the many-body electron interactions in three-dimensional spatial coordinates can be implemented by the utility of functionals of the electron density. This effective potential includes exchange and correlation interactions, representing interacting and non-interacting electrons. For application to solid-state semiconductors and oxides there exists a range of improved exchange functionals (XCF) that improve the accuracy of the DFT results. Within the DFT framework the many-electron Schrödinger equation is divided into two groups: (i) valence electrons; and (ii) inner core electrons. Inner shells electrons are strongly bound and partially screen the nucleus, forming with the nucleus an inert core. Crystal atomic bonds are primarily due to the valence electrons. Therefore, inner electrons can be ignored in a large number of cases, thereby reducing the atoms comprising the crystal to an ionic core that interacts with the valence electrons. This effective interaction is called a pseudopotential and approximates the potential felt by the valence electrons. One notable exception of the effect of inner core electrons is in the case of Lanthanide oxides, wherein partially filled Lanthanide atomic 4f-orbitals are surrounded by closed electron orbitals. The present DFT band structures disclosed herein account for this effect. There exist many improvements for XCF to attain higher accuracy of band structures applied to oxides. For example, improvements over historical XCFs of the known local density approximation (LDA), generalized gradient approximation (GGA) hybrid exchange (e.g., HSE (Heyd-Scuseria-Ernzerhof), PBE (Perdew-Burke-Ernzerhof) and BLYP (Becke, Lee, Yang, Parr)) include the use of the Tran-Blaha modified Becke-Johnson (TBmBJ) exchange functional, and further modifications, such as the KTBmBJ, JTBSm, and GLLBsc forms. It was found in accordance with the present disclosure that in particular for the present materials disclosed, the TBmBJ exchange potential can predict the electron energy-momentum (E-$\underline{k}$) band structure, bandgaps, lattice constants, and some mechanical properties of epitaxial oxide materials. A further benefit of the TBmBJ is the lower computational cost compared to HSE when applied to a large number of atoms in large supercells which are used to simulate smaller perturbations to an idealized crystal structure, such as impurity incorporation. It is expected that further improvements over TBmBJ applied specifically to the present oxide systems can also be achieved. DTF calculations are used extensively in the present disclosure to provide ab-initio insights into the electronic and physical properties of the epitaxial oxide materials described herein, such as the bandgap and whether the bandgap is direct or indirect in character. The electronic and physical properties of the epitaxial oxide materials can be used to design semiconductor structures and devices utilizing the epitaxial oxide materials. In some cases, experimental data has also been used to verify the properties of the epitaxial oxide materials and structures described herein.

Calculated E-k band diagrams of epitaxial oxide materials derived using DFT calculations are described herein. There are several features of the E-$\underline{k}$ diagrams that can be used to provide insight into the electronic and physical properties of the epitaxial oxide materials. For example, the energies and k-vectors of valence band and conduction band extrema indicate the approximate energy width of the bandgap and whether the bandgap has a direct or an indirect character. The curvature of the branches of the valence band and conduction band near the extrema are related to the hole and electron effective masses, which relates to the carrier mobilities in the material. DFT calculations using the TBmBJ exchange functional more accurately shows the magnitude of the bandgap of the material compared to previous exchange functionals, as verified by experimental data. The calculated band diagrams of epitaxial materials in this disclosure may differ from the actual band diagrams of the epitaxial materials in some ways. However, certain features, such as the valence band and conduction band extrema, and the curvature of the branches of the valence band and conduction band near the extrema, may closely correspond to the actual band diagrams of the epitaxial materials. Therefore, even if some details of the band diagrams are inaccurate, the calculated band diagrams of epitaxial materials in this disclosure provide useful insights into the electronic and physical properties of the epitaxial oxide materials, and can be used to design semiconductor structures and devices utilizing the epitaxial oxide materials.

FIGS. 76A-1 through 76D show charts and tables of DFT calculated minimum bandgap energies and lattice parameters for some examples of epitaxial oxide materials.

FIGS. 76A-1 and 76A-2 show a table of crystal symmetries (or space groups), lattice constants ("a," "b," and "c," in different crystal directions, in Angstroms), bandgaps (minimum bandgap energies in eV), and the wavelength of light ("λ_g," in nm) that corresponds to the bandgap energy. FIGS. 76B and 76C show charts of some epitaxial oxide material bandgaps (minimum bandgap energies in eV) and in some cases crystal symmetry (e.g., α-, β-, γ- and κ-$Al_xGa_{1-x}O_y$) versus lattice constant (in Angstroms) of the epitaxial oxide material. FIG. 76C includes "small," "mid," and "large" lattice constant sets of epitaxial oxide materials. Epitaxial oxide materials within each of these sets (or in some cases between the sets) may be compatible with one another, as described further herein. FIG. 76D shows a chart of lattice constant, b, in Angstroms, versus lattice constant, a, in Angstroms, of some epitaxial oxide materials.

Bandgaps of the materials shown in FIGS. 76A-1 through 76C were obtained using computer modeling. The computer models used DFT and the TBMBJ exchange potential.

The charts and tables in FIGS. 76A-1 through 76C show that the composition and the crystal symmetry (or space group) can each affect the bandgap of an epitaxial oxide material. For example, β-$Ga_2O_3$ (i.e., $Ga_2O_3$ with a C2m space group) has a bandgap of about 4.9 eV, while β-$(Al_{0.5}Ga_{0.5})_2O_3$ (i.e., $Ga_2O_3$ with a C2m space group) has a bandgap of about 6.1 eV. In other words, changing the Al content of $(Al_xGa_{1-x})_2O_3$ (e.g., adding Al to $Ga_2O_3$ to form $(Al_{0.5}Ga_{0.5})_2O_3$) increases the bandgap of the material. In another example, β-$Ga_2O_3$ (i.e., $Ga_2O_3$ with a C2m space group) has a bandgap of about 4.9 eV, while κ-$Ga_2O_3$ (i.e., $Ga_2O_3$ with a Pna21 space group) has a bandgap of about 5.36 eV, which illustrates that changing the crystal symmetry (or space group) of an epitaxial oxide material (without changing the composition) can also change its bandgap.

The character of the band structure can also be affected by the composition and the crystal symmetry (or space group) of epitaxial oxide materials, as well as by a tensile or compressive strain state of the material. For example, the composition and crystal symmetry (or space group) of an epitaxial oxide material can determine if the minimum bandgap energy corresponds to a direct bandgap transition or an indirect bandgap transition. In addition to the composition and crystal symmetry (or space group), the strain state of an epitaxial oxide material can also affect the minimum bandgap energy, and whether the minimum bandgap energy corresponds to a direct bandgap transition or an indirect bandgap transition. Other materials properties (e.g., the electron and hole effective masses) can also be impacted by the composition, crystal symmetry (or space group), and strain state of an epitaxial oxide material.

The charts and table in FIGS. 76A-1 through 76D illustrate that some epitaxial oxide materials have crystal symmetries such that the lattice constants in the a and b directions are the same. Some of the lattice constants shown in the chart in FIG. 76D lie along the diagonal (i.e., where lattice constant, a=lattice constant, b). Such epitaxial oxide materials can have a cubic crystal symmetry (or an Fd3m space group), for example γ-$Ga_2O_3$ (i.e., $Ga_2O_3$ with an Fd3m space group), or γ-$(Al_xGa_{1-x})_2O_3$ or γ-$(Al_xGa_{1-x})_yO_z$, where $0 \leq x \leq 1$, $1 \leq y \leq 3$, and $2 \leq z \leq 4$. Such epitaxial oxide materials can also have a hexagonal crystal symmetry (or an R3c space group), for example α-$Ga_2O_3$ (i.e., $Ga_2O_3$ with an R3c space group), or α-$(Al_xGa_{1-x})_2O_3$.

The charts and table in FIGS. 76A-1 through 76D also illustrate that some epitaxial oxide materials have crystal symmetries such that the lattice constants in the a and b directions are different. Some of the lattice constants shown in the chart in FIG. 76D lie off of the diagonal (i.e., where lattice constant, a does not equal lattice constant, b). Such epitaxial oxide materials can have a monoclinic crystal symmetry (or a C2m space group), for example β-$Ga_2O_3$ (i.e., $Ga_2O_3$ with a C2m space group), or β-$(Al_xGa_{1-x})_2O_3$. Such epitaxial oxide materials can also have an orthorhombic crystal symmetry (or a Pna21 space group), for example κ-$Ga_2O_3$ (i.e., $Ga_2O_3$ with a Pna21 space group), or κ-$(Al_xGa_{1-x})_2O_3$, or κ-$(Al_xGa_{1-x})_yO_z$, where $0 \leq x \leq 1$, $1 \leq y \leq 3$, and $2 \leq z \leq 4$. Such epitaxial oxide materials can have different in-plane lattice constants in different directions (e.g., a and b), all of which can be matched (or close to matched) to the in-plane lattice constants of a compatible substrate.

The charts and table in FIGS. 76A-1 through 76D also illustrate that epitaxial oxide materials have wide minimum bandgaps, with most having a bandgap from about 3 eV to about 9 eV. The wide bandgaps have several advantages. The wide bandgaps of epitaxial oxide materials provide them with high dielectric breakdown voltages, and therefore can be used in electronic devices that require large biases (e.g., high voltage switches, and impact ionization devices). The bandgaps of epitaxial oxide materials are also well suited for use in optoelectronic devices that emit or detect light in the UV range, where materials with bandgaps from about 4.5 eV to about 8 eV can be used to emit or detect UV light with wavelengths from about 150 nm to 280 nm. Semiconductor heterostructures can also be formed with wide bandgap materials as the emitter or absorber layers, and materials that have wider bandgaps than the emitter or absorber layers can be used in other layers of the structure to be transparent to the wavelength being emitted or absorbed.

The chart in FIG. 76B can also serve as a guide to design semiconductor structures comprising epitaxial oxide materials. The lattice constants and crystal symmetries provide information regarding which materials can be epitaxially formed (or grown) in a semiconductor structure, for example, with high crystal quality and/or with layers of the semiconductor structure having desired strain states. As described herein, in some cases a strain state for an epitaxial oxide material can beneficially alter the properties of the material. For example, as described herein, an epitaxial oxide material can have a direct minimum bandgap energy in a strained state, but have an indirect bandgap in a relaxed (not strained) state. In some cases, the epitaxial oxide materials and the substrate material of a semiconductor structure are selected such that the layers of the semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate. Therefore, points on the chart in FIG. 76B that are vertically aligned within an acceptable amount of mismatch, and that have compatible crystal symmetries, can be combined into a semiconductor structure with different types of epitaxial oxide materials (or epitaxial oxide heterostructures). The bandgaps of such compatible materials can then be chosen for desired properties of the semiconductor structure and/or of a device that incorporates the semiconductor structure.

For example, the semiconductor structure can be used in a UV-LED with doped layers (or regions) forming a p-i-n doping profile. In such cases, the i-layer can include an epitaxial oxide material with an appropriate bandgap (corresponding to the desired emission wavelength of the UV-LED) chosen from an epitaxial material in FIG. 76B, which can be chosen from the set of compatible materials described above. In this example the n- and p-type layers can be chosen, from the set of compatible materials in FIG. 76B, to be transparent to the emission wavelength, for example, by having bandgaps above the bandgap of the epitaxial oxide material emitting the light. In another example, the n- and p-layers can be chosen, from the set of compatible materials in FIG. 76B, to have indirect bandgaps so that they have low absorption coefficients for the wavelength of the emitted light.

For example, FIG. 76C shows that there is a group of epitaxial oxide materials with "small" lattice constants from about 2.5 Angstroms to about 4 Angstroms, some or all of which could be compatible materials with each other if their lattice constants are sufficiently matched, and their crystal symmetries are compatible. The figure also shows that there is a group of epitaxial oxide materials with "mid" lattice constants from about 4 Angstroms to about 6.5 Angstroms, some or all of which could be compatible materials with each other if their lattice constants are sufficiently matched, and their crystal symmetries are compatible. The figure also shows that there is a group of epitaxial oxide materials with “large” lattice constants from about 7.5 Angstroms to about 9 Angstroms, some or all of which could be compatible materials with each other if their lattice constants are sufficiently matched, and their crystal symmetries are compatible.

FIG. 76C also shows that some fluoride materials (e.g., LiF) can be compatible with some epitaxial oxide materials, and can be used in the semiconductor structures described herein. For example, $2\sqrt{2}x$ LiF has a lattice constant of approximately 11.5 Angstroms and can be compatible with the group of epitaxial oxide materials having lattice constants from about 11 to about 13 Angstroms. Additionally, some nitride materials (e.g., AlN) and some carbide materials (e.g., SiC) can also be compatible with some epitaxial oxide materials, and can be used in the semiconductor structures described herein.

Figure 77:
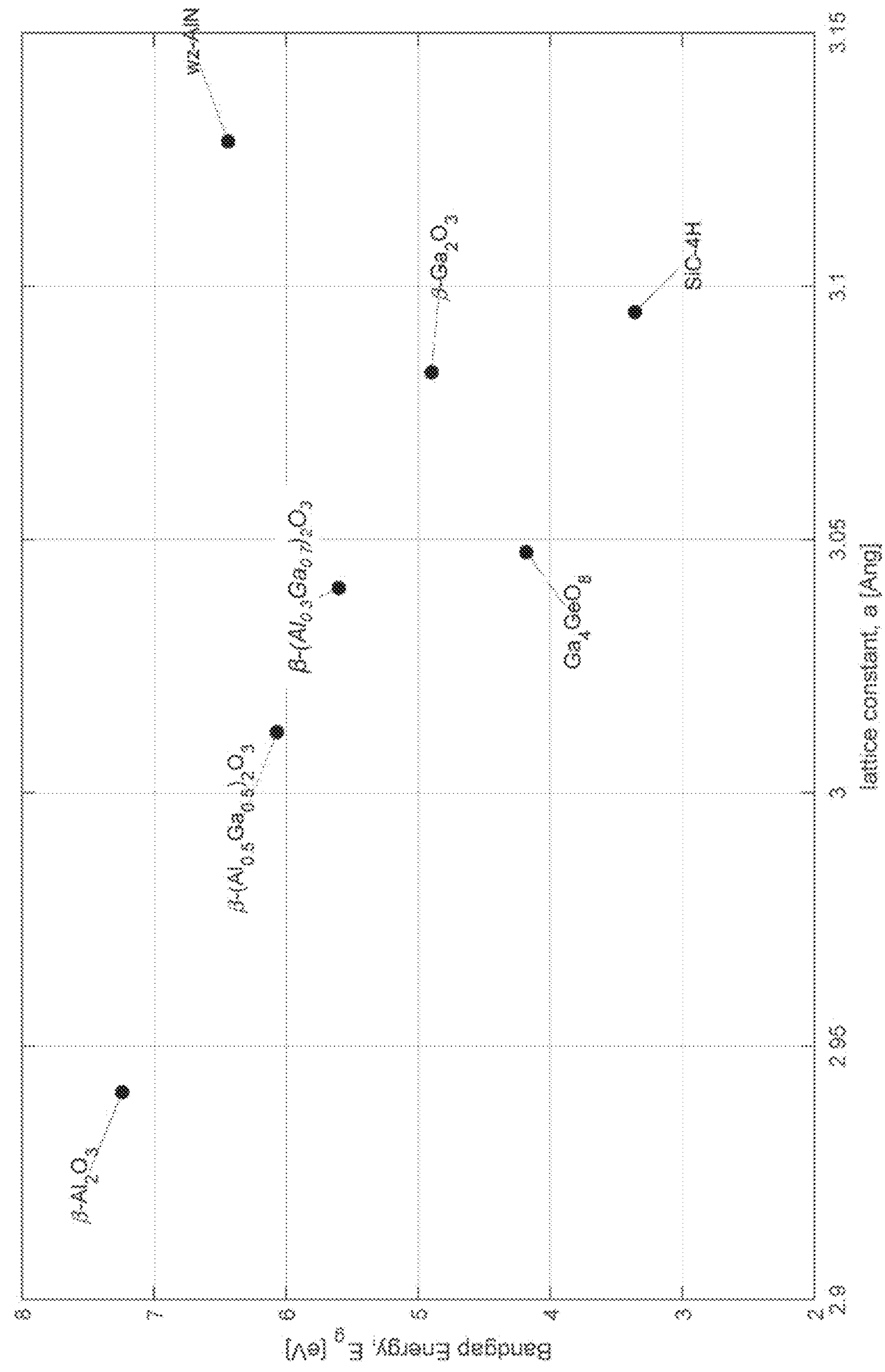
FIG. 77 shows a chart of some DFT calculated epitaxial oxide material bandgaps (minimum bandgap energies in eV) and in some cases crystal symmetry versus a lattice constant of the epitaxial oxide material.

FIG. 77 shows a chart of some DFT calculated epitaxial oxide material bandgaps (minimum bandgap energies in eV) and in some cases crystal symmetry versus a lattice constant of the epitaxial oxide material. Each of the epitaxial oxide materials shown in the chart in FIG. 77 has been experimentally determined to be compatible with the other materials in the chart, including $\beta$-$(Al_xGa_{1-x})_2O_3$ even though there may be considerable lattice constant mismatch as shown. The lattice constants of the materials in the chart vary from about 2.9 Angstroms to about 3.15 Angstroms, and therefore have less than a 10% lattice constant mismatch with each other.

Some materials in the chart in FIG. 77, such as $\beta$-$(Al_{0.3}Ga_{0.7})_2O_3$ and $Ga_4GeO_8$, have lattice constant mismatch of less than 1%. $Ga_4GeO_8$ can be advantageously used in active regions of optoelectronic devices (e.g., as an absorber or emitter material), since it has a direct bandgap.

Another example of a set of compatible materials from the chart in FIG. 77 are wz-AlN (i.e., AlN with a wurtzite crystal symmetry), $\beta$-$(Al_xGa_{1-x})_2O_3$, and $\beta$-$Ga_2O_3$. For example, a heterostructure comprising wz-AlN (i.e., AlN with a wurtzite crystal symmetry) and $\beta$-$(Al_xGa_{1-x})_2O_3$ could be formed on a $\beta$-$Ga_2O_3$ substrate. In some cases, such a structure could comprise a superlattice of alternating layers of wider bandgap wz-AlN and narrower bandgap $\beta$-$(Al_xGa_{1-x})_2O_3$ (e.g., with a low Al content of x less than about 0.3, or less than about 0.5). Such superlattices could be beneficial because the wz-AlN would be in compressive strain (compared to the $\beta$-$Ga_2O_3$ substrate) and the $\beta$-$(Al_xGa_{1-x})_2O_3$ layer would be in tensile strain, and therefore the superlattice could be designed to be strain balanced.

Additionally, some epitaxial oxide materials that are not shown in the chart in FIG. 77 are compatible with some of the materials shown in the chart in FIG. 77. In other words, the chart in FIG. 77 only shows an example subset of compatible materials. For example, MgO(100) (i.e., MgO oriented in the (100) direction) is compatible with $\beta$-$(Al_xGa_{1-x})_2O_3$.

Figure 78:
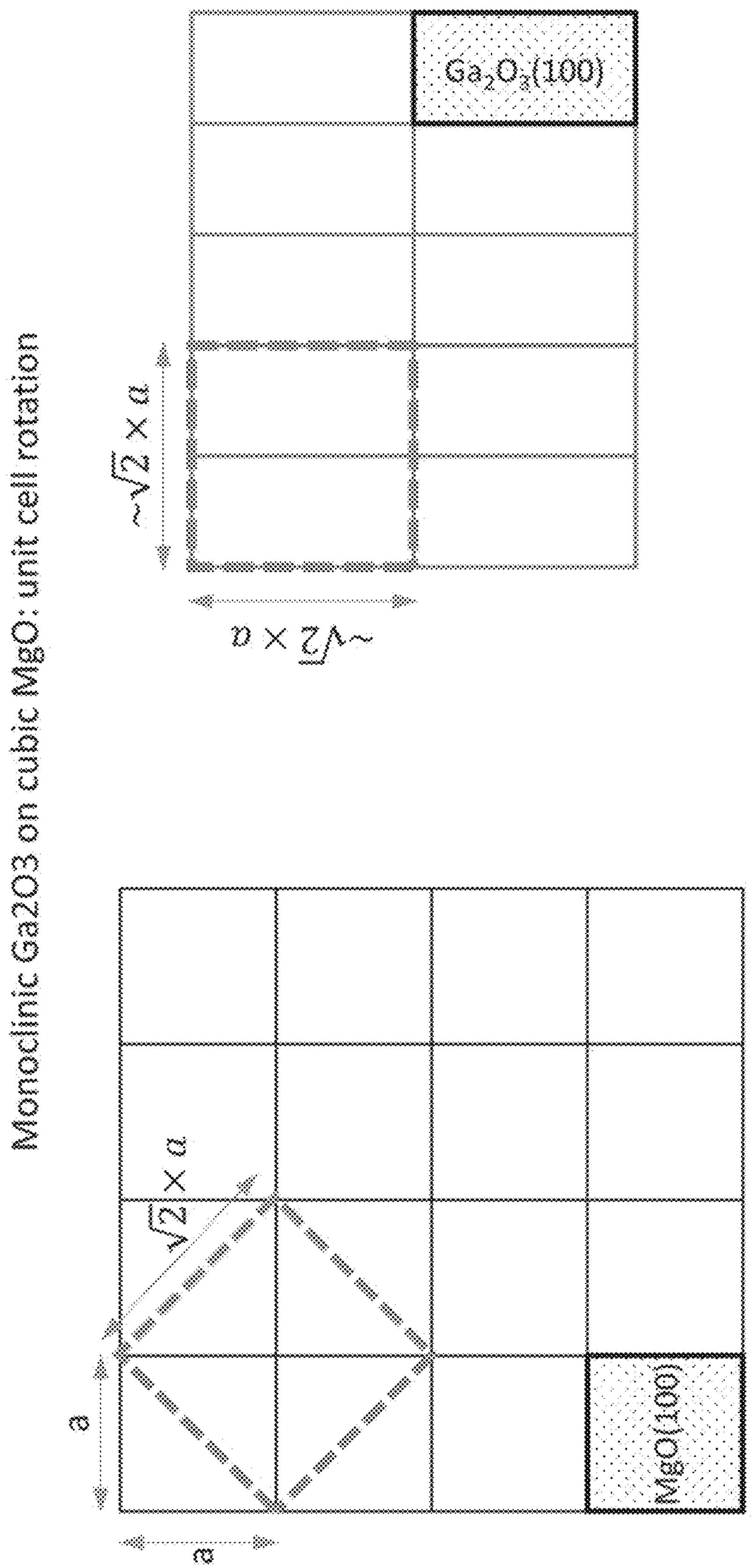
FIG. 78 shows a schematic example explaining how an epitaxial oxide material with a monoclinic unit cell can be compatible with an epitaxial oxide material with a cubic unit cell.

FIG. 78 shows a schematic example explaining how an epitaxial oxide material with a monoclinic unit cell can be compatible with an epitaxial oxide material with a cubic unit cell. In the example shown in FIG. 78, MgO(100) is the material with the cubic crystal symmetry and $\beta$-$Ga_2O_3$(100) is the material with the monoclinic crystal symmetry. Two adjacent unit cells of $\beta$-$Ga_2O_3$(100) have in-plane lattice constants that are approximately square, and approximately match the in-plane lattice constants of MgO(100) when there is a 45° rotation between the two materials.

Figure 79:
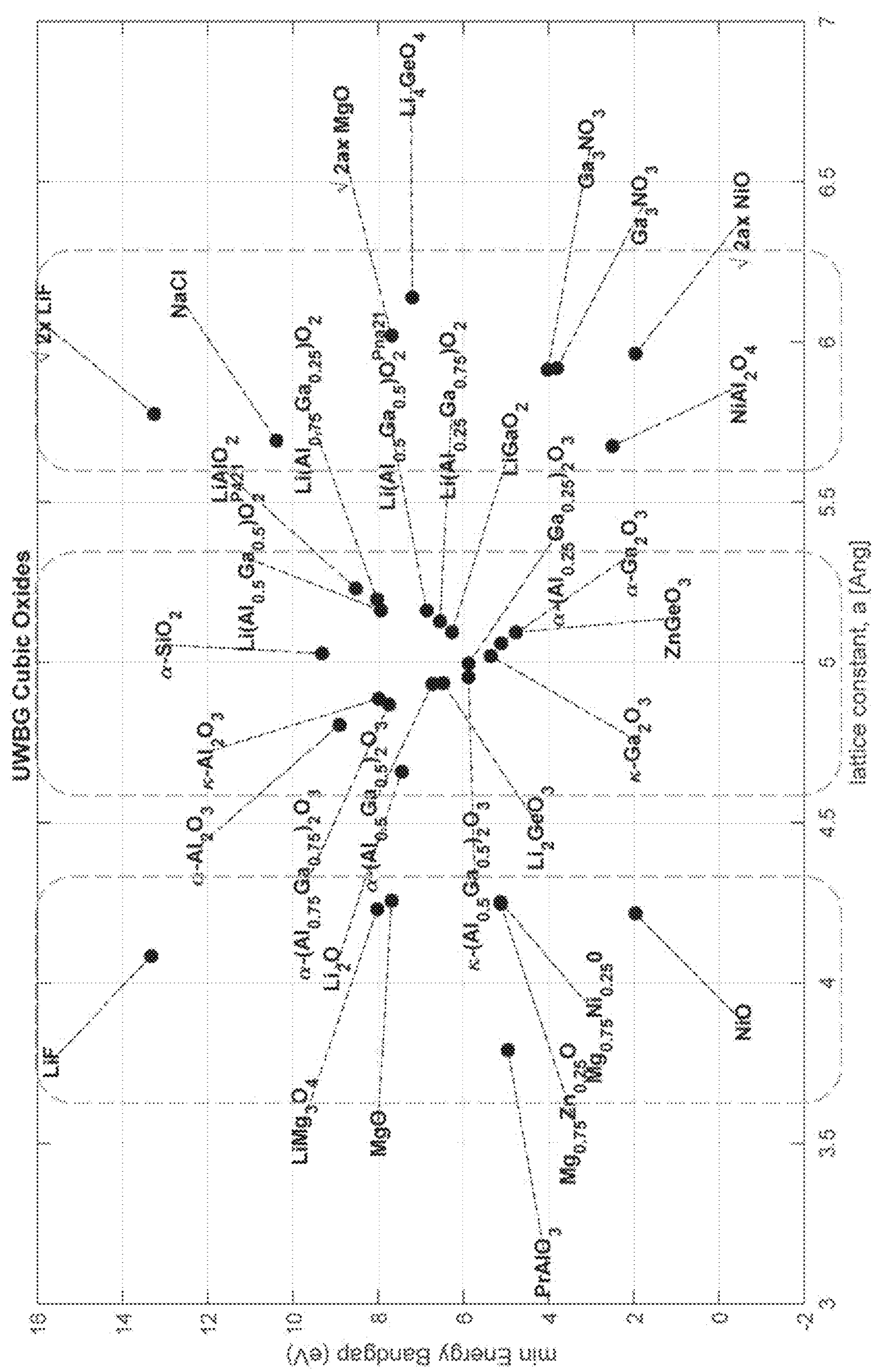
FIG. 79 shows a chart of some DFT calculated epitaxial oxide material bandgaps (minimum bandgap energies in eV) and in some cases crystal symmetry versus a lattice constant of the epitaxial oxide material.

FIG. 79 shows a chart of some DFT calculated epitaxial oxide material bandgaps (minimum bandgap energies in eV) and in some cases crystal symmetry versus a lattice constant of the epitaxial oxide material. There are three groups (shown by dotted boxes) of epitaxial oxide materials shown in the chart in FIG. 79, where the materials within each group are compatible with the other materials in the group, including $\alpha$- and $\kappa$-$(Al_xGa_{1-x})_2O_3$ or $(Al_xGa_{1-x})_yO_z$, where $0 \le x \le 1$, $1 \le y \le 3$, and $2 \le z \le 4$.

For example, some materials in the chart in FIG. 79 that can be used as substrates and/or epitaxial oxide layers in semiconductor structures include MgO, $LiAlO_2$, $LiGaO_2$, $Al_2O_3$(C-, A-, R-, or M-plane oriented), and $\beta$-$Ga_2O_3$(100), $\beta$-$Ga_2O_3$ (−201). The chart also shows that epitaxial LiF has a lattice constant that is compatible with those of different epitaxial oxide materials in the chart.

Another example of materials in the chart in FIG. 79 that are compatible is $\kappa$-$(Al_xGa_{1-x})_2O_3$ with $0 \le x \le 1$, $\kappa$-$(Al_xGa_{1-x})_yO_z$, where $0 \le x \le 1$, $1 \le y \le 3$, and $2 \le z \le 4$, and $LiGaO_2$ substrates. $(Al_xGa_{1-x})_yO_z$, where $0 \le x \le 1$, $1 \le y \le 3$, and $2 \le z \le 4$ can be advantageously used in active regions of optoelectronic devices (e.g., as an absorber or emitter material), since it has a direct bandgap.

Figure 80:
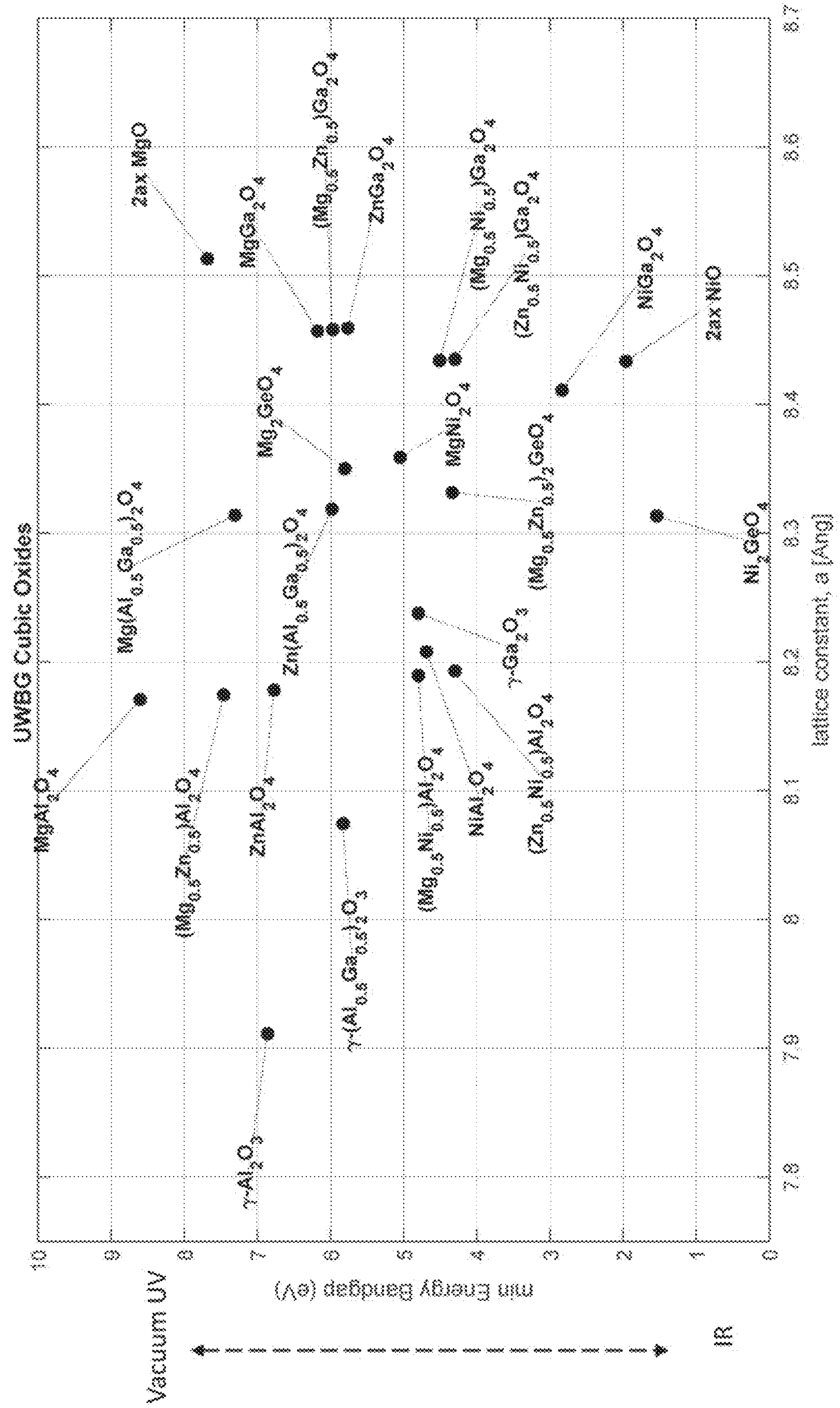
FIG. 80 shows a chart of some DFT calculated epitaxial oxide material bandgaps (minimum bandgap energies in eV) versus a lattice constant where the epitaxial oxide materials all have cubic crystal symmetry with a Fd3m or Fm3m space group.

FIG. 80 shows a chart of some DFT calculated epitaxial oxide material bandgaps (minimum bandgap energies in eV) versus a lattice constant where the epitaxial oxide materials all have cubic crystal symmetry with a Fd3m or Fm3m space group. Each of the epitaxial oxide materials shown in the chart in FIG. 80 is compatible with the other materials in the chart, including $\gamma$-$(Al_xGa_{1-x})_2O_3$ or $\gamma$-$(Al_xGa_{1-x})_yO_z$, where $0 \le x \le 1$, $1 \le y \le 3$, and $2 \le z \le 4$. The lattice constants of the materials in the chart vary from about 7.9 Angstroms to about 8.5 Angstroms, and therefore have less than an 8% lattice constant mismatch with each other. The cubic epitaxial oxide materials shown in the chart in FIG. 80 have large unit cells (e.g., with lattice constants about 8.2+/−0.3 Angstroms, as shown in the figure) and have the peculiar attribute of being able to accommodate large amounts of elastic strain, such as less than or equal to about 10%, or less than or equal to about 8%, or less than or equal to 5%. For example, some of the epitaxial oxide materials shown in FIG. 80 that are compatible with $\gamma$-$(Al_xGa_{1-x})_yO_z$, where $0 \le x \le 1$, $1 \le y \le 3$, and $2 \le z \le 4$ are $(Mg_xZn_{1-x})(Al_yGa_{1-y})_2O_4$ where $0 \le x \le 1$ and $0 \le y \le 1$.

Figure 81:
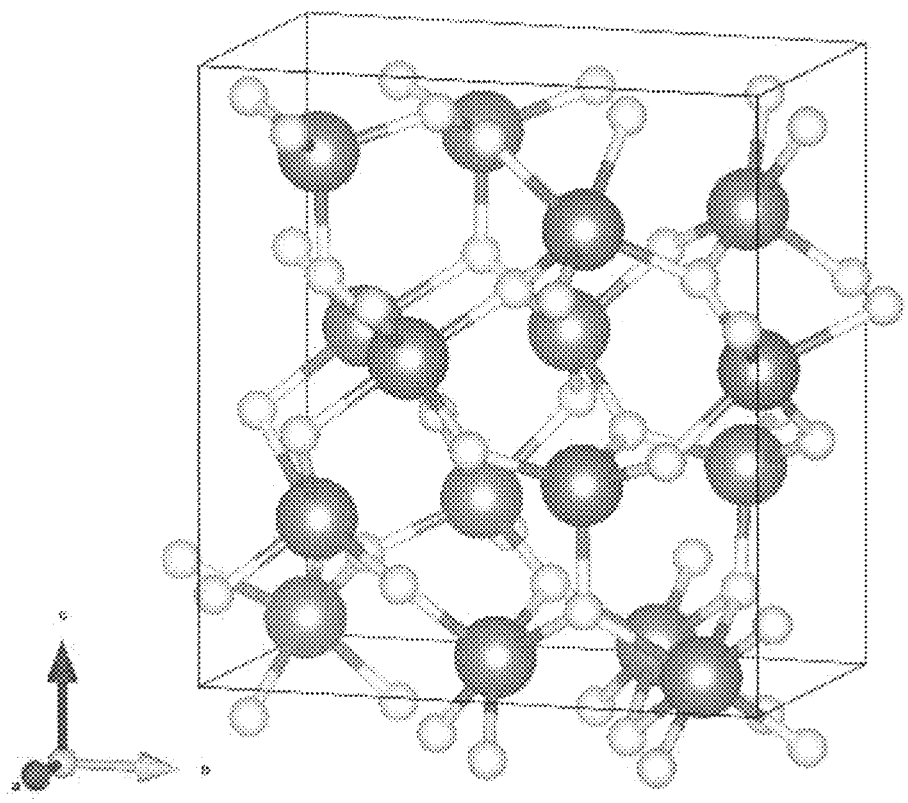
FIG. 81 shows the DFT calculated atomic structure of $\kappa$-$Ga_2O_3$ (i.e., $Ga_2O_3$ with a Pna21 space group).

Epitaxial oxide materials that are polar can be doped via polarization doping and can therefore be used to form unique epitaxial oxide structures. FIG. 81 shows the DFT calculated atomic structure of $\kappa$-$Ga_2O_3$ (i.e., $Ga_2O_3$ with a Pna21 space group). The geometric optimization of the crystal structure of a unit cell of $\kappa$-$Ga_2O_3$ was performed using DFT where the exchange functional was the generalized gradient approximation (GGA) variation GGA-PBEsol. K—$Ga_2O_3$ has an orthorhombic crystal symmetry. K—$(Al_xGa_{1-x})_yO_z$, where x is from 0 to 1, y is from 1 to 3, and z is from 2 to 4, can be grown on quartz, $LiGaO_2$ and Al(111) substrates. K—$(Al_xGa_{1-x})_yO_z$, where x is from 0 to 1, y is from 1 to 3, and z is from 2 to 4, can be doped p-type using Li as a dopant. At moderate levels of Li incorporation, polar alloys can be formed such as $Li(Al_xGa_{1-x})O_2$, where x is from 0 to 1, which can be native p-type oxides, and have compatible spaces groups such as Pna21 and P421212.

In some embodiments, Li can also be used as an advantageous impurity level dopant or constituent alloy species for other epitaxial oxide materials (e.g., those shown in FIGS. 28, 76A-1, 76A-2 and 76B) to create p-type conductivity.

Figure 82A:
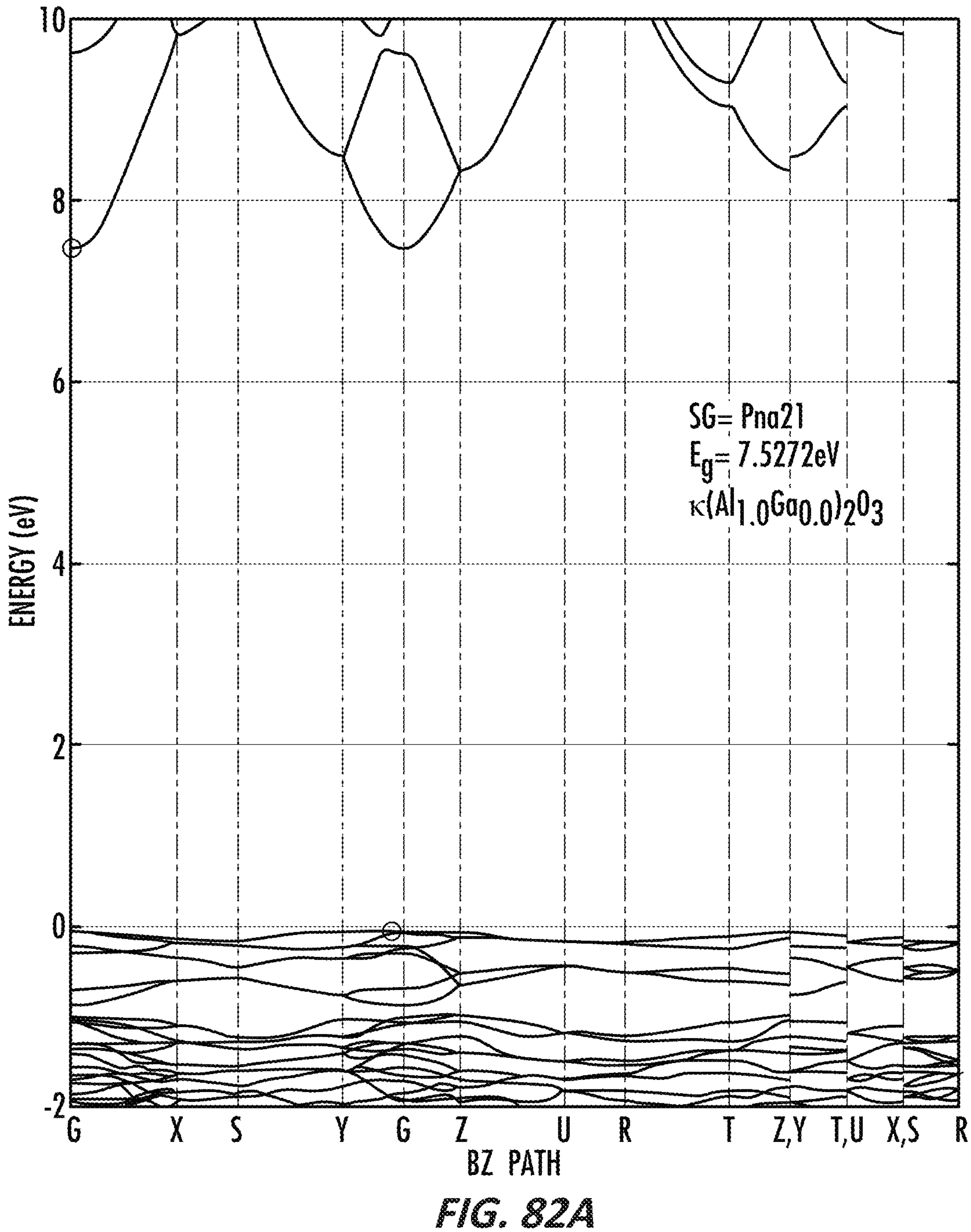
FIGS. 82A-82C show DFT calculated band structures of $\kappa$-$(Al_xGa_{1-x})_2O_3$, where x=1, 0.5 and 0, respectively.
Figure 82B:
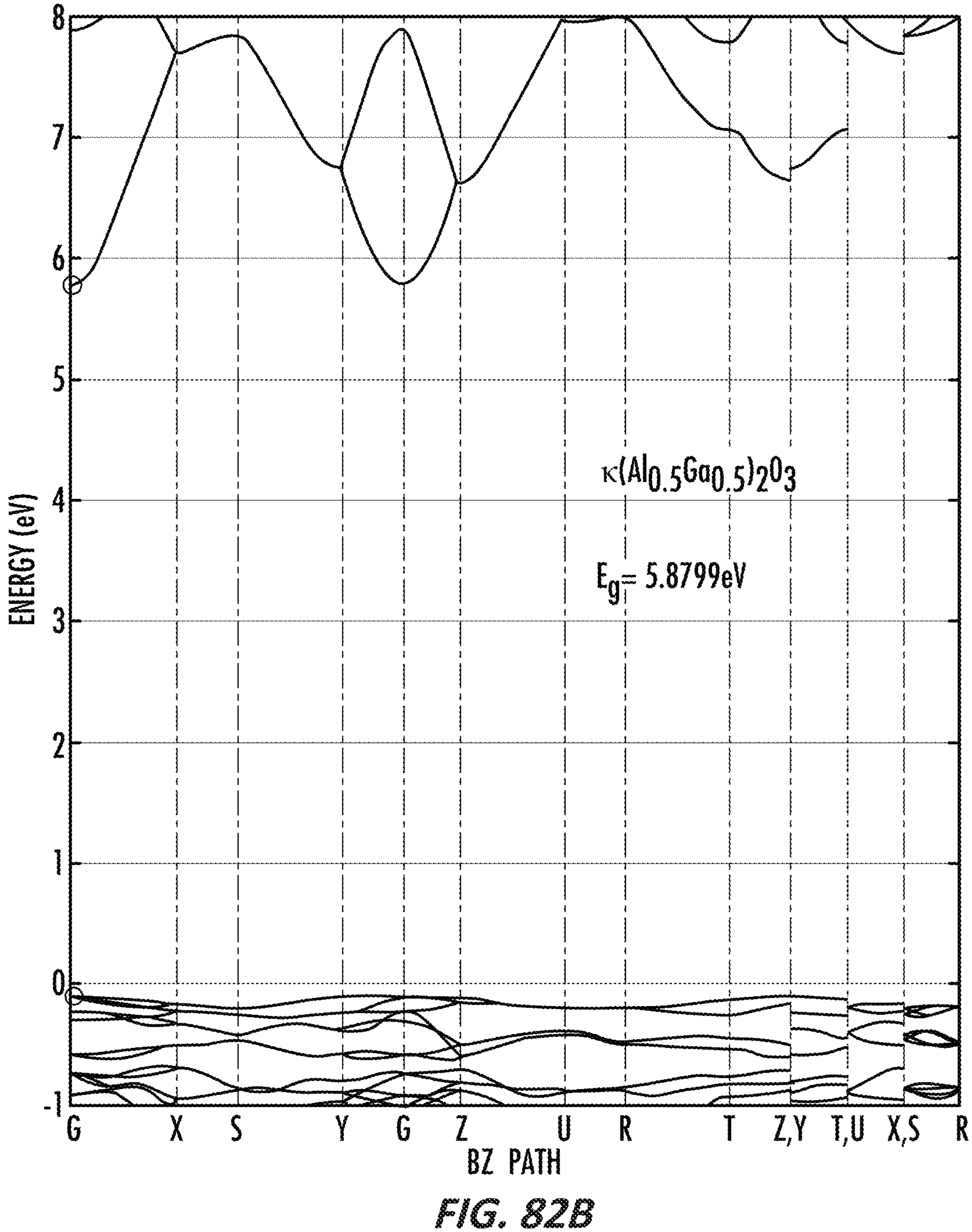
Figure 82C:
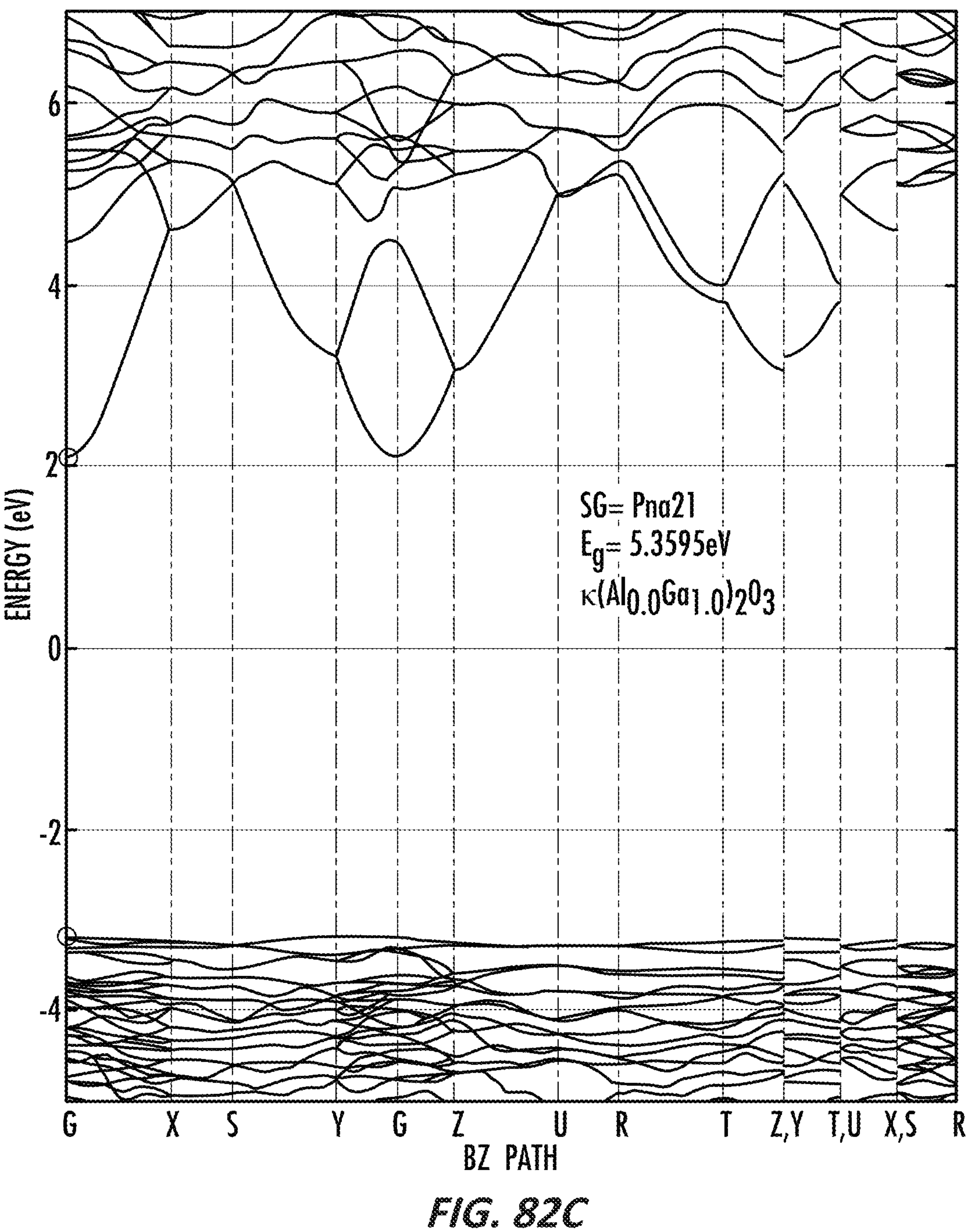
Figure 82D:
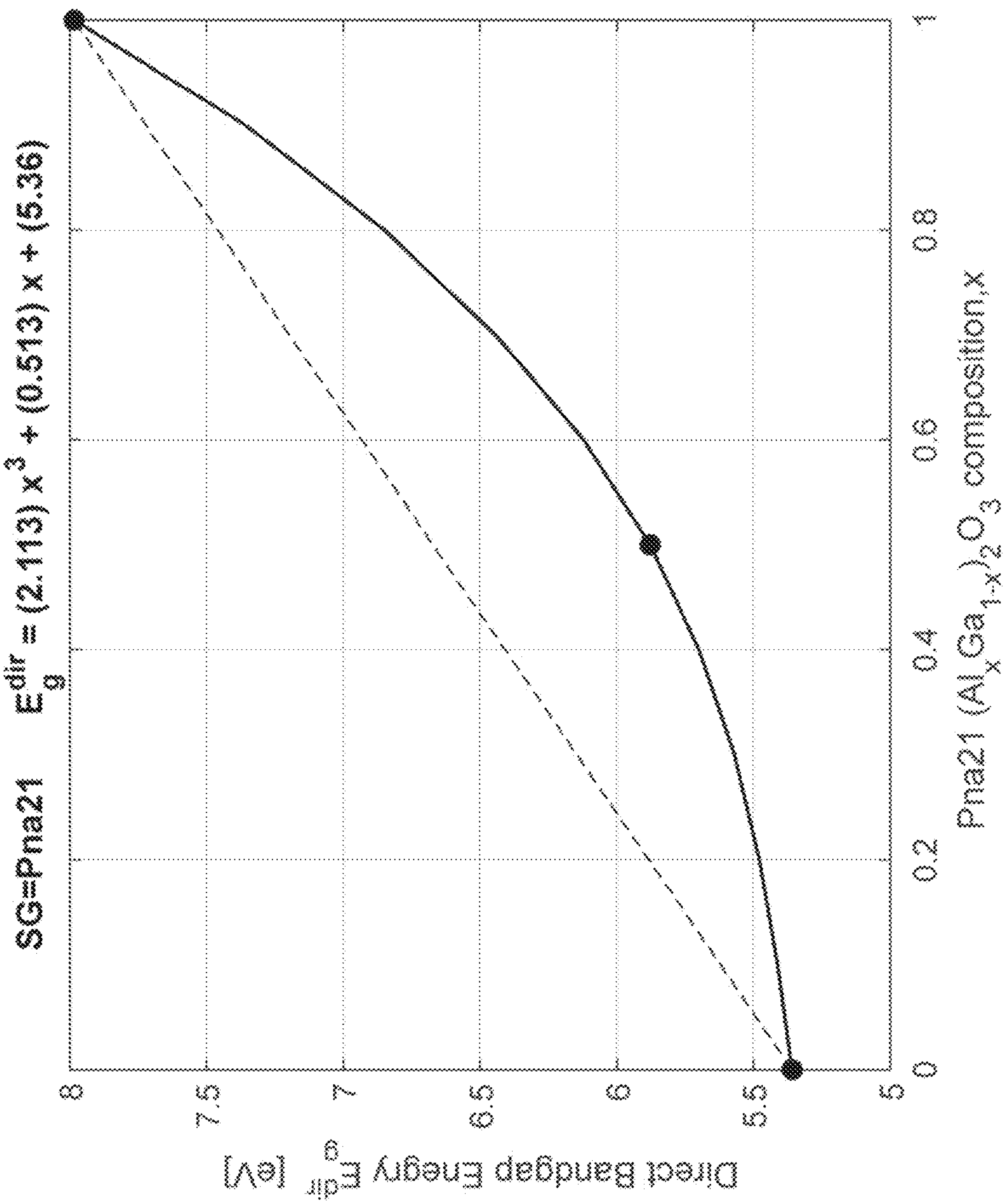
FIG. 82D shows the DFT calculated minimum bandgap energy of $\kappa$-$(Al_xGa_{1-x})_2O_3$, where x=1, 0.5 and 0, which shows the band bowing due to the polar nature of the materials.

FIGS. 82A-82C show DFT calculated band structures of κ-$(Al_xGa_{1-x})_2O_3$, where x=1, 0.5 and 0, respectively. FIG. 82D shows the DFT calculated minimum bandgap energy of κ-$(Al_xGa_{1-x})_2O_3$, where x=1, 0.5 and 0, which shows the band bowing due to the polar nature of the materials. For example, a high electron mobility transistor (HEMT) can be formed using κ-$(Al_xGa_{1-x})_2O_3$, where x is from 0 to 1 (e.g., in a κ-$(Al_xGa_{1-x})_2O_3$/κ-$(Al_yGa_{1-y})_2O_3$ heterostructure or superlattice, where x≠y). The estimated polarization charges derived from the calculated band structures can be used to design FET and HEMT devices. K—$(Al_xGa_{1-x})_2O_3$, where x is from 0 to 1, also has a direct bandgap and can therefore be used in optoelectronic devices such as sensors, LEDs and lasers.

Figure 83:
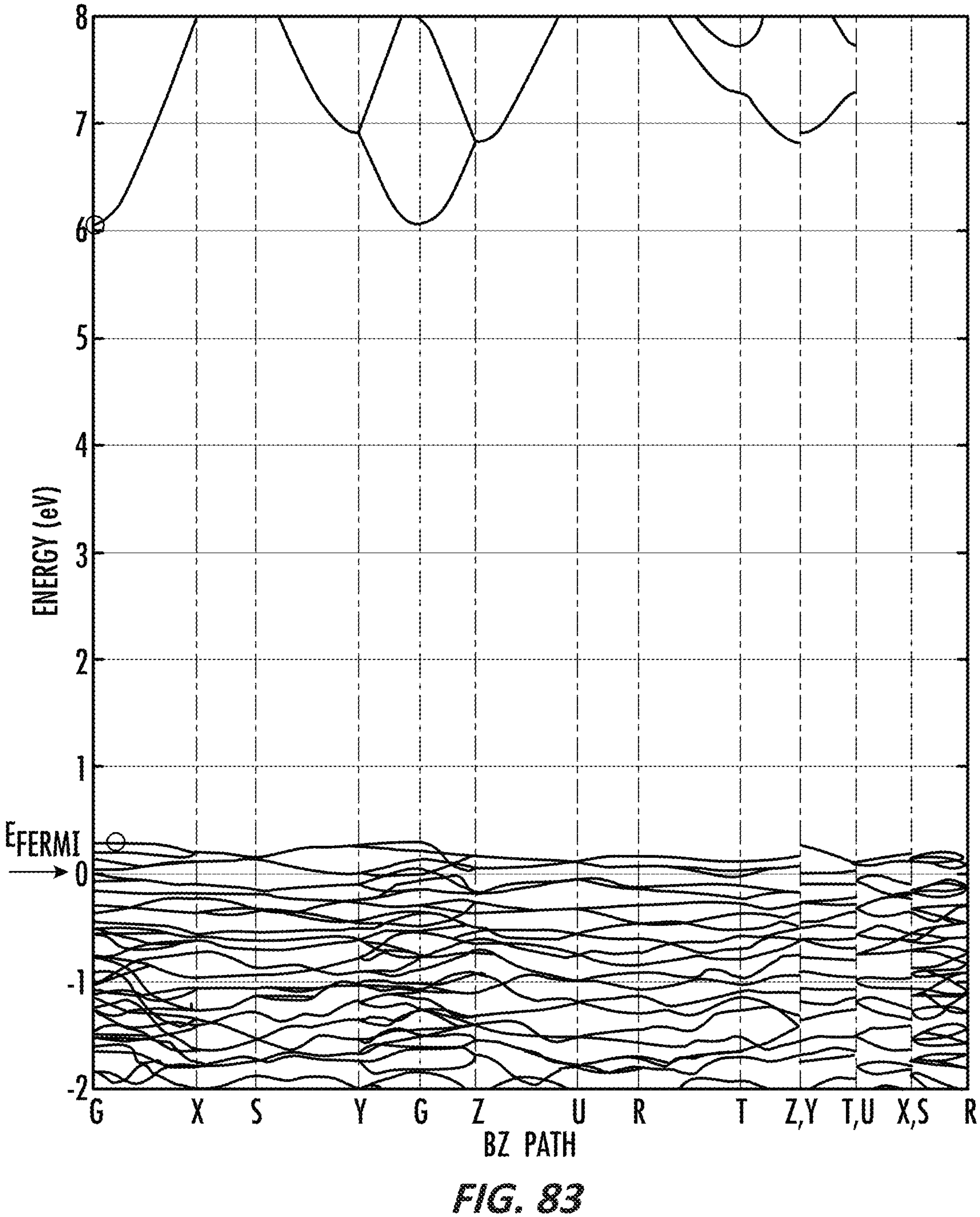
FIG. 83 shows a DFT calculated band structure of Li-doped $\kappa$-$Ga_2O_3$. The structure had one Ga atom replaced with a Li atom in each unit cell.

FIG. 83 shows a DFT calculated band structure of Li-doped κ-$Ga_2O_3$. The structure had one Ga atom replaced with a Li atom in each unit cell. The band structure indicates that Li doped the material p-type because the Fermi energy is below the valence band edge (i.e., maximum).

Figure 84:
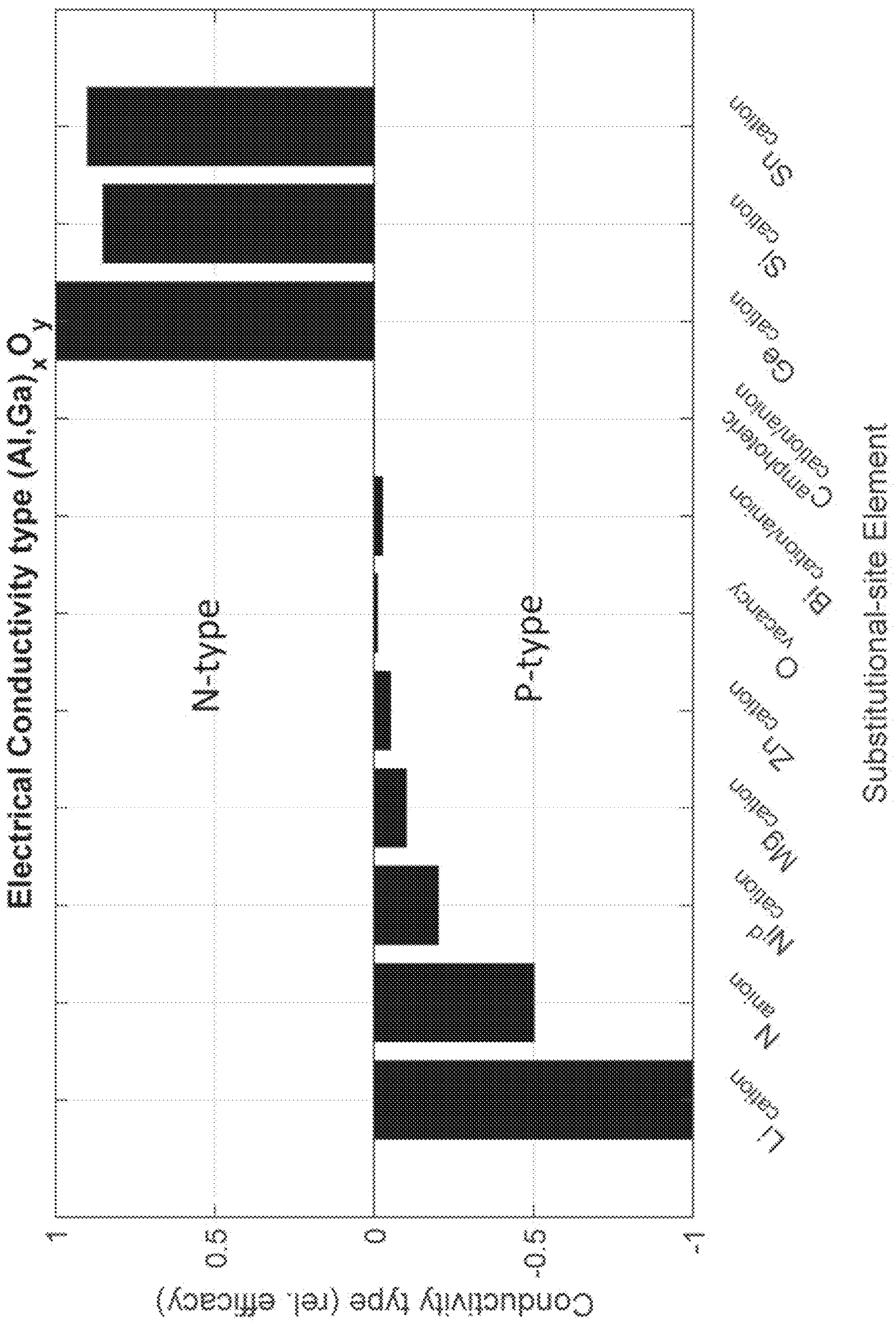
FIG. 84 shows a chart that summarizes the results from DFT calculated band structures of doped $\kappa$-$Ga_2O_3$ using different dopants.

FIG. 84 shows a chart that summarizes the results from DFT calculated band structures of doped κ-$Ga_2O_3$ using different dopants. The dopants listed can substitute for the cation (i.e., Al and/or Ga) or the anion (i.e., O), or the dopant can be a vacancy in the crystal, as noted in the figure. The relative efficacy is also shown, which indicates how strongly the dopant will affect the conductivity of the κ-$Ga_2O_3$.

Figure 85:
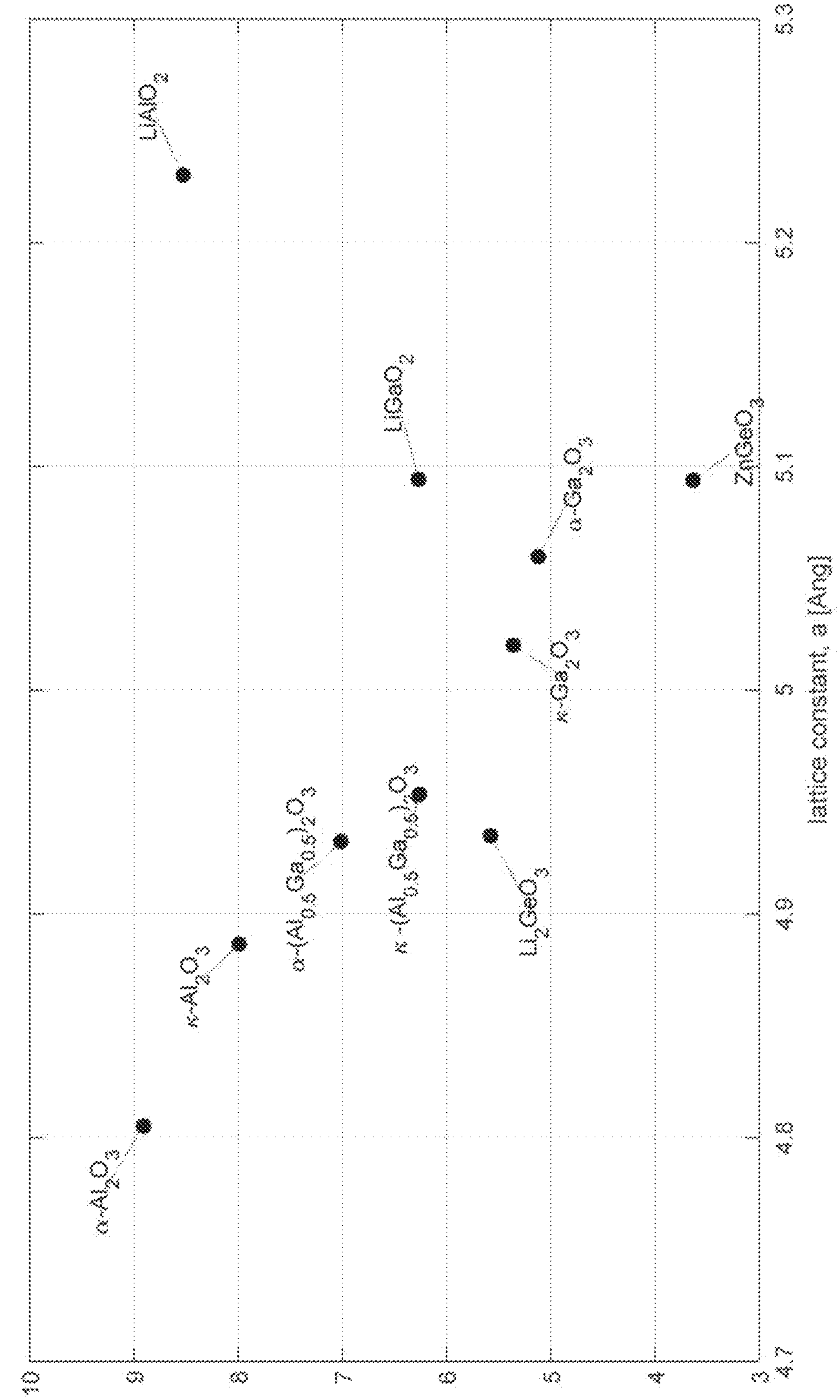
FIG. 85 shows some DFT calculated epitaxial oxide materials with lattice constants from about 4.8 Angstroms to about 5.3 Angstroms, that can be substrates for, and/or form heterostructures with, $\alpha$- and $\kappa$-$Al_xGa_{1-x}O_y$, such as $LiAlO_2$ and $Li_2GeO_3$.

FIG. 85 shows some DFT calculated epitaxial oxide materials with lattice constants from about 4.8 Angstroms to about 5.3 Angstroms, that can be substrates for, and/or form heterostructures with, α- and κ-$Al_xGa_{1-x}O_y$, such as $LiAlO_2$ and $Li_2GeO_3$.

FIG. 86 shows some additional DFT calculated epitaxial oxide materials with lattice constants from about 4.8 Angstroms to about 5.3 Angstroms, that can be substrates for, and/or or form heterostructures with, α- and κ-$Al_xGa_{1-x}O_y$, including α-$SiO_2$, $Al(111)_{2x3}$ (i.e., six atoms of Al(111) forming a 2×3 sub-array have an acceptable lattice mismatch with one unit cell of κ-$Al_xGa_{1-x}O_y$), and $AlN(100)_{1x4}$.

Figure 87A:
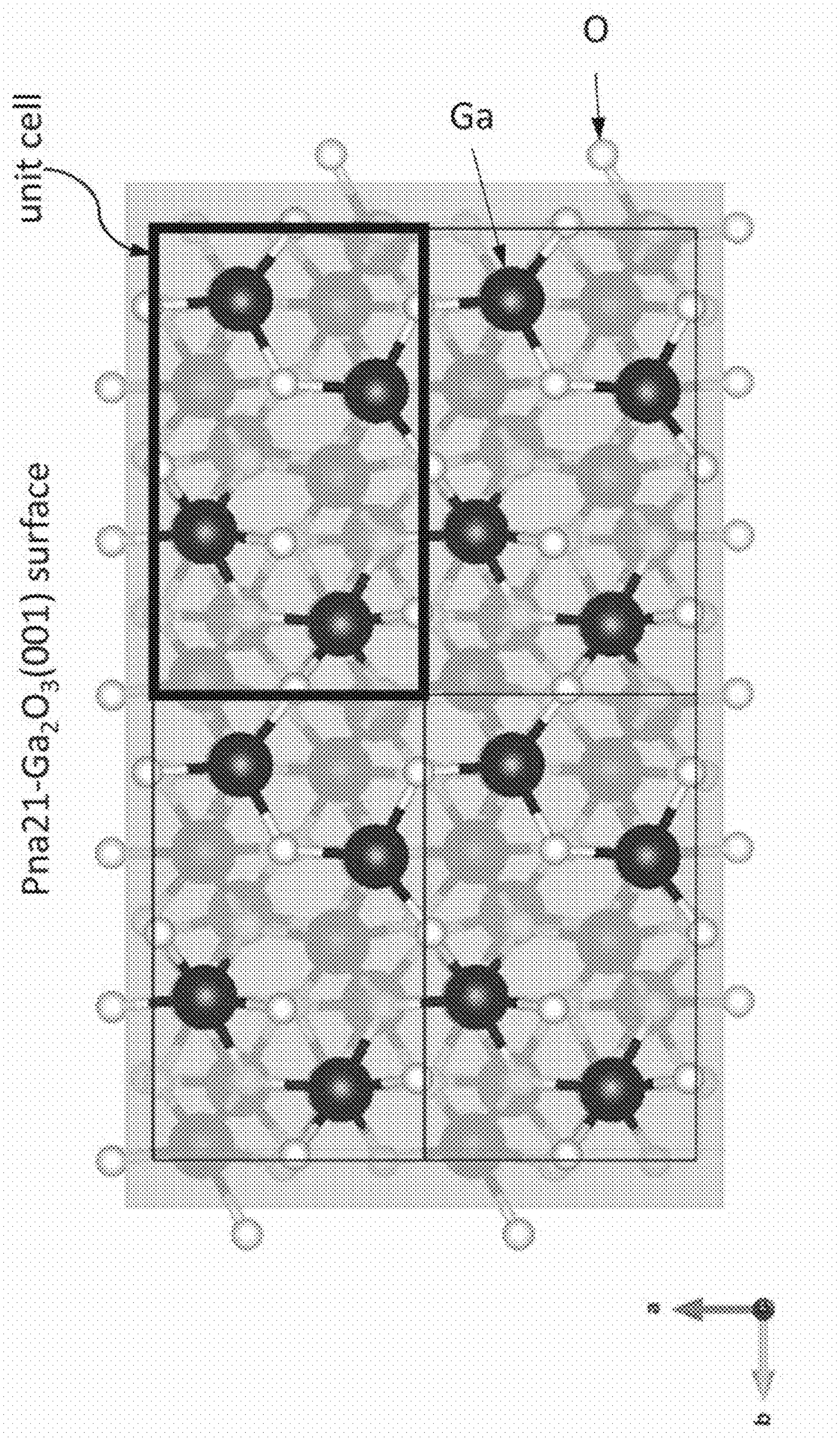
Figure 87B:
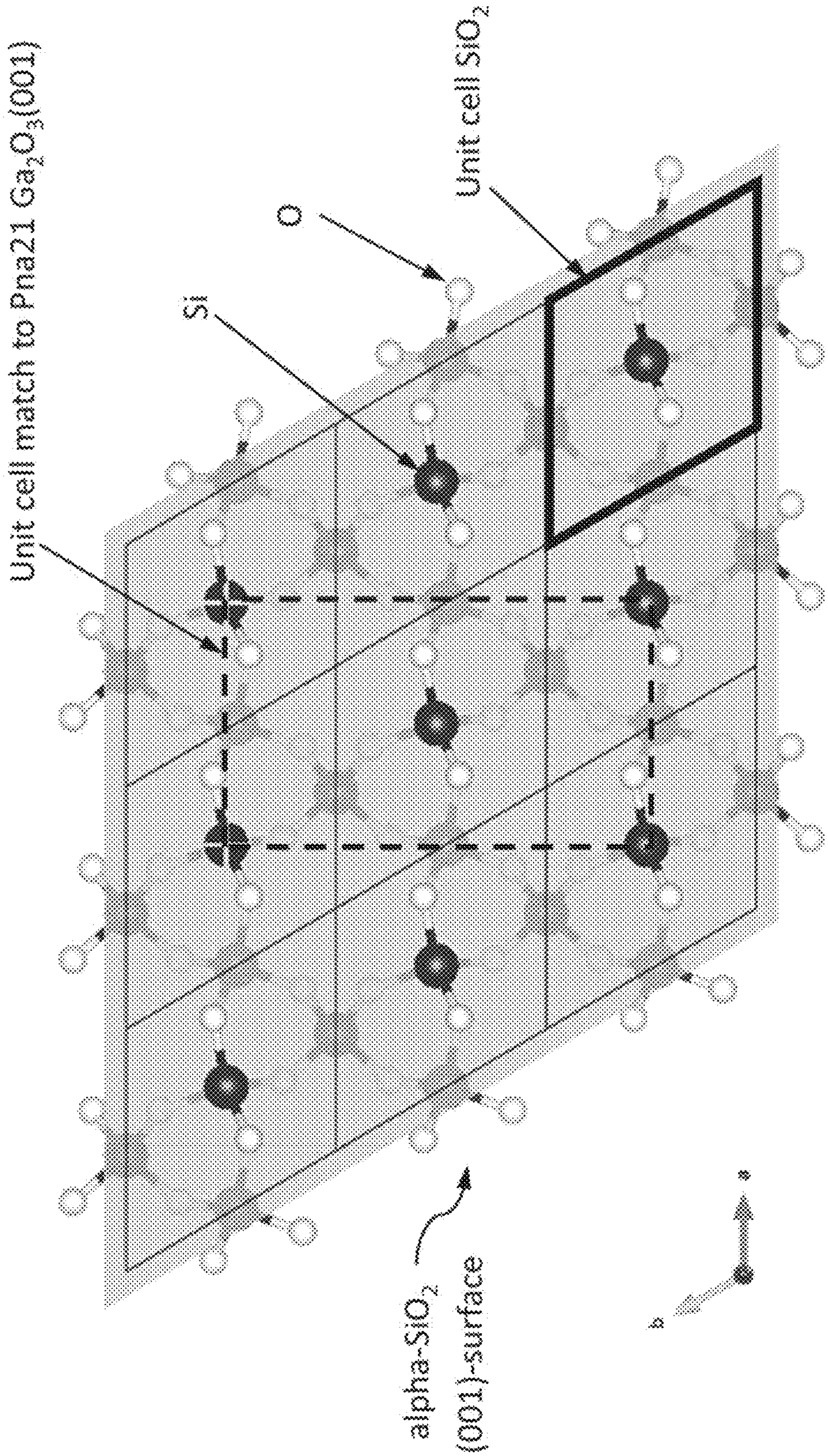
Figure 87C:
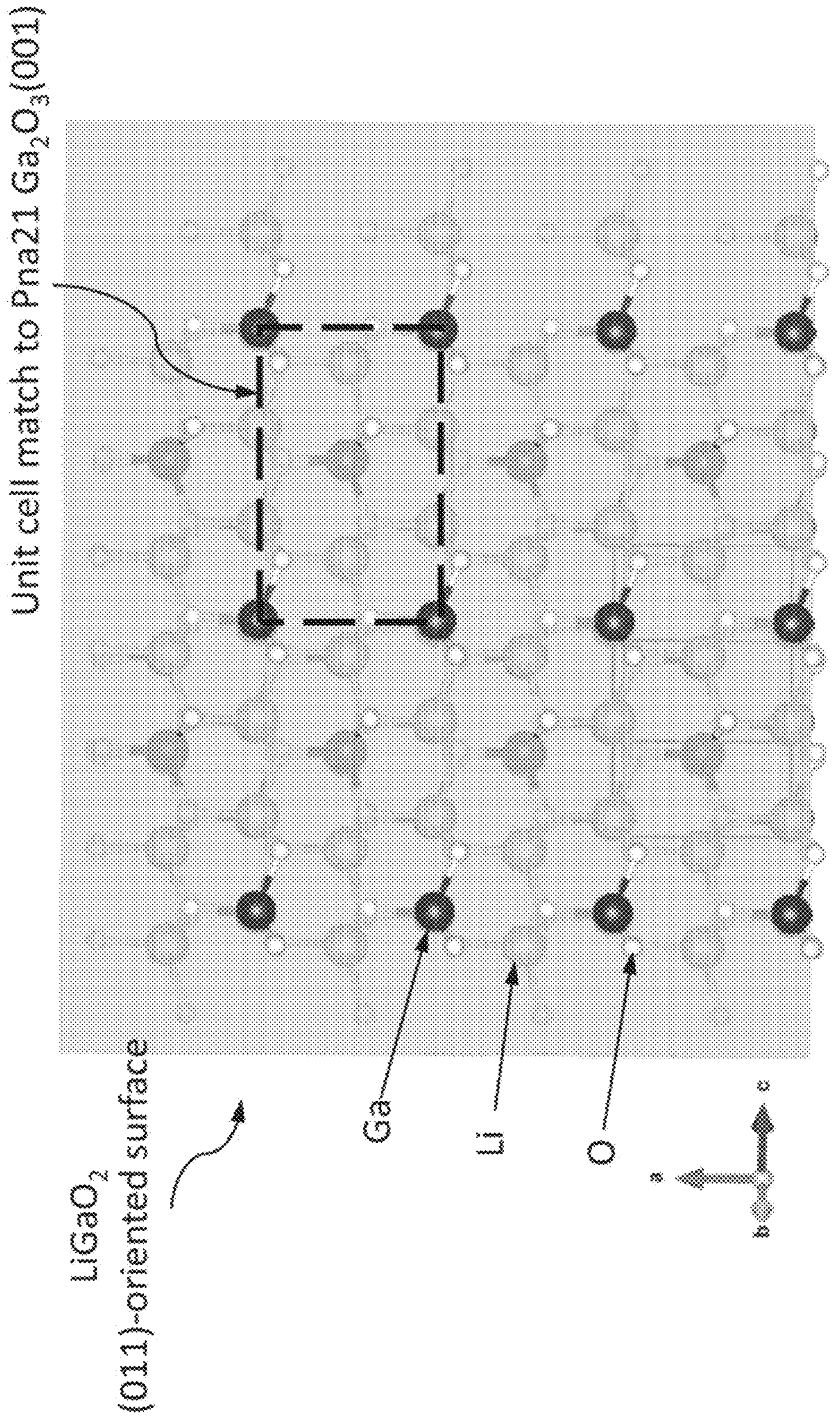
Figure 87D:
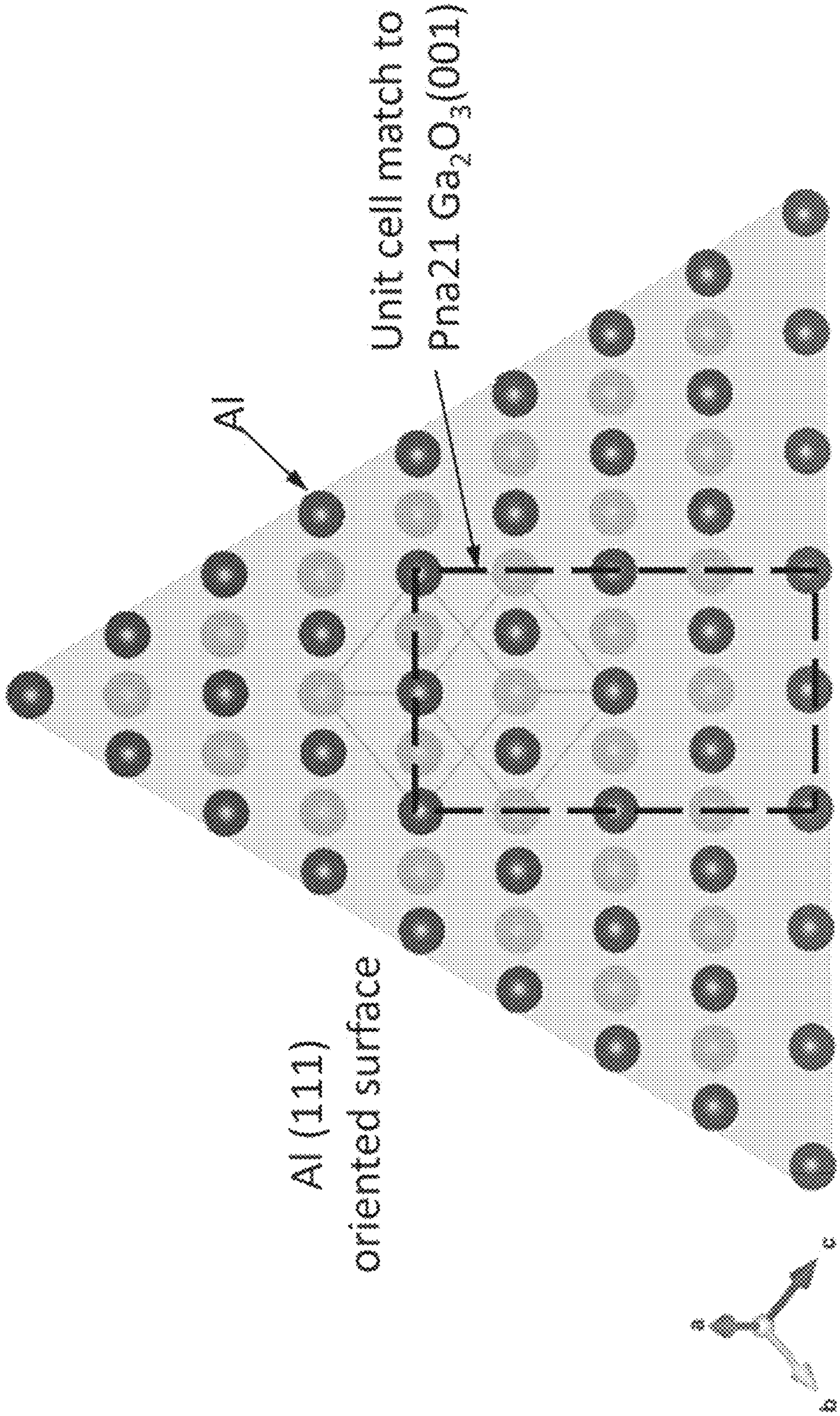
Figure 87E:
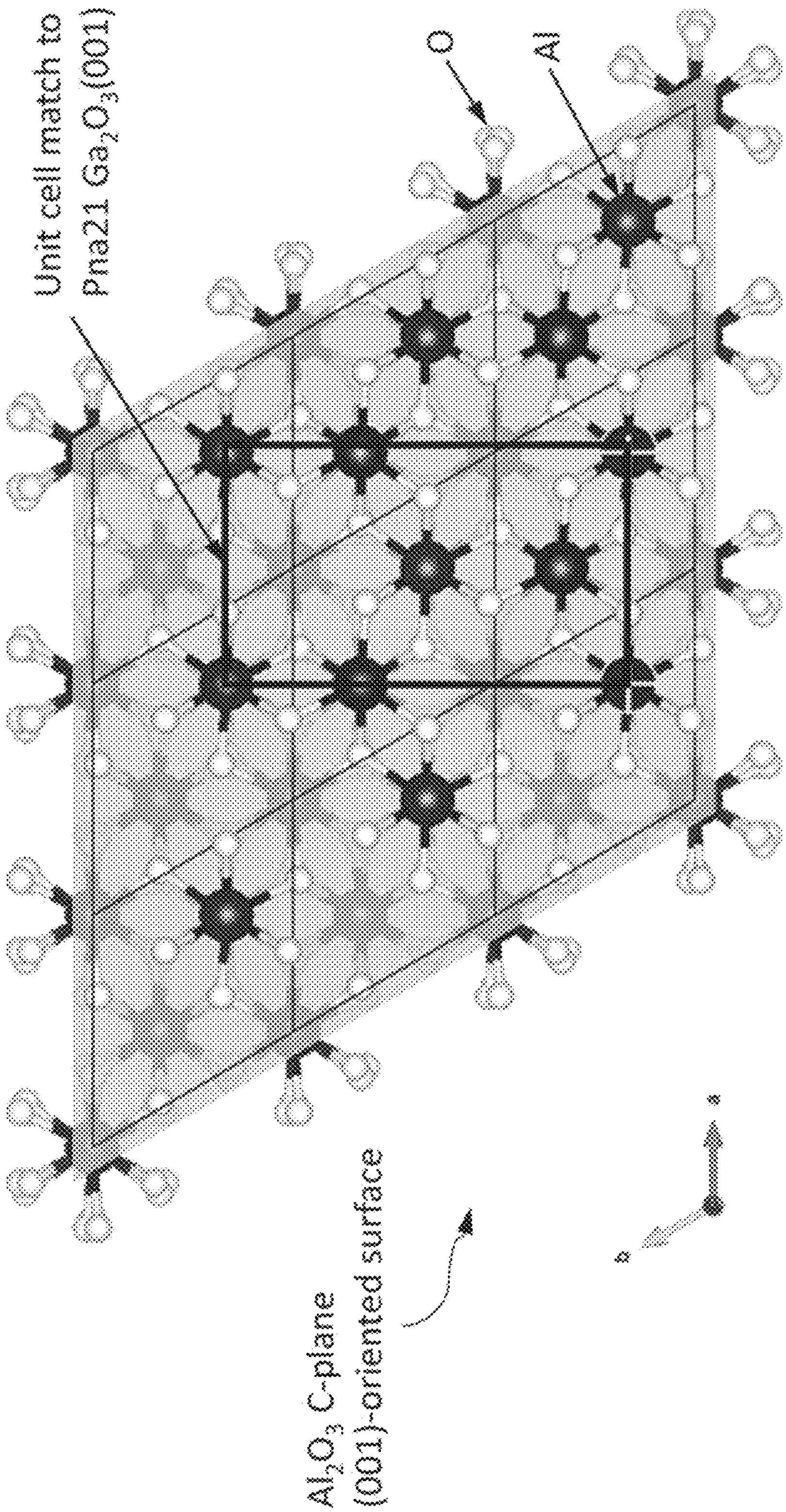

FIGS. 87A-87E show atomic structures at surfaces of κ-$Ga_2O_3$ and some compatible substrates. FIG. 87A shows the rectangular array of atoms in the unit cells at the (001) surface of κ-$Ga_2O_3$. FIG. 87B shows the surface of α-$SiO_2$, with the rectangular unit cell of κ-$Ga_2O_3$(001) overlayed. FIG. 87C shows the surface of $LiGaO_2$(011), with the rectangular unit cell of κ-$Ga_2O_3$(001) overlayed. FIG. 87D shows the surface of Al(111), with the rectangular unit cell of κ-$Ga_2O_3$(001) overlayed. FIG. 87E shows the surface of α-$Al_2O_2$(001) (i.e., C-plane sapphire), with the rectangular unit cell of κ-$Ga_2O_3$(001) overlayed.

FIG. 88 shows a flowchart of an example method for forming a semiconductor structure comprising κ-$Al_xGa_{1-x}O_y$. The substrate is prepared, the surface is terminated in Al (at a temperature above 800° C.), then the temperature is dropped to below 30° C. in an ultra-high vacuum (UHV) environment, and a thin (e.g., 10 nm to 50 nm) layer of Al(111) is formed. The temperature is then increased to the growth temperature of the κ-$Al_xGa_{1-x}O_y$, and layers of different compositions can be grown (e.g., in alternating structures to form superlattices), and then the substrate is cooled.

FIGS. 89A-89C are plots of XRD intensity versus angle (in an Ω-2θ scan) for experimental structures. FIG. 89A shows two overlayed scans, one of κ-$Al_2O_3$ grown on an Al(111) template, and the other of κ-$Al_2O_3$ grown on a Ni(111) template. FIG. 89B shows two overlayed scans (shifted in the y-axis) of the structures shown, one including a κ-$Ga_2O_3$ layer grown on an α-$Al_2O_3$ substrate with an Al(111) template layer, and the other a β-$Ga_2O_3$ layer grown on an α-$Al_2O_3$ substrate without a template layer. FIG. 89C shows the two overlayed scans from FIG. 89B in high resolution where the fringes due to the high quality and flatness of the layers at the atomic interfaces was observed.

FIGS. 90A-90I show examples of semiconductor structures 6201-6209 comprising epitaxial oxide materials in layers or regions. Each of the semiconductor structures 6201-6209 comprises a substrate 6200*a*-I and a buffer layer on the substrate 6210*a-i*. The semiconductor structures 6201-6209 also comprise epitaxial oxide layer 6220*a-i* formed on buffer layers 6210*a-i*. Similarly numbered layers in structures 6201-6209 are the same as, or similar to, layers in other structures 6201-6209. For example, layers 6230*b*, 6230*c*, 6230*d*, etc. are the same as, or similar to, each other. The epitaxial oxide layers of semiconductor structures 6201-6209 can comprise any epitaxial oxide materials described herein, such as any of those with compositions and crystal symmetries shown in the charts and table in FIGS. 76A-1 through 76D.

Substrate 6200*a-i* can be any crystalline material compatible with an epitaxial oxide material described herein. For example, substrate 6200*a-i* can be $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where 0≤x≤1, 1≤y≤3, and 2≤z≤4 (any crystal symmetry), $MgF_2$, $LaAlO_3$, $TiO_2$, or quartz.

Buffer layer 6210*a-i* can be any epitaxial oxide material described herein. For example, buffer 6210*a-i* can be a material that is the same as the material of the substrate, or the same as a material of a layer to be grown subsequently (e.g., layer 6220*a-i*). In some cases, buffer layer 6210*a-i* comprises multiple layers, a superlattice, and/or a gradient in composition. Superlattices and/or compositional gradients can in some cases be used to reduce the concentration of defects (e.g., dislocations or point defects) in the layer(s) of the semiconductor structure above the buffer layer (i.e., in a direction away from the substrate). In some cases, a buffer layer 6210*a-i* with a gradient in composition can be used to reset the lattice constant upon which the subsequent epitaxial oxide layers are formed. For example, a substrate 6200*a-i* can have a first in-plane lattice constant, a buffer layer 6210*a-i* can have a gradient in composition such that it starts with the first in-plane lattice constant of the substrate and ends with a second in-plane lattice constant, and a subsequent epitaxial oxide layer 6220*a-i* (formed on the buffer layer) can have the second in-plane lattice constant.

Epitaxial oxide layer 6220*a-i* can, in some cases, be doped and have an n-type or p-type conductivity. The dopant can be incorporated through co-deposition of an impurity dopant, or an impurity layer can be formed adjacent to epitaxial oxide layer 6220*a-i*. In some cases, epitaxial oxide layer 6220*a-i* is a polar piezoelectric material and is doped n-type or p-type via spontaneous or induced polarization doping.

Structure 6201 in FIG. 90A can have a subsequent epitaxial oxide layer, fluoride layer, nitride layer, and/or a metal layer formed on top (i.e., away from the substrate 6200*a-i*) of layer 6220*a*. For example, a metal layer can be formed on epitaxial oxide layer 6220*a* to form a Schottky barrier between epitaxial oxide layer 6220*a* and the metal (e.g., see FIG. 55 where the extrema for creating p-type and n-type electrical contacts are shown). Some examples of medium work function metals that can be used to form a Schottky barrier include Al, Ti, Ti—Al alloys, and titanium nitride (TiN). In other examples, the metal can form an ohmic (or low resistance) contact to epitaxial oxide layer 6220*a*. Some examples of high work function metals that can be used in ohmic (or low resistance) contacts to a p-type epitaxial oxide layer 6220*a* are Ni, Os, Se, Pt, Pd, Ir, W, Au and alloys thereof. Some examples of low work function materials that can be used in ohmic (or low resistance) contacts to an n-type epitaxial oxide layer 6220*a* are Ba, Na, Cs, Nd and alloys thereof. However, in some cases, Al, Ti, Ti—Al alloys, and titanium nitride (TiN) being common metals can also be used as contacts to an n-type epitaxial oxide layer (e.g., 6220*a*). In some cases, the metal contact layer can contain 2 or more layers of metals with different compositions (e.g., a Ti layer and an Al layer).

Structures 6202-6208 in FIGS. 90B-90H further include epitaxial oxide layer 6230*b-h*. In some cases, epitaxial oxide layer 6230*b-h* is not intentionally doped. In some cases, epitaxial oxide layer 6230*b-h* is doped and has an n-type or p-type conductivity (e.g., as described for layer 6220*a-i*). In some cases, epitaxial oxide layer 6230*b-h* is doped and has an opposite conductivity type as epitaxial oxide layer 6220*b-h* to form a p-n junction. For example, epitaxial oxide layer 6220*b-h* can have n-type conductivity and epitaxial oxide layer 6230*b-h* can have p-type conductivity. Alternatively, epitaxial oxide layer 6220*b-h* can have p-type conductivity and epitaxial oxide layer 6230*b-h* can have n-type conductivity.

In structure 6202, in some cases, a metal layer can be formed on epitaxial oxide layer 6220*a* to form an ohmic (or low resistance) contact to epitaxial oxide layer 6230*b*. Some examples of high work function metals that can be used in ohmic (or low resistance) contacts to a p-type epitaxial oxide layer 6230*b* are Ni, Os, Se, Pt, Pd, Ir, W, Au and alloys thereof. Some examples of low work function materials that can be used in ohmic (or low resistance) contacts to an n-type epitaxial oxide layer 6230*b* are Ba, Na, Cs, Nd and alloys thereof. However, in some cases, Al, Ti, Ti—Al alloys, and titanium nitride (TiN) being common metals can also be used as contacts to an n-type epitaxial oxide layer (e.g., 6220*a*). In some cases, the metal contact layer can contain 2 or more layers of metals with different compositions (e.g., a Ti layer and an Al layer).

In an example of structure 6202, substrate 6200*b* is MgO or $\gamma$-$Ga_2O_3$ (i.e., $Ga_2O_3$ with an Fd3m space group), or $\gamma$-$Al_2O_3$ (i.e., $Al_2O_3$ with an Fd3m space group). Epitaxial oxide layer 6220*b* is $\gamma$-$(Al_xGa_{1-x})_2O_3$ with an Fd3m space group, where $0 \leq x \leq 1$ (or $\gamma$-$(Al_xGa_{1-x})_yO_z$, where $0 \leq x \leq 1$, $1 \leq y \leq 3$, and $2 \leq z \leq 4$), and has n-type conductivity. Epitaxial oxide layer 6230*b* is $\gamma$-$(Al_yGa_{1-y})_2O_3$ with an Fd3m space group, where $0 \leq y \leq 1$, and has p-type conductivity. In some cases, x and y are the same and the p-n junction is a homojunction, and in other cases x and y are different and the p-n junction is a heterojunction. A metal contact layer (e.g., Al, Os or Pt) can be formed to make an ohmic contact with epitaxial oxide layer 6230*b*. A second contact layer (e.g., containing Ti and/or Al, and or layers of Ti and Al) can be formed making contact to the substrate 6200*b* and/or epitaxial oxide layer 6220*b*. Such a semiconductor structure with metal contacts can be used as a diode in an optoelectronic device, such as an LED, laser or photodetector. In the case of optoelectronic devices, one or both of the metal contacts formed can be patterned (e.g., to form one or more exit apertures) to allow light to escape the semiconductor structure. In some cases, one or both contacts are reflective or partially reflective to improve the light extraction from the semiconductor structure, for example to form a resonant cavity, or redirect emitted light (e.g., towards one or more exit apertures).

Structure 6203 further includes epitaxial oxide layer 6240*c*. In some cases, epitaxial oxide layer 6240*c* is doped and has an n-type or p-type conductivity (e.g., as described for layer 6220*a-i*). In some cases, epitaxial oxide layer 6230*c* is not intentionally doped, and epitaxial oxide layer 6240*c* is doped and has an opposite conductivity type as epitaxial oxide layer 6220*c* to form a p-i-n junction.

In structure 6203, in some cases, a metal layer can be formed on epitaxial oxide layer 6240*c* to form an ohmic (or low resistance) contact to epitaxial oxide layer 6240*c* and on the substrate 6200*c* (and/or epitaxial oxide layer 6220*c*) using appropriate high or low work function metals (as described above).

In structure 6204 epitaxial oxide layer 6220*d* has a gradient in composition (as indicated by the double arrow), wherein the composition can change monotonically in either direction, or in both directions, or non-monotonically. In some cases, epitaxial oxide layer 6220*d* is doped and has an n-type or p-type conductivity (e.g., as described for layer 6220*a-i*). In some cases, epitaxial oxide layer 6230*d* is doped and has an opposite conductivity type as epitaxial oxide layer 6220*d* to form a p-n junction.

In structure 6204, in some cases, a metal layer can be formed on epitaxial oxide layer 6230*d* to form an ohmic (or low resistance) contact to epitaxial oxide layer 6230*d* and on the substrate 6200*d* (and/or epitaxial oxide layer 6220*d*) using appropriate high or low work function metals (as described above).

In structure 6205 epitaxial oxide layer 6230*e* has a gradient in composition, wherein the composition can change monotonically in either direction, or in both directions (as indicated by the double arrow), or non-monotonically. In some cases, epitaxial oxide layer 6230*e* is not intentionally doped, epitaxial oxide layer 6220*e* has n-type or p-type conductivity, and epitaxial oxide layer 6240*e* has an opposite conductivity to epitaxial oxide layer 6220*e* to form a p-i-n junction with a graded i-layer.

In structure 6205, in some cases, a metal layer can be formed on epitaxial oxide layer 6240*e* to form an ohmic (or low resistance) contact to epitaxial oxide layer 6240*e* and on the substrate 6200*e* (and/or epitaxial oxide layer 6220*e*) using appropriate high or low work function metals (as described above).

In structure 6206 epitaxial oxide layer 6250*f* has a gradient in composition (as indicated by the double arrow), wherein the composition can change monotonically in either direction, or in both directions, or non-monotonically. In some cases, epitaxial oxide layer 6250*f* is doped and has n-type or p-type conductivity, epitaxial oxide layer 6240*f* is doped and has the same conductivity type as epitaxial oxide layer 6250*f*, epitaxial oxide layer 6230*f* is not intentionally doped, and epitaxial oxide layer 6240*f* has an opposite conductivity to epitaxial oxide layer 6220*f* to form a p-i-n junction with epitaxial oxide layer 6250*f* acting as a graded contact layer.

In structure 6206, in some cases, a metal layer can be formed on epitaxial oxide layer 6250*f* to form an ohmic (or low resistance) contact to epitaxial oxide layer 6250*f* and on the substrate 6200*f* (and/or epitaxial oxide layer 6220*f*) using appropriate high or low work function metals (as described above). In some cases, epitaxial oxide layer 6250*f* comprises a polar and piezoelectric material, and the graded composition of epitaxial oxide layer 6250*f* improves the properties (e.g., lowers the resistance) of the contact.

In structure 6207 epitaxial oxide layer 6230*g* has a quantum well or a superlattice (as indicated by the quantum well schematic in epitaxial oxide layer 6230*g*), or a multilayer structure with at least one narrower bandgap material layer that is sandwiched between two adjacent wider bandgap layers. In some cases, epitaxial oxide layer 6230$g$ is not intentionally doped, epitaxial oxide layer 6220$g$ has n-type or p-type conductivity, and epitaxial oxide layer 6240$g$ has an opposite conductivity to epitaxial oxide layer 6220$e$ to form a p-i-n junction with a graded i-layer. For example, the epitaxial oxide layer 6230$g$ can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

In structure 6207, in some cases, a metal layer can be formed on epitaxial oxide layer 6240$g$ to form an ohmic (or low resistance) contact to epitaxial oxide layer 6240$g$ and on the substrate 6200$g$ (and/or epitaxial oxide layer 6220$g$) using appropriate high or low work function metals (as described above).

In structure 6208 epitaxial oxide layer 6250$h$ has a quantum well or a superlattice, or a multilayer structure with at least one narrower bandgap material layer that is sandwiched between two adjacent wider bandgap layers. In some cases, epitaxial oxide layer 6250$h$ is a chirp layer with a multilayer structure with alternating narrower bandgap material layers and wider bandgap material layers and a composition variation (e.g., formed by varying the period of the narrower and wider bandgap layers). In some cases, epitaxial oxide layer 6250$h$ is doped and has n-type or p-type conductivity, epitaxial oxide layer 6240$h$ is doped and has the same conductivity type as epitaxial oxide layer 6250$h$, epitaxial oxide layer 6230$h$ is not intentionally doped, and epitaxial oxide layer 6240$h$ has an opposite conductivity to epitaxial oxide layer 6220$h$ to form a p-i-n junction with epitaxial oxide layer 6250$h$ acting as a graded contact layer. For example, the epitaxial oxide layer 6250$h$ can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

In structure 6208, in some cases, a metal layer can be formed on epitaxial oxide layer 6250$h$ to form an ohmic (or low resistance) contact to epitaxial oxide layer 6250$h$ and on the substrate 6200$h$ (and/or epitaxial oxide layer 6220$h$) using appropriate high or low work function metals (as described above). In some cases, epitaxial oxide layer 6250$h$ comprises a polar and piezoelectric material, and the graded composition of epitaxial oxide layer 6250$h$ improves the properties (e.g., lowers the resistance) of the contact.

In structure 6209 epitaxial oxide layer 6220$i$ has a quantum well or a superlattice, or a multilayer structure with at least one narrower bandgap material layer that is sandwiched between two adjacent wider bandgap layers. For example, epitaxial oxide layer 6220$i$ can comprise a digital alloy with alternating layers of epitaxial materials with different properties. Such an epitaxial oxide layer 6220$i$ can have optical and/or electrical properties that would otherwise not be compatible with a given substrate, for example. Digital alloy materials and structures are discussed further herein. For example, the epitaxial oxide layer 6220$i$ can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

FIGS. 90J-90L show examples of semiconductor structures 6201$b$-6203$b$ comprising epitaxial oxide materials in layers or regions. Similarly, numbered layers in structures 6201$b$-6203$b$ are the same as, or similar to, layers in structures 6201-6209.

Semiconductor structure 6201$b$ shows an example where there are three adjacent superlattices and/or chirp layers 6220$j$, 6230$j$, and 6240$j$ (which are similar to layers 6220$i$, 6230$g$ and 6250$h$, respectively, in FIGS. 90G-90I) comprising epitaxial oxide materials and forming different possible doping profiles, such as p-i-n, p-n-p, or n-p-n. For example, epitaxial oxide layer(s) 6220$j$, 6230$j$ and/or 6240$j$ can comprise digital alloy(s) with alternating layers of epitaxial materials with different properties. Such epitaxial oxide layer(s) 6220$j$, 6230$j$ and/or 6240$j$ comprising digital alloys can have optical and/or electrical properties that would otherwise not be compatible with a given substrate.

Semiconductor structure 6202$b$ shows an example where there are two adjacent superlattices and/or layers 6220$k$ and 6230$k$ (which are similar to layers 6220$i$ and 6230$g$, respectively, in FIGS. 90I and 90G) and a layer 6240$k$ all comprising epitaxial oxide materials and forming different possible doping profiles, such as p-i-n, p-n-p, or n-p-n. For example, epitaxial oxide layer(s) 6220$k$ and/or 6230$k$ can comprise digital alloy(s) with alternating layers of epitaxial materials with different properties.

Semiconductor structure 6203$b$ shows an example where there are two superlattices and/or chirp layers 6230$l$ and 6240$l$ (which are similar to layers 6230$g$ and 6250$h$, respectively, in FIGS. 90G-90H) and a layer 6220$l$ all comprising epitaxial oxide materials and forming different possible doping profiles, such as p-i-n, p-n-p, or n-p-n. For example, epitaxial oxide layer(s) 6230$l$ and/or 6240$l$ can comprise digital alloy(s) with alternating layers of epitaxial materials with different properties.

Furthermore, the buffer layer 6210$j$-1 can comprise a superlattice or chirp layer, and also be adjacent to the other superlattices in some of the structures.

In some cases, any of structures 6201-6209 in FIGS. 90A-90I and structures 6201$b$-6203$b$ in FIGS. 90J-90L can have a subsequent epitaxial oxide layer, fluoride layer, nitride layer, and/or a metal layer formed on top (i.e., away from the substrate 6200$a$-$l$) of the topmost layer in the structure (e.g., layer 6230$b$ for structure 6202).

In some cases, any of structures 6201-6209 in FIGS. 90A-90I and structures 6201$b$-6203$b$ in FIGS. 90J-90L can further include one or more reflectors that are configured to reflect wavelengths of light that are generated by the semiconductor structure. For example, a reflector can be positioned between the buffer layer and the epitaxial oxide layer(s). For example, a reflector can be a distributed Bragg reflector, formed using the same epitaxial growth technique as the other epitaxial oxide layers in the semiconductor structure. In another example, a reflector can be formed on top of the semiconductor structure, opposite the substrate. For example, a reflective metal (e.g., Al or Ti/Al) can be used as a top contact and a reflector.

FIG. 91A is a schematic of an example of a semiconductor structure comprising epitaxial oxide layers on a suitable substrate. Alternating layers of epitaxial oxide semiconductors A and B are shown on the substrate. Additionally, the semiconductor structure in this example has a different epitaxial oxide layer C substituted for an epitaxial oxide layer A. In one example, the A layer could comprise $Mg(Al,Ga)_2O_4$, the B layer could comprise MgO, and the C layer would be $Mg_2GeO_4$ where the substrate could be MgO or $MgAl_2O_4$.

FIGS. 91B-91I show electron energy (on the y-axis) vs. growth direction (on the x-axis) for examples of epitaxial oxide heterostructures comprising layers of dissimilar epitaxial oxide materials.

Figure 91B:
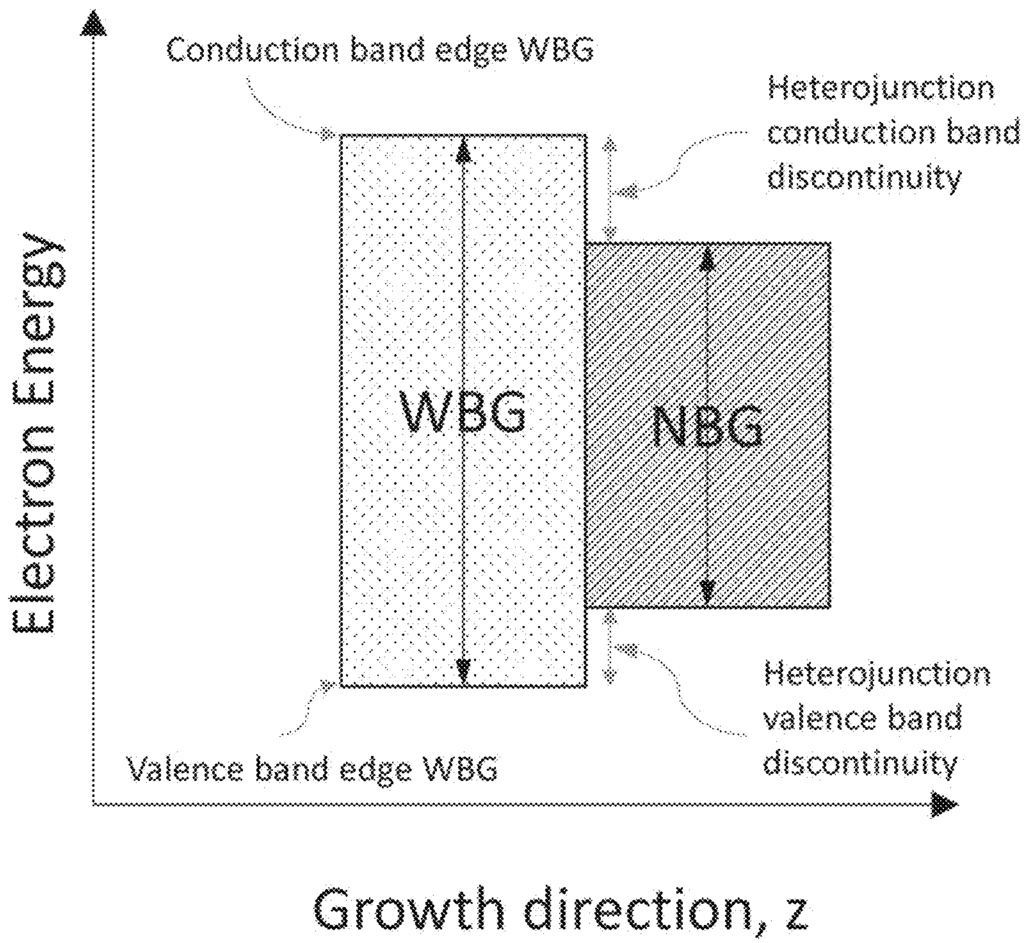

FIG. 91B shows an example of an epitaxial oxide heterostructure. The wider bandgap (WBG) material and the narrower bandgap (NBG) material in this example align such that there are heterojunction conduction band and valence band discontinuities, as shown. The band alignment in this example is a type I band alignment, but type II or type III band alignments are possible in other cases.

Figure 91C:
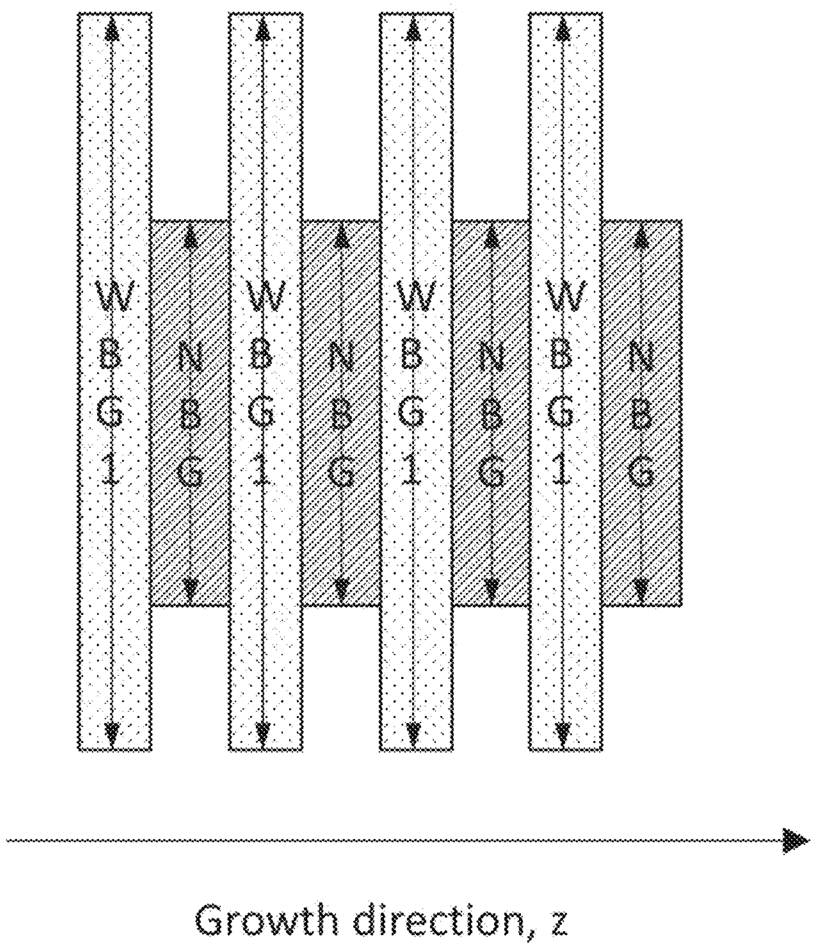

The structure shown in FIG. 91C is an example of an epitaxial oxide superlattice formed by repeating the structure of FIG. 91B four times along the growth direction "z." Other superlattices can contain fewer or more than 4 unit cells, for example, from 2 to 1000, from 10 to 1000, from 2 to 100, or from 10 to 100 unit cells. The structure of FIG. 91B is the unit cell of the epitaxial oxide superlattice shown in FIG. 91C. In some cases, a short period superlattice (or SPSL) can be formed if the layers of the unit cell of the superlattice are sufficiently thin (e.g., thinner than 10 nm, or 5 nm, or 1 nm).

Figure 91D:
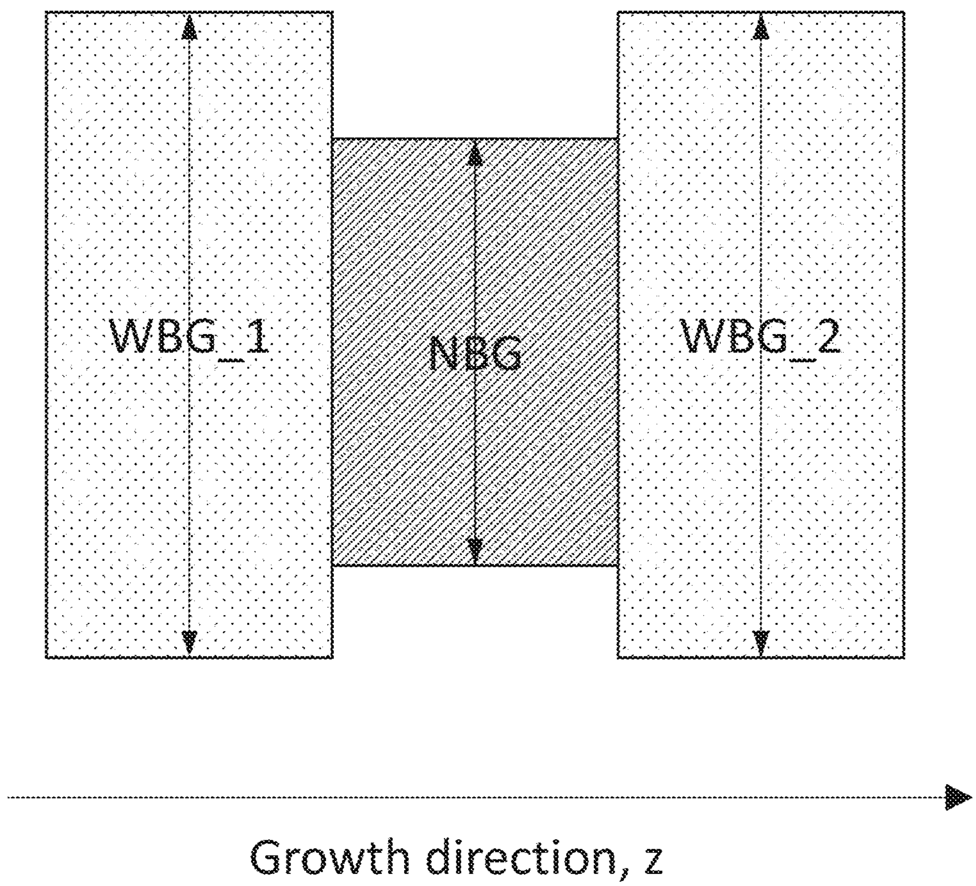

FIG. 91D shows an example of an epitaxial oxide double heterostructure with layers of a WBG material surrounding an NBG material, with type I band alignments. If the NBG material layer in this example were made sufficiently thin (e.g., below 10 nm, or below 5 nm, or below 1 nm) then the structure in FIG. 91D would comprise a single quantum well.

Figure 91E:
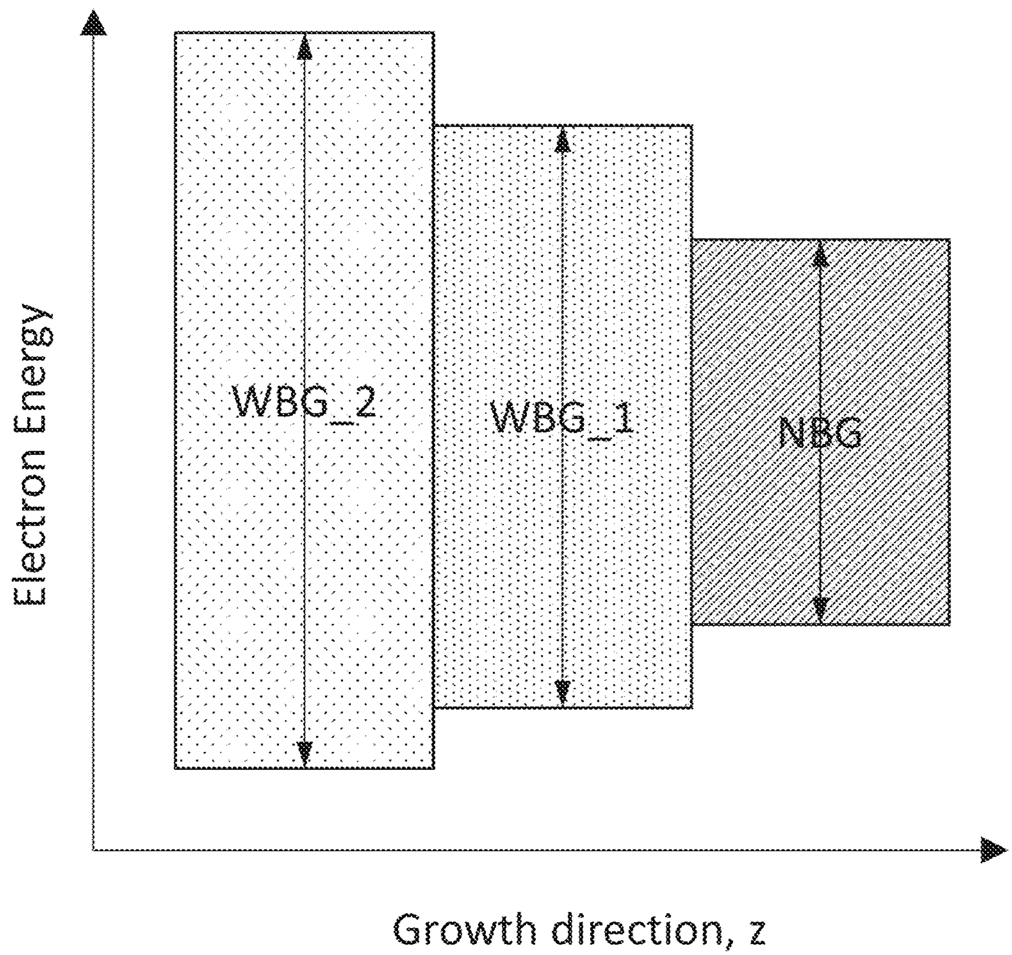

FIG. 91E shows an example of an epitaxial oxide heterostructure with three different materials, an NBG material and two wider bandgap materials WBG_1 and WBG_2. In this example, at both the interface between the NBG material and the WBG_1 material and at the interface between the WBG_1 material and the WBG_2 material, the epitaxial oxide layers align in a type I band alignment.

Figure 91F:
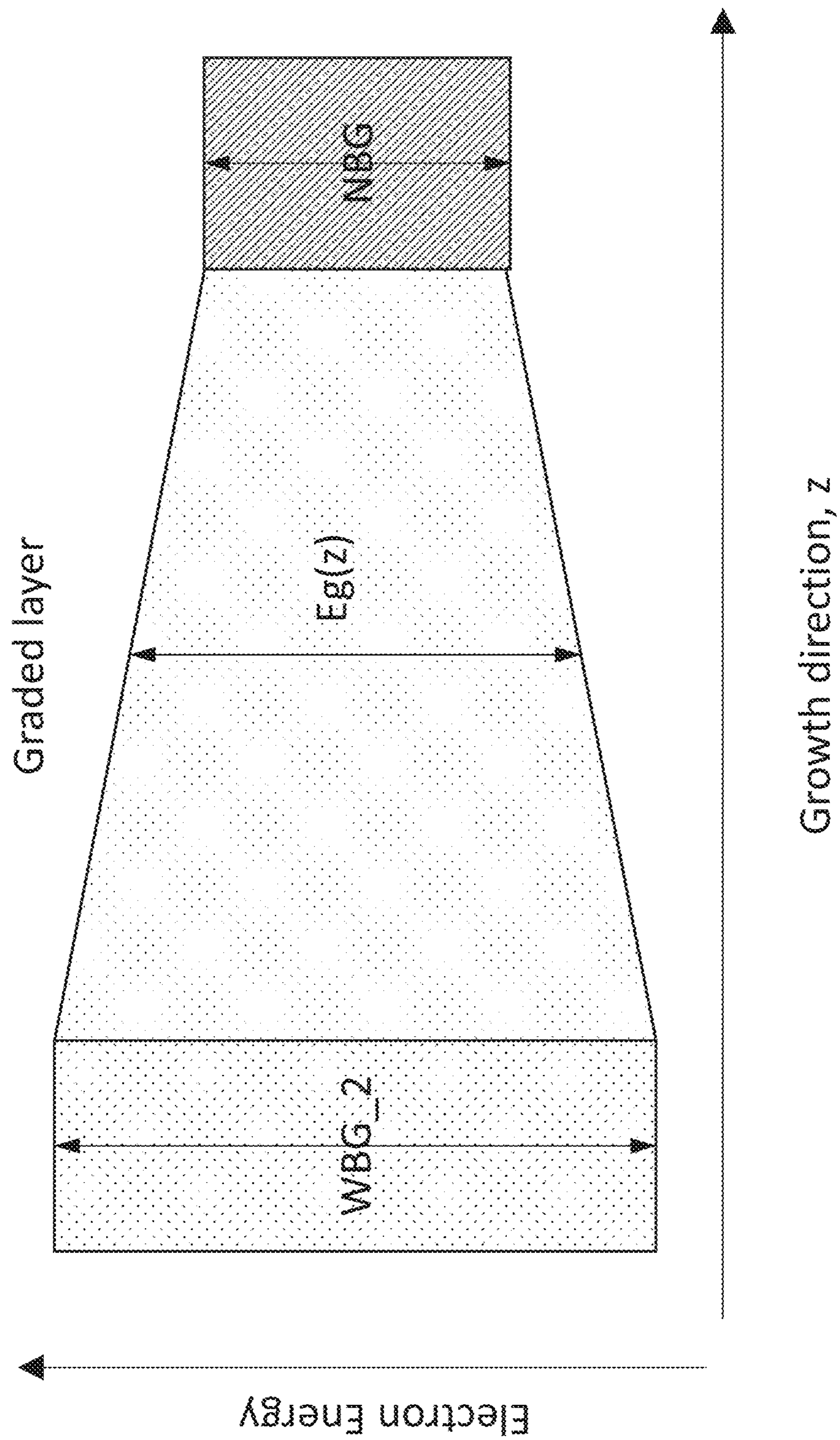

FIG. 91F shows an example of a WBG material WBG_2 and an NBG material coupled with a graded layer. The graded layer in this example has a changing bandgap Eg(z) formed by a changing average composition throughout the graded layer. The composition and bandgap of the graded layer in this example changes monotonically from those of the WBG_2 material to those of the NBG material, such that there are no (or small) bandgap discontinuities at the interfaces.

Figure 91G:
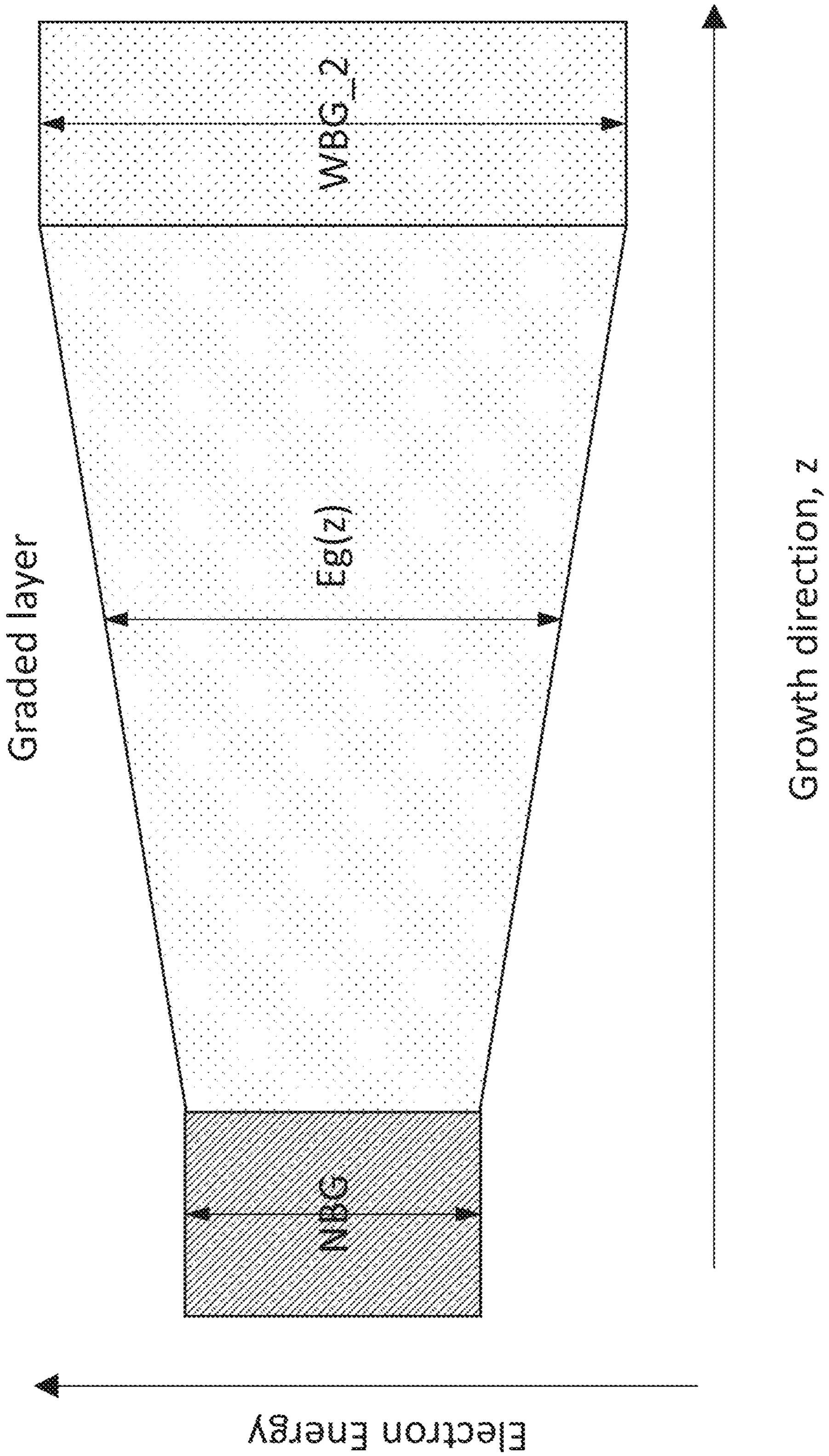

FIG. 91G shows an example of an NBG material and a WBG material WBG_2 coupled with a graded layer that is similar to the example shown in FIG. 91G except that the NBG material occurs before the WBG material (i.e., closer to the substrate) along the growth direction.

Figure 91H:
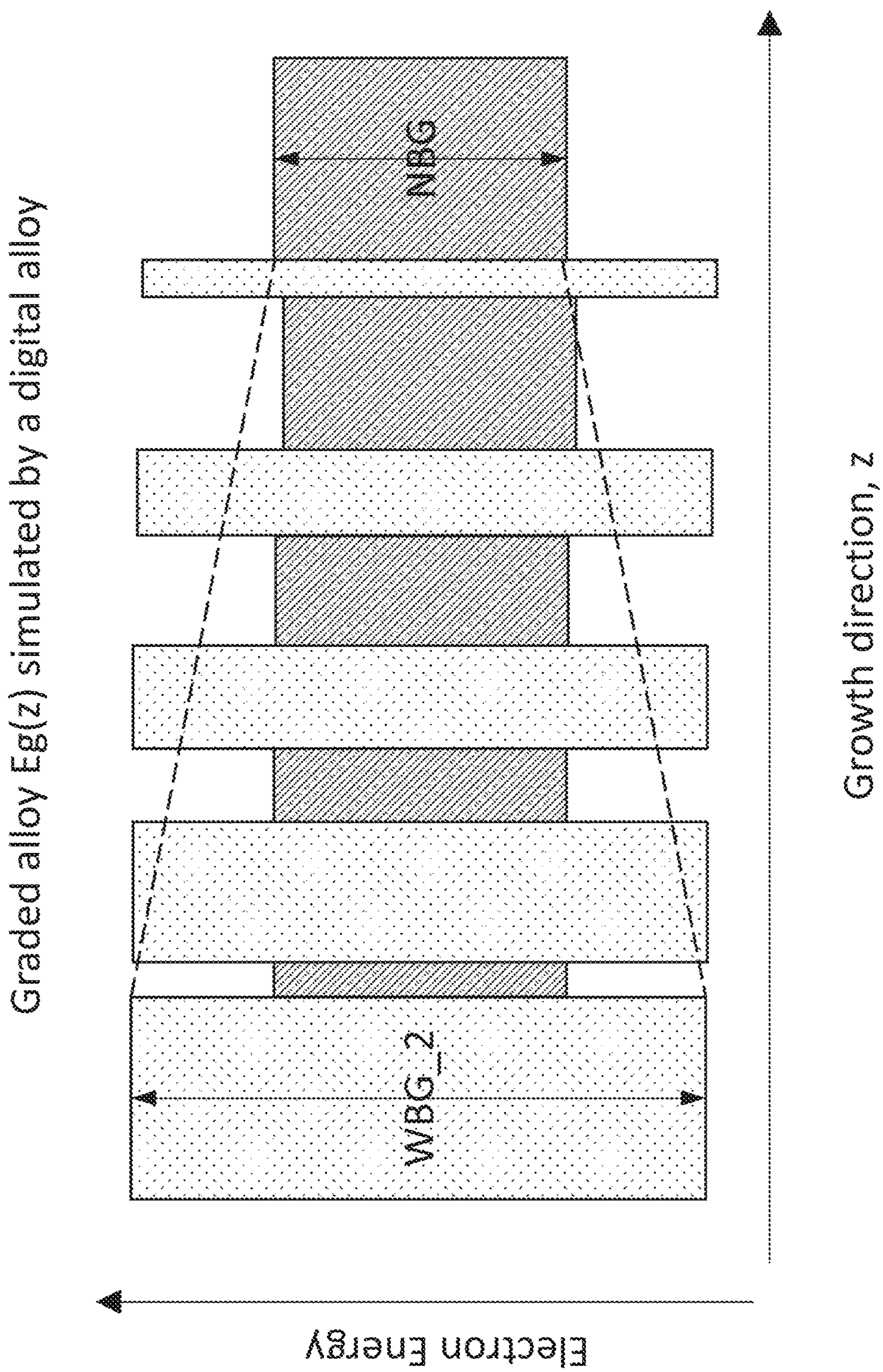

FIG. 91H shows an example of a WBG material WBG_2 and an NBG material coupled with a chirp layer. The chirp layer in this example comprises a multilayer structure of epitaxial oxide materials with alternating layers of a WBG epitaxial oxide material layer and an NBG epitaxial oxide material layer, where the thicknesses of the NBG layers and the WBG layers change throughout the chirp layer. In other examples, the WBG layers could have changing thicknesses and the NBG layers could have the same thickness, or the NBG layers could have changing thicknesses and the WBG layers could have the same thickness throughout the chirp layer.

Figure 91I:
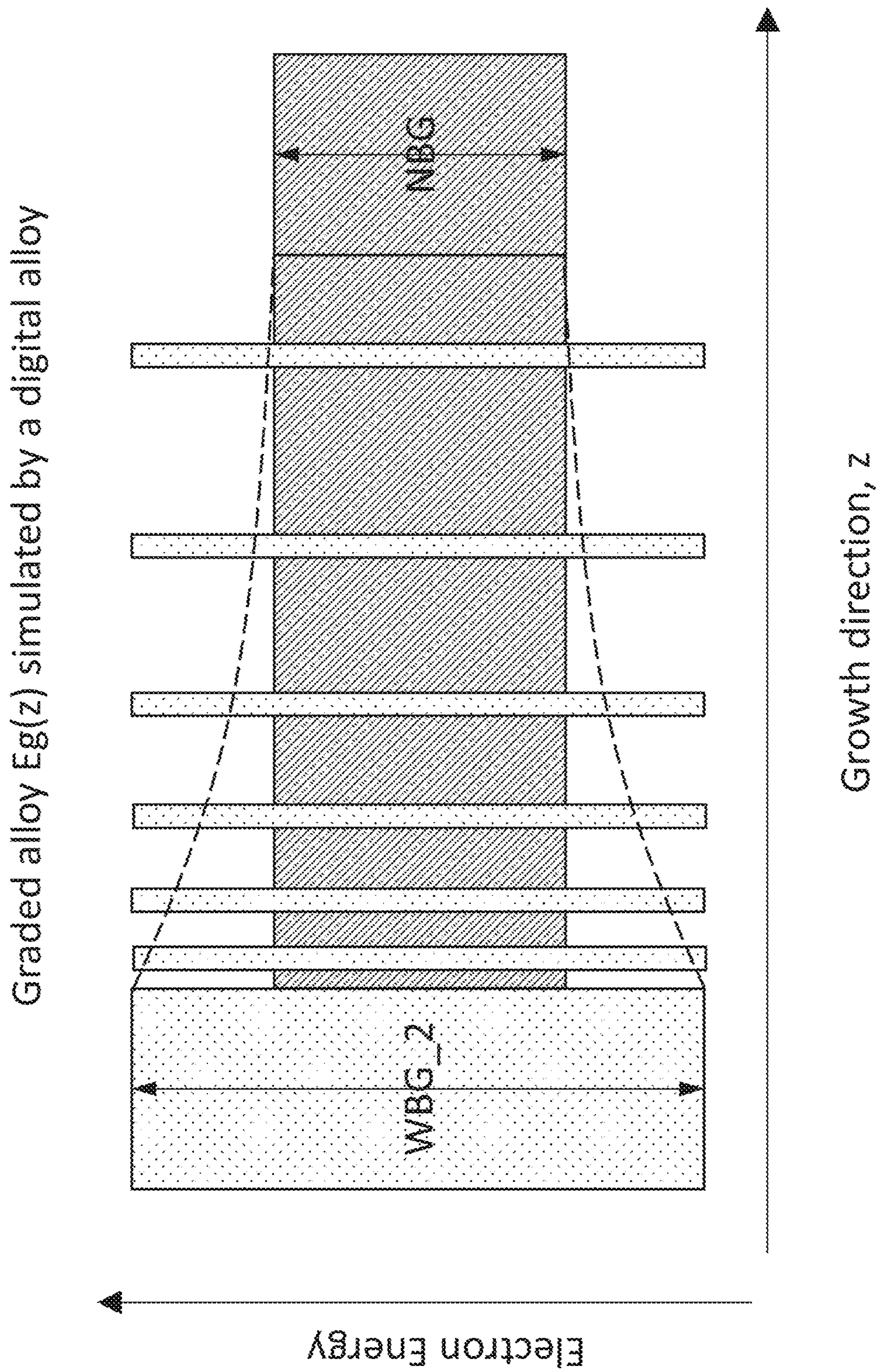

FIG. 91I shows an example of a WBG material WBG_2 and an NBG material coupled with a chirp layer, where the chirp layer comprises a multilayer structure of epitaxial oxide materials where the NBG layers have changing thicknesses and the WBG layers have the same thickness throughout the chirp layer.

Chirp layers like those shown in FIGS. 91H-91I can be used to change the average composition of a region of a semiconductor structure while only depositing two different materials compositions. This can be useful, for example, to grade the composition between a pair of materials that prefer particular stoichiometries (e.g., when the materials can be formed with higher quality at certain stoichiometric phases). It can also be advantageous for manufacturing process control of a graded layer, since the thickness of a layer is often controlled by fast and easy to control mechanisms such as a mechanical shutter, while changing composition can require changing temperatures which can be slower and more difficult to control.

Digital alloys are multilayer structures that comprise alternating layers of at least two epitaxial materials (e.g., the structure in FIG. 91C). Digital alloys can advantageously be a used to form a layer with properties that are a blend of the properties of the constituent epitaxial materials layers. This can be particularly useful to form a composition of a pair of materials that prefer particular stoichiometries (e.g., when the materials can be formed with higher quality at certain stoichiometric phases). It can also be advantageous for manufacturing process control, since the thickness of a layer is often controlled by fast and easy to control mechanisms such as a mechanical shutter, while changing composition can require changing temperatures which can be slower and more difficult to control.

FIGS. 92A-92C show energy versus growth direction (distance, z) for three examples of different digital alloys, and example wavefunctions for the confined electrons and holes in each. The three digital alloys are made from alternating layers of the same two materials (an NBG material and a WBG material), but with different thicknesses of the NBG layers. The "Thick NBG layer >20 nm" digital alloy has thick NBG layers (i.e., greater than about 20 nm in thickness) and the least confinement, which leads to a smallest effective bandgap $E_g^{SL1}$ for the digital alloy. The "Thin NBG layer <20 nm" digital alloy has thin NBG layers (i.e., less than about 5 nm in thickness) and the most confinement, which leads to a largest effective bandgap $E_g^{SL3}$ for the digital alloy. The "Mid NBG layer ~5-20 nm" digital alloy has NBG layers with intermediate thicknesses (i.e., from about 5 nm to about 20 nm in thickness) and an intermediate amount of confinement, which leads to an effective bandgap $E_g^{SL2}$ for the digital alloy that is between that of $E_g^{SL1}$ and $E_g^{SL3}$.

FIG. 93 shows a plot of effective bandgap versus an average composition (x) of the digital alloys shown in FIGS. 92A-92C. The two epitaxial oxide constituent layers of the digital alloy in this example are AO and $B_2O_3$, where A and B are metals (or non-metallic elements) and O is oxygen. In this example, material AO corresponds to the NBG material and $B_2O_3$ corresponds to the WBG material in the charts shown in FIGS. 92A-92C. In some cases, it may be difficult or not possible to form a high quality epitaxial material with the composition $A_xB_{2(1-x)}O_{3-2x}$. However, a digital alloy with alternating layers of AO and $B_2O_3$ can have properties (e.g., bandgap, and optical absorption coefficients) that are between those of the constituent materials AO and $B_2O_3$. In some cases, one or both layers of a digital alloy can be strained, which can further alter the properties of the materials and provide a different set of materials properties for incorporation into the semiconductor structures described herein. Some examples of AO and $B_2O_3$ combinations for digital alloys are MgO/β-($AlGaO_3$) and MgO/γ-($AlGaO_3$). Other combinations of epitaxial oxides materials can also be used in digital alloys, such as MgO/$Mg_2GeO_4$, $MgGa_2O_4$/$Mg_2GeO_4$. For example, a continuous alloy composition cannot generally be formed from a bulk random alloy comprising $Mg_xGa_{2(1-y)}O_{(3-2x)}$ over the range of $0 \le x \le 1$, however, an equivalent pseudo-alloy can be formed using a SL[MgO/$Ga_2O_3$] or SL[MgO/$MgGa_2O_4$] or SL[$MgGa_2O_4$/$Ga_2O_3$] digital superlattice.

The plot in FIG. 93 shows how the effective bandgap will change in the three scenarios, which correspond to the digital alloys with different thicknesses of quantum wells shown in FIGS. 92A-92C. In this example, the layers of the NBG and WBG materials in the digital alloy are sufficiently thin to cause quantum confinement of carriers, which adjusts (increases) the effective bandgap of the material, as described above. Such a plot illustrates that a digital alloy can be designed with a desired effective bandgap by choosing appropriate thickness of certain epitaxial oxide constituent layers.

The epitaxial oxide materials and semiconductor structures described herein can be used as devices, such as diodes, sensors, LEDs, lasers, switches, transistors, amplifiers, and other semiconductor devices. The semiconductor structures can comprise a single layer of an epitaxial oxide on a substrate, or multiple layers of epitaxial oxide materials.

FIG. 94A shows a full E-k band structure of an epitaxial oxide material, which can be derived from the atomic structure of the crystal. FIG. 94B shows a simplified band structure, which is a representation of the minimum bandgap of the material, and wherein the x-axis is space (z) rather than wavevectors (as in the E-k diagrams). Semiconductor devices can be designed using epitaxial oxide materials using the thickness ($L_z$) of the layer and the minimum bandgap.

For example, FIG. 95 shows a simplified band structure of a p-i-n device comprising epitaxial oxide layers. The three layers in this case are the same material (i.e., $E_{gn}=E_{gi}=E_{gp}$) and form a homojunction p-i-n structure. The p-i-n-structure forms a diode and the built-in electric field applies an electric field along the direction "z" across the i-region, as shown.

FIG. 96 shows a simplified band structure of a heterojunction p-i-n device comprising epitaxial oxide layers. The n- and p-layers in this case are wider bandgap materials (where $E_{gn}=E_{gp}$, or $E_{gn}\neq E_{gp}$), and the i-region has a smaller bandgap (i.e., $E_{gi}\leq E_{gn}$, and $E_{gi}\leq E_{gp}$). The band offsets $\Delta E_e$ and $\Delta E_v$ align in a Type-I configuration in this example, and provide energy barriers for controlling carrier flow and/or carrier confinement. The p-i-n-structure forms a diode and the built-in electric field applies an electric field along the direction "z" across the i-region, as shown. The semiconductor structure in FIG. 96 can advantageously be used as a light emitting device (e.g., an LED) because the wider bandgap n- and p-regions have low absorption coefficients of light emitted from the narrower bandgap i-layer.

FIG. 97 shows a simplified band structure of a multiple heterojunction p-i-n device comprising epitaxial oxide layers. The structure is similar to the structure in FIG. 96 and comprises a heterojunction p-i-n structure where the i-region comprises a single quantum well structure. The n- and p-layers in this case are wider bandgap materials (where $E_{gn}=E_{gp}$, or $E_{gn}\neq E_{gp}$), and the i-region has at least one layer with a bandgap (i.e., $E_{gi,B}$ or $E_{gi,W}$) that is narrower than $E_{gn}$ and/or $E_{gp}$. Electrons and holes are injected into the intrinsic region from their respective reservoir regions. The heterojunction band offsets $\Delta E_c$ and $\Delta E_v$ align in a Type-I configuration, in this example, and provide energy barriers for controlling carrier flow and/or carrier confinement. The semiconductor structure in FIG. 96 can advantageously be used as a light emitting device (e.g., an LED) because the wider bandgap n- and p-regions have low absorption coefficients of light emitted from the quantum well in the narrower bandgap i-layer. The quantum well, with bandgap $E_{gi,W}$, is designed such that the thickness $L_{QW}$ can tune the quantized energy levels in the conduction and valence bands confined between the barriers, with bandgaps $E_{gi,B}$. In other embodiments, the structure can have more than one, or multiple quantum wells in the intrinsic region. The energy levels in the multiple quantum well structure influence various properties of the structure, such as the effective minimum bandgap. In some cases, such as in light emitting devices, having more than one quantum well improves optical emission efficiency (e.g., due to an increased quantum well capture rate of carriers injected into the i-region from the wider bandgap p- and n-regions).

FIG. 98A shows another example of a p-i-n structure, with multiple quantum wells, and where the barrier layers of the multiple quantum well structure in the i-region have larger bandgaps than the bandgap of the n- and p-layers. In other cases, the bandgaps of the barrier layers in the multiple quantum wells can be narrower than those of the n- and p-layers. FIG. 98B shows a single quantum well of the multiple quantum well structure in 98A. The thickness $L_{QB}$ of the barrier layers can be made thin enough that electrons and holes can tunnel through them (e.g., within the i-region, and/or when being transferred between the n- and/or p-layers into and/or out of the i-region). Such a multiple quantum well structure can behave as a digital alloy, whose properties are dependent on the materials comprising the barriers and the wells, and with the thicknesses of the barriers and the wells.

FIG. 99 shows another example of a p-i-n structure, with multiple quantum wells in the n-, i- and p-layers. The n-region comprises $N_n^{SL}$ pairs of wells (thickness Li and bandgap $E_{gW1}$) and barriers (thickness $L_2$ and bandgap $E_{gB1}$). The i-region comprises $N_i^{SL}$ pairs of wells (thickness $L_3$ and bandgap $E_{gW2}$) and barriers (thickness $L_4$ and bandgap $E_{gB2}$). The p-region comprises $N_p^{SL}$ pairs of wells (thickness $L_5$ and bandgap $E_{gw3}$) and barriers (thickness $L_6$ and bandgap $E_{gB3}$). The bandgaps of the barriers and wells in the i-region are narrower than those of the barriers and wells in both the n- and p-layers in this example. In other cases of structures with multiple quantum wells, the bandgaps of the barrier layers can be wider than those of the n- and p-layers. Additionally, in some cases, the thicknesses and/or bandgaps of the barriers and/or wells in the n-, i- and/or p-region can change throughout an individual region (e.g., to form a graded structure, or a chirp layer). The thicknesses $L_2$, $L_4$, and/or $L_6$ of the barrier layers can be made thin enough that electrons and holes can tunnel through them (e.g., within the i-region, and/or when being transferred between the n- and/or p-layers into and/or out of the i-region).

Each region in the structure shown in FIG. 99 can behave as a digital alloy, whose properties are dependent on the materials comprising the barriers and the wells, and with the thicknesses of the barriers and the wells. For example, the materials and layer thicknesses can be chosen such that the n- and p-regions have wider bandgaps and are therefore transparent (or have a low absorption coefficient) to the wavelength of light emitted from the i-region superlattice. Any of the compatible materials sets described herein can be incorporated into in such structures.

FIG. 100 shows another example of a p-i-n structure, with multiple quantum wells in the n-, i- and p-layers similar to the structure in FIG. 99. The bandgap and the thicknesses of the barriers and well in the n-, i- and p-regions are defined the same as in FIG. 99. The superlattices in the n-, i- and p-regions in this example have the same alternating pairs of materials, with different well (or well and barrier) thicknesses in the i-region tuning the optical properties. The structure has a material A and a material B, where the barriers of the superlattice in the n-region comprise material A and the wells in the superlattice in the n-region comprise material B. In this example, the barriers of the i- and p-regions also comprise material A and the wells in the i- and p-regions also comprise material B. The wells in the i-region have been made thicker so that the quantized energy levels in the potential well are lower in energy with respect to the band edge of the host well, thereby making the effective bandgap of the superlattice in the i-region have a narrower bandgap (i.e., closer to that of material A in a bulk form) than that of the superlattices in the n- and p-region. Such a structure could therefore be used in a light emitting device (e.g., an LED), as described herein.

FIG. 101A shows an example of a semiconductor structure comprising $(Al_xGa_{1-x})_2O_3$ layers, where 0≤x≤1 in each layer. In other cases, the three layers can be $(Al_xGa_{1-x})_yO_z$, where 0≤x≤1, 1≤y≤3, and 2≤z≤4, with any space group. The three $(Al_xGa_{1-x})_2O_3$ layers are formed on a buffer layer ("Buffer"), which is formed on a substrate ("SUB"). A contact region ("Contact region #1") (e.g., a metal) is also shown contacting the topmost epitaxial oxide layer in the semiconductor structure. The example in FIG. 101A shows that the layers in the structure can have three different Al contents, where x1, x2, and x3 are different in the three layers. In some cases, x1, x2, and x3 are the same in the three layers. And still in other cases, x1 and x3 are the same or similar and x2 is different (e.g., to form a narrower bandgap layer between two wider bandgap layers).

FIG. 101A includes an active region comprising three $(Al_xGa_{1-x})_2O_3$ layers. In some cases, the active region can comprise more than three layers. The layers of the active region can be doped and/or not intentionally doped to form p-i-n, n-i-n, p-n-p, n-p-n, and other doping profiles. The compositions of the layers x1, x2 and x3 can be chosen depending on the substrate ("SUB") and buffer layer upon which they are formed, for example, according to the selection criteria for compatible combinations of epitaxial oxide layers and substrates described herein.

In some embodiments, the structure shown in FIG. 101A is incorporated into an optoelectronic device that emits or detects light. For example, the structure shown in FIG. 101A can be an LED or laser or photodetector configured to emit or detect UV light. In such cases, for example, the $(Al_xGa_{1-x})_2O_3$ layer with Al content x2 can emit light, the substrate can be opaque to the wavelength of the emitted light, and the compositions of the three $(Al_xGa_{1-x})_2O_3$ layers can be formed wherein x3≥x2≥x1. In such devices the light can primarily be emitted (or detected) through the top of the device or an edge of the device, and the $(Al_xGa_{1-x})_2O_3$ layer(s) above (in a direction away from the substrate) the emission layer can have higher bandgap(s) and therefore not strongly absorb the emitted light (or light to be detected). In another example, the $(Al_xGa_{1-x})_2O_3$ layer with Al content x2 can emit light, and the substrate and buffer layer are transparent to (or absorb a fraction of) the emitted light, and the compositions of the three $(Al_xGa_{1-x})_2O_3$ layers can be formed wherein 0≤x1≤1, 0≤x2≤1 and 0≤x3≤1.

In some cases, one or more of the three $(Al_xGa_{1-x})_2O_3$ layers in the structure shown in FIG. 101A can include a superlattice or graded layer or multilayer structure, as described herein, comprising different compositions of $(Al_xGa_{1-x})_2O_3$ where 0≤x≤1. For example, one or more of the three $(Al_xGa_{1-x})_2O_3$ layers can include a superlattice or a chirp layer (with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

The substrate of the structure shown in FIG. 101A can be any single crystal material that is compatible with the three $(Al_xGa_{1-x})_2O_3$ layers. For example, some substrates that are compatible with some types of $(Al_xGa_{1-x})_2O_3$ layers are $Ga_2O_3$ (any crystal symmetry, such as α-, β-, γ-, and κ-), $Al_2O_3$ (any crystal symmetry, such as α-, β-, γ-, and κ-, and C-plane, R-plane, A-plane or M-plane oriented), 4H—SiC, MgO, $MgAl_2O_4$, $MgGa_2O_4$, LiF, and $MgF_2$. Furthermore, the substrates in this list can be doped (e.g., highly n-type or highly p-type, such as greater than $10^{18}$ $cm^{-3}$ n-type or p-type) and be conductive (or have higher electrical conductivity), or can be not intentionally doped and be resistive (or have higher electrical resistance).

In some cases, the buffer layer of the structure shown in FIG. 101A can be a material compatible with the substrate and the three $(Al_xGa_{1-x})_2O_3$ layers. For example, the buffer layer can comprise a material the same as or similar to the substrate, or the same as or similar to one or more of the three $(Al_xGa_{1-x})_2O_3$ layers. For example, the substrate could comprise β-$Ga_2O_3$ and the buffer layer can comprise β-$(Al_xGa_{1-x})_2O_3$ where 0≤x≤1. In another example, the substrate is MgO and the buffer layer can comprise γ-$(Al_xGa_{1-x})_2O_3$ where 0≤x≤1. In some cases, the buffer layer can be a material other than $(Al_xGa_{1-x})_2O_3$, such as MgO, $MgAl_2O_4$, $MgGa_2O_4$, LiF, or $MgF_2$.

In some cases, the buffer layer of the structure shown in FIG. 101A can include a graded layer or multilayer structure, as described herein. In some cases, the buffer layer can be a lattice constant matching layer that couples the active region to the substrate. For example, the buffer can include a graded or chirp layer comprising different compositions of $(Al_xGa_{1-x})_2O_3$ where 0≤x≤1. For example, the buffer layer can include a superlattice or a chirp layer (with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1. The in-plane (approximately perpendicular to the growth direction) lattice constant of the graded or chirp layer adjacent to the substrate can be approximately equal to (or within 1%, 2%, 3%, 5%, or 10% of) the in-plane lattice constant at a surface of the substrate. The final in-plane (approximately perpendicular to the growth direction) lattice constant of the graded or chirp layer can be approximately equal to (or within 1%, 2%, 3%, 5%, or 10% of) the in-plane lattice constant of the $(Al_{x1}Ga_{1-x1})_2O_3$ layer in the figure.

FIG. 101B shows the structure from FIG. 101A with the layers etched such that contact can be made to any layer of the semiconductor structure using "Contact region #2," "Contact region #3," and "Contact region #4." The metals for the contact regions can be chosen to be high work function metals or low work functions metals for contacting to different conductivity type (n-type or p-type) epitaxial oxide materials, as described herein. The contact regions can all be patterned to achieve desired electrical resistances and to allow light to enter and/or escape from the semiconductor structures, in some cases.

FIG. 101C shows the structure from FIG. 101B with an additional "Contact region #5," which makes contact to the back side (opposite the epitaxial oxide layers) of the substrate ("SUB"). Such a contact region can be used when the substrate has a sufficient electrical conductivity. The metals for the contact region to the backside of the substrate ("SUB") can be chosen to be high work function metals or low work functions metals for contacting to different conductivity type epitaxial oxide materials, as described herein.

FIGS. 102A and 102B show simplified E-k diagrams in the vicinity of the Brillouin-zone center for an epitaxial oxide material, such as those shown in FIGS. 28, 76A-1, 76A-2 and 76B, showing a process of impact ionization. The band structure represents the allowed energy states for electrons in a crystal. A hot electron can be injected into an epitaxial oxide material, as shown in FIG. 102A. If the hot electron has an energy above about half the bandgap of the epitaxial oxide material, then it can relax and form a pair of electrons with energy at the conduction band minimum. As shown in FIG. 102B, the excess energy of the hot electron is transferred to a generated electron hole pair in the epitaxial oxide material. The impact ionization process shown in these figures illustrates that impact ionization leads to a multiplication of free carriers in the epitaxial oxide material.

FIG. 103A shows a plot of energy versus bandgap of an epitaxial oxide material (including the conduction band edge, $E_c$, and the valence band edge, $E_v$), where the dotted line shows the approximate threshold energy required by a hot electron to generate an excess electron-hole pair through an impact ionization process. FIG. 103B shows an example of a hot electron in $\alpha$-$Ga_2O_3$ with a bandgap of about 5 eV. In this example, the hot electron needs to have an excess energy of about 2.5 eV above the conduction band edge of the $\alpha$-$Ga_2O_3$.

FIG. 104A shows a schematic of an epitaxial oxide material with two planar contact layers (e.g., metals, or highly doped semiconductor contact materials and metal contacts) coupled to an applied voltage, $V_a$. FIG. 104B shows a band diagram of the structure shown in FIG. 104A along the growth ("z") direction of the epitaxial oxide material. The applied bias $V_a$ forms an electric field in the epitaxial oxide material, which can accelerate electrons injected into the epitaxial oxide material, thereby increasing their energy. Lu is minimum distance the hot electron must propagate before an impact ionization event probability becomes high, and an excess electron-hole pair is formed (i.e., carrier multiplication occurs). In such structures, the thickness of the epitaxial oxide material in the growth ("z") direction needs to be thick enough, and the applied bias needs to be high enough to facilitate impact ionization. For example, the oxide material thickness can be about 1 μm, or from 500 nm to 5 μm, or more than 5 μm. The applied bias can also be very high to form a large electric field, such as greater than 10 V, greater than 20 V, greater than 50 V, or greater than 100 V, or from 10 V to 50 V, or from 10 V to 100 V, or from 10 V to 200 V. The high breakdown voltages achievable by epitaxial oxide materials is therefore also beneficial. In some cases, epitaxial oxide materials with wide bandgaps and high breakdown voltages can enable devices (e.g., sensors, LEDs, lasers) with impact ionization that would not be possible in other materials with narrower bandgaps and lower breakdown voltages.

FIG. 104C shows a band diagram of the structure shown in FIG. 104A along the growth ("z") direction of the epitaxial oxide material. In this example, the epitaxial oxide has a gradient in bandgap (i.e., a graded bandgap) in the growth "z" direction, $E_c(z)$. The graded bandgap can be formed, for example by a gradient in composition in the growth "z" direction, as described herein. For example, the epitaxial oxide layer can comprise $(Al_xGa_{1-x})_2O_3$ (or $(Al_xGa_{1-x})_yO_z$, where $0 \le x \le 1$, $1 \le y \le 3$, and $2 \le z \le 4$) where x varies in the growth "z" direction. The graded bandgap further increases the electric field, which further facilitates impact ionization. In the structure in this example, the excess energy of the electrons increases as a function of propagation distance "z." Pair production probability therefore also increases as a function of propagation distance "z." With a graded bandgap any electrons that do not recombine can get accelerated further into the material and gain more excess energy. These structures therefore can also make avalanche diodes (e.g., for sensors, or LEDs).

The example above shows a gradient within a layer, however, in other examples, digital alloys and/or chirp layers can be used to form structures that are favorable for impact ionization. For example, a chirp layer can be used to progressively narrow the effective bandgap of a layer, which would cause the excess energy of injected electrons to increase as a function of propagation distance "z" similar to the graded layer described above.

FIG. 104C also shows that the excess electron-hole pairs generated via impact ionization in epitaxial oxide layers can recombine radiatively to emit photons (with wavelength $\lambda_g$ related to the bandgap of the material). Such radiative recombination is more favorable in epitaxial oxide materials with direct bandgaps, e.g., $\kappa$-$(Al_xGa_{1-x})_2O_3$ or $\kappa$-$(Al_xGa_{1-x})_yO_z$, where $0 \le x \le 1$, $1 \le y \le 3$, and $2 \le z \le 4$.

The structures described in FIGS. 104A-104C can be used, for example, in electroluminescent devices such as LEDs, or sensors such as avalanche photodiodes.

FIG. 105 shows a schematic of an example of an electroluminescent device including a high work function metal ("metal #1"), an ultra-wide bandgap ("UWBG") layer, a wide bandgap ("WBG") epitaxial oxide layer, and a second metal contact ("metal #2"). The bandgap of the WBG epitaxial oxide layer is selected for the desired optical emission wavelength, and is a direct bandgap. The UWBG layer can also be an epitaxial oxide layer. The UWBG layer is thin (e.g., the thickness ($z_b$-$z_1$) is below 10 nm, or below 1 nm) and acts as a tunnel barrier for the injection of hot electrons into the WBG epitaxial oxide layer. The work function of the metal, and the band edges of the UWBG and WBG epitaxial oxide layer are chosen such that the hot electrons have enough excess energy to generate an additional electron-hole pair via impact ionization. The injected and generated electron-hole pairs can then recombine to emit light of the desired wavelength.

FIGS. 106A and 106B show schematics of examples of electroluminescent devices that are p-i-n diodes including a p-type semiconductor layer, an epitaxial oxide layer that is not intentionally doped (NID), an impact ionization region (IIR), and an n-type semiconductor layer. The p-type and n-type semiconductor layers can be epitaxial oxide layers. The p-type and n-type semiconductor layers can have wider bandgaps than the epitaxial oxide layer, to form heterostructures as shown in the figures. The p-type and n-type semiconductor layers can be coupled to a high work function metal, and a second metal contact, respectively, such that bias can be applied to the structures.

In the example shown in FIG. 106A, the bandgap of the p-type semiconductor layer is $E_{gp}$, the bandgap of the epitaxial oxide layer that is not intentionally doped (NID) and comprises an impact ionization region (IIR) is $Eg_{IIR}$, and the bandgap of the n-type semiconductor layer is $E_{gn}$. In this example, $E_{gp}>E_{gIIR}$ and $E_{gn}>E_{gIIR}$. In the example shown in FIG. 106B, the NID epitaxial oxide layer has a graded bandgap, and the bandgaps of the n-type and p-type layers are different from one another, such that $E_{gp}>E_{gIIR}$ at the interface between the p-type semiconductor layer and the NID epitaxial oxide layer, and $E_{gn}>E_{gIIR}$ at the interface between the n-type semiconductor layer and the NID epitaxial oxide layer. Both of these examples can operate as LEDs, where injected electrons gain excess energy through the NID epitaxial oxide region, generate excess electron-hole pairs via impact ionization, and the generated electron-hole pairs can then recombine to emit photons. Structures with similar band diagrams as those shown in FIGS. 106A and 106B can also be used as avalanche photodiodes, by applying a reverse bias between the n-type and p-type layers.

FIG. 107 shows the minimum bandgap energy versus the minor lattice constant of monoclinic $\beta(Al_xGa_{1-x})_2O_3$. The lattice constants for all 3 independent crystal axes (a, b, c) become smaller as the Al mole fraction x increases. The monoclinic C2m space group has a unit cell comprising 4 distinct octahedral bonding sites and 4 distinct tetrahedral bonding sites. Theoretically the full mole fraction $0 \leq x \leq 1$ range is possible, however, it was found experimentally that Al atoms prefer exclusively octahedral bonding sites whereas Ga atoms can occupy both symmetry sites. This limits the attainable alloy range to $0 \leq x \leq 0.5$ and the available minimum bandgap to ~6 eV.

Furthermore, it was found via experiments in accordance with the present disclosure that Al atoms are particularly difficult to incorporate on the (−201) face, whereas (100), (001), (010)-oriented surfaces can attain $0 \leq x \leq 0.35$, while (110)-oriented surfaces can accommodate large mole fractions of Al, such that $0 \leq x \leq 0.5$.

FIG. 108 shows the minimum bandgap energy versus the minor lattice constant “a” of hexagonal $\alpha(Al_xGa_{1-x})_2O_3$. The lattice constants for the two independent crystal axes (a, c) become smaller as the Al mole fraction x increases. The hexagonal R3c space group has a unit cell comprising 12 distinct octahedral bonding sites. Theoretically the full mole fraction $0 \leq x \leq 1$ range is possible and was confirmed experimentally $0 \leq x \leq 1.0$. The Al and Ga atoms comprising the alloy can in general randomly select any of the 12 distinct bonding sites. The well-known x=1.0 composition is commonly referred to as sapphire and is commercially available in large wafer diameters and exceptionally high crystalline quality. Common crystal faces for epitaxial wafer growth are C-plane, A-plane, R-plane and M-plane. Intentional small angle misoriented surfaces away from A-, R-, C- and M-planes are also possible for optimizing growth conditions of epitaxial $\alpha(Al_xGa_{1-x})_2O_3$. It was found experimentally that $\alpha(Al_xGa_{1-x})_2O_3$ can be epitaxially formed on A-, R- and M-plane sapphire. In particular, the A-plane shows exceptionally high crystal quality epilayer growth. Substrates for deposition of $\alpha(Al_xGa_{1-x})_2O_3$ include tetrahedral $LiGaO_2$ and others such as metallic surfaces of Ni(111) and Al(111).

FIG. 109 shows an example of some embodiments of forming R3c $\alpha(Al_xGa_{1-x})_2O_3$ epitaxial structures. The crystal structures shown describe the atomic positions within a repeating unit cell comprising a bilayer pair of $\alpha Ga_2O_3$ and $\alpha Al_2O_3$. This digital superlattice formation can be utilized to form an equivalent ordered ternary alloy of composition $\alpha(Al_xGa_{1-x})_2O_3$ wherein the equivalent mole fraction of Al is given by the expression:

$$x = \frac{L_{Al_2O_3}}{L_{Al_2O_3} + L_{Ga_2O_3}}$$

Furthermore, if the layer thicknesses are selected to be sufficiently thin (typically, less than about 10 unit cells of the respective bulk material) then quantization effects along the growth axis occurs and electronic properties will be determined by the quantized energy states in the conduction and valence bands of the narrower bandgap material $\alpha Ga_2O_3$. If the wider bandgap materials $\alpha Al_2O_3$ is also sufficiently thin (namely, less than about 5 unit cells) then quantum mechanical tunnelling of electrons and holes can occur along the quantization axis (in general parallel to the layer formation direction).

A monolayer (ML) is defined as the unit cell thickness along the given crystal axis. For the (110) oriented growth the free-standing value for 1 ML $\alpha Al_2O_3$=4.161 Å and 1 ML $\alpha Ga_2O_3$=4.382 Å.

It was discovered in accordance with the present disclosure that the A-plane surface of sapphire is exceptionally advantageous for thin film formation of $\alpha(Al_xGa_{1-x})_2O_3$ and multilayered structures thereof. FIG. 109 shows three example cases of a digital SL intentionally formed along the [110] growth axis or deposited on the A-plane of $\alpha(Al_xGa_{1-x})_2O_3$.

In this example, the SL comprises a repeating SL period of 4 ML in thickness, however, thicker or thinner periods can be selected. The cross-section of the crystal is equivalent to viewing the C-axis in plan view, and is to be understood that the structure is periodic in the horizontal directions representing an epitaxial film. Clearly if there are no Ga atoms substituted in the crystal, the structure represents bulk $\alpha Al_2O_3$ as shown on the left-hand diagram of the figure. An example case of Ga atom substitution is shown in the middle diagram of FIG. 109, with an SL structure comprising 1 ML $\alpha Ga_2O_3$/3 ML $\alpha Al_2O_3$ being the equivalent bulk ternary alloy of $(Al_{0.75}Ga_{0.25})_2O_3$. Another example case is shown in the right-hand diagram of FIG. 109, with an SL structure comprising 2 ML $\alpha Ga_2O_3$/2 ML $\alpha Al_2O_3$ being the equivalent bulk ternary alloy of $(Al_{0.5}Ga_{0.5})_2O_3$. An advantage of using a digital alloy (such as those shown in FIG. 109) compared to co-deposition of simultaneous Al and Ga adatoms to form a random ternary alloy is the ability to bandgap engineer the electronics properties of the material beyond a simple random alloy. In practice, the digital alloy enables much simpler growth methods for MBE as only two elemental fluxes of Al and Ga are required to create a wide range of bandgap compositions. Otherwise, the flux ratio of Al ($\Phi_{Al}$) and Ga ($\Phi_{Ga}$) must be configured and precisely maintained to achieve the required Al mole fraction using:

$$x_{Al}^{random} = \frac{\Phi_{Al}}{\Phi_{Al} + \Phi_{Ga}}.$$

FIG. 110 shows an example implementation of a stepped increment tuning of the effective alloy composition of each SL region along the growth direction of a chirp layer. As an example, four SL regions are shown with varying equivalent mole fractions of Al-x1, x2, x3 and x4. The period of each SL can be kept constant, such as shown in FIG. 109, but the bilayer thicknesses can be varied, as shown in FIG. 110. The number of periods can also be kept the same or varied between SLs along the growth direction. The example shows the SL changing from high Al % near the substrate to a higher Ga % near the top. This method of grading the average alloy content as a function of the growth direction can be advantageous for managing the misfit strain at the heterojunction interfaces, for example, determined by the lattice constants shown in FIG. 108. It was found that the critical layer thickness $L_{CLT}$ for $\alpha Ga_2O_3$ on bulk $\alpha Al_2O_3$ (110) is about $L_{CLT} \leq 100$ nm. Therefore, the digital step graded SL method disclosed herein enables creation of high Ga % layers on sapphire substrates.

FIG. 111 shows an experimental XRD plot of a step graded SLs (SGSL) structure (that forms a chirp layer) using a digital alloy comprising bilayers of $\alpha Ga_2O_3$ and $\alpha Al_2O_3$ deposited on (110)-oriented sapphire (zero miscut). The SGSL had a period of 7.6 nm and each SL had 10 periods. The bilayer pair thickness was varied along the growth direction from low average Ga % to high average Ga %. The resulting equivalent alloy diffraction peak $\alpha(Al_{0.5}Ga_{0.5})_2O_3$ (110) can be compared to the pseudomorphic bulk $\alpha Ga_2O_3$ (110) diffraction peak shown in the figure.

FIG. 112 shows another example and possible application of the step graded SLs which can be used to form a pseudo-substrate with a tuned in-plane lattice constant for a subsequent high quality and close lattice matched active layer such as the "bulk" (meaning a single layer rather than an SL) $\alpha(Al_{x5}Ga_{1-x5})_2O_3$. The active layer can, for example, be used for the high mobility region of a transistor.

FIG. 113 shows an example of a high complexity digital alloy grading interleaved by a wide bandgap spacer, in this case a $\alpha Al_2O_3$ interposer layer. The SL regions are varied by the narrow bandgap (NBG) and wide bandgap (WBG) layer thicknesses $L_m$ and number of periods $N_{pm}$. Such structures are advantageous for creating chirped electronic bandgap structures along the growth direction.

FIGS. 114A and 114B shows plots of the high-resolution Bragg XRD and the grazing incidence x-ray reflection (XRR) of the chirped SL with interposer as described in FIG. 113. The XRD pattern shows well defined satellite peaks due to the imposed periodicity of keeping both the spacer and SL region period constant. The width of the satellite peak is testament to the varying effective alloy content as a function of the growth direction. Eight SL regions were utilized in this example with a period of ~8 ML and an estimated duty cycle of the $\alpha Ga_2O_3$ and $\alpha Al_2O_3$ constituent bilayers selected to achieve $0.125\leq x\leq 0.875$. The thickness of the $\alpha Al_2O_3$ interposer was 4 ML. The XRR plot shows the deep modulation in reflectivity but maintaining sharp and well resolved satellite reflexes indicative of high interfacial flatness between each SL bilayer and between SL and interposer.

FIGS. 115A and 115B show the electronic band diagram as a function of the growth direction for a chirp layer structure like those of FIGS. 112 and 113, at zero bias conditions and under a bias "$V_{Bias}$." FIG. 115C shows the lowest energy quantized energy wavefunction confined within the $\alpha Ga_2O_3$ layers of the chirp layer. The SL regions have an effective bandgap determined by the quantized energy levels confined within the NBG $\alpha Ga_2O_3$. FIG. 115D is the wavelength spectrum of the oscillator strength for electric dipole transitions between the conduction and valence band of the chirp layer modeled in FIGS. 115A-115C. It is calculated from the spatial overlap integrals between the conduction and valence band quantized wavefunctions. This curve is related to either the absorption coefficient or the emission spectrum of electrons and holes recombining in the structure. FIG. 115D also shows the calculated electron and hole wavefunctions ($\psi_c^{n=1}$, and $\psi_v^{n=1}$, respectively) within a quantum well of the structure under bias.

Adjacent Superlattices

The present disclosure describes semiconductor structures with one or more superlattices containing an epitaxial oxide material. In some cases, the semiconductor structures contain two or more superlattices. In some cases, the two or more superlattices are adjacent to one another in the semiconductor structure. The superlattices can be i-type (i.e., intrinsic, or not intentionally doped), n-type, or p-type. The superlattices that are n-type or p-type can contain impurities that act as extrinsic dopants. In some cases, the n-type or p-type superlattices contain polar epitaxial oxide materials, and the n-type or p-type conductivity can be induced via polarization doping (e.g., due to a strain within the superlattice).

The epitaxial oxide materials contained in the superlattices described herein can be any of those shown in the table in FIG. 28 and in FIGS. 76A-1, 76A-2 and 76B. Some examples of epitaxial oxide materials are $(Al_xGa_{1-x})_2O_3$ where $0\leq x\leq 1$; $(Al_xGa_{1-x})_yO_z$ where $0\leq x\leq 1$, $1\leq y\leq 3$, and $2\leq z\leq 4$; NiO; $(Mg_xZn_{1-x})_z(Al_yGa_{1-y})_{2(1-z)}O_{3-2z}$ where $0\leq x\leq 1$, $0\leq y\leq 1$ and $0\leq z\leq 1$; $(Mg_xNi_{1-x})_z(Al_yGa_{1-y})_{2(1-z)}O_{3-2z}$ where $0\leq x\leq 1$, $0\leq y\leq 1$ and $0\leq z\leq 1$; $MgAl_2O_4$; $ZnGa_2O_4$; $(Mg_xZn_yNi_{1-y-x})(Al_yGa_{1-y})_2O_4$ where $0\leq x\leq 1$, $0\leq y\leq 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0\leq x\leq 1$ and $0\leq z\leq 1$; $(Al_xGa_{1-x})_2LiO_2$ where $0\leq x\leq 1$; and $(Mg_xZn_{1-x-y}Ni_y)_2GeO_4$ where $0\leq x\leq 1$, $0\leq y\leq 1$.

For example, a superlattice described herein can contain a wider bandgap $(Al_xGa_{1-x})_2O_3$ layer and a narrower bandgap $(Al_xGa_{1-x})_2O_3$ layer, where $0\leq x\leq 1$ for both compositions and x is different in each composition, and where the difference in bandgap between the layers is from 0.1 eV to 2 eV and/or the difference in x between the layers is from 0.1 to 1. In another example, a superlattice can contain a wider bandgap $(Al_xGa_{1-x})_2O_3$ layer and a narrower bandgap $(Al_xGa_{1-x})_2O_3$ layer, where $0\leq x\leq 1$ for both compositions (i.e., both compositions are ternary materials) and x is different in each composition, and where the difference in bandgap between the layers is from 0.1 eV to 2 eV and/or the difference in x between the layers is from 0.1 to 1.

In another example, a superlattice described herein can contain a first layer of $(Al_xGa_{1-x})_2O_3$, where $0\leq x\leq 1$, or $(Al_xGa_{1-x})_yO_z$, where $0\leq x\leq 1$, $1\leq y\leq 3$, and $2\leq z\leq 4$, and a second layer, where the material of the second layer is selected from $(Al_xGa_{1-x})_2O_3$ where $0\leq x\leq 1$; $(Al_xGa_{1-x})O_z$ where $0\leq x\leq 1$, $1\leq y\leq 3$, and $2\leq z\leq 4$; NiO; $(Mg_xZn_{1-x})_z(Al_yGa_{1-y})_{2(1-z)}O_{3-2z}$ where $0\leq x\leq 1$, $0\leq y\leq 1$ and $0\leq z\leq 1$; $(Mg_xNi_{1-x})_z(Al_yGa_{1-y})_{2(1-z)}O_{3-2z}$ where $0\leq x\leq 1$, $0\leq y\leq 1$ and $0\leq z\leq 1$; $MgAl_2O_4$; $ZnGa_2O_4$; $(Mg_xZn_yNi_{1-y-x})(Al_yGa_{1-y})_2O_4$ where $0\leq x\leq 1$, $0\leq y\leq 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0\leq x\leq 1$ and $0\leq z\leq 1$; $(Al_xGa_{1-x})_2LiO_2$ where $0\leq x\leq 1$; $(Mg_xZn_{1-x-y}Ni_y)_2GeO_4$ where $0\leq x\leq 1$, $0\leq y\leq 1$; and/or other epitaxial oxide materials from FIGS. 28, 76A-1, 76A-2 and 76B.

In another example, a superlattice described herein can contain a first layer and a second layer, where the materials of the first and second layers are selected from $(Al_xGa_{1-x})_2O_3$ where $0\leq x\leq 1$; $(Al_xGa_{1-x})_yO_z$ where $0\leq x\leq 1$, $1\leq y\leq 3$, and $2\leq z\leq 4$; NiO; $(Mg_xZn_{1-x})_z(Al_yGa_{1-y})_{2(1-z)}O_{3-2z}$ where $0\leq x\leq 1$, $0\leq y\leq 1$ and $0\leq z\leq 1$; $(Mg_xNi_{1-x})_z(Al_yGa_{1-y})_{2(1-z)}O_{3-2z}$ where $0\leq x\leq 1$, $0\leq y\leq 1$ and $0\leq z\leq 1$; $MgAl_2O_4$; $ZnGa_2O_4$; $(Mg_xZn_yNi_{1-y-x})(Al_yGa_{1-y})_2O_4$ where $0\leq x\leq 1$, $0\leq y\leq 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0\leq x\leq 1$ and $0\leq z\leq 1$; $(Al_xGa_{1-x})_2LiO_2$ where $0\leq x\leq 1$; $(Mg_xZn_{1-x-y}Ni_y)_2GeO_4$ where $0\leq x\leq 1$, $0\leq y\leq 1$; and/or other epitaxial oxide materials from FIGS. 28, 76A-1, 76A-2 and 76B.

In some embodiments, the epitaxial oxide materials in the superlattices described herein can each have a cubic, tetrahedral, rhombohedral, hexagonal, and/or monoclinic crystal symmetry. In some embodiments, the epitaxial oxide materials in the doped superlattices described herein comprise $(Al_xGa_{1-x})_2O_3$ with a space group that is R3c, Pna21, C2m, Fd3m and/or Ia3.

In some cases, the semiconductor structures are grown on substrates selected from $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$ where $0\leq x\leq 1$, $1\leq y\leq 3$, and $2\leq z\leq 4$ (any crystal symmetry), $MgF_2$, $LaAlO_3$, $TiO_2$, or quartz. In some cases, the epitaxial oxide materials of the superlattices described herein and the substrate material upon which the semiconductor structures described herein are grown are selected such that the layers of the semiconductor structure have a predetermined strain. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, or 2% of an in-plane lattice constant (or crystal plane spacing) of the substrate. In other cases, a buffer layer (e.g., including a compositional gradient, or a changing average alloy content) can be used to reset the lattice constant (or crystal plane spacing) of the substrate, and the layers of the semiconductor structure have in-plane lattice constants (or crystal plane spacings) that are within 0.5%, 1%, 1.5%, or 2% of the final (or topmost) lattice constant (or crystal plane spacing) of the buffer layer.

According to one aspect, the semiconductor structures with one or more superlattices containing an epitaxial oxide material described herein reside in an optoelectronic device such as an LED or a laser.

In some embodiments, the semiconductor structure is constructed by growth, for example, epitaxial layer growth, along a predetermined growth direction. In some cases, the semiconductor structure is comprised solely of one or more superlattices. For example, where the semiconductor structure comprises more than one superlattice, the superlattices are formed atop one another in a contiguous stack. In some embodiments, the one or more superlattices are short period superlattices. Each of the one or more superlattices can be comprised of a plurality of unit cells, and each of the plurality of unit cells can comprise at least two distinct substantially single crystal layers. In some embodiments, one or more of the at least two distinct substantially single crystal layers are distinct single crystal semiconductor layers, and in some cases all of the at least two distinct substantially single crystal layers are distinct single crystal semiconductor layers. However, in some embodiments, one or more of the at least two distinct substantially single crystal layers are metal layers. For example, the metal layers can be formed of aluminium (Al).

The semiconductor structure can include a p-type active region and an n-type active region. The p-type active region of the semiconductor structure provides p-type conductivity, and the n-type active region provides n-type conductivity. In some embodiments, the semiconductor structure includes an i-type (i.e., intrinsic, or not intentionally doped) active region between the n-type active region and the p-type active region to form a p-i-n device. In other embodiments, the semiconductor structure can include an i-type active region between two n-type active regions, or an i-type active region between two p-type active regions. In other embodiments, the semiconductor structure can include an p-type active region between two n-type active regions, or an n-type active region between two p-type active regions. In all of the cases above, the n-type, i-type and/or p-type active regions can include superlattices, and two or more adjacent regions can contain superlattices.

In some embodiments, each region of the semiconductor structure is a separate superlattice. However, in some alternative embodiments, the n-type active region, the p-type active region and/or the i-type active region are regions of a single superlattice. In other alternative embodiments, the n-type active region, the p-type active region and/or the i-type active region each comprise one or more superlattices. In other embodiments, two or more of the n-type active region, the p-type active region and the i-type active region are superlattices, and the third region does not comprise a superlattice. In some embodiments, the semiconductor structure also contains a buffer layer (e.g., between the n-type active region and a substrate, or between the p-type active region and a substrate) that may or may not also contain a superlattice.

In some embodiments, the optoelectronic device is a light emitting diode or a laser and/or emits ultraviolet light in the wavelength range of 150 nm to 700 nm, or in the wavelength range of 150 nm to 280 nm, or in the wavelength range of 210 nm to 240 nm. In some embodiments, the optoelectronic device emits ultraviolet light in the wavelength range of 240 nm to 300 nm, or in the wavelength range of 260 nm to 290 nm. When the optoelectronic device is configured as a light emitting device, the optical energy is generated by recombination of electrically active holes and electrons supplied by the p-type active region and the n-type active region. The recombination of holes and electrons can occur in a region substantially between the p-type active region and the n-type active region, for example, in the i-type active region or around an interface of the p-type active region and n-type active region when an i-type active region is omitted. In some cases, the semiconductor structure can include an i-type active region between two n-type active regions, or an i-type active region between two p-type active regions, and the light can be emitted from the i-type active region.

Each layer in each unit cell in the one or more superlattices (e.g., in the n-type, i-type and/or p-type active regions, and/or in a buffer layer or other layer in the structure) has a thickness that can be selected to control electronic and optical properties of the optoelectronic device by controlling quantized energy states and spatial wavefunctions for electrons and holes in the electronic band structure of the superlattice. From this selection a desired electronic and optical energy can be achieved. In some embodiments, an average thickness in the growth direction of each of the plurality of unit cells is constant within at least one of the one or more superlattices. In some embodiments, the unit cells in two or more of the n-type active region, the p-type active region and the i-type active region have different average thicknesses.

In some embodiments, one of the at least two layers of each of the plurality of unit cells within at least a portion of the one or more superlattices comprises from 1 to 10 monolayers of atoms, or from 1 to 100 monolayers, along the growth direction and the other one or more layers in each of the respective unit cells comprise a total of 1 to 10 monolayers, or from 1 to 100 monolayers, of atoms along the growth direction where the thickness of a unit cell will vary in accordance with the number of monolayers. As an example, the thickness of a monolayer could vary from about 1 Å to about 10 Å. In some embodiments, all or a majority of the distinct substantially single crystal layers of each unit cell within each superlattice have a thickness of 1 monolayer to 10 monolayers, or from 1 to 100 monolayers, of atoms along a growth direction. In some embodiments, at least two layers in each of the plurality of unit cells each have a thickness of less than or equal to 6 monolayers, or less than or equal to 20 monolayers, or less than or equal to 100 monolayers, of a material of which the respective layer is composed along the growth direction. In some embodiments, the thickness of each unit cell is chosen based on the composition of the unit cell.

An average alloy content (or, an effective alloy content, or average alloy composition, or average composition) of each of the plurality of unit cells can be constant or non-constant along the growth direction within at least one of the one or more superlattices. Maintaining a constant average alloy content enables lattice matching of the effective in-plane lattice constant of the unit cells of dissimilar superlattices. In some embodiments, throughout the semiconductor structure, unit cells that are adjacent to one another have substantially the same average alloy content. In some embodiments, the average alloy content of each of the plurality of unit cells is constant in a substantial portion of the semiconductor structure. In some cases, the average alloy content is constant through two adjacent superlattices in the semiconductor structure by using the same materials compositions in the layers of the unit cells of the adjacent superlattices, and by keeping the ratio of thicknesses of the layers of the unit cells constant through two or more superlattices of the semiconductor structure. For example, a well layer of $(Al_xGa_{1-x})_2O_3$ with a first thickness and barrier layer of $(Al_yGa_{1-y})_2O_3$ with a second thickness (where $0 \leq x \leq 1$ and $0 \leq y \leq 1$, x and y are different values, and y is greater than x) can be used to form a unit cell of a first superlattice. A second superlattice can then be formed, adjacent to the first superlattice, with unit cells having layers of the same compositions of $(Al_xGa_{1-x})_2O_3$ and $(Al_yGa_{1-y})_2O_3$ (i.e., where x and y are the same as those in the unit cells of the first superlattice) with a ratio of thicknesses between the layers that is equal to a ratio of the first thickness and the second thickness.

In some embodiments, the at least two distinct substantially single crystal layers of each unit cell in the one or more superlattices (e.g., in the n-type, i-type and/or p-type active regions) have a crystal symmetry that is hexagonal, orthorhombic, monoclinic and/or cubic (e.g., $(Al_xGa_{1-x})_yO_z$ with a space group that is R3c, Pna21, C2m, Fd3m, and/or Ia3) and have a crystal polarity in the growth direction that is either a metal-polar polarity or oxygen-polar polarity. In some embodiments, the crystal polarity is spatially varied along the growth direction, the crystal polarity being alternately flipped between the oxygen-polar polarity and the metal-polar polarity.

In some cases, each of the at least two distinct substantially single crystal layers of each unit cell in each superlattice comprises at least one of the following compositions: a binary composition single crystal semiconductor material $(A_xO_y)$, where $0 \leq x \leq 1$ and $0 \leq y \leq 1$; a ternary composition single crystal semiconductor material $(A_uB_{1-u}O_y)$, where $0 \leq u \leq 1$ and $0 \leq y \leq 1$; and/or a quaternary composition single crystal semiconductor material $(A_pB_qC_{1-p-g}O_y)$, where $0 \leq p \leq 1$, $0 \leq q \leq 1$ and $0 \leq y \leq 1$. Here A, B and C are distinct metal or non-metal atoms selected from group II and/or group III elements, rare earth elements, and/or Ga, Al, Mg, Ni, Zn, Bi, Ge, Ir, Li, Gd and/or Er; and O is oxygen.

For example, each of the at least two distinct substantially single crystal layers of each unit cell in each superlattice (e.g., in the n-type, i-type and/or p-type active regions, and/or in a buffer layer or other layer in the structure) can comprise at least one of the following compositions: aluminium oxide $(Al_2O_3)$; gallium oxide $(Ga_2O_3)$; aluminium gallium oxide ($(Al_xGa_{1-x})_2O_3$, where $0 \leq x \leq 1$, or $(Al_xGa_{1-x})_yO_z$, where $0 \leq x \leq 1$, $1 \leq y \leq 3$, and $2 \leq z \leq 4$); NiO; $(Mg_xZn_{1-x})_z(Al_yGa_{1-y})_{2(1-z)}O_{3-2z}$, where $0 \leq x \leq 1$, $0 \leq y \leq 1$, $0 \leq z \leq 1$; $(Mg_xNi_{1-x})_z(Al_yGa_{1-y})_{2(1-z)}O_{3-2z}$, where $0 \leq x \leq 1$, $0 \leq y \leq 1$, $0 \leq z \leq 1$; $MgAl_2O_4$; $MgGa_2O_4$; $ZnGa_2O_4$; $ZnAl_2O_4$; MgO; LiF; $MgF_2$; and/or other epitaxial oxide materials from FIGS. 28, 76A-1, 76A-2 and 76B. In some embodiments, one of the at least two distinct substantially single crystal layers comprises a narrower band gap material and another of the at least two distinct substantially single crystal layers comprises a wider bandgap material.

In some embodiments, one or more of the at least two distinct substantially single crystal layers of each unit cell is formed of a metal. For example, each unit cell can comprise an aluminium (Al) layer and an aluminium oxide $(Al_2O_3)$ layer.

In some embodiments, one or more layers of each unit cell of the one or more superlattices is not intentionally doped with an impurity species, for example, in the n-type active region, the p-type active region and/or the i-type active region. Alternatively or additionally, one or more layers of each unit cell of the one or more superlattices of the n-type active region and/or the p-type active region is intentionally doped with one or more impurity species or formed with one or more impurity species.

In some embodiments, the semiconductor structures with one or more superlattices containing an epitaxial oxide material are incorporated into n-type or p-type regions (and/or layers). In some cases, the semiconductor structures described herein can contain one or more superlattices containing an epitaxial oxide material and additionally contain n-type and/or p-type region(s) (and/or layer(s)) containing an epitaxial oxide material.

For example, an n-type region (and/or layer) containing an epitaxial oxide material (either in a superlattice, or not in a superlattice) can comprise $(Mg_xZn_{1-x})_z(Al_yGa_{1-y})_{2(1-z)}O_{3-2z}$, where $0 \leq x \leq 1$, $0 \leq y \leq 1$ and $0 \leq z \leq 1$, or $(Al_xGa_{1-x})_2O_3$, where $0 \leq x \leq 1$, and a donor material such as Si; Ge; Sn; rare earth elements (e.g., Er and Gd); and/or group III elements such as Al, Ga, and In. In another example, the n-type region (and/or layer) can contain $Mg_2GeO_4$ and a donor material such as one or more group III elements such as Al, Ga, and/or In.

For example, a p-type region (and/or layer) containing an epitaxial oxide material (either in a superlattice, or not in a superlattice) can comprise $(Mg_xNi_{1-x})_z(Al_yGa_{1-y})_{2(1-z)}O_{3-2z}$, where $0 \leq x \leq 1$, $0 \leq y \leq 1$ and $0 \leq z \leq 1$, and an acceptor material such as Li, N, Ir, Bi and/or Pd. For example, the p-type region (and/or layer) containing an epitaxial oxide material (either in a superlattice, or not in a superlattice) can comprise $Mg_xGa_{2(1-x)}O_{3-2x}$, where $x \leq 0.1$, that is p-type due to a substitution of $Ga^{3+}$ cation sites by $Mg^{2+}$ cations.

At least a portion of the at least one of the one or more superlattices can include a uniaxial strain, a biaxial strain or a triaxial strain. In some cases, the strain can modify the band structure of the material (e.g., convert an indirect bandgap to a direct bandgap) and/or a level of activated impurity doping. In some cases, by the action of crystal deformation in at least one crystal direction, the induced strain can deform advantageously the energy band structure of the materials in the layers of the one or more superlattices. The resulting energy shift of the conduction or valence band edges can then be used to reduce the activation energy of a given impurity dopant relative to the superlattice. For example, an epitaxial oxide material doped with an impurity can be subjected to a strain (e.g., an elastic tensile strain substantially perpendicular to the growth direction), and the resulting shift in energy of the valence band edges can result in a reduced energy separation between the valence band edge and the impurity energy level. This energy separation is known as the activation energy for holes and is temperature dependent. Therefore, in some cases, reducing the activation energy of a specific carrier due to an impurity dopant via the application of a strain dramatically improves the activated carrier density of the doped material. This built-in strain can be selected during an epitaxial material formation step during the formation of the superlattice. Therefore, strain can enhance the activation energy of one or more of the intentionally doped regions that contain the impurity species. This improves an electron or hole carrier concentration in the one or more of the intentionally doped regions.

FIG. 116A is a diagram showing a sectional view of a semiconductor structure (or stack) 7100 for an optoelectronic device according to some embodiments of the present semiconductor structures with one or more superlattices containing an epitaxial oxide material. In one embodiment, the optoelectronic device is a Light Emitting Diode (LED). However, it should be appreciated that the present semiconductor structures may also be adapted to fabricate superluminescent LEDs and lasing devices with the positioning of suitable reflective layers or mirrors in the optoelectronic device.

The stack 7100 comprises a crystalline substrate 7110. A buffer region 7112 is grown first on the substrate 7110 followed by a semiconductor structure 7114. The buffer region 7112 and the semiconductor structure 7114 are formed or grown in a growth direction indicated by arrow 7101. The buffer region 7112 includes a buffer layer 7120 and one or more superlattices 7130. In some embodiments, the buffer region acts as a strain control mechanism providing a predetermined in-plane lattice constant.

The semiconductor structure 7114 comprises, in growth order, an n-type active region 7140, an i-type active region 7150 and a p-type active region 7160. A p-type contact layer 7170 is optionally formed on the p-type active region 7160. A first contact layer 7180 is formed on the p-type contact layer 7170 or the p-type active region 7160 if the p-type contact layer is not present. In some embodiments, at least one region of the semiconductor structure is substantially transparent to an optical energy emitted by the optoelectronic device. For example, the p-type active region and/or the n-type active region can be transparent to the emitted optical energy.

In some embodiments, the substrate 7110 has a thickness of between 300 μm and 1,000 μm. The thickness of the substrate 7110 can be chosen based on a diameter of the substrate 7110. For example, a substrate having a diameter of two inches (25.4 mm) and made of c-plane sapphire may have a thickness of about 400 μm and a substrate having a diameter of six inches may have a thickness of about 1 mm. The substrate 7110 can be a native substrate made of a native material that is native to the n-type active region or a non-native substrate made from a non-native material that is non-native to the n-type active region. For example, the substrate can include single crystal $Ga_2O_3$ (e.g., $\beta$-$Ga_2O_3$), sapphire (e.g., A-plane sapphire, C-plane sapphire, M-plane sapphire, or R-plane sapphire), or MgO.

The buffer region 7112 functions as a transition region between the substrate 7110 and semiconductor structure 7114. For example, the buffer region 7112 can provide a better match in lattice structure between the substrate 7110 and the semiconductor structure 7114 than without a buffer region present. For example, the buffer region 7112 may comprise a bulk like buffer layer followed by at least one superlattice designed to achieve a desired in-plane lattice constant suitable for depositing the one or more superlattices of the semiconductor structure of the device. The buffer region may or may not include a superlattice. In some cases, the buffer layer can include a single layer of constant composition, a single layer with a gradient in composition, and/or a plurality of layers with step changes in composition (i.e., with a step-wise composition gradient). In some cases, the buffer region can include a superlattice and one or more of a single layer of constant composition, a single layer with a gradient in composition, and/or a plurality of layers with step changes in composition (i.e., with a step-wise composition gradient). Some examples of materials comprising buffer region 7112 are $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$; NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; and $(Mg_xZn_{1-x-y}Ni_y)_2GeO_4$ where $0 \le x \le 1$, $0 \le y \le 1$.

In some embodiments, the buffer layer 7120 in the buffer region 7112 has a thickness of between 50 nm and several micrometers, or between 100 nm and 500 nm. The buffer layer 7120 can be made from any material that is suitable for matching (e.g., within a certain amount of mismatch, such as within 2% in-plane lattice constant mismatch) the lattice structure of the substrate 7110 to the lattice structure of a lowest layer of the one or more superlattices. For example, if the lowest layer of the one or more superlattices is made of a group III metal oxide material, such as $(Al_xGa_{1-x})_2O_3$, the buffer layer 7120 can be made of the same metal oxide material, such as $(Al_xGa_{1-x})_2O_3$ of the same (or similar) composition. In alternative embodiments, the buffer layer 7120 can be omitted.

The one or more superlattices 7130 in the buffer region 7112 and the one or more superlattices in the semiconductor structure 7114 can each be considered to comprise a plurality of unit cells. For example, the unit cells 7132 are in the buffer region 7112, the unit cells 7142 are in the n-type active region 7140, the unit cells 7152 are in the i-type active region 7150, and the unit cells 7162 are in the p-type active region 7160. Each of the plurality of unit cells comprises two distinct substantially single crystal layers. A first layer in each unit cell is labelled "A" and a second layer in each unit cell is labelled "B".

In a region of the semiconductor structure, the first layer and/or the second layer in each unit cell in a superlattice in that region can have the same or a different composition as those in a different region, and/or the same or a different thickness as those in a different region. For example, FIG. 116A shows the first layers and the second layers having a greater thickness in the i-type active region 7150 than in the n-type active region 7140 and the p-type active region 7160.

The n-type active region 7140 provides n-type conductivity. In some embodiments, one or both of the first layer 7142A and the second layer 7142B in each unit cell 7142 in the n-type active region 7140 is doped with, or formed of, a dopant material, such as the donor and acceptor materials described herein. In some embodiments, the dopant material is different in the first layer and the second layer of each unit cell. Some examples of materials comprising n-type active region 7140 are $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$; NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; and $(Mg_xZn_{1-x-y}Ni_y)_2GeO_4$ where $0 \le x \le 1$, $0 \le y \le 1$, doped with a donor material, as described herein.

The i-type active region 7150 is the main active region of the optoelectronic device. In some embodiments, the i-type active region is designed to optimize the spatial electron and hole recombination and to emit a selected emission energy or wavelength. In some embodiments, the first layer 7152A and the second layer 7152B in each unit cell 7152 of the i-type active region 7150 have a thickness that is adjusted to control the quantum mechanical allowed energies of electrons and holes within the unit cell or the i-type active region 7150. As the thickness of each layer of the unit cells is 1 to 10 monolayers in some embodiments, a quantum description and treatment of the superlattice structure is necessary to determine the electronic and optical configuration. Some examples of materials comprising the i-type active region 7150 are $(Al_xGa_{1-x})_2O_3$ where 0≤x≤1; $(Al_xGa_{1-x})_yO_z$ where 0≤x≤1, 1≤y≤3, and 2≤z≤4; NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1.

Additionally, in some cases, group III metal oxide materials having a polar nature are used to form the layers, and there are internal electric fields across each heterojunction of the unit cell and the one or more superlattices. For example, $(Al_xGa_{1-x})_2O_3$, where 0≤x≤1, with a Pna21 space group is a polar epitaxial oxide material. Built-in electric fields can form due to spontaneous and/or induced piezoelectric charges that occur at each heterojunction. The complex spatial band structure along the growth direction creates a non-trivial potential variation in the conduction and valence bands which is modulated by the spatial variation in composition between the layers of the unit cells. This spatial variation is of the order of the deBroglie wavelength of the respective carriers within the conduction and valence bands, and thus requires a quantum treatment of the resulting confined energy levels and spatial probability distribution (defined herein as the carrier wavefunction) within the one or more superlattices.

Furthermore, for polar epitaxial oxide materials, a crystal polarity of the semiconductor structure can be selected from either a metal-polar or an oxygen-polar growth along the growth direction 7101, for example, for one or more superlattices formed of group III metal oxide materials. Depending on the crystal polarity of the semiconductor structure, at least a portion of the i-type active region 7150 can be further selected to optimize the optical emission. For example, a metal-polar oriented growth along the growth direction 7101, can be used to form a superlattice in the i-type active region of an n-i-p stack (e.g., comprising alternating layers of polar $Al_xGa_{1-x}O_3$ and $Al_yGa_{1-y}O_3$ materials). As the n-type active region in an n-i-p stack is formed closest to the substrate, the i-type active region can have a linearly increasing depletion field across it spanning the distance between the n-type active region and the p-type active region. The i-type active region superlattice can then be subjected to yet a further electric field due to the built-in depletion field of the n-i-p stack. Alternatively, the built-in depletion field across the i-type active region can be generated in other configurations. For example, the stack can be a p-i-n stack with the p-type active region 7160 closest to the substrate and/or grown using oxygen-polar crystal growth orientation along 7101.

The depletion field across the depletion region of a p-n stack or the i-type active region 7150 of a p-i-n stack can also partially set an optical emission energy and emission wavelength of the optoelectronic device. In some embodiments, one or both of the first layer 7152A and the second layer 7152B in each unit cell in the i-type active region is undoped or not intentionally doped. In some embodiments, the i-type active region 7150 has a thickness less than or equal to 5 μm, less than or equal to 1 μm, less than or equal to 100 nm, greater than or equal to 1 nm, or from 1 nm to 5 μm, or from 100 nm to 3 μm. The i-type active region can have a lateral width selected from the range of 1 nm to approximately 10 μm, from 10 nm to 1 μm, or larger than 10 μm.

The total thickness of the i-type active region 7150 can be selected to further tune the depletion field strength across the i-type active region 7150 between the p-type active region 7160 and the n-type active region 7140. Depending upon the crystal growth polarity, the width and the effective electron and hole carrier concentrations of the n-type active region 7140 and the p-type active region 7160, the depletion field strength will provide either a blue-shift or a red-shift in the emission energy or wavelength of the light emitted from the i-type active region.

The p-type active region 7160 provides p-type conductivity. In some embodiments, one or both of the first layer 7162A and the second layer 7162B in each unit cell 7162 in the p-type active region is doped with, or formed of, a dopant material, such as the materials described above. Some examples of materials comprising the p-type active region 7160 are $(Al_xGa_{1-x})_2O_3$ where 0≤x≤1; $(Al_xGa_{1-x})_yO_z$ where 0≤x≤1, 1≤y≤3, and 2≤z≤4; NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1, doped with an acceptor material, as described herein.

In some embodiments, the first layer and the second layer of each of the plurality of unit cells in each of the one or more superlattices in the semiconductor structure are composed of different compositions of $(Al_xGa_{1-x})_2O_3$ where 0≤x≤1 or $(Al_xGa_{1-x})_yO_z$ where 0≤x≤1, 1≤y≤3, and 2≤z≤4. For example, the first layers can be composed of AlO, or a first composition of $(Al_xGa_{1-x})_yO_z$, and the second layers can be composed of GaO, or a second composition of $(Al_xGa_{1-x})_yO_z$. However, it should be appreciated that the first and second layers in each of the one or more superlattices can be composed of any of the materials specified above.

In some embodiments, the average alloy content, for example the average Al fraction and/or Ga fraction of the superlattices described above, of the one or more superlattices is constant. In alterative embodiments, the average alloy content of one or more of the one or more superlattices is non-constant.

In some embodiments, the average alloy content of the unit cells is the same in all superlattices of the semiconductor structure 7114 and/or stack 7100, but the period is changed between superlattices and/or within superlattices. Maintaining a constant average alloy content enables the growth of dissimilar superlattices without the constituent layers relaxing (e.g., without the constituent layers forming misfit dislocations). Such growth of each unit cell enables large numbers of periods to be formed without an accumulation of strain. For example, using a specific period of the superlattice for an n-type active region 7140 can make the n-type active region 7140 more transparent to a wavelength of the emitted light (e.g., if the period in the superlattice of the n-type active region is larger than that of the superlattice in the i-type active region). In another example, using a different period for the i-type active region 7150, would cause the light to be emitted vertically, i.e., in a same plane as the growth direction 7101 because the emitted photon will be generated with a smaller energy than the effective bandgap of the surrounding p- and n-type regions.

In some embodiments, the one or more superlattices have a constant average alloy content and an optical emission that is substantially perpendicular to the plane of the superlattice layers. For example, a vertically emitting device can be formed using superlattices with layers of $(Mg_xZn_{1-x})_z(Al_yGa_{1-y})_{2(1-z)}O_{3-2z}$, where 0≤x≤1, 0≤y≤1 and 0≤z≤1; $(Mg_xNi_{1-x})_z(Al_yGa_{1-y})_{2(1-z)}O_{3-2z}$, where 0≤x≤1, 0≤y≤1 and 0≤z≤1; and/or $(Al_xGa_{1-x})_2O_3$, where 0≤x≤1; and/or $(Al_xGa_{1-x})_yO_z$ where 0≤x≤1, 1≤y≤3, and 2≤z≤4. In yet another embodiment, a plurality of or all of the one or more of the superlattices are constructed from unit cells comprising first and second compositions of $(Al_xGa_{1-x})_2O_3$ where 0≤x≤1, or $(Al_xGa_{1-x})_yO_z$ where 0≤x≤1, 1≤y≤3, and 2≤z≤4, or $Al_2O_3$ and $Ga_2O_3$, thereby enabling an improved growth process that is optimized at a single growth temperature for only two materials.

Doping may be incorporated into the n-type active region and/or p-type active region of the one or more superlattices in several ways. In some embodiments, doping is introduced into just one of the first layer and the second layer in each unit cell. For example, Si can be introduced into $(Al_xGa_{1-x})_2O_3$, where 0≤x≤1 (or $(Al_xGa_{1-x})_yO_z$ where 0≤x≤1, 1≤y≤3, and 2≤z≤4) in the second layer of the unit cell to create an n-type material; or Li can be introduced into $(Al_xGa_{1-x})_2O_3$, where 0≤x≤1 (or $(Al_xGa_{1-x})_yO_z$ where 0≤x≤1, 1≤y≤3, and 2≤z≤4) in the second layer of the unit cell to create a p-type material. The other combinations of epitaxial oxide materials with donor or acceptor dopants that are described herein can also be used in the n-type active region or p-type active region of the one or more superlattices. In alternative embodiments, doping can be introduced into more than one layer/material in each unit cell and the dopant material can be different in each layer of the unit cell. In some embodiments, the one or more superlattices include a uniaxial strain or a biaxial strain to modify a level of activated doping.

While a single superlattice is shown in FIG. 116A for each region of the semiconductor structure, it should be appreciated that each region may include more than one superlattice stacked atop one another. For example, the n-type active layer 7140 can include a first superlattice wherein respective layers in each unit cell have a first set of material compositions and a first period and a second superlattice grown on the first super lattice wherein the respective layers in each unit cell have a second set of material compositions and a second period, where the first set of material compositions is different than the second set of material compositions, and/or where the first period is different than the second period. In some embodiments, the stack 7100 can comprise a single superlattice comprising one or more of the buffer superlattice 7130, the n-type active region 7140, the i-type active region 7150 and the p-type active region 7160.

In some cases, superlattices are entirely periodic, meaning that each unit cell of the respective superlattice has the same structure. For example, each unit cell of the respective superlattice has the same number of layers, the same layer thicknesses and the same material compositions in respective layers.

In some embodiments, multilayer structures can be formed that are aperiodic, meaning that the multilayer structure is not composed entirely of repeating unit cells of the same structure. For example, a multilayer structure can contain epitaxial oxide materials where the materials chosen for each of the layers, the thicknesses of the layers, and/or other design features of the multilayer structure vary throughout the multilayer structure.

Each of the regions in the structures described herein (e.g., in stack 7100 in FIG. 116A) can contain superlattices or multilayer structures with varying properties, and accordingly, they may have a different structure to achieve different electronic and optical properties. Thus, one region can contain a superlattice, while other regions can contain multilayer structures with varying properties. In addition, all of the regions in a stack 7100 can be superlattices, or all of the regions can be multilayer structures with varying properties. In yet another embodiment, one or more regions can contain superlattices can be periodic, while one or more regions contain multilayer structures with varying properties. For example, the buffer region can contain a multilayer structure with varying properties (e.g., having a monotonically changing average composition) to assist in lattice matching the materials of the other regions of the structure with the material of the substrate.

In some cases, the p-type contact layer 7170 (also known as a hole injection layer) is formed on top of the p-type active region of the one or more superlattices. A first contact layer 7180 is formed on the p-type contact layer 7170, such that the p-type contact layer 7170 is formed between the first contact layer 7180 and the p-type active region 7160. In some embodiments, the first contact layer 7180 is a metal contact layer. The p-type contact layer 7170 aids an electrical ohmic contact between the p-type active region 7160 and the first contact layer 7180. In some embodiments, the p-type contact layer 7170 is made from p-type $(Mg_xNi_{1-x})_z(Al_yGa_{1-y})_{2(1-z)}O_{3-2z}$, where 0≤x≤1, 0≤y≤1 and 0≤z≤1; or $(Al_xGa_{1-x})_2O_3$, where 0≤x≤1 (e.g., doped with Li); or $(Al_xGa_{1-x})_2LiO_2$ where 0≤x≤1; and has a thickness of between 5 nm and 200 nm, or between 10 nm and 25 nm. The thickness of the p-type contact layer 7170 can be optimized to reduce the optical absorption at a specific optical wavelength and/or to make the p-type contact layer 7170 optically reflective to an emission wavelength of the stack 7100. In other cases, the p-type contact layer 7170 can be omitted from semiconductor structure 7114. For example, the first contact layer 7180 can make contact directly with the p-type active region 7160.

The first contact layer 7180 enables the stack 7100 to be connected to a positive terminal of a voltage source. In some embodiments, the first contact layer 7180 has a thickness of between 10 nm and several thousand nanometers, or between 50 nm and 500 nm.

A second contact layer (not shown) is formed on the n-type active region 7140 (or in some cases to the substrate 7110, or to a layer in the buffer region 7112) to connect to a negative terminal of a voltage source. In some embodiments, the second contact layer has a thickness of between 10 nm and several thousand nanometers, or between 50 nm and 500 nm.

In some embodiments, the semiconductor structure can be inverted with respect to the semiconductor structure 7100 in FIG. 116A, and the p-type layer can be closer to the substrate than the n-type layer. In such cases, the second contact (for the n-type region) would be at the top of the structure (opposite the substrate), and the first contact (for the p-type region) could be formed on the p-type active region (or to the substrate, or to a layer in the buffer region).

The first contact layer 7180 and the second contact layer may be made from any suitable metal. In some embodiments, the first contact layer 7180 is made from a high work function metal to aid in the formation of a low ohmic contact between the p-type active region 7160 and the first contact layer 7180. If the work function of the first contact layer 7180 is sufficiently high, then the optional p-type contact layer 7170 may not be required. For example, if the substrate is transparent and insulating, the light emitted by the semiconductor structure is directed substantially out through the substrate and the p-type active region 7160 is disposed further from the substrate than the n-type active region 7140, then the first contact layer 7180 can have high optical reflectance at the operating wavelength, so as to retroreflect a portion of the emitted light back through the substrate. For example, the first contact layer 7180 can be made from metals selected from Nickel (Ni), Osmium (Os), Platinum (Pt), Palladium (Pd) and Iridium (Ir). Especially, for deep ultraviolet (DUV) operation in which the stack 7100 emits DUV light, the first contact layer 7180 may not in general fulfill the dual specification of low p-type ohmic contact and high optical reflectance. High work function p-type contact metals for epitaxial oxide materials can be poor DUV wavelength reflectors. Platinum (Pt), Iridium (Ir), Palladium (Pd) and Osmium (Os) are examples of high work function p-type contact metals to some of the epitaxial oxide compositions and superlattices described herein (e.g., $(Mg_xZn_{1-x})_z(Al_yGa_{1-y})_{2(1-z)}O_{3-2z}$, where $0 \le x \le 1$, $0 \le y \le 1$ and $0 \le z \le 1$; $(Mg_xNi_{1-x})_z(Al_yGa_{1-y})_{2(1-z)}O_{3-2z}$, where $0 \le x \le 1$, $0 \le y \le 1$ and $0 \le z \le 1$; or $(Al_xGa_{1-x})_2O_3$, where $0 \le x \le 1$).

In some cases, for ultraviolet and DUV operation of the stack 7100, aluminium can be used as the contact metal, as it has the highest optical reflectance over a large wavelength range spanning from 150 nm to 500 nm. In general, metals can be used as DUV optical reflectors due to the low penetration depth and low loss of light into the metal. This enables optical microcavity structures to be formed. Conversely, relatively medium work function metals, such as Aluminium (Al), Titanium (Ti) and Titanium Nitride (TiN) can be utilized to form low ohmic metal contacts to n-type group III metal oxide compositions and superlattices (e.g., see FIG. 55 where the extrema for creating p-type and n-type electrical contacts are shown).

It should be appreciated that the stack 7100 shown in FIG. 116A is an example of a semiconductor structure for an optoelectronic device, and that the stack 7100 may be made in many other ways. For example, the n-type active layer 7140 and the p-type active layer 7160 may be reversed such that the p-type layer 7160 is grown first. It should also be noted that the buffer layer 7120 and/or the buffer superlattice 7130 are optional layers, and the one or more superlattices can be grown directly on the substrate 7110. However, it is generally advantageous to grow the one or more superlattices on the buffer layer 7120 and/or buffer superlattice 7130, as the resulting material quality of the structure will be improved.

In some embodiments, the buffer region and the adjacent p-type or n-type active region are part of the same superlattice with the only difference between the buffer region and the p-type or n-type active region being the incorporation of an impurity dopant in the p-type or n-type active region. In some embodiments, a first superlattice is grown upon the substrate with a sufficient thickness to render the superlattice in a substantially relaxed or free-standing state with a low defect density and a preselected in-plane lattice constant.

In another embodiment, the stack 7100 may be fabricated without an i-type active layer 7150 such that the stack forms a p-n junction rather than the p-i-n junction of FIG. 116A. Furthermore, it should be appreciated that p-type contact layer 7170 is optional, and the first contact layer 7180 may be grown directly on the p-type active region 7160 of the one or more superlattices. However, in some cases it may be more difficult to fabricate the first contact layer 7180 directly on the p-type active region 7160 using conventional ex-situ fabrication techniques. For example, a thin but heavily doped p-type contact layer 7170 enables easier and more consistent post epitaxial process for metallization to achieve an ohmic contact. However, an in-situ metallization process directly onto a final epitaxial surface of the p-type active region 7160 that is free of contamination provides an alternate means for formation of the first contact layer 7180.

In some embodiments, the one or more superlattices are grown sequentially during at least one deposition cycle. That is, in some cases, dopants are introduced during epitaxy via a process of co-deposition. An alternative method is to physically grow at least a portion of the one or more superlattices without a dopant and then, post-growth, introduce the desired dopant. For example, in some embodiments, materials for the p-type region are deposited as the final sequence of the fabrication of the stack (e.g., without a co-deposited p-type dopant), and a post-growth method for incorporating a p-type dopant introduced from a surface can then be used to provide p-type conductivity to the p-type region. For example, ion-implantation and diffusion (e.g., via a spin-on dopant), followed by activation thermal anneals can be used to dope one or more layers in a post-growth process.

The semiconductor structure 7114 can be grown with a polar, non-polar or semi-polar crystal polarity oriented along the growth direction 7101. For example, a polar epitaxial oxide material (e.g., $(Al_xGa_{1-x})_2O_3$ with $0 \le x \le 1$ and a pna21 space group) can be grown which is oriented with the polarization axis being substantially perpendicular to the growth direction. These polar crystals can be metal-polar or oxygen-polar along a crystal direction parallel to the growth direction 7101.

Other growth plane orientations can also be achieved resulting in semi-polar and even non-polar crystal growth along the growth direction 7101. In one example, non-polar crystal growth of $(Al_xGa_{1-x})_2O_3$ can be formed on A-, R-, or M-plane sapphire oriented surfaces. For example, a semiconductor structure can be formed of non-polar epitaxial oxide materials (e.g., $(Al_xGa_{1-x})_2O_3$ with $0 \le x \le 1$ and a R3c, C2m, Fd3m, or Ia3 space group).

In some cases with polar materials (e.g., $\kappa$-$Al_xGa_{1-x}O_y$), the crystal polarity can be reduced from a polar to a semi-polar crystal along a growth direction, which can be advantageous for the reduction of the spontaneous and piezoelectric charges that are created at the heterojunctions in the structure. In some cases, the internal polarization charges are managed by keeping the average alloy content constant in each unit cell of the one or more superlattices. In other cases, the average alloy content in any one unit cell or superlattice varies from another, and a net polarization charge can be accumulated. Therefore, in structures with polar epitaxial oxide materials, the average alloy content in unit cells between superlattices (or within a superlattice) can be used advantageously to control the band edge energy position in the one or more superlattices relative to the Fermi energy.

In a further embodiment, a single superlattice structure is used for n-type active region 7140, the i-type active region 7150, and the p-type active region 7160 and the superlattice is strained via biaxial and/or uniaxial stresses to further affect the desired optical and/or electronic tuning.

In some embodiments, the n-type active region 7140 comprises a total thickness from 50 nm to 5000 nm, or from 200 nm to 1000 nm, or from 300 nm to 500 nm, and a total number of unit cells 7142 from 10 to 5000, or from 100 to 500, or from 150 to 350. The unit cells 7142 contain two distinct substantially single crystal layers 7142A and 7142B, one of which can be a barrier (e.g., a wider bandgap $(Al_xGa_{1-x})_yO_z$) and one of which can be a well (e.g., a narrower bandgap $(Al_xGa_{1-x})_yO_z$). The barriers in the unit cells 7142 can be from 1 monolayer (ML) to 20 ML, or from 2 ML to 12 ML, or from 4 ML to 8 ML thick. The wells in the unit cells 7142 can be from 1 ML to 10 ML, or from 0.1 ML to 3 ML, or from 0.2 ML to 1.5 ML thick.

In some embodiments, the i-type active region 7150 comprises a total thickness from less than 1 nm to 2000 nm, or from 10 nm to 2000 nm, or from 10 nm to 100 nm, or from 40 nm to 60 nm, and a total number of unit cells 7152 from 1 to 5000, or from 25 to 400, or from 10 to 100, or from 20 to 30. The unit cells 7152 contain two distinct substantially single crystal layers 7152A and 7152B, one of which can be a barrier (e.g., a wider bandgap $(Al_xGa_{1-x})_yO_z$) and one of which can be a well (e.g., a narrower bandgap $(Al_xGa_{1-x})_yO_z$). The barriers in the unit cells 7152 can be from 1 ML to 20 ML, or from 2 ML to 20 ML, or from 5 ML to 10 ML thick. The wells in the unit cells 7152 can be from 1 ML to 10 ML, or from 0.1 ML to 2 ML, or from 0.2 ML to 1.5 ML thick.

In some embodiments, the p-type active region 7160 comprises a superlattice (optionally with an approximately constant average composition), and comprises a total thickness from 20 nm to 5000 nm, or from less than 1 nm to 100 nm, or from 10 nm to 100 nm, or from 30 nm to 50 nm, and a total number of unit cells 7162 from 1 to 5000, or from 1 to 7100, or from 1 to 10. The unit cells 7162 can contain two distinct substantially single crystal layers 7162A and 7162B, one of which can be a barrier (e.g., a wider bandgap $(Al_xGa_{1-x})_yO_z$) and one of which can be a well (e.g., a narrower bandgap $(Al_xGa_{1-x})_yO_z$). The barriers in the unit cells 7162 can be from 0 ML to 20 ML, or from 1 ML to 20 ML, or from 0 ML to 12 ML, or from 4 ML to 8 ML thick. The wells in the unit cells 7162 can be from 1 ML to 10 ML, or from 0.5 ML to 6 ML, or from 0.2 ML to 1.5 ML thick.

In some embodiments, the p-type active region 7160 comprises a superlattice with an average composition (or average alloy content) that changes through the thickness of the superlattice, and the p-type active region 7160 comprises a total thickness from less than 1 nm to 100 nm, or from 10 nm to 100 nm, or from 10 nm to 30 nm, and a total number of unit cells 7162 from 1 to 50, or from 1 to 20, or from 5 to 15. The unit cells 7162 contain two distinct substantially single crystal layers 7162A and 7162B, one of which can be a barrier (e.g., a wider bandgap $(Al_xGa_{1-x})_yO_z$) and one of which can be a well (e.g., a narrower bandgap $(Al_xGa_{1-x})_yO_z$). In the embodiments where the average composition changes through the thickness of the superlattice, the starting and ending thickness of the barriers and/or the wells in unit cells 7162 can be different. In such cases, the starting thickness of the barriers (e.g., a wider bandgap $(Al_xGa_{1-x})_yO_z$) in the unit cells 7162 can be from 2 ML to 8 ML, or from 3 ML to 5 ML; the starting thickness of the wells (e.g., a narrower bandgap $(Al_xGa_{1-x})_yO_z$) in the unit cells 7162 can be from 0.0 ML to 2 ML, or from 0.2 ML to 0.3 ML; the ending thickness of the barriers (e.g., a wider bandgap $(Al_xGa_{1-x})_yO$) in the unit cells 7162 can be from 0 ML to 8 ML, or from 3 ML to 5 ML; and the ending thickness of the wells (e.g., a narrower bandgap $(Al_xGa_{1-x})_yO$) in the unit cells 7162 can be from 4 ML to 20 ML, or from 5 ML to 10 ML. Some of the preceding ranges contain layers with thicknesses of 0 ML. These cases describe situations where the starting and/or ending thickness of the barriers and/or wells is 0 ML, meaning that the unit cell at the start or the end of the superlattice contains only one layer, either a barrier or a well.

FIG. 116B is a diagram showing a sectional view of a semiconductor structure (or stack) 7100B for an optoelectronic device according to some embodiments. The layers in stack 7100B are the same as those in stack 7100 shown in FIG. 116A, except that the p-type active region 7160 does not include a superlattice in stack 7100B. The p-type active region 7160 can be a layer with an approximately constant or varying composition through the layer.

FIG. 116C is a diagram showing a sectional view of a semiconductor structure (or stack) 7100C for an optoelectronic device according to some embodiments. The layers in stack 7100C are the same as those in stack 7100 shown in FIG. 116A, except that the n-type active layer 7140 does not include a superlattice in stack 7100C. The n-type active layer 7140 can be a layer with an approximately constant or varying composition through the layer.

In other embodiments, the semiconductor structures with one or more (optionally adjacent) epitaxial oxide superlattices described herein can have fewer regions than shown in structures 7100, 7100B and 7100C. For example, a semiconductor structure can comprise an n-type region similar to n-type region 7140, adjacent to a p-type region similar to p-type active region 7160, to form a p-n junction (rather than a p-i-n junction device as shown in structures 7100, 7100B and 7100C).

In other embodiments, the semiconductor structures with one or more (optionally adjacent) epitaxial oxide superlattices described herein can have the regions 7140, 7150, and 7160 described above arranged to form n-i-n, p-i-p, n-p-n, and p-n-p semiconductor structures. For example, the semiconductor structure can be an n-p-n vertical transistor structure formed using an n-type region similar to n-type region 7140, adjacent to a p-type region similar to p-type region 7160, adjacent to an n-type region similar to n-type region 7140.

In some cases, the epitaxial oxide superlattices in buffer region 7130, n-type active region 7140, i-type active region 7150, and/or p-type region 7160 can be composed entirely of unit cells with a first layer of $(Al_xGa_{1-x})_2O_3$ where $0 \le x \le 1$, and a second layer of $Ga_2O_3$ or $Al_2O_3$. For example, the buffer region 7130, n-type active region 7140, i-type active region 7150, and the p-type region 7160 can be composed of unit cells with a first layer of $(Al_xGa_{1-x})_2O_3$ where x is about 0.5, and a second layer of $Ga_2O_3$. In this example, the period of the unit cells (or the width of the $Ga_2O_3$ wells) could be longer in the i-type active region 7150 than the other regions such that the other regions would be transparent (or have low optical absorption) to light emitted by the i-type active region 7150. In another example, the buffer region 7130, n-type active region 7140, and i-type active region 7150 can be composed of unit cells with a first layer of $(Al_xGa_{1-x})_2O_3$ where x is about 0.5, and a second layer of $Al_2O_3$. In this example, the period of the unit cells (or the width of the $(Al_xGa_{1-x})_2O_3$ wells) could be longer in the i-type active region 7150 than the other regions such that the other regions would be transparent (or have low optical absorption) to light emitted by the i-type active region 7150. In some cases of the above examples, the ratio of the first layer to the second layer of the unit cells would be maintained constant throughout adjacent superlattices and as a result the average alloy composition (or Al fraction) of the adjacent superlattices is also constant.

FIG. 117 is a diagram showing a sectional view of a semiconductor structure (or stack) 7200 for an optoelectronic device according to an embodiment of the present semiconductor structures with one or more superlattices containing an epitaxial oxide material. The layers in stack 7200 are the same as those in the stack 7100 of FIG. 116A, except that the buffer region of stack 7200 does not comprise one or more superlattices (i.e., 7130 in FIG. 116A). The buffer layer 7120 can be a layer with an approximately constant or varying composition through the layer.

In some cases, the structures 7100, 7100B, 7100C and 7200 can be p-i-n structures, as described above, with band diagrams similar to those shown in FIG. 99 or 100.

FIG. 118 is a diagram showing a sectional view of an optoelectronic device 7300 according to an embodiment of the present semiconductor structures with one or more superlattices containing an epitaxial oxide material. The optoelectronic device 7300 contains layers that are the same as or similar to the layers of stacks 7100, 7100B, 7100C and 200 of FIGS. 116A-116C and 117. The optoelectronic device 7300 comprises a substrate 7110 on which a buffer layer 7120 and a semiconductor structure 7114 are formed. The semiconductor structure 7114 comprises, in growth order, an n-type active region 7140, an i-type active region 7150 and a p-type active region 7160. An optional p-type contact layer 7170 is formed on the p-type active region 7160 and a first contact layer 7180 is formed on the p-type contact layer 7170.

In the embodiment shown in FIG. 118, the i-type active region 7150, the p-type active region 7160, p-type contact layer 7170 and the first contact layer 7180 form a mesa on the n-type active region 7140. The mesa shown in FIG. 118 has straight sidewalls. However, in alternative embodiments, the mesa can have angled side walls. The device 7300 further comprises a second contact layer 7382 formed on the n-type active region 7140. In some embodiments, the second contact layer 7382 forms a ring or loop around the mesa. The second contact layer 7382 enables a negative terminal of a voltage source to be connected to the n-type active region 7140. The second contact layer 7382 can be composed of any metal, for example, the low work function n-type contact metals described with respect to stack 7100 in FIG. 116A. The device 7300 further comprises a passivation layer 7390 that covers the exposed or physically etched layers of the one or more superlattices. The passivation layer 7390 is preferably made of a material (e.g., $Al_2O_3$, LiF or MgF) having a wider band gap than the exposed or physically etched layers that it covers. The passivation layer 7390 reduces current leakage between the layers of the one or more superlattices.

The device 7300 can be operated as a vertically emissive device or a waveguide device. For example, in some embodiments, the optoelectronic device 7300 can behave as a vertically emissive device with light out-coupled from the interior of an electron-hole recombination region of the i-type active region 7150 through the n-type active region 7140 and the substrate 7110. In some embodiments, light propagating upwards (in the growth direction) in the optoelectronic device 300 is also retroreflected, for example, from the first contact layer 7180.

FIG. 119 is a diagram showing a sectional view of an optoelectronic device 7400 according to an embodiment of the present semiconductor structures with one or more superlattices containing an epitaxial oxide material. The optoelectronic device 7400 is similar to the optoelectronic device 7300 of FIG. 118. However, the optoelectronic device comprises a first lateral contact 7486 and a second lateral contact 7484.

The first lateral contact 7486 extends partially into the p-type active region 7160 from the first contact layer 7180. In some embodiments, the first lateral contact 7486 is an annular shaped protrusion extending from the first contact layer 7180 into in the p-type active region 7160 and (where applicable) the p-type contact layer 7170. In some embodiments, the first lateral contact 7486 is made from the same material as the first contact layer 7180 (e.g., the high work function p-type contact metals described with respect to stack 7100 in FIG. 116A).

The second lateral contact 7484 extends partially into the n-type active region from the second contact layer 7382 formed on a surface of the n-type active region 7140. In some embodiments, the second lateral contact 7484 is an annular shaped protrusion extending into in the n-type active region 7140 from the second contact layer 7382. In some embodiments, the second lateral contact 7484 is made from the same material as the second contact layer 7382 (e.g., the low work function n-type contact metals described with respect to stack 7100 in FIG. 116A) to improve electrical conduction between the n-type active region 7140 and the second contact layer 7382.

In some embodiments, the first lateral contact 7486 and the second lateral contact 7484 contact a plurality of narrower bandgap layers of the one or more superlattices in the semiconductor structure, and therefore couple efficiently for both vertical transport of charge carriers perpendicular to the plane of the layers and parallel transport of charge carriers parallel to the plane of the layers. In general, carrier transport in the plane of the layers achieves higher mobility than carrier transport perpendicular to the plane of the layers. However, efficient transport perpendicular to the plane of the layers can be achieved by using thin wider bandgap layers to promote quantum mechanical tunnelling. For example, in a superlattice comprising alternating layers of wider and narrower bandgap $(Al_xGa_{1-x})_yO_z$, it is found that electron tunnelling between adjacent allowed energy states in each narrower bandgap layer is enhanced when the interposing wider bandgap layers have a thickness of less than or equal to 10 ML, less than or equal to 4 ML, or less than or equal to 2 ML. Holes on the other hand, and in particular the heavy-holes, have a tendency to remain confined in their respective narrower bandgap layers and be effectively uncoupled by tunnelling through the wider bandgap layers, which act as barriers, when the wider bandgap layers have thicknesses of 4 ML of greater, 2 ML or greater, or 1 ML or greater.

In some embodiments, the first lateral contact 7486, and the second lateral contact 7484 improve electrical conductivity between the first contact layer 7180 and the p-type active region 7160, and between the second contact layer 7382 and the n-type active region 7140, respectively, by making use of a superior in-plane carrier transport compared to a vertical transport across the layer band discontinuities of the superlattice. The first lateral contact 7484 and the second lateral contact 7486 can be formed using post-growth patterning (e.g., using photolithography, etching, and metal deposition techniques such as evaporation or sputtering) and production of 3D electrical impurity regions to discrete depths (e.g., using photolithography and ion implantation).

FIG. 120 is a diagram showing a sectional view of an optoelectronic device 7500 according to an embodiment of the present semiconductor structures with one or more superlattices containing an epitaxial oxide material. The optoelectronic device 7500 is similar to the optoelectronic device 7400 of FIG. 119, except that the optoelectronic device 7500 does not include a p-type contact layer 7170 and the first lateral contact 7486 is surrounded by an enhancement layer 7588, such as a layer of p-type $(Al_xGa_{1-x})_yO_z$, between the first lateral contact 7486 and the p-type active region 7160. The enhancement layer 7588 can improve an ohmic connection between the p-type active region 7160 and the first contact layer 7180. The enhancement layer 7588 can be created by selective area regrowth upon a patterned surface of the p-type active region 7160.

FIG. 121 is a diagram showing a sectional view of an optoelectronic device 7600 according to an embodiment of the present semiconductor structures with one or more superlattices containing an epitaxial oxide material. The optoelectronic device 7600 is similar to the optoelectronic device 7500 of FIG. 120. However, the first contact layer 7680 is annular shaped and a reflector layer 7692 is provided to improve the out-coupling of the optical energy generated within the semiconductor structure. The reflector layer 7692 is positioned atop the optoelectronic device 7600 to substantially retroreflect emitted light from the interior of the optoelectronic device 7600.

In some embodiments, the passivation layer 7390 is also provided within the annulus formed by the first contact layer 7680, and the reflector 7692 is formed atop of the passivation layer 7390. In alternative embodiments, the reflector 7692 may be formed on top of the p-type active region 7160, or, if present, the p-type contact layer 7170.

FIG. 122 is a diagram showing a perspective view of an optoelectronic device 7700 according to an embodiment of the present semiconductor structures with one or more superlattices containing an epitaxial oxide material. The optoelectronic device 7700 is similar to the optoelectronic device 7600 of FIG. 121. However, the optoelectronic device 7700 comprises a buffer region superlattice 7130 and the passivation layer 7390 is not shown. The first contact layer 7680 and the reflector layer 7692 are shown above the p-type active region 7160 on the mesa. The second contact layer 7382 is formed on the buffer region superlattice 7130 as a ring around the mesa.

FIG. 123 is a diagram showing a sectional view of an optoelectronic device 7800 according to an embodiment of the present semiconductor structures with one or more superlattices containing an epitaxial oxide material. The optoelectronic device 7800 is similar to the optoelectronic device 7600 of FIG. 121. However, the optoelectronic device 7800 does not comprise the enhancement layer 7588 that is present in optoelectronic device 7600 of FIG. 121.

As shown in FIG. 123, upon application of an external voltage and current source between the first contact layer 7680 and the second contact layer 7382, holes 7802 are injected into the p-type active region and combine, for example at point 7808, with electrons 7804 injected into the n-type active region 7140. The injected electrons 7804 and holes 7802 recombine advantageously in the electron-hole recombination (EHR) region 7809 that is substantially confined spatially within the i-type active region 7150. The EHR region 7809 generates photons via electron-hole recombination with an energy and optical polarization of the photons dictated by the energy-momentum band structure of the one or more superlattices. The EHR region 7809 can be shapes other than what is shown in FIG. 123, for example, the EHR region can be substantially planar, or be located anywhere within the i-type active region 7150. As illustrated in FIG. 123, the EHR emits photons 7806A, 7806B, 7806C, 7806D, in directions that can be classified as substantially in the plane of the layers or vertically parallel to the growth direction. Light can also propagate in other directions and can propagate in a non-trivial way within the structure. In general, light generated with a propagation vector that is substantially vertical and within an escape cone (determined by the angle of total internal reflection and thus the refractive index of the materials in the structure) will be the major source of photons that can be out-coupled vertically through the transparent substrate 7110. Photons 7806A are emitted in a generally vertical direction and in the same direction as the growth direction 7101 shown in FIG. 116A. Photons 7806B are emitted in a generally vertical direction and in an opposite direction to the growth direction 7101. Photons 7806C and 7806D are emitted in a generally horizontal direction, parallel to the layers of the device, for example, parallel to the plane of the layers of the i-type active region 7150.

In the embodiment shown in FIG. 123, some of the photons 7806A are reflected off the optical reflector 7692 and can then exit the light emitting device 7800 through the substrate 7110. It should be appreciated that with the addition of suitable mirrors (not shown) or an advantageous optical cavity and refractive index discontinuity between the substrate and i-type active region, the device may therefore be modified to produce a microcavity LED or laser or a superluminescent LED. Superluminescence is found to improve the extraction efficiency of light by limiting the number of optical modes available for the generated light to couple into. This effective optical phase space compression can improve selectivity of the device for advantageous vertical emission. An optical cavity can be formed using the total optical thickness formed by the buffer layer 7120, the n-type active region 7140, the i-type active region 7150 and the p-type active region 7160. If the optical cavity is formed between the reflector 7692 and the substrate 7110 and the thickness of the optical cavity along the growth direction is less than or equal to one wavelength of the emission wavelength, then the cavity is a microcavity. Such a microcavity possesses the properties necessary to create superluminescence and stable wavelength operation imposed by the optical cavity mode wavelength. In some embodiments of the present semiconductor structures, an emission wavelengthIm the EHR region 7809 is equal to the lowest order wavelength cavity mode of the microcavity and superluminescence is achieved. A second optical reflector (e.g., a distributed Bragg reflector (DBR)) can also be included within the buffer layer 7120 (or within the buffer region 7112 of the structures shown in FIGS. 116A-116C).

In some embodiments, a transparent region (e.g., the n-type active region 7140) is provided between the i-type active region (where light is emitted) and the buffer layer 7120 and the substrate 7110, and the buffer layer 7120 is transparent to optical energy emitted from the device. The optical energy is coupled externally through the transparent region, the buffer layer 7120 and the substrate 7110. Photons 7806C, 7806D are emitted in a generally horizontal direction, parallel to the layers of the device, for example, parallel to the plane of the layers of the p-type active region 7160.

In some embodiments, the optoelectronic device emits light having a substantially transverse magnetic optical polarization with respect to the growth direction. In such cases, the optoelectronic device can operate as an optical waveguide with light spatially generated and confined along a direction substantially parallel to the plane of the one or more layers of the unit cells of the one or more superlattices of the semiconductor structure.

In some embodiments, the optoelectronic device emits light having a substantially transverse electric optical polarization with respect to the growth direction. In such cases, the optoelectronic device can operate as a vertically emitting cavity device with light spatially generated and confined along a direction substantially perpendicular to the plane of the one or more layers of the unit cells of the one or more superlattices of the semiconductor structure. The vertically emitting cavity device can have a vertical cavity disposed substantially along the growth direction and formed using reflectors (e.g., metallic reflectors) spatially disposed along one or more portions of the semiconductor structure. The reflectors can be made from a high optical reflectance metal. In some cases, the cavity defined by the optical length between the reflectors is less than or equal to a wavelength of the light emitted by the device. The emission wavelength of the optoelectronic device of such devices can be determined by the optical emission energy of the one or more superlattices comprising the semiconductor structure and optical cavity modes determined by the vertical cavity.

FIG. 124 shows schematically an example of the atomic forces (or stresses) 73210 and 73220 present in a structure 73200 comprising two unit cells 73270 and 73280. Each unit cell comprises two layers and each of the two layers is formed of a dissimilar material, for example, first layers 73230 and 73250 can be wider bandgap $(Al_xGa_{1-x})_yO_z$ layers and second layers 73240 and 73260 can be narrower bandgap $(Al_xGa_{1-x})_yO_z$ layers. The layers are formed by epitaxial deposition of crystals, which are elastically deformed due to the dissimilar crystal lattice constants in each adjacent layer. The balancing of the stresses between the layers in the structure between compressive stress 73220 and tensile stress 73210 can be beneficial for producing multilayer structures with high crystal quality (e.g., low concentrations of point defects and dislocations). Continuing with the example above, the narrower bandgap $(Al_xGa_{1-x})_yO_z$ has a lower Al content and a smaller lattice constant (in a relaxed state), which would cause it to be in tensile stress as shown in structure 73200. On the other hand, the wider bandgap $(Al_xGa_{1-x})_yO_z$ has a higher Al content and a larger lattice constant (in a relaxed state), which would cause it to be in compressive stress as shown in structure 73200.

In another example, structure 73200 could be a region of a semiconductor structure grown on an alpha-$Ga_2O_3$ substrate (not shown), layers 73230 and 73250 can be alpha-$(Al_{0.5}Ga_{0.5})_2O_3$, and layers 73240 and 73260 can be $LiAlO_2$. Alpha-$(Al_{0.5}Ga_{0.5})_2O_3$ has a smaller lattice constant than the alpha-$Ga_2O_3$ substrate and $LiAlO_2$ has a larger lattice constant, which would cause the layers to have the stresses 73210 and 73220 shown in structure 73200.

Such a superlattice formed using lattice mismatched materials, with each layer of each unit cell being formed with thickness below the CLT, can achieve high crystalline perfection when formed with a sufficient number of periods. In some cases, the strains are balanced (or close to balanced) between the alternating layers in the structure and the initial in-plane (strained) lattice constants are the same as the final in-plane (strained) lattice constants. In some cases, the strains can be unbalanced, and the structure can relax such that the initial in-plane (strained) lattice constants are different from the final in-plane (relaxed) lattice constants. In some cases, the final in-plane (relaxed) lattice constants are mainly determined by the materials forming layers 73230, 73240, 73250 and 73260, with no or only a minor influence from layer(s) beneath structure 73200 (e.g., a substrate). In some cases, after a certain total thickness (e.g., after approximately 10 to 100 periods) of superlattice growth the final unit cells can attain idealized free-standing in-plane lattice constants $a_{\parallel}^{SL}$. This is one example method of forming a superlattice buffer 7130 as discussed in relation to FIG. 116A.

In some embodiments of the present semiconductor structures with one or more superlattices containing an epitaxial oxide material, each superlattice in the semiconductor structure has a distinct configuration that achieves a selected optical and electronic specification.

In some cases, keeping an average alloy content in each unit cell constant along the superlattice is equivalent to keeping the in-plane lattice constant of the unit cell $a_{\parallel}^{SL}$ constant. In such cases, the thickness of the unit cell can then be selected to achieve a desired optical and electrical specification. This enables a plurality of distinct superlattices to have a common effective in-plane unit cell lattice constant and thus enables the advantageous management of strain along a growth direction.

FIG. 125 schematically describes the influence of the built-in depletion field 75130 having potential energy 75135 along a distance 75140 that is parallel to a growth direction 75110 in the semiconductor structures with one or more superlattices containing epitaxial oxide materials described herein. The superlattice band diagram without a built-in depletion field is shown as the spatial conduction band edge 75115, and the vertical axis 75105 represents energy. The delocalized electron wavefunction 75120 is coupled between adjacent low bandgap polar κ-$(Al_xGa_{1-x})_2O_3$ (with a Pna21 space group) regions by virtue of quantum mechanical tunnelling through the high potential energy high bandgap polar κ-$(Al_xGa_{1-x})_yO_z$ barriers. For example, the low bandgap polar κ-$(Al_xGa_{1-x})_yO_z$ can have a bandgap from about 5.5 eV to 6 eV and the high bandgap polar κ-$(Al_xGa_{1-x})_yO_z$ can have a bandgap from about 7 eV to 8 eV (where the Al composition, x, is lower for the lower bandgap region and higher for the higher bandgap region). Other bandgaps are possible for the low and high bandgap polar κ-$(Al_xGa_{1-x})_yO_z$ regions. The internal pyroelectric and piezoelectric fields are also shown and representative of a metal polar oriented growth of the polar κ-$(Al_xGa_{1-x})_yO_z$. The tunnelling of the wavefunctions 75120 results in an energy miniband 75125 for the allowed quantized conduction states. Application of a linearly increasing potential 75130, such as would occur with the built-in depletion field, results in spatial band structure 75160. The resulting wavefunctions of the superlattice with application of the depletion field 75130 generates the wavefunctions 75145 and 75155 which are no longer resonantly coupled to their nearest neighbor low bandgap polar κ-$(Al_xGa_{1-x})_yO_z$ potential minima. The quantized allowed energy states of the band structure 75160 now has discrete energy states 75165 and 75170 that are higher in energy compared to the miniband energy states 75125.

This effect can be modified by application of a depletion electric field across an oxygen-polar oriented growth, with a resulting lowering of the energy of Stark split states. This is particularly useful for example, for an oxygen-polar p-i-n superlattice device composed of only one unit cell type, such as an M:N=3:6 unit cell having a low bandgap polar κ-$(Al_xGa_{1-x})_yO_z$ and a high bandgap polar κ-$(Al_xGa_{1-x})_2O_3$ layer. The built-in depletion field across the superlattice having M:N=3:6 unit cells causes an emission energy to be stark shifted to longer wavelengths (i.e., red-shifted) and will not be substantially absorbed in surrounding p-type and n-type active regions having M:N=3:6 unit cells.

In general, a metal polar oriented growth of structures comprising polar κ-$(Al_xGa_{1-x})_yO_z$ produces blue-shift in the emission spectrum of the i-type active region of a n-i-p device due to a p-up epilayer stack. That is, a blue-shift is produced for a depletion electric field as shown for a device formed in the order: substrate, n-type active region, i-type active region, p-type active region [SUB/n-i-p]. Conversely, a red-shift is observed in the emission spectrum of the i-type active region for a p-i-n device formed as a p-down epilayer stack, that is, [SUB/p-i-n].

An oxygen-polar oriented growth of structures comprising polar κ-$(Al_xGa_{1-x})_yO_z$ produces a blue-shift in the emission spectrum of the i-type active region of a n-i-p device due to the depletion electric field, and produces a red-shift in the emission spectrum of the i-type active region of a p-i-n device due to the depletion electric field.

The present semiconductor structures with one or more superlattices containing an epitaxial oxide material provides many benefits over the prior art, including improved light emission, especially at UV and deep UV (DUV) wavelengths. For example, the use of ultrathin layered superlattices enables photons to be emitted vertically, i.e., perpendicular to the layers of the device, as well as horizontally, i.e., parallel with the layers. Furthermore, the present semiconductor structures provide spatial overlap between the electron and hole wavefunctions enabling improved recombination of electrons and holes.

In particular, for the application of UV optoelectronic devices, compositions of $(Al_xGa_{1-x})_yO_z$ where $0 \le x \le 1$, $1 \le y \le 3$, and $2 \le z \le 4$, prove extremely beneficial in serving as the narrower band gap material and the wider bandgap material.

The thickness of the first layer and second layer of the unit cells of superlattices can be used to select the quantization energy of electrons and holes and the coupling of electrons in the conduction band. For example, in a superlattice containing alternating narrower bandgap and wider bandgap layers of $(Al_xGa_{1-x})_yO_z$, the thickness of layers of narrower bandgap $(Al_xGa_{1-x})_yO_z$ can be used to select the quantization energy of electrons and holes and the thickness of layers of the wider bandgap $(Al_xGa_{1-x})_yO_z$ layers can control the coupling of electrons in the conduction band. The ratio of thickness of the layers of the narrower bandgap $(Al_xGa_{1-x})_yO_z$ layers to the wider bandgap $(Al_xGa_{1-x})_yO_z$ layers can be used to select the average in-plane lattice constant of the superlattice. Hence, the optical transition energy of a given superlattice can be altered by choice of both the average unit cell composition and the thickness of each layer of each unit cell.

Further advantages of the present semiconductor structures with one or more superlattices containing an epitaxial oxide material include: simpler manufacturing and deposition processes; customizable electronic and optical properties (such as the wavelength of the emitted light) suitable for high efficiency light emission; optimized optical emission polarization for vertically emissive devices when deposited on substrates with particularly oriented surfaces; improved impurity dopant activation for n-type and p-type conductivity regions; and strain managed monolayers enabling optically thick superlattices to be formed without excessive strain accumulation. For example, aperiodic multilayer structures can be used to prevent strain propagation and enhance optical extraction.

Furthermore, spreading out the electron and/or hole carrier spatial wavefunctions within the electron-hole recombination regions can improve both the carrier capture probability by virtue of increased volume of the recombination region, and also improves the electron and hole spatial wavefunction overlap and thus improves the recombination efficiency of the present devices over prior art.

Doped Superlattices

The present disclosure describes semiconductor structures with one or more doped superlattices containing an epitaxial oxide material. In some cases, the doped superlattice contain host layers comprising an epitaxial oxide material, and an impurity (or a dopant) layer comprising a donor (n-type), or acceptor (p-type) impurity (or dopant) material. The impurities can act as extrinsic dopants providing the doped superlattice with an n-type or p-type conductivity.

For example, a present doped superlattice can be formed by depositing (e.g., using molecular beam epitaxy (MBE), or chemical vapor deposition (CVD)) alternating pairs of: a first host epitaxial oxide semiconductor layer; and a thin (e.g., less than 1 nm, or less than 10 nm, or 1 monolayer) first impurity (or dopant) layer comprising an impurity (or dopant) that can act as a donor (n-type), or acceptor (p-type) material for the epitaxial oxide semiconductor of the host layer.

In some cases, the impurity (or dopant) layer contains an epitaxial oxide semiconductor and an extrinsic dopant (or impurity). For example, a present impurity (or dopant) layer can be formed by co-depositing (e.g., using molecular beam epitaxy (MBE), or chemical vapor deposition (CVD)) an epitaxial oxide semiconductor with a high concentration (e.g., greater than $10^{19}$ $cm^{-3}$, greater than $10^{20}$ $cm^{-3}$, greater than $10^{21}$ $cm^{-3}$, or greater than $10^{22}$ $cm^{-3}$) of an impurity (or dopant) that can act as a donor (n-type), or acceptor (p-type) material.

In some cases, the n-type or p-type superlattices contain polar epitaxial oxide materials, and the n-type or p-type conductivity can be further induced via polarization doping (e.g., due to a strain within the superlattice).

In some embodiments, the doped superlattices described herein contain epitaxial oxide materials. For example, the host layer can comprise an epitaxial oxide material. In another example, the impurity layer can comprise an epitaxial oxide material with a high concentration of a dopant material (e.g., a donor material or an acceptor material, such as greater than $10^{18}$ $cm^{-3}$, greater than $10^{19}$ $cm^{-3}$, greater than $10^{20}$ $cm^{-3}$, greater than $10^{21}$ $cm^{-3}$, or greater than $10^{22}$ $cm^{-3}$).

In some embodiments, the epitaxial oxide material in the doped superlattices described herein can be $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$; NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; $(Mg_xZn_{1-x-y}Ni_y)_2GeO_4$ where $0 \le x \le 1$, $0 \le y \le 1$; and/or other epitaxial oxide materials from FIGS. 28, 76A-1, 76A-2 and 76B.

In some embodiments, the epitaxial oxide materials in the doped superlattices described herein can each have a cubic, tetrahedral, rhombohedral, hexagonal, and/or monoclinic crystal symmetry. In some embodiments, the epitaxial oxide materials in the doped superlattices described herein comprise $(Al_xGa_{1-x})_2O_3$ with a space group that is R3c, Pna21, C2m, Fd3m, and/or Ia3.

In some cases, the doped superlattices described herein reside in semiconductor structures that are grown on substrates selected from $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where $0 \le x \le 1$, $1 \le y \le 3$, and $2 \le z \le 4$ (any crystal symmetry), $MgF_2$, $LaAlO_3$, $TiO_2$, or quartz. In some cases, the epitaxial oxide materials of the superlattices described herein and the substrate material upon which the semiconductor structures described herein are grown are selected such that the layers of the semiconductor structure have a predetermined strain. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, or 2% of an in-plane lattice constant (or crystal plane spacing) of the substrate. In other cases, a buffer layer (e.g., including a compositional gradient, or a changing average alloy content) can be used to reset the lattice constant (or crystal plane spacing) of the substrate, and the layers of the semiconductor structure have in-plane lattice constants (or crystal plane spacings) that are within 0.5%, 1%, 1.5%, or 2% of the final (or topmost) lattice constant (or crystal plane spacing) of the buffer layer.

In some embodiments, a semiconductor material of the doped superlattices is a wide bandgap material (e.g., $(Al_xGa_{1-x})_2O_3$, where $0 \le x \le 1$, or a material shown in the table in FIG. 28 or in FIGS. 76A-1, 76A-2 and 76B) having a bandgap from 3 eV to 14 eV, or from 3.5 eV to 9 eV, or approximately 6 eV.

According to one aspect, the doped superlattices described herein comprise alternating host layers and impurity layers. The host layers contain (or consist essentially of) a semiconductor material, and the impurity layers contain (or consist essentially of) a corresponding dopant material (e.g., a donor or acceptor material). For example, the host layers can be formed of a not intentionally doped (NID) semiconductor material and the impurity layers can be formed of one or more corresponding donor or acceptor materials. In some cases, the impurity layers can comprise a semiconductor material (e.g., the same semiconductor material as in the host layers) and one or more corresponding donor or acceptor materials. In such cases, the concentration of the one or more corresponding donor or acceptor materials can be very high (e.g., greater than $10^{18}$ $cm^{-3}$, greater than $10^{19}$ $cm^{-3}$, greater than $10^{20}$ $cm^{-3}$, greater than $10^{21}$ $cm^{-3}$, or greater than $10^{22}$ $cm^{-3}$) in the impurity layers. The superlattice can be formed via a film formation process as described further below with reference to FIGS. 127 and 128. In some embodiments, the superlattice is formed as a layered single crystal structure. In some embodiments, the superlattice is a short-period superlattice (e.g., with a period less than 20 nm, or less than 10 nm, or less than 5 nm, or less than 1 nm, or from less than 1 nm to 20 nm).

The doped superlattices described herein can comprise a plurality of superlattice unit cells, each containing a host layer and an impurity layer. However, in alternative embodiments, the superlattice unit cells can comprise a host layer and two or more impurity layers. The electrical and optical properties of the superlattice can be changed by varying the period and the duty cycle of the superlattice unit cells. In some embodiments, the superlattice comprises superlattice unit cells having uniform periodicity. However, in alternative embodiments, the structure comprises a multilayer structure with alternating host and impurity layers having non-uniform periodicity. For example, the period of the alternating host and impurity layers in the multilayer structure can be varied linearly along the multilayer structure by varying the thickness of the host layers and/or impurity layers.

The period of the superlattice is defined as the thickness of the superlattice unit cell. For example, the period can be equal to the center-to-center spacing between adjacent impurity layers, or to impurity layers in adjacent superlattice unit cells. The duty cycle of each superlattice unit cell containing only 2 layers is defined as the ratio of the thickness of one layer to the thickness of the other layers in the superlattice unit cell. For example, the duty cycle of a superlattice unit cell with only a host layer and an impurity layer would be equal to the ratio of the thickness of the host layer to the thickness of the impurity layer in the superlattice unit cell (or the ratio of the thickness of the impurity layer to the thickness of the host layer).

The doped superlattices having host layers and impurity layers as described herein exhibit several advantages over semiconductor materials doped via conventional methods. The doped superlattices described herein can obviate the need to co-deposit a dopant impurity during formation of the semiconductor material and substantially reduce or entirely eliminate the segregation of dopant impurities to the surface of the semiconductor material during the film formation process. The doped superlattices described herein can also provide relatively large excesses of free carriers.

When the host layers contain $(Al_xGa_{1-x})_yO_z$, where $0 \le x \le 1$, $1 \le y \le 3$, and $2 \le z \le 4$, for semiconductor material that has a high Al content (e.g., x>0.5), the doped superlattices described herein can achieve a high level of n-type or p-type conductivity and the activated carrier concentration does not significantly decrease with increasing Al content. Hence, the doped superlattices described herein can provide highly activated n-type or p-type conductivity in a $(Al_xGa_{1-x})_yO_z$ semiconductor with a high Al content.

Epitaxial oxides, such as those shown in FIGS. 28, 76A-1, 76A-2 and 76B that do not contain Ni or Li, can be difficult to dope p-type. In some embodiments, the doped superlattices described herein can achieve a high level p-type conductivity for epitaxial oxide materials that are difficult to dope p-type using dopants co-deposited with the epitaxial oxide material.

FIG. 126 is a cross-sectional view of a structure 8100 comprising a semiconductor layer 8110 and a doped superlattice 8115, according to an embodiment. The superlattice 8115 is formed atop the semiconductor layer 8110 (e.g., an epitaxial oxide layer, or a substrate). In some embodiments, semiconductor layer 8110 can comprise any of the epitaxial oxide materials shown in FIGS. 28, 76A-1, 76A-2 and 76B. In some embodiments, a material for the semiconductor layer 8110 is $(Al_xGa_{1-x})_yO_z$ where $0 \le x \le 1$, $1 \le y \le 3$, and $2 \le z \le 4$ (e.g., with a Pna21 space group, or other type of crystal symmetry, such as α-, β-, or γ-$(Al_xGa_{1-x})_yO_z$), with thickness from less than 1 nm to 5 microns, or greater than 5 microns. In some embodiments, the semiconductor layer 8110 is an aluminium oxide, such as sapphire, for example a substrate in A-plane sapphire, C-plane sapphire, M-plane sapphire, or R-plane orientation with a thickness of about 600 μm, or from 100 μm to 1000 μm. However, other suitable semiconductor materials and thicknesses can be used for semiconductor layer 8110.

The doped superlattice 8115 comprises alternately formed host layers 8120-*n* and impurity layers 8130-*n*. As shown in the example in FIG. 126, in order, the doped superlattice 8115 comprises host layer 8120-1, impurity layer 8130-1, host layer 8120-2, impurity layer 8130-2, host layer 8120-3, impurity layer 8130-3, and host layer 8120-4. Each pair comprising a host layer 8120-*n* and an adjacent impurity layer 8130-*n* constitutes a unit cell of the doped superlattice. For example, the host layer 8120-1 and the impurity layer 8130-1 together constitute a unit cell of the doped superlattice.

In the embodiment shown in FIG. 126, four of the host layers 8120-*n* and three of the impurity layers 8130-*n* (i.e., three and one-half unit cells) are shown, but any number of the alternating host layers 8120-*n* and impurity layers 8130-*n* may be formed to create the doped superlattice 8115 with a thickness t1. For example, in some embodiments, doped superlattice 8115 comprises at least 10 unit cells and can comprise hundreds or thousands of unit cells. The thickness t1 of the doped superlattice 8115 can be between about 50 nm and about 5 μm, or between about 50 nm and 1 μm, or between 50 nm and 500 nm, or between 50 nm and 100 nm. In some embodiments, the thickness t1 is about 1 μm, or about 250 nm.

With reference to the enlarged section shown in FIG. 126, each of the host layers 8120-*n* has a thickness t2. In some embodiments, the thickness t2 is from less than 1 nm to about 100 nm, or from about 1 nm to about 25 nm. In some embodiments, the host layers each have a thickness of at least one half of a monolayer and at most 10 monolayers. Each of the impurity layers 8130-*n* has a thickness t3. In some embodiments, the thickness t3 is from less than 1 nm to 10 nm, or from about 0.25 nm to about 2 nm. In some embodiments, the thickness t3 is about 1 nm. In some embodiments, the impurity layers 8130-*n* each have a thickness of at least one half of a monolayer and less than five monolayers, or less than or equal to two monolayers. In some embodiments, the average spacing between atoms of the donor material or acceptor material in the plane of the impurity layer is less than 1 nm and more preferably about 0.1 nm.

In some embodiments, the host layers 8120-*n* comprise an epitaxial oxide material. In some embodiments, the epitaxial oxide material in the host layers 8120-*n* can be $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$; NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; $(Mg_xZn_{1-x-y}Ni_y)_2GeO_4$ where $0 \le x \le 1$, $0 \le y \le 1$; and/or other epitaxial oxide materials from FIGS. 28, 76A-1, 76A-2 and 76B. In some embodiments, the epitaxial oxide material in the host layers 8120-*n* can have a cubic, tetrahedral, rhombohedral, hexagonal, and/or monoclinic crystal symmetry. In some embodiments, the epitaxial oxide materials in the doped superlattices described herein comprise $(Al_xGa_{1-x})_2O_3$ with a space group that is R3c, Pna21, C2m, Fd3m and/or Ia3.

In some embodiments, the host layers 8120-*n* can comprise different epitaxial oxide materials throughout the doped superlattice 8115. For example, the host layers 8120-*n* can comprise $(Al_xGa_{1-x})_yO_z$, where the composition (or the value of x, or the Al content of the material) varies throughout the doped superlattice 8115. In another example, the host layers 8120-*n* can comprise different epitaxial oxide materials (e.g., different materials from the table in FIG. 28 or in FIGS. 76A-1, 76A-2 and 76B) throughout the doped superlattice 8115.

In some embodiments, the impurity layers 8130-*n* comprise (or, in some cases, consist essentially of) a donor material corresponding to an epitaxial oxide semiconductor material or an acceptor material corresponding to an epitaxial oxide semiconductor material. However, in some alternative embodiments, a plurality of the impurity layers within a doped superlattice are donor impurity layers comprising a donor material corresponding to an epitaxial oxide semiconductor material, and a plurality of the impurity layers within the doped superlattice are acceptor impurity layers comprising an acceptor material corresponding to an epitaxial oxide semiconductor material. For example, impurity layers can alternate between donor impurity layers and acceptor impurity layers.

Where the impurity layers 8130-*n* comprise a donor material, the doped superlattice provides n-type conductivity. For example, the donor material of the impurity layer can be selected from at least one of: Si; Ge; Sn; rare earth elements (e.g., Er and Gd); and group III elements such as Al, Ga, and In; and the host layers can comprise $(Mg_xZn_{1-x})_z(Al_yGa_{1-y})_{2(1-z)}O_{3-2z}$, where $0 \le x \le 1$, $0 \le y \le 1$ and $0 \le z \le 1$; or $(Al_xGa_{1-x})O_z$ where $0 \le x \le 1$, $1 \le y \le 3$, and $2 \le z \le 4$ or $(Al_xGa_{1-x})_2(Si_zGe_{1-z})O_5$ where $0 \le x \le 1$ and $0 \le z \le 1$; or $(Al_xGa_{1-x})_2LiO_2$ where $0 \le x \le 1$. In another example, the impurity layers can comprise group III elements such as Al, Ga, and/or In, and the host layers can comprise $Mg_2GeO_4$ host layers.

Where the impurity layers 8130-*n* consist essentially of the acceptor material, the superlattice provides p-type conductivity. For example, the acceptor material can be selected from at least one of: Li, Ga, Zn, N, Ir, Bi, Ni, Mg and Pd, and the host layers can comprise $(Mg_xNi_{1-x})_z(Al_yGa_{1-y})_{2(1-z)}O_{3-2z}$, where $0 \le x \le 1$, $0 \le y1$ and $0 \le z \le 1$, or $(Al_xGa_{1-x})_yO_z$ where $0 \le x \le 1$, $1 \le y \le 3$, and $2 \le z \le 4$, or $(Al_xGa_{1-x})_2(Si_zGe_{1-z})O_5$ where $0 \le x \le 1$ and $0 \le z \le 1$; or $(Al_xGa_{1-x})_2LiO_2$ where $0 \le x \le 1$.

In some cases, each impurity layer 8130-*n* interposed between adjacent host layers 8120-*n* creates a thin region (or sheet) of spatially confined potential wells, which effectively creates a volume of $n^+$-type or $p^+$-type material in the doped superlattice 8115. In some cases, a potential well formed by an impurity layer comprising a donor material can be a well for electrons, while a potential well formed by an impurity layer comprising an acceptor material can be a well for holes. For example, a first sheet of potential wells is formed in the impurity layer 8130-1 interposed between the host layer 8120-1 and the host layer 8120-2. Further, a second sheet of potential wells is formed in the impurity layer 8130-2 interposed between the host layer 8120-2 and the host layer 8120-3. Additionally, a third sheet of potential wells is formed in the impurity layer 8130-3 interposed between the host layer 8120-3 and the host layer 8120-4. The position and amplitude of the potential wells can be varied by varying the periodic spacing d1 of the impurity layers 8130-*n*. The periodic spacing d1 is determined, for example, based on the bandgap of the semiconductor material used to form the host layers 8120-*n*, and/or on the materials properties of the semiconductor material and the impurity material, and/or on the concentration of the impurity (in the structure, relative to the host layer, and/or within the impurity layer).

The periodic spacing d1 of the impurity layers 8130-*n* can be varied by varying the thickness t2 of the host layers and/or the thickness t3 of the impurity layer. In some embodiments, the periodic spacing d1 of the impurity layers 8130-*n* is from about 0.1 nm to about 10 nm, or from 0.1 nm to 1 nm, or from 1 ML to 100 ML, or from 1 ML to 10 ML.

In the embodiment shown in FIG. 126, the host layers 8120-*n* have a similar thickness in each of the plurality of superlattice unit cells, and the impurity layers 8130-*n* have a similar thickness in each of the plurality of unit cells. Therefore, the periodic spacing d1 or period is uniform along the superlattice. However, in alternative embodiments, the host layer 8130-*n* has a substantially different thickness in each subsequent unit cell and/or the impurity layer 8130-*n* has a substantially different thickness in each subsequent unit cell. In these alternative embodiments the periodic spacing d1 can be non-uniform along the multilayer structure.

In some embodiments, the periodic spacing d1 of the impurity layers 8130-*n* of the doped superlattice 8115 is such that the electron wavefunctions Ψ in the potential wells induced by the atoms of the donor material or the acceptor material in subsequent impurity layers 8130-*n* spatially overlap. Because the electron wavefunctions Ψ between the impurity layers 8130-*n* overlap, a delocalized "sea" of electrons can be formed. For example, if the host layers 8120-*n* are formed of $(Al_xGa_{1-x})_yO_z$, where 0≤x≤1, 1≤y≤3, and 2≤z≤4, and the periodic spacing d1 of the impurity layers 8130-*n* is about 0.5 nm to 10 nm this can enable vertical propagation of electrons through the doped superlattice 8115.

In some embodiments, the semiconductor material used to form the host layers 8120-*n* is a wide bandgap material (e.g., $(Al_xGa_{1-x})_yO_z$, where 0≤x≤1, 1≤y≤3, and 2≤z≤4, or a material shown in the table in FIG. 28 or in FIGS. 76A-1, 76A-2 and 76B) having a bandgap from 3 eV to 14 eV, or from 3.5 eV to 9 eV, or approximately 6 eV, and the donor or acceptor material used to form the impurity layers 8130-*n* is an ultrathin semiconductor material with a narrower bandgap, such as an epitaxial oxide material (e.g., $(Al_xGa_{1-x})_yO_z$, where 0≤x≤1, 1≤y≤3, and 2≤z≤4, or a material shown in the table in FIG. 28 or in FIGS. 76A-1, 76A-2 and 76B). A continuous thin (e.g., 1 ML thick, or 2 ML thick) semiconductor material with a narrower bandgap disposed across an O-terminated host surface is suitably bonded on either side by O bonds and can act as a degenerate doping sheet. For example, a charge deficit of atoms of the semiconductor material with a narrower bandgap at the interface with the host material can provide a free electron to the crystal. The doped superlattices described herein can improve carrier mobilities along a growth direction since the carriers are, on the average, more distant from the ionized impurity atom. Therefore, the free-carrier mobilities of the p-type or n-type doped superlattices described herein can be higher than those of conventional homogeneous but random doping of a host semiconductor. In some cases, the difference between the electronic bandgaps of the wide bandgap host material and the narrow bandgap impurity material coupled with the large difference in electron affinities of each, effectively modulates the positions of the conduction band and valence band energies in the superlattice relative to the Fermi energy $E_{Fermi}$.

Donor impurity layers comprising (or consisting essentially of) the donor material effectively modulate the position of the conduction band energies toward the Fermi energy $E_{Fermi}$ and the position of the valence band energies away from the Fermi energy $E_{Fermi}$. Donor impurity layers provide n-type, or $n^+$-type conductivity in localized regions by effectively pulling the lowest conduction band edge Γ below the Fermi energy $E_{Fermi}$.

Acceptor impurity layers effectively modulate the positions of the conduction band energies away from the Fermi energy $E_{Fermi}$ and the positions of the valence band energies toward the Fermi energy $E_{Fermi}$. The acceptor impurity layers provide p-type or $p^+$-type conductivity in localized regions by effectively moving the CH-valence-band edge closer to the Fermi energy $E_{Fermi}$.

In some embodiments, a method of making a doped superlattice (a p-type or n-type doped superlattice) includes making the doped superlattice via a substantially two-dimensional thin film formation process. The method can be used to make any of the superlattices described herein (for example superlattices for use in electronic devices having p-type and n-type regions and in some cases an intrinsic region). The film formation process can be, for example, a vacuum deposition process, a molecular beam epitaxy (MBE) process, a vapour phase deposition process, a chemical deposition process, or any other formation process that is capable of precisely forming layers (e.g., epitaxial layers) of a given thickness in the range of 0.1 nm to 100 nm.

For example, the film formation process is an MBE process, the epitaxial oxide semiconductor material is $(Mg_xZn_{1-x})_z(Al_yGa_{1-y})_{2(1-z)}O_{3-2z}$, where 0≤x≤1, 0≤y≤1 and 0≤z≤1; or $(Al_xGa_{1-x})_yO_z$, where 0≤x≤1, 1≤y≤3, and 2≤z≤4; and the impurity layer comprises a dopant (donor) material such as Si; Ge; Sn; rare earth elements (e.g., Er and Gd); and group III elements such as Al, Ga, and In. In another example, the host layers can comprise $(Mg_xNi_{1-x})_z(Al_yGa_{1-y})_{2(1-z)}O_{3-2z}$, where 0≤x≤1, 0≤y≤1 and 0≤z≤1, or $(Al_xGa_{1-x})_yO_z$, where 0≤x≤1, 1≤y≤3, and 2≤z≤4; and the impurity layer comprises an acceptor material such as Li. Ga, Zn, N, Ir, Bi, Ni, Mg and/or Pd. A mechanical shutter is associated with each material source (e.g., Al, Ga, and the dopant material). Each shutter is positioned in the beam path of the species that is emitted from the material source intersecting the line of sight of the beam between the source and the deposition plane of the substrate. The shutters are used to modulate the outputs of each material source species as a function of time for given calibrated arrival rates of source materials at the deposition plane. When open, each shutter allows the corresponding species to impinge the deposition surface and participate in epitaxial layer growth. When closed, each shutter prevents the corresponding species from impinging on the deposition surface and thus inhibits the respective species from being incorporated within a given film. A shutter-modulation process may be used to readily form atomically abrupt interfaces between the alternately disposed layers of the doped superlattice. Methods will now be described in more detail with reference to FIG. 127. An example of shutter sequences 8150 for such a film formation process are shown in FIG. 128.

FIG. 127 is a flow diagram of an example of a method 8400 of making a doped superlattice described herein via a film formation process. The method 8400 comprises the following steps.

At step 8410, a substrate is prepared to have a surface of desired crystal symmetry and cleanliness devoid of disadvantageous impurities. Additional substrate preparation methods described herein may also be used. The substrate is loaded into a reaction chamber, for example an MBE reaction chamber, and then the substrate is heated to a film formation temperature. In some embodiments, the film formation temperature is between about 200° C. and about 81200° C. In some embodiments, the film formation temperature is between about 500° C. and 850° C. In some embodiments, the reaction chamber is sufficiently deficient of water, hydrocarbons, hydrogen (H), al carbon (C) species so as to not impact the electronic or structural quality of the doped superlattice.

At step 8420, a first host layer 8120-*n*, for example, comprising (or consisting essentially of) an epitaxial oxide semiconductor material, is formed via the film formation process on the prepared semiconductor layer 8110. The host layer 8120-*n* is formed to a thickness (e.g., t2 in FIG. 126). For example, if the film formation process is MBE and the epitaxial oxide semiconductor material is $(Al_xGa_{1-x})_yO_z$, where 0≤x≤1, 1≤y≤3, and 2≤z≤4, the shutters associated with the sources of elemental aluminum and/or gallium, and of excited molecular oxygen are opened and a layer of $(Al_xGa_{1-x})O_z$ is formed. In this example, the source(s) of elemental aluminum and/or gallium can be conventional effusion cells and the source of excited molecular oxygen species can be a plasma source. Other active-oxygen sources can be used, for example ozone and nitrous oxide.

At step 8430, the formation of the first host layer 8120-*n* is interrupted and a first impurity layer 8130-*n* comprising (or consisting essentially of) a corresponding donor or acceptor material is formed using the film formation process. The impurity layer 8130-*n* is formed to a thickness (e.g., t3 in FIG. 126). In some embodiments, a first oxygen terminated surface is formed on the first host layer prior to forming the first impurity layer and the first impurity layer 8130-*n* is formed on the first oxygen terminated surface. For example, if the film formation process is MBE, the epitaxial oxide semiconductor material is $(Al_xGa_{1-x})_yO_z$, where 0≤x≤1, 1≤y≤3, and 2≤z≤4, and the dopant material is a donor material such as Si; Ge; Sn; rare earth elements (e.g., Er and Gd); and/or group III elements such as Al, Ga, and In, the shutter associated with the aluminum and/or gallium source(s) are closed and a layer of oxygen species is deposited to form an oxygen-terminated surface. In other cases, the epitaxial oxide semiconductor material is $(Al_xGa_{1-x})_yO_z$, where 0≤x≤1, 1≤y≤3, and 2≤z≤4 and the dopant material is an acceptor material such as Li. Ga, Zn, N, Ir, Bi, Ni, Mg and/or Pd. The shutter associated with the active oxygen species is then closed, a shutter associated with a source of donor material is opened and the first impurity layer is formed atop the surface of the first host layer formed in step 8420. In one example, the source of dopant material is an elemental effusion cell comprising a pyrolytic boron nitride (PBN) crucible. In some embodiments, donor or acceptor material adatoms are chemisorbed and/or physisorbed on the oxygen-terminated surface and deposition is substantially self-limited by the available oxygen bonds on the surface. In some embodiments, the surface is supersaturated with the donor or acceptor material and the donor or acceptor material is both physisorbed and chemisorbed. In one example, the deposited impurity layer is a monolayer of a dopant material (e.g., a donor or an acceptor material) which ideally forms a reconstructed surface of the same symmetry type as the underlying surface of the host layer.

At step 8440, the formation of the first impurity layer 8130-*n* is interrupted and a second host layer 8120-*n* is formed using the film formation process. In some embodiments, a second oxygen-terminated surface is formed on the impurity layer prior to forming the second host layer 8120-*n*. For example, if the film formation process is MBE, the host layer is an epitaxial oxide semiconductor material, such as $(Al_xGa_{1-x})_yO_z$, where 0≤x≤1, 1≤y≤3, and 2≤z≤4, and the impurity layer comprises a dopant material such as Mg, Zn, N, Ir, Bi, Ni, Pd and/or Li, the shutter associated with the dopant source is closed, the shutter associated with the active oxygen species is opened, and a layer of oxygen species is deposited to form an oxygen-terminated surface. The shutters associated with the aluminum and/or gallium source(s) are then opened and the second host layer is formed using the film formation process. The thickness (e.g., t2 in FIG. 126) of the host layer 8120-*n* is based, for example, on the periodic spacing (e.g., d1 in FIG. 126) between impurity layers 8130-*n* and the thickness (e.g., t3 in FIG. 126) of the impurity layers.

At step 8450, it is determined whether the superlattice has reached a desired thickness (e.g., t1 in FIG. 126). The desired thickness is defined along the growth direction, i.e., perpendicular to the plane of the layers. If the number of superlattice unit cells or impurity layers 8130-*n* required to achieve the desired thickness (e.g., t1 in FIG. 126) has been achieved, then the method 8400 proceeds to step 8470. However, if the doped superlattice has not reached a desired thickness or does not yet comprise a desired number of layers, the method 8400 proceeds to step 8460. In some embodiments, the desired number of layers is at least 10 host layers 8120-*n* and at least 10 impurity layers 8130-*n* (or from 3 host layers to more than 100 host layers, and from 3 impurity layers to more than 100 impurity layers) and/or the desired thickness is from about 5 nm to about 5 μm, or from about 50 nm to about 5 μm. It is understood that a large number of periods can be deposited, such as of the order 100 or 1000.

At step 8460, the formation of the second host layer is interrupted and a second impurity layer is formed using the film formation process. For example, if the film formation process is MBE, the host layer is $(Al_xGa_{1-x})_yO_z$, where 0≤x≤1, 1≤y≤3, and 2≤z≤4, and the dopant material is Mg, Zn, N, Ir, Bi, Ni, Pd and/or Li, the shutters associated with the aluminum and/or gallium source(s) are closed and a layer of oxygen species is deposited to the host layer to form an oxygen-terminated surface. The shutter associated with the active oxygen species is then closed, the shutter associated with the source of dopant material is opened and the second impurity layer is formed atop the surface of the host layer previously formed in step 8440. The method 8400 then returns to step 8440.

When the desired thickness or desired number of layers of the superlattice has been achieved, at step 8470, the film formation process is suspended and the structure comprising the semiconductor layer 8110 and subsequent layers (e.g., epitaxial oxide layers) can be grown on the doped superlattice, or the doped superlattice can be removed from the reaction chamber. For example, the material sources can be deactivated, the reaction chamber allowed to cool, and the structure removed from the reaction chamber.

In some embodiments, in steps 8430 and 8460 the impurity layers 8130-*n* are single atomic layers or monolayers of donor or acceptor material. In some embodiments, the impurity layers 8130-*n* are at least one monolayer and less than five monolayers of donor or acceptor material. In some embodiments, the impurity layers are at least one monolayer and less than or equal to two monolayers of donor or acceptor material.

In one example, a single atomic layer of Si (or Ge) or Mg (or Li) can be formed to provide the superlattice with n-type or p-type conductivity, respectively. In another example, the impurity layers can be an impurity adatom matrix, such as 1 to 5 atomic layers of a single crystalline structure, such as $Si_xO_y$ where x>0 and y>0, or $Mg_pO_q$ where p>0 and q>0. In yet another example, the impurity layers are alloys of $Si_u(Al_xGa_{1-x})_yO_v$ or $Mg_u(Al_xGa_{1-x})_yO_v$, where x≥0, y≥0, u>0 and v>0.

In some examples, in steps 8430 and 8460 the impurity layers 8130-*n* are highly doped semiconductor materials. In such cases, in steps 8430 and 8460, an epitaxial oxide material can be deposited (e.g., with a low growth rate for example, about 0.1 microns/hr, or 0.01 microns per hour, or from 0.01 microns/hr to 0.1 microns/hr) and the dopant material can be co-deposited with the epitaxial oxide material. For example, in steps 8430 and 8460, the host layer is an epitaxial oxide semiconductor material, such as $(Al_xGa_{1-x})_yO_z$, where 0≤x≤1, 1≤y≤3, and 2≤z≤4, and the impurity layer is an epitaxial oxide semiconductor material, such as $(Al_xGa_{1-x})_yO_z$, where 0≤x≤1, 1≤y≤3, and 2≤z≤4, comprising a dopant material. In such cases, a shutter (or shutters) associated with aluminum and/or gallium source(s), a shutter associated with the active oxygen species, and a shutter associated with a source of donor material, are all open during the deposition of the impurity layers in steps 8430 and 8460.

In some embodiments, the host layers 8120-*n* and the impurity layers 8130-*n* have a predetermined crystal polarity, such as a substantially metal polar polarity or an oxygen-polar polarity along a growth direction.

In some embodiments, the host layers 8120-*n* and the impurity layers 8130-*n* have a predetermined strain imposed by the impurity layer on to the host layer. For example, the doped superlattice can be engineered to have the host layers in a state of biaxial compression or biaxial tension relative to the buffer layer and/or substrate wherein the biaxial compression or biaxial tension is induced by the impurity layers. For example, an n-type superlattice formed using $(Al_xGa_{1-x})_yO_z$ host layers and the impurity layers provide biaxial tension or compression in the $(Al_xGa_{1-x})O_z$ host layers.

In some embodiments, the doped superlattice described herein resides in an electronic device, where the electronic device comprises an n-type doped superlattice providing n-type conductivity and a p-type doped superlattice providing p-type conductivity. For example, the electronic device can be a UV LED, a UV light detector, or a UV laser. For example, the electronic device can be a UV LED operating in the optical wavelength range from 8150 nm to 280 nm, or from 190 nm to 250 nm.

In an example, the n-type doped superlattice comprises alternating host layers and donor impurity layers. The host layers of the n-type doped superlattice comprise (or consist essentially of) an epitaxial oxide semiconductor material and the donor impurity layers comprise (or consist essentially of) a corresponding donor material. The p-type doped superlattice comprises alternating host layers and acceptor impurity layers. The host layers of the p-type doped superlattice comprise (or consist essentially of) an epitaxial oxide semiconductor material and the acceptor impurity layers comprise (or consist essentially of) a corresponding acceptor material. The n-type doped superlattice and p-type doped superlattice can be the doped superlattice 8115 described above, and the epitaxial oxide semiconductor material, the donor material and/or the acceptor material can be the materials described in relation to the doped superlattice 8115.

In some embodiments, the n-type doped superlattice and the p-type doped superlattice form a PN junction. In other embodiments, the electronic device further comprises an intrinsic region between the n-type doped superlattice and the p-type doped superlattice to form a PIN junction. Here the term "intrinsic region" has been used in line with convention and is not intended to suggest that the intrinsic region is always formed of a near pure semiconductor material. In some embodiments the intrinsic region comprises (or is formed essentially of) one or more not intentionally doped or pure semiconductor materials. The intrinsic region can comprise one or more epitaxial oxide semiconductor materials of the host layer, or one or more epitaxial oxide materials that are different from those in the host layer(s) of the n-type and/or p-type doped superlattices.

In some embodiments, the electronic device can be considered to be a homojunction device because the same epitaxial oxide semiconductor material is used throughout most or all of the electrical and optical layers of the electronic device. Because the same epitaxial oxide semiconductor material is used throughout most or all of the electrical and optical layers of the electronic device, the refractive index is the same throughout these layers of the electronic device.

In some embodiments, a period and/or a duty cycle of the p-type doped superlattice and/or the n-type doped superlattice is such that the p-type doped superlattice and/or the n-type doped superlattice is transparent to a photon emission wavelength or a photon absorption wavelength of the intrinsic region or a depletion region of a PN junction. This enables light emitted from, or absorbed by, the intrinsic region or the depletion region of the PN junction to efficiently enter or leave the device. In some cases, the depletion region is engineered for high (or optimal) optical generation probability by efficient recombination of injected electrons and holes from the respective n-type and p-type doped superlattice regions.

In some embodiments, the electronic devices are heterostructure devices comprising a first epitaxial oxide material as the host layer in one or more doped superlattices, and a second epitaxial oxide material in an intrinsic (or not intentionally doped) region. For example, wider bandgap epitaxial oxide materials can be used in the one or more doped superlattices in the device and a narrower bandgap epitaxial oxide material can be used in the intrinsic region. Such a configuration can be beneficial since the one or more doped superlattices can be transparent to a wavelength of interest while the intrinsic region can be configured to emit the wavelength of interest (or absorb the wavelength of interest, in the case of a detector device). For example, the one or more doped superlattices can comprise $(Al_xGa_{1-x})_yO_z$ with a high Al content (e.g., x greater than 0.5) and the intrinsic region can comprise $(Al_xGa_{1-x})_yO$ with a low Al content (e.g., x less than 0.5).

FIG. 129 is a cross-sectional view of an electronic device 8500, according to some embodiments. The electronic device 8500 is a PIN device and comprises a substrate 8510, a buffer region 8520, an n-type doped superlattice 8530, an intrinsic (or not intentionally doped) layer 8540, and a p-type doped superlattice 8550. The device can be produced by forming the buffer region 8520, the n-type doped superlattice 8530, the intrinsic layer 8540 and the p-type doped superlattice 8550 in order on the substrate 8510.

The substrate 8510 has a thickness t4, which in some embodiments is between about 300 μm and about 1,000 μm. In some embodiments, the thickness t4 is chosen in proportion to a diameter of the substrate 8510, such that the larger the diameter of the substrate, the larger the thickness t4.

In some embodiments, the substrate 8510 is substantially transparent to a design wavelength of the electronic device. The design wavelength can be an emission wavelength of the electronic device 8500 where the electronic device 8500 is a UV LED or UV laser, or can be an absorption wavelength of the electronic device 8500 where the electronic device 8500 is a UV light detector. In some embodiments, the emission wavelength or the absorption wavelength is from 8150 nm to 280 nm, or from 190 nm to 250 nm. For example, the substrate 8510 can be formed of a material that is substantially transparent to UV light, such as sapphire. In some embodiments, the material for the substrate can be selected from one of: A-plane sapphire, C-plane sapphire, M-plane sapphire, R-plane sapphire, $Ga_2O_3$, or MgO, optionally with a template layer (e.g., Al(111) metal).

In alternative embodiments, the substrate 8510 is substantially non-transparent to the design wavelength of the electronic device 8500. For example, the substrate 8510 can be formed of a material that is substantially non-transparent to some wavelengths of UV light, such as $Ga_2O_3$. The substrate 8510 can be substantially insulating or substantially conductive. For example, the substrate 8510 can be formed of MgO that has been doped to a high level of conductivity. In some embodiments, an optical access port can be optionally micro-machined or etched into the substrate to enable efficient optical extraction.

The buffer region 8520 has a thickness t5, which in some embodiments is from about 10 nm to 5 μm, or from about 10 nm to about 1 μm, or from about 100 nm to 500 nm. In some cases, the buffer region 8520 is formed sufficiently thick to have low defect density at a surface adjacent to the n-type doped superlattice 8530. For example, the defect density of the buffer region 8520 is about $10^8$ $cm^{-3}$ or less.

In some embodiments, the buffer region 8520 comprises (or consists essentially of) $(Al_xGa_{1-x})_2O_3$, where 0≤x≤1, either as bulk-like materials (or bulk-like films, or single layer films), or as layers of a buffer region superlattice. In some embodiments, the buffer region comprises a ternary bulk alloy or superlattice comprising a material from the table in FIG. 28 or FIGS. 76A-1, 76A-2 and 76B. In some embodiments, the buffer region comprises an epitaxial oxide of the form $A_xB_yO_z$ (e.g., $(A_xB_{1-x})_2O_3$), where A and B are selected from at least two of Al, Ga, Mg, Ni, Zn, Bi, Ge, Ir, a rare earth element, and Li.

Buffer region 8520 can include, for example, $(Al_xGa_{1-x})_2O_3$ with a space group that is R3c, Pna21, C2m, Fd3m, and/or Ia3; $(Al_xGa_{1-x})_2O_3$ where 0≤x≤1; $(Al_xGa_{1-x})_yO_z$ where 0≤x≤1, 1≤y≤3, and 2≤z≤4; NiO; $(Mg_xZn_{1-x})_z(Al_yGa_{1-y})_{2(1-z)}O_{3-2z}$ where 0≤x≤1, 0≤y≤1 and 0≤z≤1; $(Mg_xN_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2$ $(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B.

In some embodiments, the buffer region 8520 comprises a superlattice, such as a short-period superlattice. For example, a buffer layer can be formed from a superlattice formed of alternating layers of $(Al_xGa_{1-x})_yO_z$ where 0≤x≤1, 1≤y≤3, and 2≤z≤4, where the alternating layers can include two different compositions of $(Al_xGa_{1-x})_yO_z$. In some cases, a buffer region superlattice may have a bulk composition equivalent to a composition of the epitaxial oxide semiconductor material of the host layers 8532. In some cases, a buffer region superlattice may have a top surface with an in-plane (approximately parallel with the surface of the substrate) lattice constant that is equivalent to (or within 10% of, or within 5% of, or within 3% of, or within 2% of, or within 1% of) an in-plane lattice constant of the epitaxial oxide semiconductor material of the host layers 8532. Such superlattice structures can be used to further reduce the defect density in the buffer region 8520 by introducing lateral strain energy to reduce threading dislocations.

The n-type doped superlattice 8530 comprises alternating host layers 8532 and donor impurity layers 8534. The host layers and impurity layers can be any of those described herein, for example, $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c, Pna21, C2m, Fd3m and/or Ia3); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2$ $(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B.

The p-type doped superlattice 8550 comprises alternating host layers 8552 and acceptor impurity layers 8554. The host layers and impurity layers can be any of those described herein, for example, $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c, Pna21, C2m, Fd3m and/or Ia3); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B.

The n-type doped superlattice 8530 has a thickness t6 and the p-type doped superlattice 8550 has a thickness t7. These thicknesses can be the thicknesses described above, for example in FIG. 126 as thickness t1. The thicknesses t6 and t7 can be selected to substantially reduce parasitic absorption of light of the design wavelength of the electronic device 8500. For example, epitaxial oxide materials can have emission wavelengths from 8150 nm to 280 nm.

In some cases, an optical thickness of the n-type doped superlattice 8530 can be determined from the refractive indexes of the materials used to form the n-type doped superlattice 8530, and the other layers in the structure. The optical thickness can be selected for efficient extraction of light from the electronic device 8500, for example, taking into account reflections between interfaces and optical interference effects.

In some embodiments, the thickness t6 of the n-type doped superlattice 8530 is selected to facilitate formation of an ohmic contact (not shown) on the electronic device 8500. In some embodiments, the thickness t6 is at least about 250 nm to facilitate fabricating an ohmic contact using a selective mesa-etching process.

The host layers 8532 and 8552 of the n-type doped superlattice 8530 and the p-type doped superlattice 8550 have a thickness t9 and a thickness t11, respectively. These thicknesses can be the thickness described above, for example in FIG. 126 as thickness t2. The donor impurity layers 8534 have a thickness t10 and the acceptor impurity layers 8554 have a thickness t12. These thicknesses can be the thicknesses described above, for example in FIG. 126 as thickness t3.

The n-type doped superlattice 8530 has a period d2 and the p-type doped superlattice 8550 has a period d3. In some embodiments, period d2 and/or period d3 are based on the design wavelength of the electronic device 8500. In the embodiment shown, the period d2 and the period d3 are uniform. However, in alternative embodiments, period d2 and/or period d3 can be non-uniform, such as being different from one another, and/or can vary within a superlattice. The periods d2 and d3 can be the periods described above, for example in FIG. 126 as period d1.

The n-type doped superlattice 8530 can be considered to have a plurality of superlattice unit cells each consisting of a host layer 8532 and a donor impurity layer 8534. The p-type doped superlattice 8550 can be considered to have a plurality of unit cells each consisting of a host layer 8552 and an acceptor impurity layer 8554. The optical properties of the n-type doped superlattice 8530 and the p-type doped superlattice 8550 can be selected by changing the period and/or duty cycle of the unit cells in the superlattice. The optical properties of the n-type doped superlattice 8530 and the p-type doped superlattice 8550 can also be selected by changing the material comprising the doped superlattices 8530 and 8550. In the embodiment shown, the period d2 and the period d3 are the same. However, in alternative embodiments, period d2 and the period d3 can be different enabling different optical properties to be selected on either side of the intrinsic region 8540.

In some embodiments, the intrinsic region 8540 is the active region of electronic device 8500 wherein electrons from the n-type doped superlattice 8530 and holes from the p-type doped superlattice 8550 recombine to emit photons. The intrinsic region 8540 has a thickness t8, which in some embodiments is from 100 nm to 1000 nm, or less than 500 nm. In some embodiments, the thickness of the intrinsic region is about one half the emitted optical wavelength, or an even multiple of the emitted optical wavelength. For UV LEDs and lasers, the thickness t8 of the intrinsic region 8540 is selected for efficient recombination of electrons from the n-type doped superlattice 8530 and holes from the p-type doped superlattice 8550.

In some embodiments, the intrinsic region 8540 comprises (or consists essentially of) one or more epitaxial oxide semiconductor materials. For example, the intrinsic region 8540 can comprise (or consist of) the epitaxial oxide semiconductor material used in the host layers 8532 of the n-type doped superlattice and the p-type doped superlattice, for example $(Al_xGa_{1-x})_yO_z$ where $0\le x\le 1$, $1\le y\le 3$, and $2\le z\le 4$, which has an emission wavelength from about 8150 nm to about 280 nm. In some embodiments, the one or more epitaxial oxide semiconductor materials are configured such that the intrinsic region 8540 has a bandgap that varies along a growth direction.

For example, the intrinsic region 8540 can comprise at least one of the following: $(Al_xGa_{1-x})_2O_3$ where $0\le x\le 1$; $(Al_xGa_{1-x})_yO_z$ where $0\le x\le 1$, $1\le y\le 3$, and $2\le z\le 4$ (with a space group that is R3c, Pna21, C2m, Fd3m, and/or Ia3); NiO; $(Mg_xZn_{1-x})_z(Al_yGa_{1-y})_{2(1-z)}O_{3-2z}$ where $0\le x\le 1$, $0\le y\le 1$ and $0\le z\le 1$; $(Mg_xNi_{1-x})_z(Al_yGa_{1-y})_{2(1-z)}O_{3-2z}$ where $0\le x\le 1$, $0\le y\le 1$ and $0\le z\le 1$; $MgAl_2O_4$; $ZnGa_2O_4$; $(Mg_xZn_yNi_{1-y-x})(Al_yGa_{1-y})_2O_4$ where $0\le x\le 1$, $0\le y\le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0\le x\le 1$ and $0\le z\le 1$; $(Al_xGa_{1-x})_2LiO_2$ where $0\le x\le 1$; $(Mg_xZn_{1-x-y}Ni_y)_2GeO_4$ where $0\le x\le 1$, $0\le y\le 1$; and/or other epitaxial oxide materials from FIGS. 28, 76A-1, 76A-2 and 76B. The intrinsic region can comprise a single layer of one of the materials listed above, multiple layers of one of the materials listed above, one or more quantum wells and barriers comprising one or more of the materials listed above, or a superlattice comprising one or more of the materials listed above. The crystal structure modifier can produce a predetermined effect of at least one of: improving the material quality, altering the emission wavelength, and altering the intrinsic strain state of the intrinsic region relative to the other regions of the superlattice.

In some embodiments, the intrinsic region 8540 comprises an impurity layer. The impurity layer comprises (or consists essentially of): a donor material corresponding to the one or more epitaxial oxide semiconductor materials of the intrinsic region; an acceptor material corresponding to the one or more epitaxial oxide semiconductor materials of the intrinsic region; a compensated material comprising a donor material and an acceptor material corresponding to the one or more epitaxial oxide semiconductor materials of the intrinsic region. For example, the intrinsic region can comprise $(Mg_xZn_{1-x})_z(Al_yGa_{1-y})_{2(1-z)}O_{3-2z}$, where $0\le x\le 1$, $0\le y\le 1$ and $0\le z\le 1$, or $(Al_xGa_{1-x})O_z$ where $0\le x\le 1$, $1\le y\le 3$, and $2\le z\le 4$, and the impurity layer in the intrinsic region can comprise Si; Ge; group III elements such as Al, Ga, and In; and Li.

In some embodiments, the intrinsic region comprises an optical recombination superlattice, or a superlattice where electrons and holes recombine to emit photons (or light). For example, the intrinsic region 8540 can comprise a superlattice comprising a repeating unit cell of the following layers of material [host/impurity/host/impurity/host/impurity], where host is a host semiconductor material, such as the epitaxial oxide semiconductor material of the host layer, and impurity is a donor or acceptor material corresponding to the host layer. In some cases, the materials comprising the host layers and impurity layers change throughout the superlattice. For example, the intrinsic region 8540 can comprise a superlattice comprising a repeating unit cell of the following layers of material [host A/impurity A/host B/impurity B], where host A and host B are different epitaxial oxide materials (e.g., $(Al_xGa_{1-x})_yO_z$ with different values of x) and where impurity A and impurity B are either the same donor or acceptor material or different donor or acceptor materials.

In some embodiments, the optical recombination superlattice comprises host layers comprising (or consisting essentially of) a host epitaxial oxide semiconductor material and an impurity layer that is optically active. The impurity layer, for example, comprises (or consists essentially of) a material that is selected from a lanthanide species that is incorporated in a triply ionized state. The Lanthanide species within the optical recombination superlattice thus forms a prepared 4-f shell electronic manifold intrinsic to the Lanthanide atoms incorporated within the optical recombination superlattice. The 4-f electronic manifold of the triply ionized and atomically bonded Lanthanide specie is embedded on an electronic energy scale substantially within the bandgap energy of the host semiconductor material of the optical recombination superlattice.

Electrons and holes are injected into the optical recombination superlattice from the n-type and p-type doped superlattices, respectively, wherein the electrons and holes recombine transferring energy to the 4-f shell states of the Lanthanide specie in the impurity layer of the optical recombination superlattice and thus excite the said 4-f shell states. Relaxation of the excited 4f-shell states creates intense and sharp optical emission that is transmitted through the entire electronic device by virtue of the n-type and p-type doped superlattices being optically transparent.

In alternative embodiments, the intrinsic region 8540 is omitted from the electronic device 8500 shown in FIG. 129. In these embodiments, the p-type doped superlattice 8550 is formed directly atop the n-type doped superlattice 8530 and the electronic device is a PN device (or a homojunction PN device).

FIG. 130 is a cross-sectional view of an example of an LED device 8600 that is based on the structure of the electronic device 8500 shown in FIG. 129. The LED device 8600 comprises a substrate 8610, a buffer region 8620, an n-type doped superlattice 8630, an intrinsic layer 8640, a p-type doped superlattice 8650, and a p-type contact layer 8660. The device can be produced by forming the buffer region 8620, the n-type doped superlattice 8630, the intrinsic layer 8640, the p-type doped superlattice 8650, and the p-type contact layer 8660 in order on the substrate 8610. The LED device 8600 also comprises a p-type contact 8670 and an n-type contact 8680. The p-type contact 8670 is formed on top of the p-type contact layer 8660.

The p-type contact 8670 and the n-type contact 8680 can be formed using known photolithographic processes. For example, the n-type contact 8680 can be formed via a photolithographic process, wherein a portion of each of the p-type contact 8670, the p-type contact layer 8660, the p-type doped superlattice 8650, the intrinsic layer 8640, and the n-type doped superlattice 8630 are removed in order to expose a defined area on the n-type doped superlattice 8630. A passivation layer 8685 (e.g., $Al_2O_3$, LiF or MgF) is formed to cover exposed edges of the n-type doped superlattice 8630, the intrinsic layer 8640, the p-type doped superlattice 8650, and the p-type contact layer 8660 to prevent undesired conduction paths from the n-type contact to the buffer region 8620, the n-type doped superlattice 8630, the intrinsic layer 8640, the p-type doped superlattice 8650 and the p-type contact layer 8660. In some embodiments, the passivation layer 8685 consists of a wide bandgap material (e.g., $Al_2O_3$, LiF or MgF) having a wider bandgap than the epitaxial oxide semiconductor material of the host layers in the n-type doped superlattice 8630 and the p-type doped superlattice 8650.

In one embodiment, the substrate 8610 is a transparent insulating substrate formed of sapphire and the p-type contact layer 8660 is formed of highly doped p-type $(Al_xGa_{1-x})_yO_z$ where $0 \le x \le 1$, $1 \le y \le 3$, and $2 \le z \le 4$ (e.g., doped with Li or N). The thickness of the p-type contact layer 8660 can be between about 25 nm and about 200 nm, and is about 50 nm in an example. The p-type contact 8670 is preferably reflective and electrically conductive. A portion of the p-type contact 8670 can be formed using Al for highly optical reflective operation in the 190 nm to 280 nm wavelength region, and a portion of the p-type contact 8670 can be formed of a not optically reflective material as an ohmic contact. High work function p-type contact metals for epitaxial oxide materials can include Platinum (Pt), Iridium (Ir), Palladium (Pd) and Osmium (Os). Metal contacts to n-type epitaxial oxide materials can be made from Aluminium (Al), Cesium (Cs), Palladium (Pd), and Tungsten (W).

Light 8690 that is emitted from the intrinsic layer 8640 can exit the LED device 8600 vertically through the substrate 8610 and/or in the lateral direction. Because the p-type contact 8670 can be engineered to be reflective, a portion of the light 8690 that is emitted from the intrinsic layer 8640 in the vertical direction through the p-type doped superlattice 8650 can be reflected and exit the LED device 8600 through the substrate 8610 as reflected light 8695.

FIG. 131 is a cross-sectional view of an example of an LED device 8800 that is based on the electronic device 8500 and the LED device 8600 shown in FIGS. 129 and 130. The LED device 8800 is a vertically emitting homojunction PIN diode. The LED device 8800 comprises a substrate 8810, a buffer region 8820, an n-type doped superlattice 8830, an intrinsic layer 8840, a p-type doped superlattice 8850, and a p-type contact layer 8860. The LED device 8800 can be produced by forming the buffer region 8820, the n-type doped superlattice 8830, the intrinsic layer 8840, the p-type doped superlattice 8850, and the p-type contact layer 8860 in order on the substrate 8810. The LED device 8800 also comprises a p-type contact 8870 and an n-type contact 8880. The p-type contact 8870 is formed on top of the p-type contact layer 8860.

The substrate 8810 is a non-transparent insulating substrate (for example $Ga_2O_3$) and the p-type contact 8870 is patterned as a grid having a plurality of openings 8872. Light 8890 emitted from the intrinsic region 8840 is emitted from the device through the openings 8872. In some cases, the light 8890 emitted from the intrinsic region 8840 can also exit the LED device 8800 in the lateral direction. "Laterally" or "lateral" refers to the direction substantially along the plane of the layers, while "vertically" or "vertical" refers to the direction substantially perpendicular or normal to the plane of the layers.

FIG. 132 is a cross-sectional view of an example of an LED device 8802 based on the LED device 8800 shown in FIG. 131. In the LED device 8802, the substrate 8810 is a non-transparent, conductive substrate. For example, such a substrate can be made of n-type doped $Ga_2O_3$ (if the emission wavelength is in the range of 8150-280 nm) that has been electrically doped to a high level of conductivity. An ohmic contact 8882 is formed on the bottom of the substrate 8810 and an n-type contact adjacent to layer 8830 (e.g., contact 8880 in FIG. 131) is omitted. The ohmic contact 8882 can be formed, for example, of Al if the substrate 8810 is n-type, or of a high work function metal, such as nickel or osmium, if the substrate 8810 is p-type. The contact resistance between the contact 8882 and the buffer region 8820, through the substrate 8810, can be further improved by recessing into the substrate 8810 trenched regions of ohmic metal to further increase the contact area and improve the heat extraction efficiency.

In some embodiments, the substrate 8810 and the ohmic contact 8882 comprise one or more windows or openings to enable light to leave the electronic device.

FIG. 133 is a cross-sectional view of an example of an LED device 8900. In this example, after forming the LED device 8800 shown in FIG. 132, a portion of the ohmic contact 8882 and a portion of the substrate 8810 are removed to form a window 8987. In one example, the window 8987 is formed using a photolithography process, wherein a portion of the ohmic contact 8882 and a portion of the substrate 8810 are removed in order to expose a defined area on the buffer layer 8820. In some cases, substrate 8810 is thinned and not completely removed, either in certain regions, or across the entire substrate 8810. In some cases, light 8890 is also emitted from the LED device 8900 through the window 8987 and the openings 8872. Light 8890 is also emitted through the passivation layer 8885. In some embodiments, an antireflective coating can be formed on a back side of the window 8987 to improve light extraction or optical coupling.

The doped superlattices described herein advantageously allow the formation of epitaxial oxide regions that are doped n-type or p-type, with wide bandgap epitaxial oxide host layers and thin impurity layers. The doped superlattices described herein can be designed to have high conductivity (n-type or p-type) and wide effective bandgaps, such that they have low absorption coefficients to UV light in the wavelength from about 150 nm to about 280 nm (or higher), for example, that is emitted from (or absorbed by) a not intentionally doped region in a structure.

The superlattices can be designed to be transparent to the design wavelength of the electronic device to enable light to be emitted through the n-type or p-type semiconductor region while achieving a high level of n-type or p-type conductivity. Furthermore, the electrical (e.g., carrier concentration) and optical (e.g., optical transparency at the design wavelength) properties of the superlattices can be changed by varying the period and the duty cycle of the unit cells of the superlattice.

It should be appreciated that in the electronic devices shown herein the n-type and p-type doped superlattices and contacts may be swapped such that the p-type doped superlattice is grown first.

Graded Layers and Multilayers

The present disclosure describes semiconductor structures with one or more graded layers or graded regions containing epitaxial oxide materials. In some cases, the graded layers contain an epitaxial oxide layer with a gradient in composition (e.g., a monotonic change in composition) throughout the layer. In some cases, the graded regions contain an epitaxial oxide multilayer structure (or a plurality of epitaxial oxide layers) where the average composition of the multilayer structure changes throughout the region. The average composition of the region can be graded by changing the compositions of the epitaxial oxide layers within the multilayer structure and/or by changing the thicknesses of the epitaxial oxide layers within the multilayer structure.

The epitaxial oxide layers in the graded layers and graded regions described herein can be i-type (i.e., intrinsic, or not intentionally doped), n-type, or p-type. The epitaxial oxide layers that are n-type or p-type can contain impurities that act as extrinsic dopants. In some cases, the n-type or p-type layers contain polar epitaxial oxide materials (e.g., $(Al_xGa_{1-x})_2O_3$, where 0≤x≤1, with a Pna21 space group), and the n-type or p-type conductivity can be induced via polarization doping (e.g., due to a strain within the layer(s)).

The epitaxial oxide materials contained in the semiconductor structures described herein can be any of those shown in the table in FIGS. 28, 76A-1, 76A-2 and 76B, for example, $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c, pna21, C2m, Fd3m, and/or Ia3); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1.

In some cases, the multilayer structures of the graded regions can contain alternating layers that repeat in sequence (e.g., with different compositions and/or thicknesses) with a wider bandgap epitaxial oxide material layer and a narrower bandgap epitaxial oxide material layer. The difference in bandgaps between the wider bandgap and the narrower bandgap epitaxial oxides can be of any height greater than about 100 meV, such as from 0.1 eV to 2 eV, or from 0.3 eV to 2 eV, or from 0.5 eV to 10 eV. In some cases, the multilayer structures of the graded regions can contain layers of three or more layers of epitaxial oxide materials that repeat in sequence (e.g., with different compositions and/or thicknesses).

The graded regions described herein can contain a graded multilayer structure having a wider bandgap $(Al_{x1}Ga_{1-x1})_yO_z$ layer and a narrower bandgap $(Al_{x2}Ga_{1-x2})_yO_z$ layer, where 0≤x1≤1 and 0≤x2≤1, and x1≠x2, where the difference in bandgap between the layers is from 0.1 eV to 2 eV and/or the difference in x between the layers is from 0.1 to 1, and where the compositions and/or thicknesses of the layers change throughout the multilayer structure. For example, a graded region can contain a multilayer structure with repeating pairs of a wider bandgap $(Al_xGa_{1-x})_yO_z$ layer and a narrower bandgap $(Al_xGa_{1-x})_yO_z$ layer, where 0≤x≤1 for both compositions (i.e., both compositions are ternary materials), x is different in each composition, the difference in bandgap between the layers is from 0.1 eV to 2 eV and/or the difference in x between the layers is from 0.1 to 1, and where the thicknesses of the wider bandgap layers and/or the thicknesses of the narrower bandgap layers change through the thickness of the graded region. By changing the thicknesses (or the relative thickness between the layers) through the multilayer structure, the average composition will change throughout the graded region.

FIGS. 91H and 91I described above are example band structures of a graded multilayer structures between a WBG and an NBG material.

In another example, a graded region described herein can contain a multilayer structure with a first layer of $(Al_xGa_{1-x})_yO_z$ where 0≤x≤1, 1≤y≤3, and 2≤z≤4, and a second layer, where the material of the second layer is selected from $(Al_xGa_{1-x})_2O_3$ where 0≤x≤1; $(Al_xGa_{1-x})O_z$ where 0≤x≤1, 1≤y≤3, and 2≤z≤4 (with a space group that is R3c (i.e., α), Pna21 (i.e., κ), C2m (i.e., β), and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B, and where the compositions and/or thicknesses of the first and/or second layers change throughout the multilayer structure.

In another example, a graded region described herein can contain a multilayer structure with a first layer and a second layer, where the materials of the first and second layers are selected from $(Al_xGa_{1-x})_2O_3$ where 0≤x≤1; $(Al_xGa_{1-x})_yO_z$ where 0≤x≤1, 1≤y≤3, and 2≤z≤4; NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B, and where the compositions and/or thicknesses of the first and/or second layers change throughout the multilayer structure.

In some embodiments, the epitaxial oxide materials in the semiconductor structures described herein can each have a cubic, tetrahedral, rhombohedral, hexagonal, and/or monoclinic crystal symmetry. In some embodiments, the epitaxial oxide materials in the semiconductor structures described herein comprise $(Al_xGa_{1-x})_2O_3$ with a space group that is R3c, Pna21, C2m, Fd3m, and/or Ia3.

In some cases, the semiconductor structures are grown on substrates selected from $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $MgF_2$, $LaAlO_3$, $TiO_2$ or quartz.

In some cases, the epitaxial oxide materials of the semiconductor structures described herein and the substrate material upon which the semiconductor structures described herein are grown are selected such that the layers of the semiconductor structure have a predetermined strain. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, or 2% of an in-plane lattice constant (or crystal plane spacing) of the substrate.

In other cases, a buffer layer including a graded layer or region described herein can be used to reset the lattice constant (or crystal plane spacing) of the substrate, and the layers of the semiconductor structure have in-plane lattice constants (or crystal plane spacings) that are within 0.5%, 1%, 1.5%, 2%, 5%, or 10% of the final (or topmost) lattice constant (or crystal plane spacing) of the buffer layer.

Various embodiments relate to growth of a semiconductor structure that has one or more graded layers or graded regions containing epitaxial oxide materials. In some cases, the epitaxial oxide materials of the graded layers described herein have a polar crystal structure, such as $\kappa$-$(Al_xGa_{1-x})_yO_z$, where $0 \leq x \leq 1$, $1 \leq y \leq 3$, and $2 \leq z \leq 4$, which is grown along a growth axis (growth direction), with a spontaneous polarization axis of the crystal structure substantially parallel to the growth axis. Such polar crystal structures are typically characterized as having a crystal lattice possessing a non-inversion symmetry, a spontaneous polarization axis and a distinct growth orientation when deposited along a polarization axis.

In some cases, the graded layers described herein contain a layer of an epitaxial oxide material that has a changing composition throughout the layer. For example, the graded layer can contain $\kappa$-$(Al_xGa_{1-x})O_z$, where $0 \leq x \leq 1$, $1 \leq y \leq 3$, and $2 \leq z \leq 4$, and where the composition (or value of x) changes throughout the layer. In some cases, the composition of the layer can change monotonically, linearly, exponentially, or logarithmically through the graded layer. In some cases, the epitaxial oxide material of the graded layer can have a polar crystal structure of $\kappa$-$(Al_xGa_{1-x})O_z$, and the layer can become n-type or p-type doped due to polarization doping caused by the changing composition (and/or strain) throughout the layer.

In some cases, the multilayer structures of the graded regions described herein contain at least two distinct layers formed of a substantially single crystal epitaxial oxide semiconductor. In some embodiments, the layers of the multilayer structures are thinner than 100 monolayers (MLs), or thinner than 10 ML, or have thicknesses from 0 ML to 100 ML, or from 0.1 ML to 100 ML, or from 0.1 ML to 10 ML. In some cases, the properties of the multilayer structure are engineered by changing a composition of one or more epitaxial oxide layers in the multilayer structure, or a bulk or an average composition throughout the multilayer structure. In some cases, the average composition of the multilayer structure is changed monotonically along the growth axis, for example by changing the compositions and/or thicknesses of the layers of the multilayer structure along the growth axis. Such a change in average composition is also referred to herein as a graded region. In some cases, one or more of the epitaxial oxide material(s) of the multilayer structure of the graded region can have a polar crystal structure and the region can have enhanced n-type or p-type conductivity due to polarization doping caused by the changing average composition (and/or strain) throughout the layer.

In some embodiments, the composition of the epitaxial oxide layers of the semiconductor structures described herein comprise at least one type, or at least two types, of cation (e.g., a metal atom cation) and oxygen. In some embodiments, the composition of the epitaxial oxide graded layers or regions is changed by changing a molar fraction of one or more of the at least two types of cations in the composition along the growth axis. In some embodiments, the average composition of a multilayer structure of a graded region is changed by changing thicknesses of one or more of the at least two distinct layers of the multilayer structure. In some embodiments, the at least two distinct layers have thicknesses that are less than the de Broglie wavelength of a charge carrier, for example, an electron or a hole, in the respective layer. In some embodiments, the at least two distinct layers also each have thicknesses that are less than or equal to a critical layer thickness required to maintain elastic strain.

In some embodiments, the composition of the graded layers or regions described herein is changed monotonically from a wider bandgap (WBG) material to a narrower bandgap (NBG) material or from a NBG material to a WBG material along the growth axis. In cases where one or more epitaxial oxide materials of the graded layers or regions is a polar material, then this can induce p-type or n-type conductivity and make the graded layer or region p-type or n-type. FIGS. 91F and 91G described above show example band structures of graded epitaxial oxide layers, with monotonically graded bandgaps along a growth direction, between an NBG layer and a WBG layer.

For example, p-type conductivity can be induced by growing the polar epitaxial oxide semiconductor with a cation-polar crystal structure, such as a metal-polar crystal structure, and changing the composition of the semiconductor monotonically from a WBG material to a NBG material along the growth axis. Alternatively, p-type conductivity can be induced by growing the polar epitaxial oxide semiconductor with an anion-polar crystal structure, such as an oxygen-polar crystal structure, and changing the composition of the semiconductor monotonically from a NBG material to a WBG material along the growth axis.

For example, n-type conductivity can be induced by growing the polar epitaxial oxide semiconductor with a cation-polar crystal structure, such as a metal-polar crystal structure, and changing the composition of the semiconductor monotonically from a NBG material to a WBG material along the growth axis. Alternatively, n-type conductivity can be induced by growing the polar epitaxial oxide semiconductor with an anion-polar crystal structure, such as an oxygen-polar crystal structure, and changing the composition of the semiconductor monotonically from a WBG material to a NBG material along the growth axis.

Similarly, in some embodiments, a graded region with a multilayer structure containing one or more polar epitaxial oxide semiconductor materials is engineered, for example to induce p-type or n-type conductivity, by changing an average composition of the multilayer structure monotonically from an average composition corresponding to a wider bandgap (WBG) material to an average composition corresponding to a narrower bandgap (NBG) material or from an average composition corresponding to a NBG material to an average composition corresponding to a WBG material along the growth axis.

For example, p-type conductivity can be induced by growing the multilayer structure with one or more polar epitaxial oxide semiconductor materials with cation-polar crystal structures, such as metal-polar crystal structures, and changing the average composition of the multilayer structure monotonically from an average composition corresponding to a WBG material to an average composition corresponding to a NBG material along the growth axis. Alternatively, p-type conductivity can be induced by growing the multilayer structure with one or more polar epitaxial oxide semiconductor materials with anion-polar crystal structures, such as oxygen-polar crystal structures, and changing the average composition of the multilayer structure monotonically from an average composition corresponding to a NBG material to an average composition corresponding to a WBG material along the growth axis.

For example, n-type conductivity can be induced by growing the multilayer structure with one or more polar epitaxial oxide semiconductor materials with cation-polar crystal structures, such as metal-polar crystal structures, and changing the average composition of the multilayer structure monotonically from an average composition corresponding to a NBG material to an average composition corresponding to a WBG material along the growth axis. Alternatively, n-type conductivity can be induced by growing the multilayer structure with one or more polar epitaxial oxide semiconductor materials with anion-polar crystal structures, such as oxygen-polar crystal structures, and changing the average composition of the multilayer structure monotonically from an average composition corresponding to a WBG material to an average composition corresponding to a NBG material along the growth axis.

A complex semiconductor structure, for example, for use in a semiconductor device, such as an LED, can be formed from the graded layers or graded regions described herein, along with other epitaxial oxide layers. For example, a complex semiconductor structure can be formed by stacking two or more semiconductor structures and/or semiconductor superlattices contiguously on top of one another. In some cases, a polarity-type of the material can be flipped between two of the two or more contiguous semiconductor structures and/or semiconductor superlattices.

For example, a light emitting diode (LED) structure, a laser structure, or other semiconductor device structure (e.g., a photodetector, or a switch (transistor), can be formed using a graded layer or graded region, for example, as an i-type region, between a WBG n-type region and a NBG p-type region, and/or by using the graded layer or graded region as an n-type region or a p-type region. In such a way, a light emitting diode (LED) structure can be formed such that there are no abrupt changes in polarization at the interfaces between each region.

FIG. 134 illustrates a metal-polar 'p-UP' LED structure 9600 for a metal-polar epitaxial oxide film growth with respect to a growth axis 9610 (sometimes referred to as a growth direction 'z'). To achieve an induced hole concentration beyond that achievable with impurity doping, polarization doping, or a combination of polarization doping and impurity doping can be used. In this example, the center portion of the LED structure 9600 has a graded layer or graded region 9650 that transitions from a WBG composition to a NBG composition with increasing growth along the growth axis 9610, which is parallel to the spontaneous polarization axis. For example, one or more of the layers and/or regions of structure 9600 can contain $\kappa\text{-}(Al_xGa_{1-x})_yO_z$, where $0\leq x\leq 1$, $1\leq y\leq 3$, and $2\leq z\leq 4$.

Listed in order along the growth axis 9610, the LED structure 9600 comprises a substrate 9620, a buffer or dislocation filter region 9630, an n-type WBG region 9640, the gradient region 9650, and a NBG p-type region 9660. For example, the substrate 9620 can be substantially transparent sapphire ($\alpha\text{-}Al_2O_3$, i.e., with a R3c space group), for example, with a c-plane oriented sapphire (0001) surface, and the gradient region 9650 can comprise $(Al_xGa_{1-x})_2O_3$ where $0\leq x\leq 1$ with a Pna21 space group. Ohmic metal contacts 9670 and 9672 are provided and an optical window 9680 may be provided to allow transmission of light from the top of LED structure 9600. It will be appreciated that light may instead, or additionally, be transmitted through the substrate 9620. Furthermore, the buffer region 9630 may instead, or as well, be a dislocation filter region.

The n-type WBG region 9640 is a doped region, for example an n-type WBG layer, or an n-doped superlattice (e.g., with constant period and constant effective alloy composition). The graded layer or graded region 9650 can then be formed on the n-type WBG region 9640 with an average (or effective) alloy composition that varies as a function of distance along the growth axis 9610. The graded layer or graded region 9650 can form the desired variation in band structure to form a transition from a WBG composition to a NBG composition. Optionally, at least a portion of the graded layer or graded region 9650 can be doped with an impurity dopant. For example, an n-type or a p-type impurity dopant could be optionally integrated into the graded layer or graded region 9650. In some cases, the graded layer or graded region 9650 comprises one or more $(Al_{x(z)}Ga_{1-x(z)})_2O_3$ layers, where x(z) can vary from 0 to 1, with a composition profile. For example, composition profile 'k' can be selected to achieve the spatial profile of the average alloy composition of each unit cell given by: $x_{ave}=x(z)=x_{WBG}-[x_{WBG}-x_{NBG}]*(z-z_s)^k$, where $z_s$ is the start position of the grading.

The NBG p-type region 9660 is deposited upon the graded layer or graded region 9650. In some cases, the NBG p-type region 9660 has a similar effective alloy composition as the final composition achieved by the graded layer or graded region 9650. This can mitigate a potential barrier being induced at a heterojunction interface between the graded layer or graded region 9650 and the NBG p-type region 9660. In some forms the NBG p-type region 9660 is a doped superlattice or bulk type epitaxial oxide layer.

A cap layer (e.g., NiO, LiF or $NiGa_2O_4$) can optionally be deposited as a final layer to provide an improved ohmic contact and a source of holes.

In some cases, the optical transparency of the substrate 9620 of the LED structure 9600 allows optical radiation generated from within the graded layer or graded region 9650 to advantageously propagate out of the device through the n-type WBG region 9640, through the buffer region 9630, and finally out through the substrate 9620 which has low absorptive losses. Light can also escape vertically out through the top of the structure 9600, but the NBG p-type region 9660 effectively filters shorter wavelengths of light and, accordingly, there can be an asymmetry in the wavelength response for light output through the top and bottom of the LED structure 9600. In some cases, light generated from within the graded layer or graded region 9650 can also escape laterally as a 'waveguided' mode with a gradient refractive index, as a function of the growth axis 9610, further confining light to within the plane.

FIG. 135 illustrates an oxygen-polar 'p-DOWN' LED structure 9700 for an oxygen-polar epitaxial oxide film growth with respect to a growth axis 9710. To achieve an induced hole concentration beyond that achievable with impurity doping alone, the center portion of the LED structure 9700 has a graded layer or graded region 9750 that transitions from a NBG composition to a WBG composition with increasing growth along the growth axis 9710, which is substantially parallel to the spontaneous polarization axis, in this case the c-axis of the wurtzite crystal structure. For example, one or more of the layers and/or regions of structure 9600 can contain $\kappa\text{-}(Al_xGa_{1-x})_yO_z$, where $0\leq x\leq 1$, $1\leq y\leq 3$, and $2\leq z\leq 4$.

Listed in order along the growth axis 9710, the LED structure 9700 comprises a substrate 9720 which is in the form of a substantially opaque substrate such as $Ga_2O_3$, a buffer region 9730, a NBG p-type region 9740, the graded layer or graded region 9750, and an WBG n-type region 9760. Ohmic metal contacts 9770 and 9772 are provided and an optical window 9780 may be provided to allow transmission of light from the top of LED structure 9700. It will be appreciated that the buffer region 9730 may instead, or as well, be a dislocation filter region.

The NBG p-type region 9740 is a doped region, for example, a p-type NBG layer or a p-doped superlattice (e.g., with constant period and constant effective or average alloy composition (with $x_{ave}$=NBG composition)). The graded layer or graded region 9750 is then formed on the NBG p-type region 9740 with an average (or effective) alloy composition that varies as a function of growth axis 9710. The graded layer or graded region 9750 can form the desired variation in band structure to form a transition from a NBG composition to a WBG composition. Optionally, at least a portion of the graded layer or graded region 9750 can be doped with an impurity dopant. For example, the gradient region 9750 can comprise $(Al_{x(z)}Ga_{1-x(z)})_2O_3$ or an $[Al_2O_3/Ga_2O_3]$ superlattice with a composition profile 'k' of $x_{ave}=x(z)=x_{NBG}+[x_{WBG}-x_{NBG}]*(z-z_s)^k$.

The WBG n-type region 9760 is deposited upon the graded layer or graded region 9750. In some cases, WBG n-type region 9760 has a similar effective alloy composition as the final composition achieved by the graded layer or graded region 9750. This can mitigate a potential barrier being induced at the heterojunction interface between the graded layer or graded region 9750 and the WBG n-type region 9760. In some forms, the WBG region is a doped superlattice or bulk type epitaxial oxide layer.

A cap layer (e.g., NiO, LiF or $NiGa_2O_4$) can optionally be deposited to provide an improved ohmic contact and a source of electrons.

In some cases, the LED structure 9700 illustrated in FIG. 135 can be formed using opaque substrates 9720, such as $Ga_2O_3$, which have a high absorption coefficient for optical wavelengths generated from within the graded layer or graded region 9750. Light can escape vertically through an optical outlet, such as in the form of an aperture and/or window 9780 in a suitable ohmic contact material 9772. Shorter wavelength light is preferentially absorbed in the NBG regions creating further electrons and holes through re-absorption.

Superlattice structures may be used to improve material structural crystal quality (lower defect density), improve electron and hole carrier transportation, and produce quantum effects that are only accessible at such small length scales. Unlike bulk type epitaxial oxide materials, superlattices introduce new and advantageous physical properties, particularly in relation to diode and LED structures, such as those illustrated in FIGS. 134 and 135. A homogeneous period superlattice comprising at least two dissimilar semiconductor compositions, such as bilayered pairs of $\kappa$-$(Al_xGa_{1-x})_yO_z$, where $0 \le x \le 1$, $1 \le y \le 3$, and $2 \le z \le 4$, where one layer is an NBG and the other layer is a WBG (by changing the composition, or the value of x, between the layers), can be engineered to provide both (i) superlattice quantized miniband transport channels substantially along the growth axis (z), both in the tunnel barrier regime and above barrier regime; and (ii) improved carrier mobility within the plane of the superlattice layers by virtue of both periodicity induced and bi-axial strain induced band deformation so as to warp the energy-momentum dispersion. The superlattice can also mitigate strain accumulation by depositing the constituent layers below their critical layer thickness. The superlattice having tailored conduction and valence band allowed energies and spatial wavefunction probabilities can be manipulated by the large built-in electric fields, such as the depletion fields described herein. For example, a constant period superlattice can be grown to exhibit a highly coupled structure and generate an efficient carrier transport channel through the structure along the growth axis. The highly coupled nature of the partially delocalized wavefunctions can be readily broken by large internal electric fields, rendering the coupled NBG layers essentially isolated (that is, no communication between adjacent NBG regions). This can be advantageous for LED applications.

The superlattice quantized miniband transport channels improve transport along the growth axis (z) and can be used to generate selective energy filters. The improved carrier mobility can be used to dramatically reduce current crowding limitations in conventional device designs comprising mesa type structures. Conversely, the same superlattice structure can be altered in operation by being subjected to large electric fields, such as the depletion regions generated in the structures disclosed herein.

$\kappa$-$(Al_xGa_{1-x})_yO_z$ has a direct bandgap over the range $0 \le x \le 1$, and can be used as emitters or absorber materials in optoelectronic devices. Optical absorption and emission processes therefore occur as vertical transitions in the energy-momentum space and primarily as first order processes without phonon momentum conservation. The superlattice periodic potential, which is also on the length scale of the de Broglie wavelength, modulates the atomic crystal periodicity with a superposed superlattice potential which thereby modifies the energy-momentum band structure in a non-trivial way.

FIG. 136 shows a semiconductor structure (or stack) 91200 for generating electrical and optical portions of a p-n diode according to some embodiments. The stack 91200 comprises a substrate SUB. The SUB is made of a material 91208 that is compatible with the epitaxial oxide materials (91206, 91207, 91209 and 91210) in stack 91200. The stack can be formed by an epitaxial growth technique along growth axis 91205. A n-type WBG buffer layer (n:WBG) 91210 is deposited as a bulk-like alloy or as a fixed average composition unit cell superlattice on the SUB. Next, an n-type SL (n:SL) is formed from alternating epitaxial oxide materials 91207 and 91209, with a constant average alloy content between the two epitaxial oxide materials xave_n. For example, the n:SL can be a 50 period SL, with a unit cell having an 8 ML layer of material 91209 and a 2 ML layer of material 91207, such that the n:SL has an xave_n=0.8. In some embodiments, the unit cell thicknesses 91211 and layer thicknesses are selected to form an n:SL that is substantially transparent (not absorbing) to a desired emission wavelength.

Next a chirp layer (i:CSL) that is not intentionally impurity doped is formed. The i:CSL is used to induce a large hole concentration deep within the device that is free from substitutional impurity doping limitations. The i:CSL varies at least an average composition of a unit cell spatially along the growth axis from a WBG composition to a NBG composition. For example, the grading may be selected to occur over 25 unit cells (i.e. 25 periods) with each unit cell total thickness 91212 held constant while the average alloy content is varied, with the WBG composition having xave_CSL=0.8 and the NBG composition having xave_CSL=0.0. An optional contact layer 91213 comprising a p-type epitaxial oxide material (p:NGB) is deposited upon the completed i:CSL. It is also possible to vary the unit cell thickness of the i:CSL as a function of the growth axis so long as the average composition of the unit cell follows the correct grading as disclosed herein.

In an example, the i:CSL and the n:SL can be formed of bilayered unit cells comprising a layer 91207 of $(Al_{x1}Ga_{1-x1})_yO_z$, where $0 \le x \le 1$, $1 \le y \le 3$, and $2 \le z \le 4$, and a layer 91209 of $(Al_{x2}Ga_{1-x2})_yO_z$, where $0 \le x2 \le 1$, $1 \le y \le 3$, and $2 \le z \le 4$, and where $x1 \ne x2$. Other choices of chirp layer compositions are also possible, and the composition of the unit cells can also be altered from period to period.

FIG. 137 shows a semiconductor structure (or stack) 91300 for generating electrical and optical portions of a p-i-n diode according to some embodiments. The superlattices are again constructed from unit cells 91310 and 91312 having binary epitaxial oxide layers 91207 and 91209 and a metal-polar growth. However, stack 91300 comprises an additional i-type SL (i:SL) with unit cells 91311 that is not intentionally doped. The i:SL is formed upon the n:SL. The i:SL is tuned specifically to achieve an emission energy of light that is substantially smaller in energy than that which the n:SL can absorb (i.e., the absorption edge of the n:SL is designed to have an energy larger than the emission energy of the i:SL). In some cases, the period of the unit cell of the superlattice in the i:SL is longer than the period of the n:SL, and the light emitted from the i:SL passes through the substrate before leaving the device.

In some cases, both the n:SL and i:SL have the same average alloy composition, and their periods can be the same or different. Thus polarization charges are balanced and do not induce p-type or n-type behaviour. This is particularly advantageous for creating an improved electron and hole recombination region within the device. The chirp layer (i:CSL) is formed with a unit cell that is varied from a WBG average composition to a NBG average composition. The i:CSL unit cell thickness is held approximately constant. The thickness of the layers in each successive unit cell are altered in increment ½ (e.g., of ½ ML, or 1 ML) in order to achieve a desired grading profile along the growth axis 91205. The p:NBG layer 91313 has a top surface 91305, upon which a metal contact can be formed, in this example.

FIG. 138 illustrates a further gradient pattern growth sequence for a gradient region with a chirped bilayer period and constant $x_{ave}$ superlattice structure. Each of the sections ($\Lambda^1_{SL}$-$\Lambda^4_{SL}$) comprises a superlattice (e.g., w $N_p$=25 repetitions), and the superlattices are sequentially stacked with incrementally varied periods. The average alloy content of each superlattice and between each superlattice is kept constant. However, the period of the unit cell in each stack is varied by varying the thickness of the layers of the unit cells of the superlattices.

The chirp layers with graded multilayer structures described herein can have varying bilayer periods throughout the structure such that there is no unit cell that is repeated. In other cases, the graded multilayer structures can have some unit cells that do repeat, as in the example above.

Native or non-native substrates can be used for oxide layer epitaxy. Some examples of substrates for the epitaxial oxide deposition of the materials described herein (e.g., the materials shown in FIGS. 28, 76A-1, 76A-2 and 76B) are $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where 0≤x≤1, 1≤y≤3, and 2≤z≤4 (any crystal symmetry), $MgF_2$, $LaAlO_3$, $TiO_2$, or quartz.

Sapphire (e.g., specific orientations of $\alpha$-$Al_2O_3$) offers a compelling commercial and technological utility for oxide layer epitaxy due to the mechanical hardness, deep UV optical transparency, a wide bandgap, and its insulating properties. Sapphire is readily grown using bulk crystal growth methods such as CZ and is manufacturable as extremely high quality structural quality single crystal wafers, available in predominately, R-plane, C-plane, M-plane, and A-plane. C-plane sapphire is an important template surface compatible with epitaxial oxide layers.

For the applications discussed herein, there is a preferred method for preparing C-plane sapphire surface for achieving high quality metal-polar or oxygen-polar epitaxial oxide films (e.g., $Al_2O_3$ with a Pna21 crystal structure). Sapphire, unlike wurtzite and zinc-blende crystals, has a more complex crystal structure. Sapphire is represented by a complex 12 unit cell comprising of oxygen planes interposed with buckled bilayers of Al atoms. Furthermore, C-plane sapphire exhibits a mechanical hardness much higher than R-plane sapphire and thus polishing damage or polishing induced work hardening can readily impede production of atomically pristine surface species. Even though chemical cleaning can be used to produce a contaminant free surface, and the bulk sapphire substrate shows excellent single crystal quality, the surface investigated by reflection high energy electron diffraction (RHEED) exhibits a signature of C-plane sapphire which is always indicative of an atomically rough and non-homogeneous surface. Surface steps in sapphire also readily expose mixed oxygen and atomic crystalline regions which directly affect the initiating epitaxial oxide polarity during epitaxy, and typically results in polarity inversion domains (PIDs).

The first surface of the initiating template may be terminated in a substantially atomically flat and homogeneous surface termination species.

FIG. 139 illustrates a broad flow diagram for forming semiconductor structures having a graded layer or graded region. First, a gradient pattern growth sequence is selected (step 9010), then an appropriate substrate is selected (step 9020), and finally the selected gradient pattern is formed on the substrate (step 9030). The gradient pattern growth sequence is selected (step 9010) such that it transitions from a WBG to a NBG or from a NBG to a WBG material along the grown axis (z). Additional layers, such as a buffer or dislocation filter region, may also be grown depending on the desired structure.

Chirp Layers

The present disclosure describes semiconductor structures with one or more chirp layers containing epitaxial oxide materials. In some cases, the chirp layers contain an epitaxial oxide multilayer structure (or a plurality of epitaxial oxide layers) where the average composition of the multilayer structure changes throughout the chirp layer. The average composition of the chirp layer can be changed (or graded) by changing the thicknesses of the epitaxial oxide layers within the multilayer structure. Additionally, the compositions of the epitaxial oxide layers within the multilayer structure can also be changed to further change the average composition of the structure throughout the chirp layer.

The epitaxial oxide layers in the chirp layers described herein can be i-type (i.e., intrinsic, or not intentionally doped), n-type, or p-type. The epitaxial oxide layers that are n-type or p-type can contain impurities that act as extrinsic dopants. In some cases, the n-type or p-type layers contain polar epitaxial oxide materials (e.g., $\kappa$-$(Al_xGa_{1-x})_yO_z$ where 0≤x≤1, 1≤y≤3, and 2≤z≤4 (with a Pna21 space group)), and the n-type or p-type conductivity can be induced via polarization doping (e.g., due to a strain within the layer(s)).

The epitaxial oxide materials contained in the semiconductor structures described herein can be any of those shown in the table in FIG. 28 and in FIGS. 76A-1, 76A-2 and 76B, for example, $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c (i.e., $\alpha$), Pna21 (i.e., $\kappa$), C2m (i.e., $\beta$), Fd3m, and/or Ia3 (i.e., $\delta$)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1.

In some cases, the multilayer structures of the chirp layer can contain alternating layers of a wider bandgap epitaxial oxide material layer and a narrower bandgap epitaxial oxide material layer that change compositions and/or thicknesses throughout the chirp layer. The difference in bandgaps between the wider bandgap and the narrower bandgap epitaxial oxides can be of any height greater than about 100 meV, such as from 0.1 eV to 2 eV, or from 0.3 eV to 2 eV, or from 0.5 eV to 10 eV. In some cases, the multilayer structures of the chirp layer can contain layers of three or more layers of epitaxial oxide materials that repeat in sequence (e.g., with different compositions and/or thicknesses).

The chirp layers described herein can contain a graded multilayer structure having a wider bandgap $(Al_{x1}Ga_{1-x1})_yO_z$ layer and a narrower bandgap $(Al_{x2}Ga_{1-x2})_yO_z$ layer, where 0≤x1≤1, 0≤x2≤1, x is different in each composition, the difference in bandgap between the layers is from 0.1 eV to 2 eV and/or the difference in between x1 and x2 is from 0.1 to 1, and where the compositions and/or thicknesses of the layers change throughout the multilayer structure. For example, a chirp layer can contain a multilayer structure with repeating pairs of a wider bandgap $(Al_xGa_{1-x})O_z$ layer and a narrower bandgap $(Al_xGa_{1-x})_yO_z$ layer, where: 0≤x≤1 for both compositions (i.e., both compositions are ternary materials); x is different in each composition; the difference in bandgap between the layers is from 0.1 eV to 2 eV and/or the difference in x between the layers is from 0.1 to 1; and where the thicknesses of the wider bandgap layers and/or the thicknesses of the narrower bandgap layers change through the thickness of the chirp layer. By changing the thicknesses (or the relative thickness between the layers) through the multilayer structure, the average composition will change throughout the chirp layer. In some cases, the composition(s) of the wider bandgap layers and/or of the narrower bandgap layers change(s) through the thickness of the chirp layer, in addition to, or instead of, the thicknesses of the wider bandgap layers and/or the thicknesses of the narrower bandgap layers changing through the thickness of the chirp layer.

In another example, a chirp layer described herein can contain a multilayer structure with a first layer of $(Al_xGa_{1-x})_yO_z$ where 0≤x≤1, 1≤y≤3, and 2≤z≤4, and a second layer, where the material of the second layer is selected from $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c (i.e., α), Pna21 (i.e., κ), C2m (i.e., β), Fd3m, and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B and where the compositions and/or thicknesses of the first and/or second layers change throughout the multilayer structure.

In another example, a chirp layer described herein can contain a multilayer structure with a first layer and a second layer, where the materials of the first and second layers are selected from $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c (i.e., α), Pna21 (i.e., κ), C2m (i.e., β), Fd3m (i.e., γ) and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B and where the compositions and/or thicknesses of the first and/or second layers change throughout the multilayer structure.

In some embodiments, the epitaxial oxide materials in the semiconductor structures described herein can each have a cubic, tetrahedral, rhombohedral, hexagonal, and/or monoclinic crystal symmetry. In some embodiments, the epitaxial oxide materials in the semiconductor structures described herein comprise $(Al_xGa_{1-x})_yO_z$ with a space group that is R3c, Pna21, C2m, Fd3m and/or Ia3.

In some cases, the semiconductor structures are grown on substrates selected from $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where 0≤x≤1, 1≤y≤3, and 2≤z≤4 (any crystal symmetry), $MgF_2$, $LaAlO_3$, $TiO_2$, or quartz.

In some cases, the epitaxial oxide materials of the semiconductor structures described herein and the substrate material upon which the semiconductor structures described herein are grown are selected such that the layers of the semiconductor structure have a predetermined strain. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, or 2% of an in-plane lattice constant (or crystal plane spacing) of the substrate.

In other cases, a buffer layer including a graded layer or region described herein can be used to reset the lattice constant (or crystal plane spacing) of the substrate, and the layers of the semiconductor structure have in-plane lattice constants (or crystal plane spacings) that are within 0.5%, 1%, 1.5%, 2%, 5%, or 10% of the final (or topmost) lattice constant (or crystal plane spacing) of the buffer layer.

The present disclosure describes semiconductor devices requiring electrons to travel from a wide bandgap region to a narrow bandgap region with structures that are engineered in such a way that the electron energy is released in small steps as the electrons travel from the wide bandgap region to the narrow bandgap region. In some embodiments, the structures of the present devices mitigate or eliminate structural device changes due to hot electrons, and as a result have improved lifetimes compared to conventional devices. Some examples of semiconductor devices that can benefit from the present embodiments are short wavelength light emitting diode (LED) devices (e.g., UV-C LEDs), LEDs with other wavelengths (e.g., UV-A LEDs), bipolar junction transistors, power transistors, vertical field-effect transistors, and semiconductor lasers. The semiconductor structures described herein can contain epitaxial oxide layers, for example, the materials shown in FIGS. 28, 76A-1, 76A-2 and 76B. Some examples of materials systems that can be used in the present devices are $(Al_xGa_{1-x})_yO_z$ where 0≤x≤1, 1≤y≤3, and 2≤z≤4, such as $Ga_2O_3/(Al,Ga)_2O_3/Al_2O_3$; $(Mg_xZn_{1-x})_z(Al_yGa_{1-y})_{2(1-z)}O_{3-2z}$, where 0≤x≤1, 0≤y≤1 and 0≤z≤1; and $(Mg_xNi_{1-x})_z(Al_yGa_{1-y})_{2(1-z)}O_{3-2z}$, where 0≤x≤1, 0≤y≤1 and 0≤z≤1.

In some embodiments, a semiconductor device contains a plurality of semiconductor layers comprising wide bandgap semiconductor layers, a narrow bandgap semiconductor layer, and a chirp layer between the wide bandgap semiconductor layers and the narrow bandgap semiconductor layer.

The terms "wide bandgap" and "narrow bandgap" are relative to one another, and the important property of the present devices is that the difference between bandgaps (or effective bandgaps in the case of layers containing superlattices) of layers in the structure is relatively large. The difference between bandgaps (or effective bandgaps in the case of layers containing superlattices) in the layers in the present structures can be greater than 1.0 eV, or greater than 1.5 eV, or greater than 2.0 eV, or greater than 2.5 eV, or greater than 3.0 eV, or greater than 3.5 eV, or greater than 4.0 eV, or from 1 eV to 4 eV, or from 2 eV to 5 eV, in different embodiments. For example, a wide bandgap layer can have a bandgap of about 6 eV, and a narrow bandgap layer can have a bandgap of about 3 eV to 5 eV. In another example, the wide bandgap layer has a bandgap about 8 eV, and the narrow bandgap layer has a bandgap from 5 eV to 7 eV.

The term "chirp layer" as used herein refers to a layer that contains a multilayer structure containing wide bandgap layers and narrow bandgap layers, wherein the thicknesses and/or compositions of the wide bandgap layers and/or narrow bandgap layers vary monotonically or non-monotonically throughout the chirp layer. A chirp layer has a similar structure as a uniformly periodic superlattice, but the chirp layer is not composed entirely of periodic unit cells. In some cases, chirp layers can contain regions with periodic unit cells, however, chirp layers also have varying thicknesses and/or compositions and therefore are not composed entirely of periodic unit cells.

FIG. 140A shows an epitaxial oxide semiconductor structure with an epitaxial oxide layer 10110 containing a wide bandgap semiconductor, and an adjacent epitaxial oxide layer 10130 containing a narrow bandgap semiconductor. FIG. 140B shows a semiconductor structure with an epitaxial oxide layer 10110 containing a wide bandgap semiconductor, an epitaxial oxide layer 10130 containing a narrow bandgap semiconductor, and an epitaxial oxide chirp layer 10120 between layers 10110 and 10130. The semiconductor structures 10100 and 10101 can contain epitaxial oxide layers comprising the materials shown in FIGS. 28, 76A-1, 76A-2 and 76B. Some examples of materials systems that can be used in structures 10100 and 10101 are $(Al_xGa_{1-x})_yO_z$ where 0≤x≤1, 1≤y≤3, and 2≤z≤4, such as $Ga_2O_3/(Al,Ga)_2O_3/Al_2O_3$; $(Mg_xZn_{1-x})_z(Al_yGa_{1-y})_{2(1-z)}O_{3-2z}$, where 0≤x≤1, 0≤y≤1 and 0≤z≤1; and $(Mg_xNi_{1-x})_z(Al_yGa_{1-y})_{2(1-z)}O_{3-2z}$, where 0≤x≤1, 0≤y≤1 and 0≤z≤1. The epitaxial oxide materials in structures 10100 and 10101 can each have a cubic, tetrahedral, rhombohedral, hexagonal, and/or monoclinic crystal symmetry. In some embodiments, the epitaxial oxide materials in structures 10100 and 10101 comprise $(Al_xGa_{1-x})_2O_3$ with a space group that is R3c, Pna21, C2m, Fd3m and/or Ia3. The crystal symmetry (and/or space groups) of the epitaxial oxide layers in structures 10100 and 10101 can be the same or different between the layers.

FIG. 140C illustrates an electron 10111 moving through the structure 10100 from left to right in the figure. When the electron 10111 moves from the epitaxial oxide layer 10110 to the epitaxial oxide layer 10130 it loses a large amount of energy 10112 in a single step (as depicted by the multiple curved lines 10112 around the electron in epitaxial oxide chirp layer 10130). FIG. 140D illustrates an electron 10113 moving through the structure 10101 (containing the epitaxial oxide chirp layer 10120) from left to right in the figure. The wide bandgap epitaxial oxide layers 10120*a* and the narrow bandgap epitaxial oxide layers 10120*b* in epitaxial oxide chirp layer 10120 are shown in this figure as well. In some cases, epitaxial oxide layers 10110, 10120 and 10130 are composed of the same wide bandgap materials (e.g., $(Al_xGa_{1-x})_yO_z$ with a high Al content, e.g., x greater than or equal to 0.3) and the same narrow bandgap materials (e.g., $(Al_xGa_{1-x})O_z$ with a low Al content, e.g., x less than 0.3).

In some embodiments, epitaxial oxide layer 10110 contains a first set of wide bandgap materials, epitaxial oxide layer 10120 contains a second set of wide bandgap materials and narrow bandgap materials, and epitaxial oxide layer 10130 contains a third set of narrow bandgap materials, where the first, second and third sets of materials can be the same or different from one another. For example, the first set of wide bandgap materials in layer 10110 can contain $(Mg_xNi_{1-x})_z(Al_yGa_{1-y})_{2(1-z)}O_{3-2z}$ with a composition providing a wide bandgap, and the chirp layer 10120 can contain a chirp layer composed of $(Mg_xNi_{1-x})_z(Al_yGa_{1-y})_{2(1-z)}O_{3-2z}$ layers with compositions providing narrow and wide bandgaps, and layer 10130 can contain $(Mg_xNi_{1-x})_z(Al_yGa_{1-y})_{2(1-z)}O_{3-2z}$ with a composition providing a narrow bandgap. The example shown in FIG. 140D depicts the thickness of the wide bandgap epitaxial oxide layers 10120*a* in the epitaxial oxide chirp layer 10120 changing in a certain way through the epitaxial oxide chirp layer 10120, and the narrow bandgap epitaxial oxide layers 10120*b* in the epitaxial oxide chirp layer 10120 changing thickness in a certain way through the epitaxial oxide chirp layer 10120. However, in other embodiments, the thicknesses of the wide and/or narrow bandgap epitaxial oxide layers in the epitaxial oxide chirp layer can change thickness in other ways not shown in FIG. 140D. In the embodiment shown in FIG. 140D, the electron 10113 loses small amounts of energy 10114 in several steps as it moves through the epitaxial oxide chirp layer 10120 (as depicted by the single curves lines 10114 around the electron in epitaxial oxide layers 10120 and 10130). This is advantageous, because electrons releasing large amounts of energy in a semiconductor device can lead to device degradation.

The epitaxial oxide structures shown in FIGS. 140A-140D can be incorporated into any semiconductor device where electrons move from regions containing wider bandgap semiconductors to regions containing narrower bandgap semiconductors, such as short wavelength light emitting diode (LED) devices (e.g., UV-C LEDs), LEDs with other wavelengths (e.g., UV-A LEDs), bipolar junction transistors, power transistors, vertical field-effect transistors, and semiconductor lasers. In some cases, incorporating a structure similar to structure 101 into any of the above semiconductor devices can improve the lifetime (i.e., reduce degradation over time) of the device.

FIGS. 91H and 91I described above show example band structures of epitaxial oxide chirp layers, comprising, and positioned between, a wide bandgap material and a narrow bandgap material.

In some embodiments, the wide bandgap epitaxial oxide layers contain an n-type material (e.g. $(Mg_xNi_{1-x})_z(Al_yGa_{1-y})_{2(1-z)}O_{3-2z}$), which can be arranged in a single layer, multiple layers, a short-period superlattice (SPSL), or any other structural form. In some embodiments, the narrow bandgap epitaxial oxide layers contain a p-type material in any of the forms described above. For example, an epitaxial layer comprising $(Al_xGa_{1-x})_2O_3$ can be doped p-type using Li. In other cases, an epitaxial material can be doped p-type using an extrinsic dopant that is co-deposited with the epitaxial oxide layer, or doped using another structure or method. In some embodiments, a not intentionally doped layer is placed between the n-type or p-type material and the not intentionally doped epitaxial oxide chirp layer. The term "not intentionally doped" as used herein refers to a semiconductor layer that does not have a chemical dopant (i.e., impurity atoms) intentionally added, but rather is chemically doped due to defects and/or impurities that are not intentionally introduced during growth. In some cases, a not intentionally doped layer (i.e., with a low doping density due to chemical doping) can have a high carrier concentration (e.g., a high hole concentration) due to polarization doping.

In some embodiments, the epitaxial oxide chirp layer is not intentionally doped. In some embodiments, the epitaxial oxide chirp layer has a high carrier concentration due to polarization doping. In some embodiments, the epitaxial oxide chirp layer is intentionally doped (e.g., heavily doped, moderately doped, lightly doped, n-type doped, or p-type doped).

The epitaxial oxide chirp layer can contain alternating epitaxial oxide layers, such as thin (e.g., less than approximately 5 nm thick) alternating wide bandgap epitaxial oxide layers (barriers) and narrow bandgap epitaxial oxide layers (quantum wells). The epitaxial oxide chirp layer can contain wide and narrow bandgap epitaxial oxide materials where the wide and/or narrow bandgap epitaxial oxide materials can each contain 2, 3, 4, 5, 6 or more than 6 elements, where the composition of each epitaxial oxide material can be tuned to provide an intended bandgap for a layer in the structure. For example, the epitaxial oxide chirp layer can contain alternating layers of $(Al_xGa_{1-x})_2O_3$ where $0≤x≤1$; $(Al_xGa_{1-x})_yO_z$ where $0≤x≤1$, $1≤y≤3$, and $2≤z≤4$ (with a space group that is R3c (i.e., α), Pna21 (i.e., κ), C2m (i.e., β), Fd3m (i.e., γ) and/or Ia3 (i.e., δ)); NiO; $(Mg_xZn_{1-x})_z(Al_yGa_{1-y})_{2(1-z)}O_{3-2z}$ where $0≤x≤1$, $0≤y≤1$ and $0≤z≤1$; $(Mg_xNi_{1-x})_z(Al_yGa_{1-y})_{2(1-z)}O_{3-2z}$ where $0≤x≤1$, $0≤y≤1$ and $0≤z≤1$; $MgAl_2O_4$; $ZnGa_2O_4$; $(Mg_xZn_yNi_{1-y-x})(Al_yGa_{1-y})_2O_4$ where $0≤x≤1$, $0≤y≤1$ (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where $0≤x≤1$ and $0≤z≤1$; $(Al_xGa_{1-x})_2LiO_2$ where $0≤x≤1$; $(Mg_xZn_{1-x-y}Ni_y)_2GeO_4$ where $0≤x≤1$, $0≤y≤1$; and/or other epitaxial oxide materials from FIGS. 28, 76A-1, 76A-2 and 76B, where the compositions of the alternating epitaxial oxide layers are chosen such that one epitaxial oxide layer is a wide bandgap layer and the other epitaxial oxide layer is a narrow bandgap layer. In some embodiments, the thicknesses of the wide and/or narrow bandgap epitaxial oxide layers vary throughout the epitaxial oxide chirp layer. In some embodiments, the thicknesses and/or compositions of the wide and/or narrow bandgap epitaxial oxide layers vary throughout the epitaxial oxide chirp layer. In some embodiments, the epitaxial oxide chirp layer contains alternating layers of material with different bandgaps, where the materials are not necessarily narrow and wide bandgap semiconductors (as described herein). For example, the epitaxial oxide chirp layer can contain alternating epitaxial oxide layers where both layers are wide bandgaps layers (with different bandgaps from each other). In some embodiments, the epitaxial oxide chirp layer is designed to mitigate the concentration (or flux) of hot electrons, for example, by tuning the thicknesses of the barriers and wells within the epitaxial oxide chirp layer to optimize the energy and probability of the allowed intersubband transitions for electrons within the epitaxial oxide chirp layer.

Not to be limited by theory, if the barriers and wells in the epitaxial oxide chirp layer are designed such that the electrons moving through the epitaxial oxide chirp layer have fewer possible high energy intersubband electron transitions, then there will be less opportunity for the electrons to release large amounts of energy during intersubband transitions. In some embodiments, the values of overlap integrals between different electron wavefunctions in a conduction band of the not intentionally doped epitaxial oxide chirp layer are less than 0.05 for intersubband transition energies greater than 1.0 eV, when the device is under operation. In some embodiments, the overlap integrals between different electron wavefunctions are evaluated when the device is biased to approximately a flatband condition, or with a potential similar to an operating potential for the device. The overlap integral between two electron wavefunctions is the probability of an electron transition from one wavefunction to the other, where a high value indicates a high probability of transition and a low value indicates a low probability of transition. Similarly, the overlap of an electron wavefunction with a particular point in space can also be determined, which describes the probability of the electron existing at the point in space. For example, the overlap of a wavefunction with a point in space can be used to determine the probability of an electron with that wavefunction interacting with a feature (e.g., a defect) at that point in space.

In some embodiments, the thickness of the quantum wells and the barriers within one or more regions of the epitaxial oxide chirp layer are chosen such that the values of the overlap integrals between different electron wavefunctions in the conduction band of the not intentionally doped epitaxial oxide chirp layer are less than 0.2, or less than 0.15, or less than 0.1, or less than 0.05 for intersubband transition energies greater than 0.1 eV, or greater than 0.2 eV, or greater than 0.3 eV, or greater than 0.4 eV, or greater than 0.5 eV, or greater than 0.6 eV, or greater than 0.7 eV, or greater than 0.8 eV, or greater than 0.9 eV, or greater than 1.0 eV, or greater than 1.1 eV, or greater than 1.2 eV, or greater than 1.4 eV, or greater than 1.6 eV, or greater than 1.8 eV, or greater than 2.0 eV. In some embodiments, the thickness of the quantum wells and the barriers within one or more regions of the epitaxial oxide chirp layer are chosen such that the values of the overlap integrals between different electron wavefunctions in the conduction band of the not intentionally doped epitaxial oxide chirp layer are less than 0.2, or less than 0.15, or less than 0.1, or less than 0.05 for intersubband transition energies greater than the activation energies of one or more defect species within the device structure. Having small overlap integral values for high energy transitions indicates that the probability of electrons releasing large amounts of energy in these transitions is small, which can be beneficial for semiconductor device performance, as described herein.

Additionally, not to be limited by theory, if the barriers and wells in the epitaxial oxide chirp layer are designed such that defects within the wells preferentially move into the barriers, then the detrimental effects of the defects will be mitigated. In some embodiments, the overlaps between electron wavefunctions and barrier centers (or, the probability that the electron is at the barrier center), in a conduction band of the not intentionally doped chirp layer, are less than 0.4 $nm^{-1}$, or less than 0.3 $nm^{-1}$, or less than 0.2 $nm^{-1}$, or less than 0.1 $nm^{-1}$, or less than 0.05 $nm^{-1}$ in one or more regions of the epitaxial oxide chirp layer. In some embodiments, the thickness of the quantum wells and the barriers within one or more regions of the epitaxial oxide chirp layer are chosen such that the values of the overlap between the electron or hole wavefunctions and the barrier centers in the conduction or valence bands of the not intentionally doped epitaxial oxide chirp layer are less than 0.4 $nm^{-1}$, or less than 0.3 $nm^{-1}$, or less than 0.2 $nm^{-1}$, or less than 0.1 $nm^{-1}$, or less than 0.05 $nm^{-1}$, or less than 0.025 $nm^{-1}$. Having small overlap integral values with barrier centers indicates that the probability of electrons interacting with features (e.g., defects) at the barrier centers is small, which can be beneficial for semiconductor device performance, as described herein.

In some embodiments, the overlap integrals between different electron wavefunctions and/or between a wavefunction and the barrier centers are evaluated in the state when the device is biased to a flatband condition, or with a potential similar to an operating potential for the device (e.g., in forward bias ranges typical for LEDs, and/or within 0.5 V, 1.0 V, or 1.5 V of flatband).

In some embodiments, UV-C LEDs contain superlattices with one or more types of doping (e.g., unintentionally doped SPSLs, polarization doped SPSLs, and/or intentionally doped SPSLs), made up of narrow bandgap quantum wells (e.g., narrow bandgap $(Al_xGa_{1-x})_yO_z$ with thickness less than approximately 5 nm) and wide bandgap barriers (e.g., wide bandgap $(Al_xGa_{1-x})_yO_z$ with thickness less than approximately 5 nm). For example, the present devices can contain an n-type superlattice, followed by a not intentionally doped superlattice, followed by a not intentionally doped epitaxial oxide chirp layer, which is adjacent to a narrow bandgap p-type epitaxial oxide layer. In some embodiments, the narrow bandgap p-type epitaxial oxide layer is needed to supply holes and form an ohmic contact with metal layers.

In some cases, the epitaxial oxide chirp layer described herein is similar to a superlattice in that it is made up of narrow bandgap quantum wells (e.g., narrow bandgap $(Al_xGa_{1-x})_yO_z$) and wide bandgap barriers (e.g., wide bandgap $(Al_xGa_{1-x})_yO_z$). However, the epitaxial oxide chirp layer described herein is different than a superlattice because the thickness of the wells and/or barriers is monotonically increased or decreased through the thickness of the layer in such a way that the local effective bandgap transitions gradually from high to low. In other words, superlattices are defined as having repeating unit cells, where chirp layers are aperiodic (although sub-regions of a chirp layer can be periodic). The chirp layer can have any type of doping (e.g., unintentionally doped SPSLs, polarization doped SPSLs, and/or intentionally doped SPSLs). In some embodiments, the chirp layer is not intentionally doped, with n-type or p-type chemical doping concentrations less than $5\times10^{16}$ $cm^{-3}$, or less than $10^{16}$ $cm^{-3}$, or less than $10^{15}$ $cm^{-3}$, or less than $10^{14}$ $cm^{-3}$, or from less than 1014 $cm^{-3}$ to $5\times10^{16}$ $cm^{-3}$, or from less than $10^{14}$ $cm^{-3}$ to $10^{16}$ $cm^{-3}$. Some examples of free carrier concentrations for n-type or p-type doped layers (e.g., intentionally chemically doped, or not intentionally chemically doped but including polarization doping) are greater than $10^{19}$ $cm^{-3}$, or greater than $10^{18}$ $cm^{-3}$, or greater than $10^{17}$ $cm^{-3}$, or greater than $5\times10^{16}$ $cm^{-3}$, or greater than $10^{16}$ $cm^{-3}$, or greater than $10^{15}$ $cm^{-3}$, or from $10^{16}$ $cm^{-3}$ to $10^{19}$ $cm^{-3}$, or from $10^{15}$ $cm^{-3}$ to $10^{19}$ $cm^{-3}$, or from 1015 $cm^{-3}$ to $10^{20}$ $cm^{-3}$.

In some embodiments, UV-C LEDs contain an n-type superlattice, a p-type superlattice, a not intentionally doped superlattice, and a not intentionally doped epitaxial oxide chirp layer. For example, epitaxial oxide superlattices and chirp layers can be made up of alternating layers of $(Al_xGa_{1-x})_yO_z$ with different compositions. In some embodiments, UV-C LEDs further contain a p-type narrow bandgap epitaxial oxide layer, for example made up of NiO. Other epitaxial oxide materials for the present UV-C LEDs containing the superlattices and chirp layers are also possible, as described herein (e.g., in FIGS. 28, 76A-1, 76A-2 and 76B).

In some embodiments, further improved epitaxial oxide chirp layer structures can improve lifetime performance of semiconductor devices such as UV-LEDs even further. These further improved epitaxial oxide chirp layer structures can be used in any LED (or other semiconductor device) where an intrinsic region (or active region) lies between materials with different bandgaps (e.g., where the intrinsic region is between a layer or plurality of layers containing high bandgap materials and a narrow bandgap layer or plurality of layers containing narrow bandgap materials). Such further improved epitaxial oxide chirp layer structures are designed to prevent high energy from being released by hot electrons, and therefore limit structure modifications under operation that could lead to a poor lifetime performance. In some embodiments, a further improved epitaxial oxide chirp layer design is based on two main features: 1) thick barriers, and 2) adjacent quantum wells with non-resonant electron energy levels, at a device bias point corresponding to its desired operation condition (e.g., at or close to flatband conditions).

Firstly, as discussed above, and not to be limited by theory, thick barriers in such epitaxial oxide chirp layers can improve device performance for multiple possible reasons. Thick barriers can avoid wavefunction spreading, and therefore minimize high energy jumps which can lead to defect excitation. Thick barriers can also work as a defect propagation barrier, given the small electron and hole penetration into thick barriers. However, these barriers cannot be too thick or they will compromise hole transport.

Secondly, adjacent quantum wells within such epitaxial oxide chirp layers with non-resonant electron energy levels allow for energy to be relaxed in small steps, rather than large steps which can more efficiently excite defects. As an example, an optimized epitaxial oxide chirp layer can have constant $(Al_xGa_{1-x})_yO_z$ (or other epitaxial oxide material) barrier thicknesses of 4 ML, or 6 ML, or 8 ML and monotonically increasing $(Al_xGa_{1-x})_yO_z$ (or other epitaxial oxide material) wells. The exact thickness of each well can be guided by the following principle: due to the graded overall composition (e.g., aluminium concentration), the epitaxial oxide chirp layer has a high hole concentration due to polarization doping. In such structures, the hole states in the valence band can lie within an approximately flat energy band (at flatband operation) throughout the whole epitaxial oxide chirp layer. Therefore, to avoid resonant electron energy levels (and limit wavefunction spreading between wells) and allow for energy to be relaxed in small steps rather than large steps, the width of subsequent wells is such that the energy difference between each electron state and the hole ground state is not resonant between each well.

Methods will now be discussed for designing epitaxial oxide chirp layers within any LED (or other semiconductor device) where an intrinsic region (or active region) lies between materials with different bandgaps (e.g., where the intrinsic region is between a layer or plurality of layers containing high bandgap materials and a narrow bandgap layer).

An optimized bandgap transition structure recipe will depend strongly on the epitaxial oxide material it is constituted of and the purpose it serves. For example, in the case of LEDs with emission regions (or active regions) comprising κ-$(Al_xGa_{1-x})_yO_z$ (with a Pna21 space group) and a narrow bandgap epitaxial oxide layer (e.g., κ-$(Al_xGa_{1-x})_yO_z$ with a low Al concentration (e.g., where x is less than 0.5), or another narrow bandgap epitaxial oxide material such as NiO), epitaxial oxide chirped layers can be formed with a graded total aluminium composition, with the dual purpose of bringing holes into the recombination zone (usually intrinsic, or not intentionally doped, referred to as an i-layer herein) and avoiding electron overshoot into the low-bandgap p-region. Devices containing other materials systems that contain an intrinsic region (or active region) between materials with different bandgaps can also benefit from the structures and methods described herein. In those cases, the chirp layers contain unit cells containing a barrier composed of a high bandgap material and a quantum well composed of a low bandgap material, with materials other than $(Al_xGa_{1-x})_yO_z$, for example, NiO; $(Mg_xZn_{1-x})_z(Al_yGa_{1-y})_{2(1-z)}O_{3-2z}$ where $0 \leq x \leq 1$, $0 \leq y \leq 1$ and $0 \leq z \leq 1$; $(Mg_xNi_{1-x})_z(Al_yGa_{1-y})_{2(1-z)}O_{3-2z}$ where $0 \leq x \leq 1$, $0 \leq y \leq 1$ and $0 \leq z \leq 1$; $MgAl_2O_4$; $ZnGa_2O_4$; $(Mg_xZn_yNi_{1-y-x})(Al_yGa_{1-y})_2O_4$ where $0 \leq x \leq 1$, $0 \leq y \leq 1$ (e.g., $(Mg_xZn_{1-x})(Al)_2O_4)$, or $(Mg)(Al_yGa_{1-y})_2O_4)$; $(Al_xGa_{1-x})_2(Si_zGe_{1-z})O_5$ where $0 \leq x \leq 1$ and $0 \leq z \leq 1$; $(Al_xGa_{1-x})_2LiO_2$ where $0 \leq x \leq 1$; and $(Mg_xZn_{1-x-y}Ni_y)_2GeO_4$ where $0 \leq x \leq 1$, $0 \leq y \leq 1$; $Li_{2x}Ge_{1-x}O_{2-x}$ where $0 \leq x \leq 1$; $Li_{2x}Mg_{1-x}O$ where $0 \leq x \leq 1$, and/or other epitaxial oxide materials from FIGS. 28, 76A-1, 76A-2 and 76B. In some cases, the chirp layers contain unit cells containing a barrier composed of a high bandgap piezoelectric (or polarizable) material and a quantum well composed of a low bandgap piezoelectric (or polarizable) material. An example of a polarizable epitaxial oxide material is $\kappa$-$(Al_xGa_{1-x})_yO_z$.

Continuing with the example of devices with $(Al_xGa_{1-x})_2O_3$ with a pna21 space group, which being a piezoelectric material, a graded Al composition in $(Al_xGa_{1-x})_2O_3$ with a pna21 space group generates a built-in polarization field that can move carriers within the device layers. If the graded composition chirp layer is grown metal-polar and it lies between the i-layer (containing higher bandgap materials) and the lower bandgap p-type layer (e.g., $(Al_xGa_{1-x})_2O_3$ with a low Al concentration (e.g., where x is less than 0.5), or another narrow bandgap epitaxial oxide material such as NiO), the resulting polarization field will bring holes into the i-layer even without any voltage applied to the device. Such a phenomenon is related to polarization doping and can be used, for example, in UV-C LED structures. The chirp layer can also include a higher Al content epitaxial oxide layer (compared to the i-layer) (e.g., a $(Al_xGa_{1-x})_2O_3$ layer with high Al concentration) adjacent to the i-layer, such that electrons are somewhat blocked from overshooting into the low bandgap region. This electron blocking layer (EBL) can improve LED efficiency by confining carriers into an active region, which improves optical recombination efficiency. It also can improve device lifetime by avoiding damage from hot electrons.

An optimized epitaxial oxide chirp layer between a region containing high bandgap epitaxial oxide materials and a region containing low bandgap epitaxial oxide materials can be designed using the following procedure:

1) Start with a structure comprising an epitaxial oxide chirp layer between a layer containing a high bandgap epitaxial material and a layer containing low bandgap epitaxial oxide material that:

1i) has an overall gradient in bandgap (e.g., through a composition gradient) to facilitate hole transport according to the conditions described above; and 1ii) starts with a bandgap that presents a barrier for electron overshoot.

2) From this initial structure, perform an iterative process where the thickness and/or composition of each layer within the epitaxial oxide chirp layer is slightly modified. The effect of such a device modification into device performance is a factor of many parameters, including local quantum confinement and local electric fields due to a difference in neighboring crystal structures. Therefore, the outcome can be evaluated using a broad simulation tool that includes polarization effects and quantum transport. After such a simulation is carried out, the small modification is deemed effective if:

2i) hole transport is improved through smooth valence band sequential states. More specifically, the hole wavefunctions in the valence band are as aligned as possible, in a given bias condition corresponding to device operation, to avoid barriers that can block hole transport;

2ii) electrons are effectively blocked by a high energy barrier layer at the start of the chirp layer;

2iii) overshooting electrons are efficiently thermalized, and their transport through the epitaxial oxide chirp layer is only possible by giving away energy in small energy steps.

3) If an improvement is achieved according to one or more of the criteria above, do another modification to the epitaxial oxide chirp layer structure and repeat process 2-2iii above. Such an iterative loop can be done as many times as desired, until a satisfactory structure is achieved.

In some embodiments, thicker barriers in the epitaxial oxide chirp layers can effectively improve UV-C LED lifetime. As discussed above, and not to be limited by theory, in some cases once a defect has moved into the barrier center, it is practically transparent to electrons and holes, and therefore the likelihood of exciting such a defect is strongly reduced. In some embodiments, UV-C LEDs have superlattices with thick barriers and their output power increases with aging. Not to be limited by theory, when activated defects migrate into the epitaxial oxide barrier layers in which there is little electron-hole overlap, those defects are effectively deactivated (or mitigated). Therefore, in some embodiments, thick barriers help to clean defects from the active region. For similar reasons, thick barriers can be used not only in the epitaxial oxide chirp layer, but also in any other region of an epitaxial oxide semiconductor device, such as a UV-C LED. For example, thicker barriers can be used in the region where the radiative recombination occurs (e.g., the i-layer). One disadvantage of using thicker barriers is that wider barriers reduce the electron and hole mobilities. Therefore, in some cases, a practical (or ideal) barrier thickness (in any layer of the device) will be designed considering the trade-off between improved defect performance versus poor carrier mobility.

The concepts described herein can apply to devices where electrons travel between regions of different effective band gap, and therefore become "hot" at some point. This is of particular importance for UV-C LEDs where p-doping often involves a low-bandgap material, however, many other semiconductor devices (as described above) can benefit from the structures, concepts and methods described herein.

In some embodiments, the improved chirp layer structures described herein are applicable to UV-C LED devices using binary epitaxial oxide materials (e.g., those using $Al_2O_3$, $Ga_2O_3$, NiO, etc.), and also to devices that rely on a ternary epitaxial oxide materials (e.g., $(Al_xGa_{1-x})_yO_z$, $MgAl_2O_4$, and $ZnGa_2O_4$), or to epitaxial oxide materials with from 2 to 5 elements (e.g., $(Mg_xZn_{1-x})_z(Al_yGa_{1-y})_{2(1-z)}O_{3-2z}$, where $0 \leq x \leq 1$, $0 \leq y \leq 1$ and $0 \leq z \leq 1$; and $(Mg_xNi_{1-x})_z(Al_yGa_{1-y})_{2(1-z)}O_{3-2z}$, where $0 \leq x \leq 1$, $0 \leq y \leq 1$ and $0 \leq z \leq 1$) for carrier transport. The improved epitaxial oxide chirp layer structures described herein may be beneficial to any quantum well UV-C LEDs, other LEDs, and/or other semiconductor devices utilizing other material systems (e.g., those that lack suitable barriers against defect drift).

Chirp Layers Adjacent to Metal Contacts

The present disclosure describes semiconductor structures with an epitaxial oxide chirp layer adjacent to a metal layer. In some cases, the chirp layers contain an epitaxial oxide multilayer structure (or a plurality of epitaxial oxide layers) where the average composition of the multilayer structure changes throughout the chirp layer. The average composition of the chirp layer can be changed (or graded) by changing the thicknesses of the epitaxial oxide layers within the multilayer structure. Additionally, the compositions of the epitaxial oxide layers within the multilayer structure can also be changed to further change the average composition of the structure throughout the chirp layer.

The epitaxial oxide materials in the chirp layer can be polar and piezoelectric, such that the epitaxial oxide materials can have spontaneous or induced piezoelectric polarization. In some cases, induced piezoelectric polarization is caused by a strain (or strain gradient) within the multilayer structure of the chirp layer. In some cases, spontaneous piezoelectric polarization is caused by a compositional gradient within the multilayer structure of the chirp layer. For example, κ-$(Al_xGa_{1-x})_yO_z$ where 0≤x≤1, 1≤y≤3, and 2≤z≤4 (with a pna21 space group) is a polar and piezoelectric material. Some other epitaxial oxide materials that are polar and piezoelectric are $Li(Al_xGa_{1-x})O_2$ where 0≤x≤1, with a Pna21 or a P421212 space group. Additionally, some epitaxial oxide materials (e.g., those shown in the table in FIG. 28 and in FIGS. 76A-1, 76A-2 and 76B) can be polar and piezoelectric when incorporated into a layer that is in a strained state.

The epitaxial oxide layers in the chirp layers described herein can be i-type (i.e., intrinsic, or not intentionally doped), n-type, or p-type. The epitaxial oxide layers that are n-type or p-type can contain impurities that act as extrinsic dopants. For example, the n-type or p-type layers can contain a polar epitaxial oxide material (e.g., κ-$(Al_xGa_{1-x})_yO_z$ where 0≤x≤1, 1≤y≤3, and 2≤z≤4), and the n-type or p-type conductivity can be formed via polarization doping (e.g., due to a strain or composition gradient within the layer(s)).

The epitaxial oxide materials contained in the semiconductor structures described herein can be any of those shown in the table in FIG. 28, and in FIGS. 76A-1, 76A-2 and 76B, for example, $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c (i.e., α), Pna21 (i.e., κ), C2m (i.e., β), Fd3m (i.e., γ) and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1. In some cases, the multilayer structures of the chirp layer can contain alternating layers of a wider bandgap epitaxial oxide material layer and a narrower bandgap epitaxial oxide material layer that change compositions and/or thicknesses throughout the chirp layer. The difference in bandgaps between the wider bandgap and the narrower bandgap epitaxial oxides can be of any height greater than about 100 meV, such as from 0.1 eV to 2 eV, or from 0.3 eV to 2 eV, or from 0.5 eV to 10 eV. In some cases, the multilayer structures of the chirp layer can contain layers of three or more layers of epitaxial oxide materials that repeat in sequence (e.g., with different compositions and/or thicknesses).

The chirp layers described herein can contain a graded multilayer structure containing repeating pairs of a wider bandgap κ-$(Al_{x1}Ga_{1-x1})_yO_z$ layer and a narrower bandgap κ-$(Al_{x2}Ga_{1-x2})_yO_z$ layer, where 0≤x1≤1, 0≤x2≤1, the difference in bandgap between the layers is from 0.1 eV to 2 eV and/or the difference between x1 and x2 is from 0.1 to 1, and the compositions and/or thicknesses of the layers change throughout the multilayer structure. By changing the thicknesses (or the relative thickness between the layers) through the multilayer structure, the average composition will change throughout the chirp layer.

In another example, a chirp layer described herein can contain a multilayer structure with a first layer of κ-$(Al_{x1}Ga_{1-x1})_yO_z$, where 0≤x1≤1, 1≤y≤3, and 2≤z≤4, where 0≤x≤1, and a second layer, where the material of the second layer is selected from $(Al_xGa_{1-x})_2O_3$ where 0≤x≤1; $(Al_xGa_{1-x})O_z$ where 0≤x≤1, 1≤y≤3, and 2≤z≤4 (with a space group that is R3c (i.e., α), Pna21 (i.e., K), C2m (i.e., β), Fd3m (i.e., γ) and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B, and where the compositions and/or thicknesses of the first and/or second layers change throughout the multilayer structure.

In another example, a chirp layer described herein can contain a multilayer structure with a first layer and a second layer, where the materials of the first and second layers are selected from $(Al_xGa_{1-x})_2O_3$ where 0≤x≤1; $(Al_xGa_{1-x})_yO_z$ where 0≤x≤1, 1≤y≤3, and 2≤z≤4 (with a space group that is R3c (i.e., α), Pna21 (i.e., κ), C2m (i.e., β), Fd3m (i.e., γ) and/or Ia3 (i.e., δ)); NiO; $(Mg_xZn_{1-x})_z(Al_yGa_{1-y})_{2(1-z)}O_{3-2z}$ where 0≤x≤1, 0≤y≤1 and 0≤z≤1; $(Mg_xNi_{1-x})_z(Al_yGa_{1-y})_{2(1-z)}O_{3-2z}$ where 0≤x≤1, 0≤y≤1 and 0≤z≤1; $MgAl_2O_4$; $ZnGa_2O_4$; $(Mg_xZn_yNi_{1-y-x})(Al_yGa_{1-y})_2O_4$ where 0≤x≤1, 0≤y≤1 (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where 0≤x≤1 and 0≤z≤1; $(Al_xGa_{1-x})_2LiO_2$ where 0≤x≤1; and $(Mg_xZn_{1-x-y}Ni_y)_2GeO_4$ where 0≤x≤1, 0≤y≤1; and/or other epitaxial oxide materials from FIGS. 28, 76A-1, 76A-2 and 76B, and where the compositions and/or thicknesses of the first and/or second layers change throughout the multilayer structure.

In some embodiments, the epitaxial oxide materials in the semiconductor structures described herein can each have a cubic, tetrahedral, rhombohedral, hexagonal, and/or monoclinic crystal symmetry. In some embodiments, the epitaxial oxide materials in the semiconductor structures described herein comprise $(Al_xGa_{1-x})_2O_3$ with a space group that is R3c, Pna21, C2m, Fd3m and/or Ia3.

In some cases, the semiconductor structures are grown on substrates selected from $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_yO_z$, where 0≤x≤1, 1≤y≤3, and 2≤z≤4 (any crystal symmetry), $MgF_2$, $LaAlO_3$, $TiO_2$, or quartz.

In some cases, the epitaxial oxide materials of the semiconductor structures described herein and the substrate material upon which the semiconductor structures described herein are grown are selected such that the layers of the semiconductor structure have a predetermined strain, or strain gradient. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate.

In other cases, a buffer layer including a graded layer or region can be used to reset the lattice constant (or crystal plane spacing) of the substrate, and the layers of the semiconductor structure have in-plane lattice constants (or crystal plane spacings) that are within 0.5%, 1%, 1.5%, or 2% of the final (or topmost) lattice constant (or crystal plane spacing) of the buffer layer.

Semiconductor-metal contacts with spontaneous and/or induced piezoelectric polarization are described herein. In some embodiments, steeply varying the material composition of an epitaxial oxide piezoelectric semiconductor, adjacent to a metal contact, generates a strong electric field (e.g., greater than 1000 kV/cm, or greater than 2500 kV/cm, or greater than 5000 kV/cm, or from 100 kV/cm to 10000 kV/cm) through spontaneous piezoelectric polarization. In turn, the strong electric field can substantially alter the transport properties through that interface, for example either lowering or increasing the formed contact resistance. The unexpected consequence is that the contact resistance of an epitaxial oxide semiconductor-metal structure can be tailored by including a "contact layer" with a steeply varying material composition of an epitaxial oxide piezoelectric semiconductor adjacent to the metal contact (i.e., between a semiconductor layer and the metal contact). As described herein, such epitaxial oxide semiconductor structures are applicable in a wide variety of devices and materials systems. For example, ohmic p- or n-contacts with low contact resistance can be created between wide bandgap epitaxial oxide semiconductors and metal layers by utilizing the aforementioned contact layer. Alternatively, the height of a Schottky barrier between an epitaxial oxide semiconductor and a metal can be modified by utilizing the aforementioned contact layer.

The versatile approaches described herein, using different types of epitaxial oxide contact layers with steeply varying material compositions of piezoelectric semiconductors adjacent to metal contacts, are applicable in many applications, including but not limited to optoelectronic devices with wavelengths ranging from infra-red to deep-ultraviolet (e.g., light emitting diodes (LEDs), laser diodes, photodetectors, and solar cells), high-power diodes, transistors, high-power transistors, transducers, and high-mobility transistors.

The steeply varying material compositions of epitaxial oxide piezoelectric semiconductors within the contact layers can be realized in a number of ways, including using smooth compositional grading (i.e., a smoothly varying compositional gradient), using structures with one or more abrupt changes in composition (e.g., stepped layers), or using chirp layers, which are structures similar to short-period superlattices (SPSLs) but with changing sublayer thicknesses. Chirp layers may contain thin alternating wide bandgap epitaxial oxide sublayers (barriers) and narrow bandgap epitaxial oxide sublayers (wells). For example, the epitaxial oxide sublayers can be less than approximately 5 nm thick, or less than 20 monolayers (MLs), or less than 10 MLs, or less than 2 MLs, or from 0.1 to 20 MLs. In some embodiments, the compositional gradients in the regions adjacent to the contact layers described herein are steep enough to induce piezoelectric polarization within the region, wherein "steep" is defined by the following description. For example, if the region contains $\kappa$-$(Al_xGa_{1-x})_yO_z$ materials with changing composition (e.g., in a smooth gradient of $\kappa$-$(Al_xGa_{1-x})_yO_z$, where x is smoothly varied, or in a chirp layer with alternating layers of a wider bandgap $\kappa$-$(Al_{x1}Ga_{1-x1})_yO_z$ and a narrower bandgap $\kappa$-$(Al_{x2}Ga_{1-x2})_yO_z$ where the average composition changes over the chirp layer), then the composition can vary (e.g., from x equals about 0.8 (or 80%) to x equals about 0.2 (or 20%)) over about 5 nm, or 8 nm, or 10 nm, or 15 nm, or 20 nm. For example, the compositional gradient can have a value of about 40%, 60% or 80% over 5 nm, or 8 nm, or 10 nm, or 15 nm, or 20 nm, or the composition can change by about 5%, or about 7.5%, or about 10%, or about 20% per nanometer. More generally, for epitaxial oxide chirp layers, for example containing $\kappa$-$(Al_xGa_{1-x})_yO_z$ materials, the composition can change from 1% to 50% per nanometer, or from 1% to 30% per nanometer, or from 5% to 20% per nanometer. For any epitaxial oxide materials system capable of induced piezoelectric polarization (e.g., $\kappa$-$(Al_xGa_{1-x})_yO_z$ or $Li(Al_xGa_{1-x})O_2$ with a Pna21 or a P421212 space group) the composition can change from about 1% to 100% per nanometer, or from 1% to 50% per nanometer, or from 5% to 50% per nanometer, or from 5% to 30% per nanometer, or by any amount that induces an increased charge density (compared to the charge density without a compositional gradient) through the mechanism of piezoelectric polarization. In some cases, the compositional gradient is made as steep as possible to induce as large a charge as possible, without hindering charge transport. For example, if the composition is changed too quickly, then large energy barriers (e.g., greater than 25 meV) can be formed due to a large conduction band or valence band offset, which can hinder charge transport across the region.

In some embodiments, the steeply varying material compositions of piezoelectric epitaxial oxide semiconductors within the contact layers occurs over a distance from greater than 0 nm to less than 20 nm, from greater than 0 nm to less than 10 nm, from greater than 0 nm to less than 5 nm, from greater than 0.1 nm to less than 20 nm, from greater than 0.1 nm to less than 10 nm, from greater than 0.1 nm to less than 5 nm, or from 1 nm to 10 nm. In some embodiments, the contact layer forms an ohmic contact between an epitaxial oxide semiconductor and a metal. In some embodiments, the epitaxial oxide semiconductor is a wide bandgap epitaxial oxide semiconductor with bandgaps greater than 3.0 eV, or greater than 4.0 eV, or greater than 5.0 eV, or greater than 6.0 eV, or from 1.5 eV to 7.0 eV, or from 3 eV to 9 eV, or from 3 eV to 14 eV, or from 4 eV to 7 eV.

In some embodiments, the contact layers are "ohmic-chirp" layers comprising epitaxial oxide materials, and are used to create ohmic (or, low resistance) contacts to metal layers in epitaxial oxide semiconductor structures and devices (e.g., in structures and devices containing wide bandgap epitaxial oxide semiconductors). The term "chirp layer," "ohmic-chirp," or "ohmic-chirp layer" as used herein, refers to a layer with a steeply varying average material composition of piezoelectric semiconductors produced by changing the sublayer thicknesses within a multilayer structure (similar to an SPSL, but not composed entirely of periodic unit cells). The changing the sublayer thicknesses for the wells and/or the barriers within a chirp layer can be monotonic or non-monotonic, and can follow any relationship (e.g., linear, parabolic, or other shape). In some embodiments, the chirp layers contain piezoelectric epitaxial oxide materials that have spontaneous and intrinsic polarizations, which are dependent on a material composition gradient of the epitaxial oxide. In some embodiments, the chirp layers contain a gradient in a piezoelectric epitaxial oxide material composition adjacent to the metal contact layer (e.g., by changing the thicknesses of the alternating sublayers within the chirp layer). Some examples of piezoelectric epitaxial oxide materials that can be used to form ohmic-chirp layers are κ-$(Al_xGa_{1-x})_yO_z$, where 0≤x≤1, 1≤y≤3, and 2≤z≤4; and $Li(Al_xGa_{1-x})O_2$ where 0≤x≤1, with a Pna21 or a P421212 space group, or other epitaxial oxide materials in a strained state.

In some embodiments, the contact layer (e.g., a contact layer with a compositional gradient, or a chirp layer) enables an ohmic (or, low resistance) n-contact or a p-contact to an epitaxial oxide semiconductor layer (or structure), and contains a high concentration of electrons or holes, respectively. The terms "n-contact" and "p-contact" as used herein refer to an electrical contact (or connection) between a metal and an n-type or a p-type semiconductor, respectively. In some embodiments, the contact layer is situated between a metal and an n-type or a p-type epitaxial oxide semiconductor and enables an ohmic (or, low resistance) n-contact or a p-contact between the epitaxial oxide semiconductor and the metal. In some embodiments, the contact layer forms an ohmic (or, low resistance) n-contact or a p-contact by changing the barrier height and/or barrier width between the epitaxial oxide semiconductor and the metal. For example, the contact layer can reduce an effective width of a barrier across the contact (i.e., experienced by a carrier traversing the contact) by creating a strong electric field (e.g., greater than 1000 kV/cm, or greater than 2500 kV/cm, or greater than 5000 kV/cm, or from 100 kV/cm to 10000 kV/cm) in the contact layer adjacent to the metal, which increases the transport of carriers from the metal to the epitaxial oxide semiconductor (or vice-versa) across the barrier. In some cases, the barrier width across a contact containing a contact layer (as described herein) is less than 5 nm, or less than 3 nm, or less than 1 nm. In some cases, the barrier height between a contact layer (as described herein) and a metal is less than 0.3 eV, or less than 0.6 eV, or less than 1.3 eV, or less than 2 eV.

The contact layers (e.g., contact layers with compositional gradients, or chirp layers) described herein have some relation to structures that utilize polarization doping, in the sense that contact layers also benefit from the large resultant electric fields that result from grading the average composition of a region within the contact layer. Polarization doping (e.g., p-type) has been previously described for some materials (e.g., in Simon et al., Science Vol. 327, Issue 5961, pp. 60-64, 2010. DOI: 10.1126/science.1183226). Polarization doping has also been described within UVC LEDs, such as in U.S. Pat. No. 9,871,165, owned by the assignee of the present disclosure. The contact layers described herein introduce important new modifications that enable the contact resistance of an epitaxial oxide semiconductor-metal structure to be tailored, such as the inclusion of a layer with a steeply varying material composition of a piezoelectric epitaxial oxide semiconductor adjacent to the metal contact.

In other embodiments, steeply varying the strain (i.e., creating a strain gradient) of a piezoelectric epitaxial oxide semiconductor, adjacent to a metal contact, generates a strong electric field (e.g., greater than 1000 kV/cm, or greater than 2500 kV/cm, or greater than 5000 kV/cm, or from 100 kV/cm to 10000 kV/cm) through induced piezoelectric polarization. Therefore, in some embodiments, the contact resistance of an epitaxial oxide semiconductor-metal structure can be tailored by including a contact layer with a piezoelectric epitaxial oxide semiconductor containing a strain gradient adjacent to the metal contact. In some embodiments, the contact layer with a strain gradient enables an ohmic (or, low resistance) n-contact or p-contact between the contact layer (containing the epitaxial oxide semiconductor) and the metal.

In some embodiments, both a strain gradient and a compositional gradient in a piezoelectric epitaxial oxide semiconductor, adjacent to a metal contact, generate a strong electric field (e.g., greater than 1000 kV/cm, or greater than 2500 kV/cm, or greater than 5000 kV/cm, or from 100 kV/cm to 10000 kV/cm) through both spontaneous and induced piezoelectric polarization. Therefore, in some embodiments, the contact resistance of an epitaxial oxide semiconductor-metal structure can be tailored (e.g., decreased) by including a contact layer with a piezoelectric epitaxial oxide semiconductor containing both a strain gradient and a compositional gradient adjacent to the metal contact. Depending on the magnitudes and directions of the compositional gradient and the strain gradient within the piezoelectric material in the contact layer, the effect of the compositional gradient can be either larger than, smaller than, or similar to, the effect of the strain gradient.

FIG. 141A is a schematic of an example of a semiconductor structure 11100 containing an epitaxial oxide semiconductor-metal junction, whose epitaxial oxide semiconductor material 11110 is piezoelectric and abruptly graded in composition or graded in strain within contact layer 11120 adjacent to an interface with a metal contact 11130, in accordance with some embodiments. For example, the contact layer can comprise κ-$(Al_xGa_{1-x})_yO_z$, where 0≤x≤1, 1≤y≤3, and 2≤z≤4, whose average aluminium composition x is steeply reduced over a few nanometres adjacent to the metal contact. The gradient in local strain and/or difference in composition creates a strong polarization field that modifies the local carrier concentration and transport properties through the interface.

Some examples of materials that can be used in the piezoelectric semiconductor 11110 (including the strained or graded contact layer 11120) in FIG. 141A are κ-$(Al_xGa_{1-x})_yO_z$ where 0≤x≤1, 1≤y≤3, and 2≤z≤4; and $Li(Al_xGa_{1-x})O_2$ where 0≤x≤1, with a Pna21 or a P421212 space group; or other epitaxial oxide materials in a strained state. Some examples of high work function metals that can be used in the metal contact 11130 in FIG. 141A for contacts to p-type epitaxial oxide semiconductors are Ni, Os, Se, Pt, Pd, Ir, W, Au and alloys thereof. Some examples of low work function materials that can be used in the metal contact 11130 in FIG. 141A for contacts to n-type epitaxial oxide semiconductors are Ba, Na, Cs, Nd and alloys thereof. However, in some cases, Al, Ti, Ti—Al alloys, and titanium nitride (TiN) being common metals can also be used as contacts to an n-type epitaxial oxide layer (e.g., 6220*a*). In some cases, the metal contact 11130 can contain 2 or more layers of metals with different compositions (e.g., a Ti layer and an Al layer). In some embodiments, the metal contact 11130 is incorporated in an optoelectronic device and is reflective at desired optical wavelengths (e.g., from about 150 nm to about 280 nm). In such cases, the contact layer 11120 can be designed to form a low resistance contact and also be transparent (or mostly transparent) at the desired optical wavelengths.

FIG. 141B is a schematic of an example of a semiconductor structure 11150 containing an epitaxial oxide semiconductor-metal junction containing a metal contact 11130, a constant composition epitaxial oxide material 11160, and a contact layer 11170. Contact layer 11170 in this example contains a chirp layer comprising epitaxial oxide materials, and forms a contact layer adjacent to the metal contact 11130. For example, the contact layer 11170 can comprise alternating thin (e.g., less than 20 monolayers (MLs), or less than 10 MLs, or less than 2 MLs, or from 0.1 to 20 MLs) layers of wider bandgap and narrower bandgap $\kappa$-($Al_xGa_{1-x}$)$O_z$ where $0 \leq x \leq 1$, $1 \leq y \leq 3$, and $2 \leq z \leq 4$ (e.g., where the difference in x between the narrower and wider bandgap layers is from 0.1 to 1), whose average aluminium composition x is steeply reduced over a few nanometres adjacent to the metal contact by changing a thickness (and/or a composition) of the wider bandgap and/or narrower bandgap $\kappa$-$(Al_xGa_{1-x})_yO_z$ layers through contact layer 11170. The metal-polar growth direction 11180 (i.e., the orientation of the metal polar faces in layers 11160 and 11170) is also shown.

In some examples, the composition gradient (e.g., shown in contact layer 11120 in FIG. 141A) can include abrupt steps in composition within a few nanometres of the metal contact (e.g., metal contact 11130 in FIG. 141A).

In some examples, the graded region in the contact layer (e.g., contact layer 11120 in FIG. 141A, or contact layer 11170 in FIG. 141B) can also be a $\kappa$-$(Al_{x1}Ga_{1-x1})_yO_z$/$\kappa$-$(Al_{x2}Ga_{1-x2})_yO_z$ chirp layer containing alternating thin (e.g., less than 20 monolayers (MLs), or less than 10 MHLs, or less than 2 MHLs, or from 0.1 to 20 MLs) sublayers of $(Al_{x1}Ga_{1-x1})_yO_z$ and $(Al_{x2}Ga_{1-x2})_yO_z$. In some embodiments (e.g., if x1 is 1, x2 is 0, y is 2, and z is 3), the sublayers can be alternating layers of $\kappa$-$Al_2O_3$ and $\kappa$-$Ga_2O_3$. The $\kappa$-$(Al_{x1}Ga_{1-x1})_yO_z$/$\kappa$-$(Al_{x2}Ga_{1-x2})_yO_z$ chirp layer can begin or end with $\kappa$-$(Al_{x1}Ga_{1-x1})_yO_z$ or $\kappa$-$(Al_{x2}Ga_{1-x2})_yO_z$.

A $\kappa$-$(Al_{x1}Ga_{1-x1})_yO_z$/$\kappa$-$(Al_{x2}Ga_{1-x2})_yO_z$ chirp layer can contain alternating sublayers of a wider bandgap $\kappa$-$(Al_{x1}Ga_{1-x1})_yO_z$ layer and a narrower bandgap $\kappa$-$(Al_{x2}Ga_{1-x2})_yO_z$ layer, where $0 \leq x1 \leq 1$ and $0 \leq x2 \leq 1$, and x1 and x2 are different values, where the difference in bandgap between the layers is from 0.1 eV to 3.5 eV, and/or the difference in Al content between the layers is from 0.1 to 1. The $\kappa$-$(Al_{x1}Ga_{1-x1})_yO_z$ and $\kappa$-$(Al_{x2}Ga_{1-x2})_yO_z$ sublayers can contain less than 1 ML of $\kappa$-$(Al_{x1}Ga_{1-x1})_yO_z$ and $\kappa$-$(Al_{x2}Ga_{1-x2})_yO_z$ respectively, and therefore, in some regions (or nanoregions) of the layer mixed compounds $\kappa$-$(Al_{x1}Ga_{1-x1})_yO_z$ and $\kappa$-$(Al_{x2}Ga_{1-x2})_yO_z$ can still exist. Similarly, in some cases, a $\kappa$-$(Al_{x1}Ga_{1-x1})_yO_z$/$\kappa$-$(Al_{x2}Ga_{1-x2})_yO_z$ chirp layer contains alternating sublayers of $\kappa$-$(Al_{x1}Ga_{1-x1})_yO_z$ and $\kappa$-$(Al_{x2}Ga_{1-x2})_yO_z$, and the $\kappa$-$(Al_{x1}Ga_{1-x1})_yO_z$ and/or $\kappa$-$(Al_{x2}Ga_{1-x2})_yO_z$ sublayer thicknesses contain non-integer numbers of MLs. In such cases, in some regions (or nanoregions) of the layer, mixed compounds of $\kappa$-$(Al_{x1}Ga_{1-x1})_yO_z$ and $\kappa$-$(Al_{x2}Ga_{1-x2})_yO_z$ can still exist within the contact layer. In some embodiments, $\kappa$-$(Al_{x1}Ga_{1-x1})_yO_z$/$\kappa$-$(Al_{x2}Ga_{1-x2})_yO_z$ chirp layers contain regions of non-integer sublayer thicknesses, and regions containing sublayers with integer thicknesses. In some embodiments, $\kappa$-$(Al_{x1}Ga_{1-x1})_yO_z$/$\kappa$-$(Al_{x2}Ga_{1-x2})_yO_z$ chirp layers of different integer sublayer thicknesses $\kappa$-$(Al_{x1}Ga_{1-x1})_yO_z$ and/or $\kappa$-$(Al_{x2}Ga_{1-x2})_yO_z$ can coexist laterally next to each other so that the average composition is non-integer on a larger scale. In some embodiments, $\kappa$-$(Al_{x1}Ga_{1-x1})_yO_z$/$\kappa$-$(Al_{x2}Ga_{1-x2})_yO_z$ chirp layers contain regions where sublayers with different mixed $\kappa$-$(Al_{x1}Ga_{1-x1})_yO_z$ and $\kappa$-$(Al_{x2}Ga_{1-x2})_yO_z$ compositions exist next to each other.

In some embodiments, $\kappa$-$(Al_{x1}Ga_{1-x1})_yO_z$/$\kappa$-$(Al_{x2}Ga_{1-x2})_yO_z$ chirp layers can be used as a contact layer in semiconductor-metal junctions, and contain a gradient in the $\kappa$-$(Al_{x1}Ga_{1-x1})_yO_z$ and/or $\kappa$-$(Al_{x2}Ga_{1-x2})_yO_z$ sublayer thicknesses and/or compositions (i.e., the values of x and/or y can change throughout the chirp layer). For example, the $\kappa$-$(Al_{x1}Ga_{1-x1})_yO_z$ sublayers can be thicker at the beginning of the chirp layer (farther from the metal contact) and thinner at the end of the chirp layer (nearer to the metal contact). In another example, the $\kappa$-$(Al_{x1}Ga_{1-x1})_yO_z$ sublayers can be thinner at the beginning of the chirp layer (farther from the metal contact) and thicker at the end of the chirp layer (nearer to the metal contact). In other examples, the $\kappa$-$(Al_{x2}Ga_{1-x2})_yO_z$ sublayers can be thicker at the beginning of the chirp layer (farther from the metal contact) and thinner at the end of the chirp layer (nearer to the metal contact), or the $\kappa$-$(Al_{x2}Ga_{1-x2})_yO_z$ sublayers can be thinner at the beginning of the chirp layer (farther from the metal contact) and thicker at the end of the chirp layer (nearer to the metal contact).

In some embodiments, the structure 11150 in FIG. 141B is used to facilitate hole transport at the interface between the contact layer 11170 and the metal contact 11130, in which case the direction 11180 of the metal polar face of the epitaxial oxide material in layers 11160 and 11170 is towards the metal contact, as shown in FIG. 141B.

In the example structure 11150 shown in FIG. 141B, a high-bandgap epitaxial oxide region 11160, possibly p-doped, serves as a hole transport material. It is followed by a steeply graded contact region 11170 over a few nanometers scale. In some cases, the graded contact region 11170 (or a portion thereof) is also p-doped. The structure is then terminated with a metal contact 11130, for example, aluminium. In other examples, the high-bandgap region 11160 can be n-doped, and the steeply graded contact region 11170 can facilitate electron transport at the interface with metal contact 11130 (i.e., making a low resistance n-contact). As will be described more completely below, in the case of n-contacts, the polar faces of the piezoelectric materials and/or the direction of the compositional gradient will be reversed. Similarly, the resistance of epitaxial oxide semiconductor-metal interfaces can be increased (rather than reduced), by reversing the polar faces of the piezoelectric materials and/or the direction of the compositional gradient.

In some embodiments, the structure in FIG. 141B is part of a deep-UV LED or laser, in which case the bandgap of the homogeneous epitaxial oxide region 11160 is preferably high enough as to be transparent to the LED or laser emission wavelength.

The structures shown in FIGS. 141A and 141B are advantageous because they improve carrier transport across the epitaxial oxide semiconductor-metal structure (or contact layer, or interface between the epitaxial oxide semiconductor and the metal) compared to conventional structures, and can provide high carrier densities to the device in which they are incorporated at relatively low operating voltages.

Counterintuitively, the high Schottky resistance vanishes (or is significantly reduced) in operation of the graded structures similar to those shown in FIGS. 141A and 141B. Not to be limited by theory, there are some attributes of the graded epitaxial oxide contact layer that could contribute to the reduction in the Schottky resistance. The very steep grading in the composition of the epitaxial oxide material (or chirp layer) generates a large polarization field (e.g., greater than 1000 kV/cm, or greater than 2500 kV/cm, or greater than 5000 kV/cm, or from 100 kV/cm to 10000 kV/cm), which strongly bends the valence band of the epitaxial oxide layer and attracts a high hole density. This high hole density close to the metal interface minimises the width of the Schottky barrier, which facilitates hole injection via tunnelling from the metal. Surprisingly, if a thick (e.g., greater than 5 nm) epitaxial oxide layer with a bandgap equal to that of the lower bandgap material (e.g., the well layer) of the chirp layer were inserted between the steeply graded epitaxial oxide contact layer and the metal layer in the structures shown in FIGS. 141A and 141B, then the contact resistance would counterintuitively increase due to a weaker electric field in the contact layer adjacent to the contact (even though the average bandgap would be lower adjacent to the metal). The electric field in the contact layer adjacent to the metal would be decreased because the thick epitaxial oxide layer would move the strong field created by the graded region of the contact layer farther away from the interface.

In some cases, a modified surface composition and hole density (caused by a graded contact layer) could also affect the height of the Schottky barrier. As an overall result, in some embodiments of structures containing a compositional gradient (e.g., as depicted in FIGS. 141A and 141B), little or no barrier is present for hole transport, despite the progressively increasing bandgap as holes move away from the metal. Therefore, an ohmic contact forms, which, together with the high hole density, provides a contact with very low resistance. In some cases, a voltage, across the epitaxial oxide semiconductor-metal contacts described herein, needed to provide the operating current densities (e.g., approximately 400 $mA/mm^2$) is as low as a few microvolts, which would dissipate a negligible power (e.g., less than 1 microwatts under operation). In some cases, the voltage drop in a graded epitaxial oxide structure described herein (e.g., with respect to FIGS. 141A and 141B) is even smaller that the voltage drop in a pure epitaxial oxide material comprising low bandgaps (e.g., equal to the lower bandgap material (or well material) in the chirp layer of the contact layer) due to the larger electric fields that effectively reduce the tunnelling barrier width for holes from the metal into the semiconductor, which in turn improves hole transport. Also, in some cases, the larger electric fields provided by the epitaxial oxide structures described herein lead to increased hole concentrations at the graded contact layer/metal interface, compared to those created at the interface of a thick (e.g., greater than 5 nm) epitaxial oxide layer/metal interface, which is also beneficial for hole transport. Such structures are particularly advantageous in deep-UV LEDs and lasers since the graded contact region can have a lower contact resistance compared to conventional UV-transparent contact structures.

In some cases, low bandgap epitaxial oxide sublayers in the graded region can absorb some of the light that is emitted from a UVC LED or laser in which the structure is incorporated. However, those absorbing layers can be made very thin (e.g., less than 3 nm, less than 2 nm, less than 1 nm, less than 10 ML, less than 5 ML, less than 2 ML, or less than 1 ML), and therefore have relatively low total absorption. Moreover, in some embodiments, some of the absorptive epitaxial oxide layers in a contact layer are placed adjacent to a reflective metal surface, which reduces the total electric field that exists in those layers due to destructive interference. In some embodiments, the total absorption of light (emitted by the LED or laser) in the graded contact layer is about 3%, or less than 10%, or less than 5%, or less than 3%, or less than 1%, or from 1% to 5%, or from 0.1% to 10%.

In some embodiments, a steep grading close to the metal interface (e.g., in the chirp layers described herein) reduces the contact resistance for an ohmic contact in UV LEDs or lasers based on epitaxial oxide materials. Not to be limited by theory, the steep gradient can reduce the depletion width in the device layer adjacent to the metal contact due to the resulting spontaneous polarization field. Therefore, simply capping a p-doped epitaxial oxide region with a thick p-doped epitaxial oxide region (e.g., greater than 5 nm, or from 5 nm to 200 nm, or from 30 nm to 50 nm), has a much weaker benefit to the contact resistance compared to the much stronger effect provided by the chirp layers comprising epitaxial oxide materials described herein.

An example of an LED with a chirp layer adjacent to a metal contact layer is shown in FIG. 142. FIG. 142 shows a simplified schematic side view of an LED structure 11500 including a mesa structure, and an expanded view of the sublayer thicknesses of an ohmic-chirp layer (or chirp layer) 11520. The inset 11502 shows that the chirp layer 11520 contains different thicknesses of wider bandgap epitaxial oxide layers 11524, and narrower bandgap epitaxial oxide layers 11522, which form a graded average composition through ohmic-chirp layer 11520. The inset shows a few epitaxial oxide layers 11522 and 11524, however, the chirp layers described herein can have from 10 to 100 layers, or more than 100 layers, of epitaxial oxide layers (like 11522 and 11524). The structure 11500 includes a compatible substrate 11560, an optional buffer layer 11550, an n-doped epitaxial oxide layer 11540, an intrinsic (or not intentionally doped) epitaxial oxide layer 11530, the chirp layer 11520, and metal contacts 11512 and 11514. The optional buffer layer 11550, n-doped epitaxial oxide layer 11540, and/or intrinsic (or not intentionally doped) epitaxial oxide layer 11530 can comprise superlattices of epitaxial oxide materials, in some cases.

In some cases, the structure 11500 forms a p-i-n structure, for example, where the chirp layer 11520 acts as the p-type layer, or an additional p-type epitaxial oxide layer (not shown) is formed between the intrinsic (or not intentionally doped) epitaxial oxide layer 11530 and the chirp layer 11520. In some cases, the chirp layer 11520 or a portion of the chirp layer 11520 is doped with an extrinsic acceptor (e.g., Li, Ga, Zn, Ni or N). In other embodiments, the entirety of a chirp layer is not intentionally doped but has a high carrier concentration due to polarization doping. The n-type layer can have doping densities from about $10^{17}$ $cm^{-3}$ to about $10^{20}$ $cm^{-3}$, and the intrinsic region (or layer) can have doping densities below about $10^{16}$ $cm^{-3}$, or from about $10^{14}$ $cm^{-3}$ to about $10^{16}$ $cm^{-3}$. One metal contact 11514 forms an electrical contact with the n-type epitaxial oxide layer 11540, and the other metal contact 11512 forms an electrical contact with the ohmic-chirp layer 11520 on the top of the mesa, where the metals can be low and high work function metals (as described herein).

In an example, the chirp layer 11520 comprises two different compositions of $\kappa$-$(Al_xGa_{1-x})O_z$ where $0 \le x \le 1$, $1 \le y \le 3$, and $2 \le z \le 4$. For example, the chirp layer 11520 can comprise alternating layers of $\kappa$-$Al_yO_z$ where $1 \le y \le 3$, and $2 \le z \le 4$, and $\kappa$-$Ga_yO_z$ where $1 \le y \le 3$, and $2 \le z \le 4$. The average aluminium content per period is [Al]/([Al]+[Ga]), where [Al] and [Ga] are the total atomic fractions of Al and Ga respectively in a period (e.g., in 2 adjacent sublayers in the structure where one sublayer is a $\kappa$-$Al_yO_z$ layer and the other sublayer is a $\kappa$-$Ga_yO_z$ layer). In another example, the chirp layer 11520 can comprise alternating layers of $\kappa$-$(Al_xGa_{1-x})_yO_z$ where $0 \le x \le 0.5$, $1 \le y \le 3$, and $2 \le z \le 4$, and $\kappa$-$(Al_xGa_{1-x})_yO_z$ where $0.5 \le x \le 1$, $1 \le y \le 3$, and $2 \le z \le 4$. In another example, the chirp layer 11520 can comprise alternating layers of either a $\kappa$-$Al_yO_z$ layer or a $\kappa$-$Ga_yO_z$ layer where $1 \le y \le 3$, and $2 \le z \le 4$, and a $\kappa$-$(Al_xGa_{1-x})_yO_z$ layer where $0 \le x \le 1$, $1 \le y \le 3$, and $2 \le z \le 4$, and where the difference in Al content (x) is greater than 0.2, or greater than 0.3, or greater than 0.5. In some cases, the last few sublayers of the chirp layer may have effective bandgaps that are narrow enough to absorb some light emitted from the intrinsic (or not intentionally doped) epitaxial oxide layer 11530. In this example, the total aluminium content in the chirp layer 11520 has a steep grading close to the metal contact.

FIGS. 143A and 143B show examples of light extraction optimization via selection of metal contact materials and emitter positioning in LEDs or lasers. FIG. 143A shows an example schematic representation of emitted and reflected waves, where the emitter is placed 9λ/8n (where λ is the radiation wavelength outside the emission material, an epitaxial oxide material (e.g., shown in FIGS. 28, 76A-1, 76A-2 and 76B) in this case, and n is the refractive index of the emission material) away from the metal interface, which generates constructive interference of light in the left direction (i.e., the direction of the light extraction), as shown by FIG. 143A.

Using a transparent p-type material in LEDs or lasers increases the need to control the light that is emitted in the direction of the p-type material. In some embodiments of the LED or laser structures and devices described herein, the light is emitted through the substrate (e.g., sapphire) side, and therefore it is beneficial to reflect the light emitted in the opposite direction (i.e., in the direction of the p-material) as efficiently as possible. In some embodiments, the metal contact is itself reflective, and choosing an optimally reflective metal is advantageous. Given two interfaces within a structure, the amplitude and phase of a reflected wave can be approximated by using the complex refractive indices of the materials within the structure. Using aluminium as a contact to a p-type epitaxial oxide material has the clear advantage that it reflects most of the incident light at relevant wavelengths. For example, at 265 nm Al reflects approximately 89% of the incident light. While this presents a clear advantage in efficiently extracting the emitted light though the substrate (e.g., $Al_2O_3$, MgO, and $MgAl_2O_4$) side, it is advantageous for the emitted and reflected light to interfere constructively in that direction as well. Indeed, since in some embodiments the emission linewidths are below 20 nm (i.e., less than 10% of the emission wavelength), good phase coherence can be assumed with distances on the order of 10×λ≈1 micron (where λ is the wavelength of light within the epitaxial oxide material), which is much larger than the distances between the emitter and contact in conventional structures (e.g., around 50 nm). The interference between emitted and reflected waves is depicted in FIG. 143A for a −90° reflected phase difference. Therefore, in this case, destructive interference happens if the emitter is 3λ/8n, or 7λ/8n (or 3λ/8n+mλ/2n, where m is an integer and n the cavity's refractive index), away from the metal, and therefore structures with emitters placed at those distances should be avoided. On the other hand, constructive interference happens if the emitter is λ/8n, or 5λ/8n=(or λ/8n+mλ/2n, where m is an integer and n the cavity's refractive index), away from the metal, and therefore structures with emitters placed at those distances are beneficial.

In some cases, the LED or laser substrate material has a large refractive index contrast with the refractive indices of the epitaxial oxide active layers. As a consequence, multiple reflections between the p-metal contact mirror and the epitaxial oxide/substrate interface can impact the optical modes allowed inside the LED or laser structure, which will impact the total light extracted from the LED or laser.

FIG. 143B schematically shows an LED structure on a substrate. In this example, the emitter is placed at a distance λ/8n from the metal contact. The light emitted to the right in the figure (i.e., towards the metal contact) is firstly reflected by the metal contact, and is in phase with the light emitted to the left in the figure (i.e., towards the substrate) at the emitter location. This is equivalent to saying that the emitter sits at the optical mode antinode or, as said before, at a constructive interference location. The left-traveling waves henceforth are partially reflected at the interface with the substrate. For the example in FIG. 143B, that interface is 3λ/2n away from the emitter. At such a distance, the right-traveling reflected waves interfere constructively with the emitted waves at the emitter location. This corresponds to an allowed etalon-like cavity mode. It is therefore advantageous to place the emitter at the antinode of such a mode, and tailor the distance between substrate interface and metal mirror in such a way that the cavity mode wavelength matches the emission wavelength. For the substrate/epitaxial oxide layers/metal structure described in this example, this would correspond to the metal mirror being located at a distance of λ/8n+mλ/2n, where m is an integer, away from the emitter, and the substrate/epitaxial oxide layers interface being located at a distance lλ/2n, where l is an integer, away from the emitter. In this case, the emitter can benefit from a much higher optical density of states at a mode inside the light escape cone, and therefore an improvement in light extraction efficiency can be achieved. At the resonance wavelength, the ratio of the optical mode densities with ($\rho_{max}$) and without ($\rho_{1D}$) a cavity is: $\rho_{max}/\rho_{1D}=2(R_1R_2)^{3/4}/[1-(R_1R_2)]$. At the resonance wavelength, the directional emission enhancement out the exit mirror (i.e., the substrate in this example), $G_e$, is simply given by the ratio of the optical mode densities multiplied by the fraction of the light exiting that mirror (i.e., $1-R_1$) divided by the average loss of the two mirrors for one round trip in the cavity (i.e., $[(1-R_1)+(1-R_2)]/2$), and $G_e=(\rho_{max}/\rho_{1D})*(1-R_1)/([(1-R_1)+(1-R_2)]/2)$.

The total directional emission enhancement $G_{int}$ is proportional to the cavity linewidth Δλ, which is inversely proportional to the cavity length $L_{cav}$. Therefore, in order to get the most benefit from the cavity over the widest emitted wavelength band, it is beneficial to bring the mirror as close as possible to the emitter. In some embodiments, therefore, it is beneficial to form a distributed Bragg reflector (DBR) as part of the n-doped layers in the diode structure (e.g., the structure shown in FIGS. 144A and 144B). This not only improves light extraction, but also can reduce fabrication costs by avoiding the growth of extra epitaxial layers.

In some cases, a DBR with sufficient reflectivity can be made from epitaxial oxide materials arranged in short-period superlattices (SPSLs) as constituents of each DBR layer. As discussed below, using a plurality of SPSLs to form a DBR can enable electron transport inside the DBR, while still allowing for sufficient refractive index contrast between layers. The materials in the SPSLs making up a DBR can contain binary, ternary, or quaternary epitaxial oxide semiconductors, where alternating pairs (unit cells) of different epitaxial oxide materials provide different effective indices of refraction to the SPSL layers making up the DBR.

FIG. 144A shows the schematic representation of a deep-UV vertical LED structure 11900. It includes an epitaxial oxide buffer 11960 grown on a suitable substrate 11970, followed by an n-doped epitaxial oxide super-superlattice (n-SSL) 11950, a not intentionally doped epitaxial oxide material for light generation (i-layer) 11940, an epitaxial oxide ohmic-chirp 11930 serving as a p-doping material, and a metal reflector p-contact 11910. The term "super-superlattice (SSL)" as used herein describes a structure made up of repeating units, where the repeating units are two or more different superlattices. The epitaxial oxide buffer 11960 thickness can be chosen to be a multiple of $\lambda/2n_{AlN}$ in order to improve the DBR reflectivity. The n-SSL 11950 layer can consist of many different epitaxial oxide materials, each of them containing an SPSL with total thickness equal to $\lambda/4n_i+m_i\ \lambda/2n_i$ where $n_i$ is the effective refractive index of each material and $m_i$ an integer number that can be different for each layer. Two such epitaxial oxide SPSLs 11952 and 11954 within the n-SSL are shown in FIG. 144A. For example, epitaxial oxide SPSL layer 11952 can have SPSL layer compositions and thicknesses to form a layer with a first effective refractive index, and epitaxial oxide SPSL layer 11954 can have different SPSL layer compositions and thicknesses to form a layer with a second effective refractive index. The DBR is then formed by repeating pairs of epitaxial oxide SPSL layers, like layers 11952 and 11954, throughout the n-SSL.

Continuing with FIG. 144A, the epitaxial oxide i-layer 11940 can contain an epitaxial oxide SPSL material whose bandgap matches the cavity resonance, and whose thickness is chosen such that the total cavity length between bottom and top reflectors yields a cavity resonance that is similar to the epitaxial oxide i-layer 11940 bandgap. The epitaxial oxide ohmic-chirp 11930 provides hole injection into the high-bandgap epitaxial oxide i-layer 11940 with a voltage penalty that is as low as possible, and is chosen to be as thin as possible to minimize light absorption. The top metal contact 11910 (e.g., aluminium) can reflect the light back towards the substrate 11970. Additionally, a mesa structure is etched away to provide access into the n-SSL 11950 for contact with contacts 11920. Ideally the contacts 11920 contact a layer within the n-SSL 11950 to yield the smallest possible Schottky n-barrier. For example, this can be done by making contact with the lowest bandgap, or highest electron density, layers within the n-SSL layer. Alternatively, more precise etch stopping techniques can be used to reduce the Schottky barrier even further by using the polarization doping techniques described herein. For example, the structure can be grown with a graded contact layer between the n-contact and a lower Al content layer within the n-SSL material, to which the contacts 11920 can be coupled. Such structures and methods can reduce the contact resistance for the n-contact utilizing similar mechanisms as the ohmic-chirp structure described for hole injection at the p-contact.

FIG. 144B shows the same structure 11900 shown in FIG. 144A, with an inset 11902 that shows a portion of the metal contact 11910, the epitaxial oxide ohmic-chirp layer 11930, and a portion of the not intentionally doped material for light generation (epitaxial oxide i-layer) 11940. The ohmic chirp layer 11930 and i-layer 11940 in this example are epitaxial oxide SPSLs containing alternating layers of wider bandgap and narrower bandgap epitaxial oxide materials 11982 and 11984 (note that in different embodiments, material 11982 can be either the wider bandgap material or the narrower bandgap material, depending, for example, on the epi-growth polarity). Additionally, in other embodiments, one or more of the epitaxial oxide materials in the ohmic-chirp layer 11930 can be different from those in the i-layer 11940.

In some embodiments, the structures and devices described herein contain a contact layer with steep composition grading of one or more epitaxial oxide piezoelectric materials close to a metal interface to create an ohmic contact, or to reduce the contact resistance between the epitaxial oxide layers and the metal layer. A steep composition grading of one or more piezoelectric epitaxial oxide materials close to a metal interface can be realized and/or applied in many different ways and using many different materials apart from what is described above. A few additional examples will now be described.

If the goal is to reduce the Schottky resistance of an n-contact (i.e., a contact to an n-type material), then in some embodiments, $\kappa$-$Al_2O_3$, $\kappa$-$Ga_2O_3$, and/or $\kappa$-$(Al_xGa_{1-x})_yO_z$ where $0 \le x \le 1$, $1 \le y \le 3$, and $2 \le z \le 4$, materials can be used with metal-polar faces facing the n-contact metal layer. In such cases, contact layers or ohmic-chirp layers similar to those described above can be used with the composition grading within the ohmic-chirp layer ending with a high-aluminium composition. In some embodiments, contact layers or ohmic-chirp layers with metal-polar growth faces have the advantage that no absorptive layers (i.e., no layers with an effective bandgap low enough to absorb the emitted light), no matter how thin, is needed.

In further examples where the goal is to reduce the Schottky resistance of an n-contact (i.e., a contact to an n-type material), then in some embodiments, $\kappa$-$Al_2O_3$, $\kappa$-$Ga_2O_3$, and/or $\kappa$-$(Al_xGa_{1-x})O_z$ where $0 \le x \le 1$, $1 \le y \le 3$, and $2 \le z \le 4$, materials can be used with oxygen-polar faces facing the n-contact metal layer. In such cases, contact layers or ohmic-chirp layers similar to those described above can be used with the composition grading within the ohmic-chirp layer ending with a low-aluminium composition.

If the goal is to reduce the Schottky resistance of a p-contact (i.e., a contact to a p-type material), then in some embodiments $\kappa$-$Al_2O_3$, $\kappa$-$Ga_2O_3$, and/or $\kappa$-$(Al_xGa_{1-x})_yO_z$ where $0 \le x \le 1$, $1 \le y \le 3$, and $2 \le z \le 4$, materials with oxygen-polar faces facing the p-contact metal layer can be used, provided that the aluminium composition is graded and ends with a high-aluminium composition close to the metal contact. Furthermore, other types of compositional gradients (e.g., smooth gradients, or stepped compositional changes, rather than chirped layers) can also be used with metal-polar faces and composition grading ending with a low-aluminium composition for p-contacts. Conversely, in some embodiments, $\kappa$-$Al_2O_3$, $\kappa$-$Ga_2O_3$, and/or $\kappa$-$(Al_xGa_{1-x})_yO_z$ where $0 \le x \le 1$, $1 \le y \le 3$, and $2 \le z \le 4$, materials with oxygen-polar faces contain a graded composition that ends with a low aluminium composition next to the n-contact.

In some embodiments, the graded, or chirped, region is thin, however the exact way the composition is graded down can take many forms (e.g., chirped layers, smooth gradients, or stepped compositional changes). For example, inserting one thin (roughly 1 nm thick) low Al content $\kappa$-$(Al_xGa_{1-x})O_z$ layer in front of a high Al content metal-polar $\kappa$-$(Al_xGa_{1-x})_yO_z$ layer (where the low Al content layer is next to a metal contact) may be enough to reduce the Schottky resistance considerably (through the creation of polarization fields that modify the free-carrier concentrations at the interface).

In some embodiments, a $\kappa$-$Al_yO_z$/$\kappa$-$Ga_yO_z$ chirp layer (where $1 \le y \le 3$ and $2 \le z \le 4$) can be used in a semiconductor-metal junction to create a low resistance p-contact or n-contact containing $\kappa$-$Al_yO_z$ and $\kappa$-$Ga_yO_z$ sublayers.

In some embodiments, a $\kappa$-$Al_yO_z$/$\kappa$-$Ga_yO_z$ chirp layer can be used in a semiconductor-metal junction to create a low resistance p-contact containing $\kappa$-$Al_yO_z$ and $\kappa$-$Ga_yO_z$ sublayers with metal-polar faces facing the metal layer, and a gradient in the $\kappa$-$Al_yO_z$ and/or $\kappa$-$Ga_yO_z$ sublayer thicknesses with low $\kappa$-$Al_yO_z$ content adjacent to the semiconductor/metal interface. For example, the $\kappa$-$Al_yO_z$ sublayers can be thicker at the beginning of the chirp layer (farther from the metal contact) and thinner at the end of the chirp layer (nearer to the metal contact). In another example, the $\kappa$-$Ga_yO_z$ sublayers can be thinner at the beginning of the chirp layer (farther from the metal contact) and thicker at the end of the chirp layer (nearer to the metal contact). In another example, the $\kappa$-$Al_yO_z$ sublayers can be thicker at the beginning of the chirp layer (farther from the metal contact) and thinner at the end of the chirp layer (nearer to the metal contact), and the $\kappa$-$Ga_yO_z$ sublayers can be thinner at the beginning of the chirp layer (farther from the metal contact) and thicker at the end of the chirp layer (nearer to the metal contact).

In some embodiments, a wider bandgap (higher Al content) κ-$(Al_{x1}Ga_{1-x1})_yO_z$/narrower bandgap (lower Al content) κ-$(Al_{x2}Ga_{1-x2})_yO_z$ chirp layer (where 0≤x1≤1, 0≤x2≤1, 1≤y≤3, and 2≤z≤4) can be used in a semiconductor-metal junction to create a low resistance p-contact or n-contact containing κ-$(Al_{x1}Ga_{1-x1})_yO_z$ and κ-$(Al_{x2}Ga_{1-x2})_yO_z$ sublayers.

In some embodiments, a wider bandgap (higher Al content) κ-$(Al_{x1}Ga_{1-x1})_yO_z$/narrower bandgap (lower Al content) κ-$(Al_{x2}Ga_{1-x2})_yO_z$ chirp layer can be used in a semiconductor-metal junction to create a low resistance p-contact containing a wider bandgap (higher Al content) κ-$(Al_{x1}Ga_{1-x1})_yO_z$ and narrower bandgap (lower Al content) κ-$(Al_{x2}Ga_{1-x2})_yO_z$ sublayers with metal-polar faces facing the metal layer, and a gradient in the wider bandgap (higher Al content) κ-$(Al_{x1}Ga_{1-x1})_yO_z$ and/or narrower bandgap (lower Al content) κ-$(Al_{x2}Ga_{1-x2})_yO_z$ sublayer thicknesses with low average aluminium content adjacent to the semiconductor/metal interface. For example, the wider bandgap κ-$(Al_{x1}Ga_{1-x1})_yO_z$ sublayers can be thicker at the beginning of the chirp layer (farther from the metal contact) and thinner at the end of the chirp layer (nearer to the metal contact). In another example, the narrower bandgap κ-$(Al_{x2}Ga_{1-x2})_yO_z$ sublayers can be thinner at the beginning of the chirp layer (farther from the metal contact) and thicker at the end of the chirp layer (nearer to the metal contact). In another example, the wider bandgap κ-$(Al_{x1}Ga_{1-x1})_yO_z$ sublayers can be thicker at the beginning of the chirp layer (farther from the metal contact) and thinner at the end of the chirp layer (nearer to the metal contact), and the narrower bandgap κ-$(Al_{x2}Ga_{1-x2})_yO_z$ sublayers can be thinner at the beginning of the chirp layer (farther from the metal contact) and thicker at the end of the chirp layer (nearer to the metal contact).

In some embodiments, a κ-$Al_yO_z$/κ-$Ga_yO_z$ chirp layer (where 1≤y≤3 and 2≤z≤4) can be used in a semiconductor-metal junction to create a low resistance n-contact containing κ-$Al_yO_z$ and κ-$Ga_yO_z$ sublayers with metal-polar faces facing the metal layer, and a gradient in the κ-$Al_yO_z$ and κ-$Ga_yO_z$ sublayer thicknesses with high κ-$Al_yO_z$ content adjacent to the semiconductor/metal interface. For example, the κ-$Al_yO_z$ sublayers can be thinner at the beginning of the chirp layer (farther from the metal contact) and thicker at the end of the chirp layer (nearer to the metal contact). In another example, the κ-$Ga_yO_z$ sublayers can be thicker at the beginning of the chirp layer (farther from the metal contact) and thinner at the end of the chirp layer (nearer to the metal contact). In another example, the κ-$Al_yO_z$ sublayers can be thinner at the beginning of the chirp layer (farther from the metal contact) and thicker at the end of the chirp layer (nearer to the metal contact), and the κ-$Ga_yO_z$ sublayers can be thicker at the beginning of the chirp layer (farther from the metal contact) and thinner at the end of the chirp layer (nearer to the metal contact). In some embodiments, similar structures as the above can be formed using wider bandgap κ-$(Al_xGa_{1-x})_yO_z$/narrower bandgap κ-$(Al_xGa_{1-x})_yO_z$ in the chirp layer instead of κ-$Al_yO_z$/κ-$Ga_yO_z$.

In some embodiments, a κ-$Al_yO_z$/κ-$Ga_yO_z$ chirp layer (where 1≤y≤3 and 2≤z≤4) can be used in a semiconductor-metal junction to create a low resistance p-contact containing κ-$Al_yO_z$ and κ-$Ga_yO_z$ sublayers with oxygen-polar faces facing the metal layer, and a gradient in the κ-$Al_yO_z$ and/or κ-$Ga_yO_z$ sublayer thicknesses with high κ-$Al_yO_z$ content adjacent to the semiconductor/metal interface. For example, the κ-$Al_yO_z$ sublayers can be thinner at the beginning of the chirp layer (farther from the metal contact) and thicker at the end of the chirp layer (nearer to the metal contact). In another example, the κ-$Ga_yO_z$ sublayers can be thicker at the beginning of the chirp layer (farther from the metal contact) and thinner at the end of the chirp layer (nearer to the metal contact). In another example, the κ-$Al_yO_z$ sublayers can be thinner at the beginning of the chirp layer (farther from the metal contact) and thicker at the end of the chirp layer (nearer to the metal contact), and the κ-$Ga_yO_z$ sublayers can be thicker at the beginning of the chirp layer (farther from the metal contact) and thinner at the end of the chirp layer (nearer to the metal contact). In some embodiments, similar structures as the above can be formed using wider bandgap κ-$(Al_xGa_{1-x})_yO_z$/narrower bandgap κ-$(Al_xGa_{1-x})_yO_z$ in the chirp layer instead of κ-$Al_yO_z$/κ-$Ga_yO_z$.

In some embodiments, a κ-$Al_yO_z$/κ-$Ga_yO_z$ chirp layer (where 1≤y≤3 and 2≤z≤4) can be used in a semiconductor-metal junction to create a low resistance n-contact containing κ-$Al_yO_z$ and κ-$Ga_yO_z$ sublayers with oxygen-polar faces facing the metal layer, and a gradient in the κ-$Al_yO_z$ and/or κ-$Ga_yO_z$ sublayer thicknesses with low κ-$Al_yO_z$ content adjacent to the semiconductor/metal interface. For example, the κ-$Al_yO_z$ sublayers can be thicker at the beginning of the chirp layer (farther from the metal contact) and thinner at the end of the chirp layer (nearer to the metal contact). In another example, the κ-$Ga_yO_z$ sublayers can be thinner at the beginning of the chirp layer (farther from the metal contact) and thicker at the end of the chirp layer (nearer to the metal contact). In another example, the κ-$Al_yO_z$ sublayers can be thicker at the beginning of the chirp layer (farther from the metal contact) and thinner at the end of the chirp layer (nearer to the metal contact), and the κ-$Ga_yO_z$ sublayers can be thinner at the beginning of the chirp layer (farther from the metal contact) and thicker at the end of the chirp layer (nearer to the metal contact). In some embodiments, similar structures as the above can be formed using wider bandgap κ-$(Al_xGa_{1-x})_yO_z$/narrower bandgap κ-$(Al_xGa_{1-x})_yO_z$ in the chirp layer instead of κ-$Al_yO_z$/κ-$Ga_yO_z$.

In addition to creating a piezoelectric field gradient and polarization doping adjacent to a contact using a compositional gradient, it is also possible to induce polarization charges using strain only, or compositional gradients and strain gradients together, in some embodiments. For example, a constant composition piezoelectric epitaxial oxide material can be used where the strain is steeply changed, adjacent to a metal contact, either in z or in the x-y plane as a function of z (where z is the growth direction, and the x-y plane is perpendicular to the growth direction), to create a layer with a high polarization-induced electric field. Therefore, in various embodiments (e.g., to form p-contacts or n-contacts) strain can be engineered into piezoelectric epitaxial oxide materials to create the high polarization-induced electric field (instead of, or in addition to, compositional gradients) that advantageously affects epitaxial oxide semiconductor-metal interface properties (as described in detail above for chirped layers). Similar to the different embodiments of compositionally graded epitaxial oxide contact layers described above, strained epitaxial oxide contact layers can be engineered to create low resistance ohmic contacts to either n- or p-contacts. For example, the contact layer can be designed for n- or p-contacts by changing the crystal orientation (e.g., metal-polar or oxygen-polar), and/or the type of strain (e.g., compressive or tensile) within the region in the contact layer adjacent to the metal.

Furthermore, the epitaxial oxide contact layer or chirp layer requires piezoelectric epitaxial oxide materials whose spontaneous and/or induced piezoelectric polarization depends on material composition and/or strain, and these materials are not limited to κ-$(Al_xGa_{1-x})_yO_z$ materials. Therefore, contact layers (e.g., chirp layers, layers with smooth compositional gradients, or layers with strain gradients, as described above) can be created from any polar epitaxial oxide material (e.g., κ-$(Al_xGa_{1-x})_yO_z$, where $0≤x≤1$, $1≤y≤3$, and $2≤z≤4$; $Li(Al_xGa_{1-x})O_2$ where $0≤x≤1$, with a Pna21 or a P421212 space group; or other epitaxial oxide materials in a strained state).

Furthermore, epitaxial oxide contact layers, epitaxial oxide chirp layers, epitaxial oxide layers with compositional gradients, or epitaxial oxide layers with strain (as described above) that provide reduced contact resistance with a metal contact (compared to conventional structures) are not limited to LED or laser applications, but can also be used in any applications that require low resistance ohmic contact to semiconductor materials (e.g., to high-bandgap piezoelectric materials). Some examples include high-mobility RF transistors, and high-breakdown power transistors.

On the other hand, some other applications need a resistance across a semiconductor/metal interface that is as high as possible (e.g., through the use of high Schottky barriers), such as in high-voltage Schottky diodes, or control gates in RF- and power-transistors. In these cases, epitaxial oxide chirp layers, layers with compositional gradients, or epitaxial oxide layers with strain similar to those described above can also be applied, in a reversed fashion, to hinder carrier transport across the epitaxial oxide semiconductor/metal interface. For example, a metal-polar κ-$(Al_xGa_{1-x})_yO_z$ material can be graded up to high aluminium content at the metal contact interface, which would create polarization fields that could increase the p-contact resistance for holes compared to a homogeneous κ-$(Al_xGa_{1-x})O_z$/metal interface. More generally, as described above, depending on the polarity of the growth faces, and the application to an n- or p-contact, a chirp layer, layer with compositional gradient, or layer with strain (as described above) can be tailored to different situations, for example, by reversing the grading direction or the growth polarity to hinder carrier transport across the epitaxial oxide semiconductor/metal interface.

In a first aspect, the present disclosure provides a semiconductor structure comprising: a crystalline substrate; a first region, on the crystalline substrate, comprising a first region superlattice with first region superlattice unit cells, and an active region, adjacent to the first region, comprising an active region superlattice with active region superlattice unit cells. The first region superlattice unit cells comprise: a first epitaxial layer; and a second epitaxial layer. The active region superlattice unit cells comprise: a third epitaxial layer comprising $(Al_{x3}Ga_{1-x3})_{y3}O_{z3}$, wherein x3 is from 0 to 1, wherein y3 is from 1 to 3, and wherein z3 is from 2 to 4; and a fourth epitaxial layer comprising $(Al_{x4}Ga_{1-x4})_{y4}O_{z4}$, where x4 is from 0 to 1, wherein y4 is from 1 to 3, and wherein z4 is from 2 to 4.

In another form, the first epitaxial layer comprises a first epitaxial oxide material, and the second epitaxial layer comprises a second epitaxial oxide material.

In another form, the first epitaxial layer comprises $(Al_{x1}Ga_{1-x1})_{y1}O_{z1}$, wherein x1 is from 0 to 1, wherein y1 is from 1 to 3, and wherein z1 is from 2 to 4, and wherein the second epitaxial layer comprises $(Al_{x2}Ga_{1-x2})_y2O_{z2}$, wherein x2 is from 0 to 1, wherein y2 is from 1 to 3, and wherein z2 is from 2 to 4.

In another form, the first epitaxial layer comprises a first epitaxial oxide material, and wherein the second epitaxial layer comprises a second epitaxial oxide material.

In another form, the first epitaxial layer comprises $(Al_{x1}Ga_{1-x1})_{y1}O_{z1}$, wherein x1 is from 0 to 1, wherein y1 is from 1 to 3, and wherein z1 is from 2 to 4, and wherein the second epitaxial layer comprises $(Al_{x2}Ga_{1-x2})_{y2}O_{z2}$, wherein x2 is from 0 to 1, wherein y2 is from 1 to 3, and wherein z2 is from 2 to 4.

In another form, first epitaxial oxide material and/or the second epitaxial oxide material comprises NiO; $(Mg_{xa}Zn_{1-xa})_{za}(Al_{ya}Ga_{1-ya})_{2(1-za)}O_{3-2za}$ where $0≤xa≤1$, $0≤ya≤1$ and $0≤za≤1$; $(Mg_{xb}Ni_{1-xb})_{zb}(Al_{yb}Ga_{1-yb})_{2(1-zb)}O_{3-2zb}$ where $0≤xb≤1$, $0≤yb≤1$ and $0≤zb≤1$; $MgAl_2O_4$; $ZnGa_2O_4$; $(Mg_{xc}Zn_{yc}Ni_{1-yc-xc})(Al_{yc}Ga_{1-yc})_2O_4$ where $0≤xc≤1$, $0≤yc≤1$; $(Al_{xd}Ga_{1-xd})_2(Si_{zd}Ge_{1-zd})O_5$ where $0≤xd≤1$ and $0≤zd≤1$; $(Al_{xe}Ga_{1-xe})_2LiO_2$ where $0≤xe≤1$; or $(Mg_{xf}Zn_{1-xe-yf}Ni_{yf})_2GeO_4$ where $0≤xf≤1$, $0≤yf≤1$.

In another form, the first, or the second, or both the first and the second epitaxial layers is doped n-type.

In another form, the first, or the second, or both the first and the second epitaxial layers is doped p-type.

In another form, an average alloy content of the first region superlattice unit cells and of the active region superlattice unit cells is constant along a growth direction.

In another form, the first, second, third and/or fourth epitaxial layer is strained.

In another form, the first and the second epitaxial layers have opposing strains, and wherein the third and fourth epitaxial layers have opposing strains.

In another form, the semiconductor structure, further comprises a second region, adjacent to the active region, the second region comprising a second region superlattice with second region superlattice unit cells.

In another form, the second superlattice region unit cells comprise: a fifth epitaxial layer comprising a fifth composition of $(Al_{x5}Ga_{1-x5})_{y5}O_{z5}$, wherein x5 is from 0 to 1, wherein y5 is from 1 to 3, and wherein z5 is from 2 to 4; and a sixth epitaxial layer comprising a sixth composition of $(Al_{x6}Ga_{1-x6})_{y6}O_{z6}$, where x6 is from 0 to 1, wherein y6 is from 1 to 3, and wherein z6 is from 2 to 4.

In another form, the second region superlattice unit cells comprise a p-type epitaxial oxide material.

In another form, the third epitaxial layer and/or the fourth epitaxial layer has a Pna21 space group.

In another form, the substrate is A-plane sapphire, C-plane sapphire, M-plane sapphire, R-plane sapphire, $Ga_2O_3$, or MgO.

In another form, an optoelectronic semiconductor device comprises the semiconductor structure.

In another form, a light emitting diode (LED) that emits light with a wavelength from 150 nm to 280 nm comprising the semiconductor structure.

In another form, a laser that emits light with a wavelength from 150 nm to 280 nm comprises the semiconductor structure.

In a second aspect, the present disclosure provides a semiconductor structure comprising: a p-type epitaxial oxide region comprising a p-type superlattice; an n-type epitaxial oxide region comprising an n-type superlattice; and an active epitaxial oxide region comprising an active region superlattice, wherein the active epitaxial oxide region is positioned between the n-type epitaxial oxide region and the p-type epitaxial oxide region, wherein the n-type, p-type and active epitaxial oxide regions each comprise aluminum and gallium.

In another form, the n-type, p-type and active epitaxial oxide regions each comprise a composition of $(Al_xGa_{1-x})_yO_z$, wherein x is from 0 to 1, wherein y is from 1 to 3, and wherein z is from 2 to 4.

In another form, the n-type, p-type and active epitaxial oxide regions each comprise a composition of $(Al_xGa_{1-x})_yO_z$ with a Pna21 space group, wherein x is from 0 to 1, wherein y is from 1 to 3, and wherein z is from 2 to 4.

In a third aspect, the present disclosure provides a semiconductor structure comprising a substrate; and a first doped superlattice on the substrate, the first doped superlattice comprising alternating first host layers and first dopant impurity layers, wherein the first host layers comprise a first epitaxial oxide material, and the first dopant impurity layers comprise a first dopant material.

In another form, the first dopant impurity layers comprise a monolayer of the first dopant material.

In another form, the first dopant impurity layers comprise a second epitaxial oxide material doped with the first dopant material.

In another form, the first epitaxial oxide material comprises $(Al_{x1}Ga_{1-x1})_{y1}O_{z1}$, where x1 is from 0 to 1, y1 is from 1 to 3, and z1 is from 2 to 4, and wherein the first dopant material comprises Li, Ga, Zn, N, Ir, Bi, Ni, Mg and/or Pd.

In another form, the first epitaxial oxide material comprises $(Al_{x1}Ga_{1-x1})_{y1}O_{z1}$, where x1 is from 0 to 1, y1 is from 1 to 3, and z1 is from 2 to 4, and wherein the first dopant material comprises Si, Ge, Sn, and/or a rare earth metal.

In another form, the semiconductor structure, further comprises: an intrinsic region comprising a third epitaxial oxide material; and a second doped region comprising a fourth epitaxial oxide material, wherein the intrinsic region is located between the first doped superlattice and the second doped region.

In another form, the intrinsic region further comprises an intrinsic region superlattice comprising the third epitaxial oxide material and a fifth epitaxial oxide material.

In another form, the third epitaxial oxide material comprises $(Al_{x2}Ga_{1-x2})_{y2}O_{z2}$, where x2 is from 0 to 1, y2 is from 1 to 3, and z2 is from 2 to 4.

In a fourth aspect, the present disclosure provides a method of forming a doped superlattice, comprising: a) loading a substrate into a reaction chamber; b) heating the substrate to a film formation temperature; c) forming on the substrate a host layer comprising a first epitaxial oxide material; d) forming on the host layer an impurity layer comprising a first dopant material; e) forming on the impurity layer a host layer comprising the first epitaxial oxide material; f) repeating steps d) to e) until the superlattice reaches a desired thickness.

In another form, the first epitaxial oxide material comprises $(Al_{x1}Ga_{1-x1})_{y1}O_{z1}$, where x is from 0 to 1, y is from 1 to 3, and z is from 2 to 4.

In another form, the first epitaxial oxide material is $Ga_2O_3$ with an R-3c space group.

In another form, the impurity layer comprises a monolayer of the first dopant material.

In another form, the impurity layer comprises a second epitaxial oxide material doped with the first dopant material.

In another form, the first dopant material comprises Li, N, Ir, Bi, and/or Pd.

In another form, the first dopant material comprises Si, Ge, Sn, and/or a rare earth metal.

In another form, the thickness of each of the host layers in the superlattice is less than 10 nm.

In another form, the thickness of each of the impurity layers in the superlattice is less than 1 nm.

In a fifth aspect, the present disclosure provides a semiconductor structure comprising: a substrate comprising a first in-plane lattice constant; a graded buffer layer, on the substrate, comprising $(Al_{x1}Ga_{1-x1})_{1y}O_{z1}$, wherein x1 is from 0 to 1, wherein y1 is from 1 to 3, wherein z1 is from 2 to 4, and wherein x1 varies in a growth direction such that the graded buffer layer has the first in-plane lattice constant adjacent to the substrate and a second in-plane lattice constant at a surface of the graded buffer layer opposite the substrate; and a first region, on the graded buffer region, comprising a first epitaxial oxide material comprising the second in-plane lattice constant.

In another form, the first epitaxial oxide material comprises $(Al_{x2}Ga_{1-x2})_{y2}O_{z2}$, wherein x2 is from 0 to 1, wherein y2 is from 1 to 3, wherein z2 is from 2 to 4.

In another form, the first epitaxial oxide material comprises NiO; $(Mg_{xa}Zn_{1-xa})_{za}(Al_{ya}Ga_{1-ya})_{2(1-za)}O_{3-2za}$ where $0 \le xa \le 1$, $0 \le ya \le 1$ and $0 \le za \le 1$; $(Mg_{xb}Ni_{1-xb})_{zb}(Al_{yb}Ga_{1-yb})_{2(1-zb)}O_{3-2zb}$ where $0 \le xb \le 1$, $0 \le yb \le 1$ and $0 \le zb \le 1$; $MgAl_2O_4$; $ZnGa_2O_4$; $(Mg_{xe}Zn_{ye}Ni_{1-ye-x})(Al_{ye}Ga_{1-ye})_2O_4$ where $0 \le xc \le 1$, $0 \le yc \le 1$; $(Al_{xd}Ga_{1-xd})_2(Si_{zd}Ge_{1-za})O_5$ where $0 \le xd \le 1$ and $0 \le zd \le 1$; $(Al_{xe}Ga_{1-xe})_2LiO_2$ where $0 \le xe \le 1$; or $(Mg_{xf}Zn_{1-xf-yf}Ni_{yf})_2GeO_4$ where $0 \le xf \le 1$, $0 \le yf \le 1$.

In another form, the first epitaxial oxide material is strained.

In another form, the first epitaxial oxide material has a bandgap from 4.5 eV to 9.0 eV.

In another form, the first region comprises one or more superlattices.

In another form, the first region comprises an n-type region, an i-type region, and a p-type region.

In another form, an optoelectronic semiconductor device comprises the semiconductor structure, wherein the semiconductor device is a light emitting diode (LED) that emits light with a wavelength from 150 nm to 280 nm, or a laser that emits light with a wavelength from 150 nm to 280 nm.

In a sixth aspect, the present disclosure provides, a semiconductor structure comprising: a first region comprising a first epitaxial oxide material; a second region comprising a second epitaxial oxide material; and a graded region, located between the first and the second regions, comprising: $(Al_{x1}Ga_{1-x})_{y1}O_{z1}$, wherein x1 is from 0 to 1, wherein y1 is from 1 to 3, wherein z1 is from 2 to 4, and wherein the $(Al_{x1}Ga_{1-x1})_{y1}O_{z1}$ comprises a Pna21 crystal symmetry with a polarization axis parallel to a growth axis; and a monotonic change in average composition of the $(Al_{x1}Ga_{1-x1})_{y1}O_{z1}$ along the growth axis, from a first average composition adjacent to the first region to a second average composition adjacent to the second region, to induce n-type or p-type conductivity in the graded region.

In another form, the first epitaxial oxide material comprises a first composition of $(Al_{x2}Ga_{1-x})_{y2}O_{z2}$, wherein x2 is from 0 to 1, wherein y2 is from 1 to 3, wherein z2 is from 2 to 4, and wherein the second epitaxial layer comprises a second composition of $(Al_{x3}Ga_{1-x3})_{y3}O_{z3}$, wherein x3 is from 0 to 1, wherein y3 is from 1 to 3, wherein z3 is from 2 to 4.

In another form, the first epitaxial oxide material and/or the second epitaxial oxide material comprises NiO; $(Mg_{xa}Zn_{1-xa})_{za}(Al_{ya}Ga_{1-ya})_{2(1-za)}O_{3-2za}$ where $0 \le xa \le 1$, $0 \le ya \le 1$ and $0 \le za \le 1$; $(Mg_{xb}Ni_{1-xb})_{zb}(Al_{yb}Ga_{1-yb})_{2(1-zb)}O_{3-2zb}$ where $0 \le xb \le 1$, $0 \le yb \le 1$ and $0 \le zb \le 1$; $MgAl_2O_4$; $ZnGa_2O_4$; $(Mg_{xc}Zn_{ye}Ni_{1-ye-xe})(Al_{ye}Ga_{1-ye})_2O_4$ where $0 \le xc \le 1$, $0 \le yc \le 1$; $(Al_{xd}Ga_{1-xd})_2(Si_{zd}Ge_{1-zd})O_5$ where $0 \le xd \le 1$ and $0 \le zd \le 1$; $(Al_{xe}Ga_{1-xe})_2LiO_2$ where $0 \le xe \le 1$; or $(Mg_{xf}Zn_{1-xe-yf}Ni_{yf})_2GeO_4$ where $0 \le xf \le 1$, $0 \le yf \le 1$. In another form, the first and/or the second region is strained.

In another form, the first and the second epitaxial oxide materials have bandgaps that are each from 4.5 eV to 9.0 eV.

In another form, the bandgap of the first epitaxial oxide material is at least 1 eV different than the bandgap of the second epitaxial oxide material.

In another form, an optoelectronic semiconductor device comprises the semiconductor structure, wherein the semiconductor device is a light emitting diode (LED) that emits light with a wavelength from 150 nm to 280 nm, or a laser that emits light with a wavelength from 150 nm to 280 nm.

In seventh aspect, the present disclosure provides, a semiconductor structure comprising: a first region comprising a first epitaxial oxide material; a second region comprising a second epitaxial oxide material; and a chirp layer, located between the first and the second regions, comprising alternating layers of a wide bandgap (WBG) epitaxial oxide material layer and a narrow bandgap (NBG) epitaxial oxide material layer, where the thicknesses of the NBG layers and the WBG layers change throughout the chirp layer, wherein the WBG epitaxial oxide material layer comprises $(Al_{x1}Ga_{1-x1})_{y1}O_{z1}$, wherein x1 is from 0 to 1, wherein y1 is from 1 to 3, and wherein z1 is from 2 to 4, and the NBG epitaxial oxide material layer comprises $(Al_{x2}Ga_{1-x2})_{y2}O_{z2}$, wherein x2 is from 0 to 1, wherein y2 is from 1 to 3, and wherein z2 is from 2 to 4, and wherein x1 and x2 have values that are different from one another by an amount from 0.1 to 1.

In another form, each of the regions comprises a polar material, and wherein there are no abrupt changes in polarization at interfaces between each region.

In another form, the first epitaxial oxide material layer comprises $(Al_{x3}Ga_{1-x3})_{y3}O_{z3}$, wherein x3 is from 0 to 1, wherein y3 is from 1 to 3, wherein z3 is from 2 to 4, and wherein the second epitaxial oxide material layer comprises a second composition of $(Al_{x4}Ga_{1-x4})_{y4}O_{z4}$, wherein x4 is from 0 to 1, wherein y4 is from 1 to 3, wherein z4 is from 2 to 4.

In another form, the first epitaxial oxide material and/or the second epitaxial oxide material comprises NiO; $(Mg_{xa}Zn_{1-xa})_{za}(Al_{ya}Ga_{1-ya})_{2(1-za)}O_{3-2za}$ where $0 \le xa \le 1$, $0 \le ya \le 1$ and $0 \le za \le 1$; $(Mg_{xb}Ni_{1-xb})_{zb}(Al_{yb}Ga_{1-yb})_{2(1-zb)}O_{3-2zb}$ where $0 \le xb \le 1$, $0 \le yb \le 1$ and $0 \le zb \le 1$; $MgAl_2O_4$; $ZnGa_2O_4$; $(Mg_{xc}Zn_{yc}Ni_{1-yc-xc})(Al_{yc}Ga_{1-yc})_2O_4$ where $0 \le xc \le 1$, $0 \le yc \le 1$; $(Al_{xa}Ga_{1-xa})_2(Si_{zd}Ge_{1-zd})O_5$ where $0 \le xd \le 1$ and $0 \le zd \le 1$; $(Al_{xe}Ga_{1-xe})_2LiO_2$ where $0 \le xe \le 1$; or $(Mg_{xf}Zn_{1-xe-yf}Ni_{yf})_2GeO_4$ where $0 \le xf \le 1$, $0 \le yf \le 1$.

In another form, the first and/or the second region is strained.

In another form, the second effective bandgap is at least 1 eV larger than the first effective bandgap.

In another form, an optoelectronic semiconductor device comprises the semiconductor structure, wherein the semiconductor device is a light emitting diode (LED) that emits light with a wavelength from 150 nm to 280 nm, or a laser that emits light with a wavelength from 150 nm to 280 nm.

In an eight aspect, the present disclosure provides, a semiconductor structure comprising: a first region comprising first superlattice, the first superlattice comprising: a plurality of first epitaxial oxide layers; a plurality of second epitaxial oxide layers; a second region comprising a fifth epitaxial oxide layer; and a chirp layer, between the first region and the second region, comprising: a plurality of third epitaxial oxide layers comprising $(Al_{x3}Ga_{1-x3})_{y3}O_{z3}$, where x3 is from 0 to 1, y3 is from 1 to 3, and z3 is from 2 to 4; and a plurality of fourth epitaxial oxide layers comprising $(Al_{x4}Ga_{1-x4})_{y4}O_{z4}$, where x4 is from 0 to 1, y4 is from 1 to 3, and z4 is from 2 to 4.

In another form, the plurality of first epitaxial oxide layers comprises $(Al_{x1}Ga_{1-x1})_{y1}O_{z1}$, where x1 is from 0 to 1, y1 is from 1 to 3, and z1 is from 2 to 4, and wherein the plurality of second epitaxial oxide layers comprises $(Al_{x2}Ga_{1-x2})_{y2}O_{z2}$, where x2 is from 0 to 1, y2 is from 1 to 3, and z2 is from 2 to 4.

In another form, the plurality of first epitaxial oxide layers and the plurality of second epitaxial oxide layers comprise NiO; $(Mg_{xa}Zn_{1-xa})_{za}(Al_{ya}Ga_{1-ya})_{2(1-za)}O_{3-2za}$ where $0 \le xa \le 1$, $0 \le ya \le 1$ and $0 \le za \le 1$; $(Mg_{xb}Ni_{1-xb})_{zb}(Al_{yb}Ga_{1-yb})_{2(1-zb)}O_{3-2zb}$ where $0 \le xb \le 1$, $0 \le yb \le 1$ and $0 \le zb \le 1$; $MgAl_2O_4$; $ZnGa_2O_4$; $(Mg_{xe}Zn_{ye}Ni_{1-ye-xe})(Al_{ye}Ga_{1-ye})_2O_4$ where $0 \le xc \le 1$, $0 \le yc \le 1$; $(Al_{xa}Ga_{1-xa})_2(Si_{za}Ge_{1-za})O_5$ where $0 \le xd \le 1$ and $0 \le zd \le 1$; $(Al_{xe}Ga_{1-xe})_2LiO_2$ where $0 \le xe \le 1$; or $(Mg_{xf}Zn_{1-xf-yf}Ni_{yf})_2GeO_4$ where $0 \le xf \le 1$, $0 \le yf \le 1$.

In another form, the plurality of first, second, third and/or fourth epitaxial oxide layers is strained.

In another form, the superlattice comprises a first effective bandgap, wherein the fifth epitaxial oxide layer comprises a fifth bandgap, and wherein the first effective bandgap and the fifth bandgap are from 3.0 eV to 9.0 eV.

In another form, values of overlap integrals between different electron wavefunctions in a conduction band of the chirp layer are less than 0.05 for intersubband transition energies greater than 1.0 eV, when the structure is biased at an operating potential.

In another form, values of overlaps between electron wavefunctions and barrier centers in a conduction band of the chirp layer are less than 0.3 $nm^{-1}$, when the structure is biased at an operating potential.

In another form, the thicknesses of the plurality of third epitaxial oxide layers, or the thicknesses of the plurality of fourth epitaxial oxide layers, or the thicknesses of both the pluralities of the third and the fourth epitaxial oxide layers, change throughout the chirp layer.

In another form, the thicknesses of the plurality of the third and/or the fourth epitaxial oxide layers changes monotonically throughout the chirp layer.

In another form, the second region further comprises: a plurality of fifth epitaxial oxide layers; and a plurality of sixth epitaxial oxide layers.

In another form, the plurality of fifth and/or sixth epitaxial oxide semiconductor layers is strained.

In another form, a semiconductor device comprises the semiconductor structure, wherein the semiconductor device is a light emitting diode (LED), a short wavelength LED, a UV-C LED, a UV-A LED, a bipolar junction transistor, a power transistor, a vertical field-effect transistor (FET), or a semiconductor laser.

In a ninth aspect, the present disclosure provides, a semiconductor structure comprising: a first region comprising a first epitaxial oxide layer; a second region comprising a second epitaxial oxide layer; and a chirp layer, between the first region and the second region, comprising: a plurality of third epitaxial oxide layers comprising $(Al_{x3}Ga_{1-x3})_{y3}O_{z3}$, where x3 is from 0 to 1, y3 is from 1 to 3, and z3 is from 2 to 4; and a plurality of fourth epitaxial oxide layers comprising $(Al_{x4}Ga_{1-x4})_{y4}O_{z4}$, where x4 is from 0 to 1, y4 is from 1 to 3, and z4 is from 2 to 4.

In another form, the first epitaxial oxide layer comprises $(Al_{x1}Ga_{1-x1})_{y1}O_{z1}$, where x1 is from 0 to 1, y1 is from 1 to 3, and z1 is from 2 to 4, and wherein the second epitaxial oxide layer comprises $(Al_{x2}Ga_{1-x2})_{y2}O_{z2}$, where x2 is from 0 to 1, y2 is from 1 to 3, and z2 is from 2 to 4.

In another form, the first region, the second region and/or the chirp layer comprises NiO; $(Mg_{xa}Zn_{1-xa})_{za}(Al_{ya}Ga_{1-ya})_{2(1-za)}O_{3-2za}$ where $0 \le xa \le 1$, $0 \le ya \le 1$ and $0 \le za \le 1$; $(Mg_{xb}Ni_{1-xb})_{zb}(Al_{yb}Ga_{1-yb})_{2(1-zb)}O_{3-2zb}$ where $0 \le xb \le 1$, $0 \le yb \le 1$ and $0 \le zb \le 1$; $MgAl_2O_4$; $ZnGa_2O_4$;

$(Mg_{xe}Zn_{ye}Ni_{1-yc-xc})(Al_{yc}, Ga_{1-y})_2O_4$ where 0≤xc≤1, 0≤yc≤1; $(Al_{xd}Ga_{1-xd})_2(Si_{zd}Ge_{1-zd})O_5$ where 0≤xd≤1 and 0≤zd≤1; $(Al_{xe}Ga_{1-xe})_2LiO_2$ where 0≤xe≤1; or $(Mg_{xf}Zn_{1-xf-yf}Ni_{yf})_2GeO_4$ where 0≤xf≤1, 0≤yf≤1.

In a tenth aspect, the present disclosure provides, a semiconductor structure comprising: a first epitaxial oxide semiconductor layer; a metal layer; and a contact layer adjacent to the metal layer, and between the first epitaxial oxide semiconductor layer and the metal layer, the contact layer comprising: an epitaxial oxide semiconductor material; and a region comprising a gradient in the epitaxial oxide semiconductor material composition adjacent to the metal layer.

In another form, the epitaxial oxide semiconductor material comprises a piezoelectric epitaxial oxide material with a spontaneous piezoelectric polarization aligned with a growth direction.

In another form, the gradient in the epitaxial oxide semiconductor material composition over the region adjacent to the metal layer within the contact layer comprises a smoothly varying compositional gradient.

In another form, the contact layer comprises a chirp layer comprises: alternating wide bandgap sublayers and narrow bandgap sublayers; and a compositional gradient formed by varying thicknesses of the sublayers through the contact layer.

In another form, the contact layer forms a p-contact with the metal layer; and the ohmic-chirp layer further comprises: $(Al_xGa_{1-x})_2O_3$ materials, where x is from 0 to 1, with metal-polar faces facing the metal layer; an average aluminium oxide content per period; and a gradient in the average aluminium oxide content per period comprising a lower average aluminium oxide content per period close to the metal layer and a higher average aluminium oxide content per period farther away from the metal layer.

In another form, the contact layer forms an n-contact with the metal layer; and the ohmic-chirp layer further comprises: $(Al_xGa_{1-x})_2O_3$ materials, where x is from 0 to 1, with oxygen-polar faces facing the metal layer; an average aluminium oxide content per period; and a gradient in the average aluminium oxide content per period comprising a lower average aluminium oxide content per period close to the metal layer and a higher average aluminium oxide content per period farther away from the metal layer.

In another form, the contact layer forms a p-contact with the metal layer; and the ohmic-chirp layer further comprises: $(Al_xGa_{1-x})_2O_3$ materials, where x is from 0 to 1, with oxygen-polar faces facing the metal layer; an average aluminium oxide content per period; and a gradient in the average aluminium oxide content per period comprising a higher average aluminium oxide content per period close to the metal layer and a lower average aluminium oxide content per period farther away from the metal layer.

In another form, the contact layer forms an n-contact with the metal layer; and the ohmic-chirp layer further comprises: $(Al_xGa_{1-x})_2O_3$ materials, where x is from 0 to 1, with metal-polar faces facing the metal layer; an average aluminium oxide content per period; and a gradient in the average aluminium oxide content per period comprising a higher average aluminium oxide content per period close to the metal layer and a lower average aluminium oxide content per period farther away from the metal layer.

In another form, the metal layer comprises one or more of Ni, Os, Se, Pt, Pd, Ir, W, Au, and alloys thereof.

In another form, the metal layer comprises one or more of Ba, Na, Cs, Nd, and alloys thereof.

In another form, a semiconductor device comprises the semiconductor structure, wherein the semiconductor device is an optoelectronic device with wavelengths ranging from infra-red to deep-ultraviolet, a light emitting diode, a laser diode, a photodetector, a solar cell, a high-power diode, a high-power transistor, a transducer, or a high electron mobility transistor.

In an eleventh aspect, a semiconductor structure comprises: a first epitaxial oxide semiconductor layer; a metal layer; and a contact layer adjacent to the metal layer, and between the first epitaxial oxide semiconductor layer and the metal layer, comprising: an epitaxial oxide semiconductor material; and a gradient in the epitaxial oxide semiconductor material strain over a region adjacent to the metal layer.

In another form, the epitaxial oxide semiconductor material comprises a piezoelectric epitaxial oxide material with a spontaneous piezoelectric polarization aligned with a growth direction.

In another form, the region comprising the gradient in strain within the contact layer comprises a thickness from greater than 0 nm to less than 20 nm.

In another form, the metal layer comprises one or more of Ni, Os, Se, Pt, Pd, Ir, W, Au, and alloys thereof.

In another form, the metal layer comprises one or more of Ba, Na, Cs, Nd and alloys thereof.

In another form, the semiconductor device is an optoelectronic device with wavelengths ranging from infra-red to deep-ultraviolet, a light emitting diode, a laser diode, a photodetector, a solar cell, a high-power diode, a high-power transistor, a transducer, or a high electron mobility transistor.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

Unless otherwise defined, all terms used in the present disclosure, including technical and scientific terms, have the meaning as commonly understood by one of ordinary skill in the art. By means of further guidance, term definitions are included to better appreciate the teaching of the present disclosure.

As used herein, the following terms have the following meanings:

"A", "an", and "the" as used herein refers to both singular and plural referents unless the context clearly dictates otherwise. By way of example, "a metal oxide" refers to one or more than one metal oxide.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed embodiments. However, it is to be understood that the value to which the modifier "about" refers is itself also specifically disclosed.

The expression "% by weight" (weight percent), here and throughout the description unless otherwise defined, refers to the relative weight of the respective component based on the overall weight of the formulation or element referred to.

The recitation of numerical ranges by endpoints includes all numbers and fractions subsumed within that range, as well as the recited endpoints, except where otherwise explicitly stated by disclaimer and the like.

The reference to any prior art in this specification is not, and should not be taken as, an acknowledgement of any form of suggestion that such prior art forms part of the common general knowledge.

Reference has been made to embodiments of the disclosed invention. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor structure comprising:

a first epitaxial oxide semiconductor layer;

a metal layer comprising a high work function metal; and a contact layer in contact with the metal layer, and between the first epitaxial oxide semiconductor layer and the metal layer, the contact layer forming a p-contact with the metal layer, the contact layer comprising:

a chirp layer in contact with the metal layer, the chirp layer comprising a graded epitaxial oxide semiconductor material comprising a gradient in a composition in contact with the metal layer, and a thickness from greater than 0 nm to less than 20 nm.

2. The semiconductor structure of claim 1, wherein the contact layer further comprises the chirp layer, and the chirp layer comprises alternating wide bandgap epitaxial oxide sublayers and narrow bandgap epitaxial oxide sublayers, wherein the gradient in the composition of the graded epitaxial oxide semiconductor material is formed by varying thicknesses of the wide bandgap epitaxial oxide sublayers and the narrow bandgap epitaxial oxide sublayers through the chirp layer.

3. The semiconductor structure of claim 1, wherein the graded epitaxial oxide semiconductor material comprises a piezoelectric epitaxial oxide material with a spontaneous piezoelectric polarization aligned with a growth direction.

4. The semiconductor structure of claim 1, wherein the graded epitaxial oxide semiconductor material comprises metal-polar faces facing the metal layer.

5. The semiconductor structure of claim 1, wherein the graded epitaxial oxide semiconductor material comprises oxygen-polar faces facing the metal layer.

6. The semiconductor structure of claim 1, wherein the metal layer comprises one or more of Ni, Os, Se, Pt, Pd, Ir, W, Au, and alloys thereof.

7. The semiconductor structure of claim 1, further comprising a second epitaxial oxide semiconductor layer, wherein the first epitaxial oxide semiconductor layer is between the second epitaxial oxide semiconductor layer and the contact layer, wherein the first epitaxial oxide semiconductor layer is a not intentionally doped epitaxial oxide layer, and wherein the second epitaxial oxide semiconductor layer is an n-type epitaxial oxide layer.

8. The semiconductor structure of claim 7, further comprising a fourth epitaxial oxide semiconductor layer that is a p-type epitaxial oxide semiconductor layer, wherein the fourth epitaxial oxide semiconductor layer is between the contact layer and the first epitaxial oxide semiconductor layer.

9. The semiconductor structure of claim 1, wherein the contact layer or a portion of the contact layer comprises an extrinsic acceptor.

10. The semiconductor structure of claim 1, wherein the contact layer is intentionally doped p-type.

11. The semiconductor structure of claim 1, wherein the contact layer is not intentionally doped, and wherein the contact layer comprises a high carrier concentration due to polarization doping.

12. A semiconductor device comprising the semiconductor structure of claim 1, wherein the semiconductor device is an optoelectronic device with wavelengths ranging from infra-red to deep-ultraviolet, a light emitting diode, a laser diode, a photodetector, a solar cell, a high-power diode, a high-power transistor, a transducer, or a high electron mobility transistor.

13. A semiconductor structure comprising:

a first epitaxial oxide semiconductor layer;

a metal layer comprising a low work function metal; and a contact layer in contact with the metal layer, and between the first epitaxial oxide semiconductor layer and the metal layer, the contact layer forming a n-contact with the metal layer, the contact layer comprising:

a chirp layer in contact with the metal layer, the chirp layer comprising a graded epitaxial oxide semiconductor material comprising a gradient in a composition in contact with the metal layer, and a thickness from greater than 0 nm to less than 20 nm.

14. The semiconductor structure of claim 13, wherein the contact layer further comprises the chirp layer, and the chirp layer comprises alternating wide bandgap epitaxial oxide sublayers and narrow bandgap epitaxial oxide sublayers, wherein the gradient in the composition of the epitaxial oxide semiconductor material is formed by varying thicknesses of the wide bandgap epitaxial oxide sublayers and the narrow bandgap epitaxial oxide sublayers through the chirp layer.

15. The semiconductor structure of claim 13, wherein the graded epitaxial oxide semiconductor material comprises a piezoelectric epitaxial oxide material with a spontaneous piezoelectric polarization aligned with a growth direction.

16. The semiconductor structure of claim 13, wherein the graded epitaxial oxide semiconductor material comprises metal-polar faces facing the metal layer.

17. The semiconductor structure of claim 13, wherein the graded epitaxial oxide semiconductor material comprises oxygen-polar faces facing the metal layer.

18. The semiconductor structure of claim 13, wherein the metal layer comprises one or more of Ba, Na, Cs, Nd, and alloys thereof.

19. The semiconductor structure of claim 13, further comprising a second epitaxial oxide semiconductor layer, wherein the first epitaxial oxide semiconductor layer is between the second epitaxial oxide semiconductor layer and the contact layer, wherein the first epitaxial oxide semiconductor layer is a not intentionally doped epitaxial oxide layer, and wherein the second epitaxial oxide semiconductor layer is an p-type epitaxial oxide layer.

20. The semiconductor structure of claim 19, further comprising a fourth epitaxial oxide semiconductor layer that is a n-type epitaxial oxide semiconductor layer, wherein the fourth epitaxial oxide semiconductor layer is between the contact layer and the first epitaxial oxide semiconductor layer.

21. The semiconductor structure of claim 13, wherein the contact layer or a portion of the contact layer comprises an extrinsic donor.

22. The semiconductor structure of claim 13, wherein the contact layer is intentionally doped n-type.

23. The semiconductor structure of claim 13, wherein the contact layer is not intentionally doped, and wherein the contact layer comprises a high carrier concentration due to polarization doping.

24. A semiconductor device comprising the semiconductor structure of claim 13, wherein the semiconductor device is an optoelectronic device with wavelengths ranging from infra-red to deep-ultraviolet, a light emitting diode, a laser diode, a photodetector, a solar cell, a high-power diode, a high-power transistor, a transducer, or a high electron mobility transistor.

* * * * *